US012359118B2

(12) United States Patent
Lee et al.

(10) Patent No.: US 12,359,118 B2
(45) Date of Patent: Jul. 15, 2025

(54) ORGANIC LIGHT-EMITTING DEVICE

(71) Applicant: SAMSUNG DISPLAY CO., LTD., Yongin-si (KR)

(72) Inventors: Jae-Yong Lee, Yongin-si (KR); Hwan-Hee Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/856,487

(22) Filed: Sep. 16, 2015

(65) Prior Publication Data

US 2016/0260905 A1 Sep. 8, 2016

(30) Foreign Application Priority Data

Mar. 3, 2015 (KR) ........................ 10-2015-0029854

(51) Int. Cl.

| | |
|---|---|
| ***H10K 85/60*** | (2023.01) |
| ***C09K 11/06*** | (2006.01) |
| ***H10K 50/11*** | (2023.01) |
| ***H10K 50/12*** | (2023.01) |
| ***H10K 50/155*** | (2023.01) |
| ***H10K 50/18*** | (2023.01) |
| ***H10K 85/30*** | (2023.01) |
| ***H10K 101/00*** | (2023.01) |
| ***H10K 101/10*** | (2023.01) |
| ***H10K 102/10*** | (2023.01) |

(52) U.S. Cl.

CPC .......... *H10K 85/6572* (2023.02); *C09K 11/06* (2013.01); *H10K 85/633* (2023.02); *H10K 85/636* (2023.02); *H10K 85/657* (2023.02); *H10K 50/11* (2023.02); *H10K 50/12* (2023.02); *H10K 50/155* (2023.02); *H10K 50/18* (2023.02); *H10K 85/324* (2023.02); *H10K 85/342* (2023.02); *H10K 85/346* (2023.02); *H10K 85/622* (2023.02); *H10K 85/626* (2023.02); *H10K 85/6574* (2023.02); *H10K 85/6576* (2023.02); *H10K 2101/10* (2023.02); *H10K 2101/90* (2023.02); *H10K 2102/103* (2023.02)

(58) Field of Classification Search

CPC ............... H01L 51/0072; H01L 51/006; H01L 51/0061; H01L 51/0054; H01L 51/0058; H01L 51/0073; H01L 51/0074; H01L 51/0081; H01L 51/0085; H01L 51/0087; H01L 51/5012; H01L 51/5016; H01L 51/5024; H01L 51/506; H01L 51/5096; H01L 2251/308; C09K 11/06; C09K 2211/1025; C09K 2211/1029; C09K 2211/1033; C09K 2211/1037; C09K 2211/1044; C09K 2211/1048; C09K 2211/1051; C07D 209/82; C07D 209/86; C07D 403/02; C07D 403/04; C07D 405/02; C07D 405/04; C07D 409/02; C07D 409/04; H10K 85/6572; H10K 85/636; H10K 85/633; H10K 85/657; H10K 85/342; H10K 85/6574; H10K 85/622; H10K 85/6576; H10K 85/324; H10K 85/626; H10K 85/346; H10K 50/11; H10K 2101/90

USPC ........ 548/418, 440, 445; 428/690, 691, 917; 427/58, 66; 313/500–512; 257/40, 257/88–104, E51.001–E51.052; 252/301.16–301.35

See application file for complete search history.

(56) References Cited

U.S. PATENT DOCUMENTS

| | | | |
|---|---|---|---|
| 5,840,217 | A | 11/1998 | Lupo et al. |
| 6,911,551 | B2 | 6/2005 | Stössel et al. |
| 7,663,304 | B2 | 2/2010 | Fukuoka et al. |
| 7,956,531 | B2 | 6/2011 | Smith |
| 8,394,510 | B2 | 3/2013 | Mizuki et al. |
| 8,679,647 | B2 | 3/2014 | Pflumm et al. |
| 8,841,655 | B2 | 9/2014 | Okamoto |
| 8,865,323 | B2 | 10/2014 | Inoue et al. |
| 8,890,126 | B2 | 11/2014 | Ryu et al. |
| 8,932,732 | B2 | 1/2015 | Buesing et al. |
| 9,040,172 | B2 | 5/2015 | Parham et al. |
| 9,070,885 | B2 | 6/2015 | Ono |
| 9,203,043 | B2 | 12/2015 | Nishimura et al. |

(Continued)

FOREIGN PATENT DOCUMENTS

| | | | |
|---|---|---|---|
| CN | 101535256 | A | 9/2009 |
| CN | 102668157 | A | 9/2012 |

(Continued)

OTHER PUBLICATIONS

Park et al., Machine translation of WO-2010131855-A2 (2010) pp. 1-18. (Year: 2010).*

(Continued)

*Primary Examiner* — Dylan C Kershner

(74) *Attorney, Agent, or Firm* — Womble Bond Dickinson (US) LLP

(57) ABSTRACT

An organic light-emitting device includes a first electrode; a second electrode facing the first electrode; an emission layer between the first electrode and the second electrode; a hole transport region between the first electrode and the emission layer; and an electron transport region between the emission layer and the second electrode, wherein the emission layer includes a first material represented by Formula 1 and a second material represented by any one of Formulae 2-1 to 2-5, and the hole transport region includes a third material represented by Formula 3. The organic light-emitting device may have high efficiency and a long lifespan.

16 Claims, 1 Drawing Sheet

(56) References Cited

U.S. PATENT DOCUMENTS

| | | | |
|---|---|---|---|
| 9,590,184 B2 | 3/2017 | Lee et al. | |
| 9,831,439 B2 | 11/2017 | Kim et al. | |
| 9,871,208 B2 | 1/2018 | Lee et al. | |
| 9,972,789 B2 | 5/2018 | Cho et al. | |
| 10,056,560 B2 | 8/2018 | Lee et al. | |
| 10,355,217 B2 | 7/2019 | Pfister et al. | |
| 10,622,565 B2 | 4/2020 | Parham et al. | |
| 10,818,846 B2 | 10/2020 | Kim et al. | |
| 10,930,853 B2 | 2/2021 | Kim et al. | |
| 11,588,117 B2 | 2/2023 | Parham et al. | |
| 2002/0098379 A1 | 7/2002 | Arakane et al. | |
| 2003/0160564 A1 | 8/2003 | Park et al. | |
| 2003/0168970 A1* | 9/2003 | Tominaga | C07F 9/3813 556/415 |
| 2005/0106419 A1 | 5/2005 | Endoh et al. | |
| 2006/0055305 A1 | 3/2006 | Funahashi et al. | |
| 2006/0088728 A1* | 4/2006 | Kwong | C07D 209/82 428/690 |
| 2006/0220535 A1 | 10/2006 | Nakayama | |
| 2007/0231555 A1 | 10/2007 | Tsuji | |
| 2007/0252516 A1* | 11/2007 | Kondakova | H10K 50/11 428/917 |
| 2008/0124572 A1* | 5/2008 | Mizuki | C07C 211/54 428/690 |
| 2009/0309487 A1 | 12/2009 | Royster, Jr. et al. | |
| 2010/0001636 A1 | 1/2010 | Yabunouchi | |
| 2010/0012931 A1* | 1/2010 | Kato | C07D 495/04 257/40 |
| 2010/0046336 A1 | 2/2010 | Takahashi et al. | |
| 2010/0069647 A1* | 3/2010 | Suzuki | C07D 209/86 548/445 |
| 2010/0187977 A1 | 7/2010 | Kai et al. | |
| 2010/0187984 A1* | 7/2010 | Lin | H10K 50/17 546/89 |
| 2011/0037062 A1 | 2/2011 | Fukumatsu et al. | |
| 2011/0248246 A1 | 10/2011 | Ogita | |
| 2011/0278555 A1* | 11/2011 | Inoue | C07D 401/14 548/440 |
| 2011/0279020 A1* | 11/2011 | Inoue | C07D 209/82 313/504 |
| 2012/0001165 A1* | 1/2012 | Komori | C07D 487/04 257/40 |
| 2012/0068170 A1 | 3/2012 | Pflumm et al. | |
| 2012/0091885 A1 | 4/2012 | Kim et al. | |
| 2012/0112169 A1 | 5/2012 | Mizuki et al. | |
| 2012/0112174 A1 | 5/2012 | Lee et al. | |
| 2012/0138915 A1 | 6/2012 | Nishimura et al. | |
| 2012/0153272 A1* | 6/2012 | Fukuzaki | C09K 11/06 257/40 |
| 2012/0181518 A1 | 7/2012 | Ogiwara et al. | |
| 2012/0203010 A1 | 8/2012 | Matsumoto et al. | |
| 2012/0235123 A1 | 9/2012 | Lee et al. | |
| 2012/0256123 A1 | 10/2012 | Cho et al. | |
| 2012/0273764 A1* | 11/2012 | Yu | C09K 11/06 257/40 |
| 2012/0305898 A1 | 12/2012 | Okamoto | |
| 2013/0075716 A1 | 3/2013 | Nishimura et al. | |
| 2013/0105771 A1* | 5/2013 | Ryu | C09K 11/06 257/40 |
| 2013/0119354 A1 | 5/2013 | Ma et al. | |
| 2013/0256634 A1 | 10/2013 | Cho et al. | |
| 2013/0292665 A1 | 11/2013 | Ono | |
| 2013/0313536 A1 | 11/2013 | Nishimura et al. | |
| 2014/0001446 A1 | 1/2014 | Mizuki et al. | |
| 2014/0034943 A1 | 2/2014 | Mizuki et al. | |
| 2014/0048784 A1* | 2/2014 | Inoue | C07D 403/04 257/40 |
| 2014/0054564 A1 | 2/2014 | Kim et al. | |
| 2014/0061609 A1* | 3/2014 | Kim | C07D 403/04 257/40 |
| 2014/0070204 A1 | 3/2014 | Nagao et al. | |
| 2014/0084270 A1* | 3/2014 | Kato | C09K 11/06 257/40 |
| 2014/0131665 A1* | 5/2014 | Xia | H01L 51/0072 257/40 |
| 2014/0131681 A1 | 5/2014 | Ito et al. | |
| 2014/0167003 A1 | 6/2014 | Kato et al. | |
| 2014/0183500 A1 | 7/2014 | Ikeda et al. | |
| 2014/0197386 A1* | 7/2014 | Kim | H01L 51/0067 257/40 |
| 2014/0217393 A1 | 8/2014 | Kato et al. | |
| 2014/0225046 A1 | 8/2014 | Jatsch et al. | |
| 2014/0275530 A1 | 9/2014 | Jatsch et al. | |
| 2014/0299865 A1 | 10/2014 | Nishimura et al. | |
| 2014/0306207 A1 | 10/2014 | Nishimura et al. | |
| 2014/0312331 A1 | 10/2014 | Inoue et al. | |
| 2014/0312338 A1 | 10/2014 | Mizutani et al. | |
| 2014/0326985 A1 | 11/2014 | Mizuki et al. | |
| 2014/0367649 A1 | 12/2014 | Cho et al. | |
| 2014/0374711 A1 | 12/2014 | Cho et al. | |
| 2015/0001488 A1 | 1/2015 | Min et al. | |
| 2015/0060796 A1 | 3/2015 | Kim et al. | |
| 2015/0065730 A1 | 3/2015 | Montenegro et al. | |
| 2015/0069352 A1 | 3/2015 | Kim et al. | |
| 2015/0102301 A1 | 4/2015 | Cho et al. | |
| 2015/0115239 A1 | 4/2015 | Pflumm et al. | |
| 2015/0155498 A1* | 6/2015 | Ahn | C07D 491/048 548/418 |
| 2015/0179953 A1 | 6/2015 | Mujica-Fernaud et al. | |
| 2015/0194622 A1 | 7/2015 | Yamamoto et al. | |
| 2015/0207079 A1 | 7/2015 | Cho et al. | |
| 2015/0236262 A1 | 8/2015 | Cho et al. | |
| 2015/0243897 A1 | 8/2015 | Montenegro et al. | |
| 2015/0280136 A1 | 10/2015 | Ryu et al. | |
| 2015/0303379 A1 | 10/2015 | Lee et al. | |
| 2015/0318486 A1 | 11/2015 | Kim et al. | |
| 2015/0325795 A1 | 11/2015 | Lee et al. | |
| 2015/0325800 A1 | 11/2015 | Ito et al. | |
| 2015/0349270 A1 | 12/2015 | Lee et al. | |
| 2016/0149139 A1 | 5/2016 | Xia et al. | |
| 2016/0197289 A1 | 7/2016 | Sado et al. | |
| 2016/0260909 A1* | 9/2016 | Dyatkin | H10K 85/622 |
| 2017/0047527 A1 | 2/2017 | Lee et al. | |
| 2017/0062729 A1 | 3/2017 | Cha et al. | |
| 2017/0084844 A1 | 3/2017 | Parham et al. | |
| 2017/0098784 A1 | 4/2017 | Kim et al. | |
| 2017/0117488 A1 | 4/2017 | Ahn et al. | |
| 2017/0207396 A1 | 7/2017 | Park et al. | |
| 2018/0130968 A1 | 5/2018 | Ikeda | |

FOREIGN PATENT DOCUMENTS

| | | | |
|---|---|---|---|
| CN | 102858912 A | | 1/2013 |
| CN | 103328420 A | | 9/2013 |
| CN | 104795503 A | | 7/2015 |
| CN | 104860883 A | | 8/2015 |
| CN | 104903421 A | | 9/2015 |
| CN | 105051011 A | | 11/2015 |
| JP | 2010-34548 A | | 2/2010 |
| JP | 2012-156449 A | | 8/2012 |
| JP | 2012-156499 A | | 8/2012 |
| JP | 2014-49539 A | | 3/2014 |
| JP | 2014-216576 A | | 11/2014 |
| JP | 2015-167150 A | | 9/2015 |
| JP | 2015-216136 A | | 12/2015 |
| KR | 10-2003-0071617 A | | 9/2003 |
| KR | 10-2005-0085046 A | | 8/2005 |
| KR | 10-2005-0086729 A | | 8/2005 |
| KR | 10-2009-0073260 A | | 7/2009 |
| KR | 10-2009-0086057 A | | 8/2009 |
| KR | 10-2010-0105099 A | | 9/2010 |
| KR | 10-2011-0007124 A | | 1/2011 |
| KR | 10-2011-0011647 A | | 2/2011 |
| KR | 10-2011-0015836 A | | 2/2011 |
| KR | 10-2011-0066766 A | | 6/2011 |
| KR | 10-2011-0071127 A | | 6/2011 |
| KR | 10-2011-0118542 A | | 10/2011 |
| KR | 20120021203 A | * | 3/2012 |
| KR | 10-2012-0032572 A | | 4/2012 |
| KR | 10-2012-0038374 A | | 4/2012 |
| KR | 10-2012-0042633 A | | 5/2012 |
| KR | 10-2012-0047706 A | | 5/2012 |

(56) References Cited

FOREIGN PATENT DOCUMENTS

| | | | | | |
|---|---|---|---|---|---|
| KR | 10-2012-0057611 | A | | 6/2012 | |
| KR | 10-2012-0088752 | A | | 8/2012 | |
| KR | 10-2012-0092550 | A | | 8/2012 | |
| KR | 10-2012-0127746 | A | | 11/2012 | |
| KR | 10-2013-0039671 | A | | 4/2013 | |
| KR | 10-2013-0054205 | A | | 5/2013 | |
| KR | 10-2013-0109471 | A | | 10/2013 | |
| KR | 10-2013-0115027 | A | | 10/2013 | |
| KR | 10-2013-0118059 | A | | 10/2013 | |
| KR | 10-2014-0000259 | A | | 1/2014 | |
| KR | 10-2014-0006000 | A | | 1/2014 | |
| KR | 10-2014-0031213 | A | | 3/2014 | |
| KR | 10-2014-0069199 | A | | 6/2014 | |
| KR | 10-2014-0073406 | | | 6/2014 | |
| KR | 10-2014-0073412 | | | 6/2014 | |
| KR | 10-2014-0074286 | A | | 6/2014 | |
| KR | 10-2014-0081879 | A | | 7/2014 | |
| KR | 10-2014-0085110 | A | | 7/2014 | |
| KR | 10-2014-0087883 | A | | 7/2014 | |
| KR | 10-2014-0092332 | A | | 7/2014 | |
| KR | 10-2014-0094520 | A | | 7/2014 | |
| KR | 10-2014-0095072 | A | | 7/2014 | |
| KR | 10-2014-0095491 | A | | 8/2014 | |
| KR | 10-2014-0096203 | A | | 8/2014 | |
| KR | 10-2014-0104895 | A | | 8/2014 | |
| KR | 10-1427605 | B1 | | 8/2014 | |
| KR | 10-2014-0108637 | | | 9/2014 | |
| KR | 10-2014-0124654 | A | | 10/2014 | |
| KR | 10-2014-0133572 | A | | 11/2014 | |
| KR | 10-2014-0145456 | A | | 12/2014 | |
| KR | 10-2014-0145887 | A | | 12/2014 | |
| KR | 10-2014-0145888 | A | | 12/2014 | |
| KR | 10-2014-0146103 | A | | 12/2014 | |
| KR | 10-1476231 | B1 | | 12/2014 | |
| KR | 10-2015-0001101 | A | | 1/2015 | |
| KR | 10-2015-0006199 | A | | 1/2015 | |
| KR | 10-2015-0007476 | A | | 1/2015 | |
| KR | 10-1493482 | B1 | | 2/2015 | |
| KR | 10-2015-0024735 | A | | 3/2015 | |
| KR | 10-2015-0034333 | A | | 4/2015 | |
| KR | 10-2015-0036721 | A | | 4/2015 | |
| KR | 10-2015-0041652 | A | | 4/2015 | |
| KR | 10-2015-0042603 | A | | 4/2015 | |
| KR | 10-2015-0066202 | A | | 6/2015 | |
| KR | 10-2015-0068776 | A | | 6/2015 | |
| KR | 10-2015-0079664 | A | | 7/2015 | |
| KR | 10-2015-0086721 | | | 7/2015 | |
| KR | 10-2015-0096593 | | | 8/2015 | |
| KR | 10-2015-0098631 | A | | 8/2015 | |
| KR | 10-2015-0124886 | A | | 11/2015 | |
| KR | 10-2015-0126526 | A | | 11/2015 | |
| KR | 10-2015-0135123 | A | | 12/2015 | |
| TW | 201425310 | A | | 7/2014 | |
| WO | WO-2010107244 | A2 | * | 9/2010 | .......... C07D 401/04 |
| WO | WO-2010131855 | A2 | * | 11/2010 | .......... C07D 209/82 |
| WO | 2011/065136 | A1 | | 6/2011 | |
| WO | WO 2011/081423 | A2 | | 7/2011 | |
| WO | 2011/132683 | A1 | | 10/2011 | |
| WO | 2012/013271 | A1 | | 2/2012 | |
| WO | WO 2012/026780 | A1 | | 3/2012 | |
| WO | WO 2012/070233 | A1 | | 5/2012 | |
| WO | WO 2013/013271 | A1 | | 1/2013 | |
| WO | 2013105747 | A1 | | 7/2013 | |
| WO | WO 2013/120577 | A1 | | 8/2013 | |
| WO | WO 2013/157886 | A1 | | 10/2013 | |
| WO | 2013/187894 | A1 | | 12/2013 | |
| WO | WO 2014/088284 | A1 | | 6/2014 | |
| WO | WO-2014097711 | A1 | | 6/2014 | |
| WO | WO 2014/141725 | A1 | | 9/2014 | |
| WO | WO 2015/014435 | A1 | | 2/2015 | |
| WO | WO 2015/046916 | A1 | | 4/2015 | |
| WO | WO 2015/050391 | A1 | | 4/2015 | |
| WO | 2015/084114 | A1 | | 6/2015 | |
| WO | WO 2015/082056 | A1 | | 6/2015 | |
| WO | WO 2015/135625 | A1 | | 9/2015 | |
| WO | WO 2015/156587 | A1 | | 10/2015 | |
| WO | 2015/174682 | A1 | | 11/2015 | |
| WO | WO 2015/167199 | A1 | | 11/2015 | |
| WO | WO 2015/169412 | A1 | | 11/2015 | |
| WO | WO-2015167259 | A1 | * | 11/2015 | .......... C09K 11/025 |
| WO | 2016/013875 | A1 | | 1/2016 | |

OTHER PUBLICATIONS

Shin et al., "A new N-fluorenyl carbazole host material: Synthesis, physical properties and applications for highly efficient phosphorescent organic light emitting diodes" Organic Electronics (2011), 12(5), 785-793. (Year: 2011).*

Ahn et al., machine translation of KR-20120021203-A (2012) pp. 1-30. (Year: 2012).*

Machine Translation of JP 2010-034548 A. Feb. 12, 2010. (Year: 2010).

Yersin, H., "Highly Efficient OLEDs with Phosphorescent Materials," Wiley-VCH Verlag GmbH & Co. 2008. pp. 311-328.

U.S. Office Action dated Aug. 17, 2017, issued in U.S. Appl. No. 15/183,627 (22 pages).

U.S. Final Office Action dated Dec. 15, 2017, issued in U.S. Appl. No. 15/183,627 (12 pages).

U.S. Office Action dated Apr. 6, 2018, issued in U.S. Appl. No. 15/390,294 (13 pages).

U.S. Office Action dated May 24, 2018, issued in U.S. Appl. No. 15/273,515 (11 pages).

U.S. Office Action dated Jul. 17, 2018, issued in U.S. Appl. No. 15/183,627 (14 pages).

U.S. Office Action dated Apr. 6, 2018, issued in U.S. Appl. No. 15/390,210 (14 pages).

Machine translation of WO 2011-081423. (Year: 2011).

U.S. Final Office Action dated Jan. 17, 2019, issued in U.S. Appl. No. 15/293,174 (11 pages).

EPO Extended Search Report dated Jul. 26, 2017, corresponding to European Patent Application No. 17150355.0 (7 pages).

U.S. Office Action dated Aug. 7, 2018, issued in U.S. Appl. No. 15/293,174 (14 pages).

U.S. Office Action dated Oct. 4, 2018, issued in U.S. Appl. No. 15/182,298 (12 pages).

U.S. Office Action dated Oct. 4, 2018, issued in U.S. Appl. No. 15/372,042 (22 pages).

Hu, Jian-Yong, et al.; Synthesis and Photophysical Properties of Pyrene-Based Multiply Conjugated Shaped Light-Emitting Architectures: Toward Efficient Organic-Light Emitting Diodes, InTech Chapter 2, pp. 21-60, dated Jul. 27, 2011.

Office Action issued in U.S. Appl. No. 15/183,627 by the USPTO, dated Dec. 13, 2019, 15 pages.

Office Action issued in U.S. Appl. No. 15/273,515 by the USPTO, dated Jan. 22, 2020, 10 pages.

Office Action issued in U.S. Appl. No. 15/390,210 by the USPTO, dated Nov. 14, 2019, 13 pages.

Cosimbescu et al. "Electron Transport Materials: Synthesis, Properties and Device Performance", International Journal of Organic Chemistry, 2012, 2, 101-110. (Year: 2012) 10 pages.

Office action issued in U.S. Appl. No. 15/183,627 by the USPTO, mailed Jul. 18, 2019, 11 pages.

U.S. Office Action dated Apr. 3, 2019, issued in U.S. Appl. No. 15/273,515, 12 pages.

U.S. Office Action dated Apr. 15, 2019, issued in U.S. Appl. No. 15/293,174, 10 pages.

U.S. Final Office Action dated Aug. 1, 2019, issued in U.S. Appl. No. 15/390,210, 14 pages.

U.S. Final Office Action dated Jun. 8, 2020, issued in U.S. Appl. No. 15/273,515 (12 pages).

Machine translation of WO 2013105747. (Year: 2013).

U.S. Office Action dated Nov. 18, 2020, issued in U.S. Appl. No. 15/372,042 (34 pages).

U.S. Office Action dated Dec. 18, 2020, issued in U.S. Appl. No. 15/273,515 (11 pages).

US Office Action dated Aug. 4, 2021, issued in U.S. Appl. No. 15/273,515 (10 pages).

(56) References Cited

OTHER PUBLICATIONS

EPO Office Action dated Mar. 11, 2021, issued in European Patent Application No. 17150355.0 (4 pages).
U.S. Office Action dated Apr. 29, 2021, issued in U.S. Appl. No. 16/866,460 (14 pages).
U.S. Final Office Action dated May 13, 2021, issued in U.S. Appl. No. 15/273,515 (13 pages).
U.S. Final Office Action dated Jan. 5, 2022, issued in U.S. Appl. No. 15/273,515 (10 pages).
Office Action for U.S. Appl. No. 15/273,515, dated Apr. 27, 2022 (10 pages).
Final Office Action for U.S. Appl. No. 17/155,893 dated Aug. 25, 2022, 11 pages.
Notice of Allowance for U.S. Appl. No. 15/293,174 dated Sep. 7, 2022, 5 pages.
Notice of Allowance for U.S. Appl. No. 15/390,210 dated Sep. 6, 2022, 5 pages.
U.S. Advisory Action for U.S. Appl. No. 15/293,174, dated Mar. 25, 2019, 3 pages.
U.S. Advisory Action for U.S. Appl. No. 16/866,460 dated Dec. 24, 2020, 3 pages.
U.S. Advisory Action from U.S. Appl. No. 15/182,298, dated Apr. 26, 2019, 2 pages.
U.S. Advisory Action from U.S. Appl. No. 15/183,627, dated Feb. 28, 2018, 4 pages.
U.S. Advisory Action from U.S. Appl. No. 15/183,627, dated Feb. 26, 2020, 5 pages.
U.S. Advisory Action from U.S. Appl. No. 15/183,627, dated Mar. 25, 2019, 6 pages.
U.S. Advisory Action from U.S. Appl. No. 15/273,515 dated Nov. 1, 2019, 3 pages.
U.S. Advisory Action from U.S. Appl. No. 15/273,515, dated Aug. 18, 2020, 3 pages.
U.S. Advisory Action from U.S. Appl. No. 15/273,515, dated Feb. 14, 2019, 3 pages.
U.S. Advisory Action from U.S. Appl. No. 15/273,515, dated Mar. 8, 2022, 3 pages.
U.S. Advisory Action from U.S. Appl. No. 15/372,042, dated Jul. 31, 2020, 3 pages.
U.S. Advisory Action from U.S. Appl. No. 15/372,042, dated May 14, 2019, 3 pages.
U.S. Advisory Action from U.S. Appl. No. 15/390,210, dated Dec. 26, 2018, 3 pages.
U.S. Advisory Action from U.S. Appl. No. 15/390,210, dated Jun. 16, 2020, 3 pages.
U.S. Advisory Action from U.S. Appl. No. 15/390,210, dated Oct. 4, 2019, 3 pages.
U.S. Notice of Allowance for U.S. Appl. No. 16/866,460, dated Jun. 16, 2022, 5 pages.
U.S. Notice of Allowance for U.S. Appl. No. 16/866,460, dated Mar. 3, 2022, 5 pages.
U.S. Notice of Allowance for U.S. Appl. No. 16/866,460, dated Nov. 24, 2021, 8 pages.
U.S. Notice of Allowance from U.S. Appl. No. 15/182,298, dated Jun. 24, 2020, 5 pages.
U.S. Notice of Allowance from U.S. Appl. No. 15/182,298, dated Mar. 17, 2020, 5 pages.
U.S. Notice of Allowance from U.S. Appl. No. 15/182,298, dated Nov. 26, 2019, 8 pages.
U.S. Notice of Allowance from U.S. Appl. No. 15/182,298, dated Oct. 15, 2020, 5 pages.
U.S. Notice of Allowance from U.S. Appl. No. 15/293,174, dated Aug. 6, 2019, 8 pages.
U.S. Notice of Allowance from U.S. Appl. No. 15/293,174, dated Feb. 7, 2022, 8 pages.
U.S. Notice of Allowance from U.S. Appl. No. 15/293,174, dated Jan. 23, 2020, 8 pages.
U.S. Notice of Allowance from U.S. Appl. No. 15/293,174, dated Jul. 21, 2020, 8 pages.
U.S. Notice of Allowance from U.S. Appl. No. 15/293,174, dated Jan. 25, 2021, 8 pages.
U.S. Notice of Allowance from U.S. Appl. No. 15/293,174, dated Jun. 10, 2021, 8 pages.
U.S. Notice of Allowance from U.S. Appl. No. 15/293,174, dated May 5, 2020, 8 pages.
U.S. Notice of Allowance from U.S. Appl. No. 15/293,174, dated May 18, 2022, 8 pages.
U.S. Notice of Allowance from U.S. Appl. No. 15/293,174, dated Oct. 17, 2019, 8 pages.
U.S. Notice of Allowance from U.S. Appl. No. 15/293,174, dated Oct. 5, 2021, 8 pages.
U.S. Notice of Allowance from U.S. Appl. No. 15/390,210, dated Jun. 21, 2021, 8 pages.
U.S. Notice of Allowance from U.S. Appl. No. 15/390,210, dated Jan. 31, 2022, 8 pages.
U.S. Notice of Allowance from U.S. Appl. No. 15/390,210, dated May 13, 2022, 8 pages.
U.S. Notice of Allowance from U.S. Appl. No. 15/390,210, dated Oct. 1, 2021, 8 pages.
U.S. Office Action for U.S. Appl. No. 16/866,460 dated Nov. 10, 2020, 29 pages.
U.S. Office Action for U.S. Appl. No. 16/866,460, dated Jun. 12, 2020, 13 pages.
U.S. Office Action for U.S. Appl. No. 16/866,460, dated Oct. 8, 2021, 7 pages.
U.S. Office Action from U.S. Appl. No. 15/182,298, dated Feb. 15, 2019, 11 pages.
U.S. Office Action from U.S. Appl. No. 15/182,298, dated Jun. 17, 2019, 11 pages.
U.S. Office Action from U.S. Appl. No. 15/183,627, dated Jan. 14, 2019, 12 pages.
U.S. Office Action from U.S. Appl. No. 15/183,627, dated Jun. 23, 2020, 13 pages.
U.S. Office Action from U.S. Appl. No. 15/183,627, dated Nov. 23, 2020, 10 pages.
U.S. Office Action from U.S. Appl. No. 15/273,515, dated Nov. 21, 2018, 13 pages.
U.S. Office Action from U.S. Appl. No. 15/273,515, dated Sep. 12, 2019, 12 pages.
U.S. Office Action from U.S. Appl. No. 15/372,042, dated Jun. 9, 2021, 17 pages.
U.S. Office Action from U.S. Appl. No. 15/372,042, dated Mar. 7, 2019, 27 pages.
U.S. Office Action from U.S. Appl. No. 15/372,042, dated May 12, 2020, 19 pages.
U.S. Office Action from U.S. Appl. No. 15/372,042, dated Nov. 15, 2019, 20 pages.
U.S. Office Action from U.S. Appl. No. 15/390,210, dated Apr. 7, 2020, 13 pages.
U.S. Office Action from U.S. Appl. No. 15/390,210, dated Mar. 23, 2021, 13 pages.
U.S. Office Action from U.S. Appl. No. 15/390,210, dated Mar. 5, 2019, 19 pages.
U.S. Office Action from U.S. Appl. No. 15/390,210, dated Oct. 11, 2018, 18 pages.
U.S. Office Action from U.S. Appl. No. 15/390,210, dated Oct. 6, 2020, 12 pages.
U.S. Office Action from U.S. Appl. No. 17/155,893, dated May 9, 2022, 12 pages.
U.S. Restriction Requirement from U.S. Appl. No. 15/182,298, dated May 14, 2018, 5 pages.
Advisory Action for U.S. Appl. No. 17/155,893 dated Nov. 1, 2022, 3 pages.
Final Office Action for U.S. Appl. No. 15/273,515 dated Oct. 6, 2022, 11 pages.
Notice of Allowance for U.S. Appl. No. 16/866,460 dated Oct. 17, 2022, 5 pages.
Advisory Action for U.S. Appl. No. 15/273,515 dated Dec. 14, 2022, 3 pages.
Notice of Allowance for U.S. Appl. No. 15/293,174 dated Jan. 12, 2023, 5 pages.

(56) References Cited

OTHER PUBLICATIONS

Notice of Allowance for U.S. Appl. No. 15/390,210 dated Jan. 17, 2023, 7 pages.
Office Action for U.S. Appl. No. 17/155,893 dated Dec. 20, 2022, 12 pages.
Office Action for U.S. Appl. No. 17/177,049 dated Dec. 27, 2022, 18 pages.
US Office Action dated Mar. 2, 2023, issued in U.S. Appl. No. 15/273,515 (10 pages).
Ahn et al. The positional effect of arylamines on pyrene core in a blue fluorescent dopant significantly affecting the performance of organic light emitting diodes. Dyes and Pigments, 2022, 205, 110505. (Year: 2022).
Cho et al. Anthracene-dibenzofuran based electron transport type hosts for long lifetime multiple resonance pure blue OLEDs. Organic Electronics, 2022, 105, 106501. (Year: 2022).
US Final Office Action dated Jun. 9, 2023, issued in U.S. Appl. No. 17/177,049 (13 pages).
US Office Action dated Nov. 24, 2023, issued in U.S. Appl. No. 15/273,515 (10 pages).
US Final Office Action dated Jan. 9, 2024, issued in U.S. Appl. No. 17/177,049 (11 pages).
US Final Office Action dated Aug. 30, 2023, issued in U.S. Appl. No. 15/273,515 (11 pages).
US Final Office Action dated Feb. 29, 2024, issued in U.S. Appl. No. 15/273,515 (13 pages).
Application JP2015-139245. Filed Jul. 10, 2015. (Year: 2015).
Machine Translation of Application JP2015-139245. Filed Jul. 10, 2015. (Year: 2015).
US Office Action dated Sep. 19, 2023, issued in U.S. Appl. No. 17/177,049 (14 pages).
US Office Action dated Sep. 3, 2024, issued in U.S. Appl. No. 17/177,049 (11 pages).
US Final Office Action dated Oct. 22, 2024, issued in U.S. Appl. No. 15/273,515 (10 pages).
US Office Action dated Jun. 21, 2024, issued in U.S. Appl. No. 15/273,515 (14 pages).
Notice of Allowance for U.S. Appl. No. 15/273,515 dated Jan. 23, 2025, 10 pages.
Final Office Action for U.S. Appl. No. 17/177,049 dated Mar. 14, 2025, 11 pages.

* cited by examiner

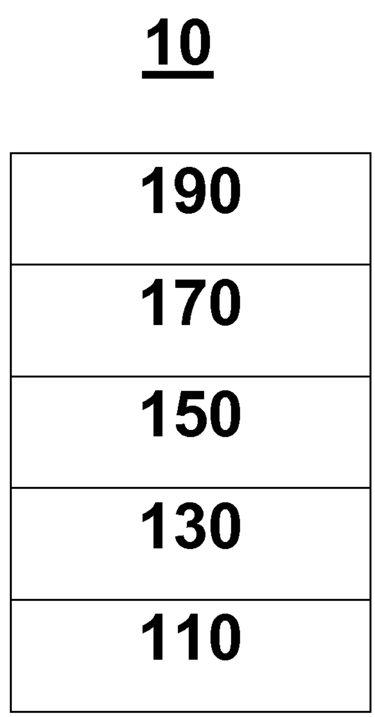
10
190
170
150
130
110

ORGANIC LIGHT-EMITTING DEVICE

CROSS-REFERENCE TO RELATED APPLICATION

This application claims priority to and the benefit of Korean Patent Application No. 10-2015-0029854, filed on Mar. 3, 2015, in the Korean Intellectual Property Office, the entire content of which is incorporated herein by reference.

BACKGROUND

1. Field

One or more aspects of embodiments of the present invention relate to an organic light-emitting device.

2. Description of the Related Art

Organic light-emitting devices (OLEDs) are self-emission devices that have wide viewing angles, high contrast ratios, quick response times, high luminance, and excellent driving voltage characteristics, and can produce full-color images.

An organic light-emitting device may include a first electrode positioned on a substrate, and a hole transport region, an emission layer, an electron transport region, and a second electrode, which are sequentially formed on the first electrode. Holes provided from the first electrode are transported to the emission layer through the hole transport region, and electrons provided from the second electrode are transported to the emission layer through the electron transport region. Carriers (e.g., the holes and electrons) may then recombine in the emission layer to generate excitons. When these excitons drop from an excited state to a ground state, light is emitted.

SUMMARY

One or more aspects of embodiments of the present invention are directed to an organic light-emitting device having a high efficiency and a long lifespan.

Additional aspects will be set forth in part in the description which follows and, in part, will be apparent from the description, or may be learned by practice of the presented embodiments.

According to one or more embodiments of the present invention, an organic light-emitting device includes a first electrode; a second electrode facing the first electrode; an emission layer between the first electrode and the second electrode; a hole transport region between the emission layer and the first electrode; and an electron transport region between the emission layer and the second electrode, wherein the emission layer includes a first material represented by Formula 1 and a second material represented by any one of Formulae 2-1 to 2-5, and the hole transport region includes a third material represented by Formula 3:

Formula 1

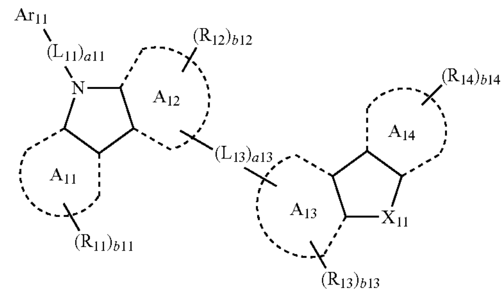

Formula 2-1

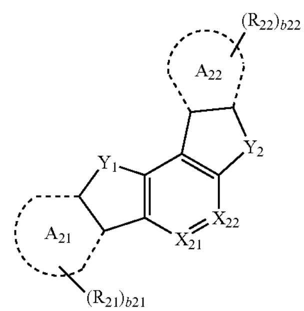

Formula 2-2

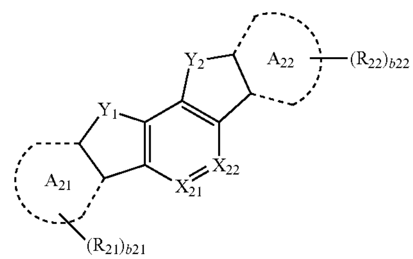

Formula 2-3

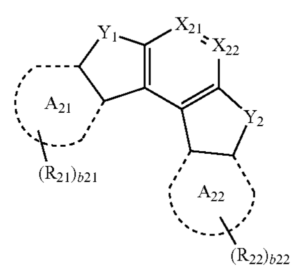

Formula 2-4

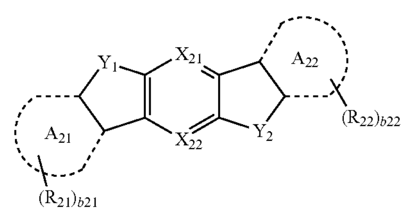

Formula 2-5

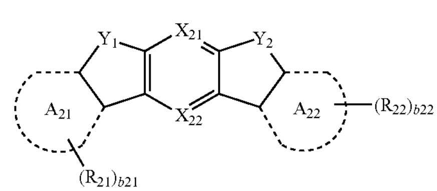

-continued

Formula 3

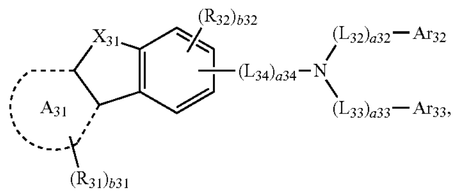

wherein, in Formulae 1, 2-1 to 2-5, and 3, $A_{11}$ to $A_{14}$, $A_{21}$, $A_{22}$, and $A_{31}$ are each independently selected from a benzene, a naphthalene, a pyridine, a pyrimidine, a quinoline, an isoquinoline, 2,6-naphthyridine, 1,8-naphthyridine, 1,5-naphthyridine, 1,6-naphthyridine, 1,7-naphthyridine, 2,7-naphthyridine, a quinoxaline, a phthalazine, a quinazoline, and a cinnoline;

$X_{11}$ is selected from O, S, $N[(L_{12})_{a12}\text{-}Ar_{12}]$, $C(R_{15})(R_{16})$, $Si(R_{15})(R_{16})$, $P[(L_{12})_{a12}\text{-}Ar_{12}]$, $B[(L_{12})_{a12}\text{-}Ar_{12}]$, and $P(=O)[(L_{12})_{a12}\text{-}Ar_{12}]$;

$X_{21}$ is $C(R_{23})$ or N;

$X_{22}$ is $C(R_{24})$ or N;

$Y_1$ is $N[(L_{21})_{a21}\text{-}Ar_{21}]$;

$Y_2$ is selected from $N[(L_{22})_{a22}\text{-}Ar_{22}]$, O, S, $C(R_{25})(R_{26})$, and $Si(R_{25})(R_{26})$;

$X_{31}$ is selected from O, S, and $N[(L_{31})_{a31}\text{-}Ar_{31}]$;

$L_{11}$ to $L_{13}$, $L_{21}$, $L_{22}$, and $L_{31}$ to $L_{34}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a31 to a34 are each independently selected from 0, 1, 2, and 3, and when a11 is 2 or greater, two or more $L_{11}$s are identical to or different from each other, when a12 is 2 or greater, two or more $L_{12}$s are identical to or different from each other, when a13 is 2 or greater, two or more $L_{13}$S are identical to or different from each other, when a21 is 2 or greater, two or more $L_{21}$s are identical to or different from each other, when a22 is 2 or greater, two or more $L_{22}$s are identical to or different from each other, when a31 is 2 or greater, two or more $L_{31}$S are identical to or different from each other, when a32 is 2 or greater, two or more $L_{32}$S are identical to or different from each other, when a33 is 2 or greater, two or more $L_{33}$S are identical to or different from each other, and when a34 is 2 or greater, two or more $L_{34}$S are identical to or different from each other;

$Ar_{11}$, $Ar_{12}$, $Ar_{21}$, and $Ar_{22}$ are each independently selected from $ET_1$ and $HT_2$;

$Ar_{31}$ to $Ar_{33}$ are each independently $HT_2$;

where $ET_1$ is an electron transport group and $HT_2$ is a hole transport group;

$R_{11}$ to $R_{16}$, $R_{21}$ to $R_{26}$, $R_{31}$, and $R_{32}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—B(Q_4)(Q_5)$, and $—N(Q_6)(Q_7)$;

$R_{15}$ and $R_{16}$ are optionally linked to each other to form a saturated or unsaturated ring;

b11 to b14, b21, b22, b31, and b32 are each independently selected from 0, 1, 2, and 3; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—B(Q_{14})(Q_{15})$, and $—N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of embodiments, taken in conjunction with the accompanying drawing, which is a schematic view of an organic light-emitting device according to one or more embodiments of the present invention.

DETAILED DESCRIPTION

Reference will now be made in more detail to the present embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of" or "at least one selected from," when preceding a list of elements, modify the entire list of elements and do not modify the individual elements of the list. Further, the use of "may" when describing embodiments of the present invention refers to "one or more embodiments of the present invention."

The drawing is a schematic view of a cross-section of an organic light-emitting device 10 according to one or more embodiments of the present invention. The organic light-emitting device 10 includes a first electrode 110, a hole transport region 130, an emission layer 150, an electron transport region 170, and a second electrode 190.

Hereinafter, a structure and a method of preparing an organic light-emitting device according to one or more embodiments of the present invention will be described in detail.

A substrate may be additionally positioned under the first electrode 110 or on the second electrode 190 as illustrated in the drawing. The substrate may be a glass substrate or a transparent plastic substrate, each having excellent mechanical strength, thermal stability, transparency, surface smoothness, ease of handling, and/or waterproofness (water resistance).

The first electrode 110 may be formed by depositing or sputtering a first electrode material on the substrate. When the first electrode 110 is an anode, the first electrode material may be selected from materials that have a high work function so as to facilitate hole injection. The first electrode 110 may be a reflective electrode, a semi-transmissive electrode, or a transmissive electrode. The first electrode material may be an indium tin oxide (ITO), an indium zinc oxide (IZO), a tin oxide ($SnO_2$), and/or a zinc oxide (ZnO), which may give transparency and conductivity to the first electrode 110. In some embodiments, in order to form the first electrode 110 that is a semi-transmissive electrode or a reflective electrode, the first electrode material may be at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including two or more layers. For example, the first electrode 110 may have a triple-layer structure of ITO/Ag/ITO, but embodiments of the present invention are not limited thereto.

The hole transport region 130, the emission layer 150, and the electron transport region 170 are sequentially stacked on the first electrode 110 in the stated order.

The emission layer 150 includes a first material represented by Formula 1 and a second material represented by any one of Formulae 2-1 to 2-5, and the hole transport region 130 includes a third material represented by Formula 3:

Formula 1

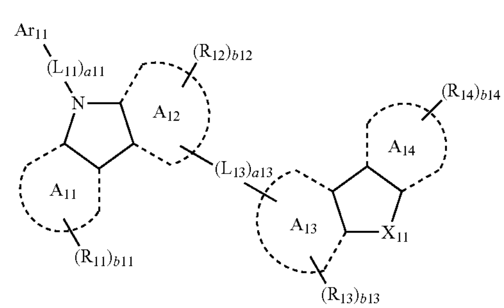

-continued

Formula 2-1

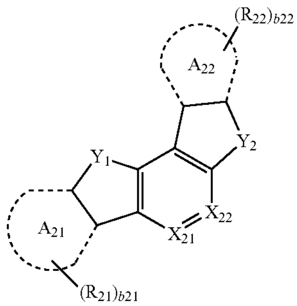

Formula 2-2

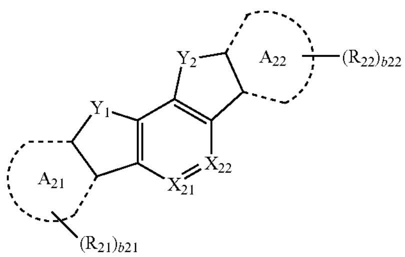

Formula 2-3

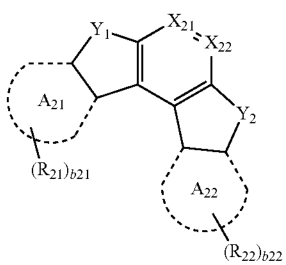

Formula 2-4

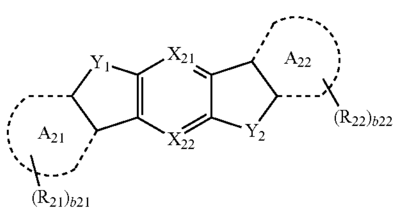

Formula 2-5

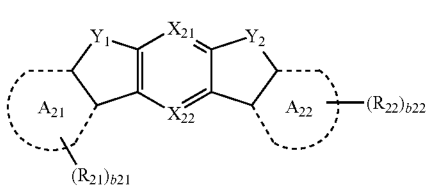

Formula 3

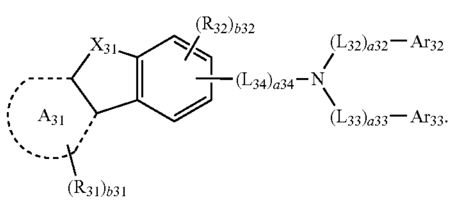

In Formulae 1, 2-1 to 2-5, and 3, $A_{11}$ to $A_{14}$, $A_{21}$, $A_{22}$, and $A_{31}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline.

For example, in Formulae 1, 2-1 to 2-5, and 3, $A_{11}$ to $A_{14}$ and $A_{21}$ may be each independently selected from a benzene, a naphthalene, a pyridine, an isoquinoline, and a quinoxaline; and $A_{22}$ and $A_{31}$ may be each independently selected from a benzene and a naphthalene.

In some embodiments, in Formulae 1, 2-1 to 2-5, and 3, $A_{11}$ and $A_{21}$ may be each independently selected from a benzene, a naphthalene, a pyridine, an isoquinoline, and a quinoxaline; and $A_{12}$ to $A_{14}$, $A_{22}$, and $A_{31}$ may be each independently selected from each independently a benzene and a naphthalene.

In Formula 1, $X_{11}$ may be selected from O, S, $N[(L_{12})_{a12}\text{-}Ar_{12}]$, $C(R_{15})(R_{16})$, $Si(R_{15})(R_{16})$, $P[(L_{12})_{a12}\text{-}Ar_{2}]$, $B[(L_{12})_{a12}\text{-}Ar_{12}]$, and $P(=O)[(L_{12})_{a12}\text{-}Ar_{12}]$.

In Formulae 2-1 to 2-5, $X_{21}$ may be $C(R_{23})$ or N, and $X_{22}$ may be $C(R_{24})$ or N.

For example, in Formulae 2-1 to 2-5, $X_{21}$ may be $C(R_{23})$, and $X_{22}$ may be $C(R_{24})$.

In Formulae 2-1 to 2-5, $Y_1$ may be $N[(L_{21})_{a21}\text{-}Ar_{21}]$, and $Y_2$ may be selected from $N[(L_{22})_{a22}\text{-}Ar_{22}]$, O, S, $C(R_{25})(R_{26})$, and $Si(R_{25})(R_{26})$.

In Formula 3, $X_{31}$ may be selected from O, S, and $N[(L_{31})_{a31}\text{-}Ar_{31}]$.

In Formulae 1, 2-1 to 2-5, and 3, $L_{11}$ to $L_{13}$, $L_{21}$, $L_{22}$, and $L_{31}$ to $L_{34}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1, 2-1 to 2-5, and 3, $L_{11}$ to $L_{13}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthryl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, and a quinazolinyl group, $L_{21}$, $L_{22}$, and $L_{31}$ to $L_{34}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —$Si(Q_{31})(Q_{32})(Q_{33})$, and $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group.

In some embodiments, in Formulae 1, 2-1 to 2-5, and 3, $L_{11}$ to $L_{13}$ may be each independently one selected from groups represented by Formula 3-1 to 3-34, and
$L_{21}$, $L_{22}$, and $L_{31}$ to $L_{34}$ may be each independently one selected from groups represented by Formulae 3-1 to 3-10, 3-26 to 3-28, 3-32, and 3-33:
3-1
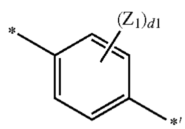
3-2
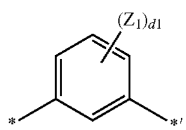
3-3
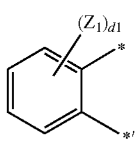
3-4
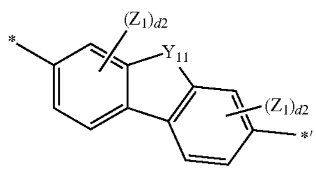
3-5
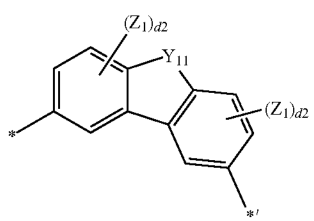
3-6
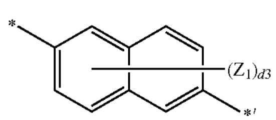
3-7
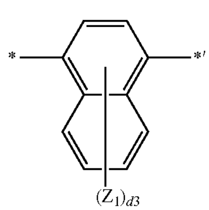
3-8
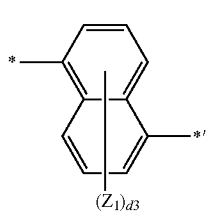
-continued
3-9
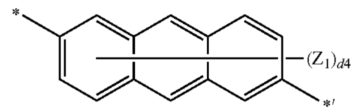
3-10
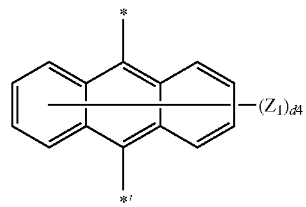
3-11
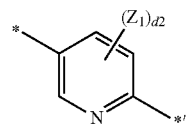
3-12
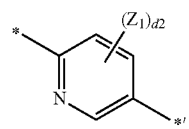
3-13
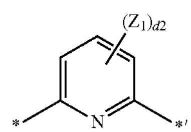
3-14
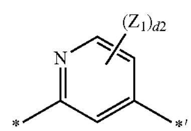
3-15
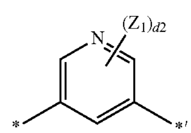
3-16
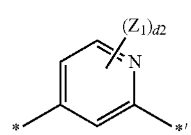
3-17
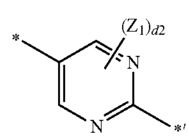
3-18
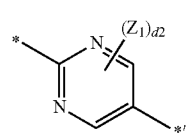

-continued 3-19

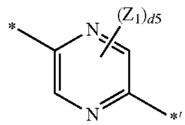

3-20

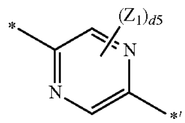

3-21

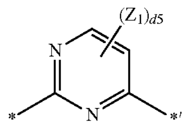

3-22

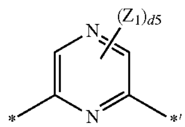

3-23

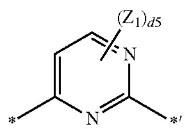

3-24

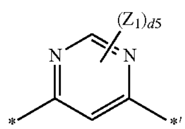

3-25

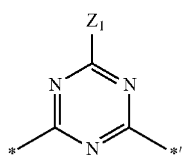

3-26

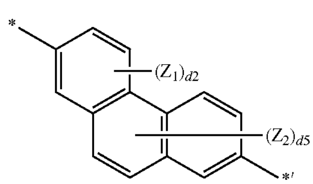

3-27

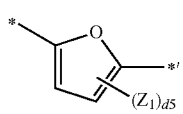

3-28

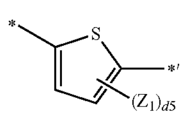

-continued 3-29

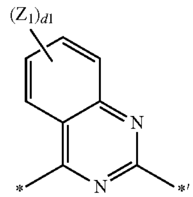

3-30

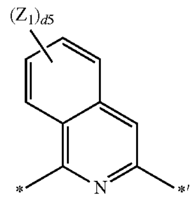

3-31

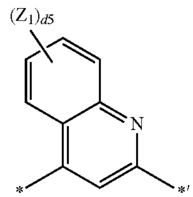

3-32

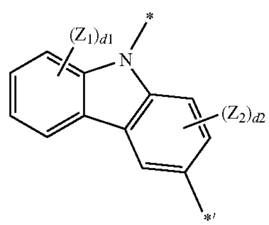

3-33

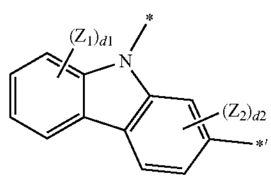

3-34

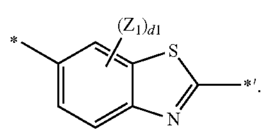

In Formulae 3-1 to 3-34, $Y_{11}$ may be selected from O, S, S(═O), S(═O)$_2$, C($Z_3$)($Z_4$), N($Z_5$), and Si($Z_6$)($Z_7$);

$Z_1$ to $Z_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthryl group, a pyrenyl group, a phenanthrenyl group, a fluorenyl group, a carbazolyl group, a benzocarbazolyl group, and a dibenzocarbazolyl group;

d1 may be an integer selected from 1 to 4; d2 may be an integer selected from 1 to 3; d3 may be an integer selected from 1 to 6; d4 may be an integer selected from 1 to 8; d5 may be an integer of 1 or 2; d6 may be an integer selected from 1 to 5; and * and *' may be each independently a binding site to a neighboring atom.

In some embodiments, in Formulae 1, 2-1 to 2-5, and 3, $L_{11}$ to $L_{13}$ may be each independently one selected from groups represented by Formulae 4-1 to 4-26, and $L_{21}$, $L_{22}$, and $L_{31}$ to $L_{34}$ may be each independently one selected from groups represented by Formulae 4-1, 4-3, 4-5 to 4-8, and 4-10 to 4-21, but embodiments of the present invention are not limited thereto:

4-1

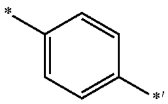

4-2

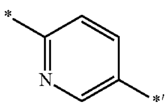

4-3

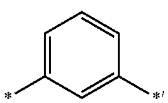

4-4

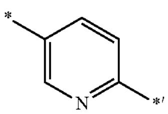

4-5

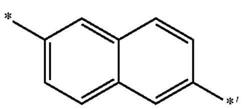

4-6

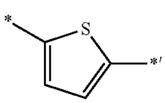

4-7

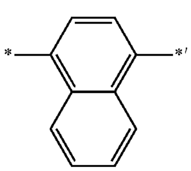

4-8

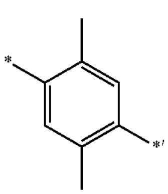

4-9

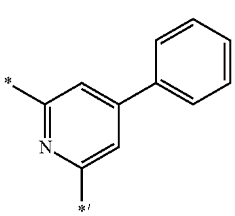

-continued 4-10

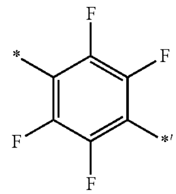

4-11

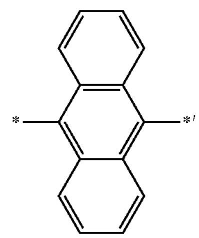

4-12

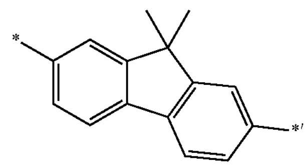

4-13

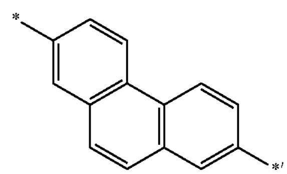

4-14

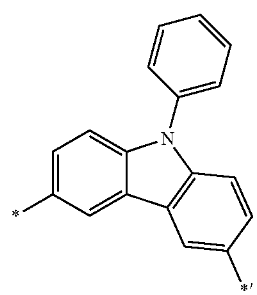

4-15

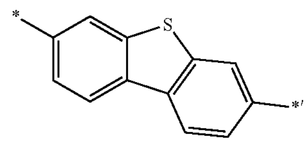

4-16

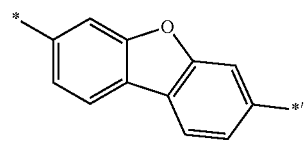

4-17

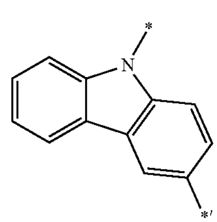

-continued 4-18

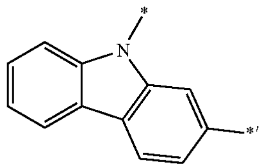

4-19

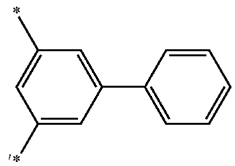

4-20

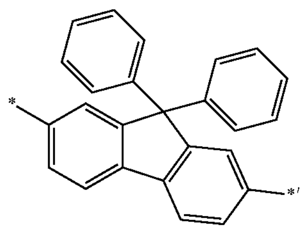

4-21

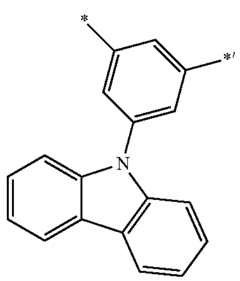

4-22

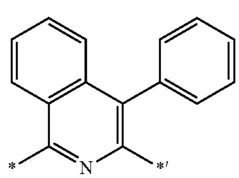

4-23

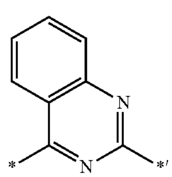

4-24

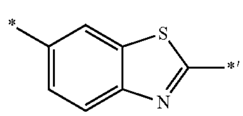

4-25

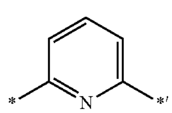

4-26

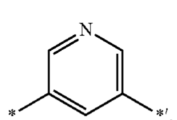

In Formulae 4-1 to 4-26, * and *' may be each independently a binding site to a neighboring atom.

In Formulae 1, 2-1 to 2-5, and 3, a11 to a13, a21, a22, and a31 to a34 may be each independently selected from 0, 1, 2, and 3. In Formulae 1, 2-1 to 2-5, and 3, a11 denotes the number of $L_{11}$s, and, when a11 is 0, -$(L_{11})_{a11}$- is a single bond, and, when a11 is 2 or greater, two or more $L_{11}$s may be identical to or different from each other. Descriptions of a12, a13, a21, a22, and a31 to a34 may be each independently understood by referring to the description of a11 and the respective structures of Formulae 1, 2-1 to 2-5, and 3.

In Formulae 1, 2-1 to 2-5, and 3, $Ar_{11}$, $Ar_{12}$, $Ar_{21}$, and $Ar_{22}$ may be each independently selected from $ET_1$ and $HT_2$; and $Ar_{31}$ to $Ar_{33}$ may be $HT_2$.

Here, $ET_1$ is an electron transport group and $HT_2$ is a hole transport group.

In Formulae 1, 2-1 to 2-5, and 3, $A_{11}$ and $A_{12}$ may be each independently selected from $ET_1$ and $HT_2$, where at least one of $Ar_{11}$ and $Ar_{12}$ may be $ET_1$, and $Ar_{21}$ and $Ar_{22}$ may be $HT_2$; or $Ar_{11}$ and $Ar_{12}$ may be each independently $HT_2$, where $Ar_{21}$ and $Ar_{22}$ are each independently selected from $ET_1$ and $HT_2$, and at least one of $Ar_{21}$ and $Ar_{22}$ may be $ET_1$.

For example, in Formulae 1, 2-1 to 2-5, and 3, $Ar_{11}$ may be $ET_1$, $X_{11}$ may be selected from O, S, $C(R_{15})(R_{16})$, and $Si(R_{15})(R_{16})$, and $Ar_{21}$ and $Ar_{22}$ may be $HT_2$;

$Ar_{11}$ may be $ET_1$, $X_{11}$ may be selected from $N[(L_{12})_{a12}$-$Ar_{12}]$, $P[(L_{12})_{a12}$-$Ar_{12}]$, $B[(L_{12})_{a12}$-$Ar_{12}]$, and $P(=O)[(L_{12})_{a12}$-$Ar_{12}]$, and $Ar_{12}$, $Ar_{21}$, and $Ar_{22}$ may be $HT_2$; or $Ar_{11}$ may be $ET_1$, $X_{11}$ may be selected from $N[(L_{12})_{a12}$-$Ar_{12}]$, $P[(L_{12})_{a12}$-$Ar_{12}]$, $B[(L_{12})_{a12}$-$Ar_{12}]$, and $P(=O)[(L_{12})_{a12}$-$Ar_{12}]$, $Ar_{12}$ may be $ET_1$, and $Ar_{21}$ and $Ar_{22}$ may be $HT_2$.

$ET_1$ may be selected from a substituted or unsubstituted $C_1$-$C_{10}$ heterocycloalkyl group, a substituted or unsubstituted $C_1$-$C_{10}$ heterocycloalkenyl group, a substituted or unsubstituted $C_1$-$C_{60}$ heteroaryl group, and a substituted or unsubstituted monovalent non-aromatic condensed heteropolycyclic group (where, a substituted or unsubstituted a carbazolyl group is excluded among substituted or unsubstituted monovalent non-aromatic condensed heteropolycyclic groups) that include at least one nitrogen atom as a ring-forming atom.

For example, $ET_1$ may be selected from:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{31})(Q_{32})(Q_{33})$, —$B(Q_{34})(Q_{35})$, and —$N(Q_{36})(Q_{37})$; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group, each substituted with at least one selected from a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{21})(Q_{22})(Q_{23})$, —$B(Q_{24})(Q_{25})$, and —$N(Q_{26})(Q_{27})$, where $Q_{21}$ to $Q_{27}$ and $Q_{31}$ to $Q_{37}$ may be each independently selected from a $C_1$-$C_{20}$ alkyl group, a $C_1$-$C_{20}$ alkoxy group, a phenyl group, and a naphthyl group.

In some embodiments, $ET_1$ may be selected from groups represented by Formulae 5-1 to 5-45:

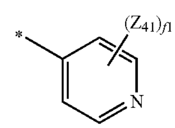

5-1

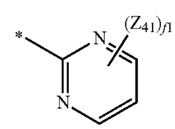

5-2

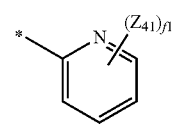

5-3

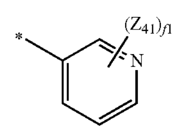

5-4

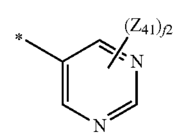

5-5

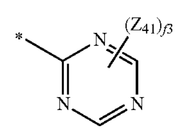

5-6

-continued
5-7
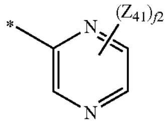
5-8
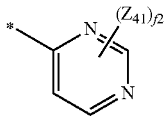
5-9
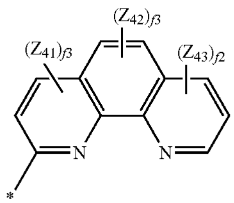
5-10
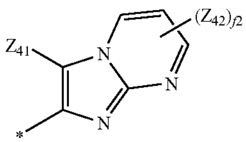
5-11
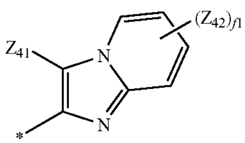
5-12
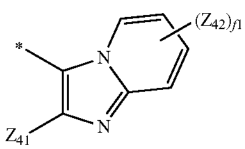
5-13
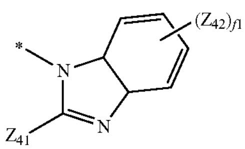
5-14
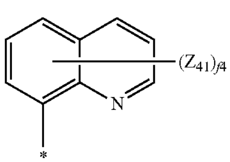
5-15
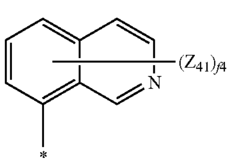
5-16
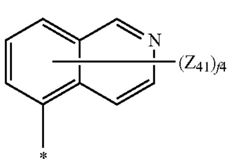
-continued
5-17
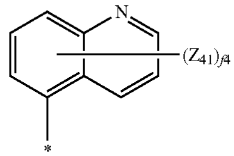
5-18
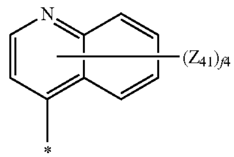
5-19
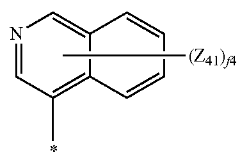
5-20
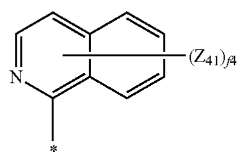
5-21
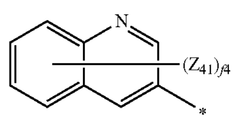
5-22
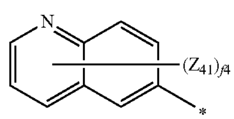
5-23
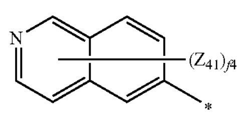
5-24
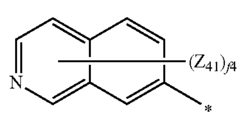
5-25
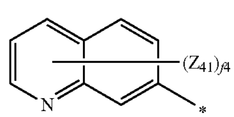
5-26
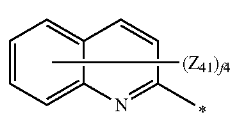
5-27
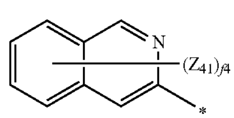

-continued 5-28

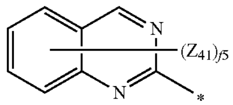

5-29

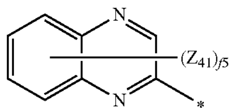

5-30

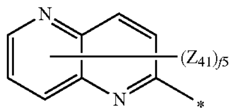

5-31

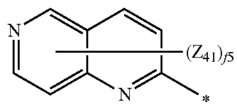

5-32

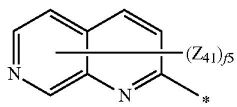

5-33

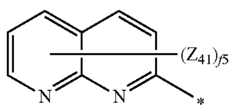

5-34

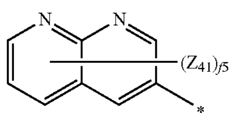

5-35

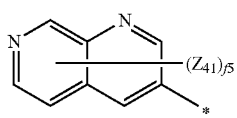

5-36

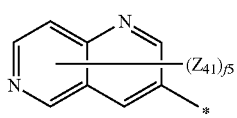

5-37

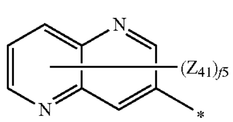

5-38

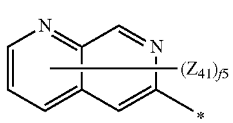

5-39

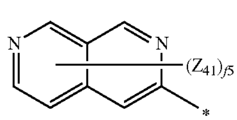

-continued 5-40

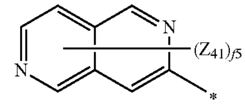

5-41

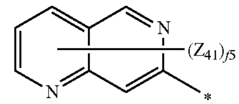

5-42

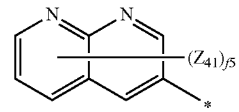

5-43

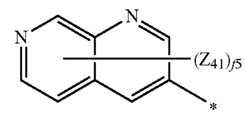

5-44

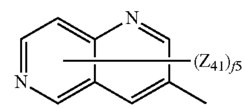

5-45

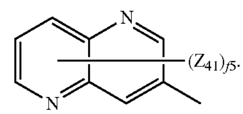

In Formulae 5-1 to 5-45, $Z_{41}$ to $Z_{43}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

where $Q_{21}$ to $Q_{27}$ and $Q_{31}$ to $Q_{37}$ may be each independently selected from a $C_1$-$C_{10}$ alkyl group, a $C_1$-$C_{10}$ alkoxy group, a phenyl group, and a naphthyl group;

f1 may be an integer selected from 1 to 4; f2 may be an integer selected from 1 to 3; f3 may be an integer of 1 or 2; f4 may be an integer selected from 1 to 6; and f5 may be an integer selected from 1 to 5.

For example, in Formulae 5-1 to 5-45, $Z_{41}$ to $Z_{43}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from a $C_1$-$C_{10}$ alkyl group, a $C_1$-$C_{10}$ alkoxy group, a phenyl group, a naphthyl group, a fluorenyl group, a spiro-fluorenyl group, a pyridinyl group, a pyrazinyl group, a pyrimidinyl group, a quinolinyl group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$, where $Q_{21}$ to $Q_{27}$ and $Q_{31}$ to $Q_{37}$ may be each independently selected from a $C_1$-$C_{10}$ alkyl group, a $C_1$-$C_{10}$ alkoxy group, a phenyl group, and a naphthyl group.

In some embodiments, $HT_2$ may be selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —$Si(Q_{31})(Q_{32})(Q_{33})$, —$B(Q_{34})(Q_{35})$, and —$N(Q_{36})(Q_{37})$;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from a $C_1$-$C_{20}$ alkyl group and a phenyl group; and —$Si(Q_1)(Q_2)(Q_3)$, —$B(Q_4)(Q_5)$, and —$N(Q_6)(Q_7)$, where $Q_1$ to $Q_7$ and $Q_{31}$ to $Q_{37}$ may be each independently selected from a $C_1$-$C_{10}$ alkyl group, a $C_1$-$C_{10}$ alkoxy group, a phenyl group, and a naphthyl group.

For example, $HT_2$ may be selected from:

—$Si(Q_1)(Q_2)(Q_3)$, —$B(Q_4)(Q_5)$, and —$N(Q_6)(Q_7)$; and groups selected from Formulae 7-1 to 7-9, where $Q_1$ to $Q_7$ may be each independently selected from a $C_1$-$C_{10}$ alkyl group, a $C_1$-$C_{10}$ alkoxy group, a phenyl group, and a naphthyl group:

7-1

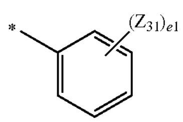

7-2

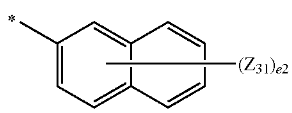

7-3

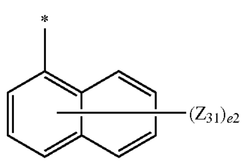

7-4

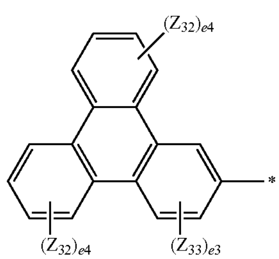

7-5

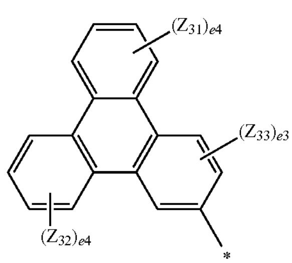

7-6

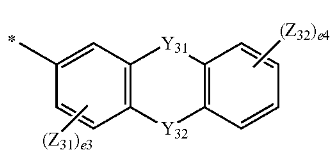

-continued 7-7

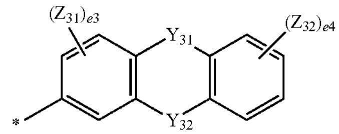

7-8

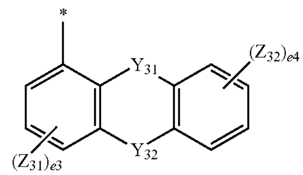

7-9

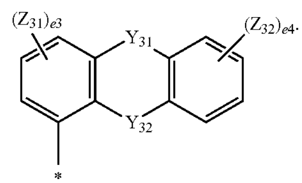

In Formulae 7-1 to 7-9, $Y_{31}$ and $Y_{32}$ may be each independently selected from a single bond, O, S, $C(Z_{34})(Z_{35})$, $N(Z_{36})$, and $Si(Z_{37})(Z_{38})$;

$Z_{31}$ to $Z_{38}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

e1 may be an integer selected from 1 to 5, e2 may be an integer selected from 1 to 7, e3 may be an integer selected from 1 to 3, e4 may be an integer selected from 1 to 4, and * and *' may be each independently a binding site to a neighboring atom.

For example, $HT_2$ may be selected from groups represented by Formulae 8-1 to 8-46:

8-1

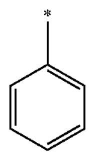

8-2

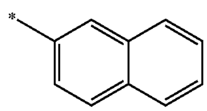

8-3

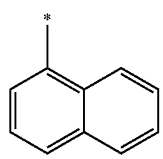

8-4

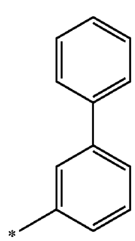

8-5

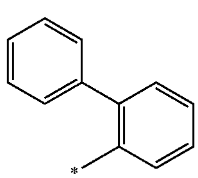

8-6

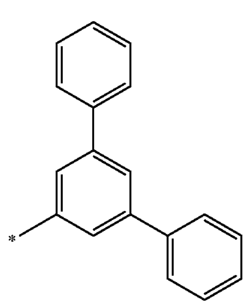

-continued 8-7

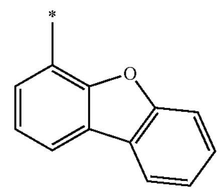

8-8

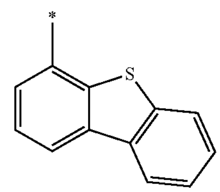

8-9

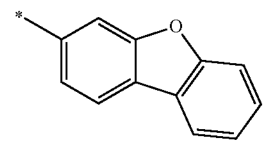

8-10

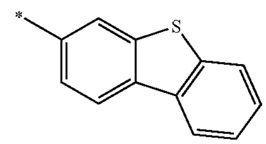

8-11

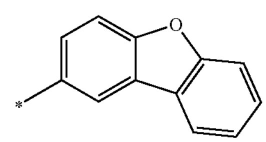

8-12

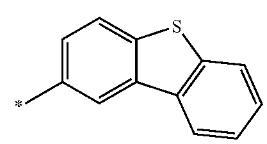

8-13

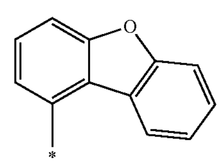

8-14

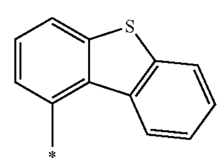

8-15

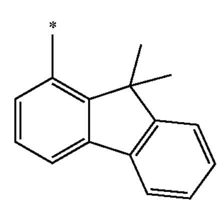

8-16
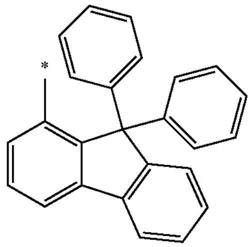
8-17
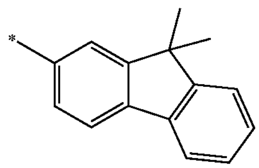
8-18
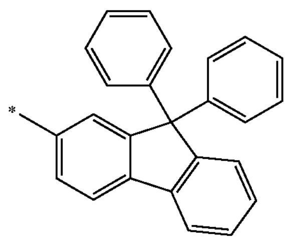
8-19
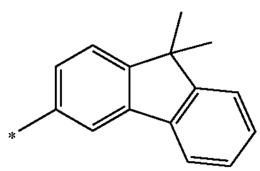
8-20
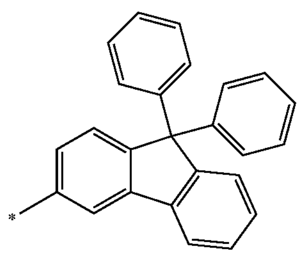
8-21
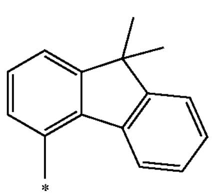
8-22
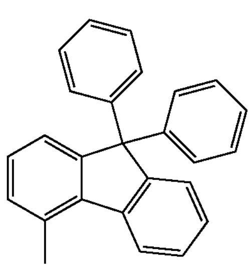
8-23
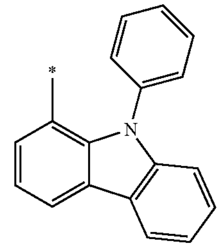
8-24
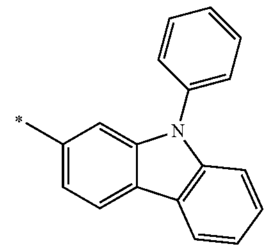
8-25
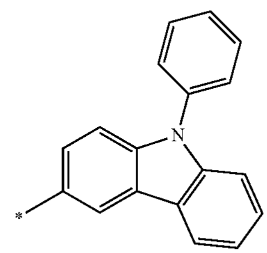
8-26
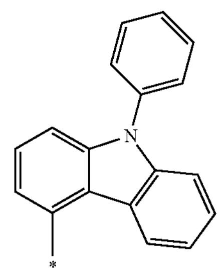
8-27
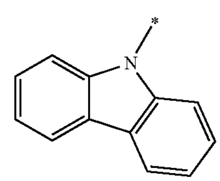
8-28
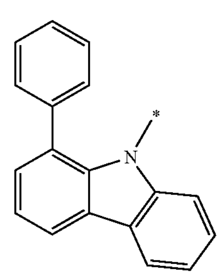

8-29
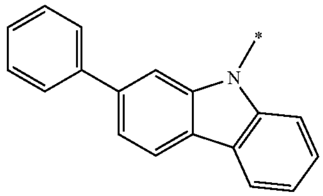
8-30
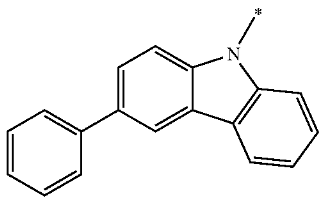
8-31
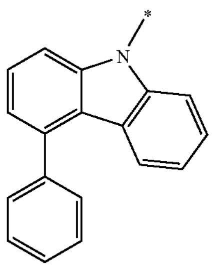
8-32
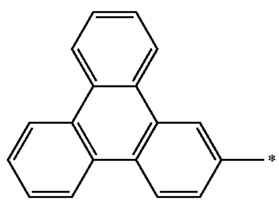
8-33
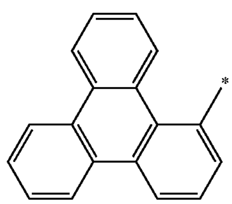
8-34
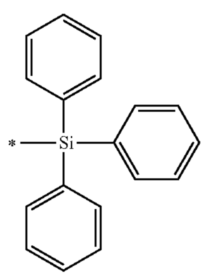
8-35
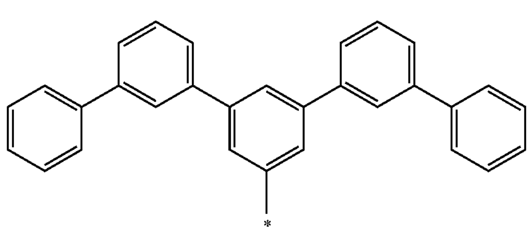
8-36
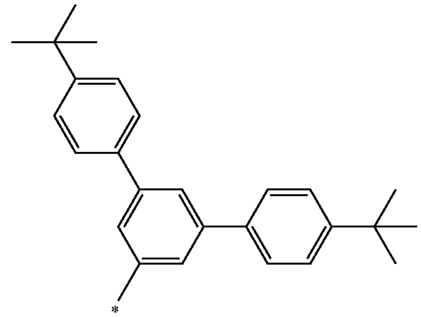
8-37
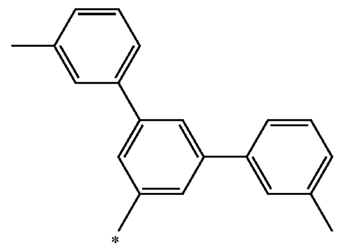
8-38
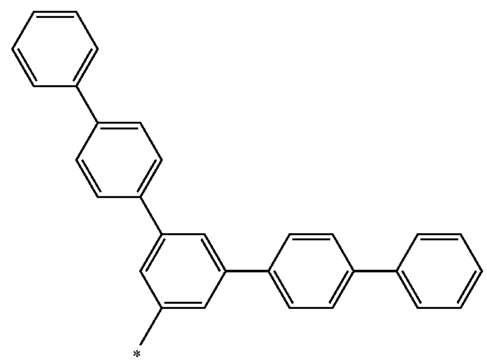
8-39
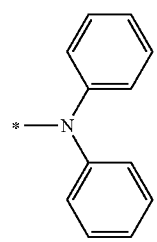
8-40
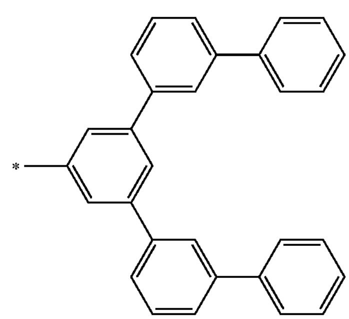

-continued 8-41

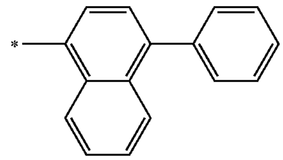

8-42

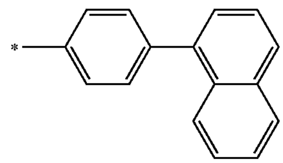

8-43

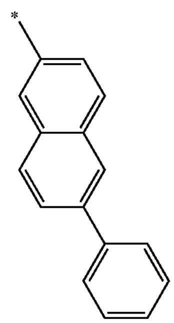

8-44

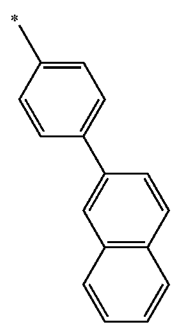

8-45

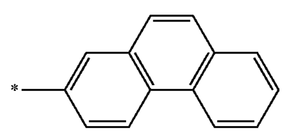

8-46

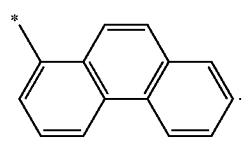

In Formulae 8-1 to 8-46, * may be a binding site to a neighboring atom.

In Formulae 1, 2-1 to 2-5, and 3, $R_{11}$ to $R_{16}$, $R_{21}$ to $R_{26}$, $R_{31}$, and $R_{32}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group (substituted or unsubstituted monovalent non-aromatic condensed polycyclic group), a substituted or unsubstituted monovalent non-aromatic condensed heteropolycyclic group (substituted or unsubstituted monovalent non-aromatic condensed heteropolycyclic group), —$Si(Q_1)(Q_2)(Q_3)$, —$B(Q_4)(Q_5)$, and —$N(Q_6)(Q_7)$, where $Q_1$ to $Q_7$ are as defined herein; and $R_{15}$ and $R_{16}$ may be optionally linked to each other and form a saturated or unsaturated ring.

For example, $R_{15}$ and $R_{16}$ may be optionally linked to each other and form a saturated or unsaturated ring having 4 to 10 carbon atoms.

In some embodiments, in Formulae 1, 2-1 to 2-5, and 3, $R_{11}$ to $R_{16}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, a dibenzocarbazolyl group, and —$Si(Q_{31})(Q_{32})(Q_{33})$; and —$Si(Q_1)(Q_2)(Q_3)$;

$R_{21}$ to $R_{26}$, $R_{31}$, and $R_{32}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group and a dibenzosilolyl group, and —$Si(Q_{31})(Q_{32})(Q_{33})$; and —$Si(Q_1)(Q_2)(Q_3)$;

where $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, and a naphthyl group.

In some embodiments, in Formulae 1, 2-1 to 2-5, and 3, $R_{11}$ to $R_{16}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a naphthyl group, a fluorenyl group, a phenanthrenyl group, a pyridinyl group, a pyrimidinyl group, a triazinyl group, a dibenzofuranyl group, and a dibenzothiophenyl group; and a phenyl group, a naphthyl group, a fluorenyl group, a phenanthrenyl group, a pyridinyl group, a pyrimidinyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a phenanthrenyl group, a pyridinyl group, a pyrimidinyl group, a triazinyl group, a dibenzofuranyl group, a dibenzothiophenyl group, and —$Si(Q_{31})(Q_{32})(Q_{33})$, $R_{21}$ to $R_{26}$, $R_{31}$, and $R_{32}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a naphthyl group, a fluorenyl group, a phenanthrenyl group, a carbazolyl group, a dibenzofuranyl group, and a dibenzothiophenyl group; and a phenyl group, a naphthyl group, a fluorenyl group, a phenanthrenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a phenanthrenyl group, a carbazolyl group, a dibenzofuranyl group, a dibenzothiophenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, and a naphthyl group.

In Formulae 1, 2-1 to 2-5, and 3, b11 to b14, b21, b22, b31, and b32 may be each independently selected from 0, 1, 2, and 3. In Formulae 1, 2-1 to 2-5, and 3, b11 denotes the number of $R_{11}$, and when b11 is 2 or greater, a plurality of R11 may be identical to or different from each other. Descriptions of b12 to b14, b21, b22, b31, and b32 may be each independently understood by referring to the descriptions of b11 and Formulae 1, 2-1 to 2-5, and 3.

For example, in Formulae 1, 2-1 to 2-5 and 3, b11 to b14, b21, b22, b31, and b32 may be each independently selected from 0, 1, and 2, or, in some embodiments, from 0 and 1.

In some embodiments, the first material may be represented by any one of Formulae 1A to 1 G, the second material may be represented by any one of Formulae 2(1) to 2(16), and the third material may be represented by any one of Formulae 3A to 3E:

Formula 1A

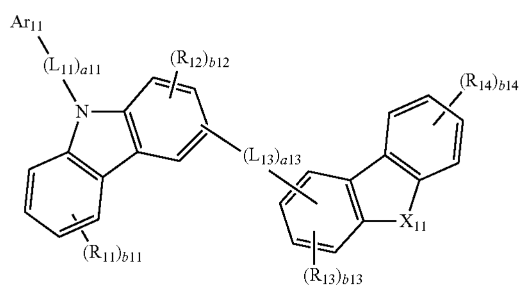

Formula 1B

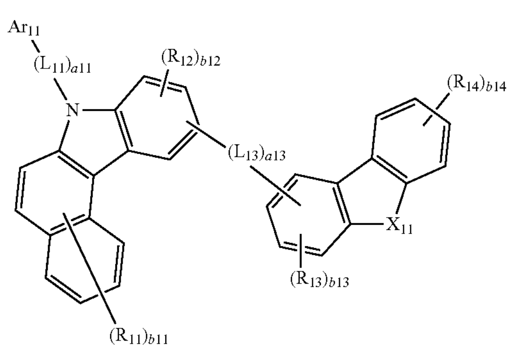

-continued

Formula 1C

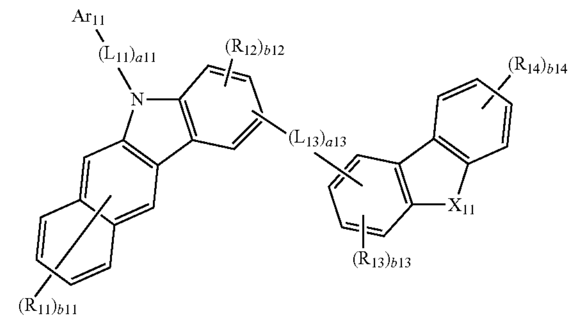

Formula 1D

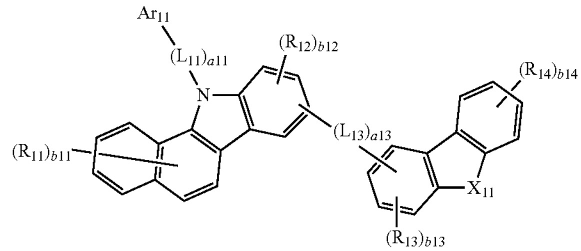

Formula 1E

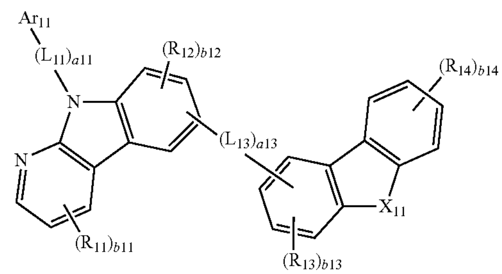

Formula 1F

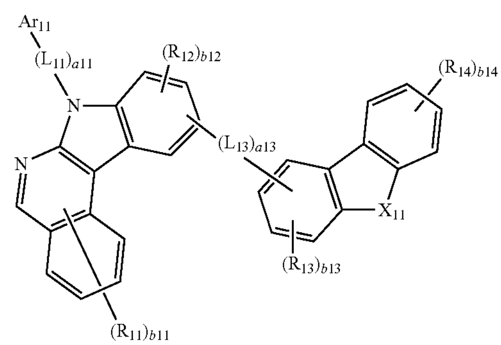

Formula 1G

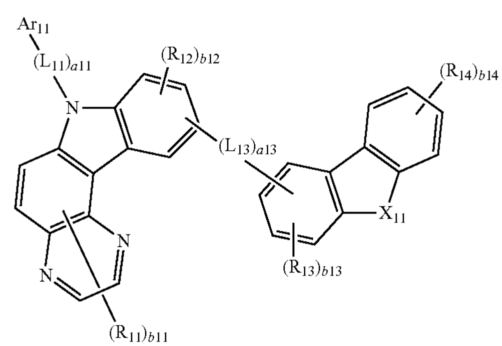

Formula 2(1)
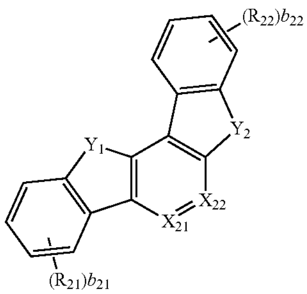
Formula 2(2)
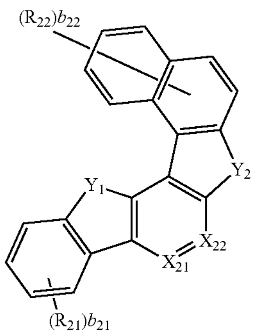
Formula 2(3)
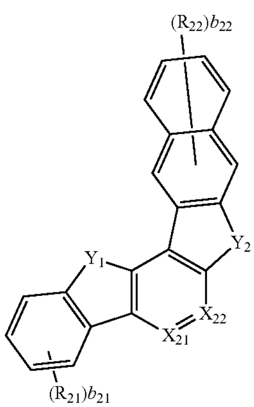
Formula 2(4)
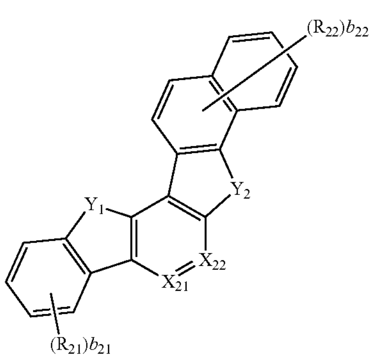
Formula 2(5)
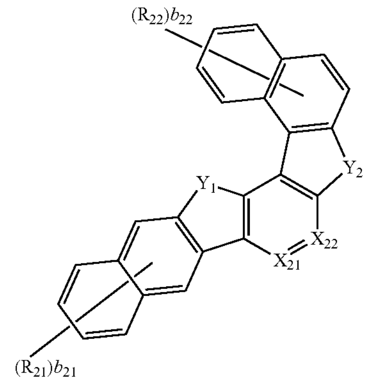
Formula 2(6)
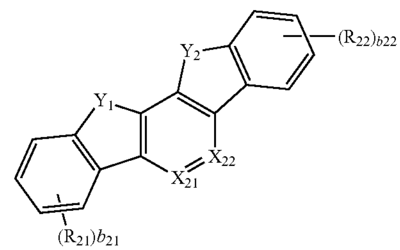
Formula 2(7)
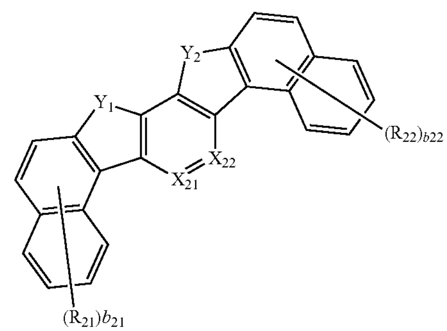
Formula 2(8)
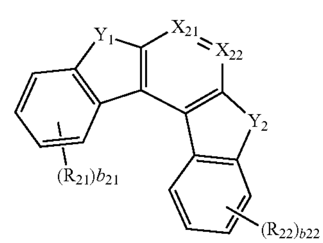
Formula 2(9)
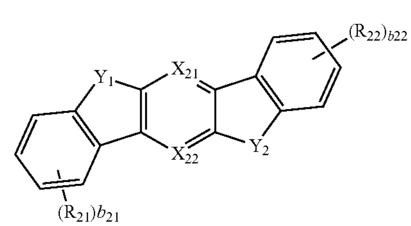

Formula 2(10)
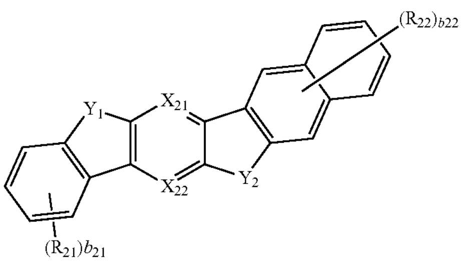
Formula 2(11)
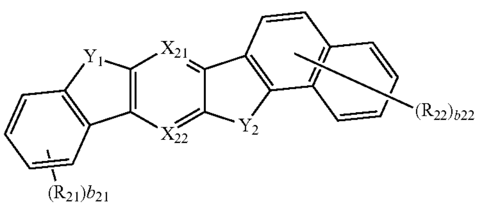
Formula 2(12)
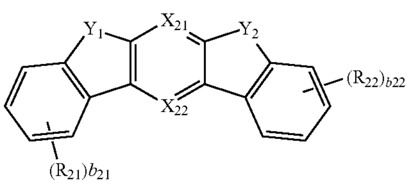
Formula 2(13)
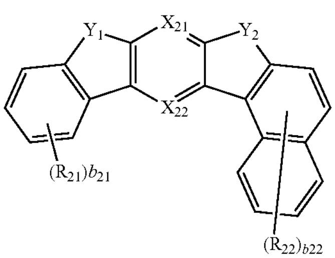
Formula 2(14)
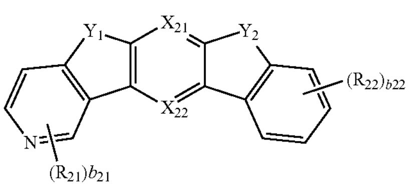
Formula 2(15)
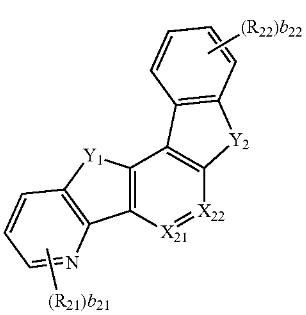
Formula 2(16)
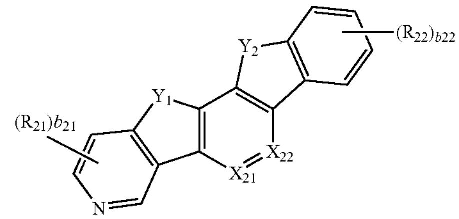
Formula 3A
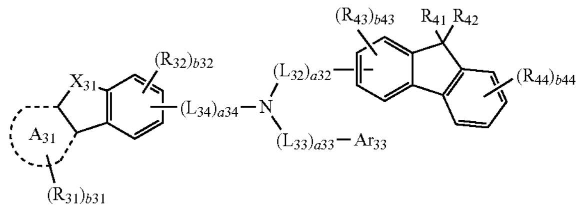
Formula 3B
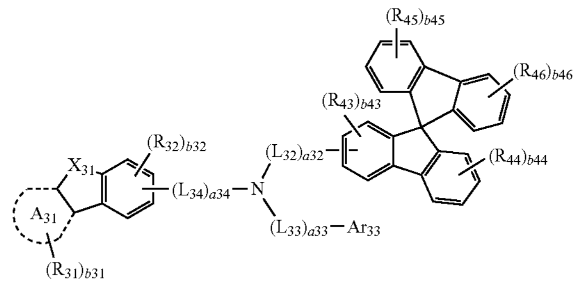
Formula 3C
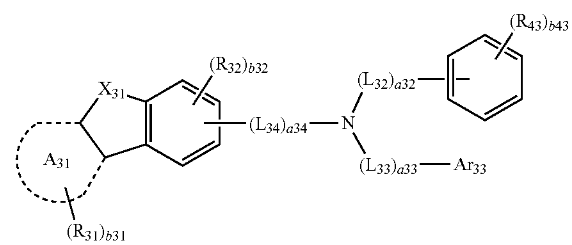
Formula 3D
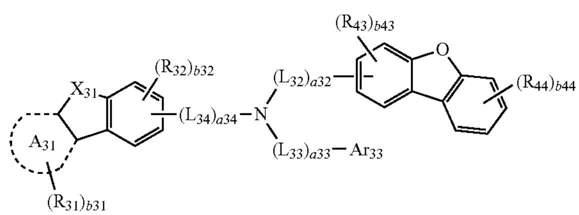
Formula 3E
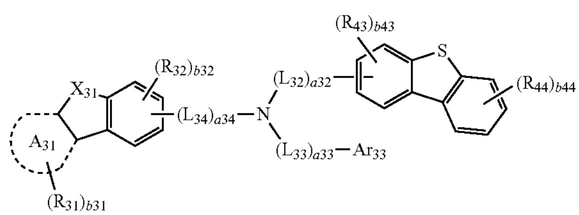
In Formulae 1A to 1G, $X_{11}$, $L_{11}$, $L_{13}$, a11, a13, $Ar_{11}$, $R_{11}$ to $R_{14}$, and b11 to b14 are the same as defined herein,
in Formulae 2(1) to 2(16), $X_{21}$, $X_{22}$, $Y_1$, $Y_2$, $R_{21}$, $R_{22}$, b21, and b22 are the same as defined herein, in Formulae 3A to 3E, $A_{31}$, $X_{31}$, $L_{32}$ to $L_{34}$, a32 to a34, $Ar_{33}$, $R_{31}$, $R_{32}$, b31, and b32 are the same as defined herein, $R_{41}$ to $R_{46}$ are each independently the same as $R_{31}$ defined in Formula 3, and b43 to b46 are each independently the same as b31 defined in Formula 3.

In some embodiments, the first material may be represented by one of Formulae 1A to 1 G, the second material may be represented by one of Formulae 2(1) to 2(13), and the third material may be represented by one of Formulae 3A to 3E:

Formula 1A

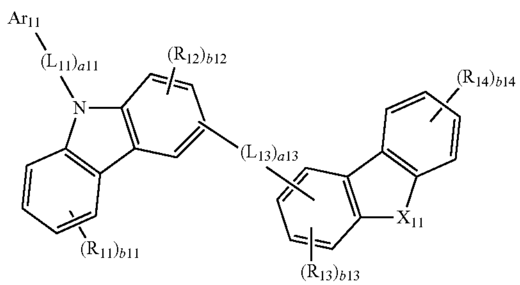

Formula 1B

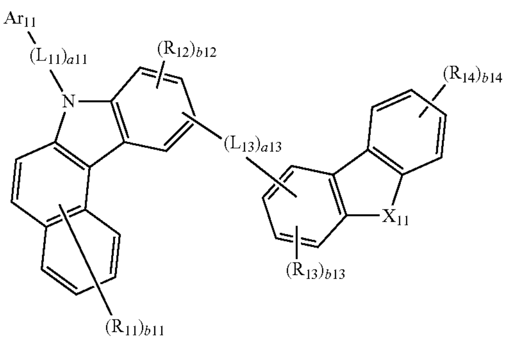

Formula 1C

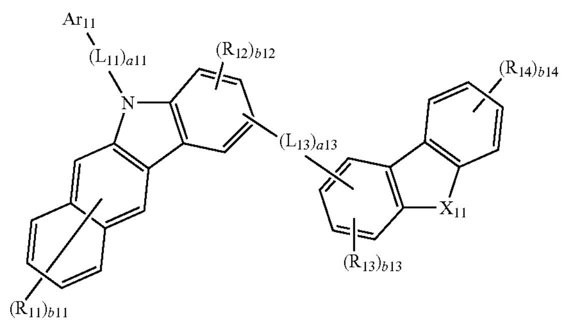

Formula 1D

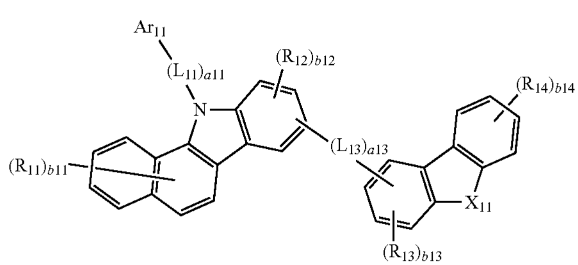

-continued

Formula 1E

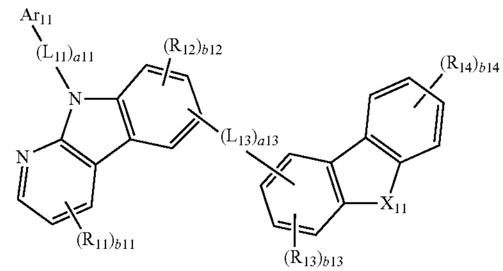

Formula 1F

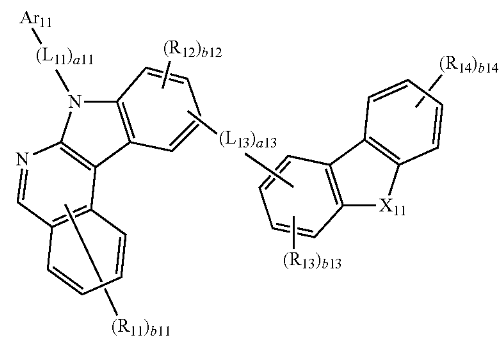

Formula 1G

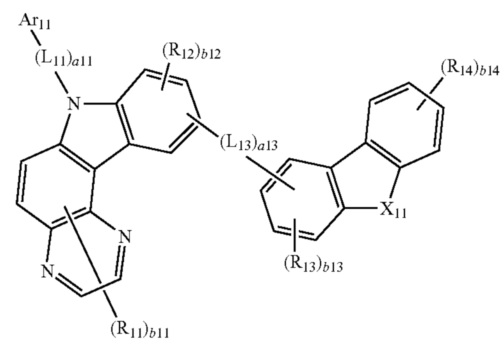

Formula 2(1)

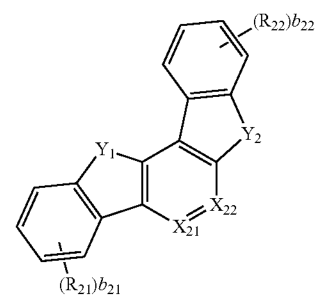

Formula 2(2)

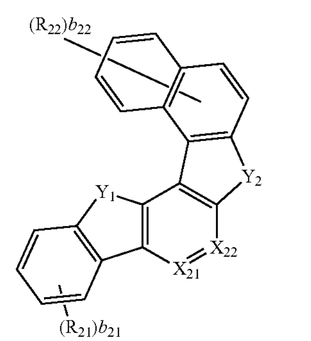

-continued
Formula 2(3)
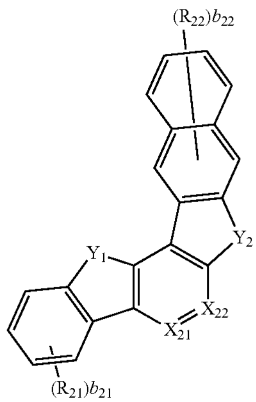
Formula 2(4)
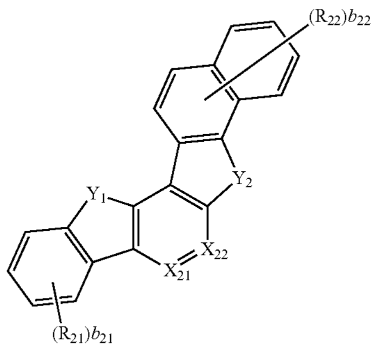
Formula 2(5)
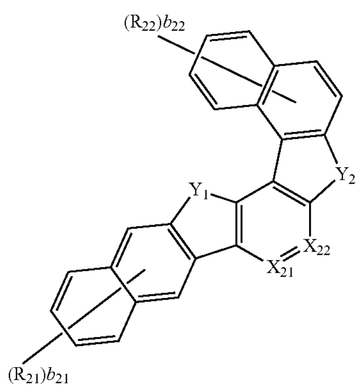
Formula 2(6)
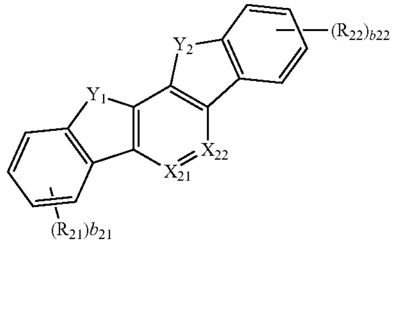
-continued
Formula 2(7)
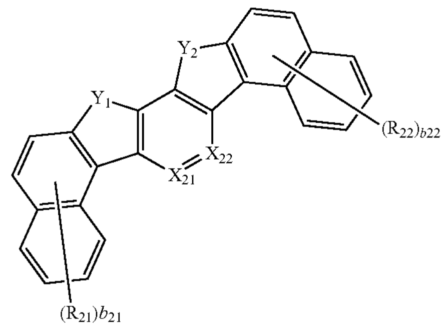
Formula 2(8)
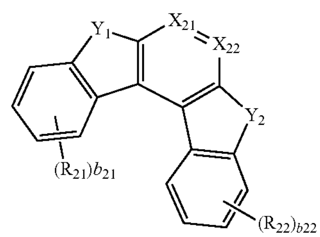
Formula 2(9)
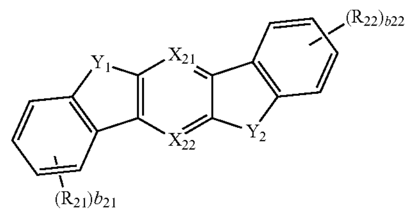
Formula 2(10)
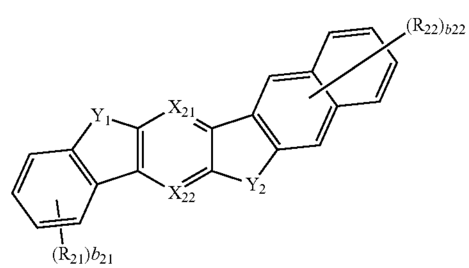
Formula 2(11)
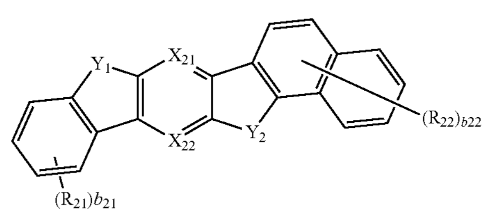
Formula 2(12)
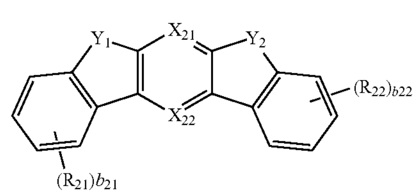

-continued

Formula 2(13)

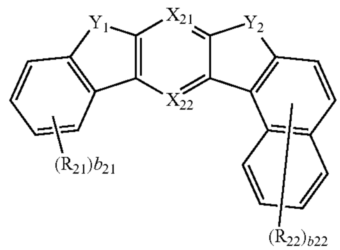

Formula 3A

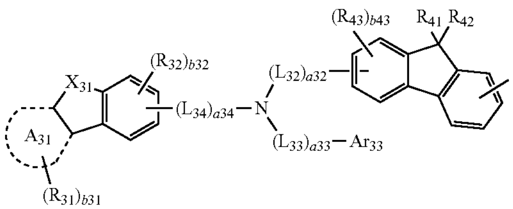

Formula 3B

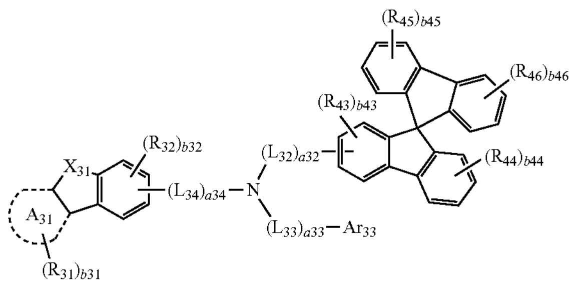

Formula 3C

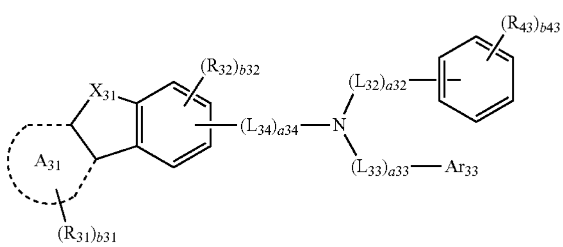

Formula 3D

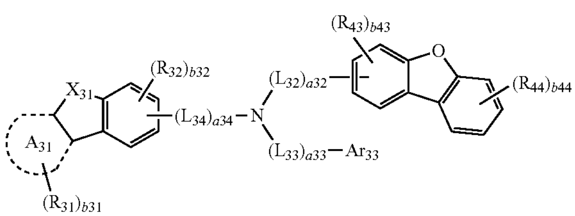

Formula 3E

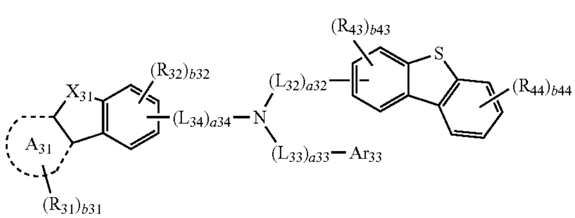

In Formulae 1A to 1G, $X_{11}$ may be selected from O, S, N[$(L_{12})_{a12}$-$Ar_{12}$], C($R_{15}$)($R_{16}$), Si($R_{15}$)($R_{16}$), P[$(L_{12})_{a12}$-$Ar_{12}$], B[$(L_{12})_{a12}$-$Ar_{12}$], and P(=O)[$(L_{12})_{a12}$-$Ar_{12}$];

at least one of $Ar_{11}$ and $Ar_{12}$ may be $ET_1$;

$L_{11}$ to $L_{13}$, a11 to a13, $R_{11}$ to $R_{16}$, and b1 to b14 may be the same as defined herein;

in Formulae 2(1) to 2(13), $Y_1$ may be N[$(L_{21})_{a21}$-$Ar_{21}$];

$Y_2$ may be selected from N[$(L_{22})_{a22}$-$Ar_{22}$], O, S, C($R_{25}$)($R_{26}$), and Si($R_{25}$)($R_{26}$);

$X_{21}$ may be C($R_{23}$) and $X_{22}$ may be C($R_{24}$);

$Ar_{21}$ and $Ar_{22}$ may be $HT_1$;

a21, a22, b21, and b22 may be each independently selected from 0, 1, 2, and 3;

in Formulae 3A to 3E, $X_{31}$ may be selected from O, S, and N[$(L_{31})_{a31}$-$Ar_{31}$];

a31 to a34, b31, b32, and b43 to b46 may be each independently selected from 0, 1, 2, and 3;

$A_{31}$, $Ar_{31}$, and $Ar_{33}$ may be the same as defined herein;

in Formulae 2(1) to 2(13) and Formulae 3A to 3E, $L_{21}$, $L_{22}$, and $L_{31}$ to $L_{34}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$);

$R_{21}$ to $R_{26}$, $R_{31}$, $R_{32}$, and $R_{41}$ to $R_{46}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$); and —Si($Q_1$)($Q_2$)($Q_3$), where $Q_1$ to $Q_3$ and $Q_{31}$ to $Q_{33}$ may be each independently selected from a $C_1$-$C_{10}$ alkyl group, a $C_1$-$C_{10}$ alkoxy group, a phenyl group, and a naphthyl group.

In some embodiments, the first material may be selected from Compounds 101A to 189A and Compounds 101B to 163B, the second material may be selected from Compounds 301A to 373A and Compounds 301B to 460B, and the third material may be selected from Compounds 501 to 796:

101A

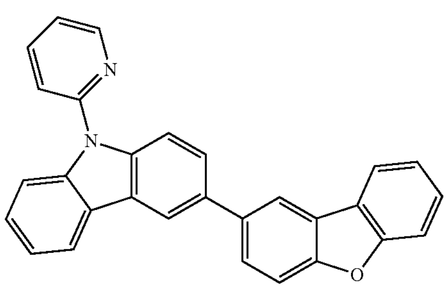

102A

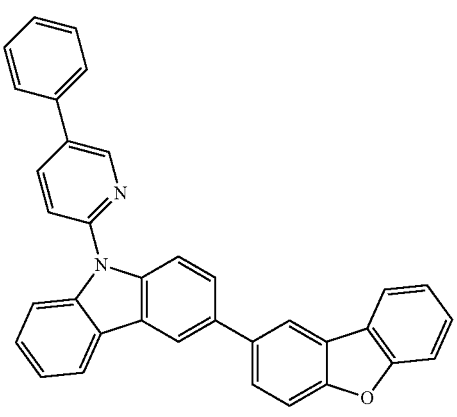

-continued
103A
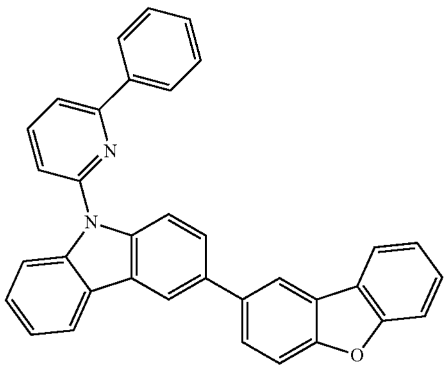
104A
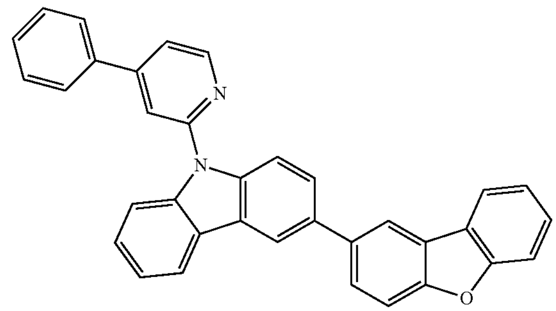
105A
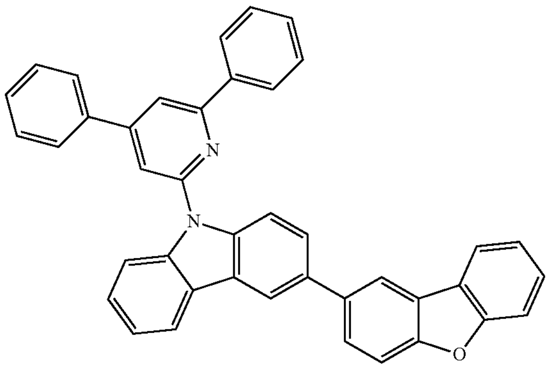
106A
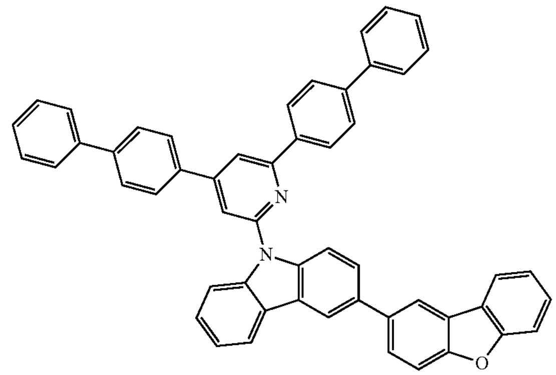
107A
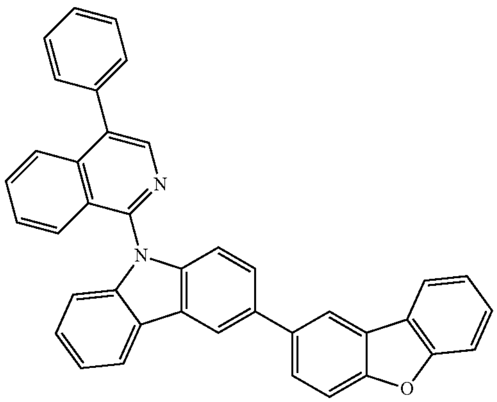
108A
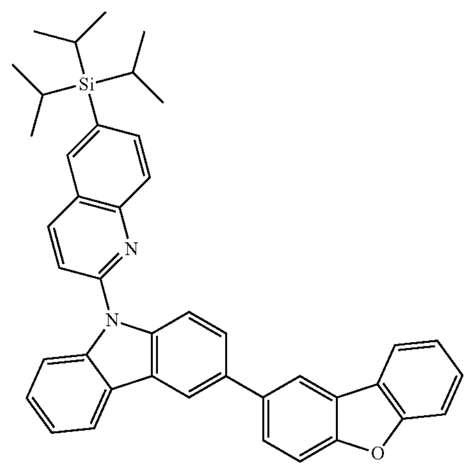
109A
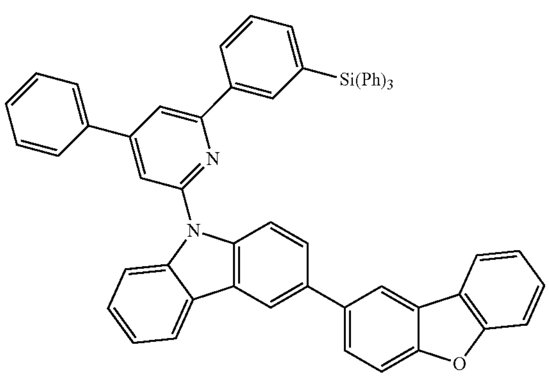
110A
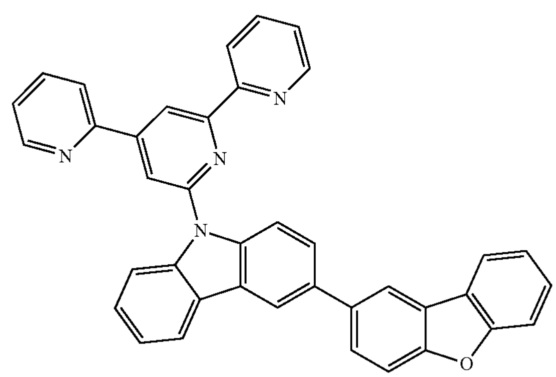

-continued
111A
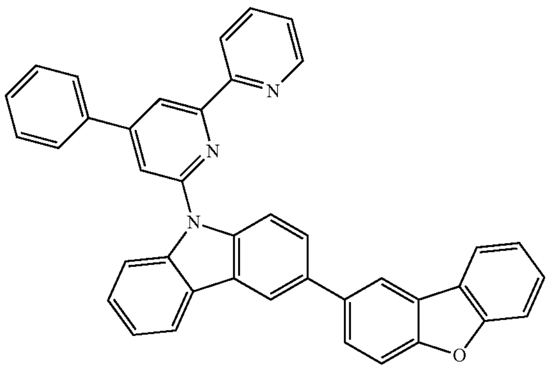
112A
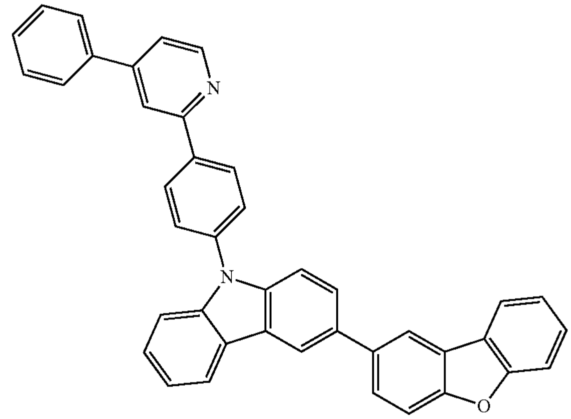
113A
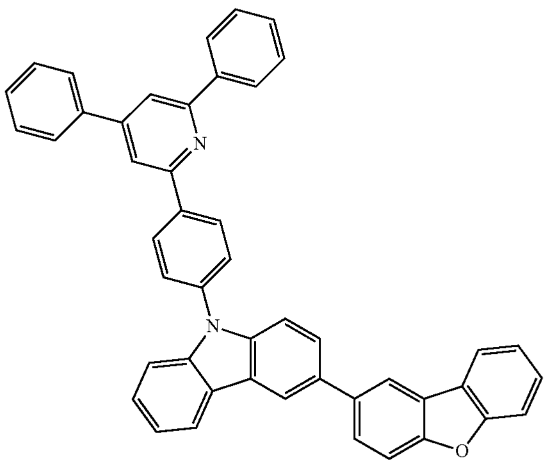
114A
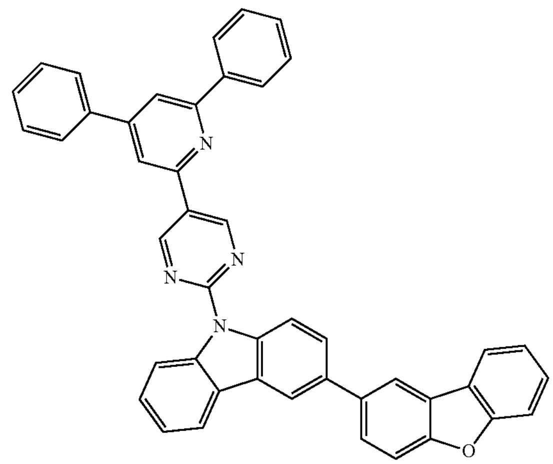
115A
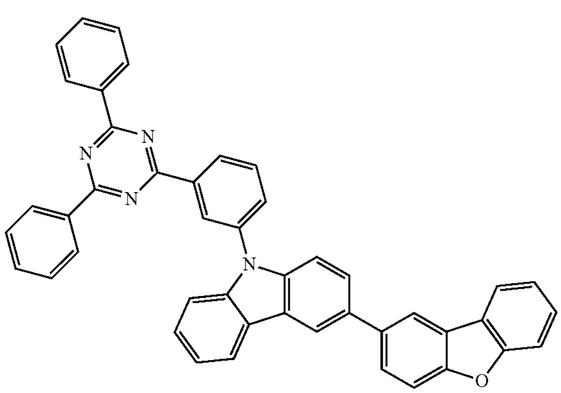
116A
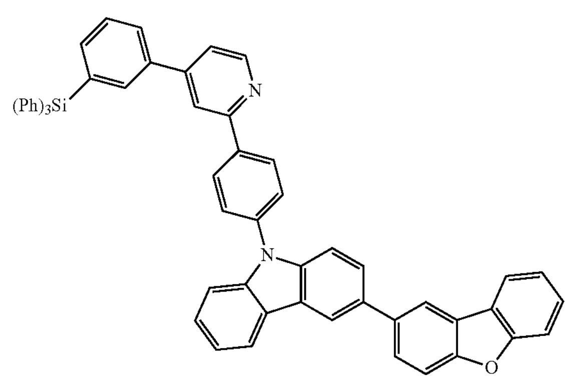

-continued
117A
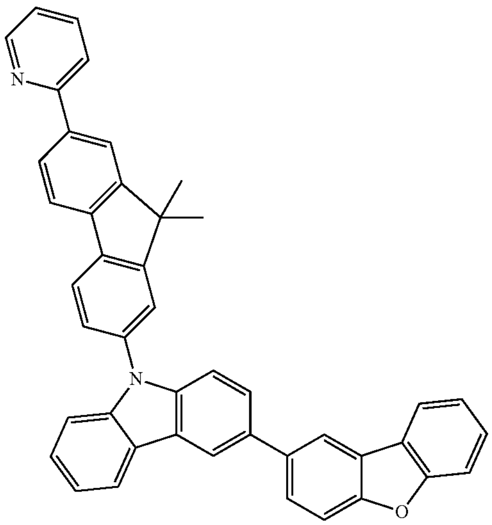
118A
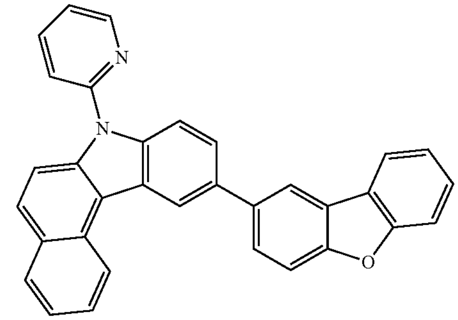
119A
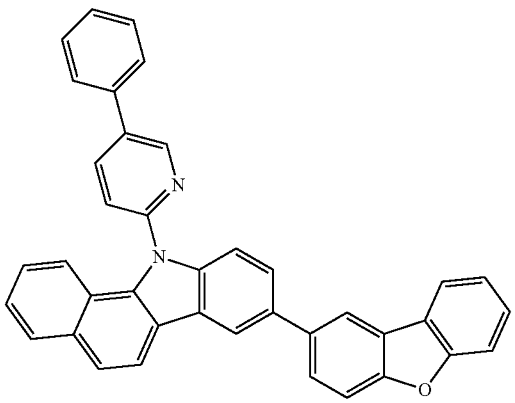
120A
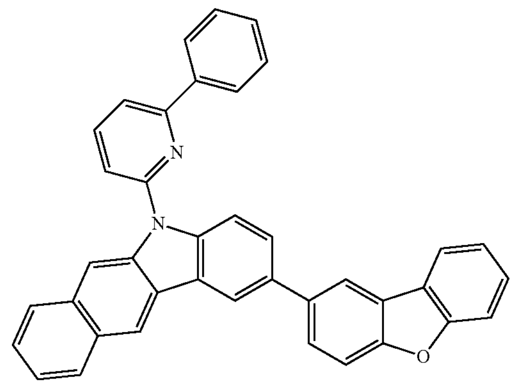
121A
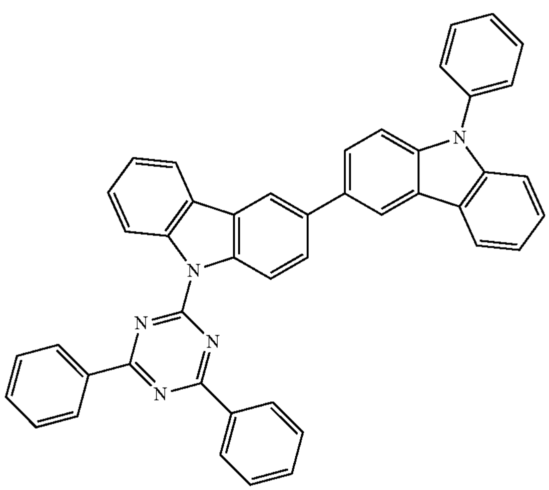
122A
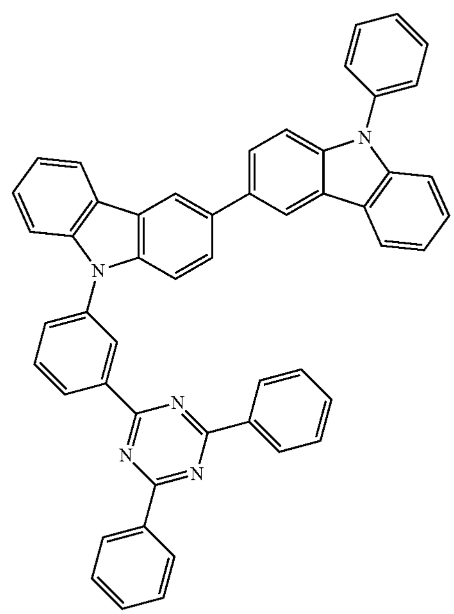

-continued
123A
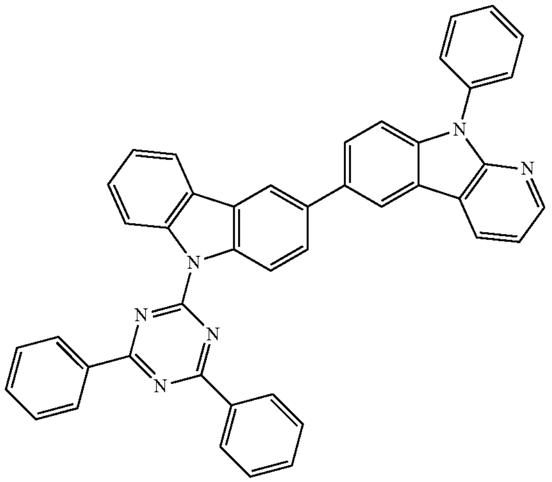
124A
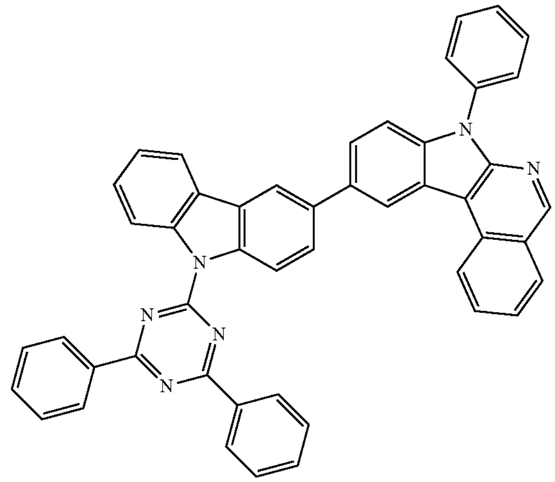
125A
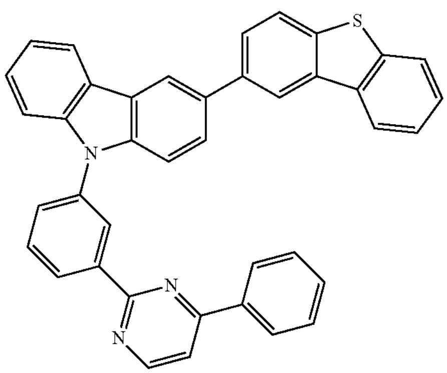
126A
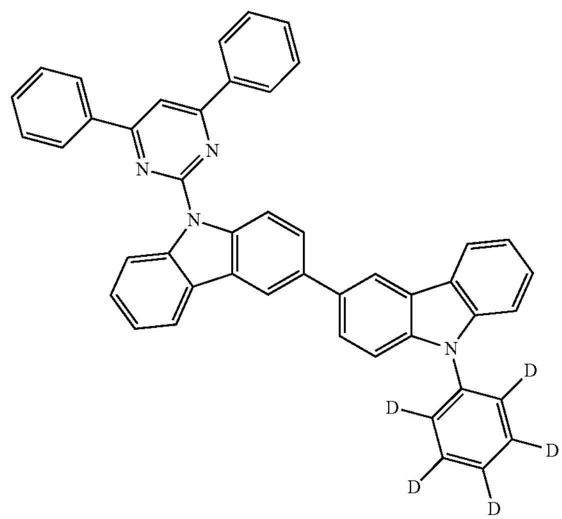
127A
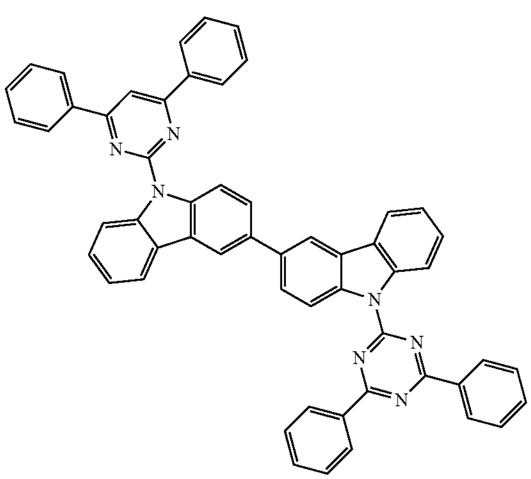
128A
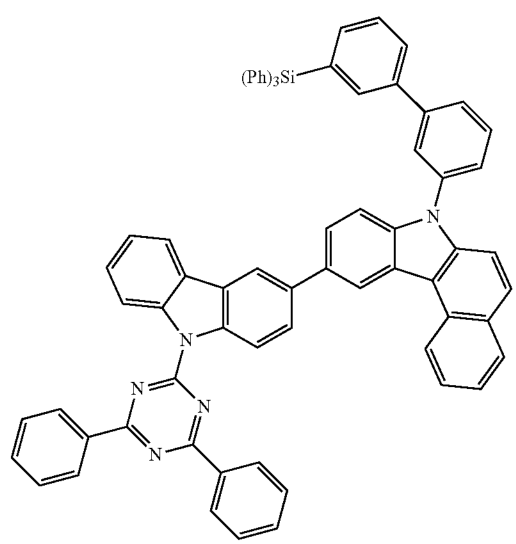

-continued
129A
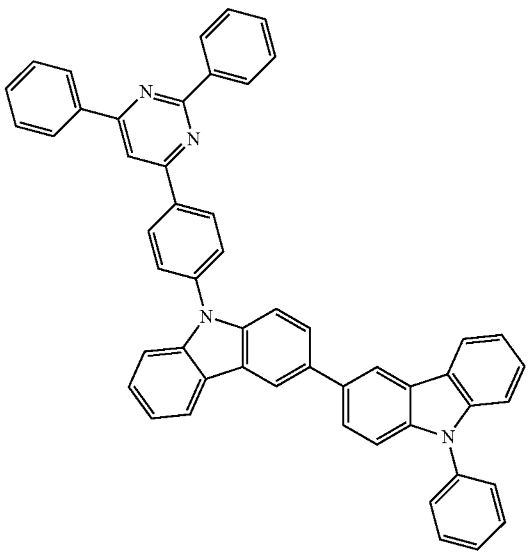
130A
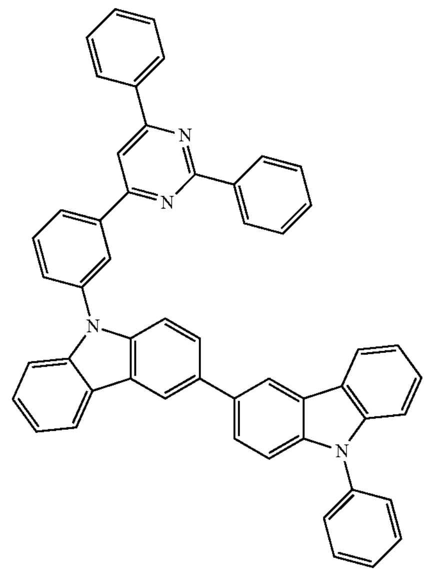
131A
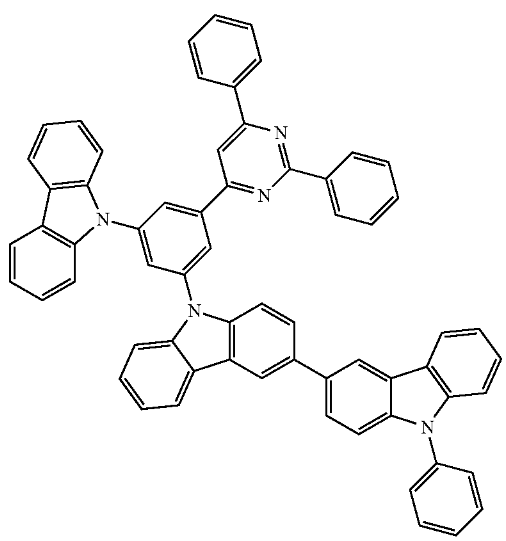
132A
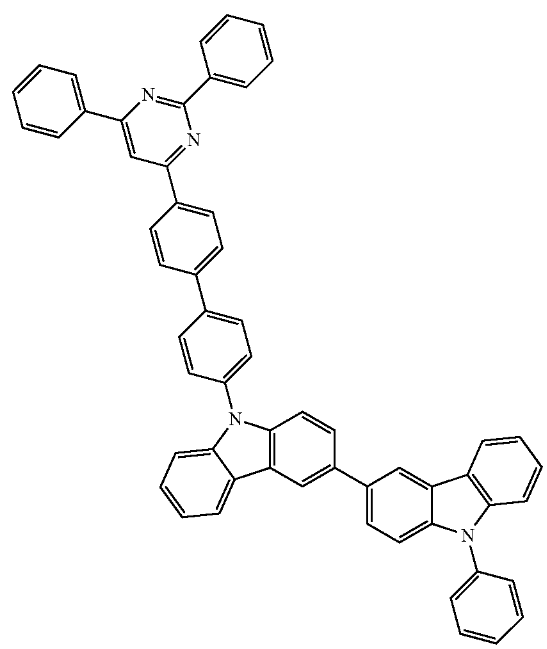

-continued
133A
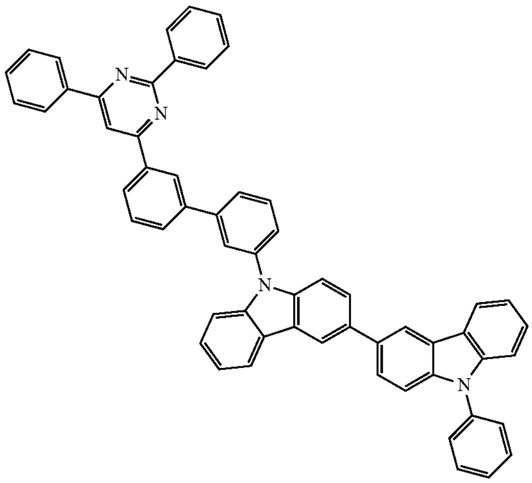
134A
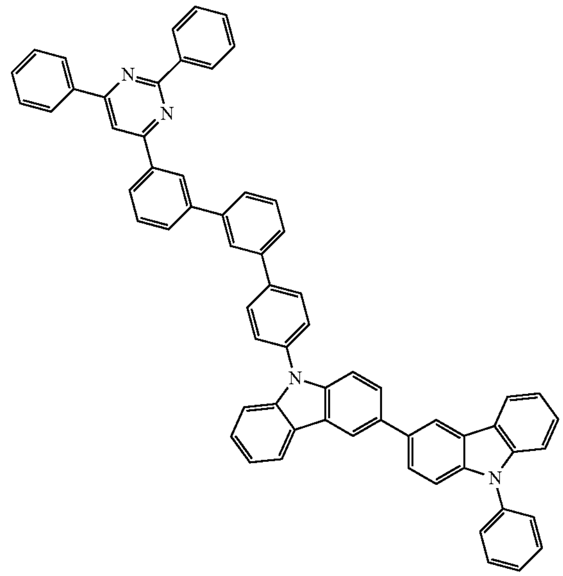
135A
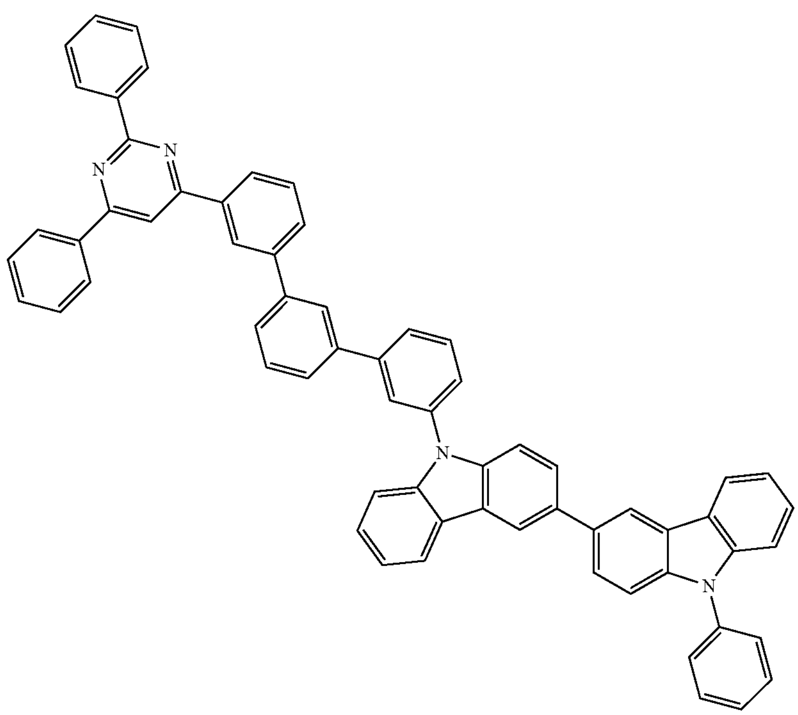

-continued
136A
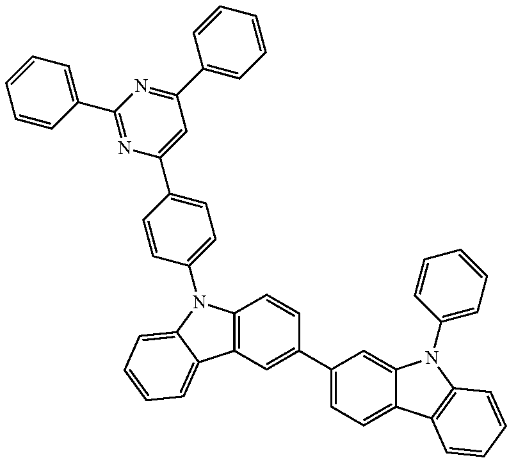
137A
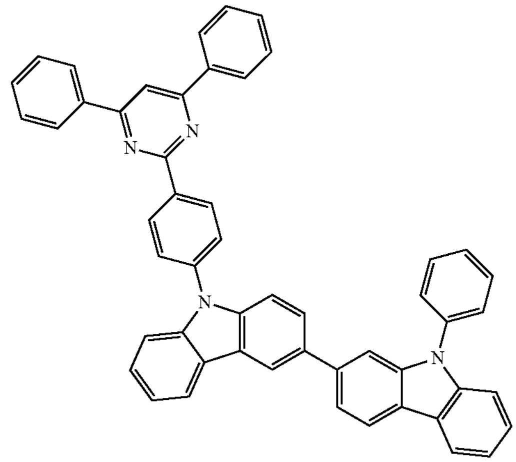
138A
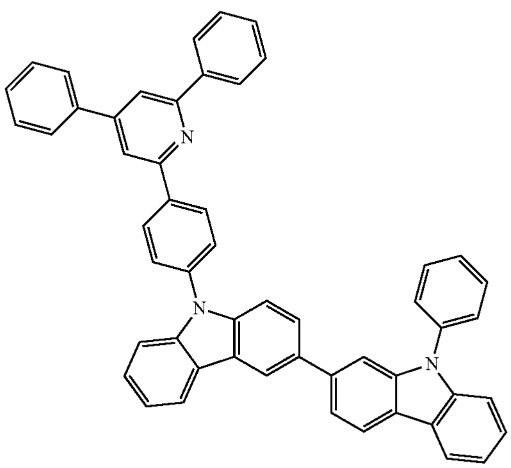
139A
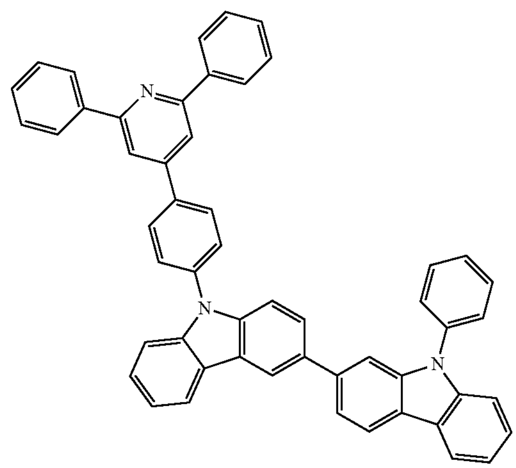
140A
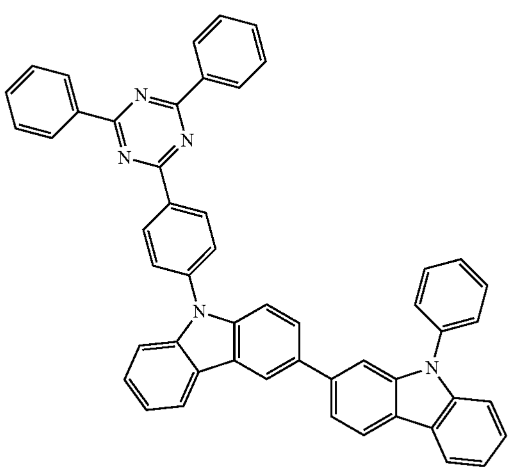
141A
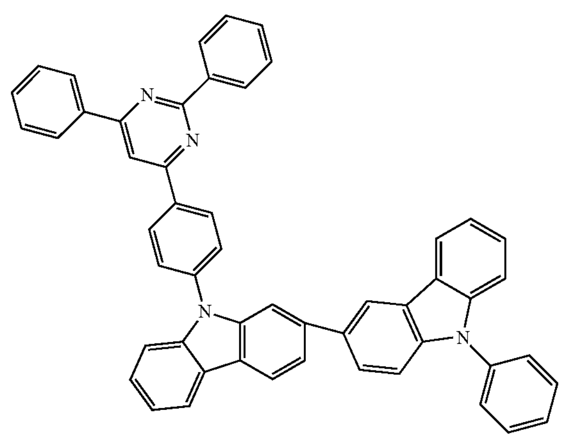

-continued
142A
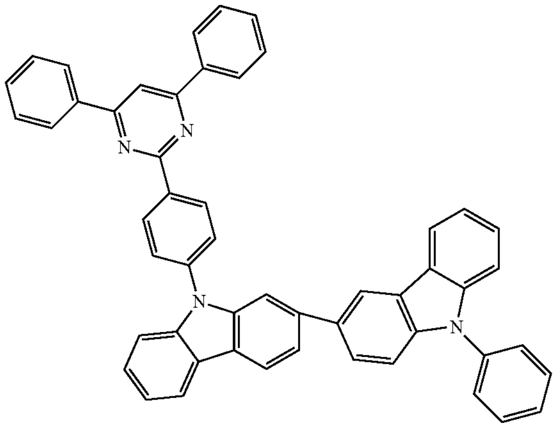
143A
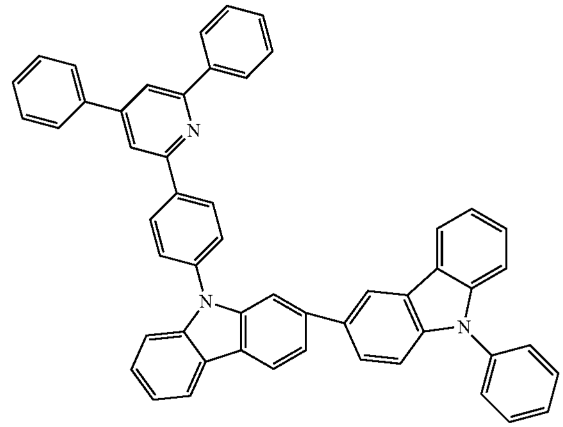
144A
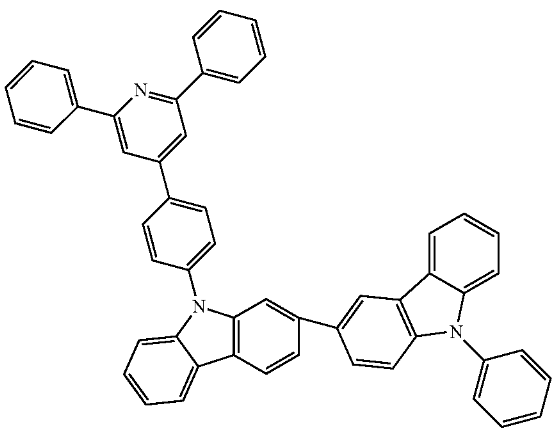
145A
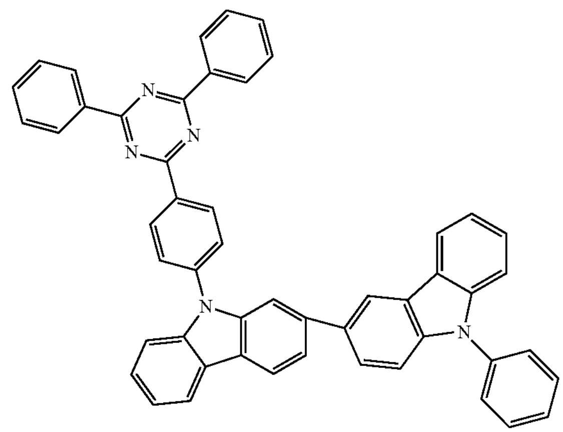
146A
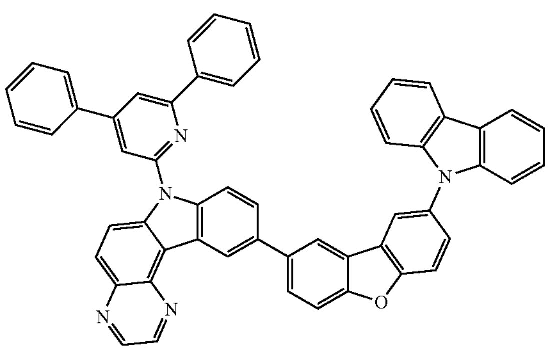
147A
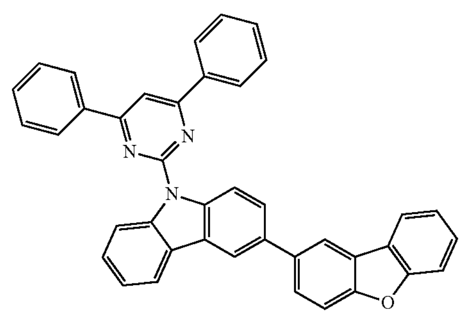
148A
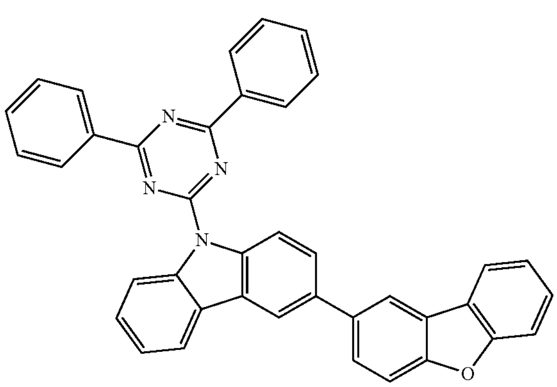
149A
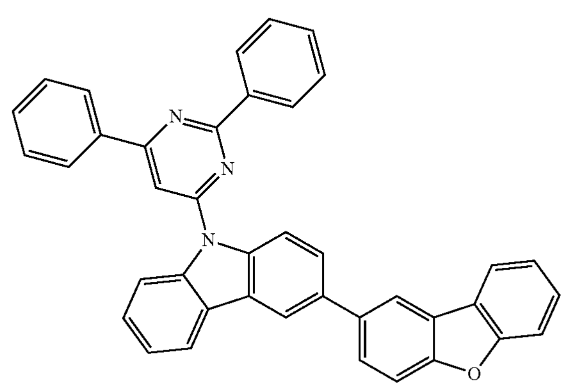

-continued
150A
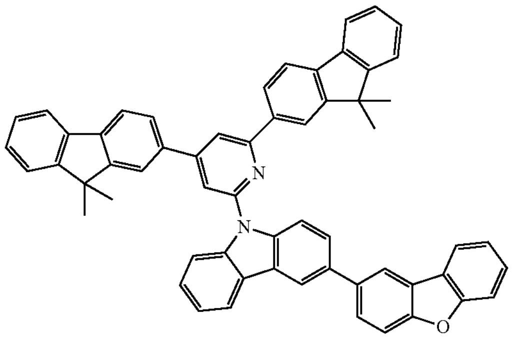
151A
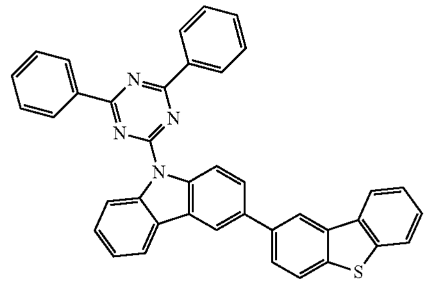
152A
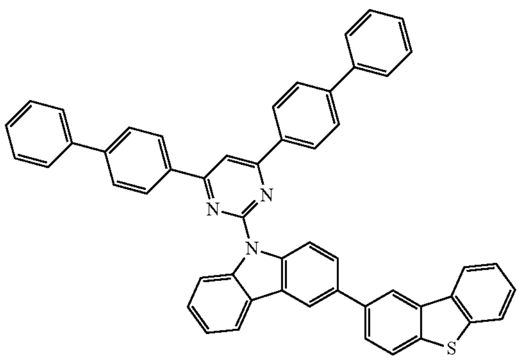
153
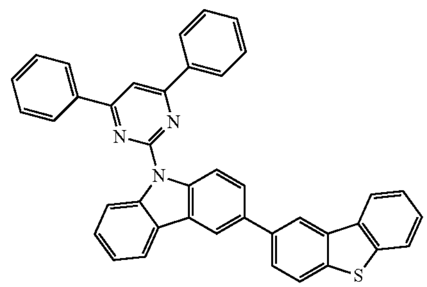
154A
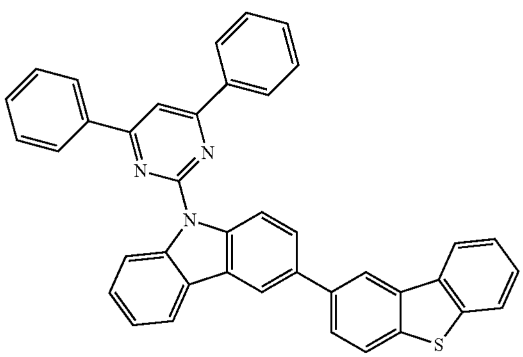
155A
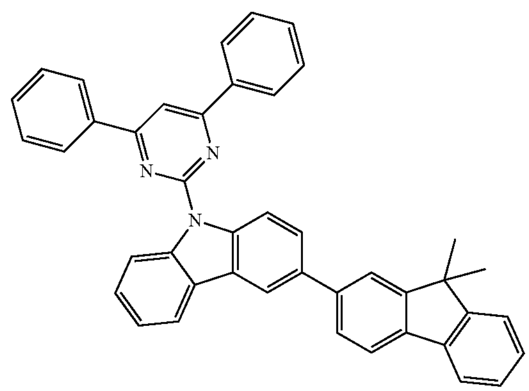
156A
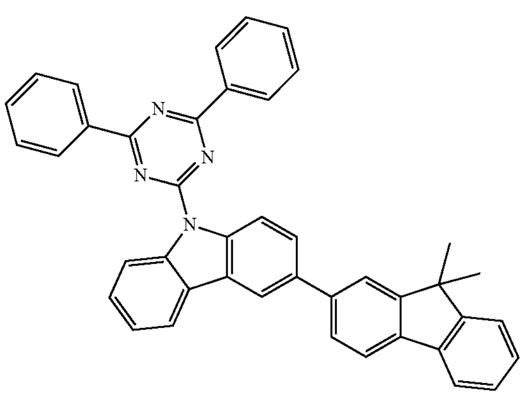
157
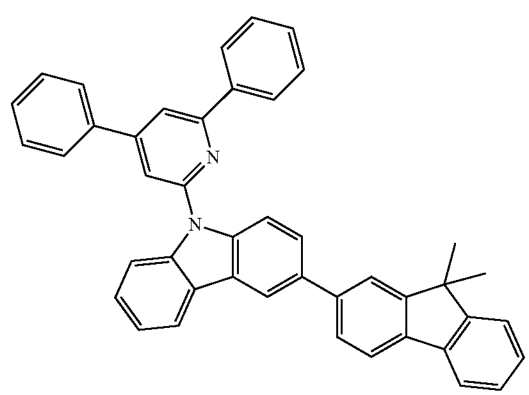

-continued
158A
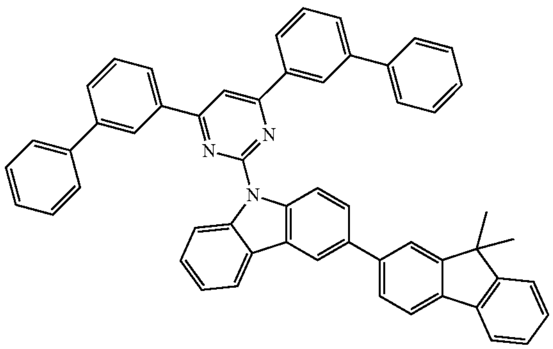
159A
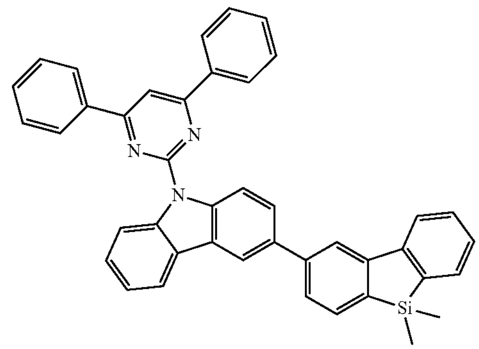
160A
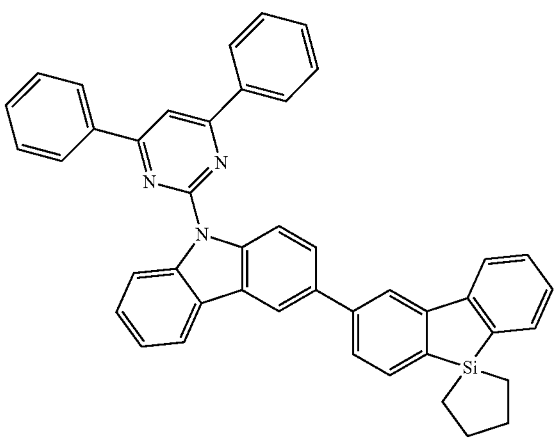
161A
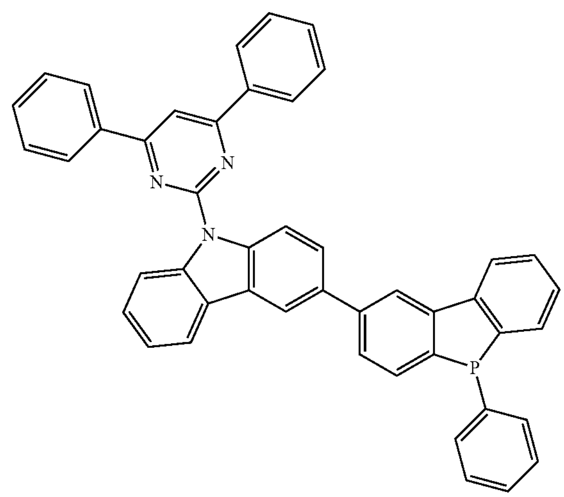
162A
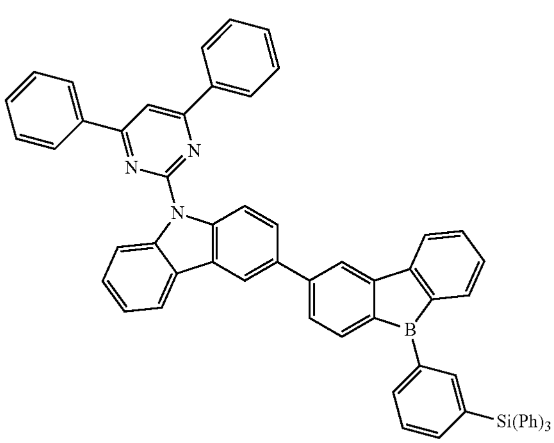
163A
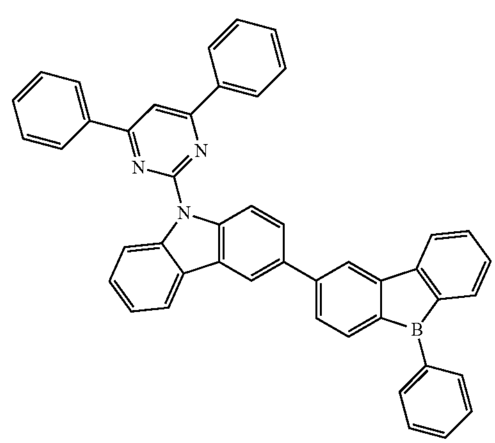

-continued
164A
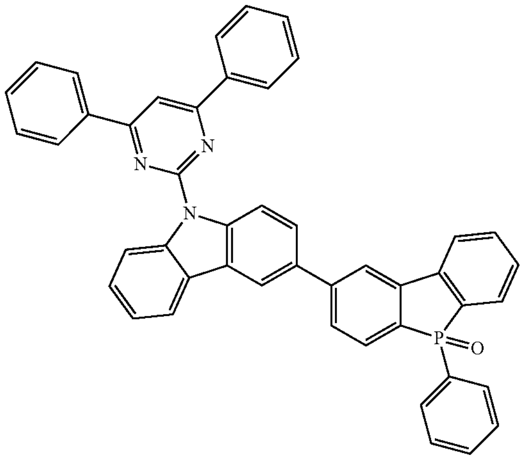
165A
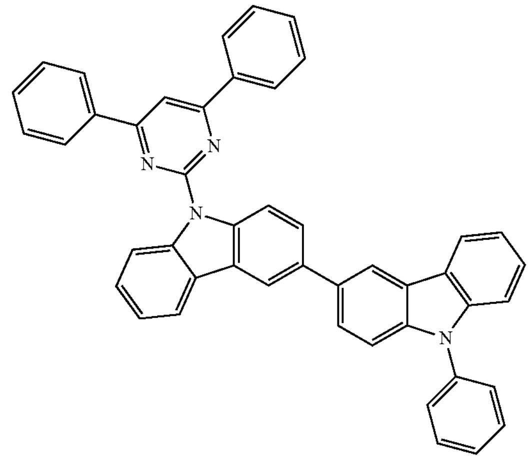
166A
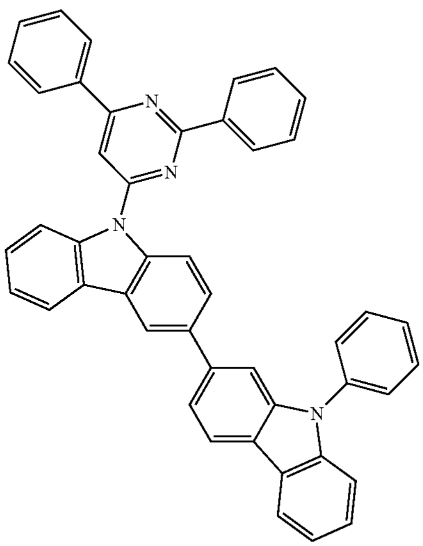
167A
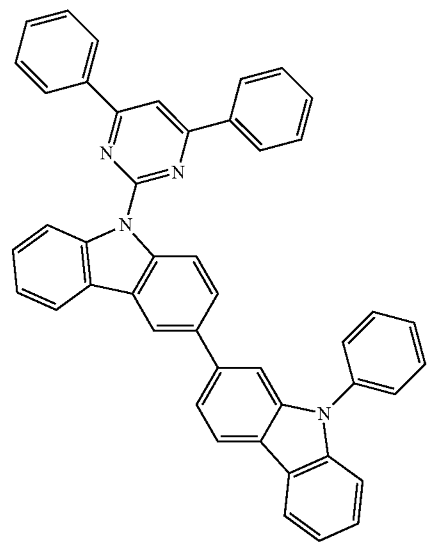
168A
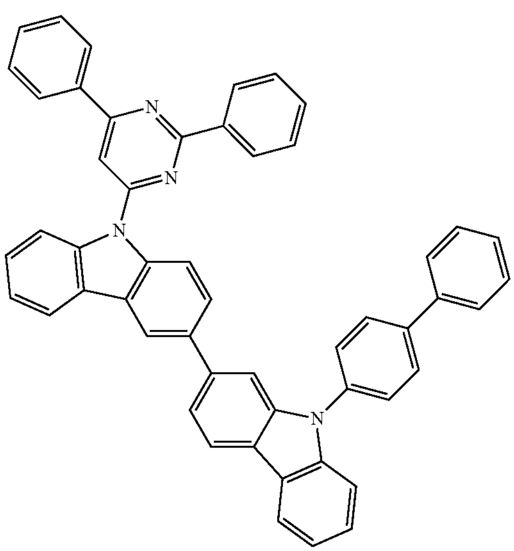
169A
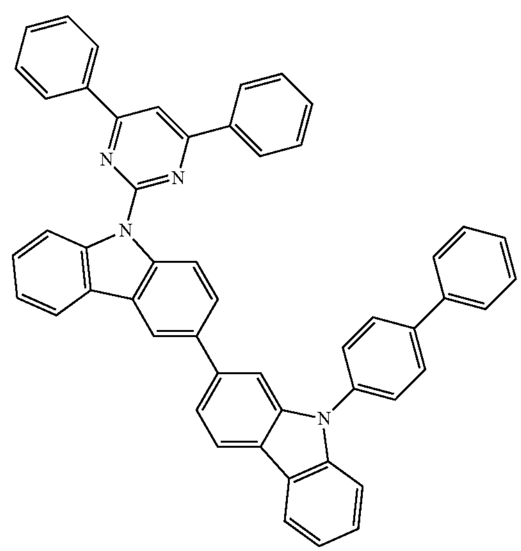

-continued
170A
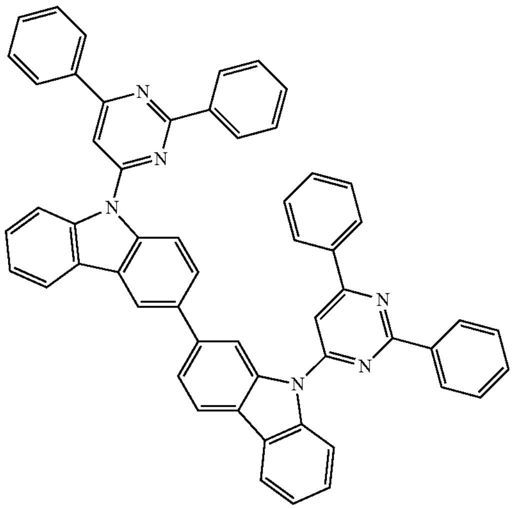
171A
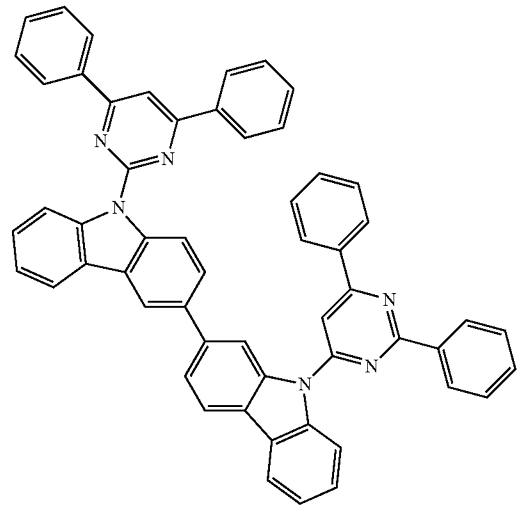
172A
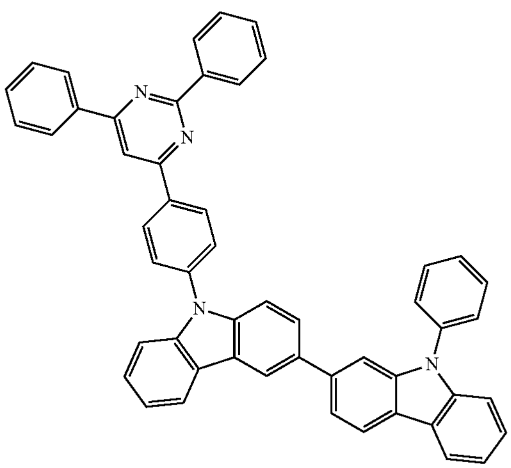
173A
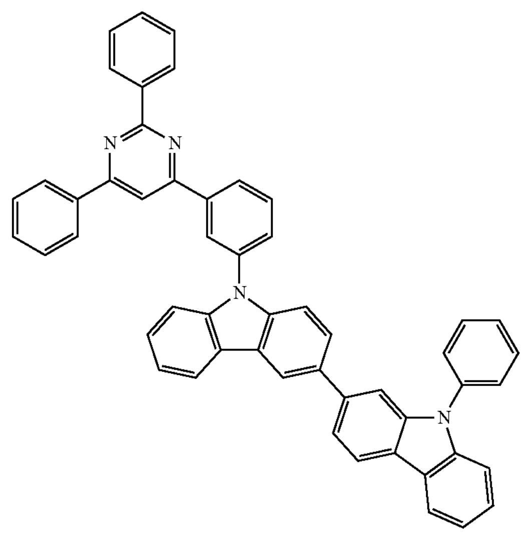
174A
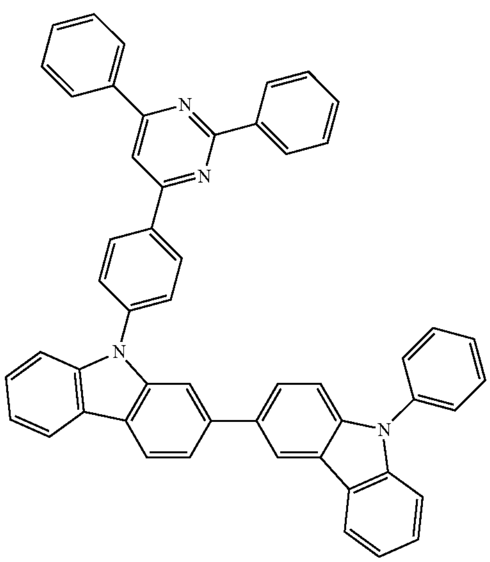
175A
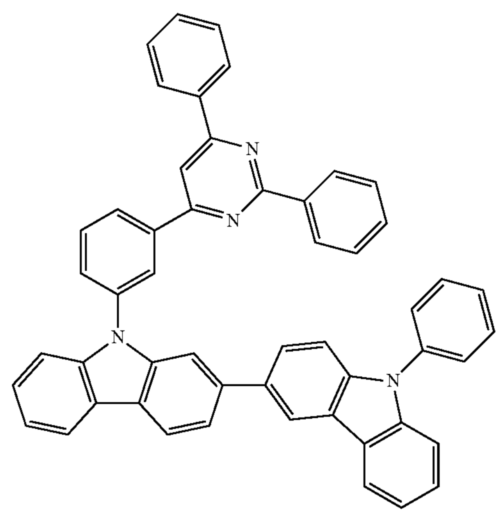

-continued
176A
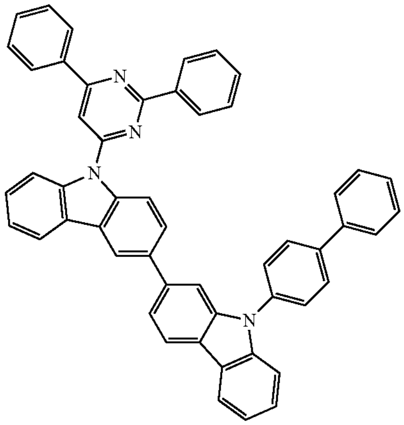
177A
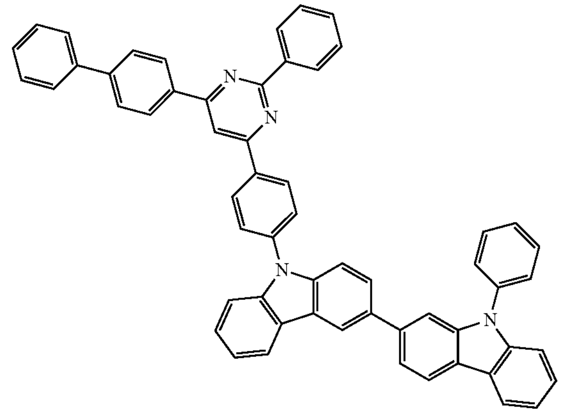
178A
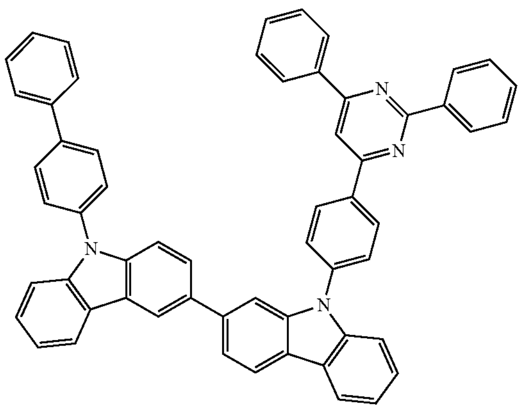
179A
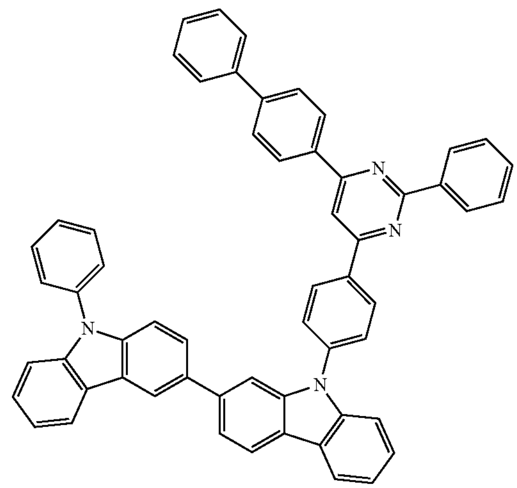
180A
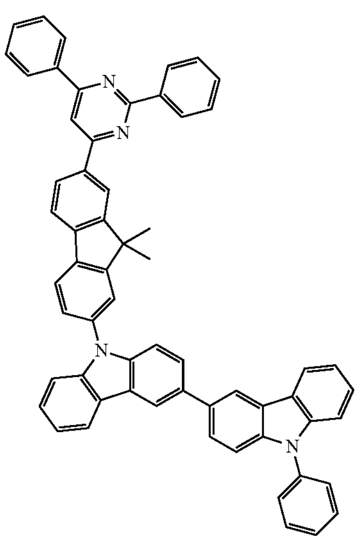
181A
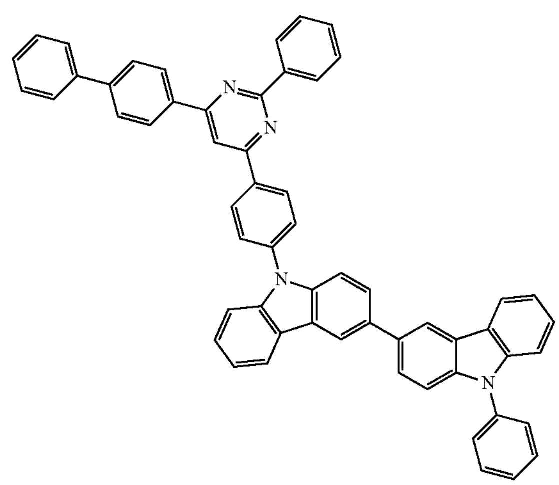

-continued
182A
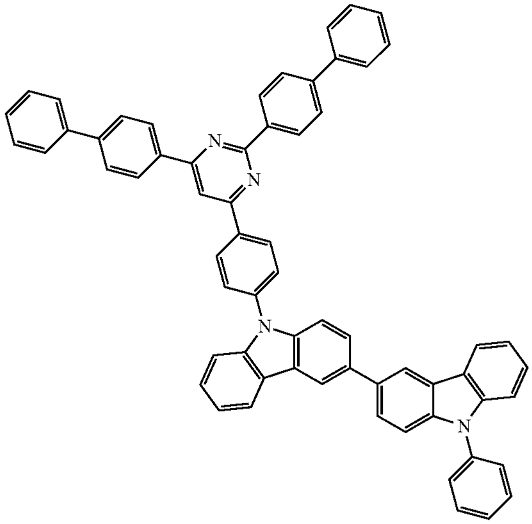
183A
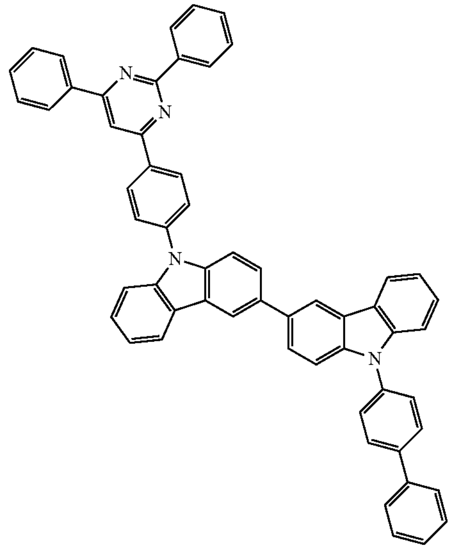
184A
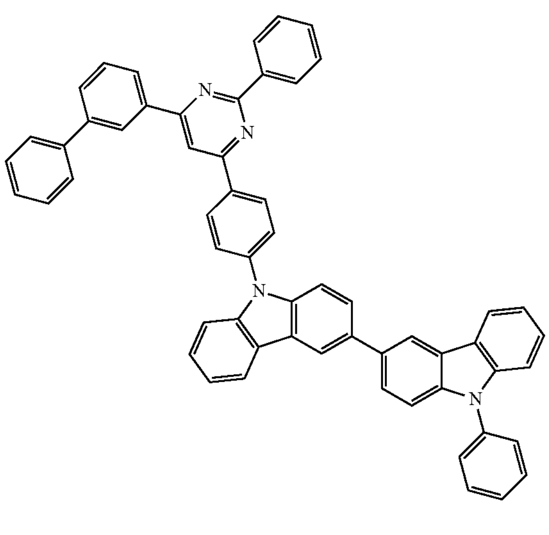

-continued
185A
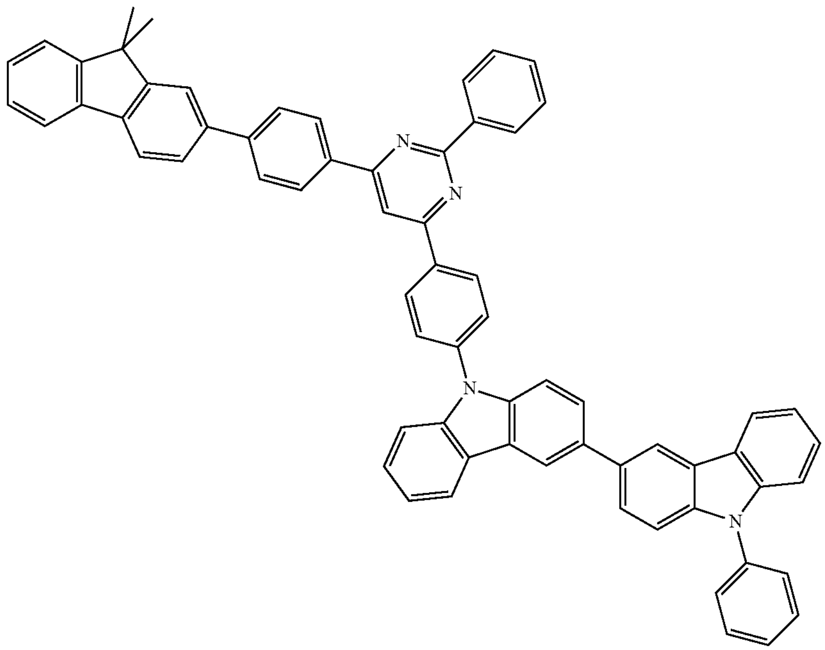
186A
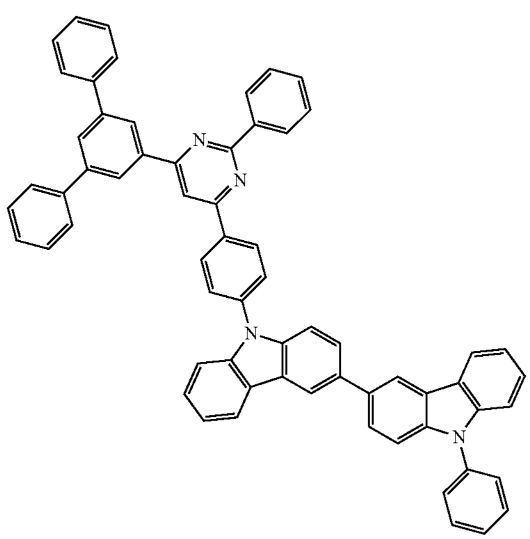
187A
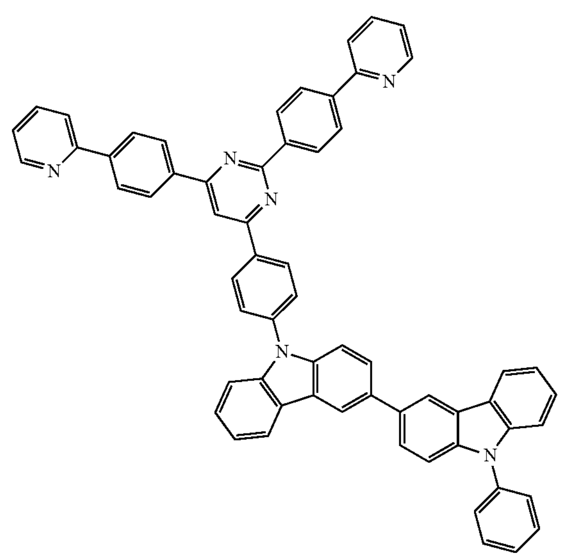

-continued
188A
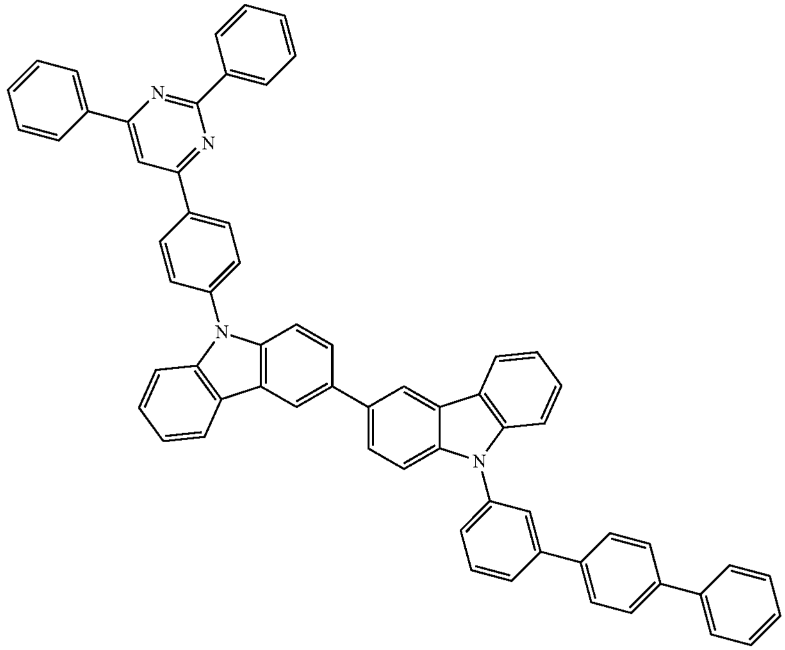
189A
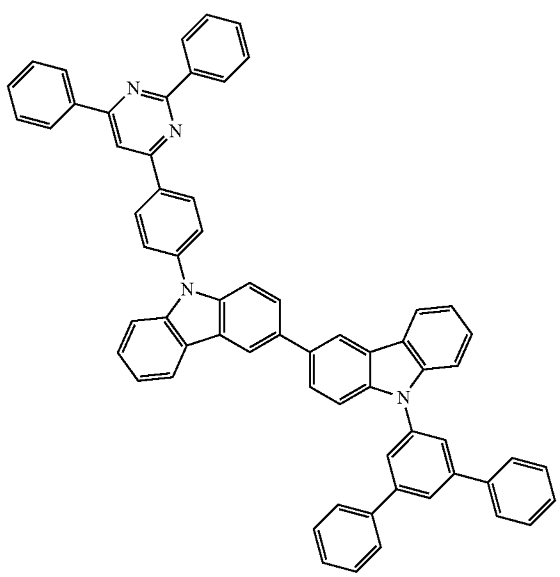
101B
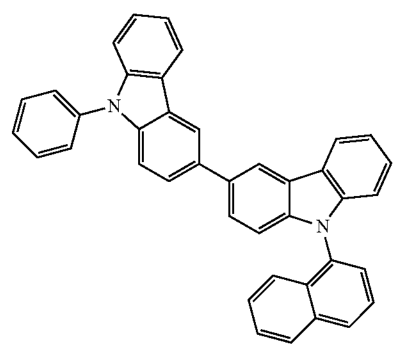

-continued
102B
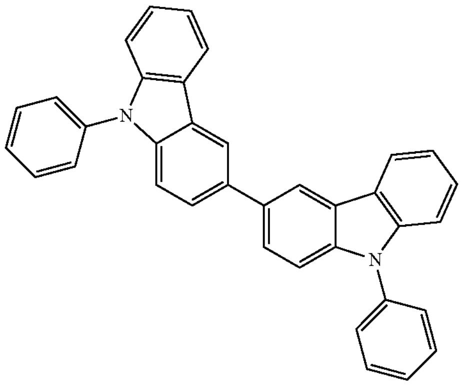
103B
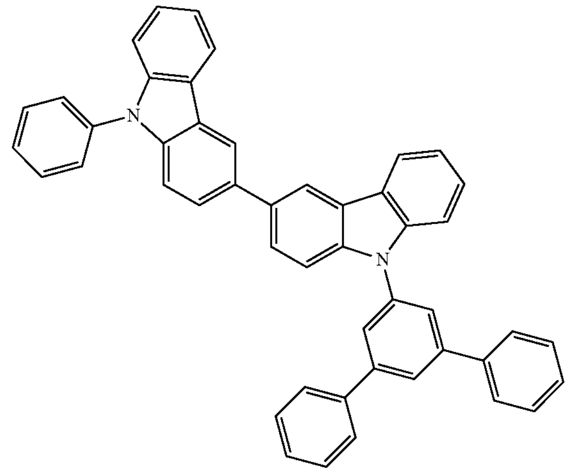
104B
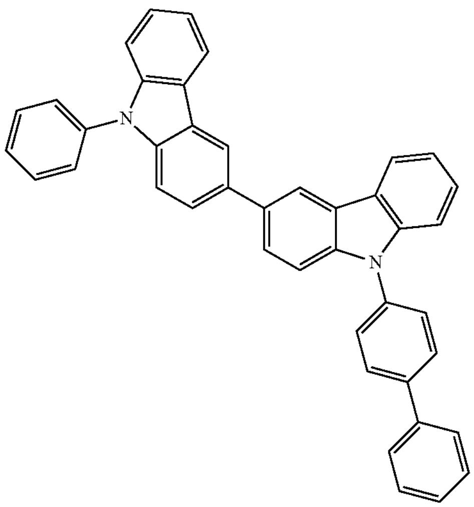
105B
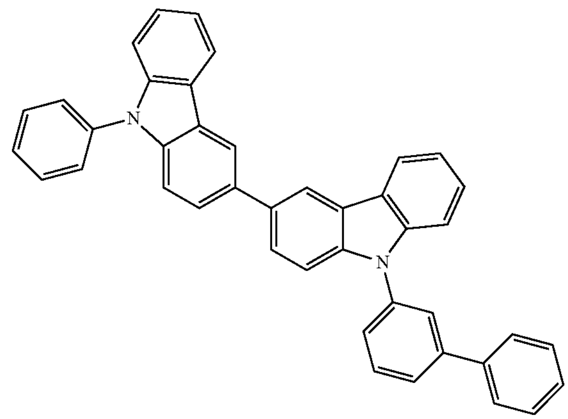
106B
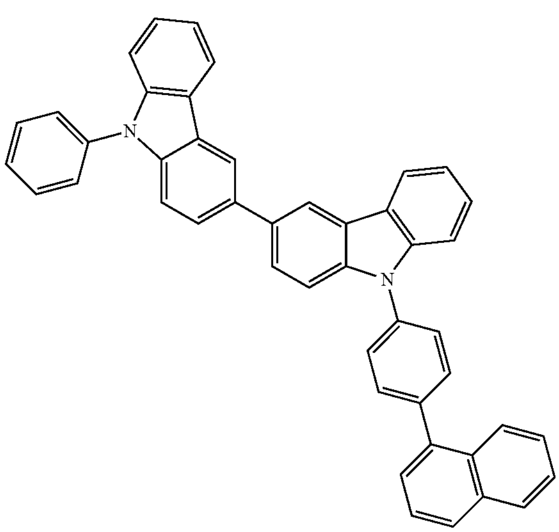
107B
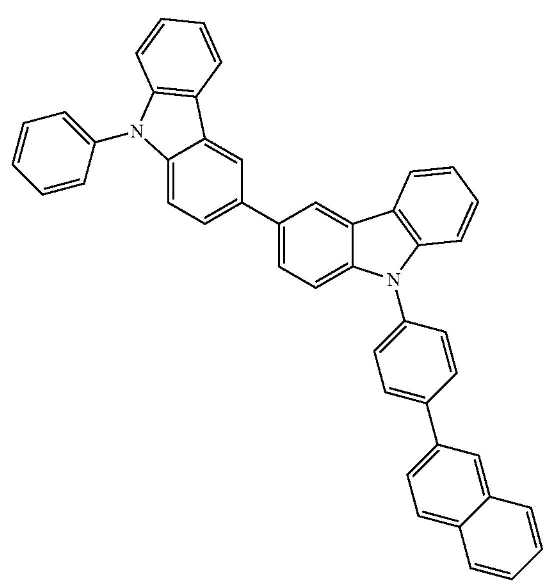

-continued
108B
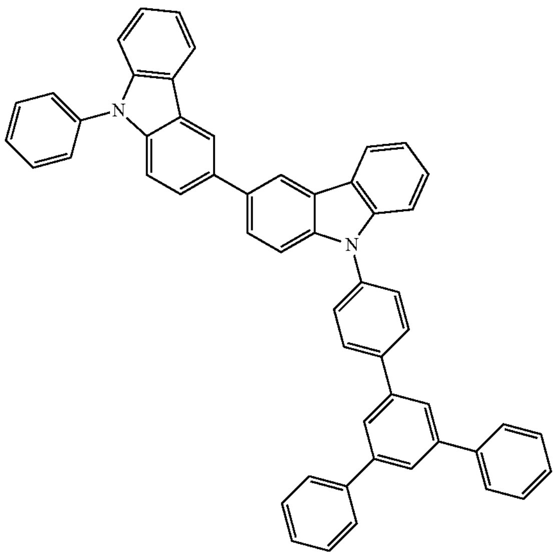
109B
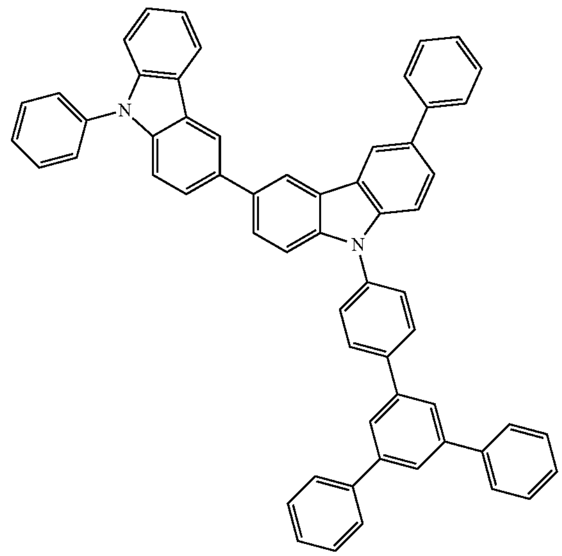
110B
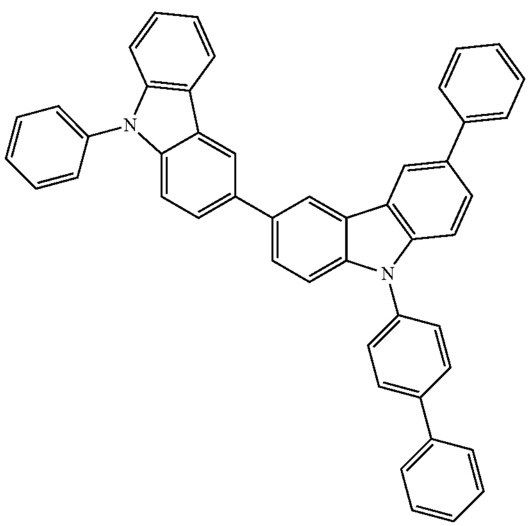
111B
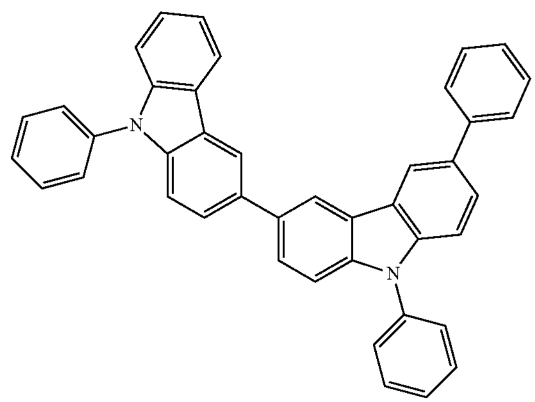
112B
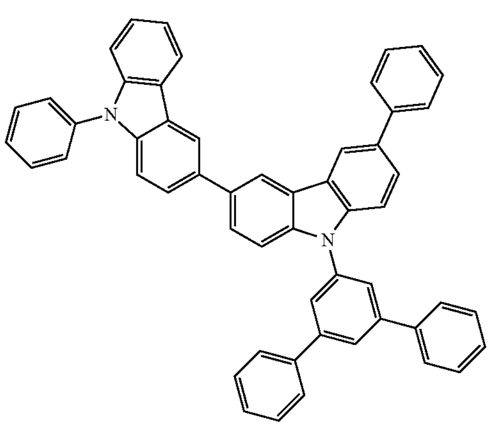
113B
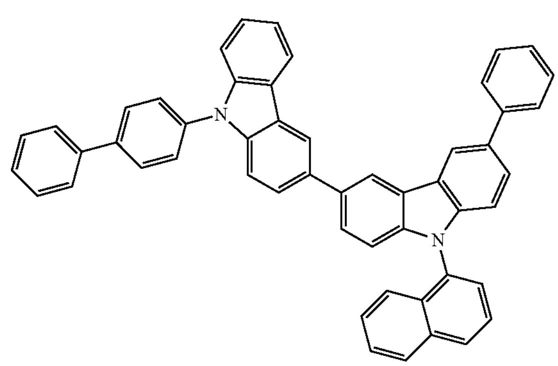

-continued
114B
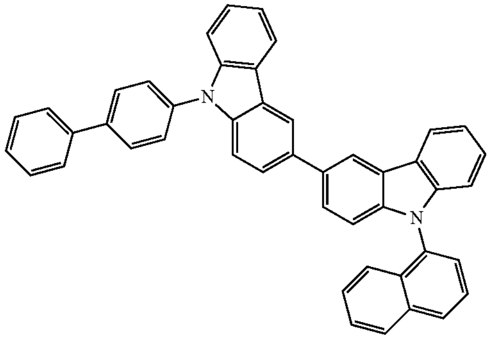
115B
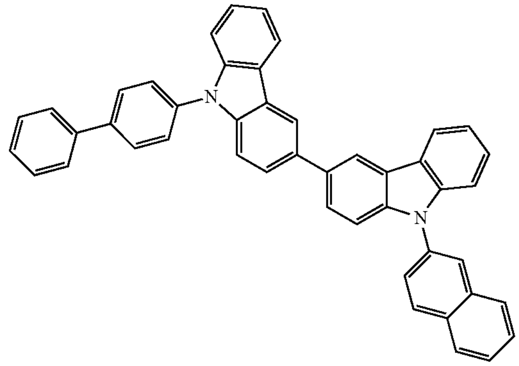
116B
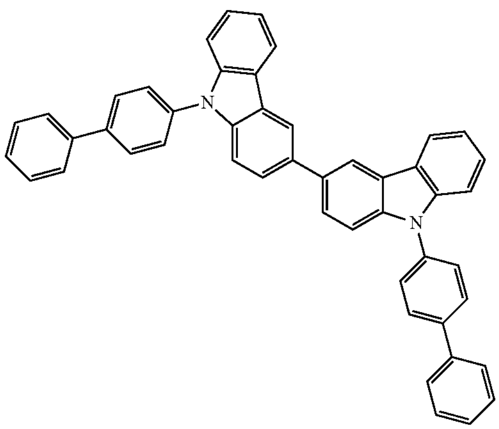
117B
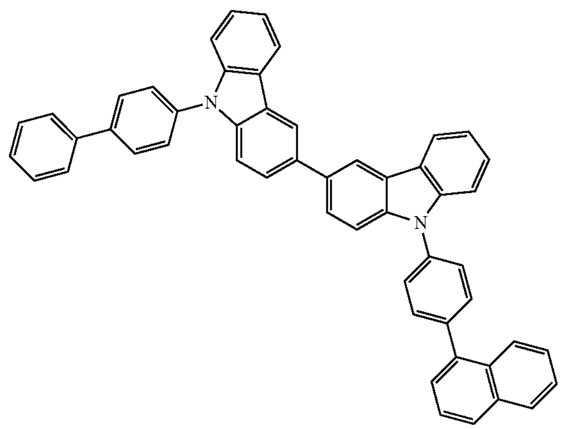
118B
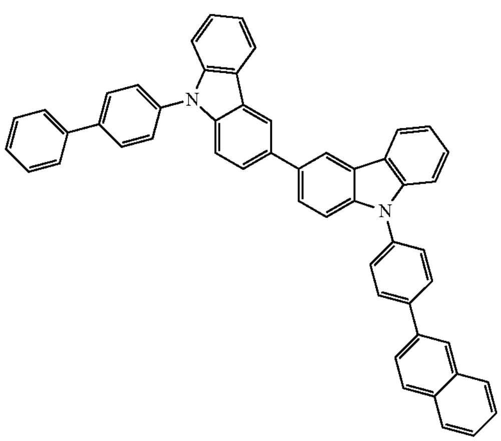
119B
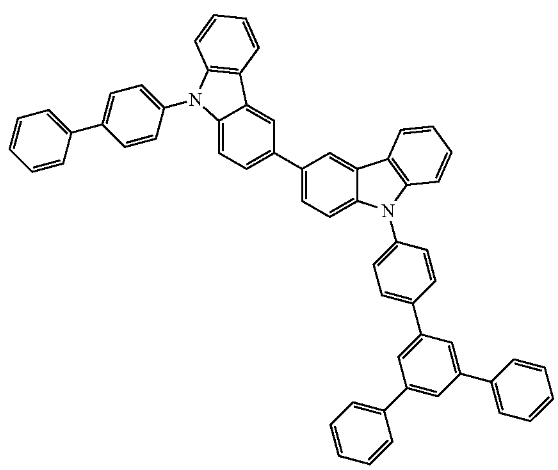

-continued
120B
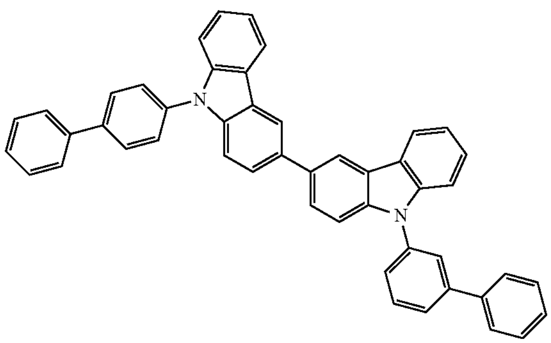
121B
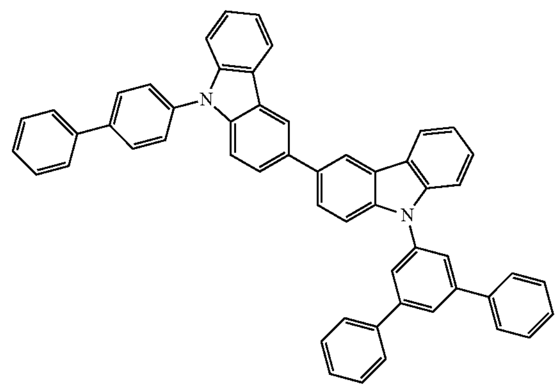
122B
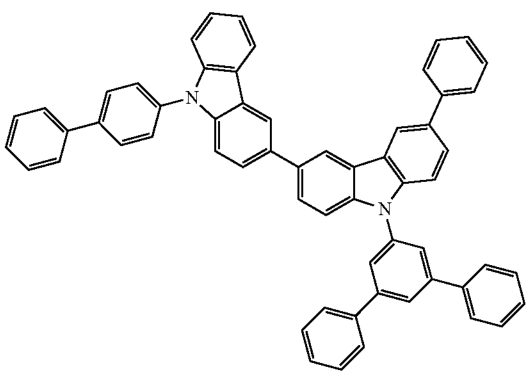
123B
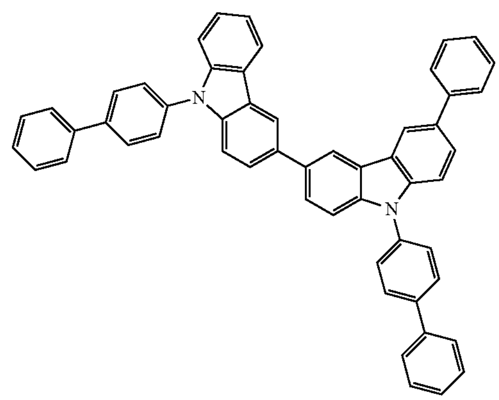
124B
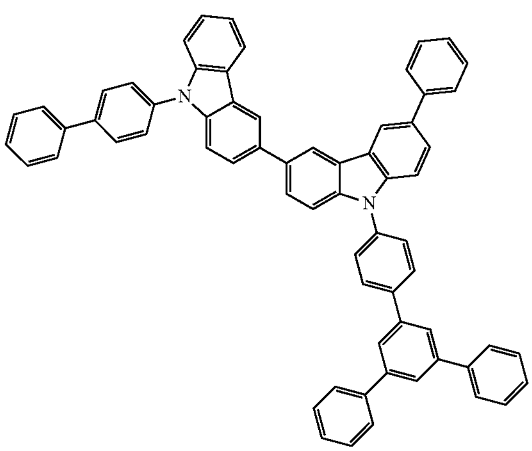
125B
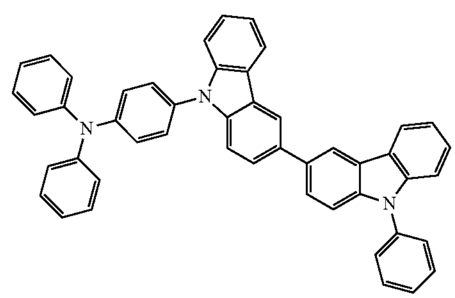
126B
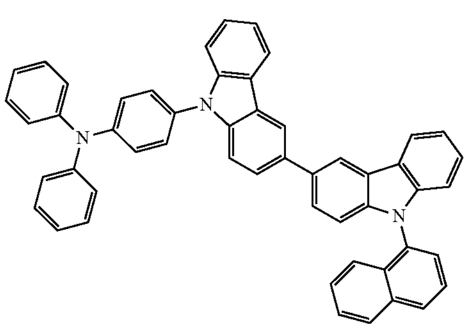
127B
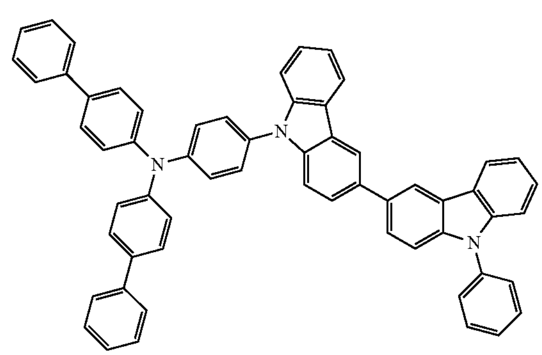

-continued
128B
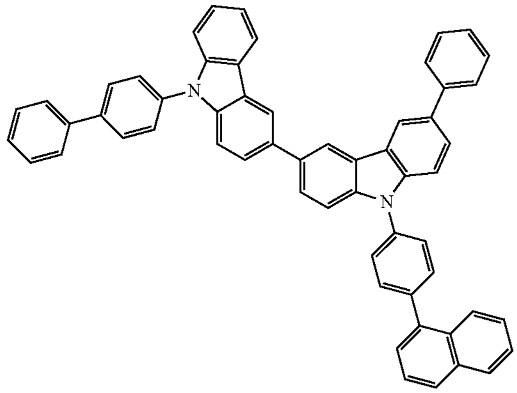
129B
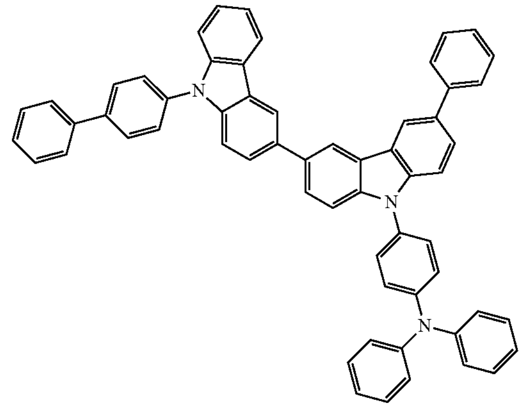
130B
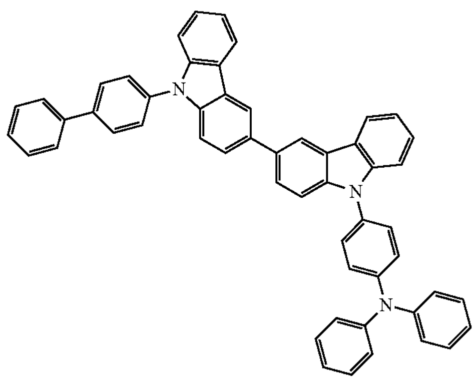
131B
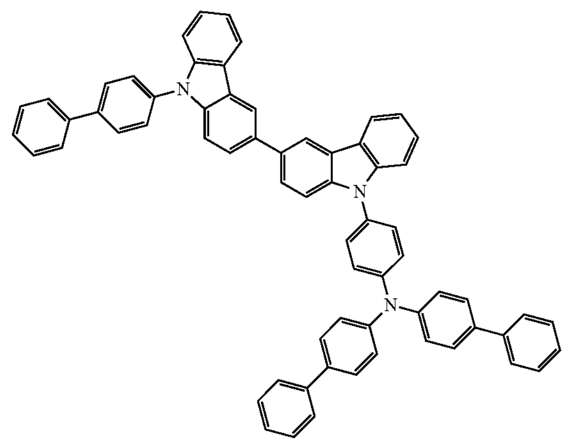
132B
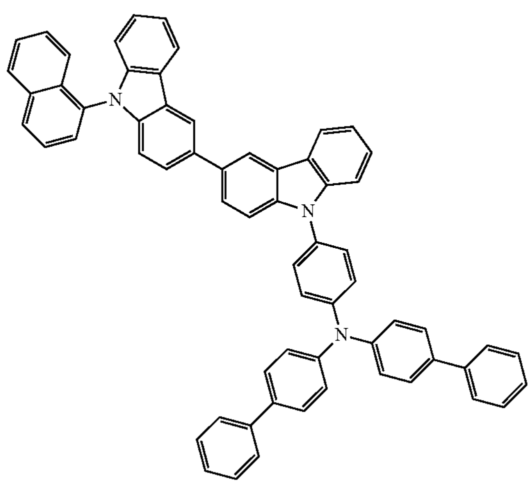
133B
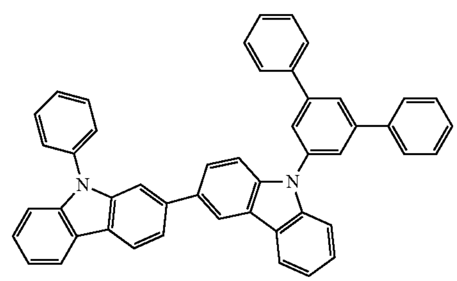

-continued
134B
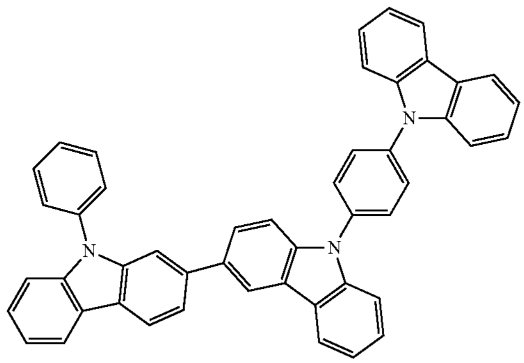
135B
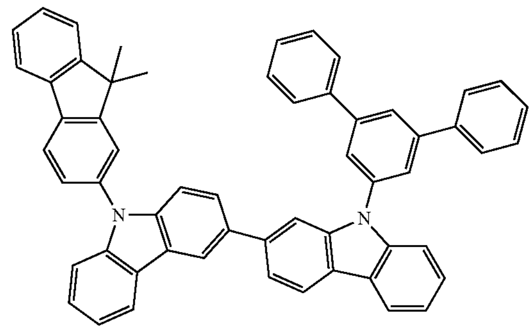
136B
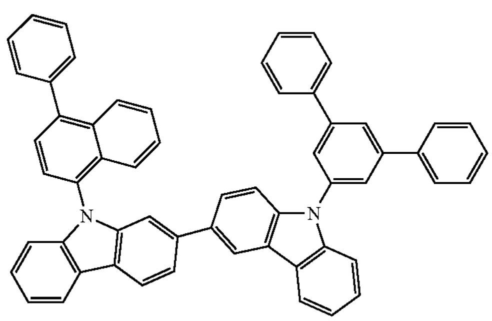
137B
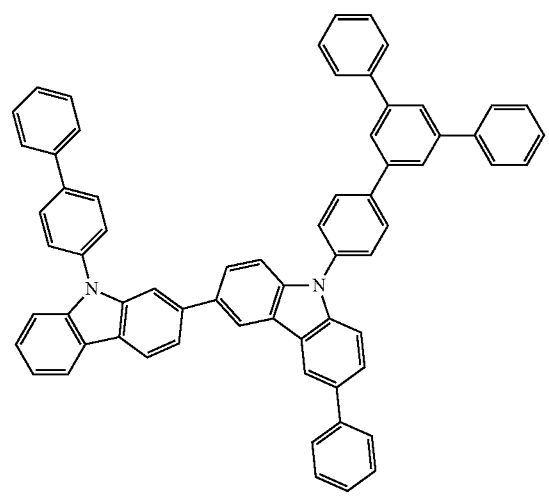
138B
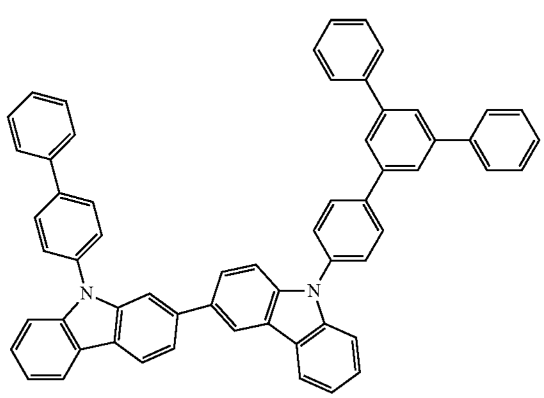
139B
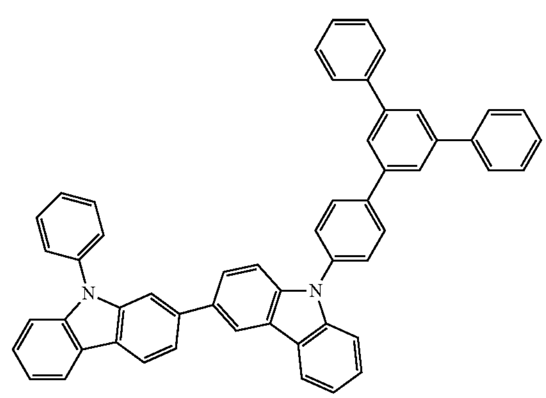

-continued
140B
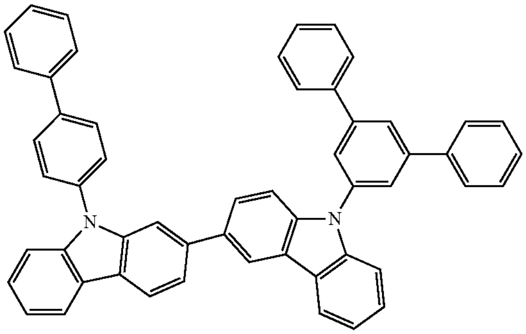
141B
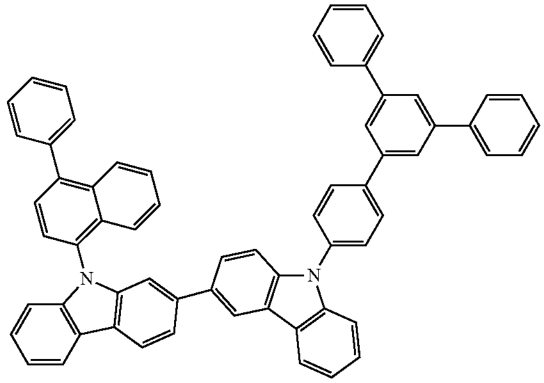
142B
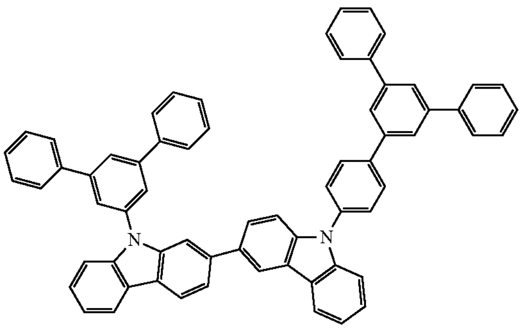
143B
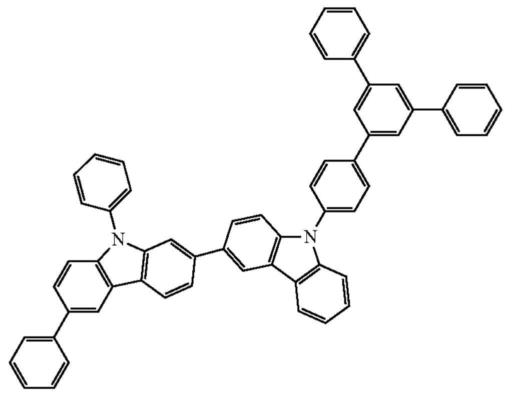
144B
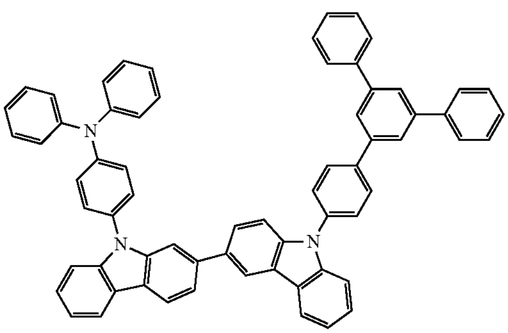
145B
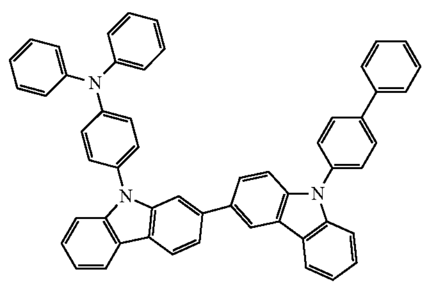
146B
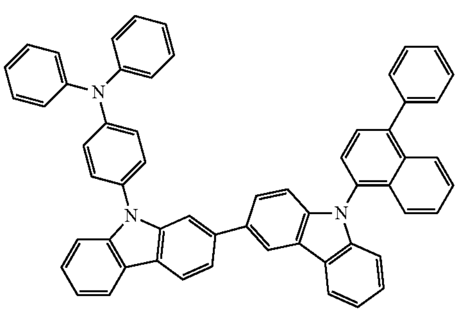

-continued
147B
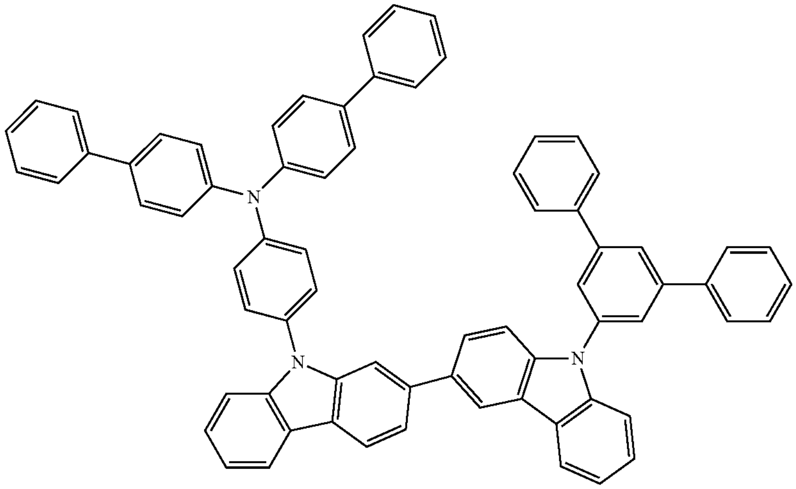
148B
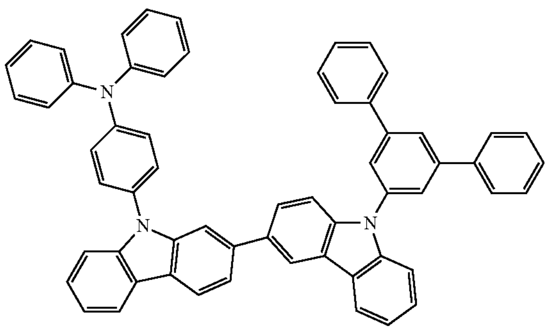
149B
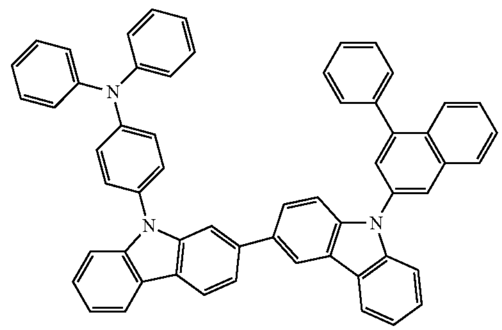
150B
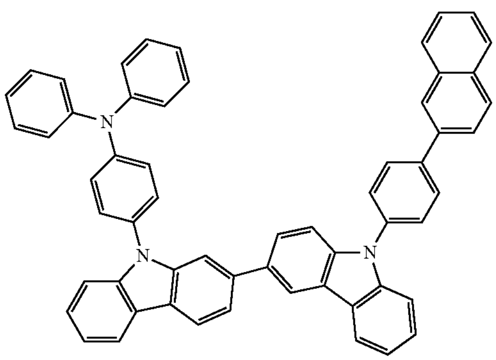
151B
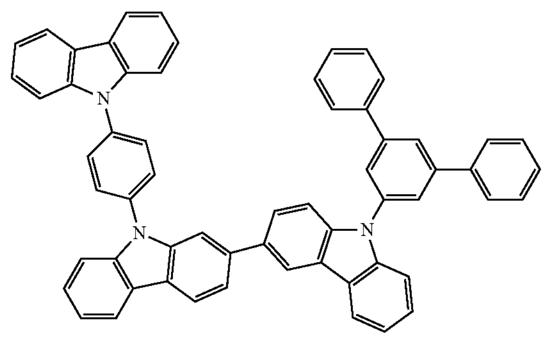
152B
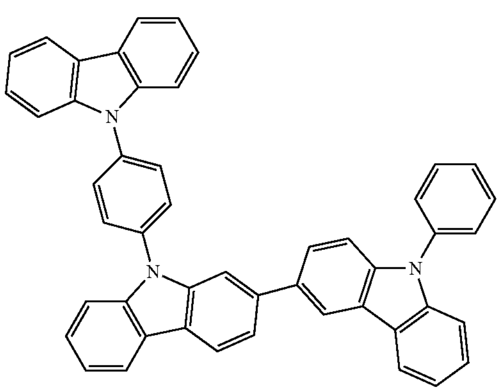
153B
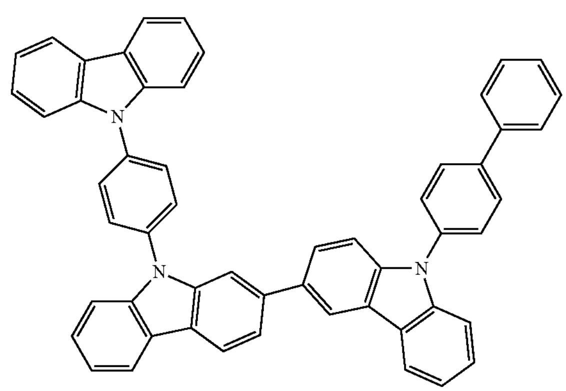

-continued
154B
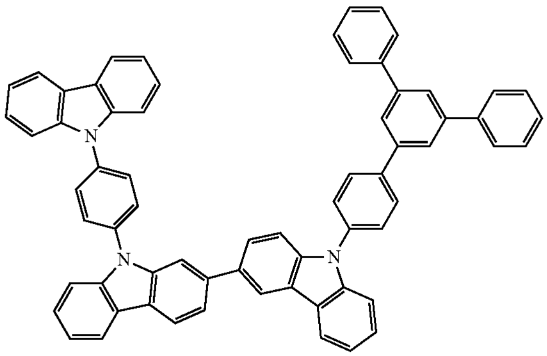
155B
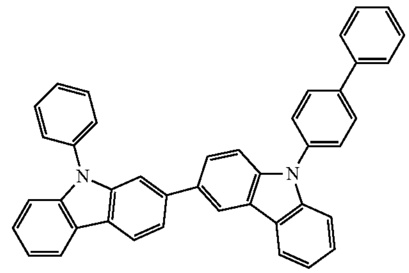
156B
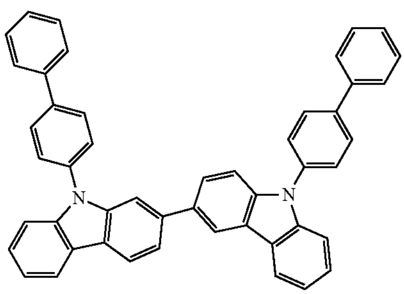
157B
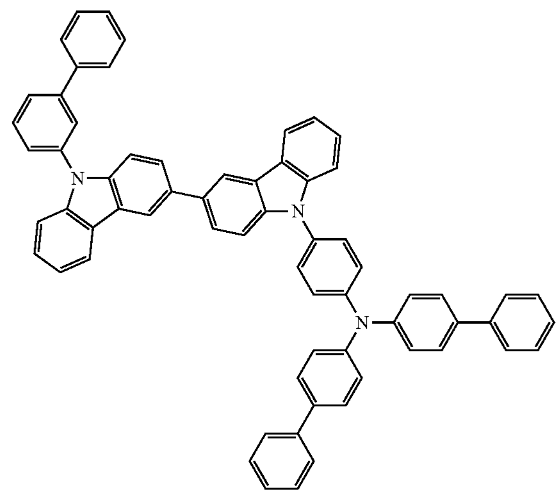
158B
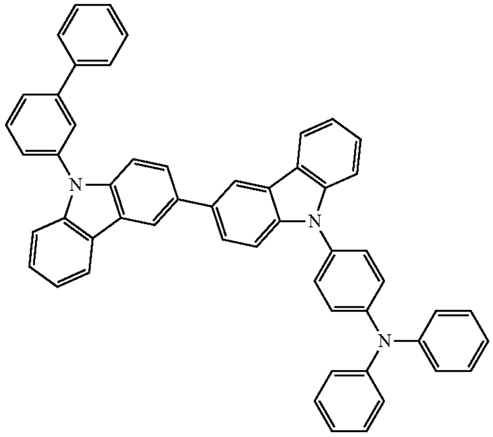
159B
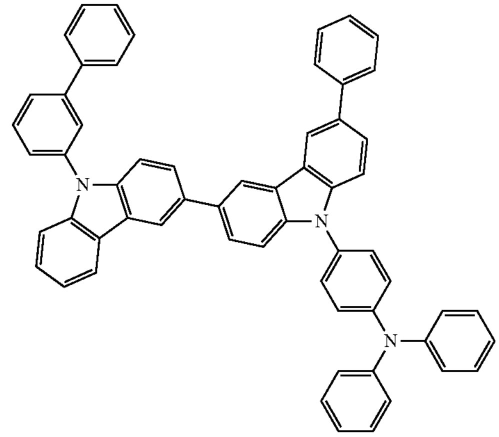

-continued
160B
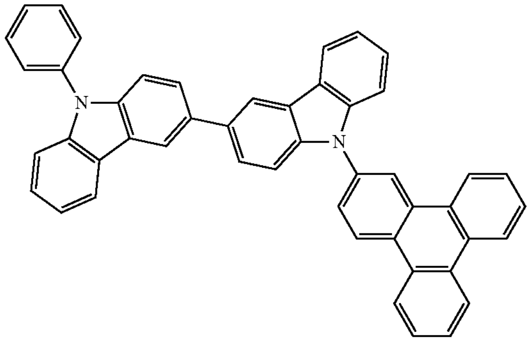
161B
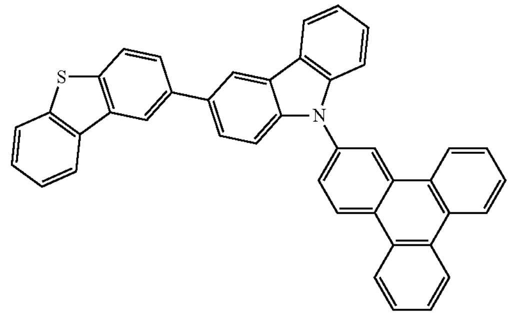
162B
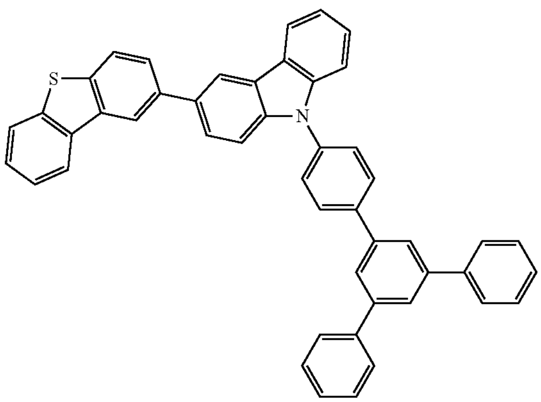
163B
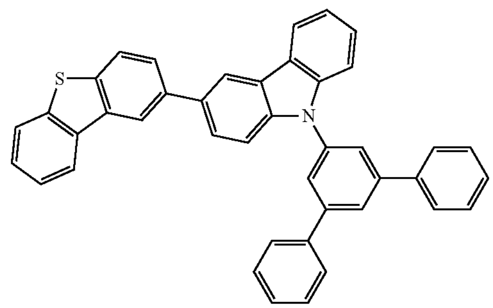
301A
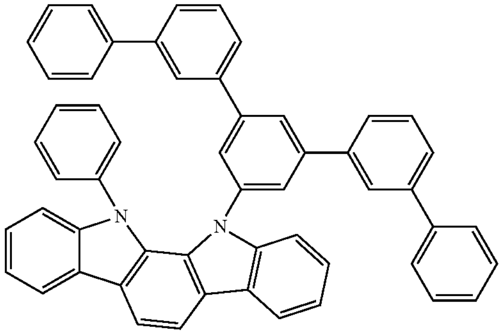
302A
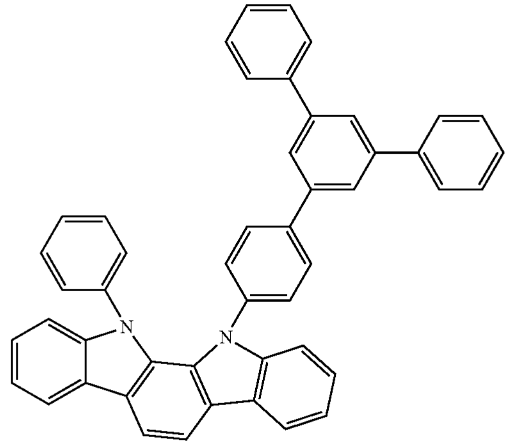

-continued
303A
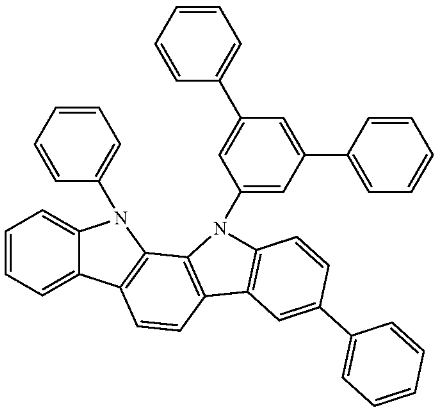
304A
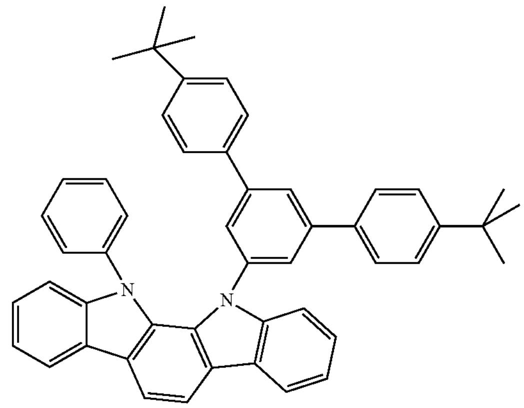
305A
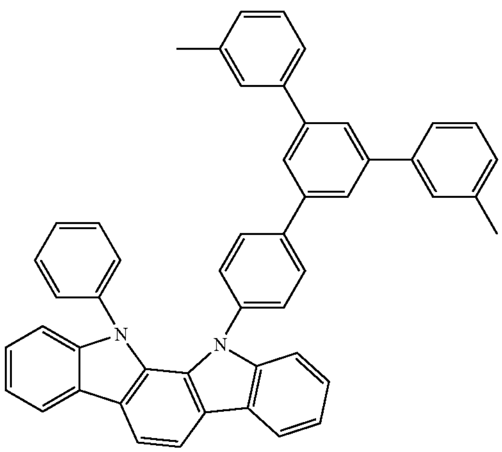
306A
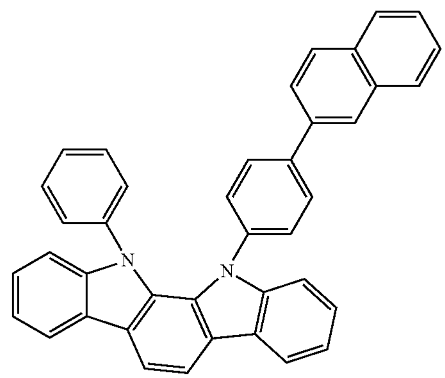
307A
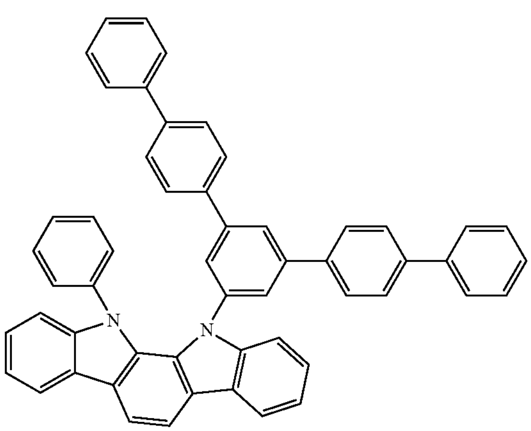
308A
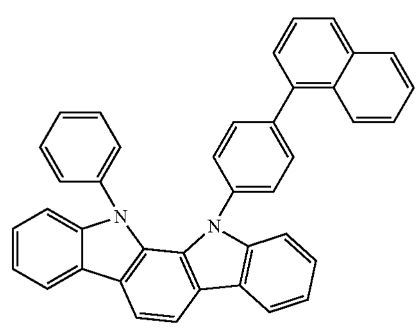

-continued
309A
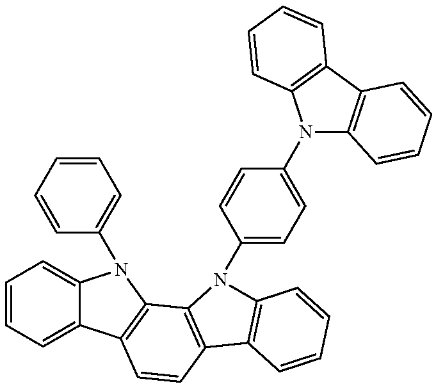
310A
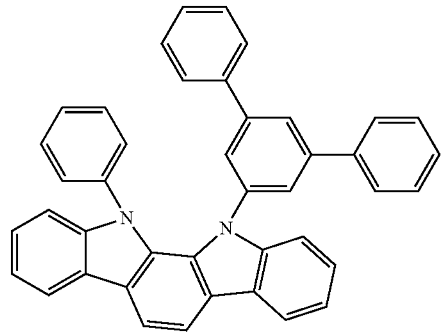
311A
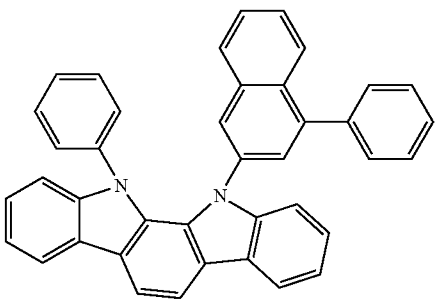
312A
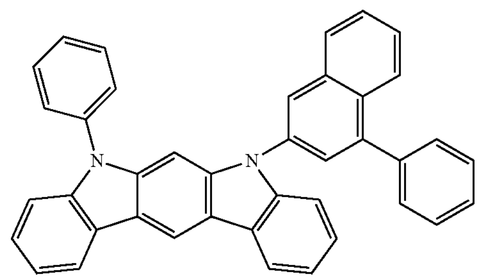
313A
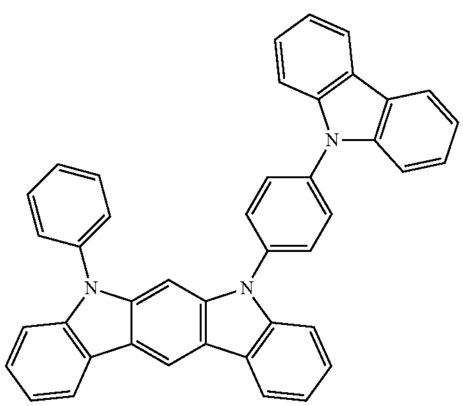
314A
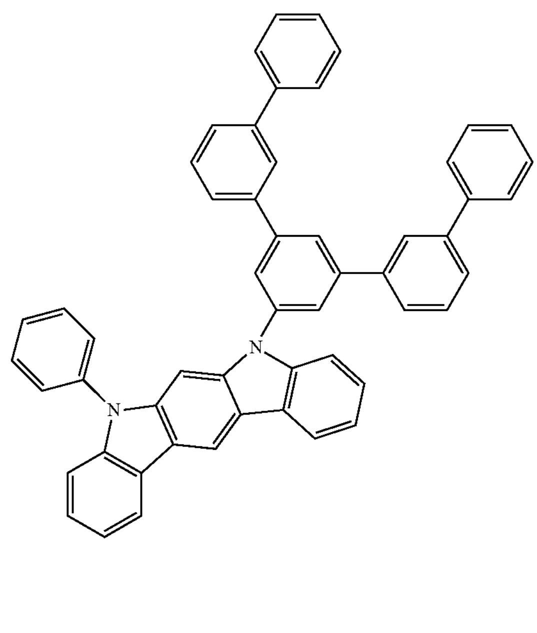

-continued
315A
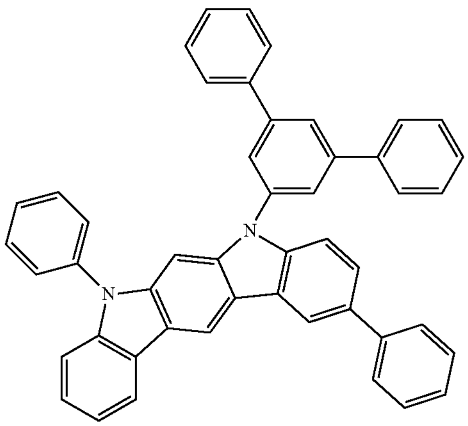
316A
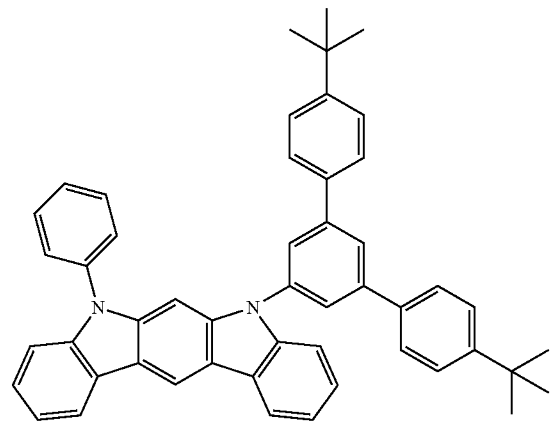
317A
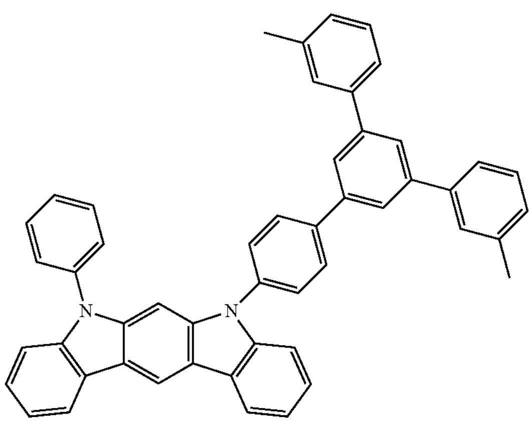
318A
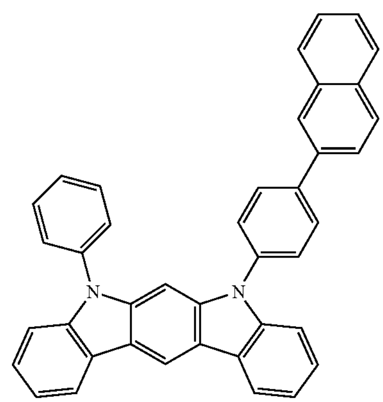
319A
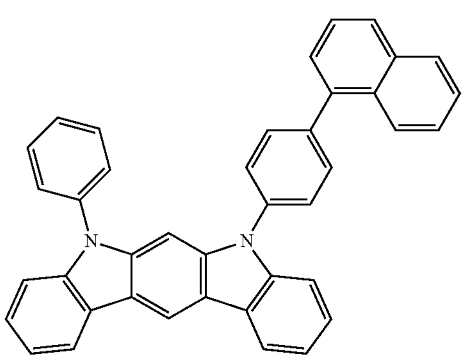
320A
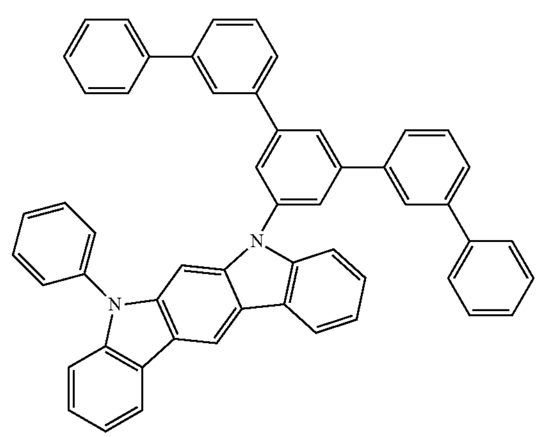

-continued
321A
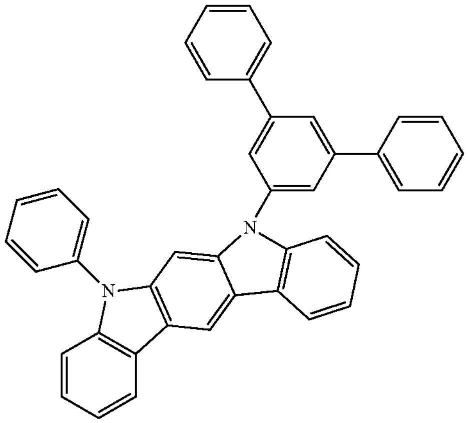
322A
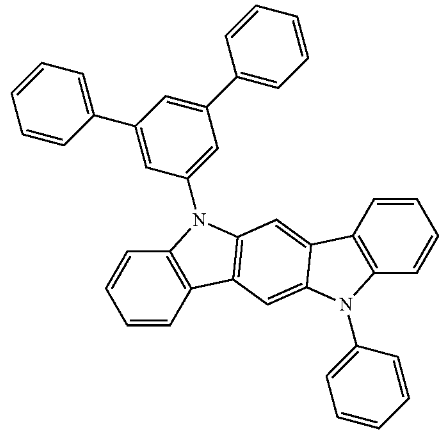
323A
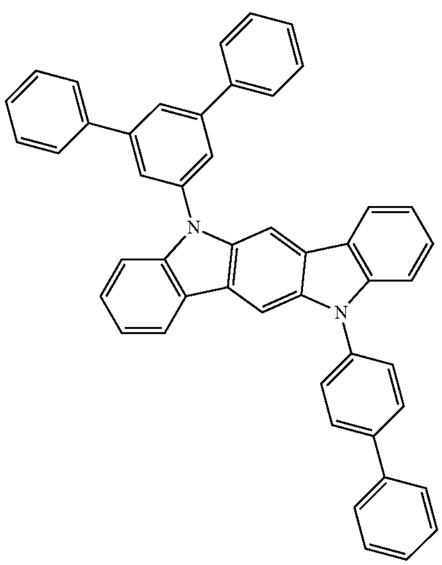
324A
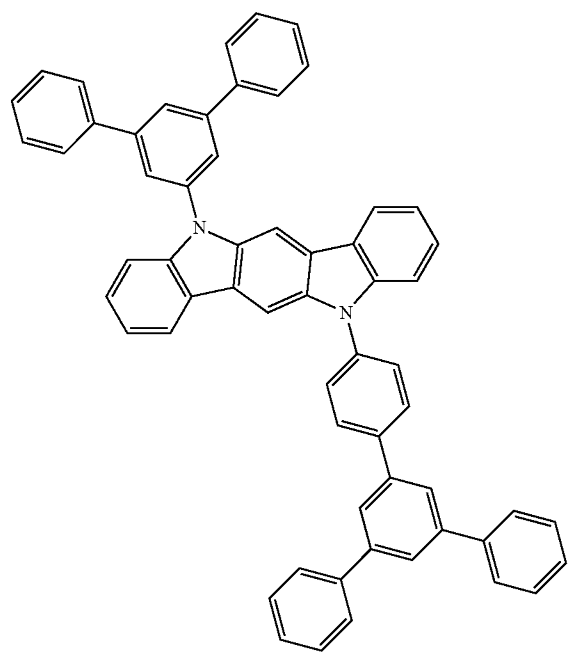

-continued
325A
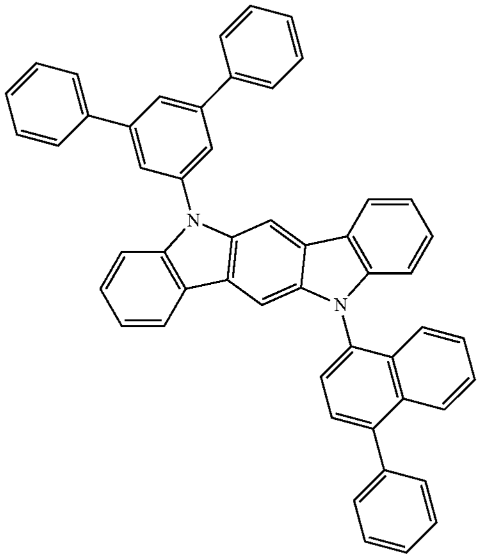
326A
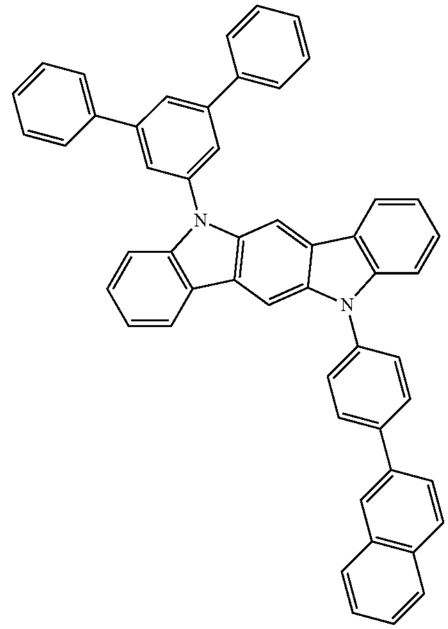
327A
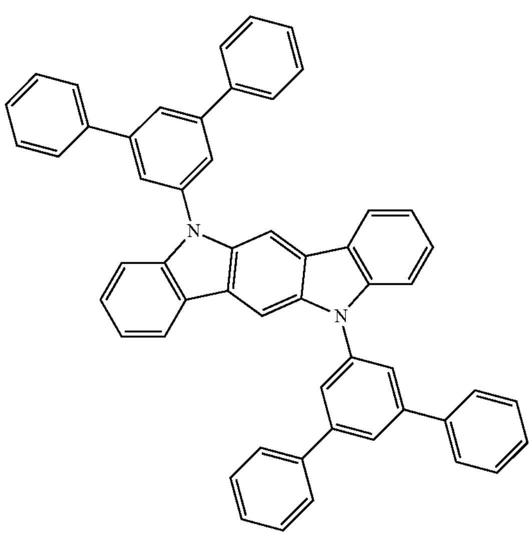
328A
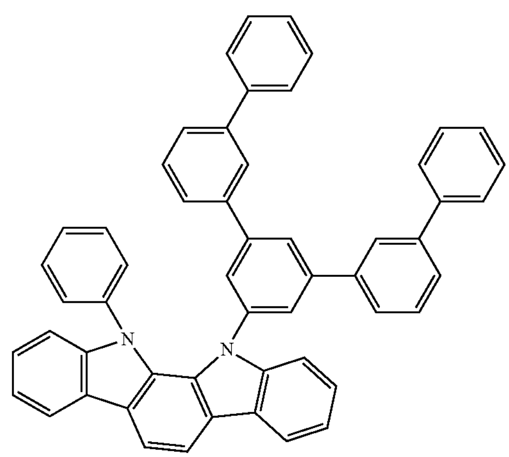

-continued
329A
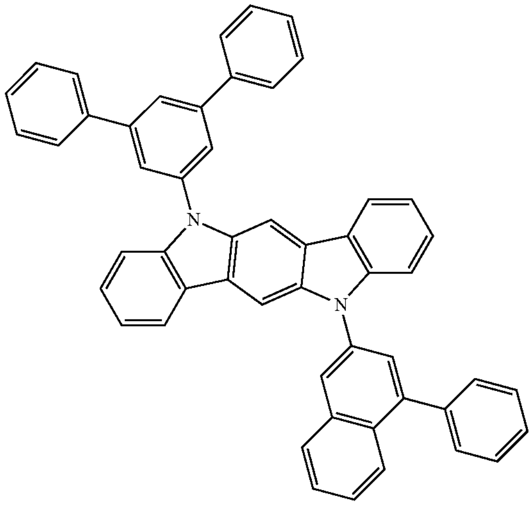
330A
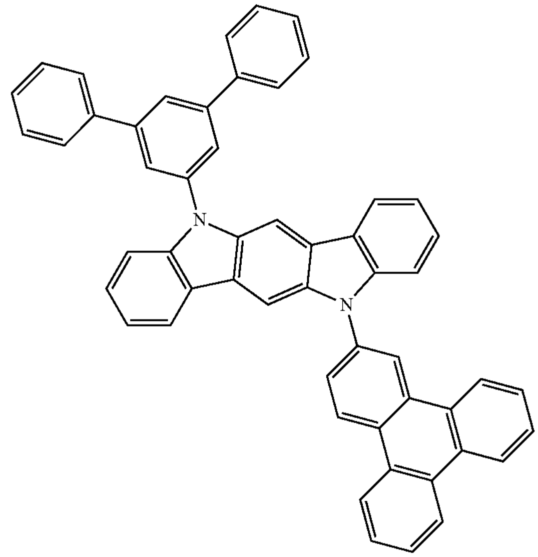
331A
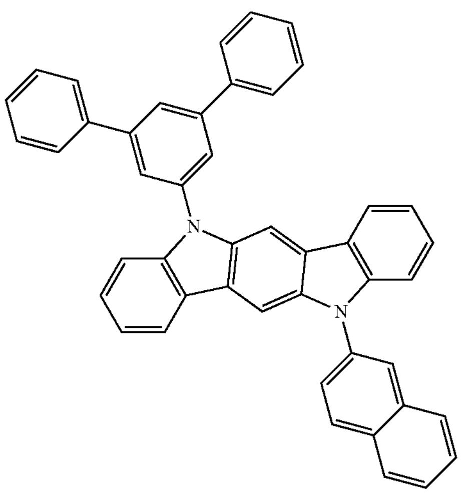
332A
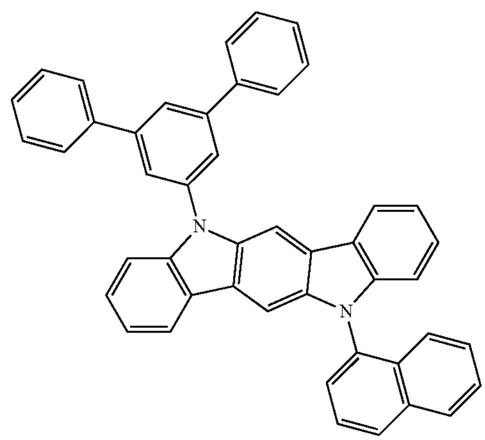
333A
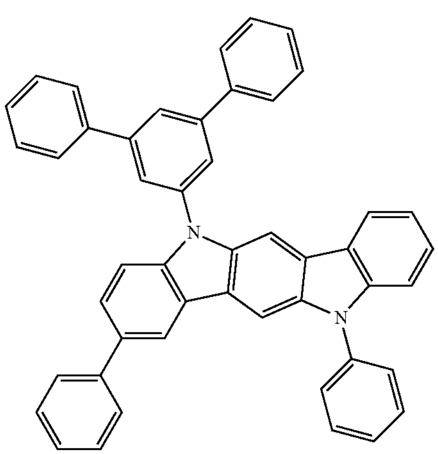
334A
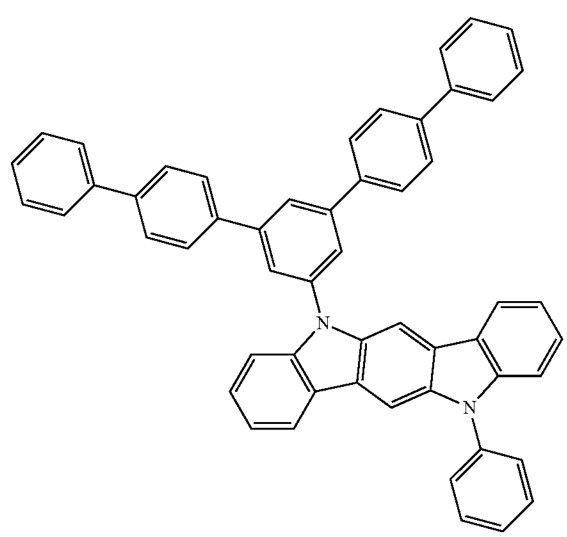

-continued
335A
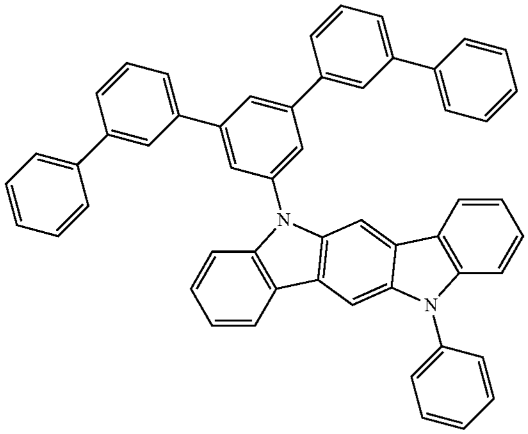
336A
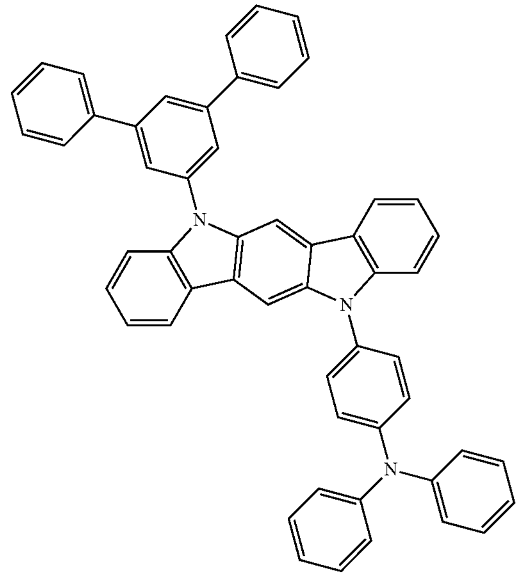
337A
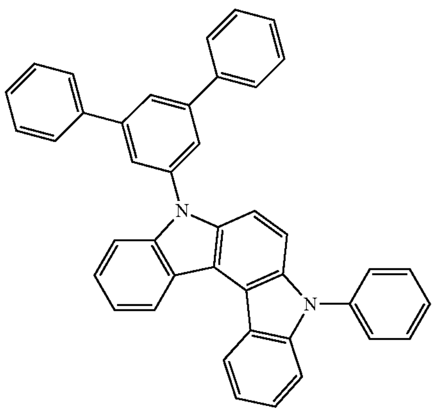
338A
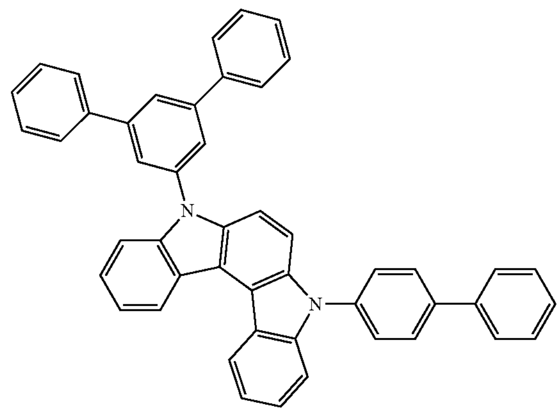
339A
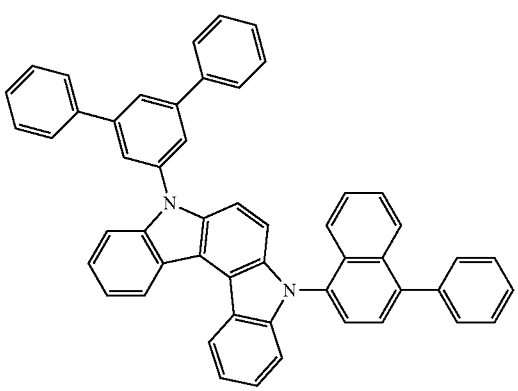
340A
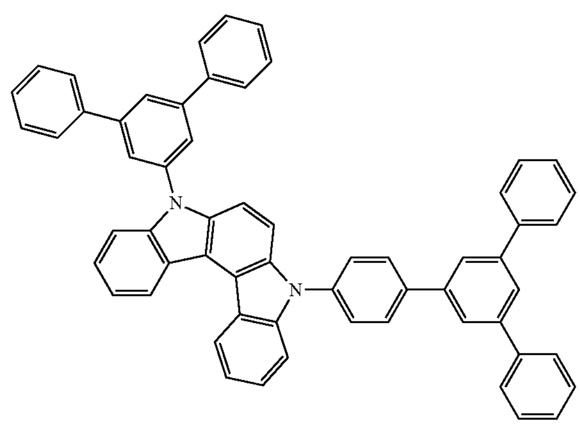

-continued
341A
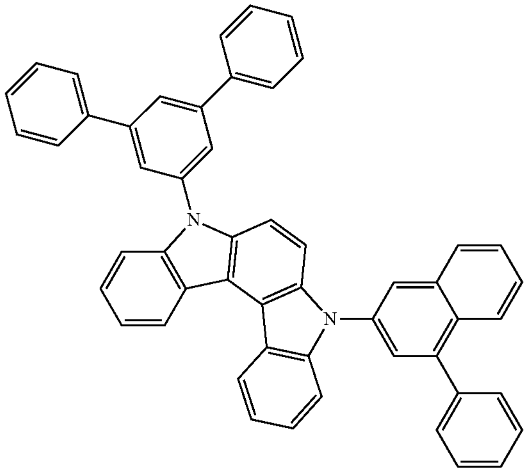
342A
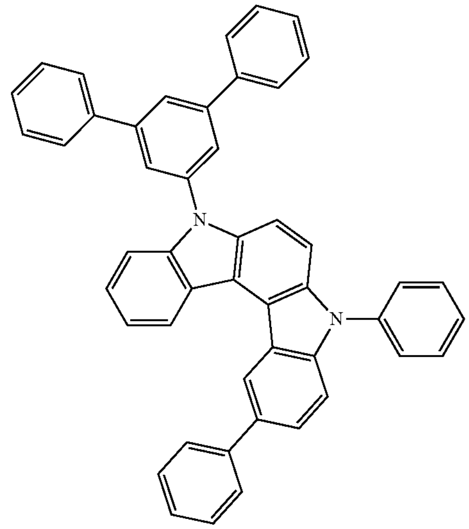
343A
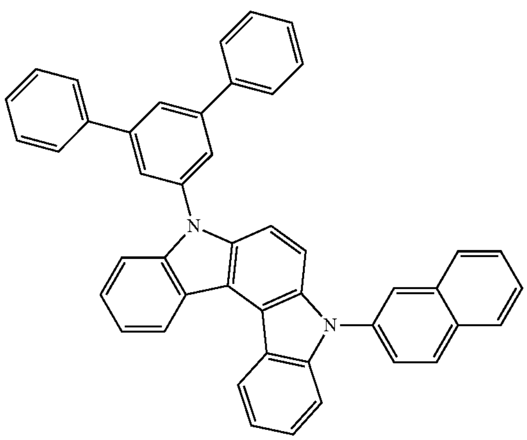
344A
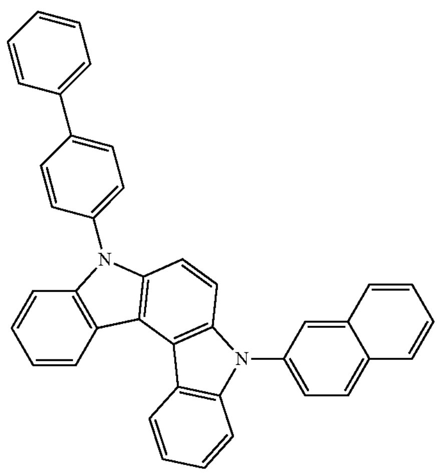
345A
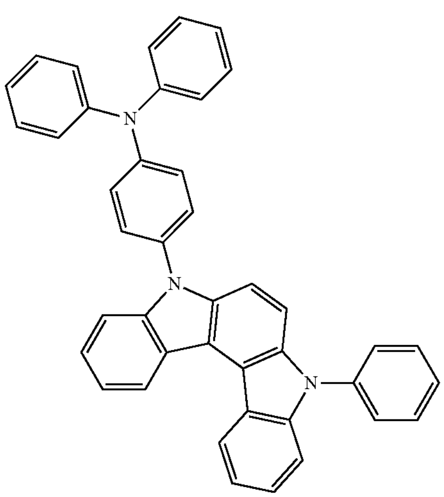
346A
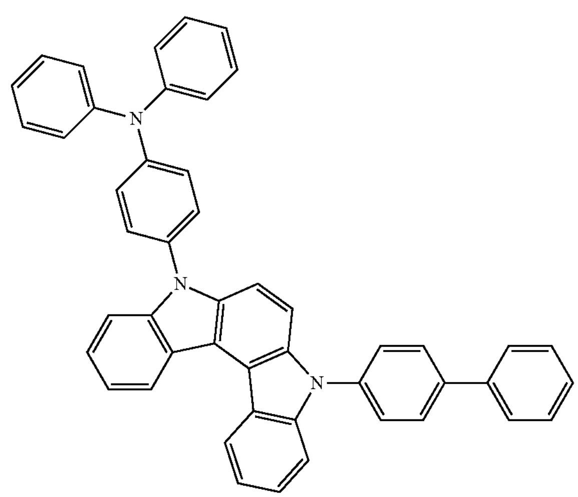

-continued
347A
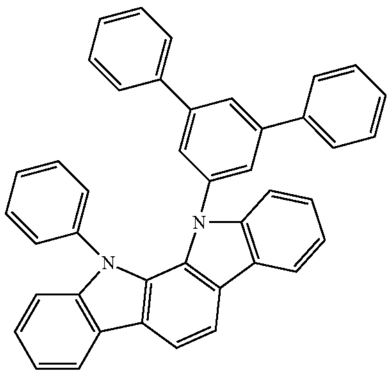
348A
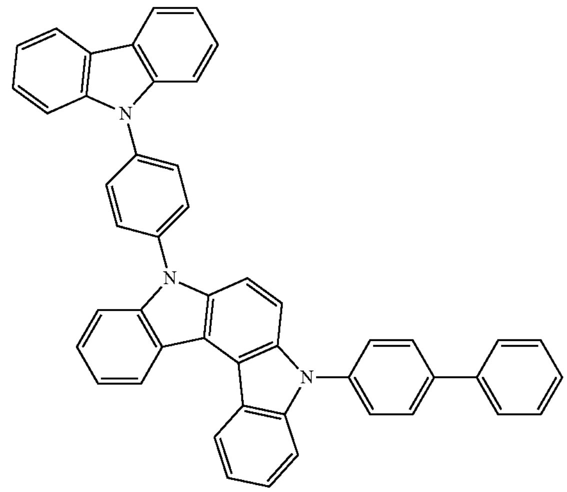
349A
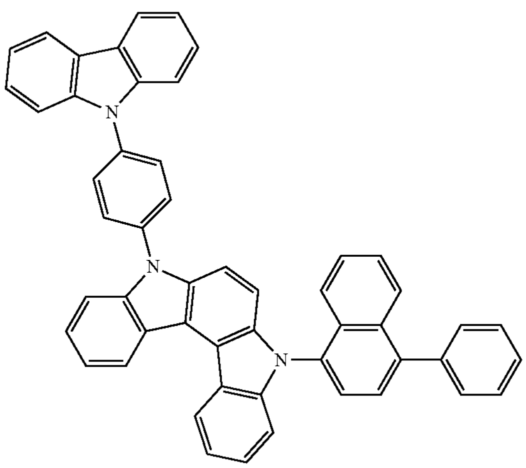
350A
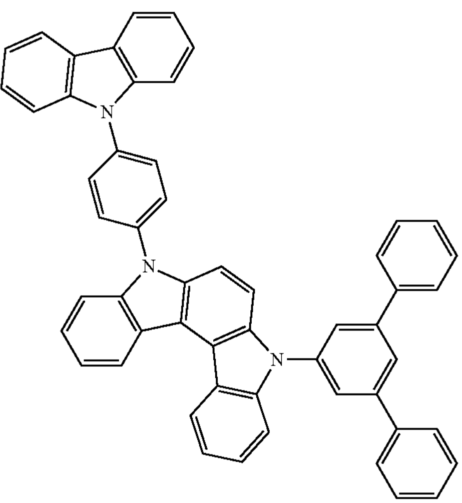
351A
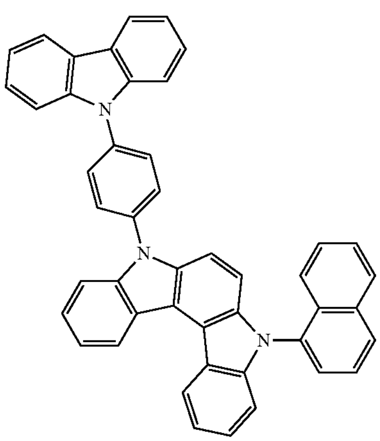
352A
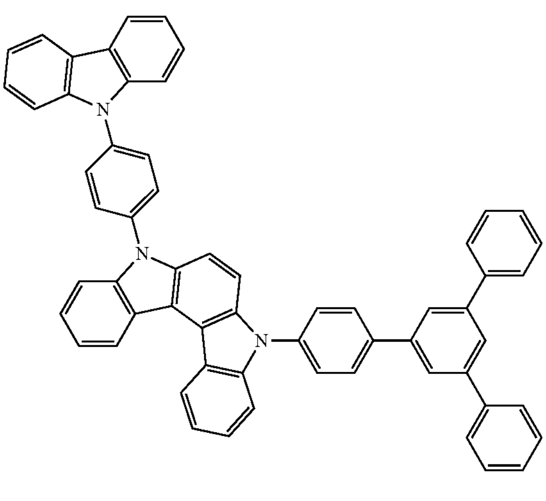

-continued
353A
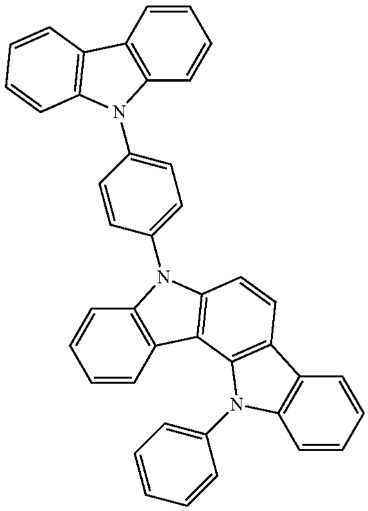
354A
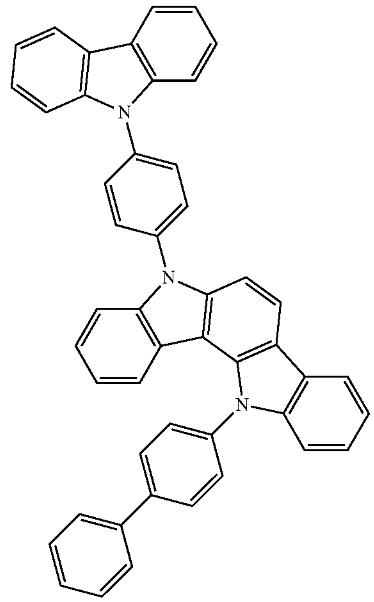
355A
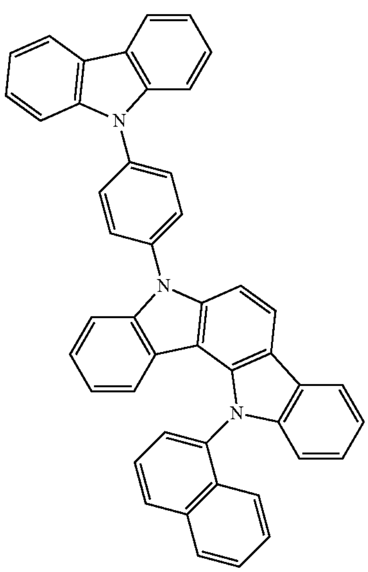
356A
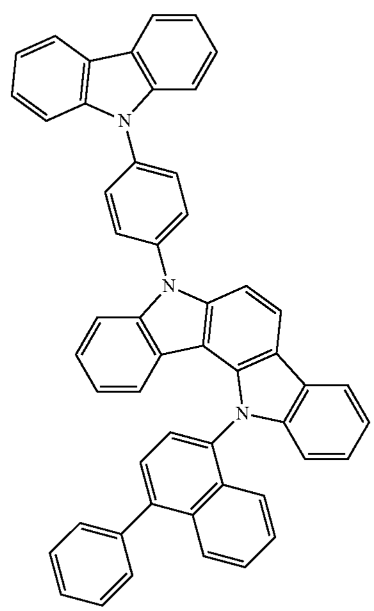

-continued
357A
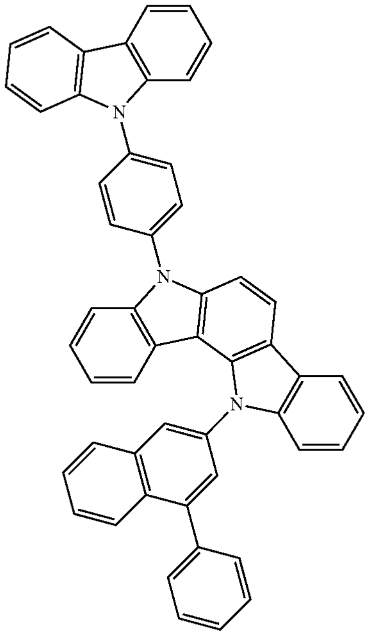
358A
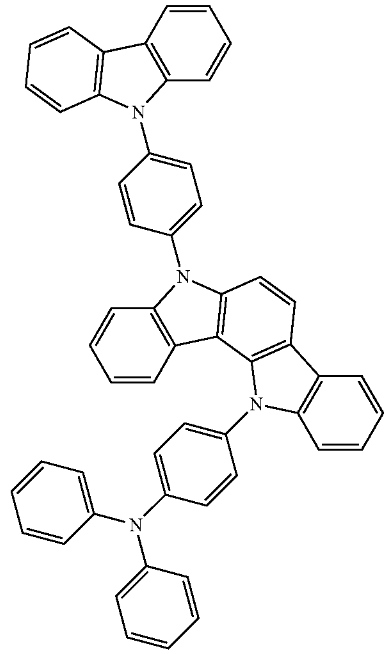
359A
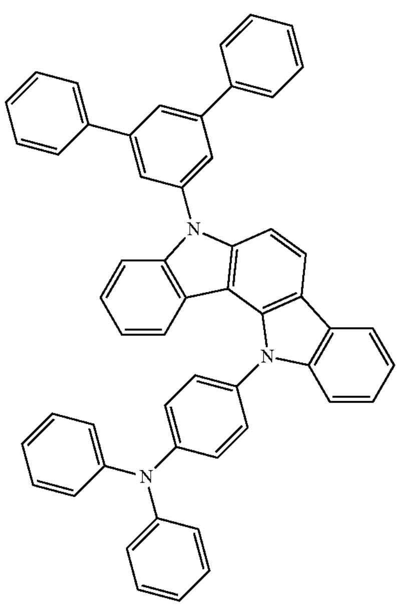
360A
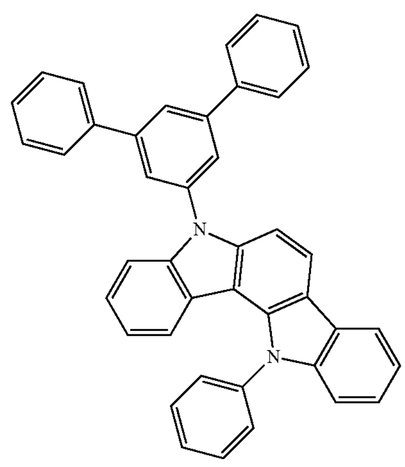

-continued
361A
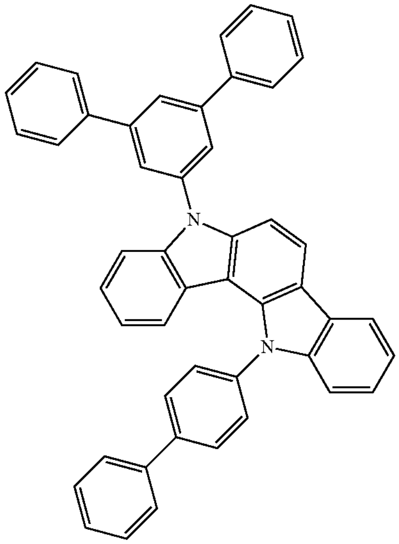
362A
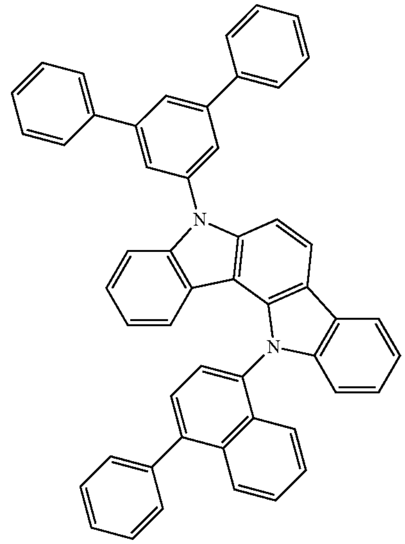
363A
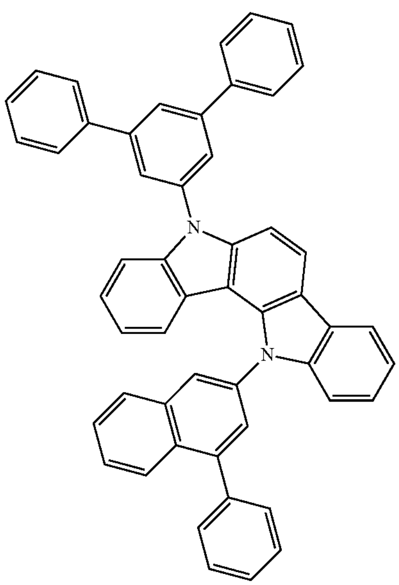
364A
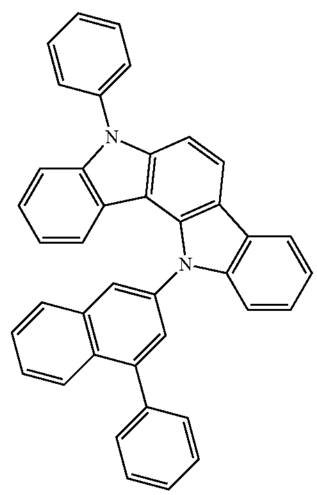

-continued
365A
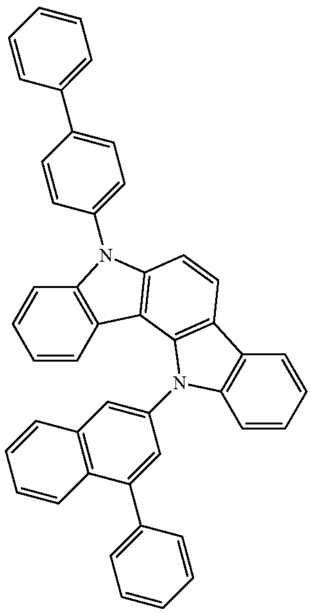
366A
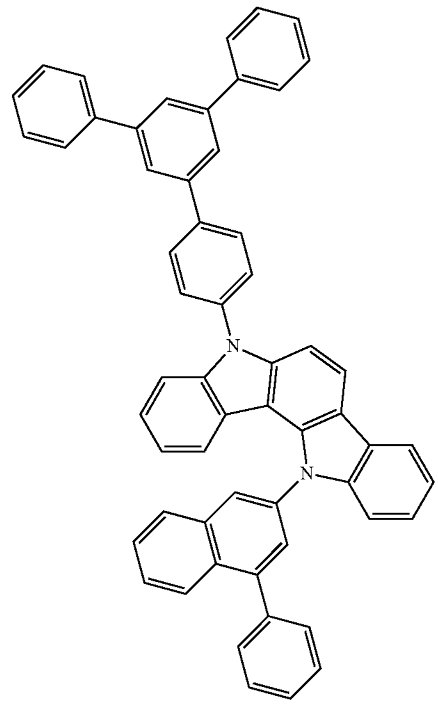
367A
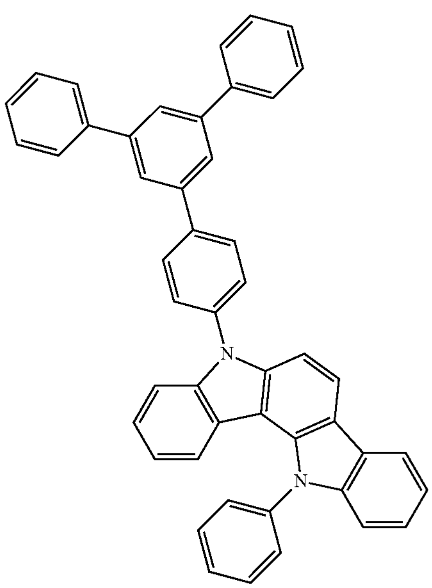
368A
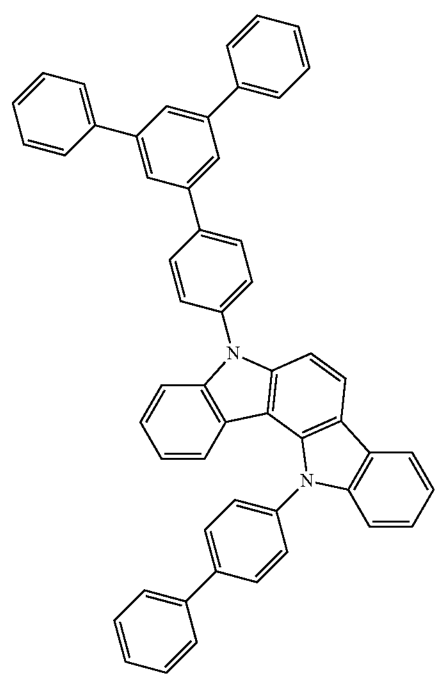

-continued
369A
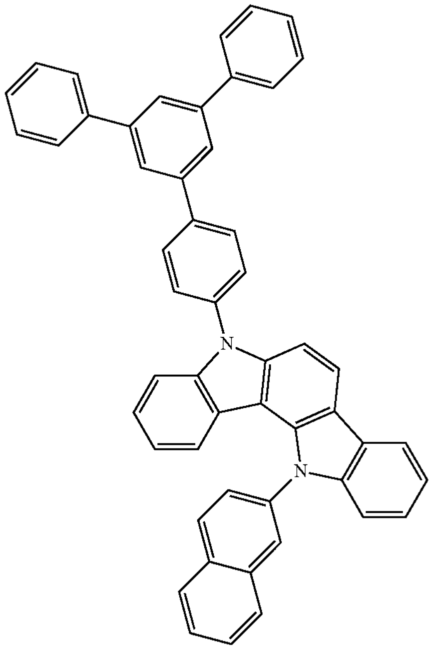
370A
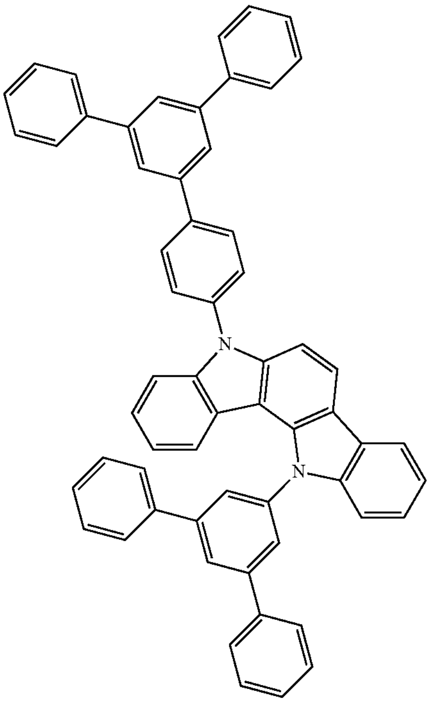
371A
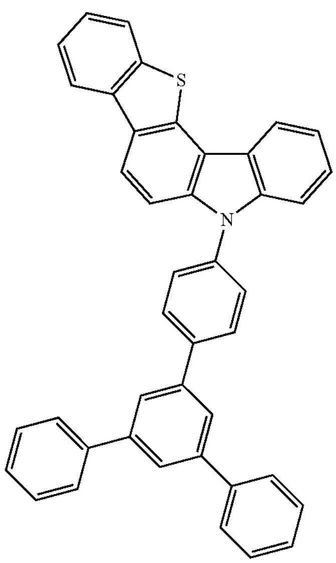
372A
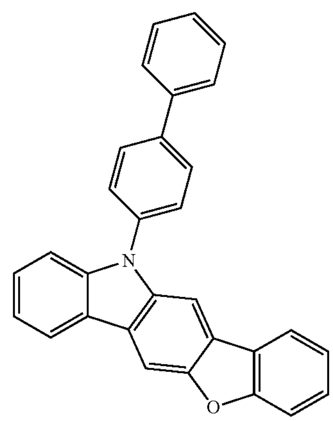
373A
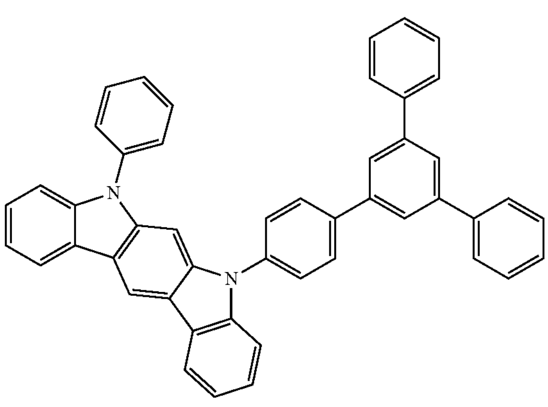

301B
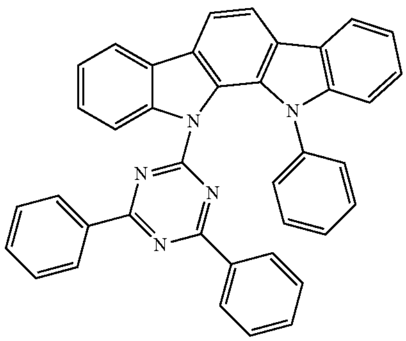
302B
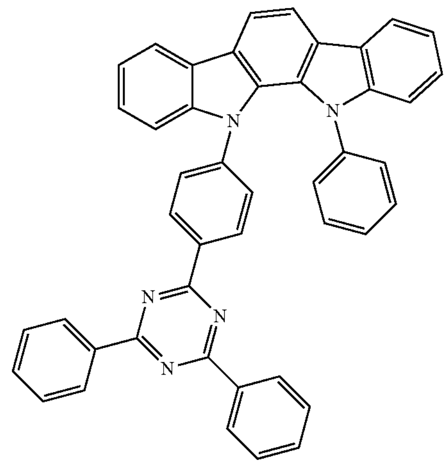
303B
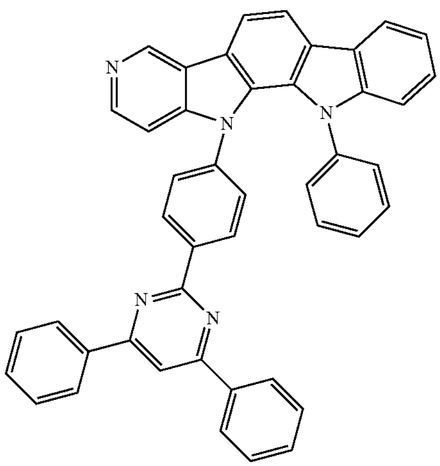
304B
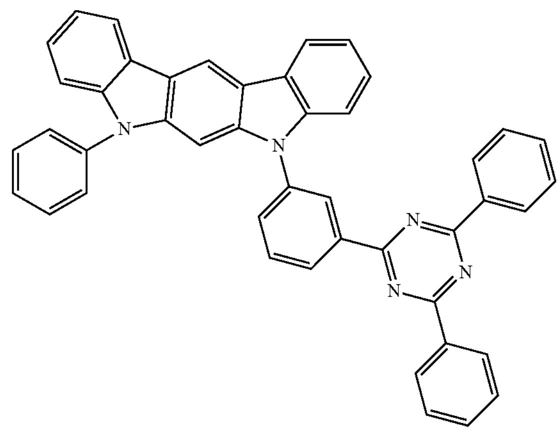
305B
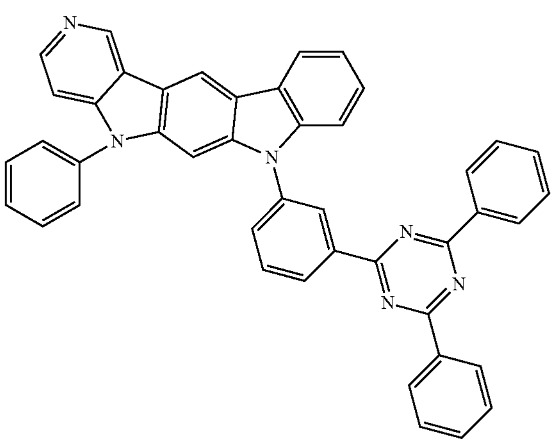
306B
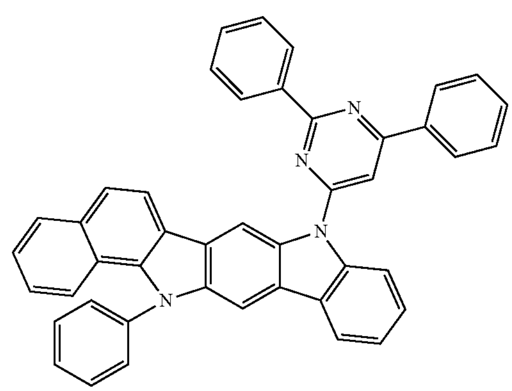

-continued
307B
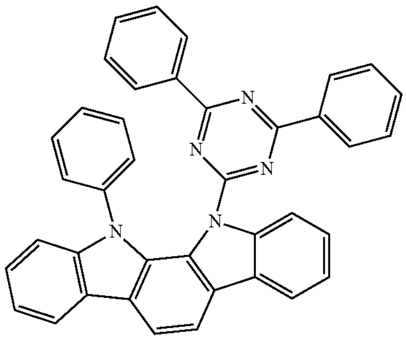
308B
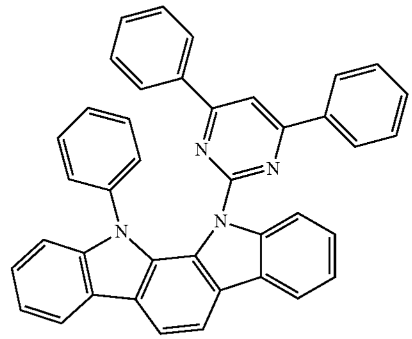
309B
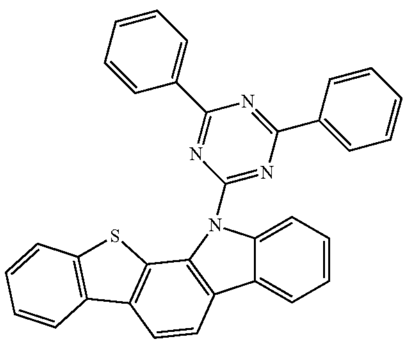
310B
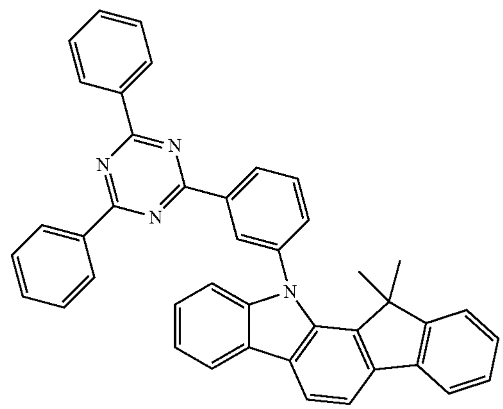
311B
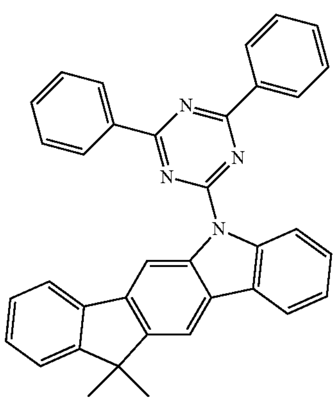
312B
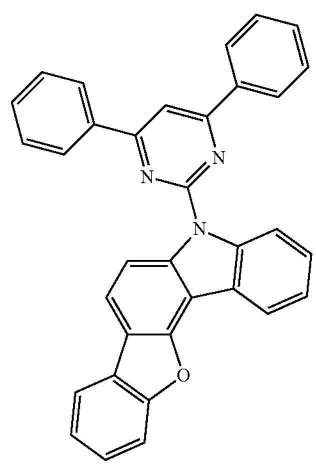

-continued
313B
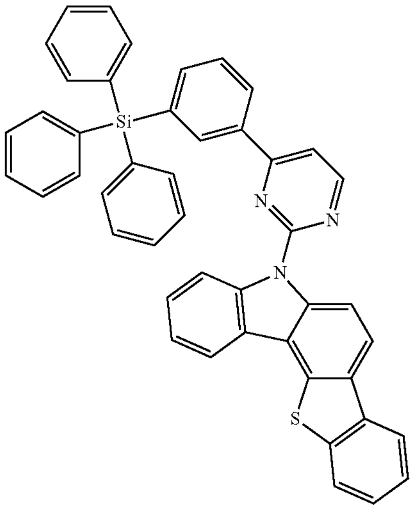
314B
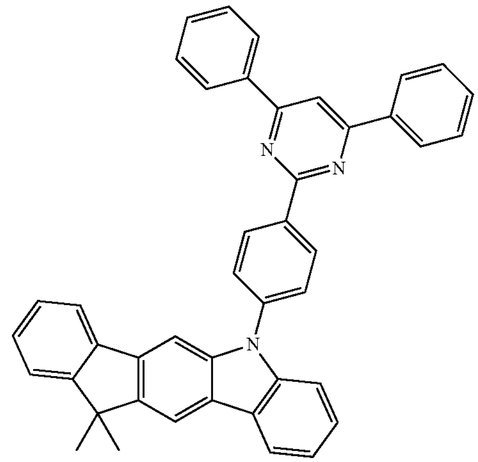
315B
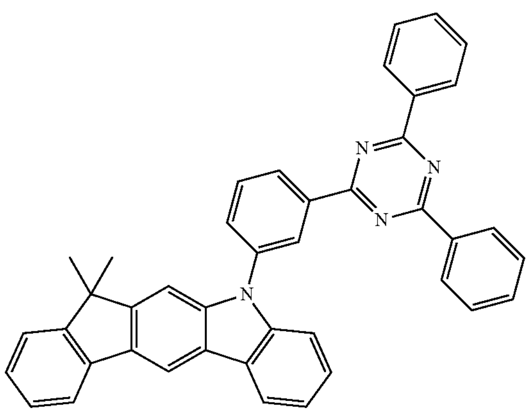
316B
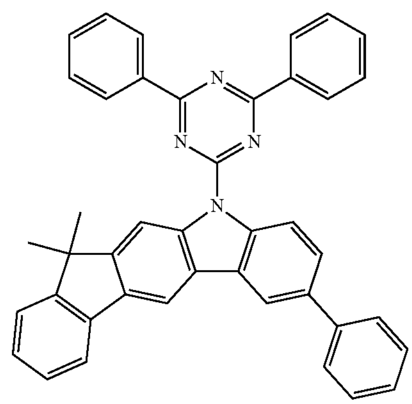
317B
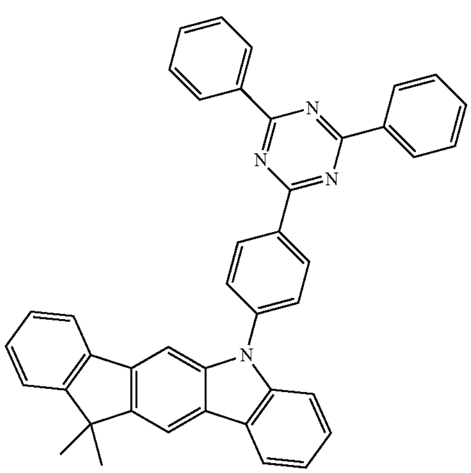
318B
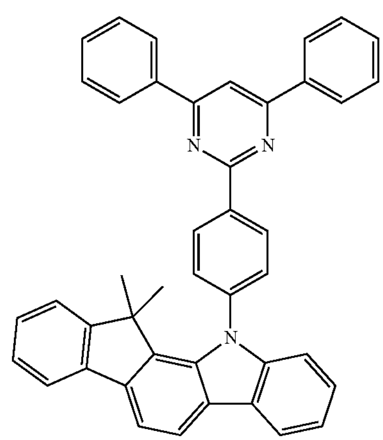

-continued
319B
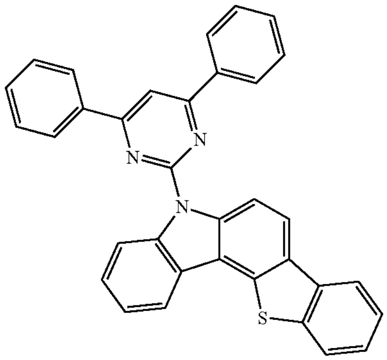
320B
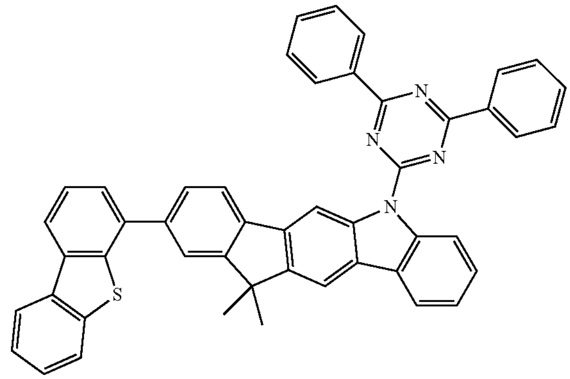
321B
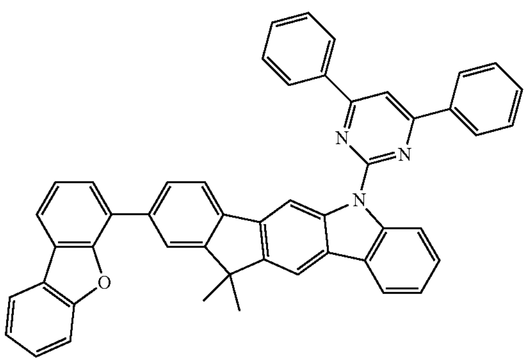
322B
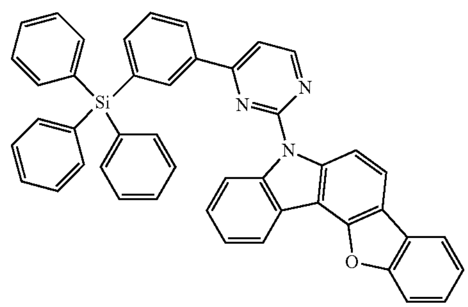
323B
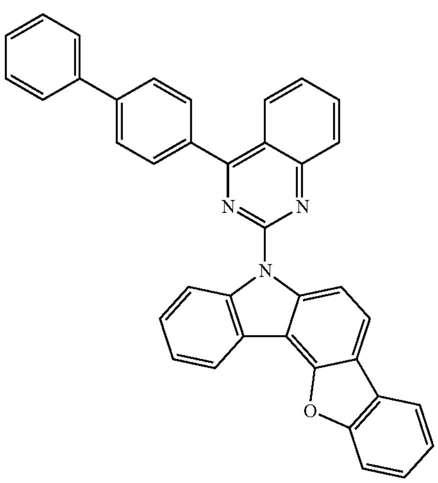
324B
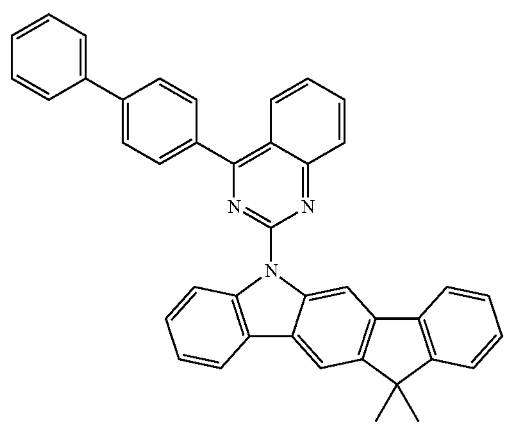

-continued
325B
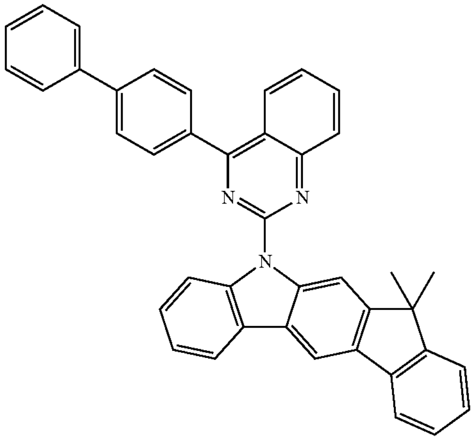
326B
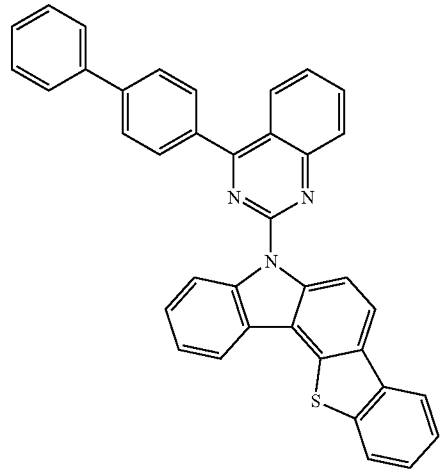
327B
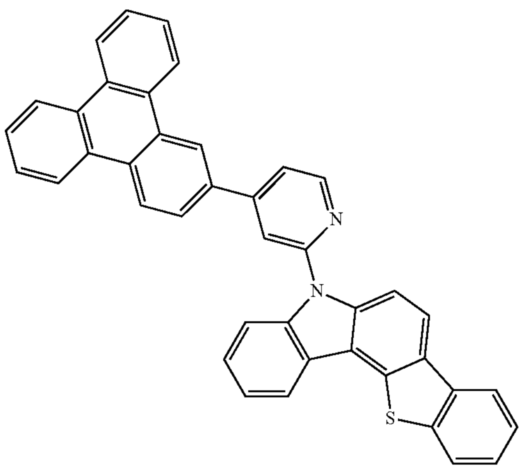
328B
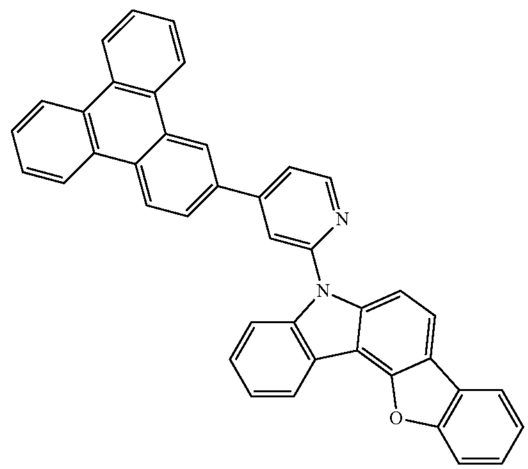
329B
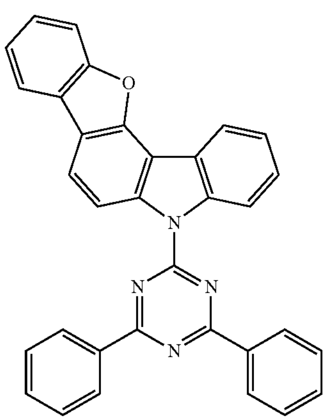
330B
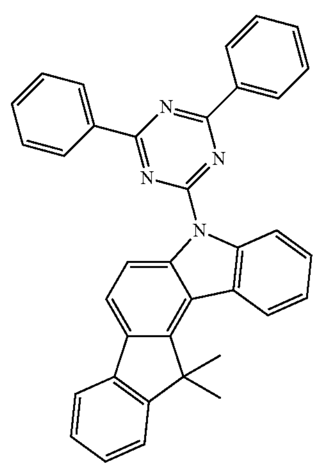

-continued
331B
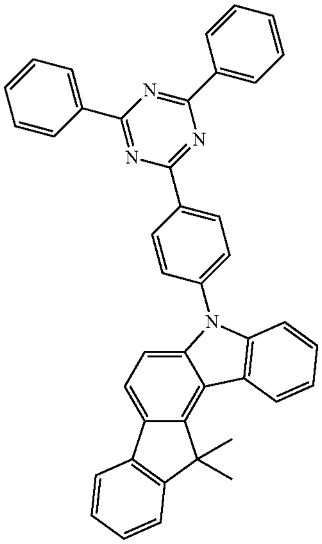
332B
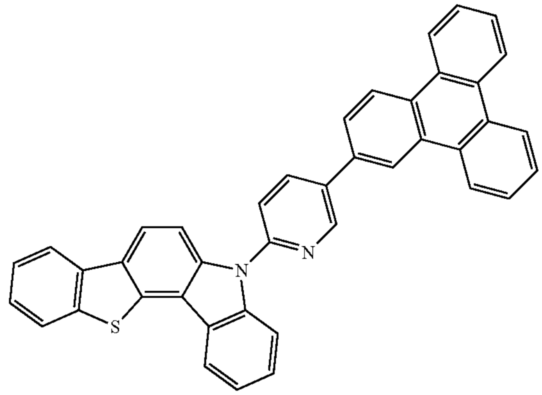
333B
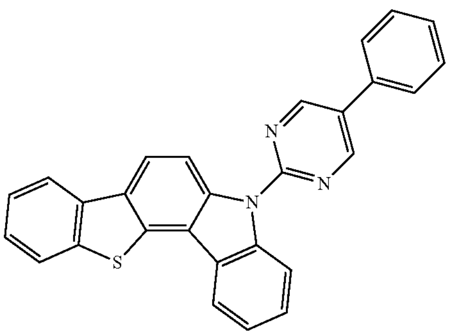
334B
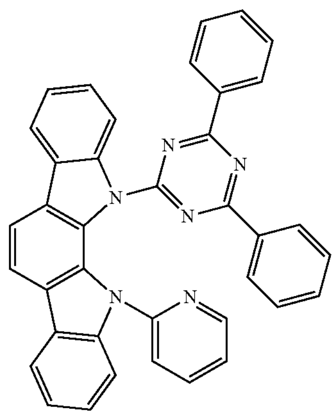
335B
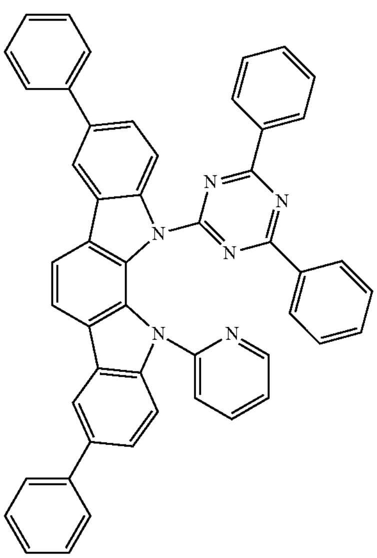
336B
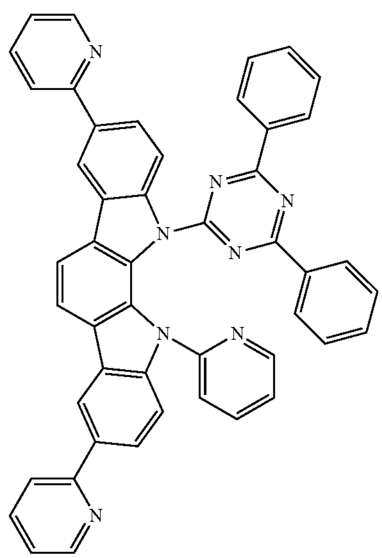

-continued
337B
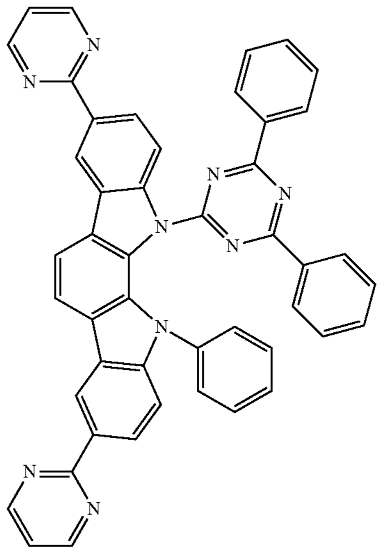
338B
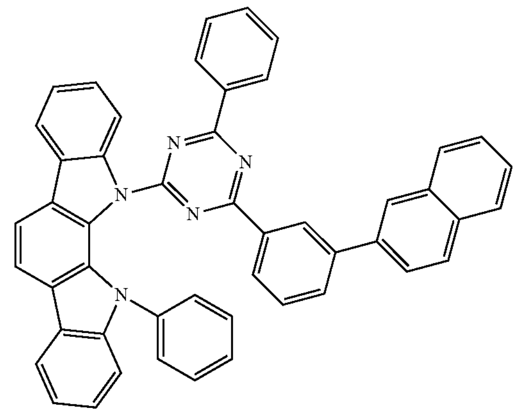
339B
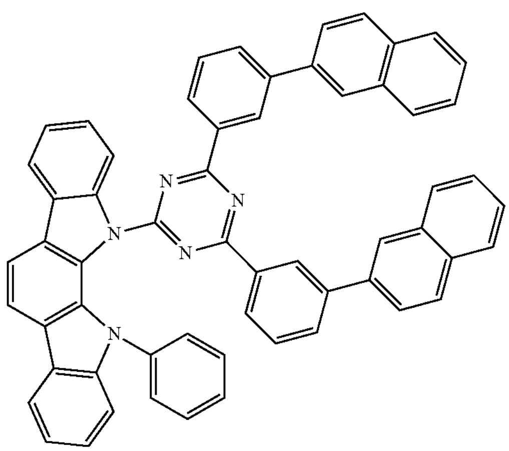
340B
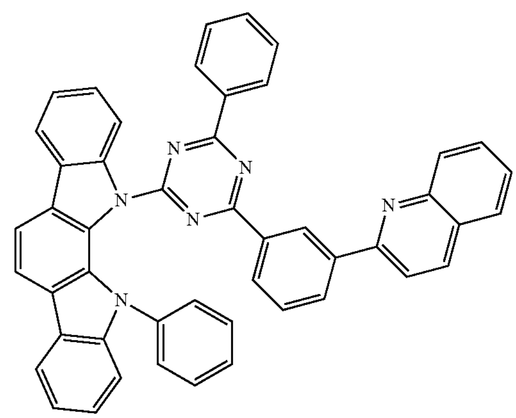
341B
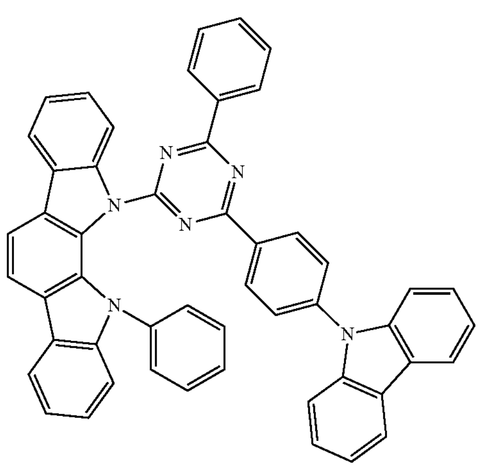
342B
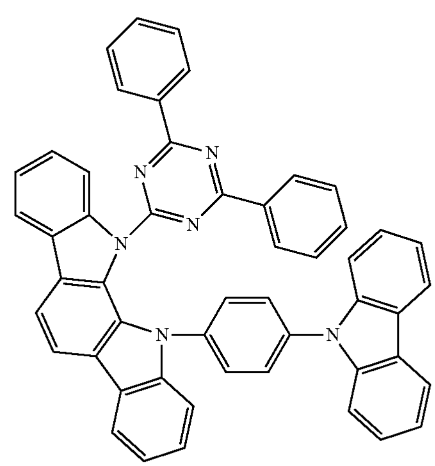

-continued
343B
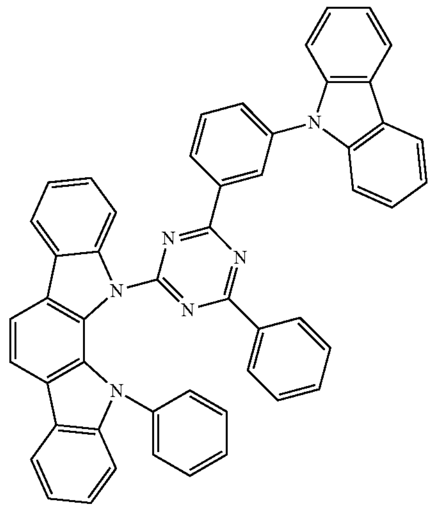
344B
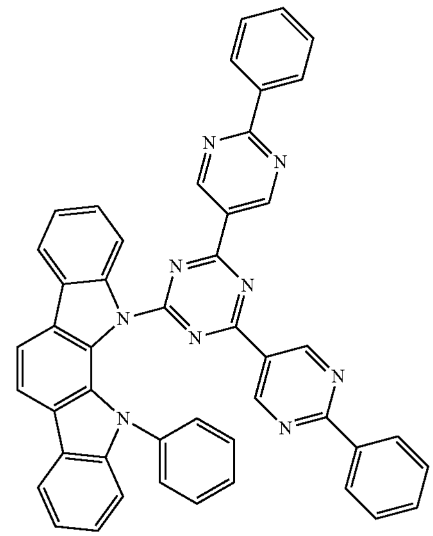
345B
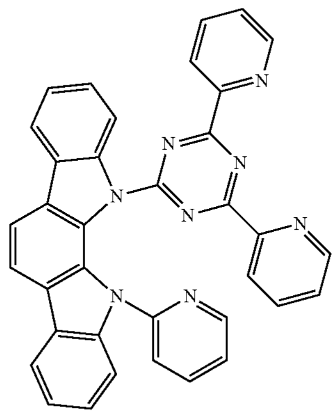
346B
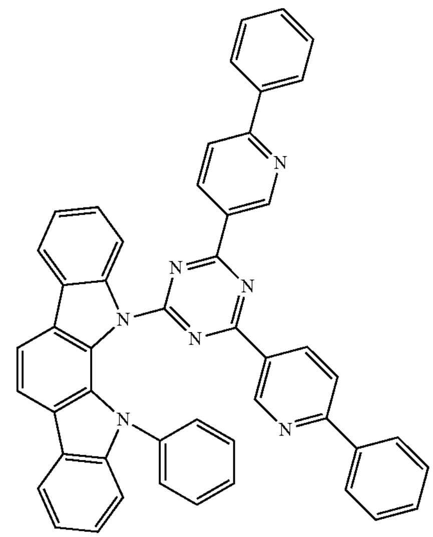
347B
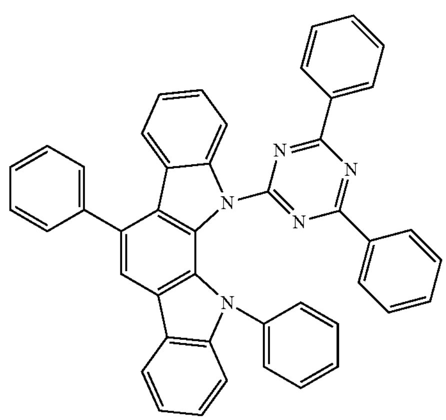
348B
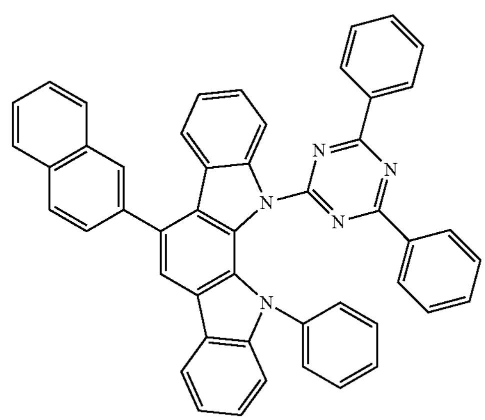

-continued
349B
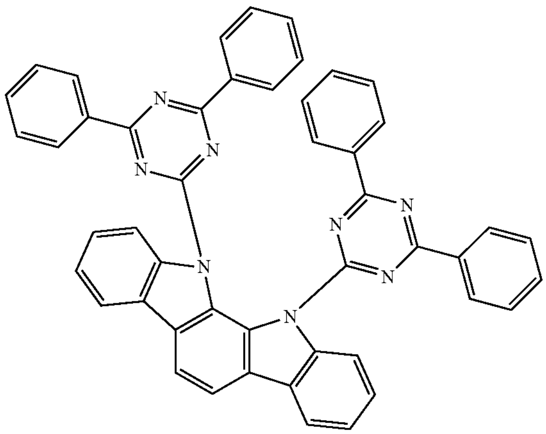
350B
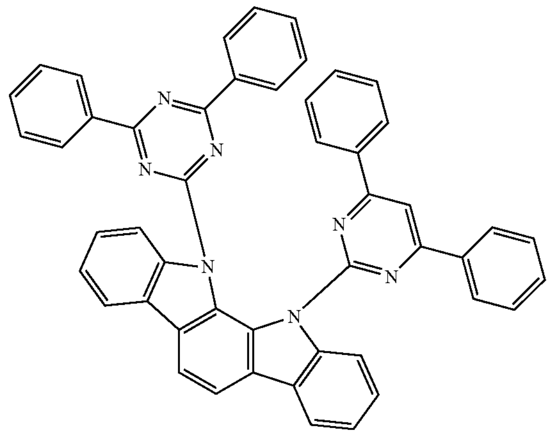
351B
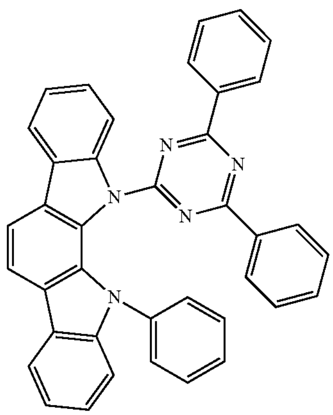
352B
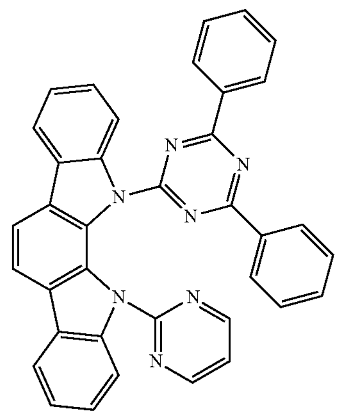
353B
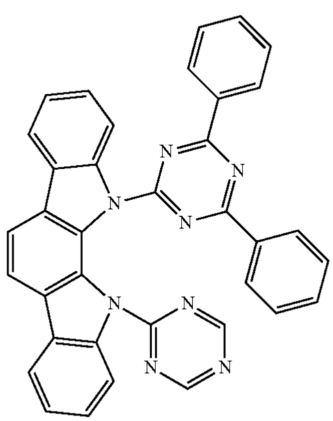
354B
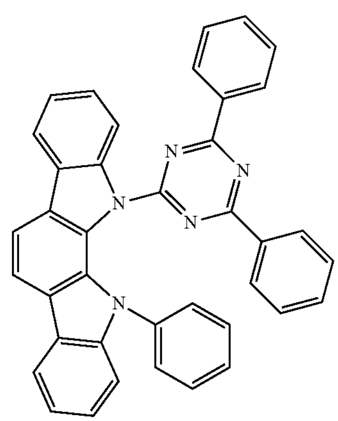

-continued
355B
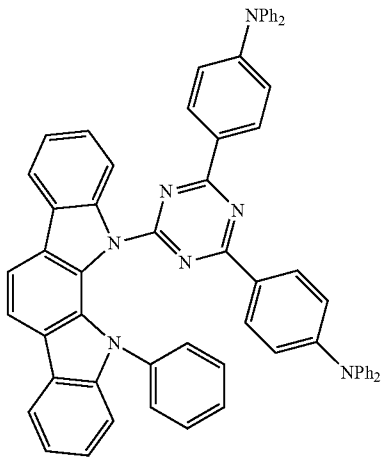
356B
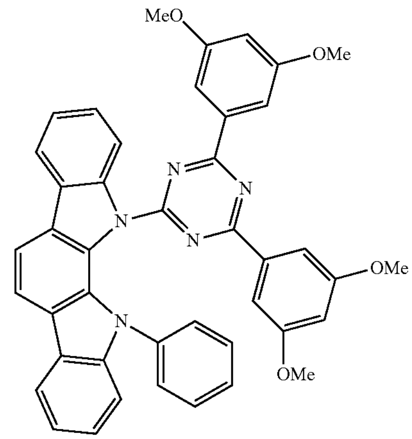
357B
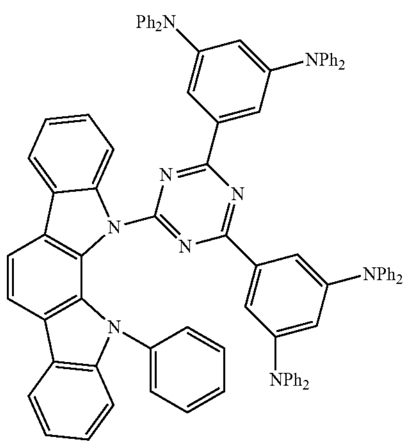
358B
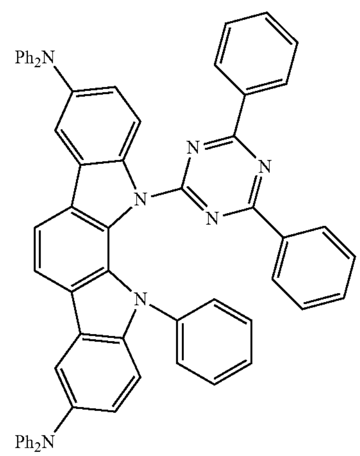
359B
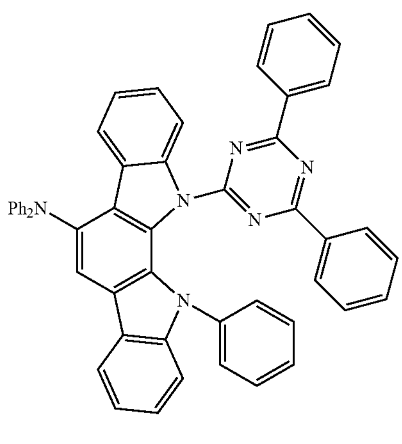
360B
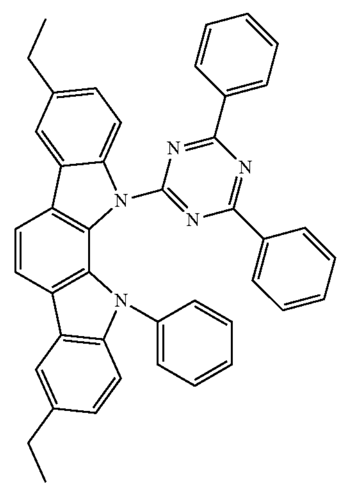

-continued
361B
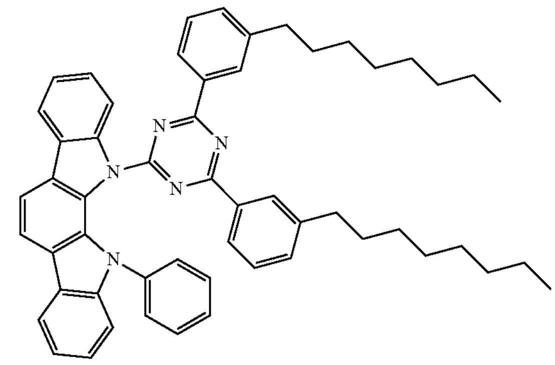
362B
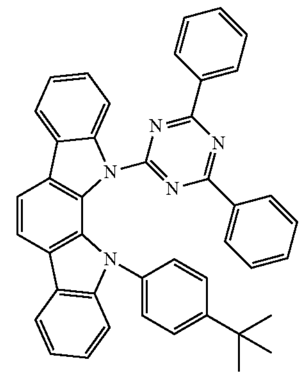
363B
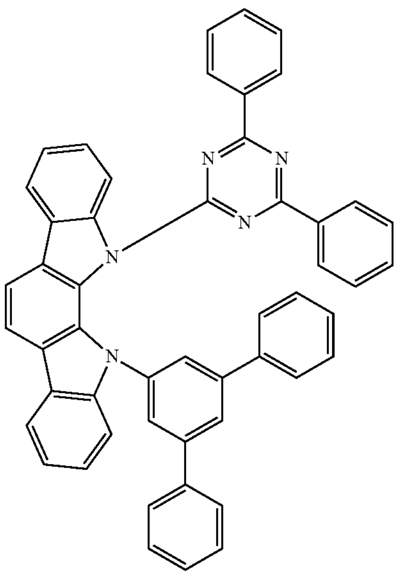
364B
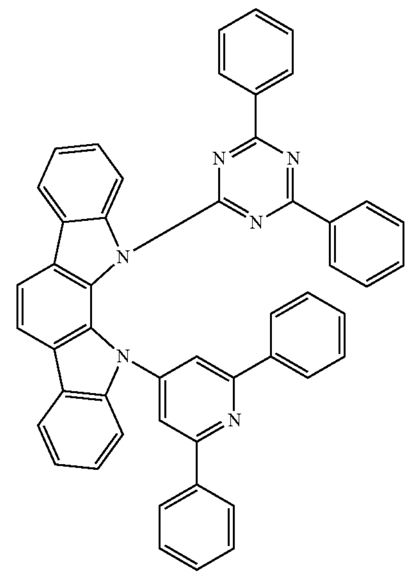
365B
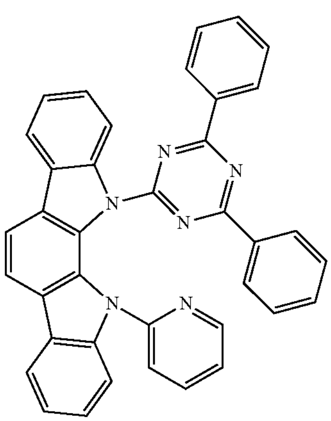
366B
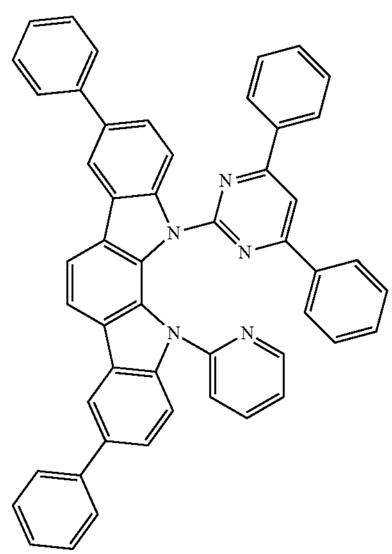

-continued
367B
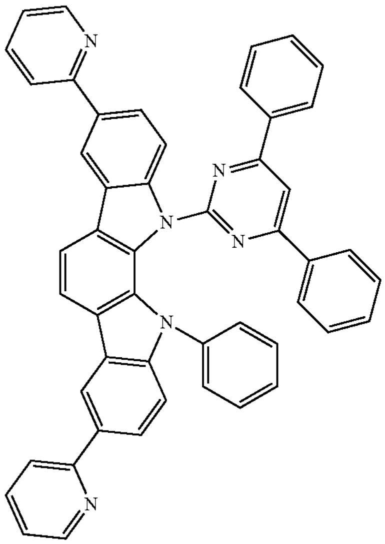
368B
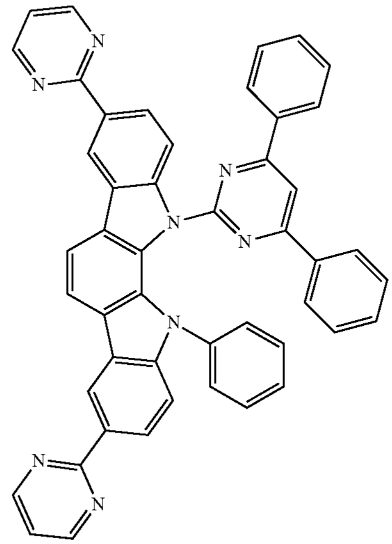
369B
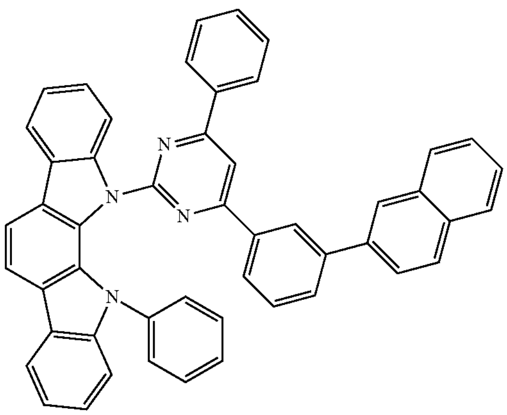
370B
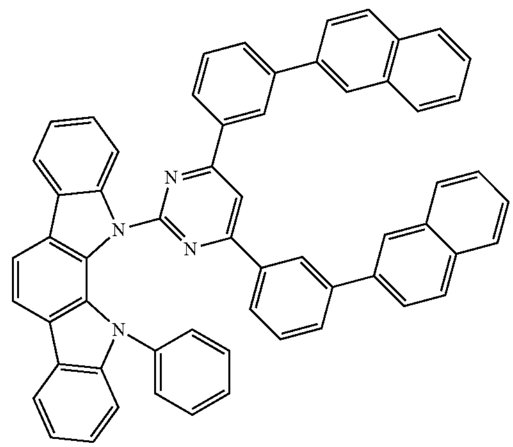
371B
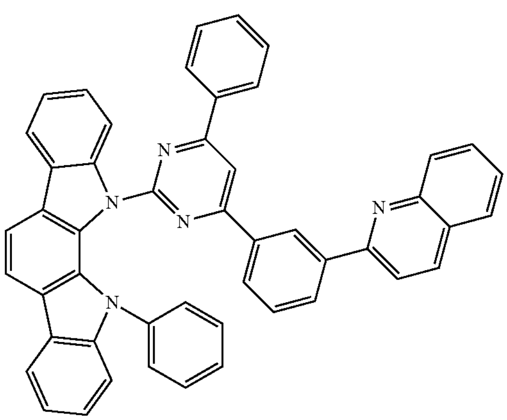
372B
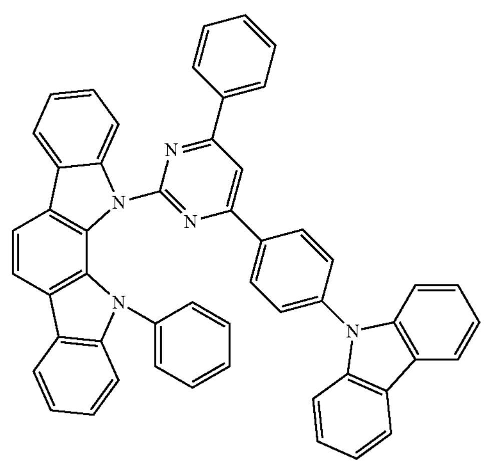

-continued
373B
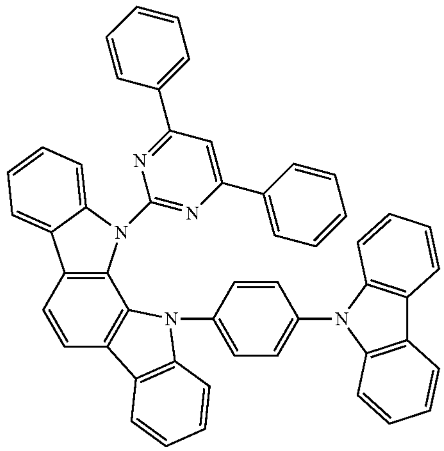
374B
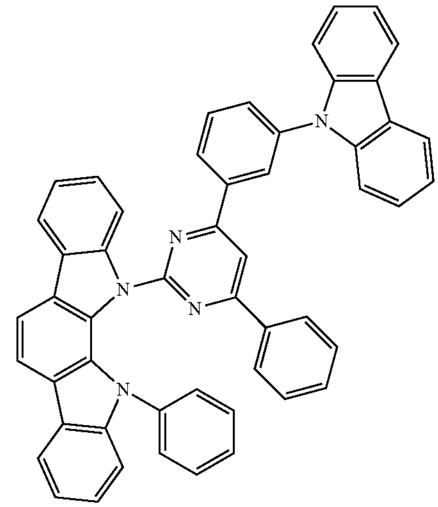
375B
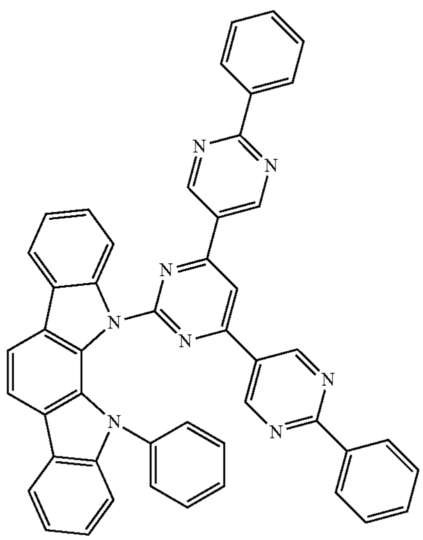
376B
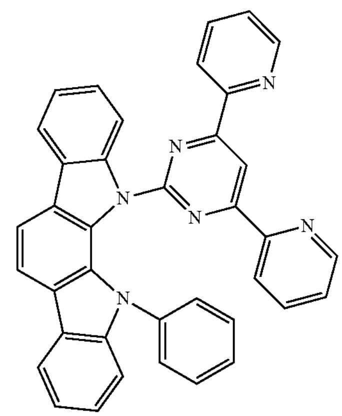
377B
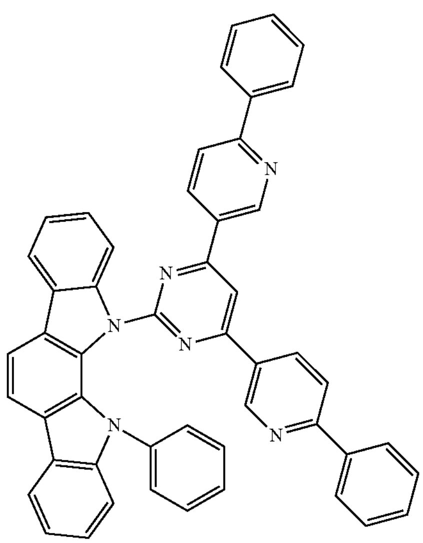
378B
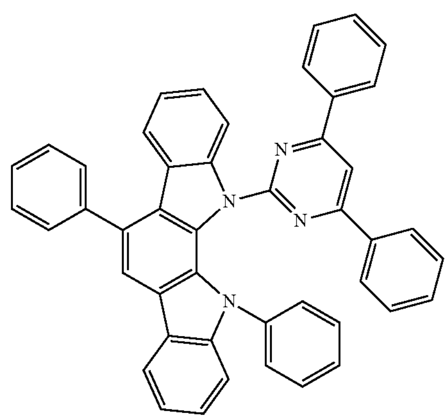

-continued
379B
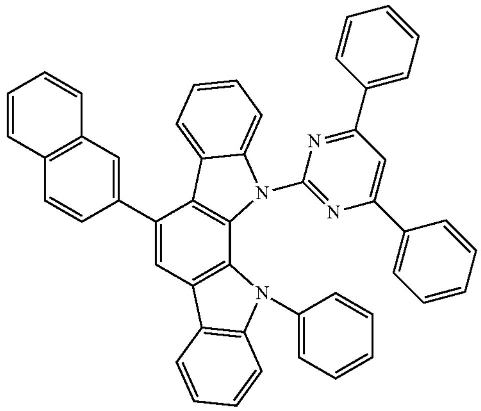
380B
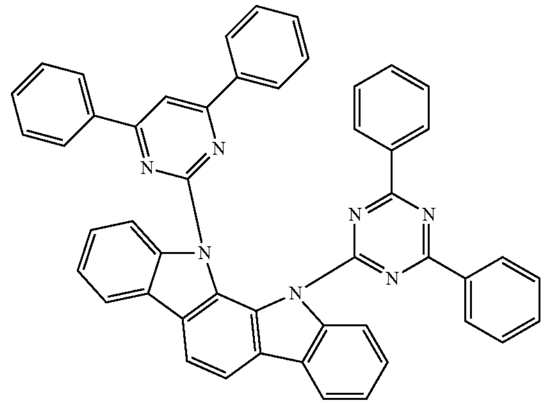
381B
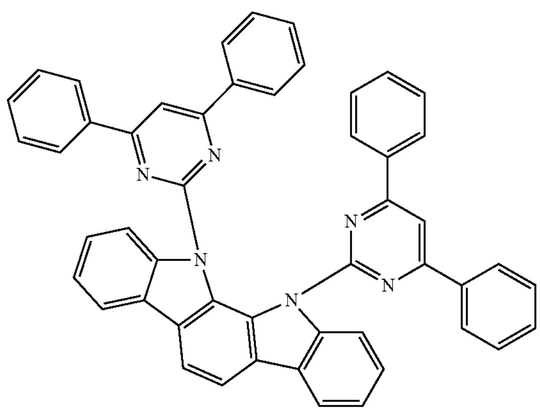
382B
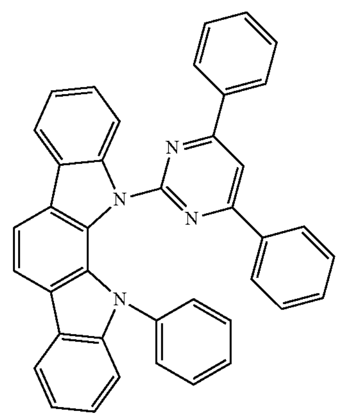
383B
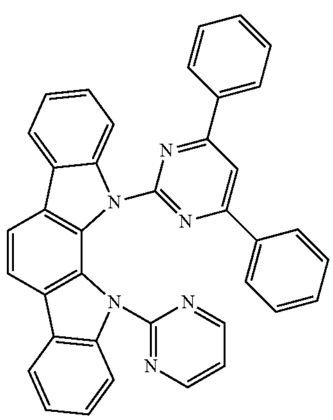
384B
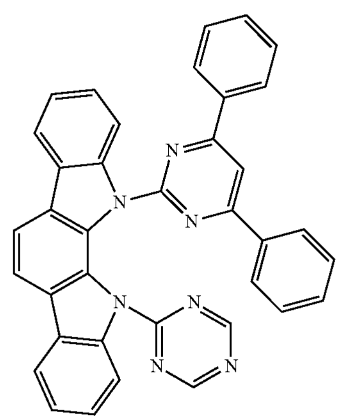

-continued
385B
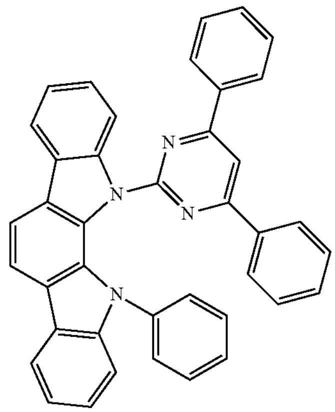
386B
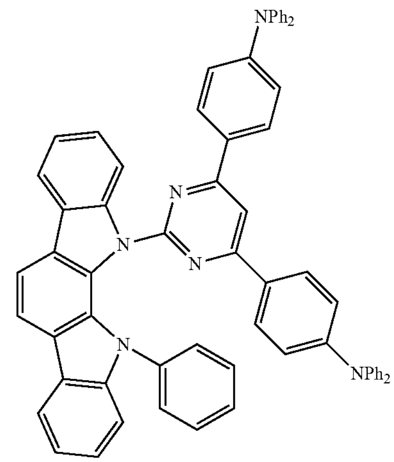
387B
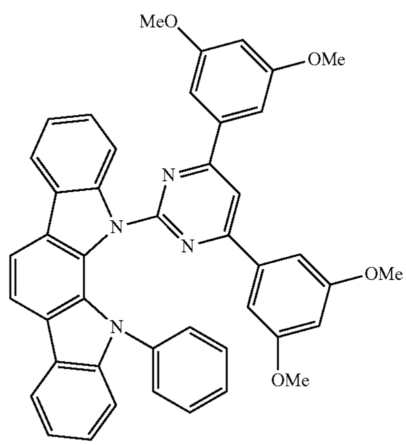
388B
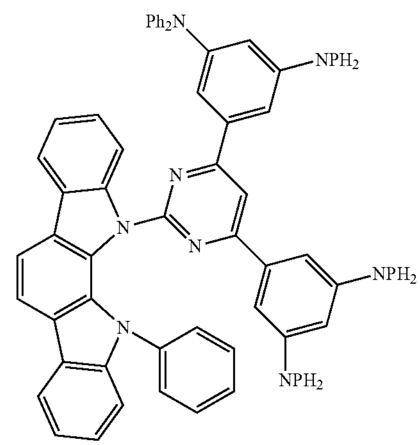
389B
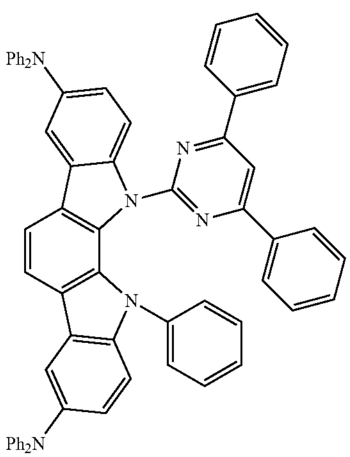
390B
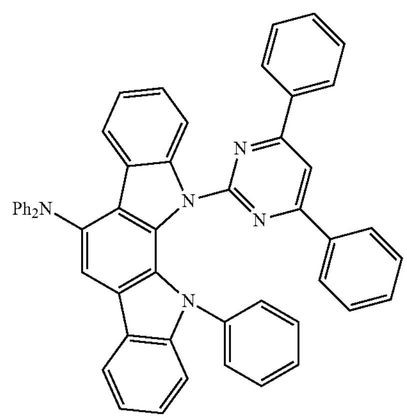

-continued
391B
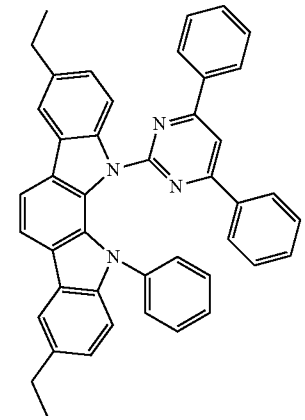
392B
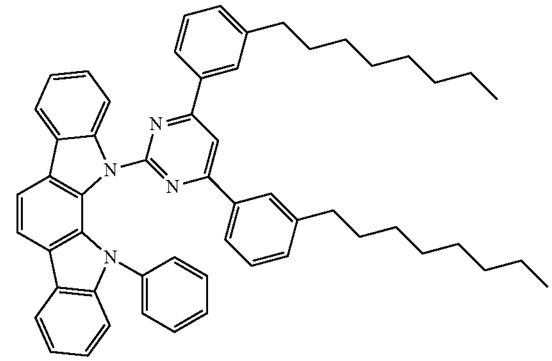
393B
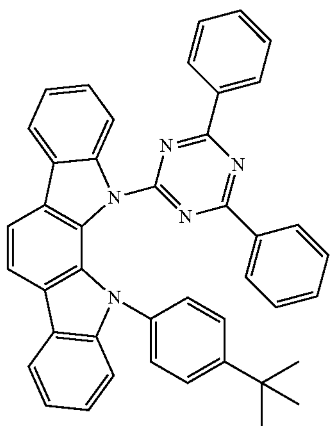
394B
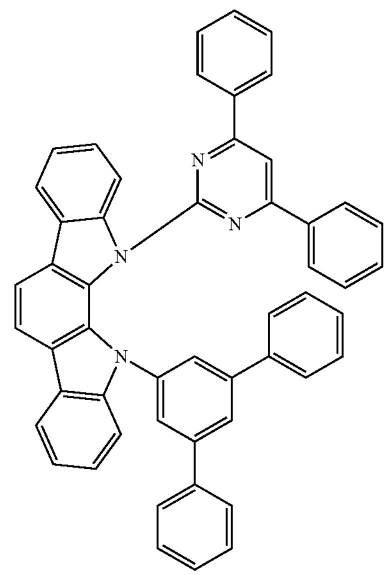
395B
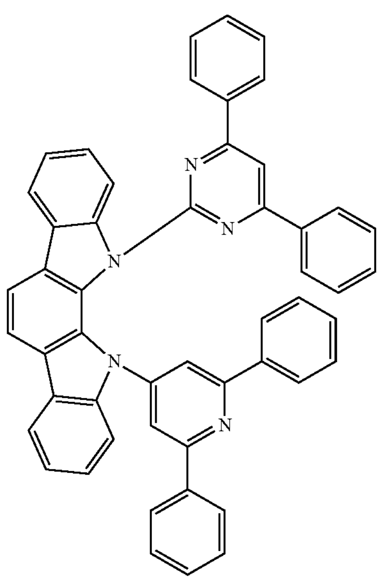
396B
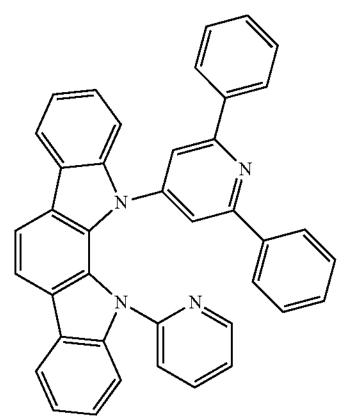

-continued
397B
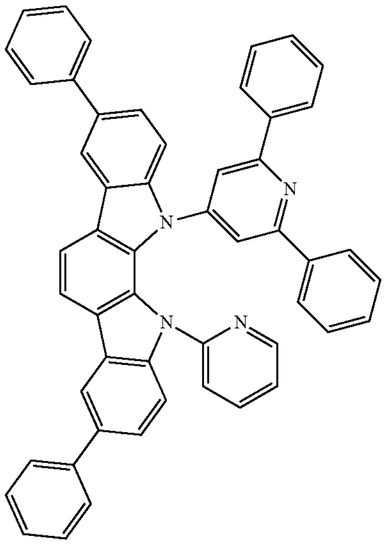
398B
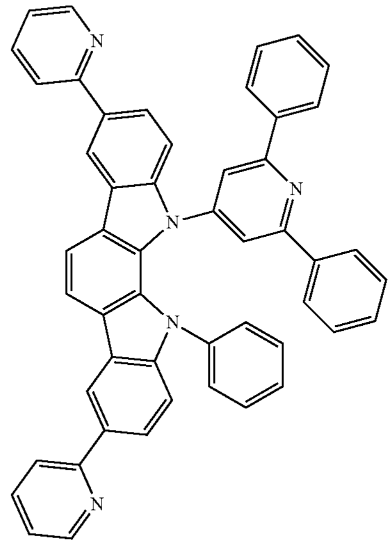
399B
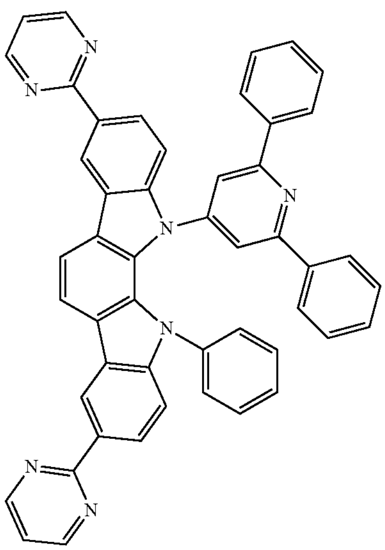
400B
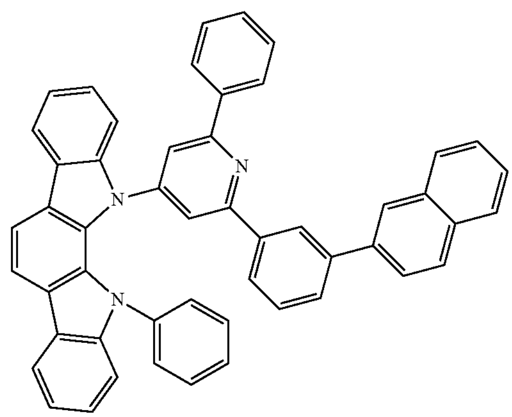
401B
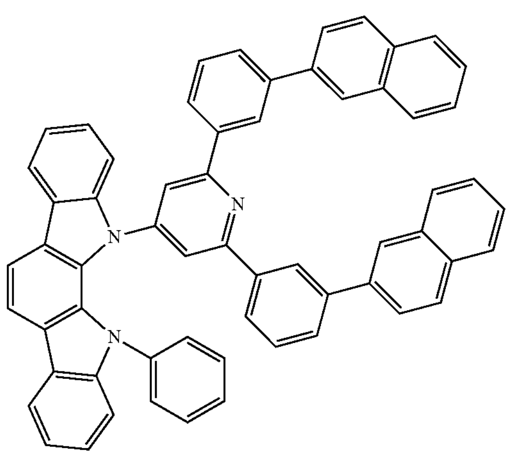
402B
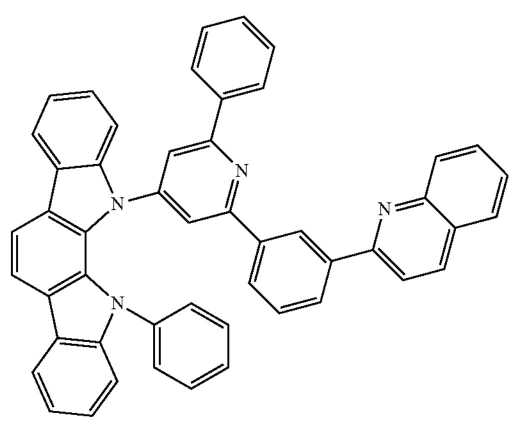

-continued
403B
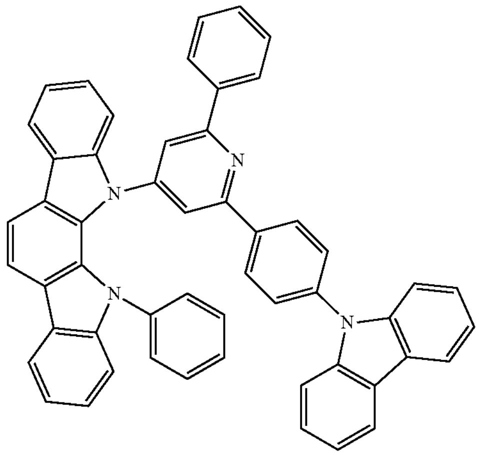
404B
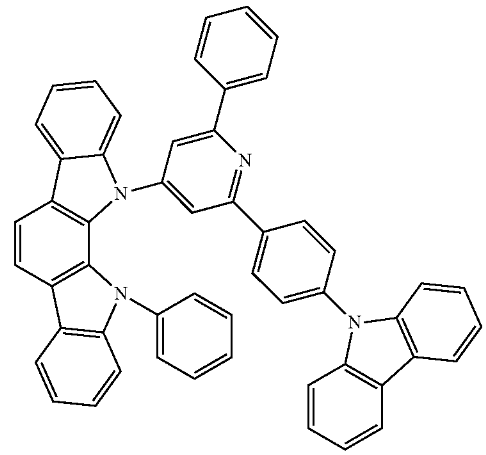
405B
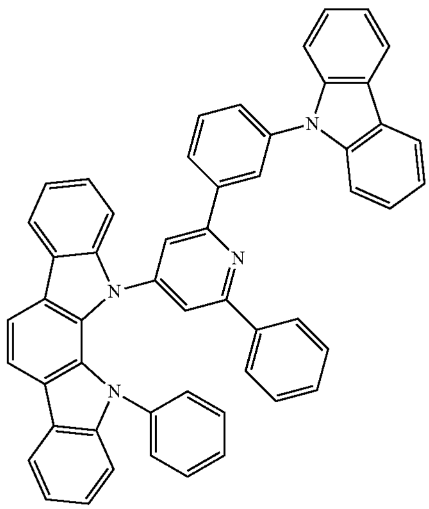
406B
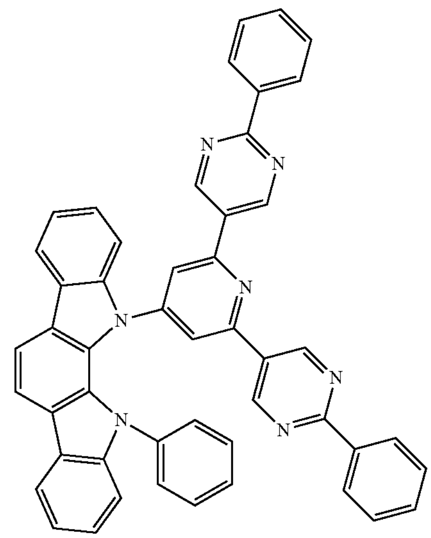
407B
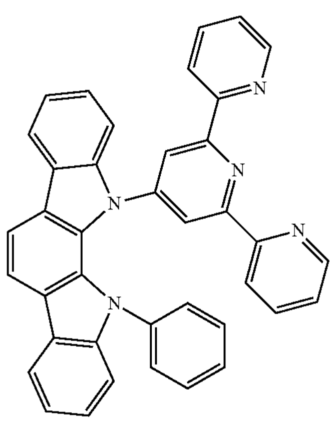
408B
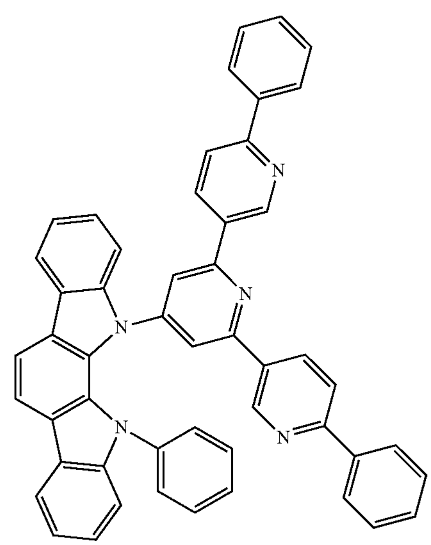

-continued
409B
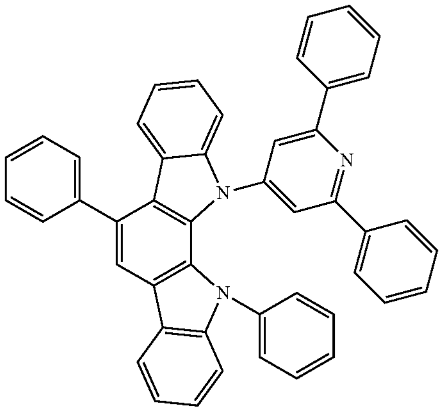
410B
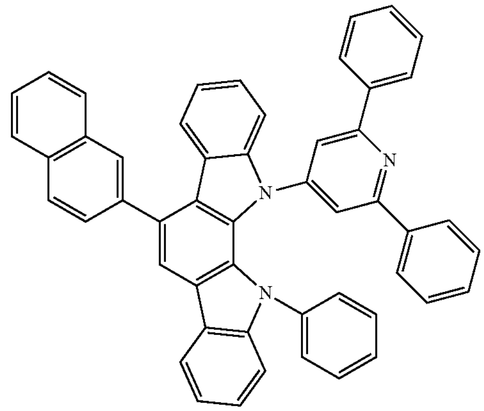
411B
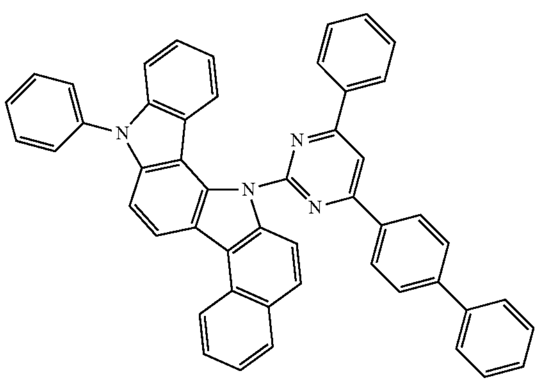
412B
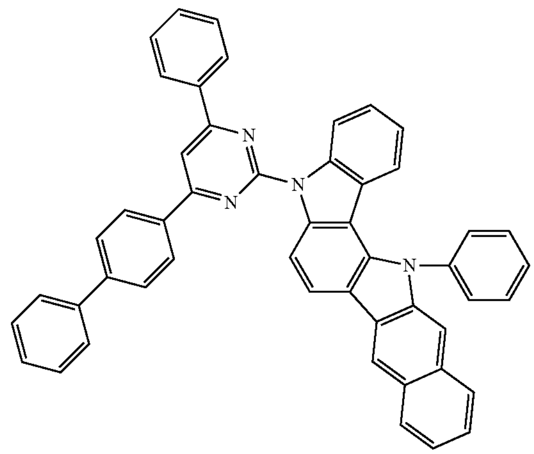
413B
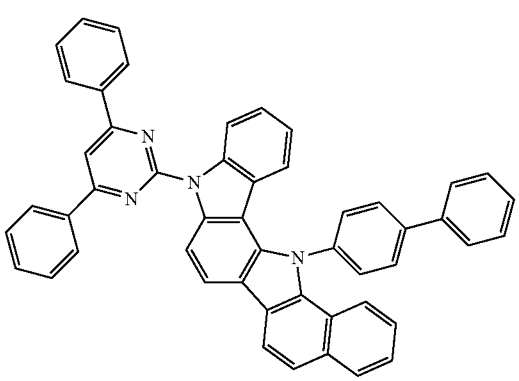
414B
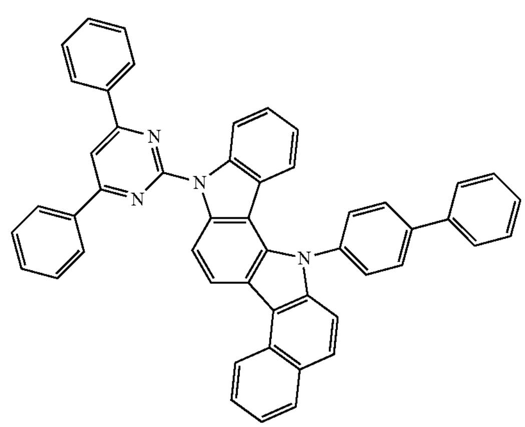

-continued
415B
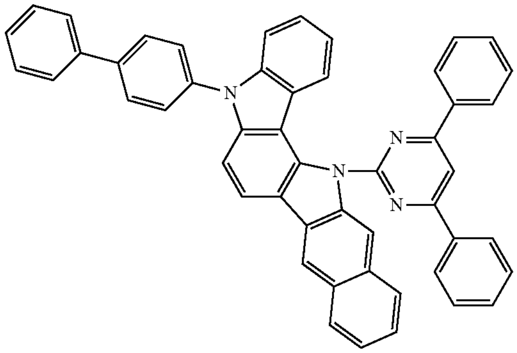
416B
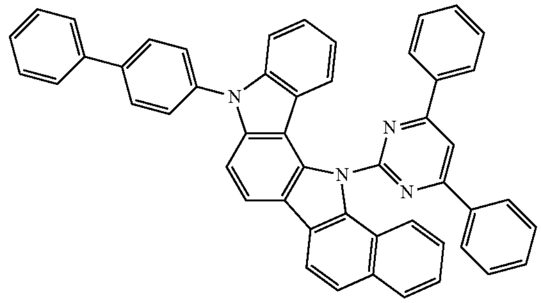
417B
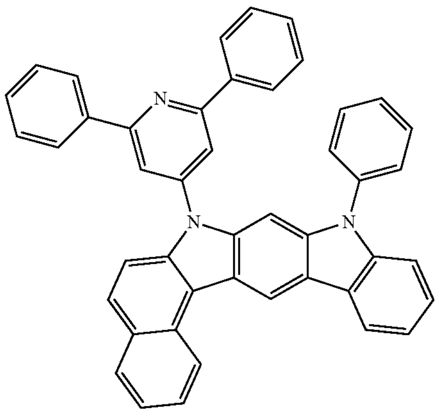
418B
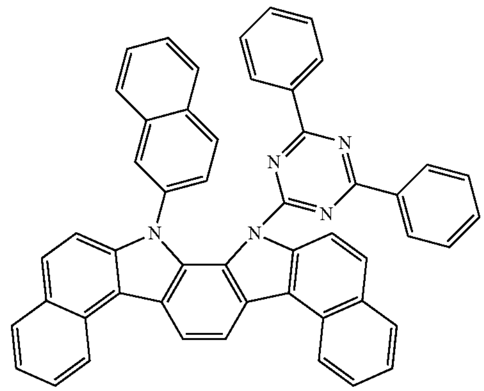
419B
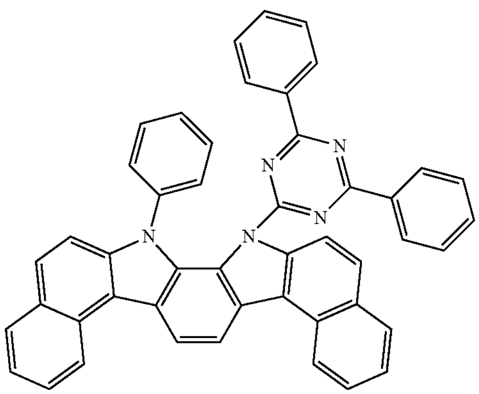
420B
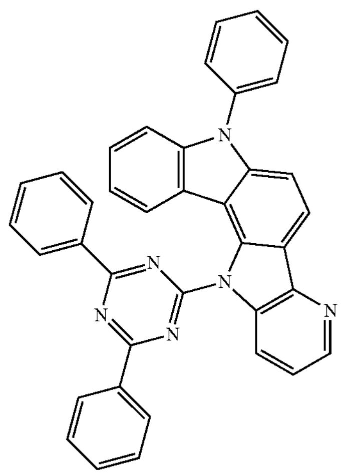
421B
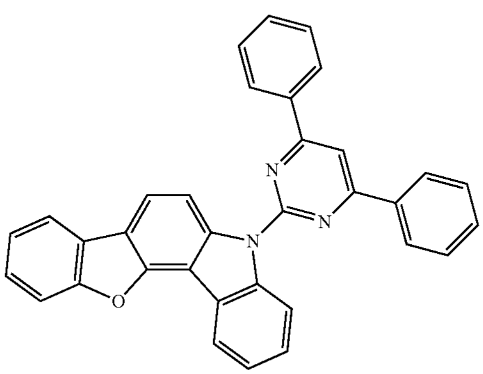
422B
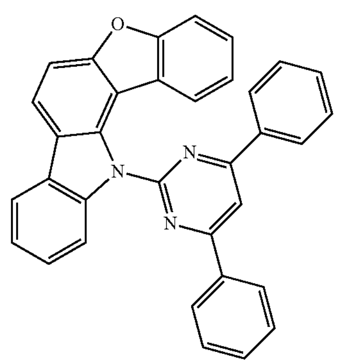

-continued
423B
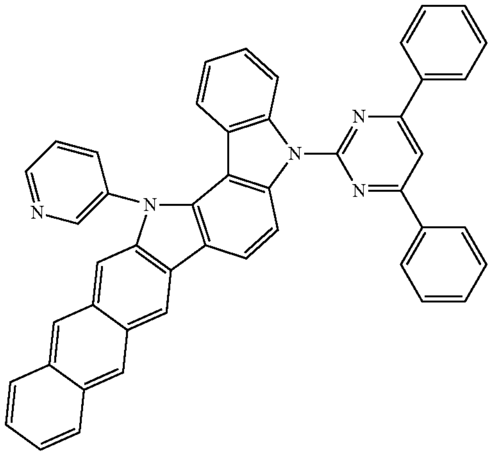
424B
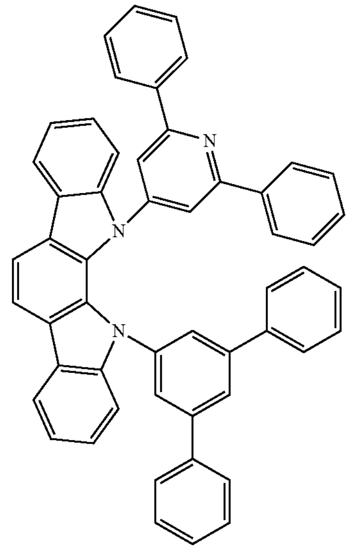
425B
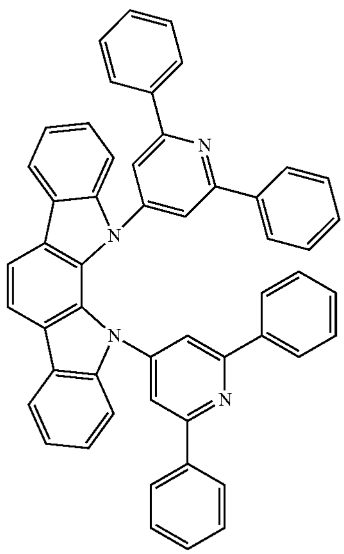
426B
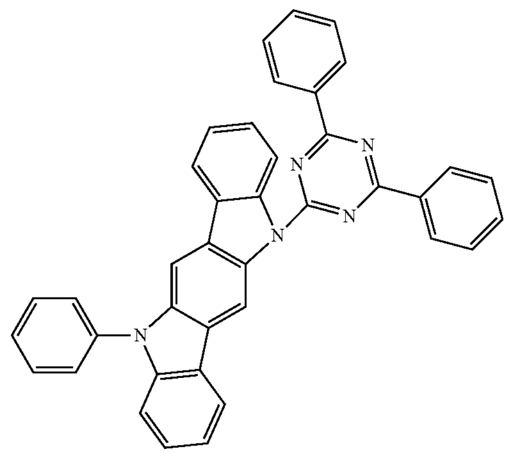
427B
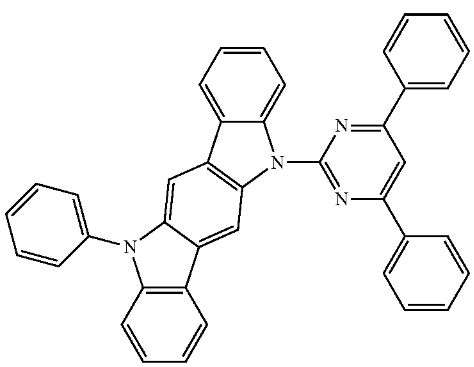
428B
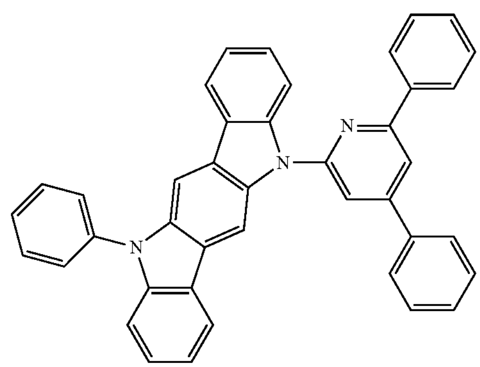

-continued
429B
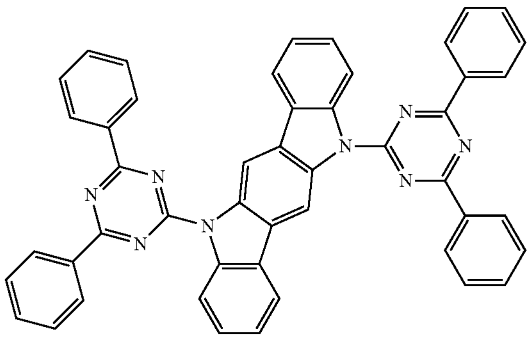
430B
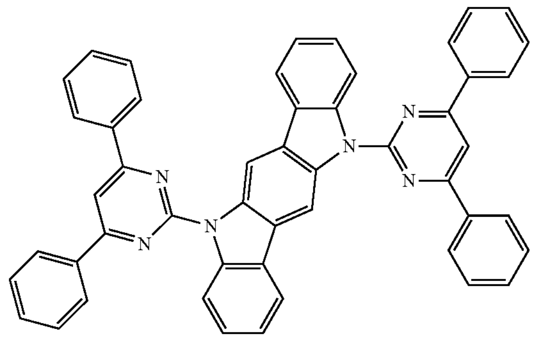
431B
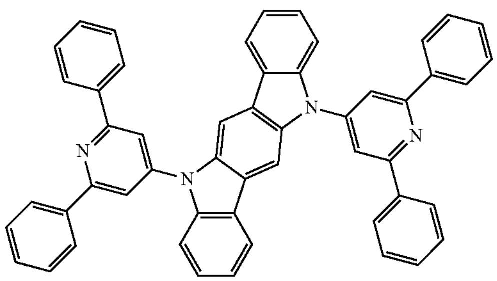
432B
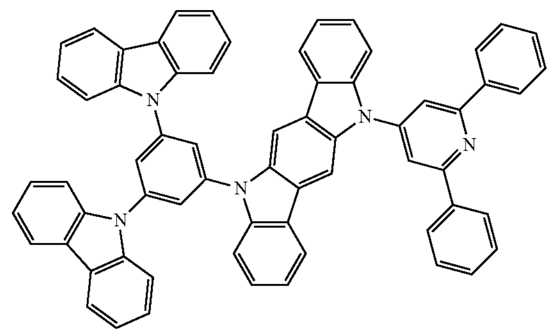
433B
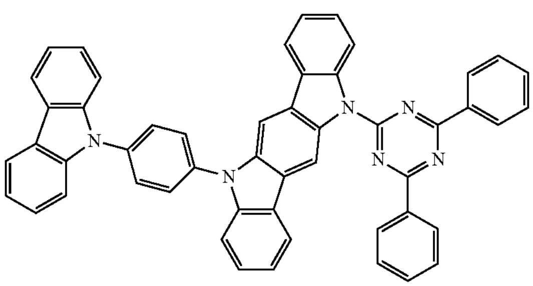
434B
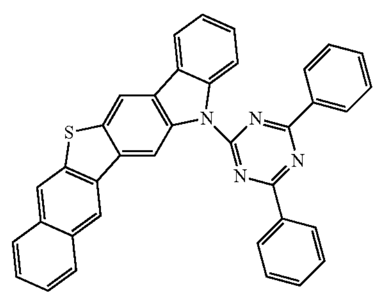
435B
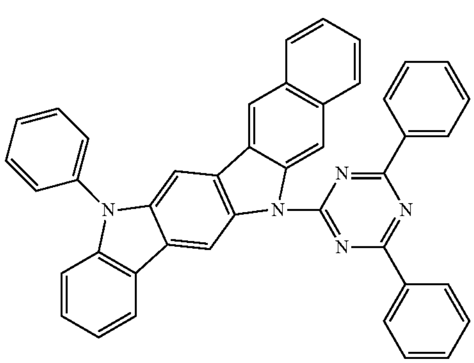
436B
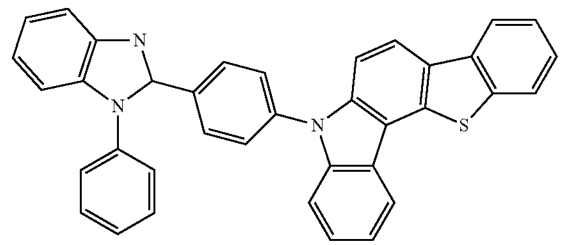

-continued
437B
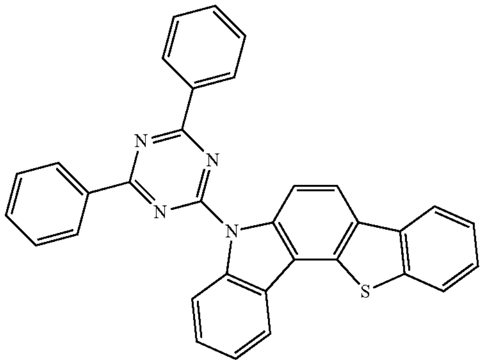
438B
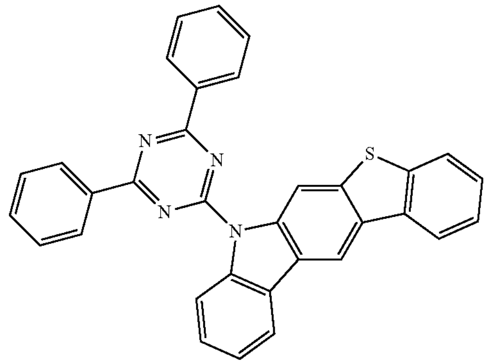
439B
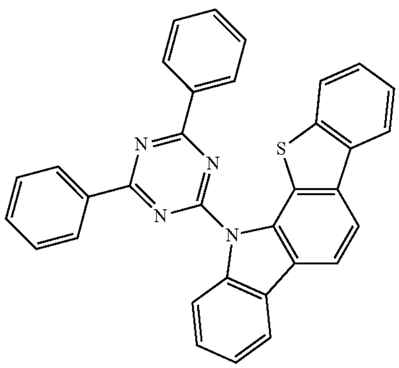
440B
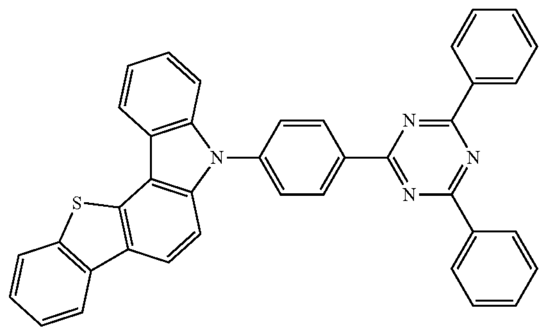
441B
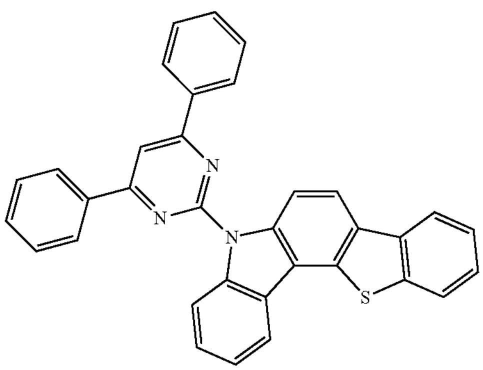
442B
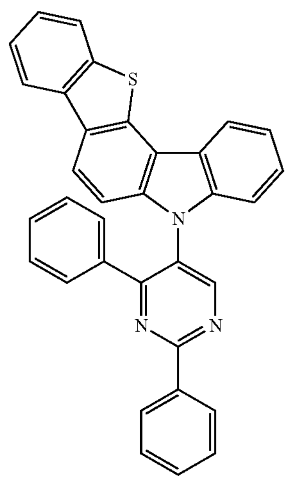
443B
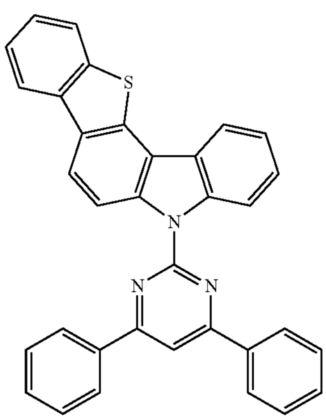
444B
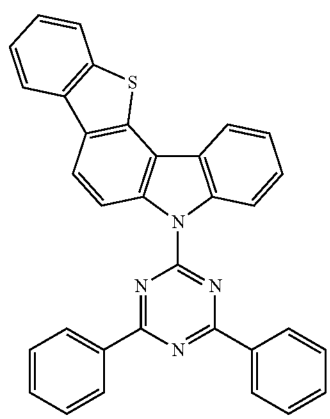

-continued
445B
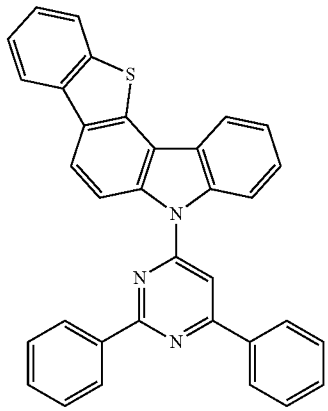
446B
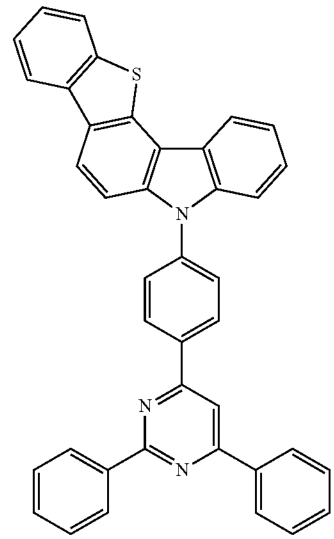
447B
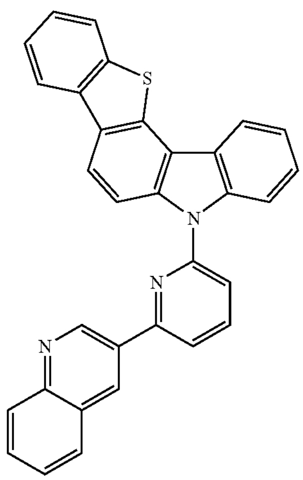
448B
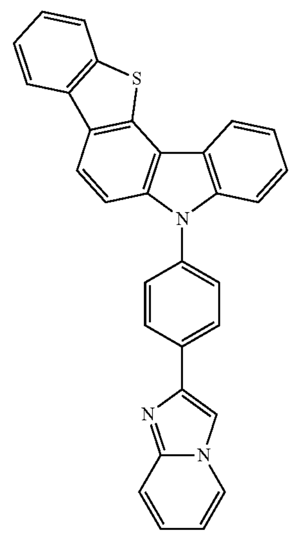
449B
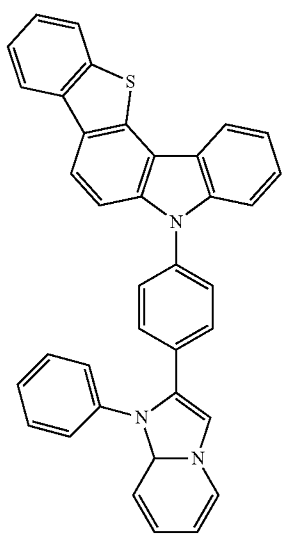
450B
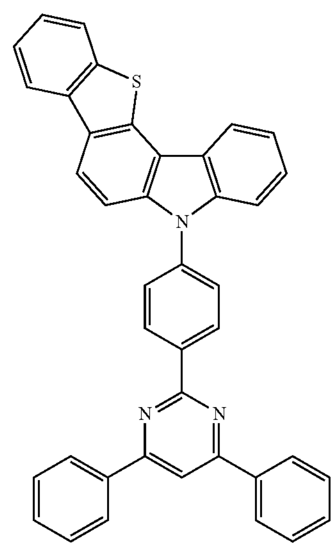

-continued
451B
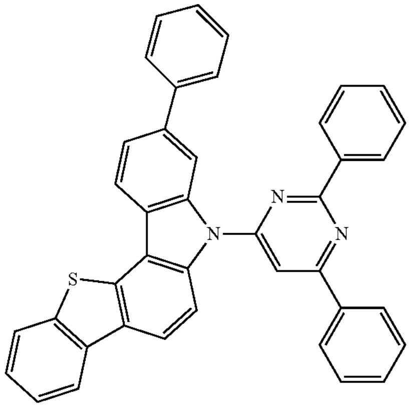
452B
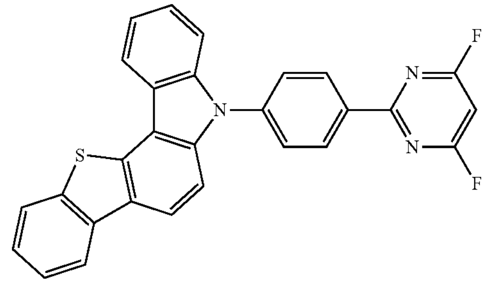
453B
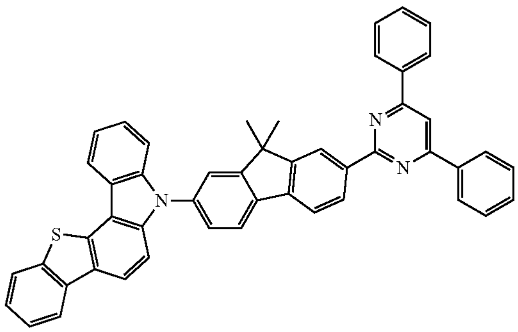
454B
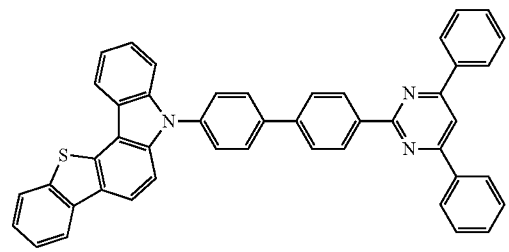
455B
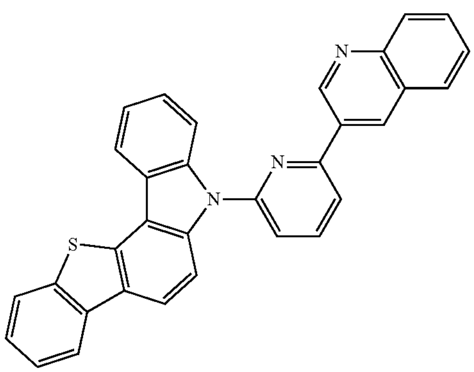
456B
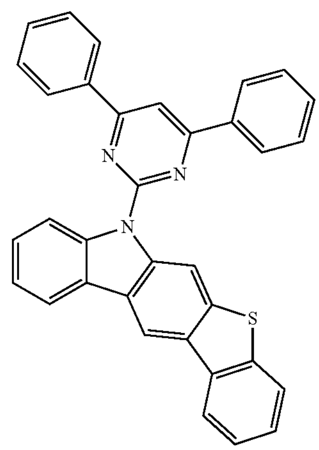
457B
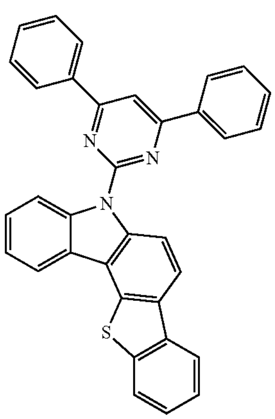
458B
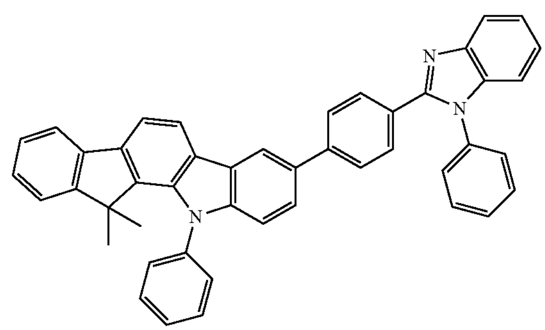

-continued
459B
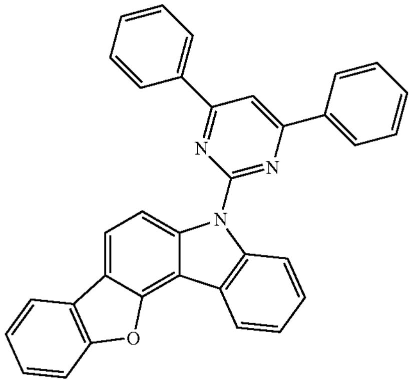
460B
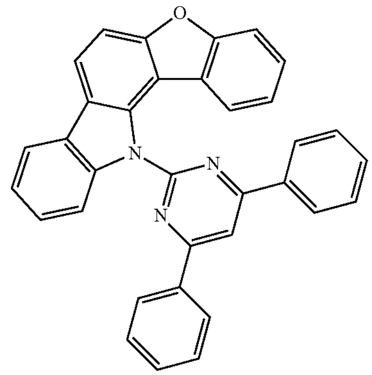
501
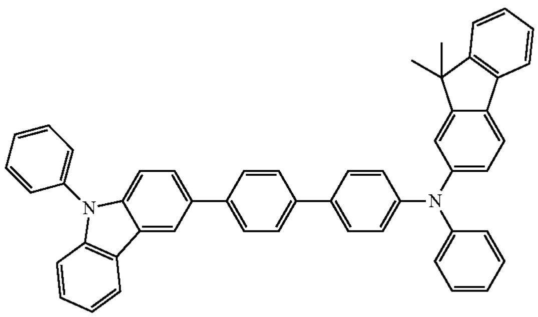
502
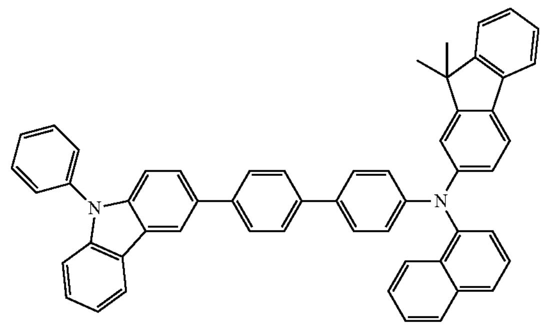
503
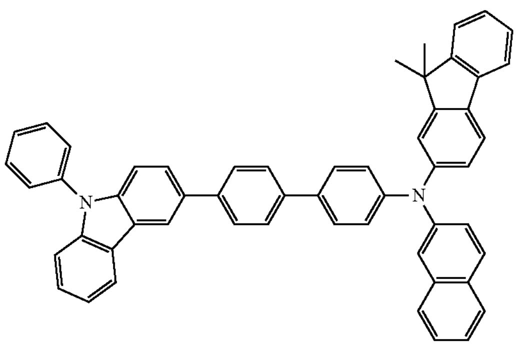
504
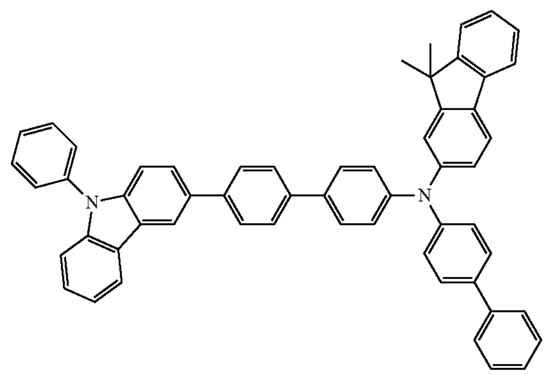
505
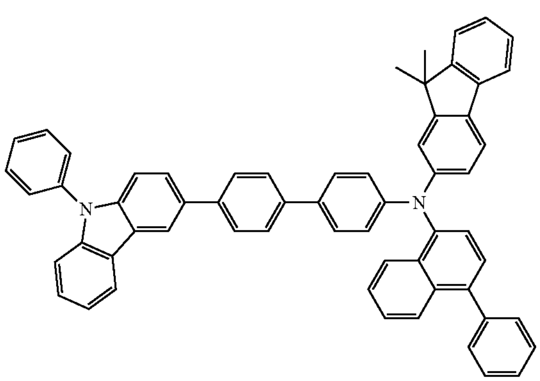
506
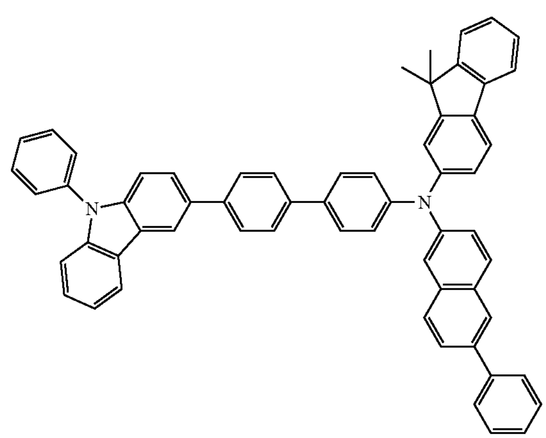

-continued
507
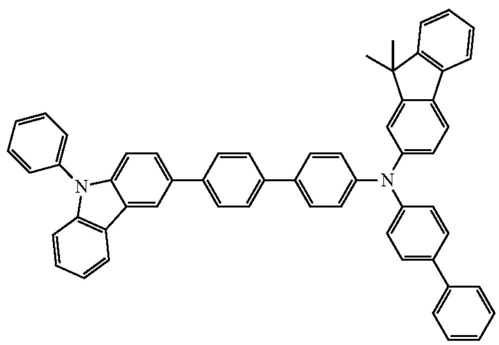
508
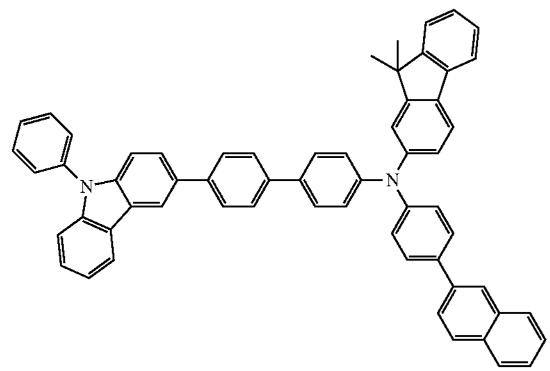
509
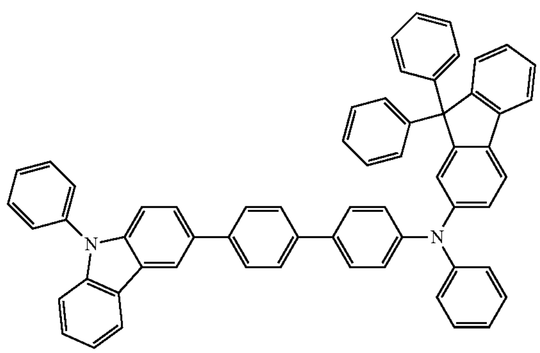
510
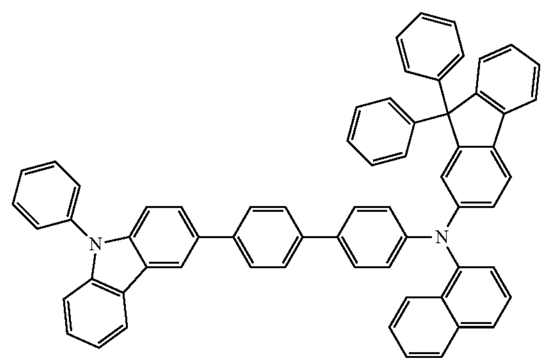
511
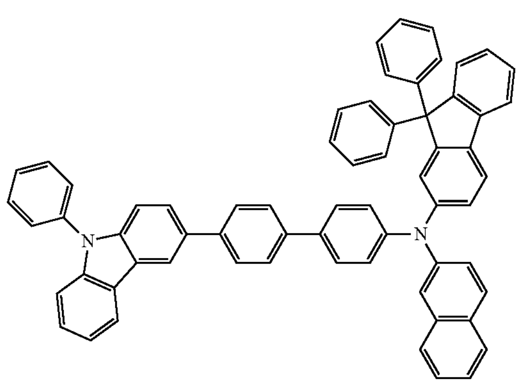
512
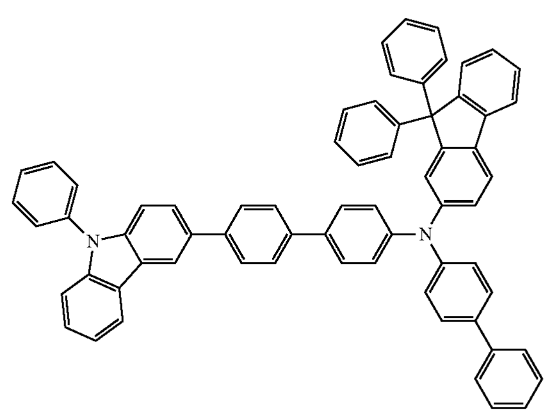

-continued
513
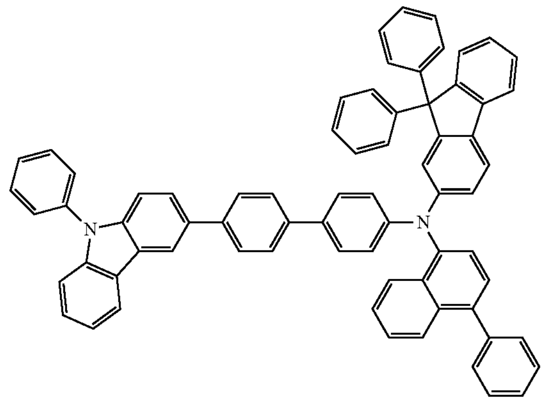
514
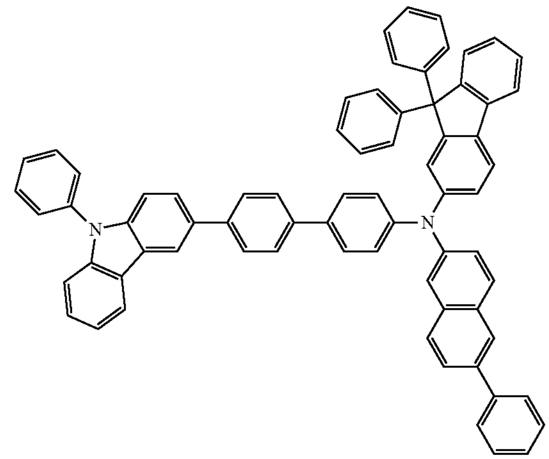
515
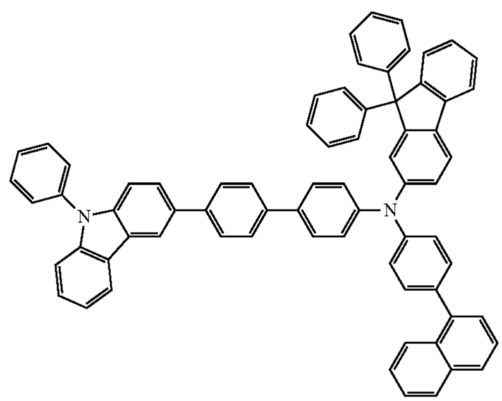
516
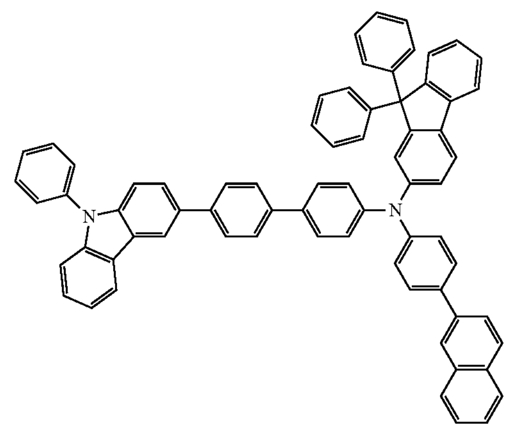
517
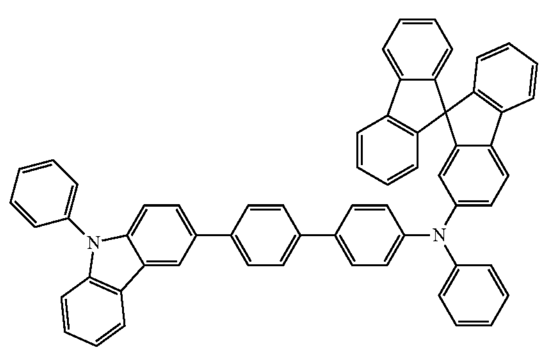
518
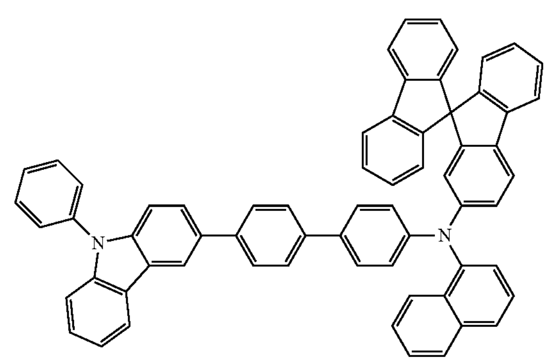

-continued
519
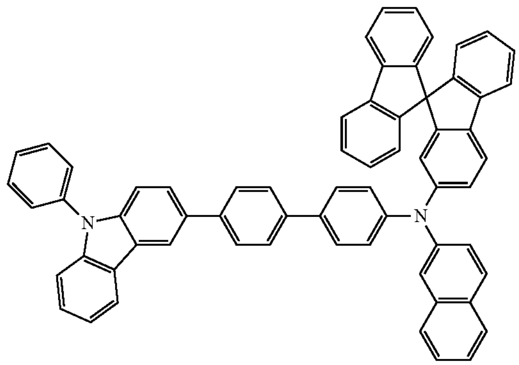
520
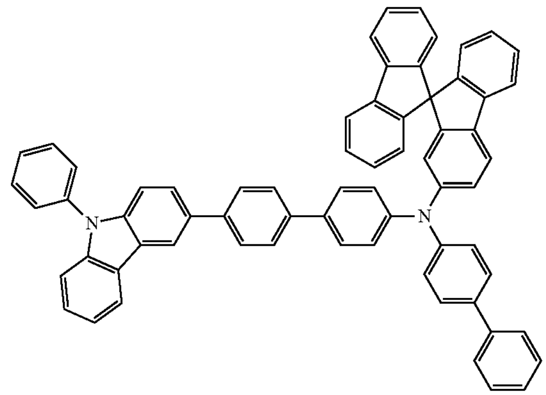
521
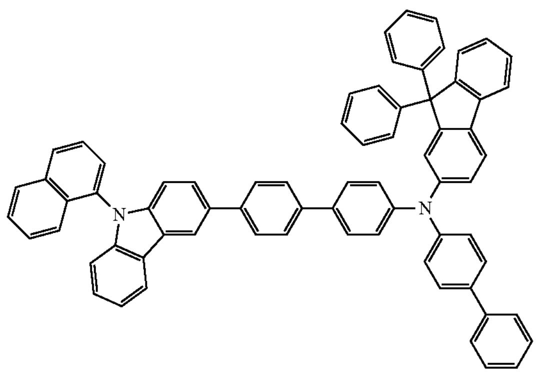
522
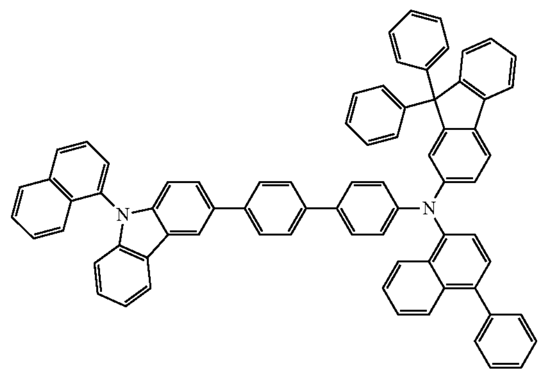
523
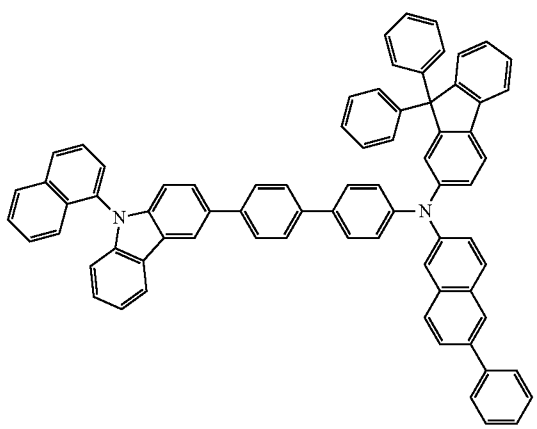
524
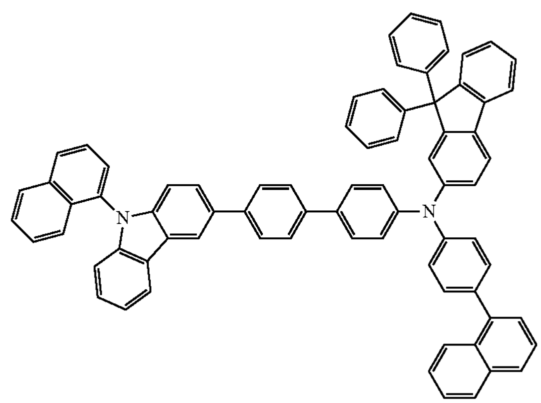
525
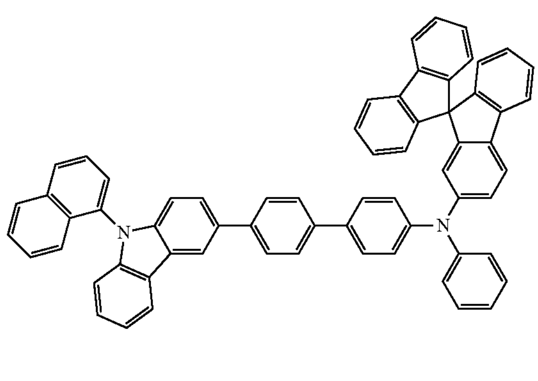
526
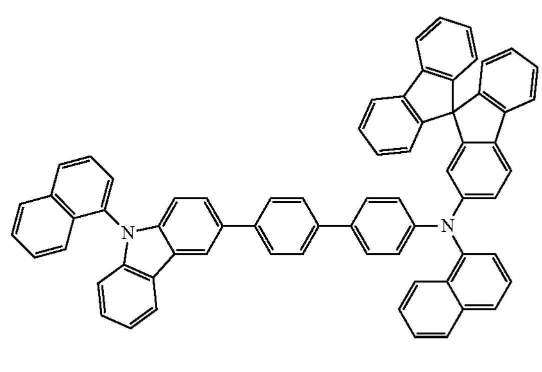

-continued
527
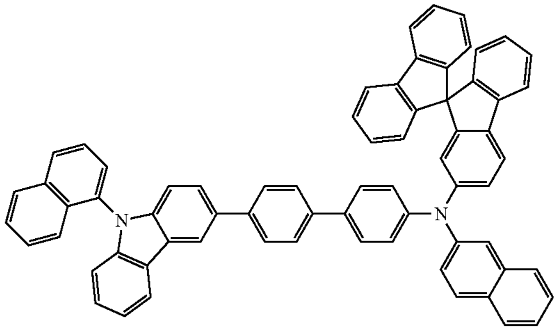
528
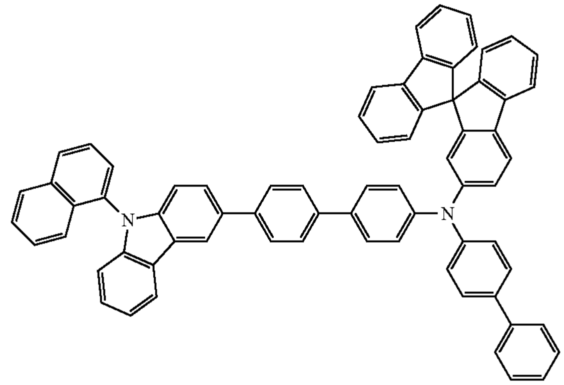
429
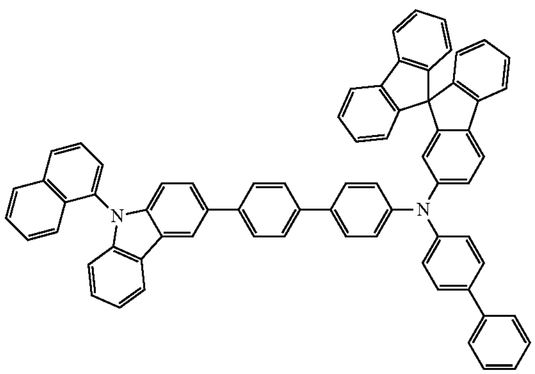
430
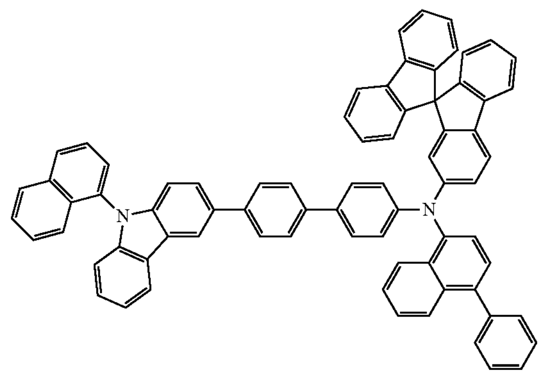
431
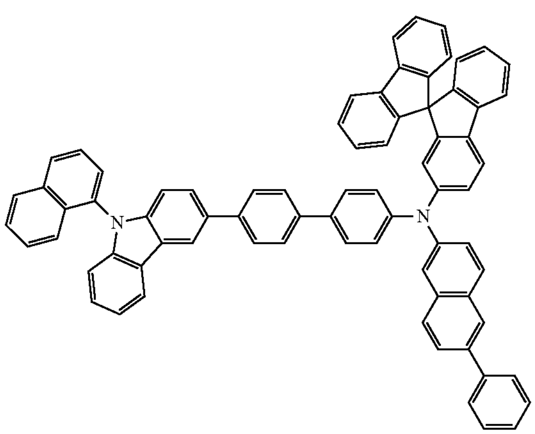
432
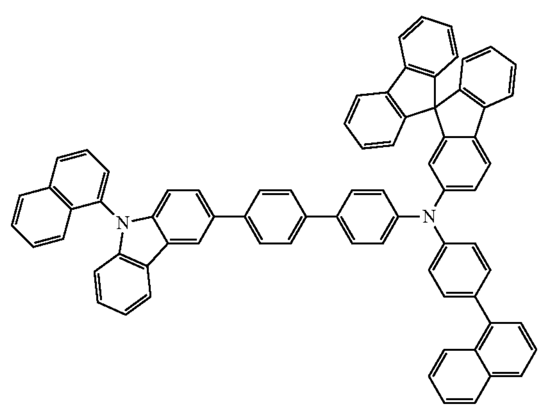

-continued
533
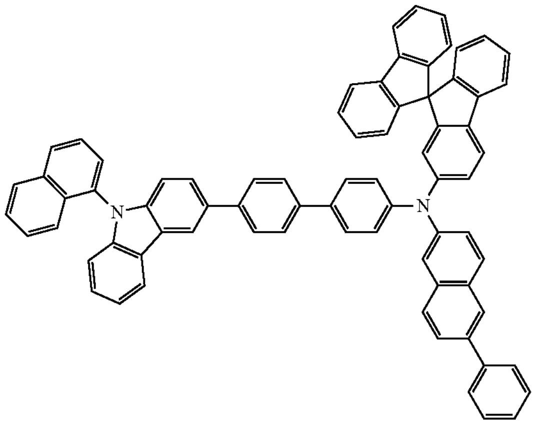
534
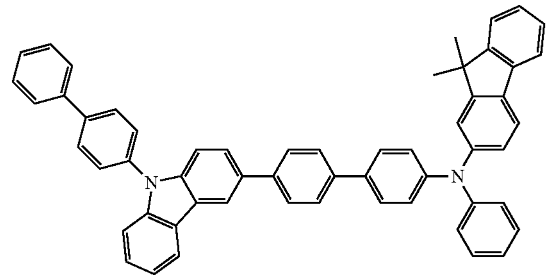
535
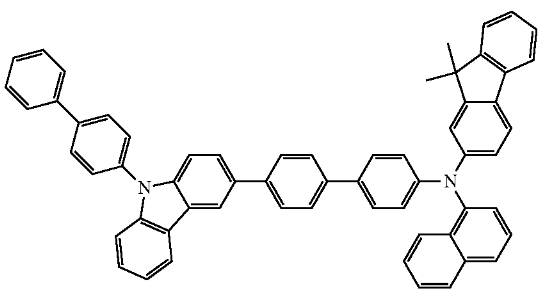
536
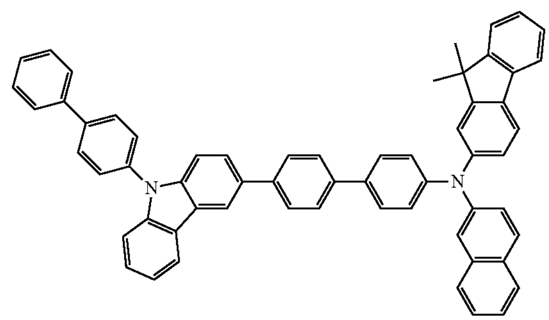
537
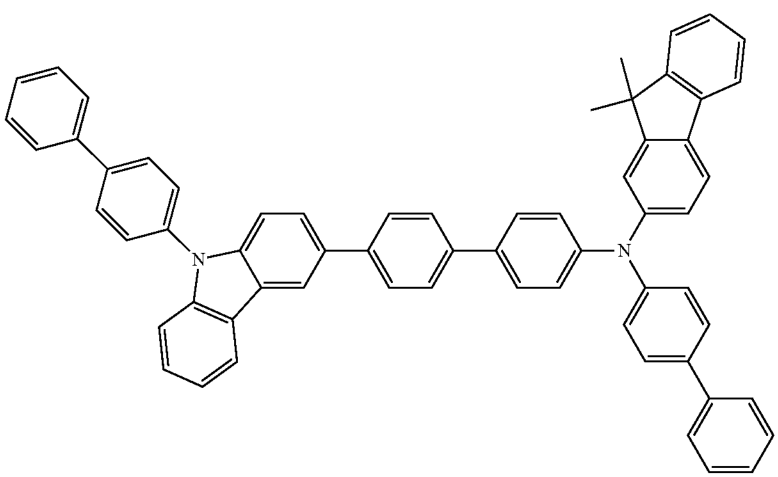

-continued
538
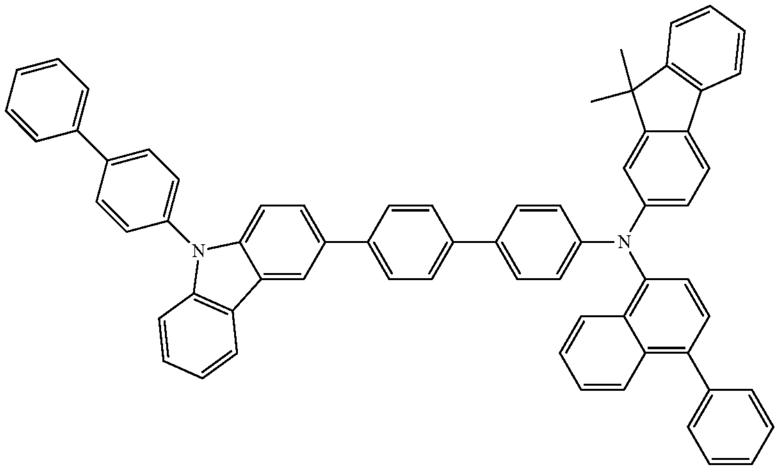
539
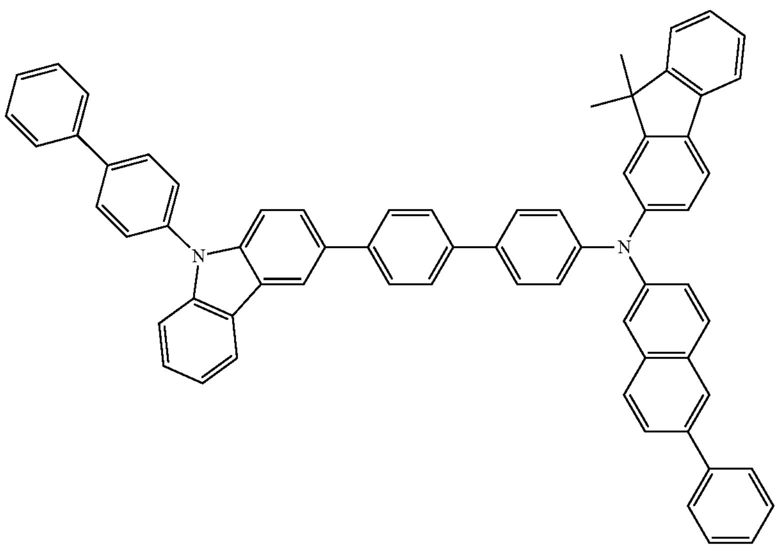
540
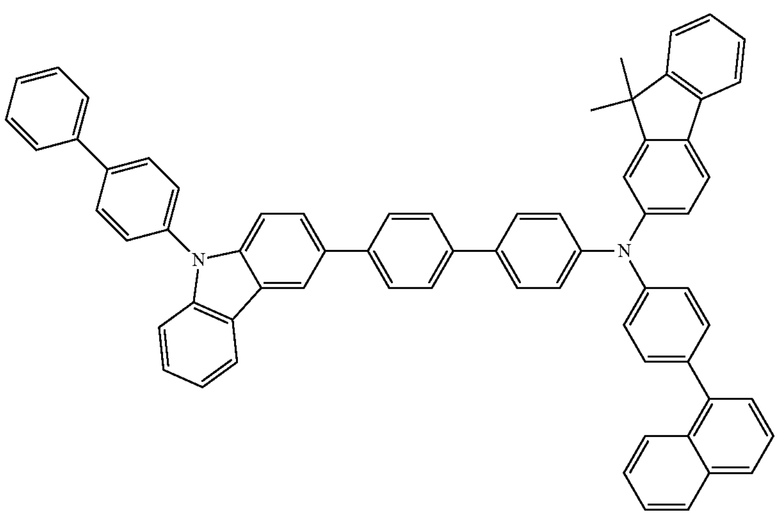

-continued
541
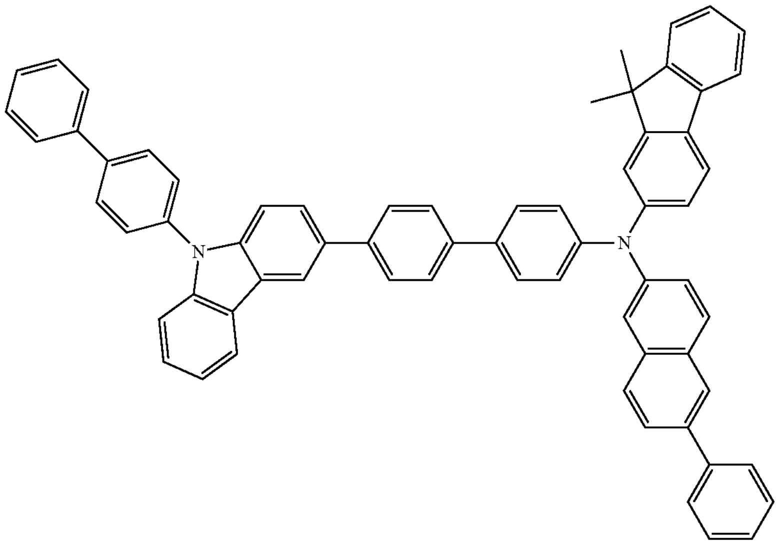
542
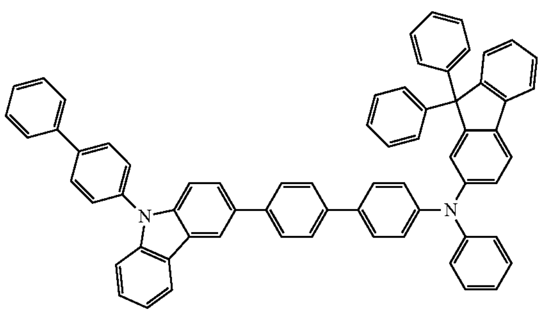
543
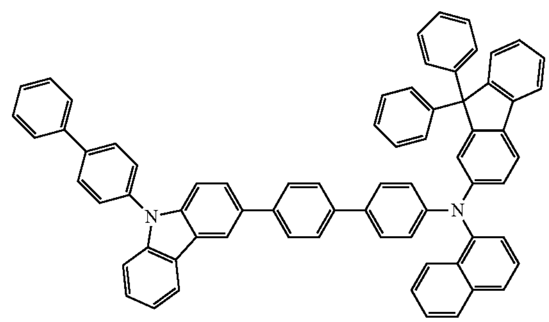
544
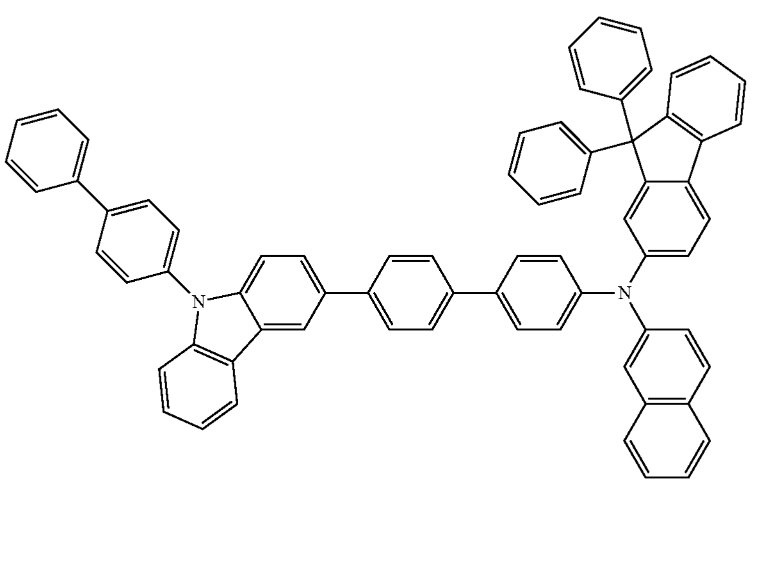

-continued
545
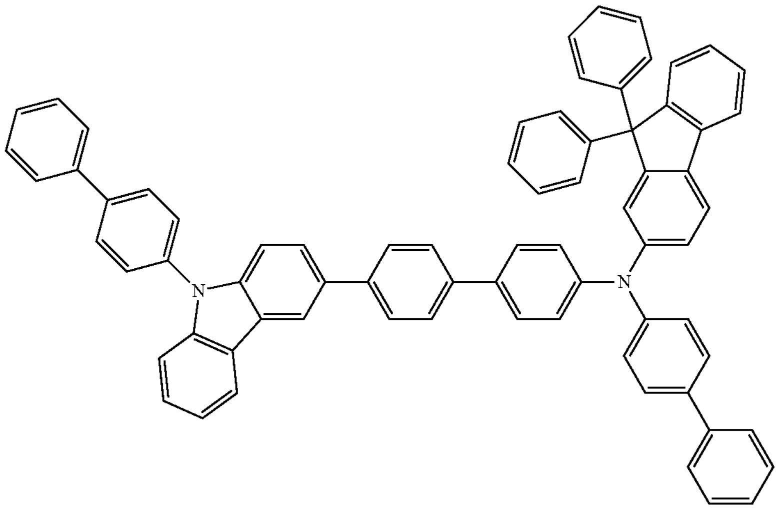
546
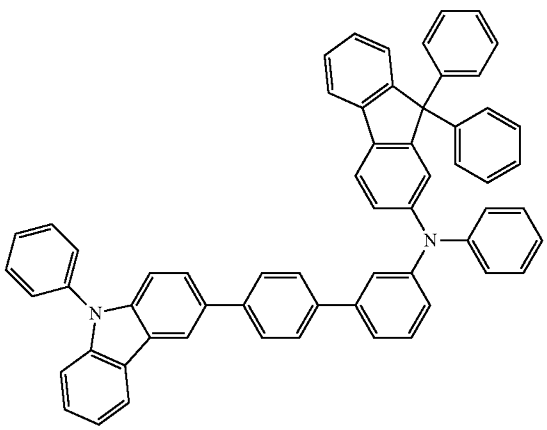
547
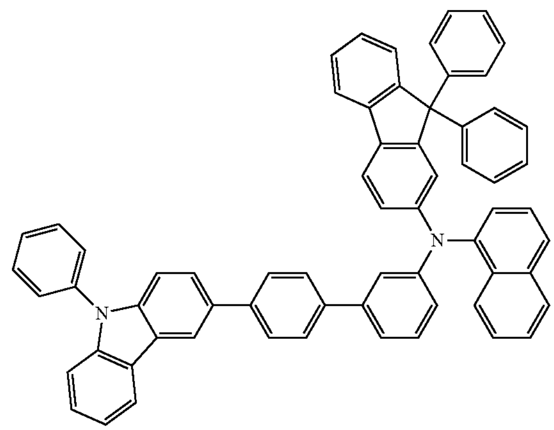
548
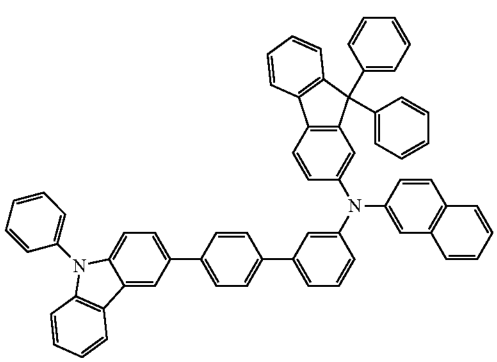
549
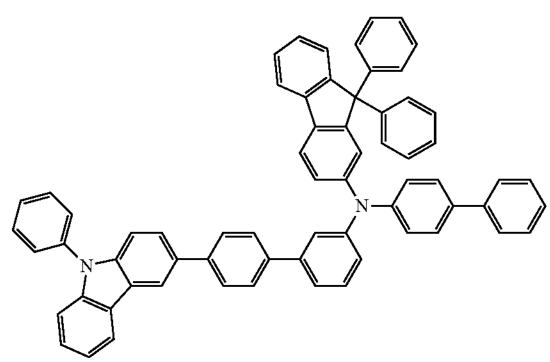

-continued
550
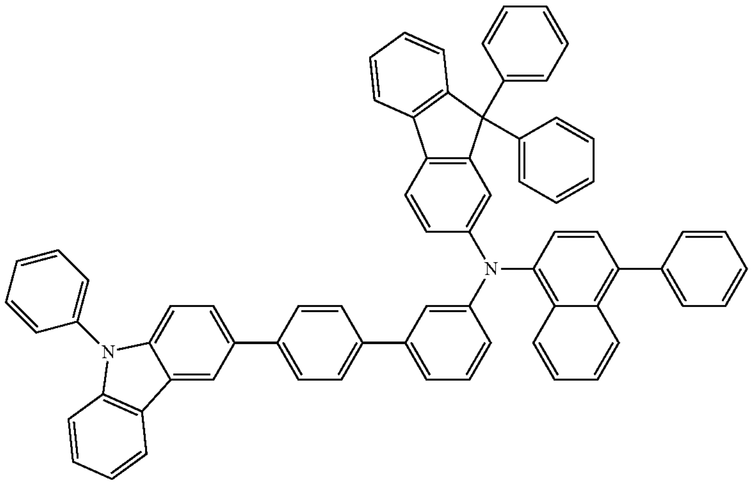
551
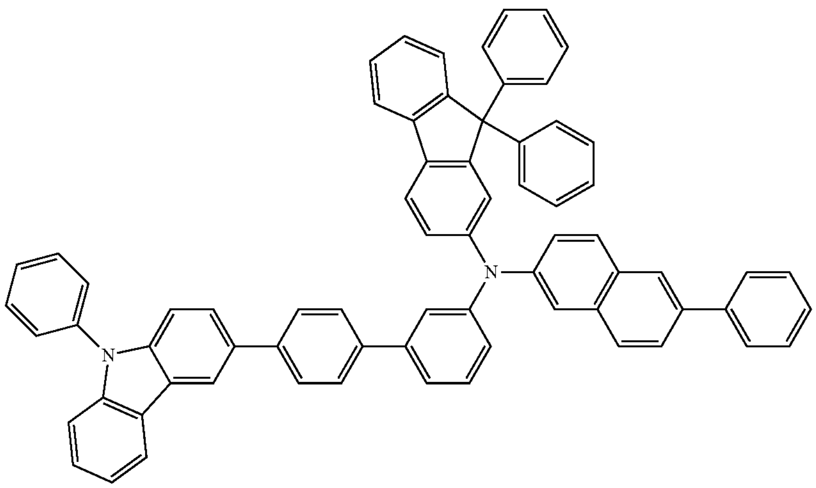
552
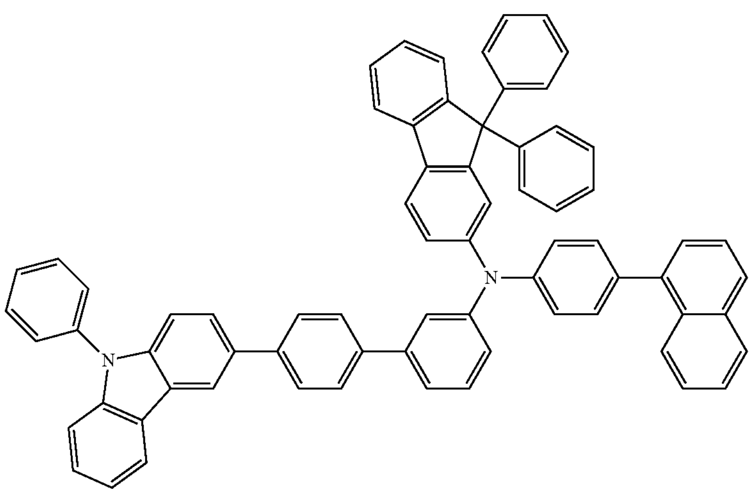

-continued
553
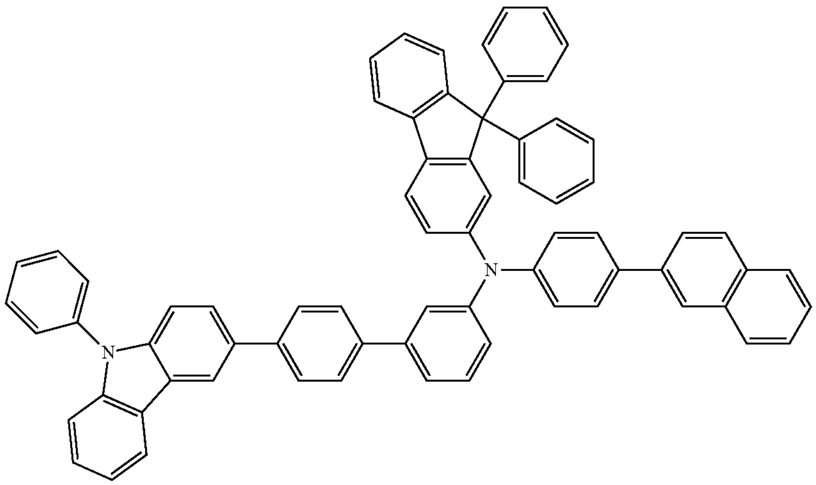
554
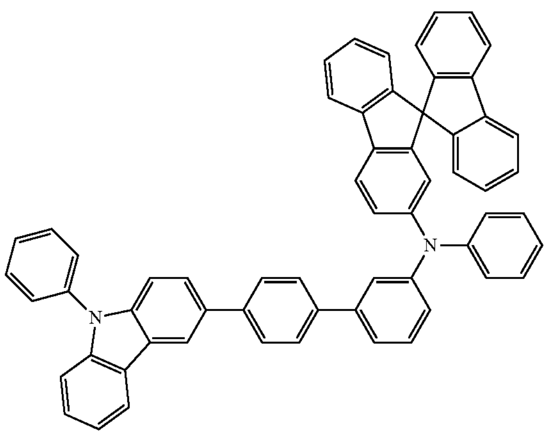
555
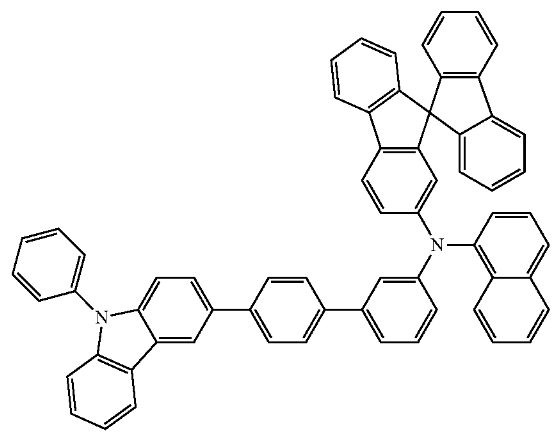
556
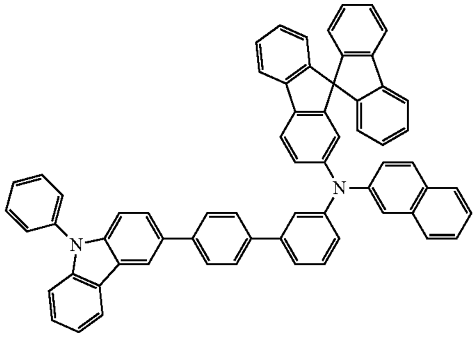
557
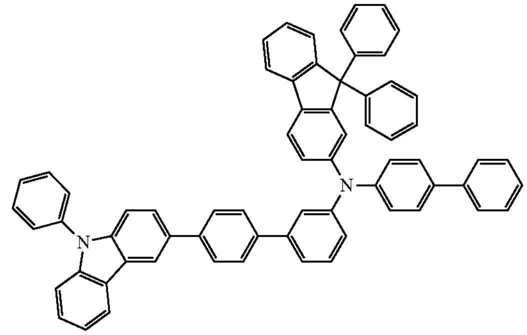

-continued
558
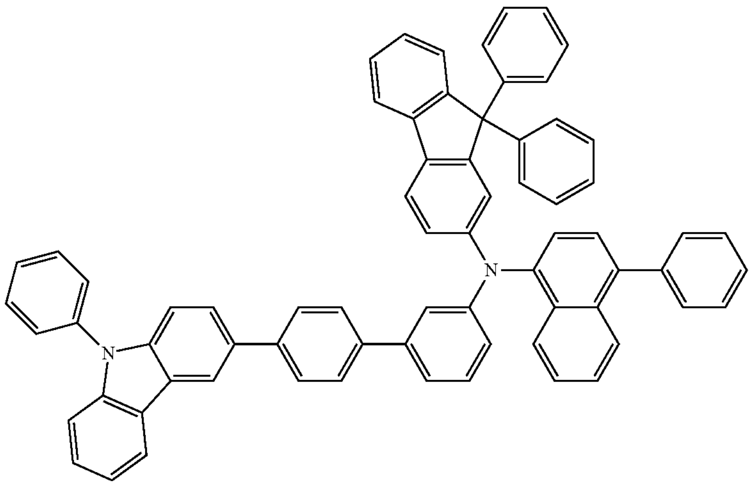
559
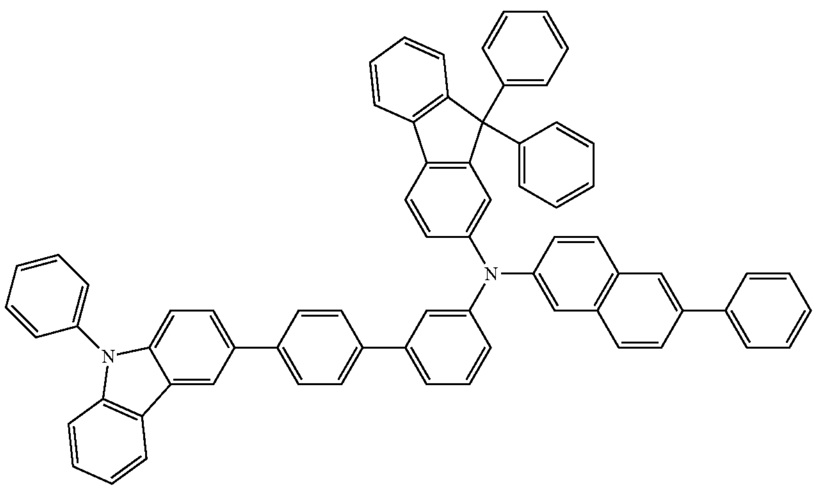
560
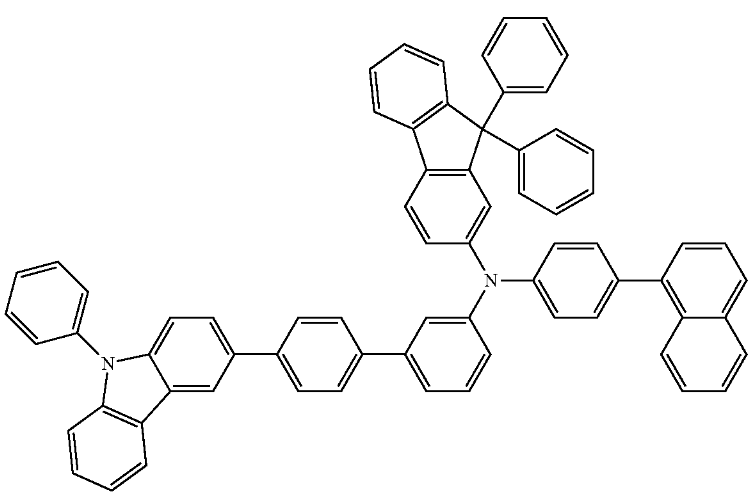

561
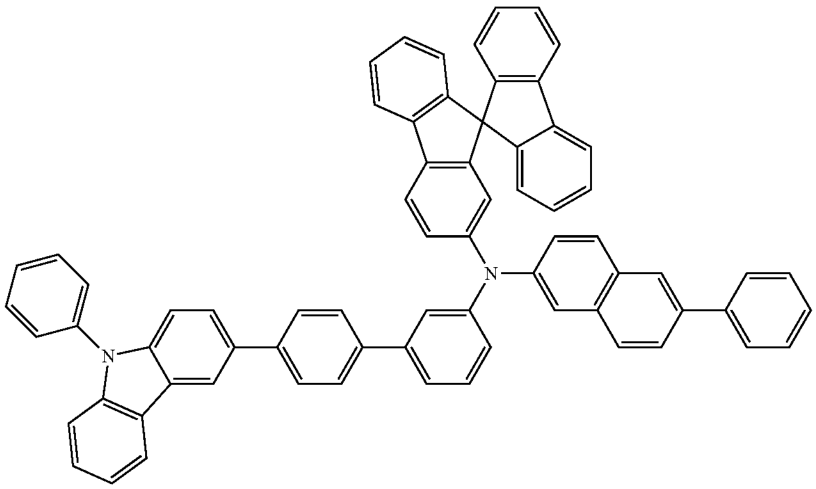
562
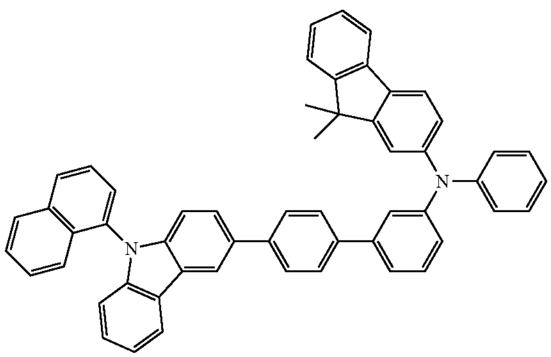
563
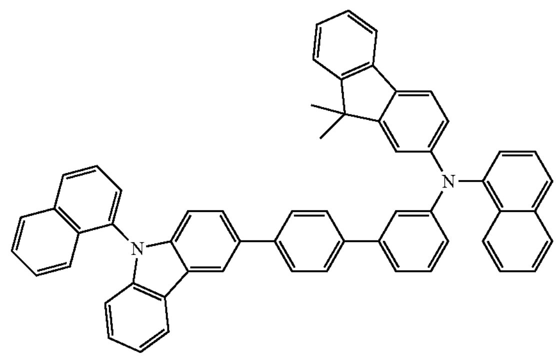
564
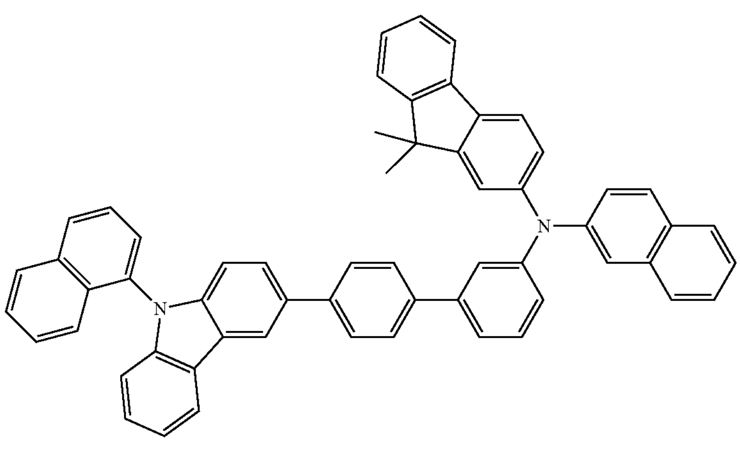

-continued
565
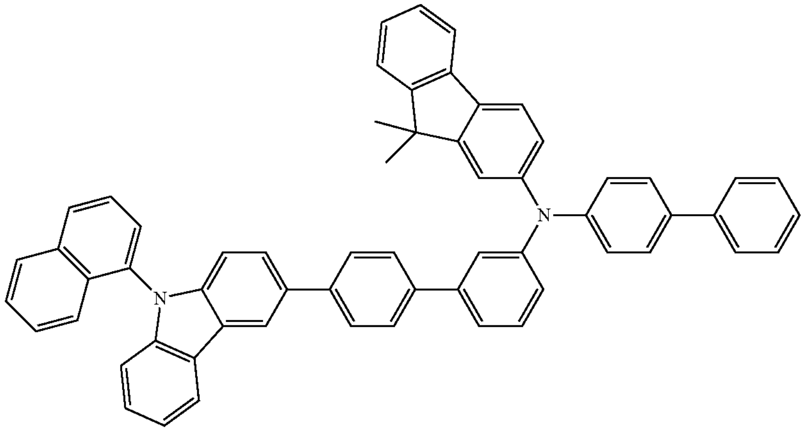
566
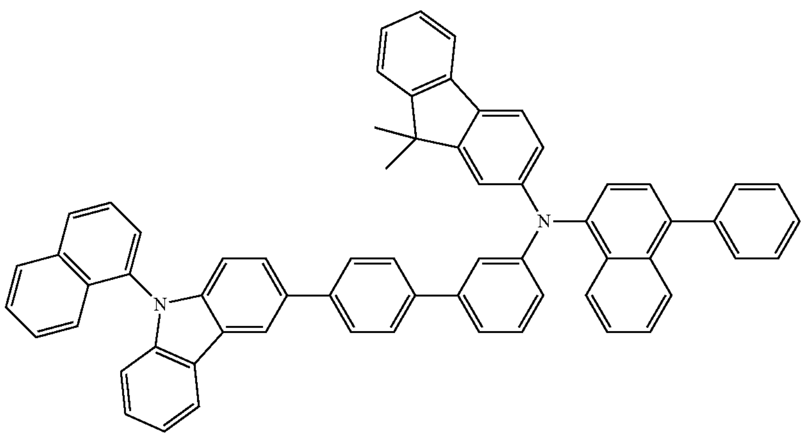
567
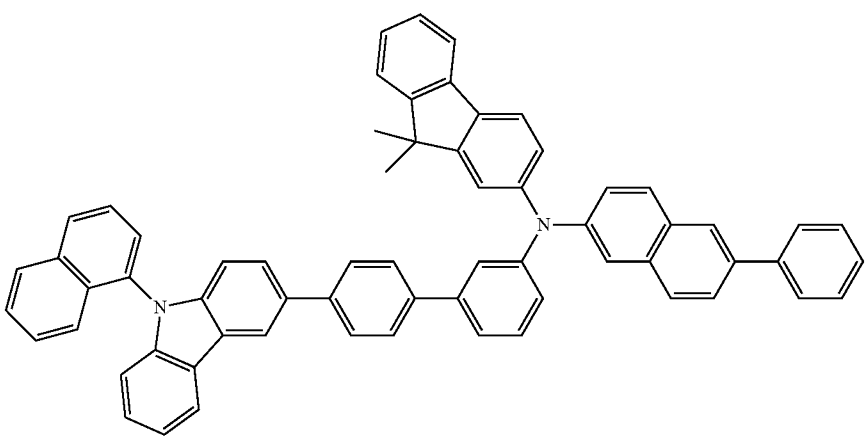

-continued
568
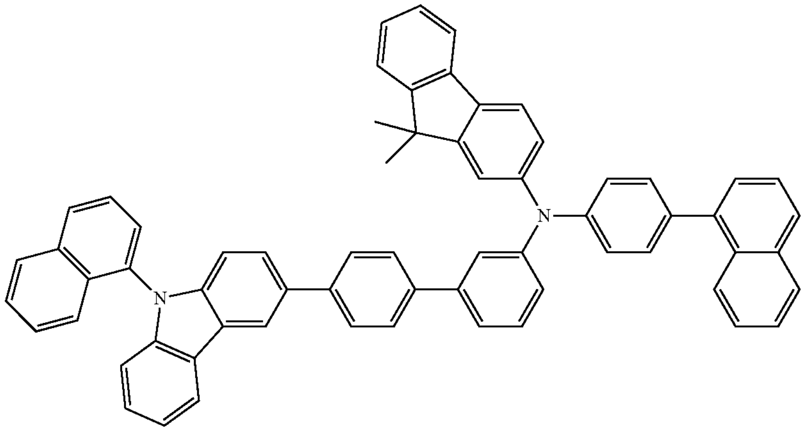
569
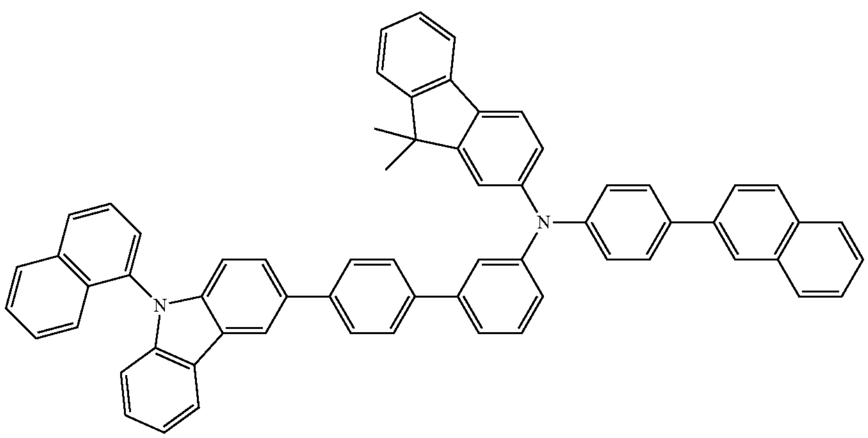
570
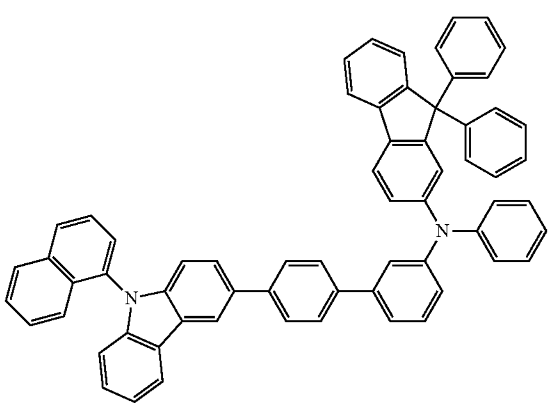
571
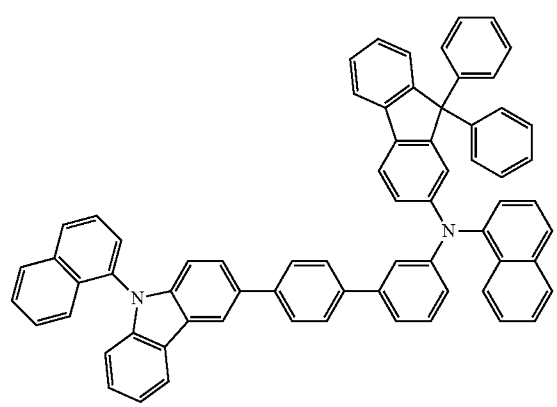

-continued
572
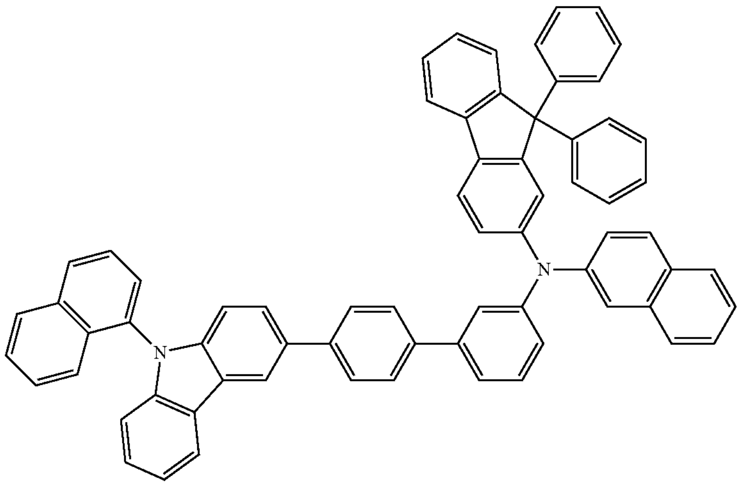
573
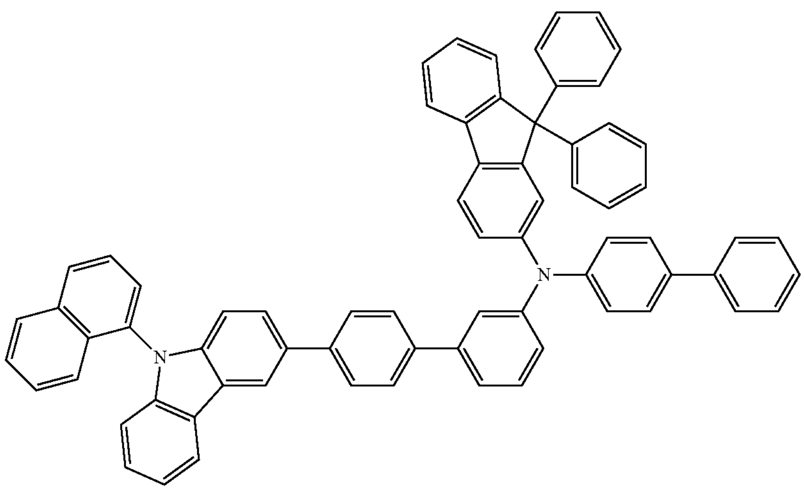
574
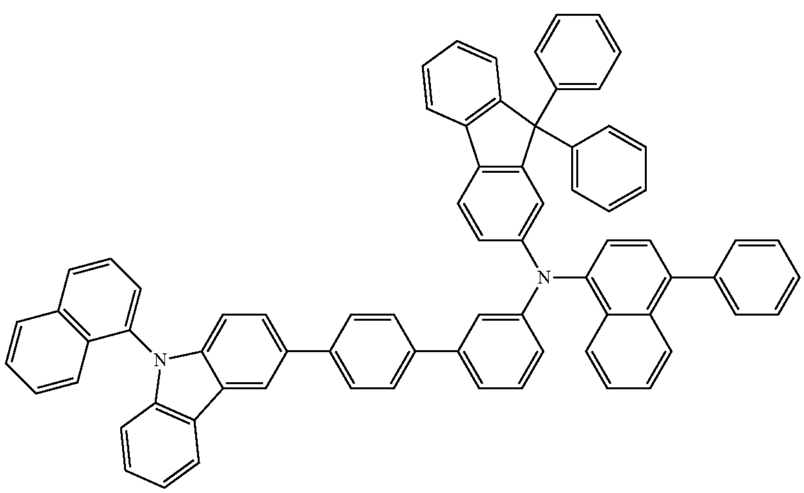

-continued
575
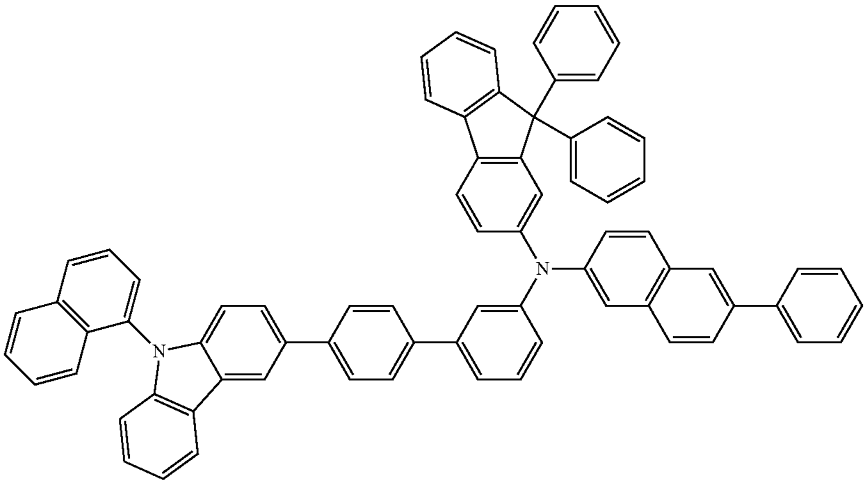
576
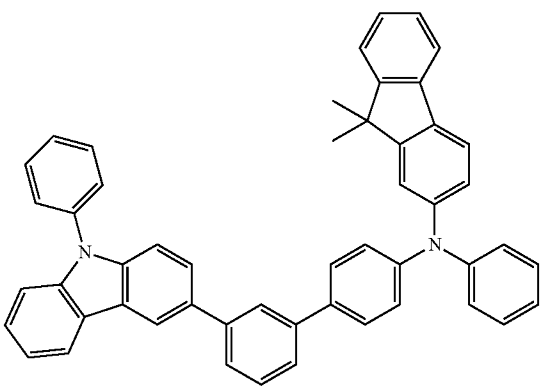
577
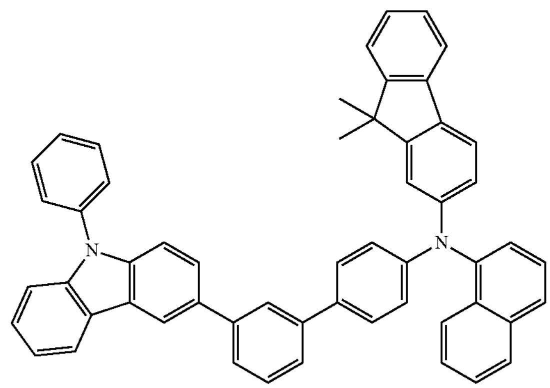
578
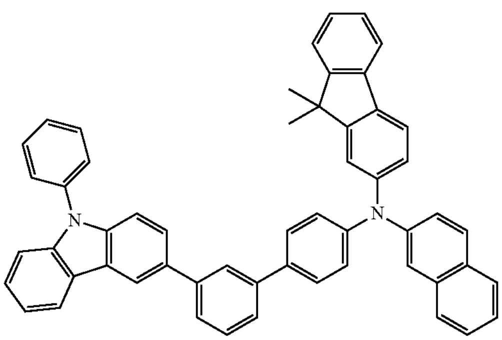
579
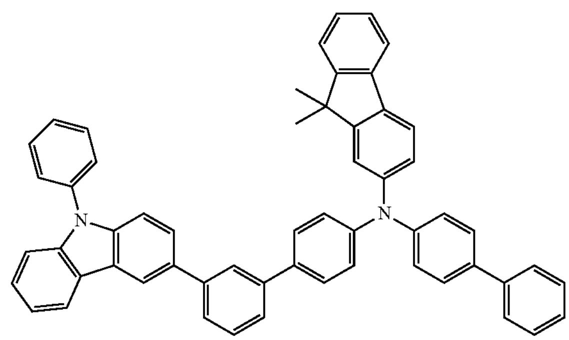
580
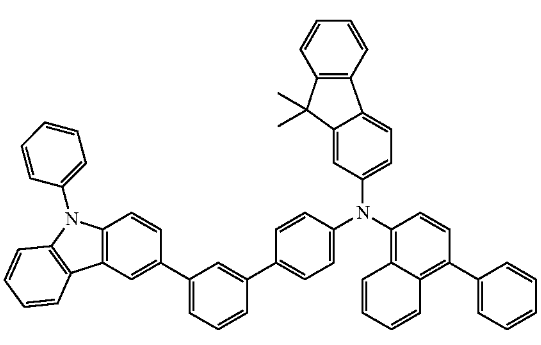
581
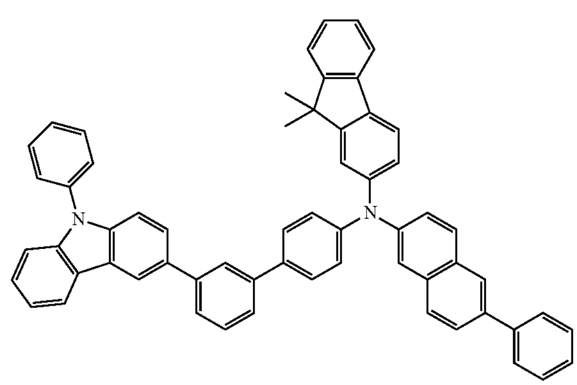

-continued
582
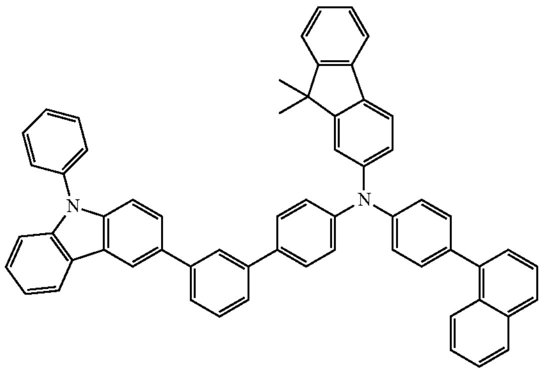
583
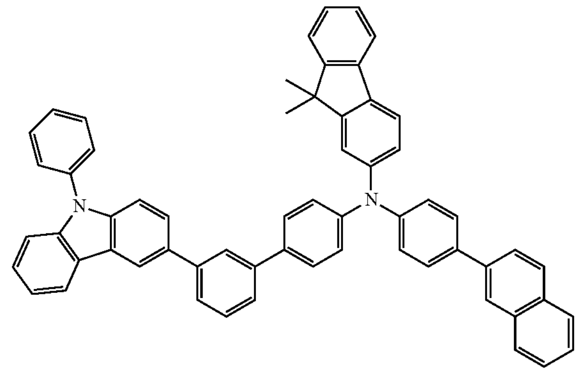
584
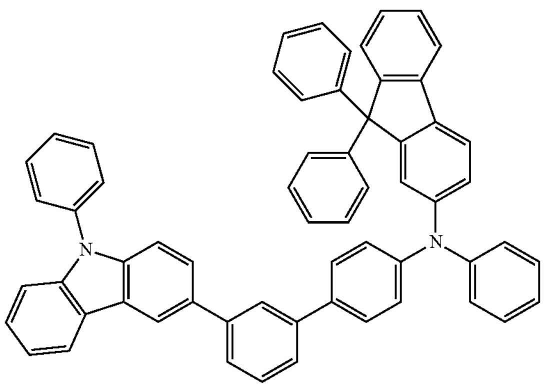
585
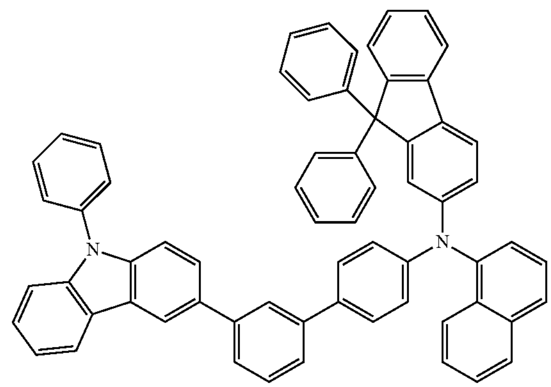
586
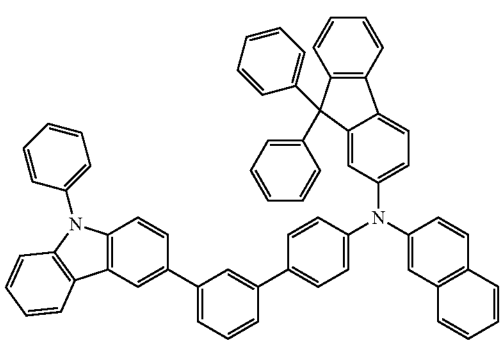
587
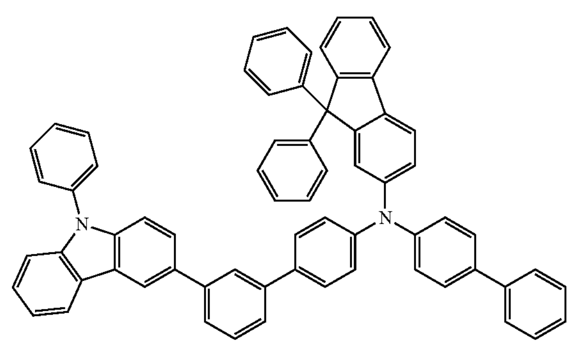
588
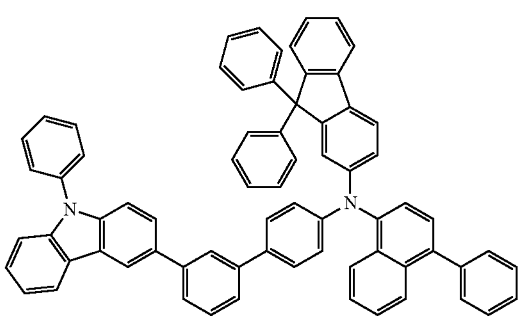
589
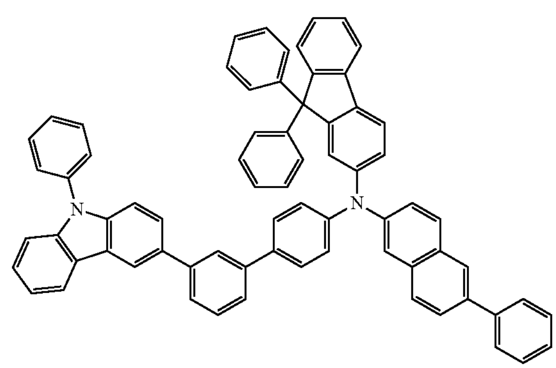

-continued
590
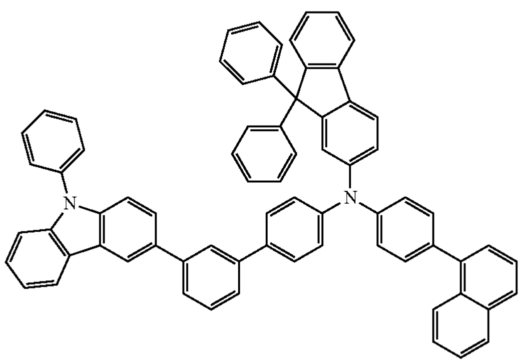
591
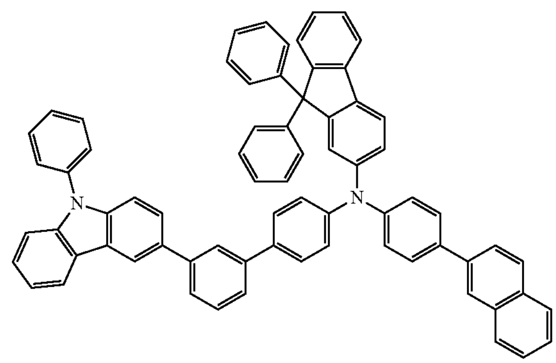
592
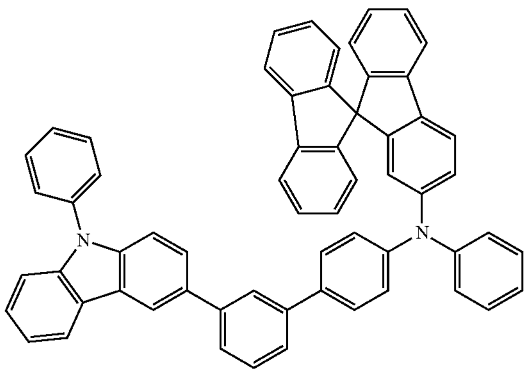
593
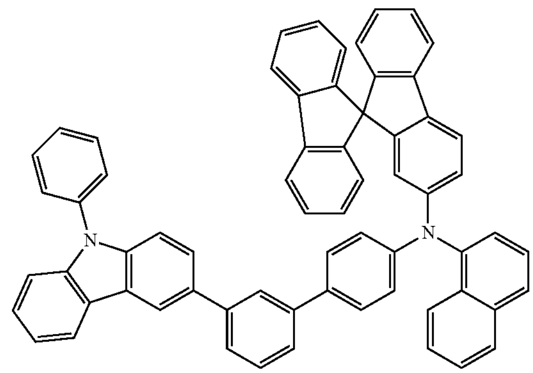
594
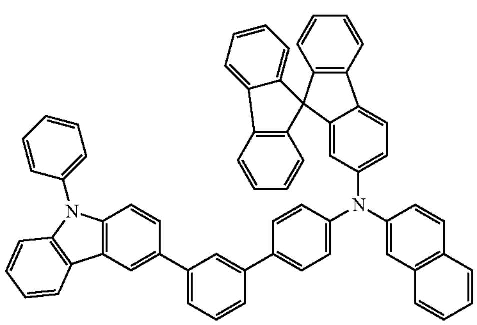
595
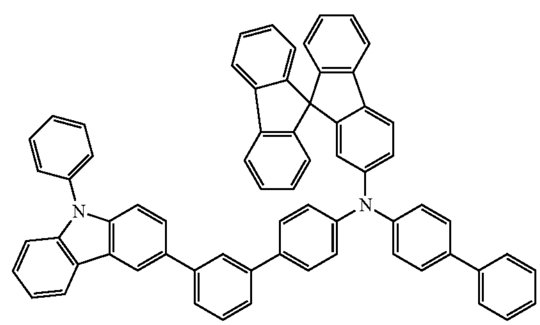
596
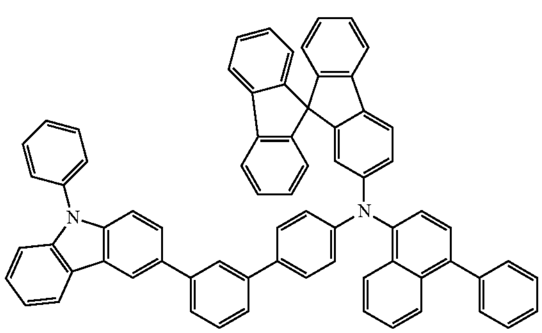
597
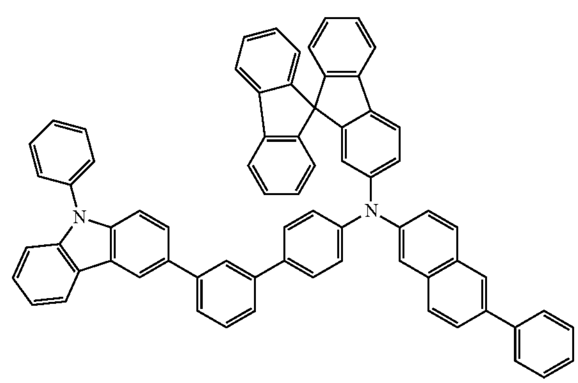

-continued
598
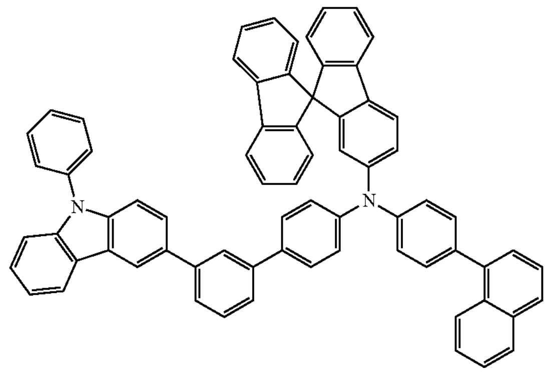
599
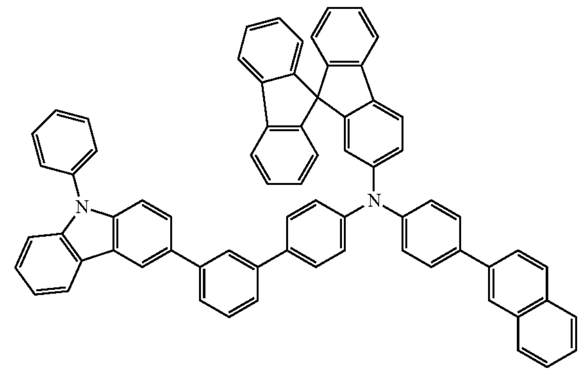
600
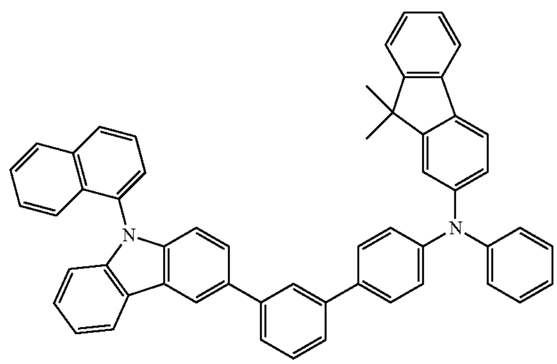
601
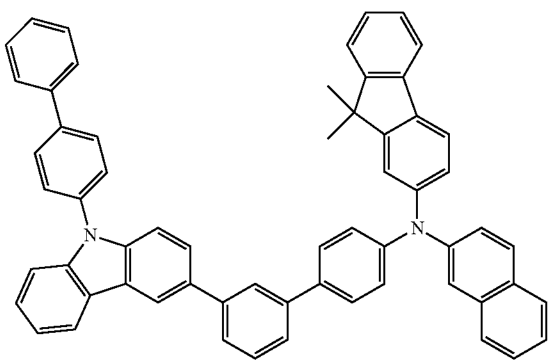
602
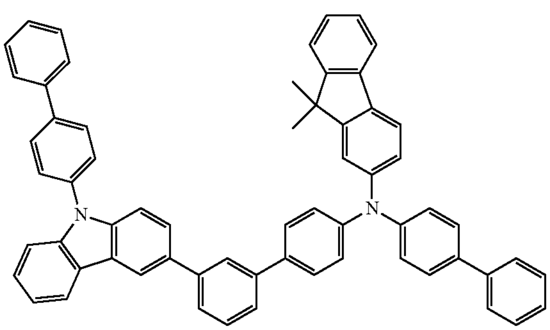
603
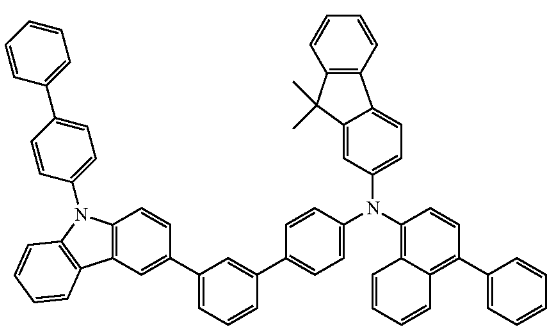
604
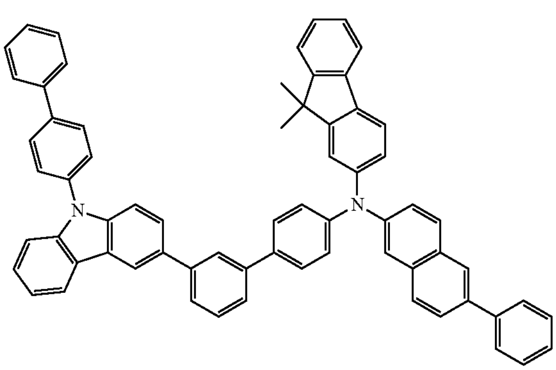
605
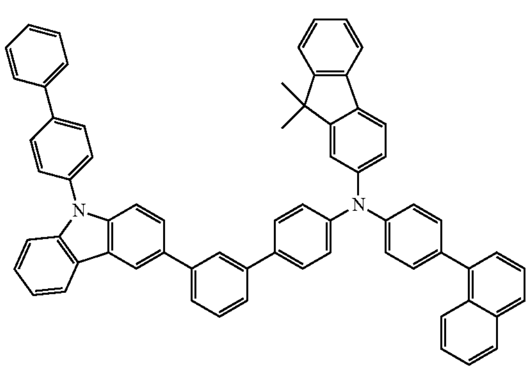

-continued
606
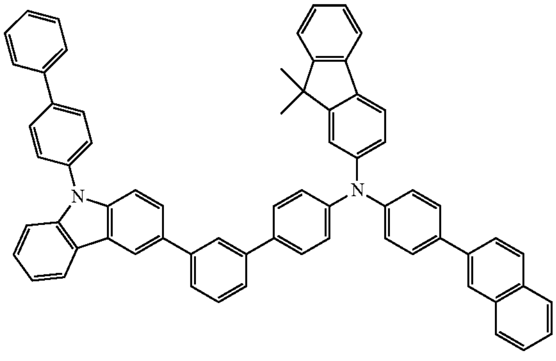
607
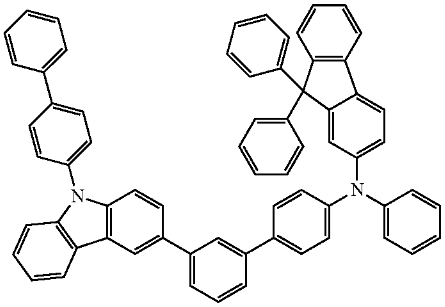
608
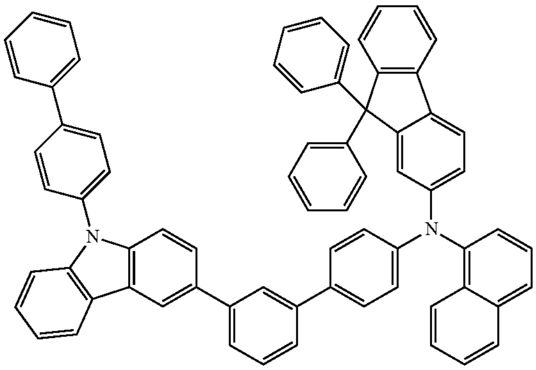
609
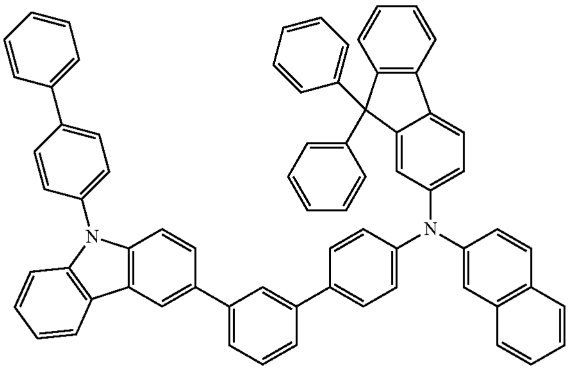
610
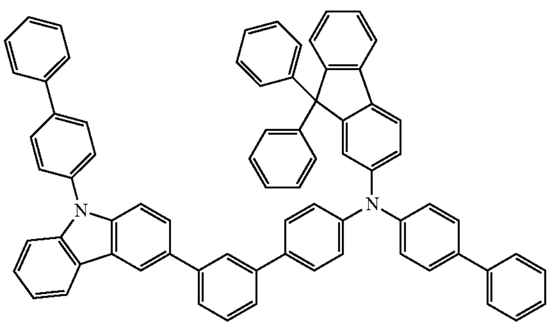
611
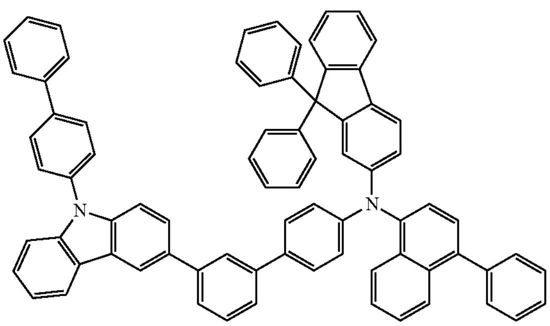
612
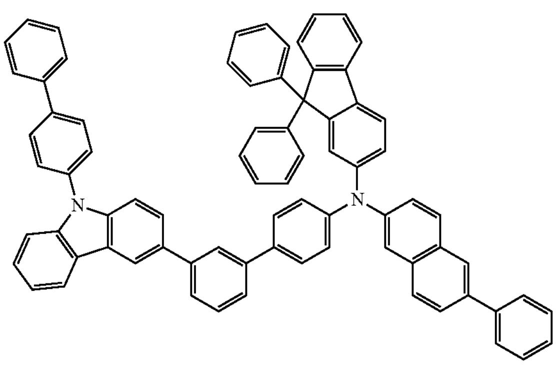
613
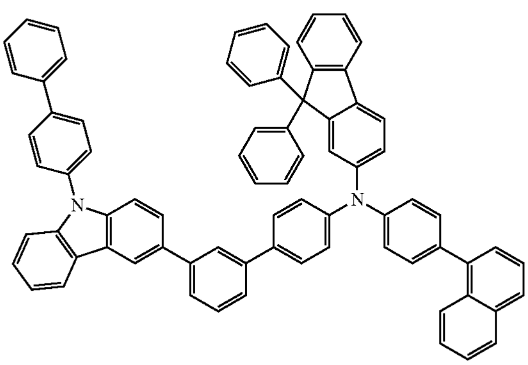

-continued
614
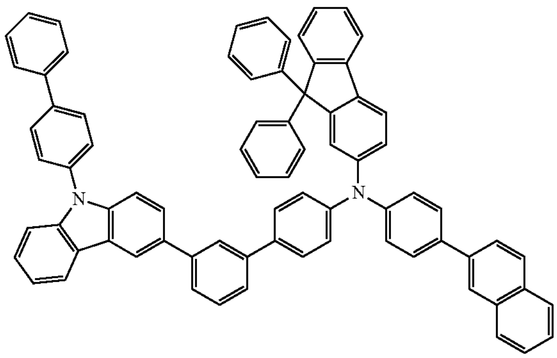
615
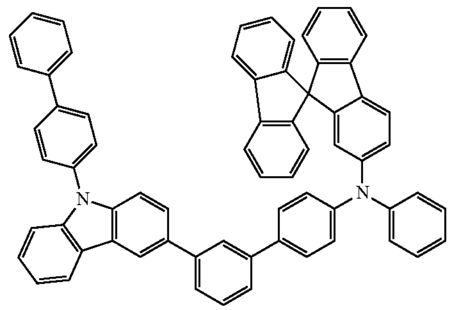
616
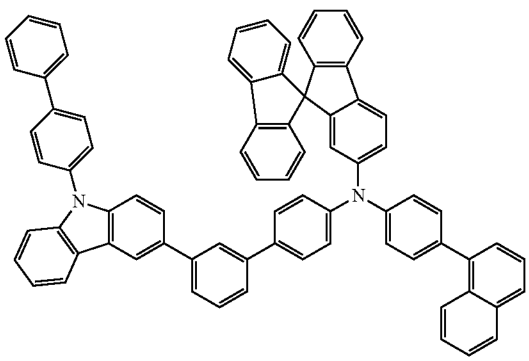
617
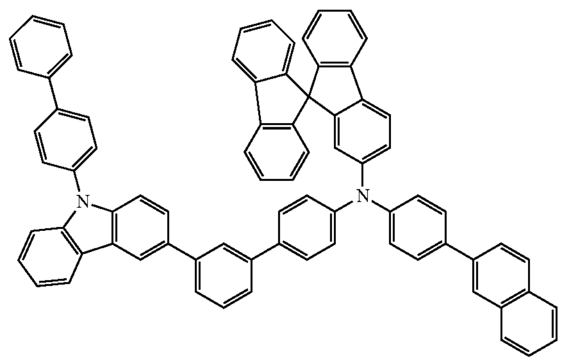
618
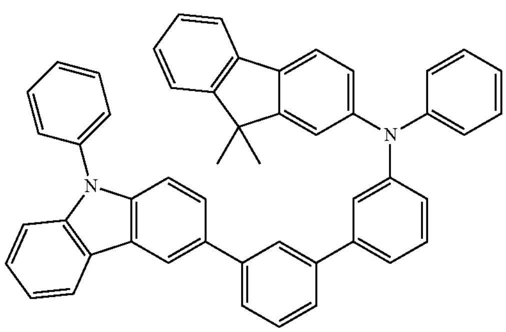
619
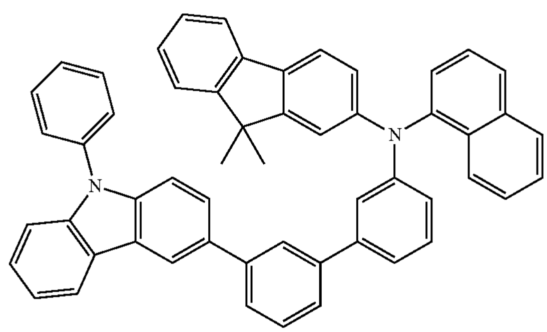
620
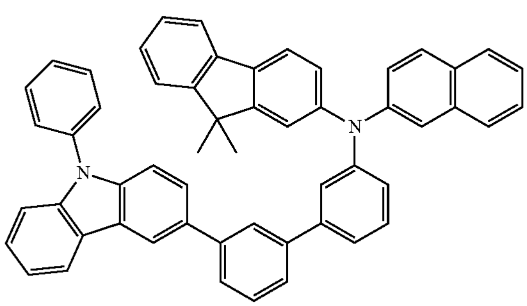
621
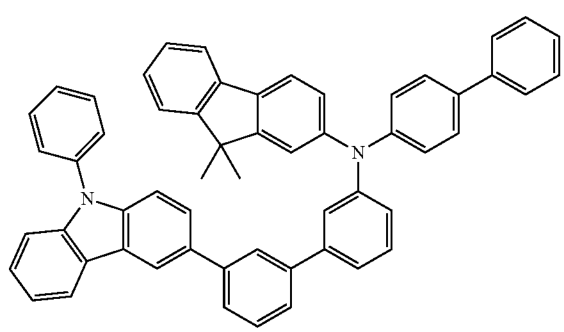

-continued
622
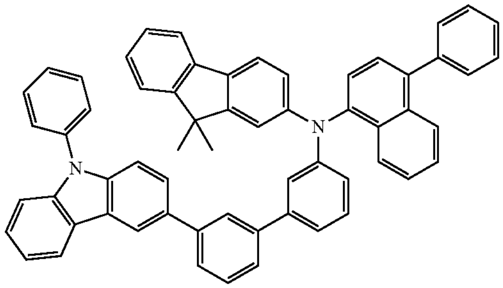
623
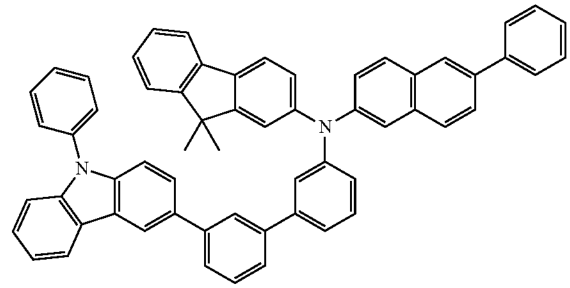
624
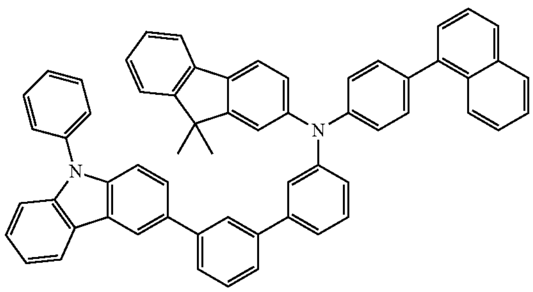
625
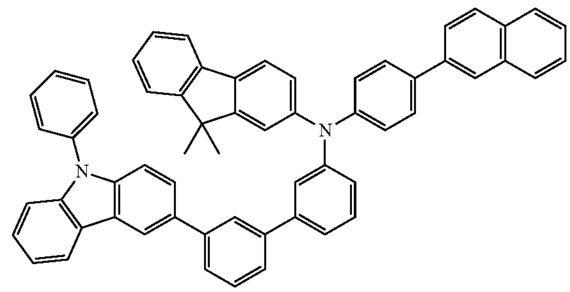
626
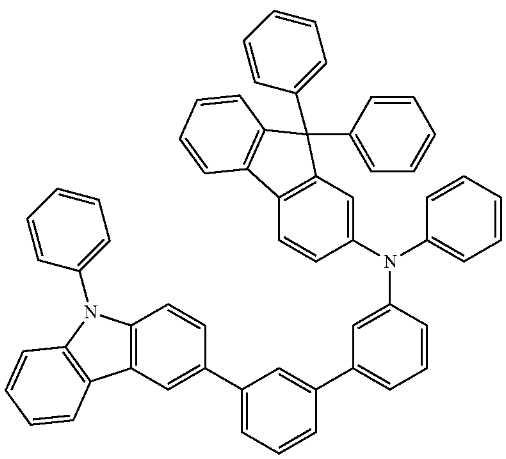
627
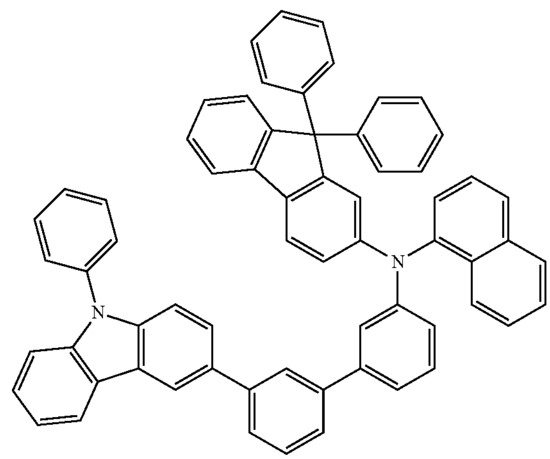
628
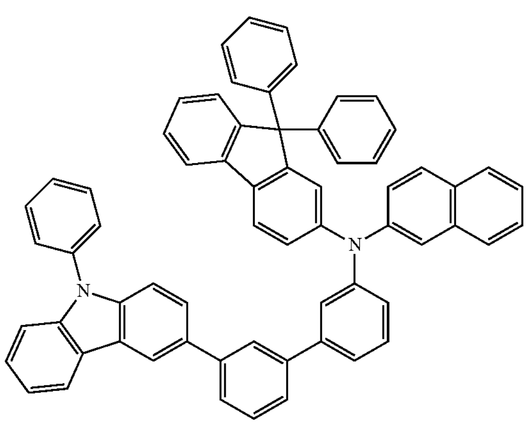
629
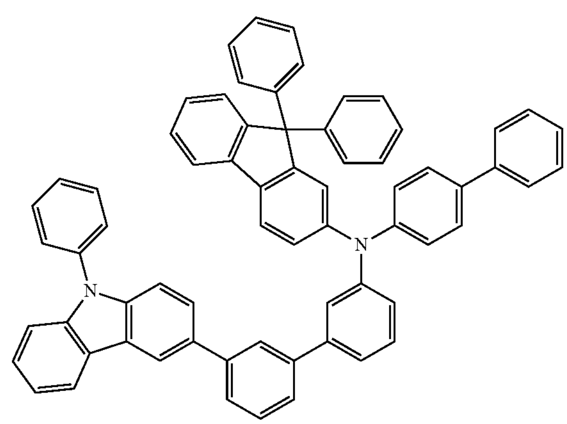

-continued
630
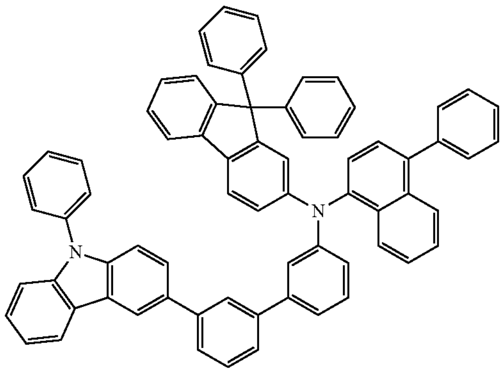
631
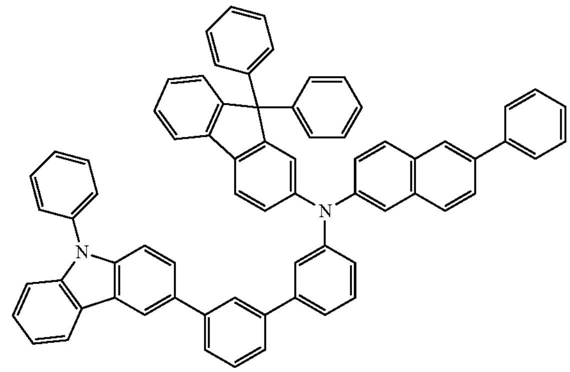
632
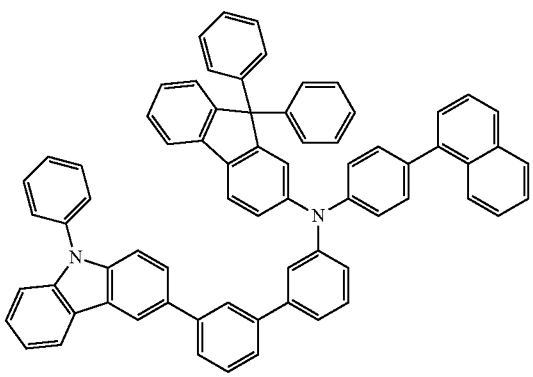
633
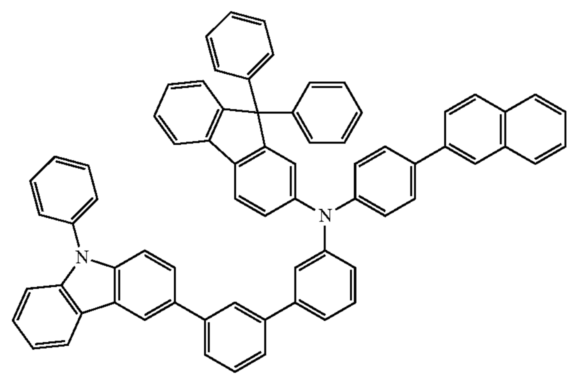
634
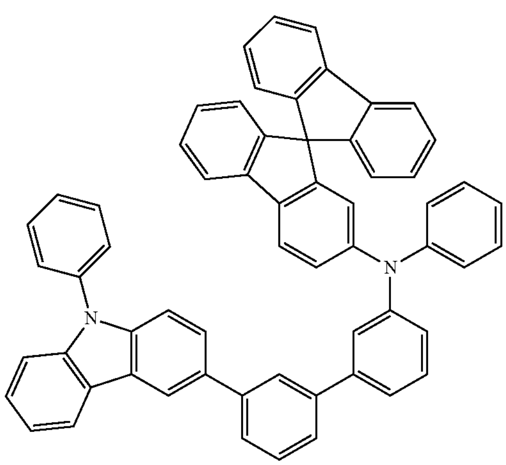
635
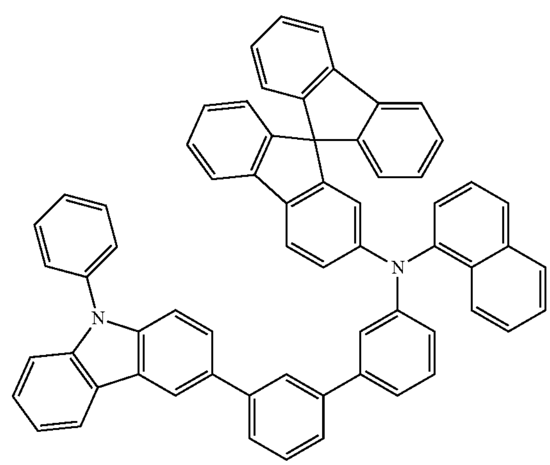

-continued
636
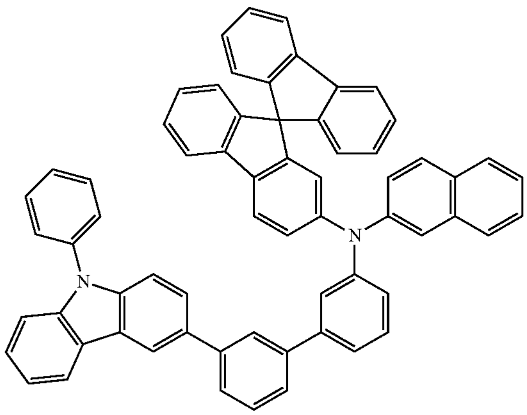
637
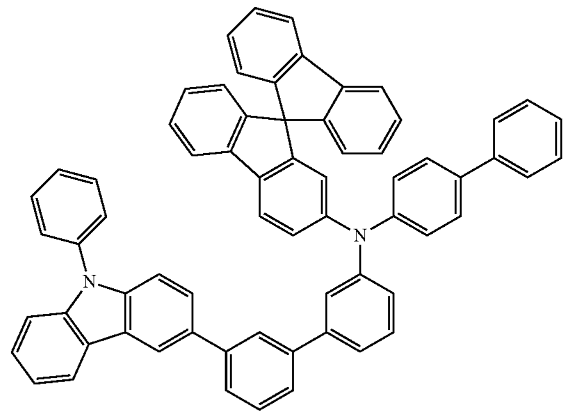
638
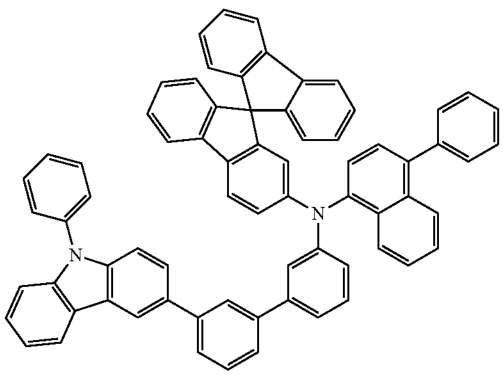
639
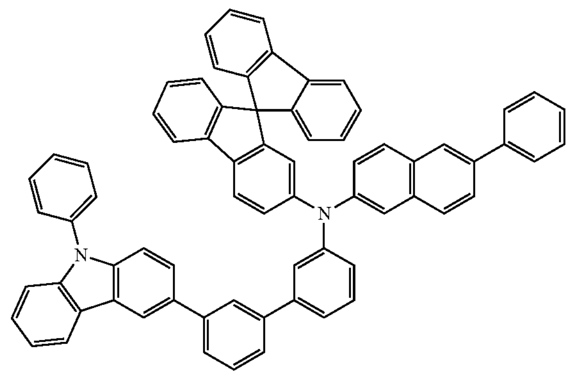
640
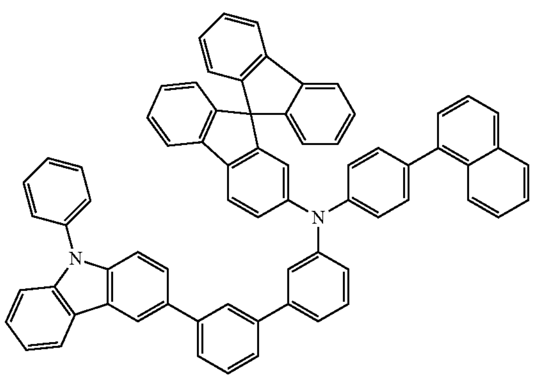
641
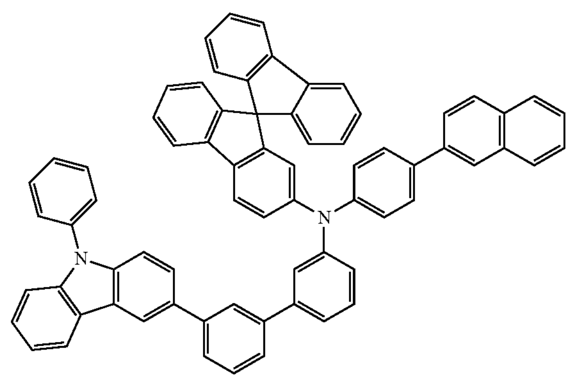
642
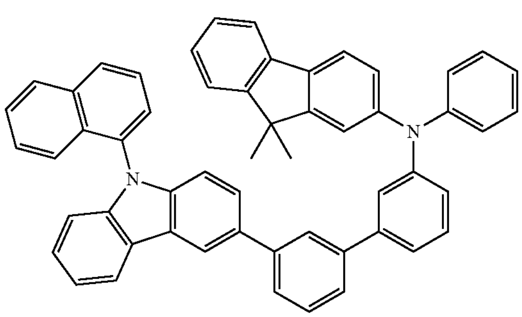
643
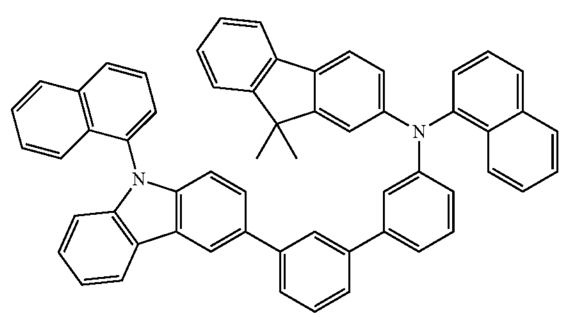

-continued
644
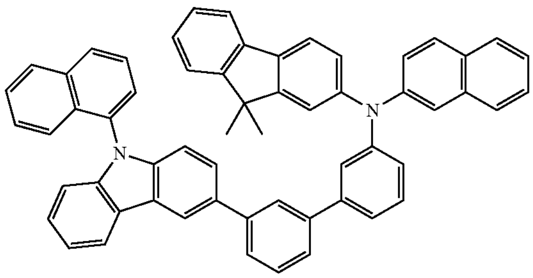
645
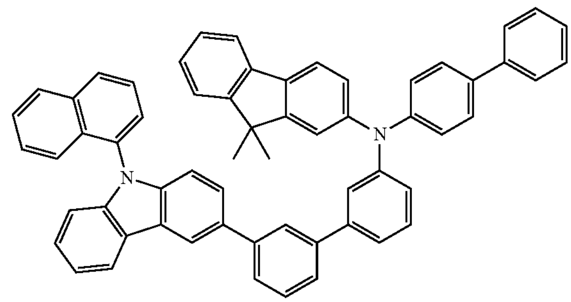
646
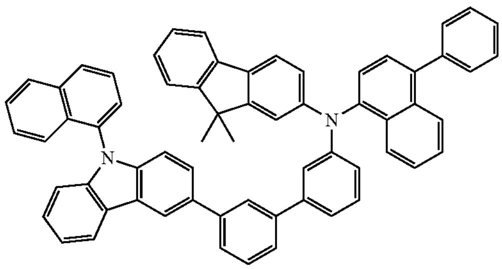
647
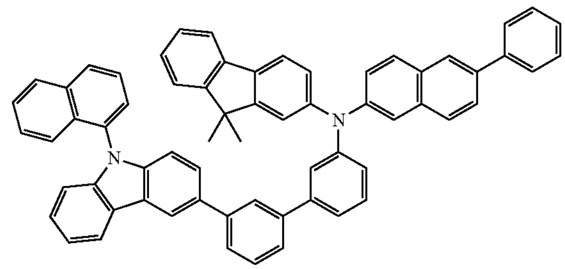
648
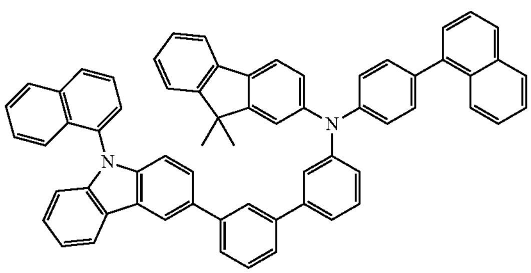
649
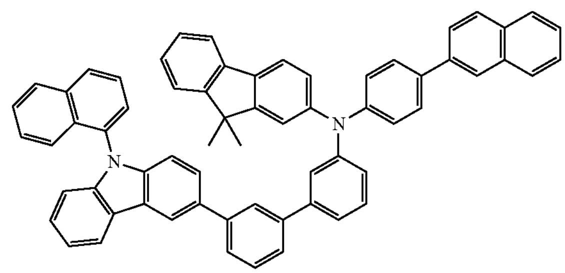
650
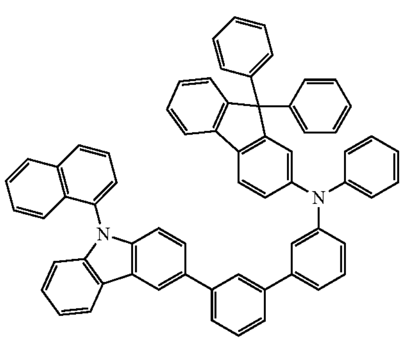
651
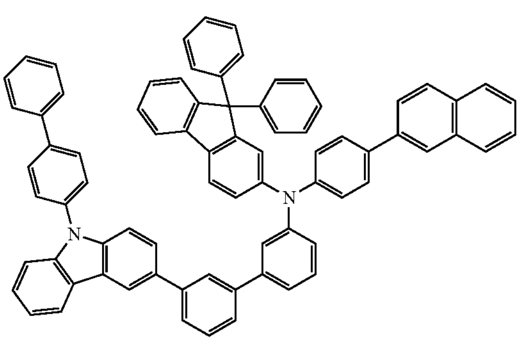

-continued
652
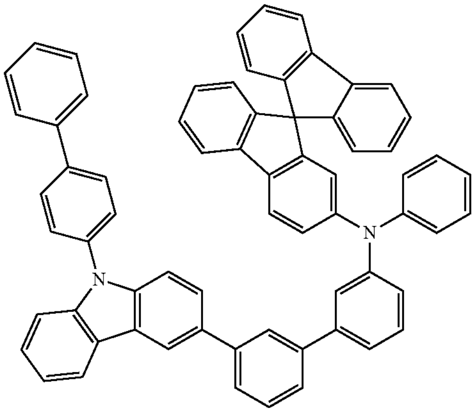
653
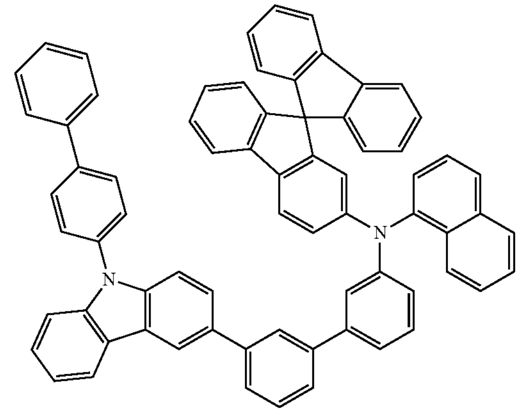
654
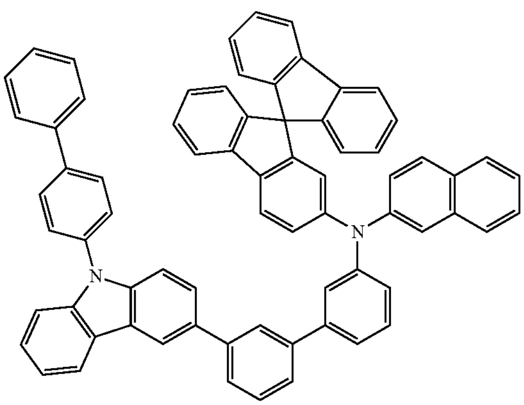
655
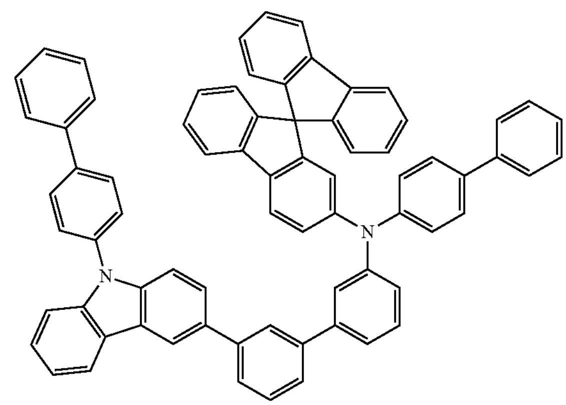
656
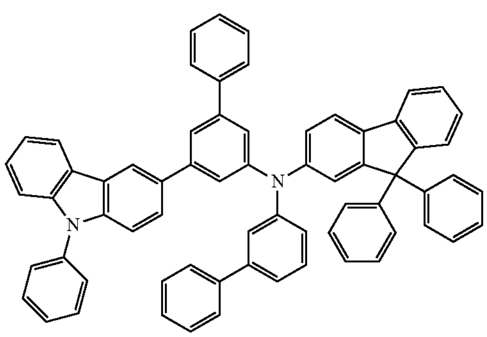
657
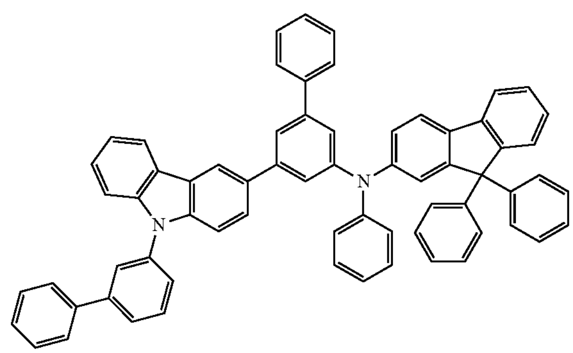

-continued
658
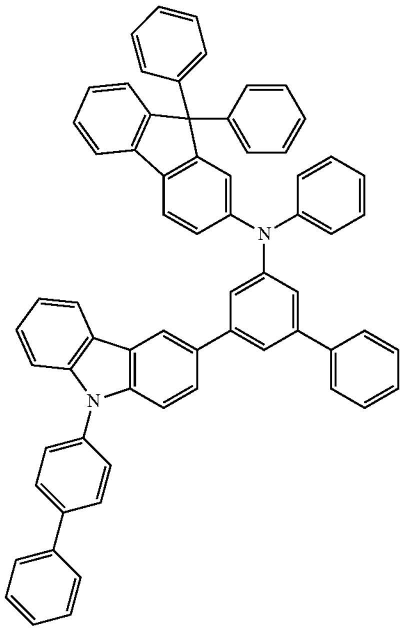
659
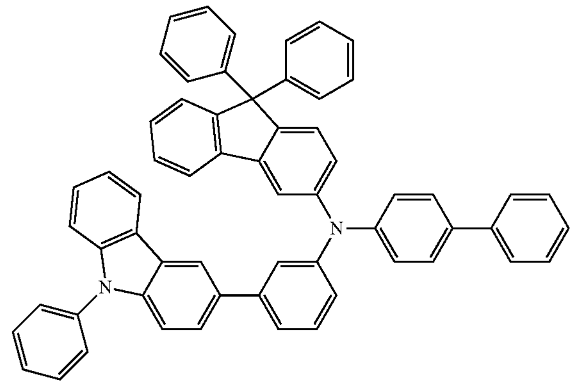
660
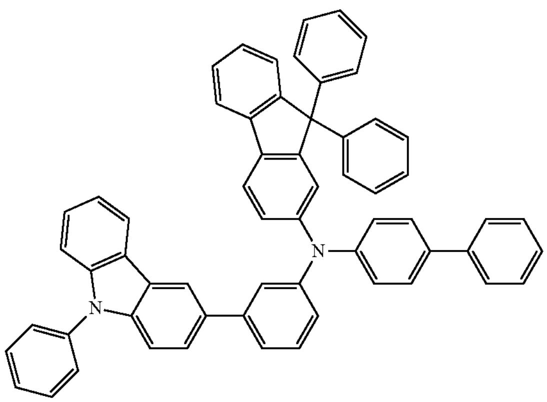
661
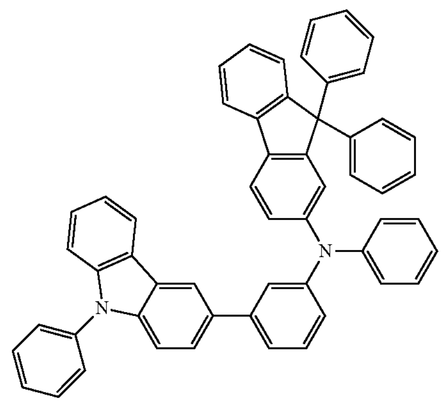
662
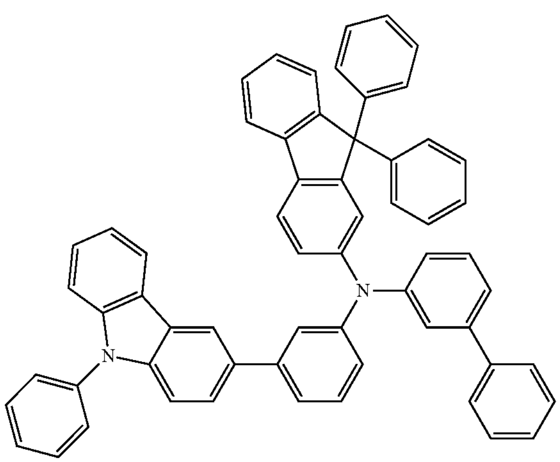
663
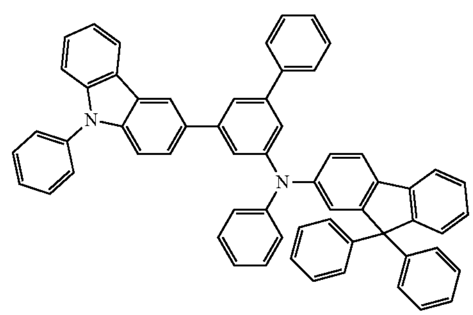

-continued
664
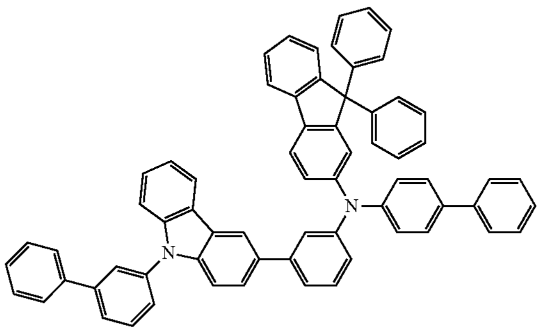
665
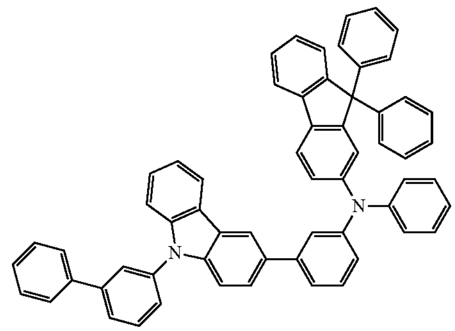
666
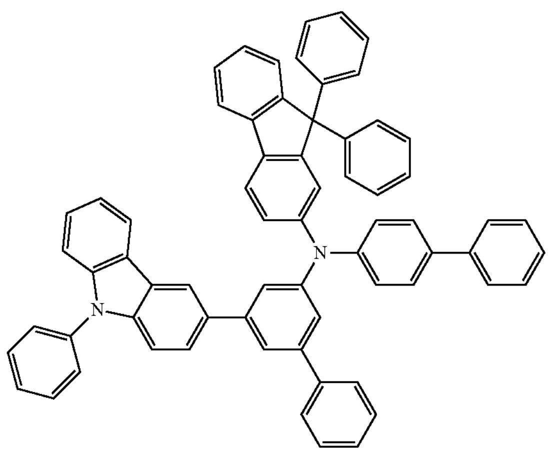
667
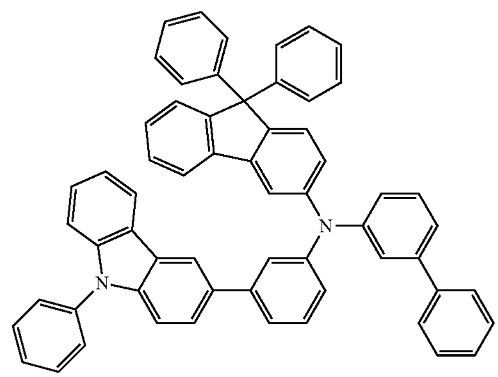
668
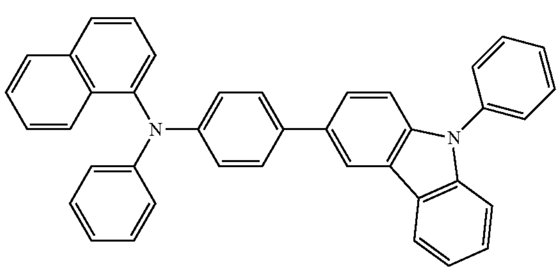
669
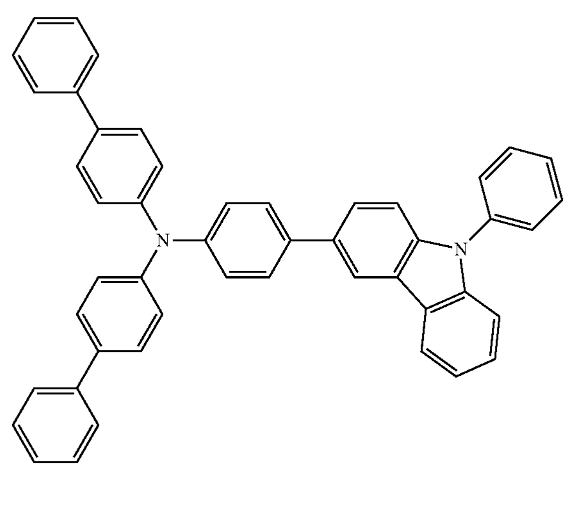

-continued
670
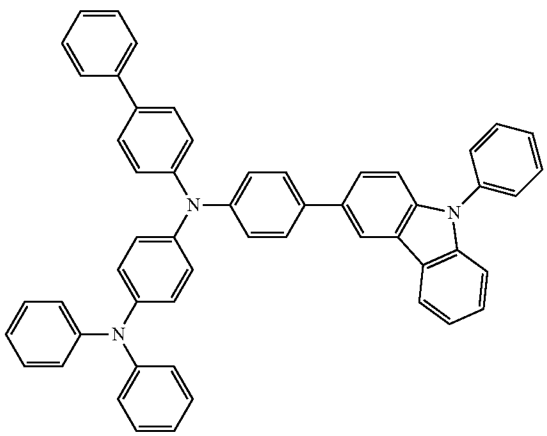
671
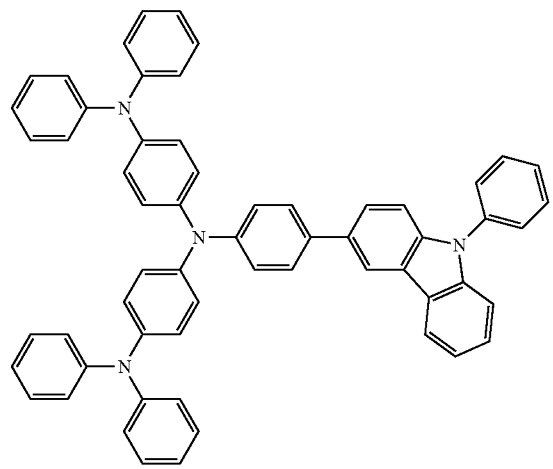
672
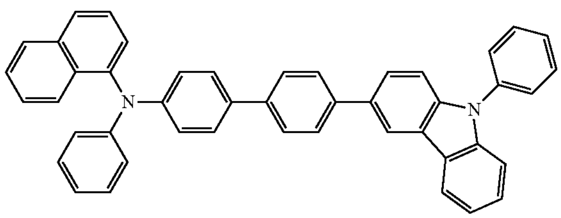
673
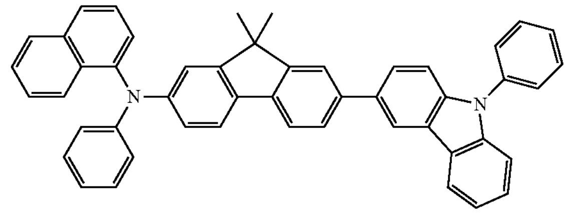
674
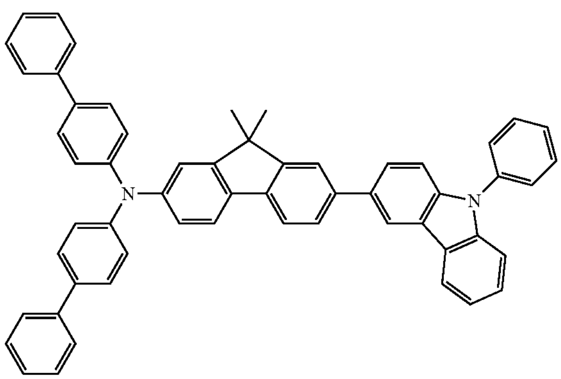
675
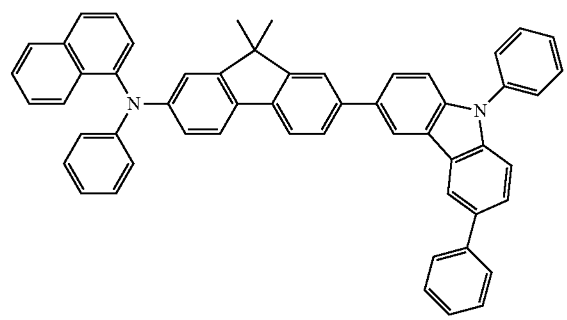
676
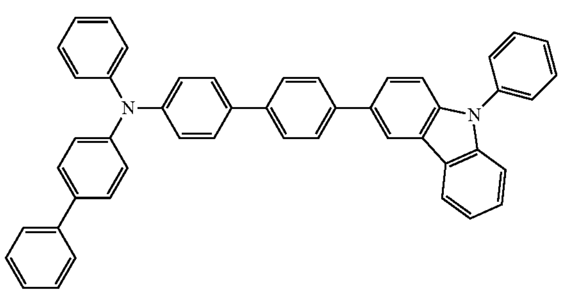
677
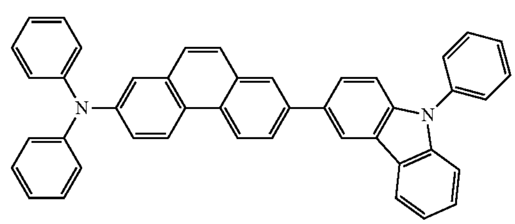
678
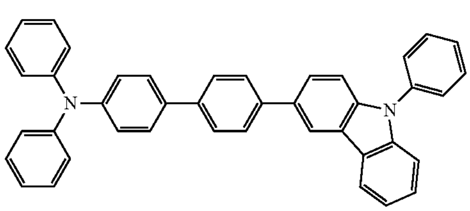
679
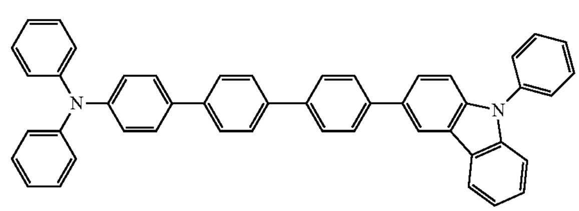

-continued
680
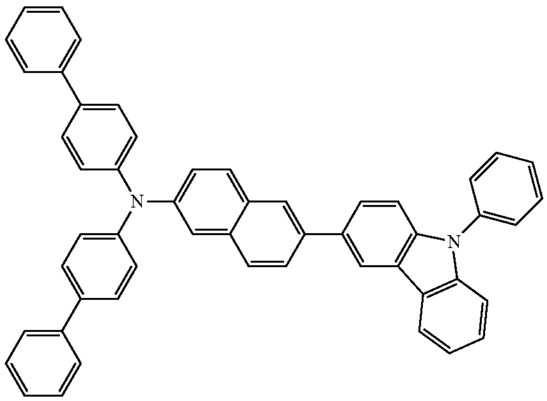
681
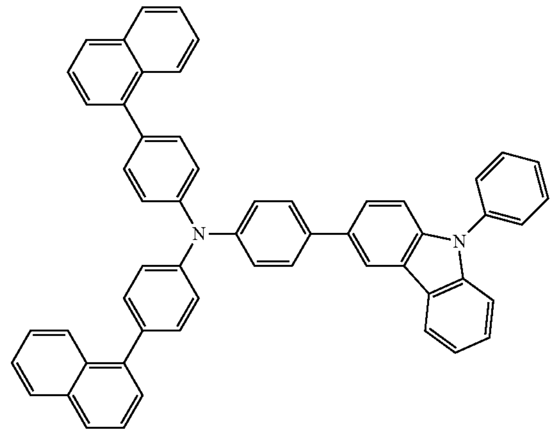
682
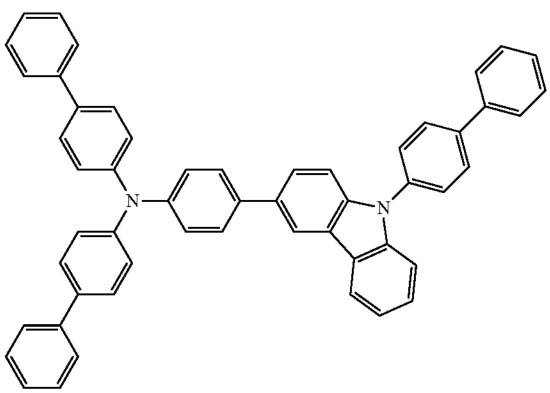
683
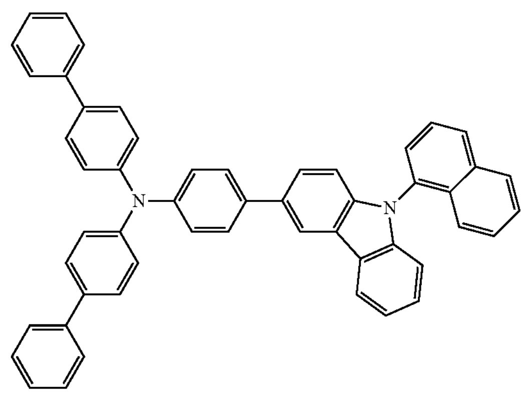
684
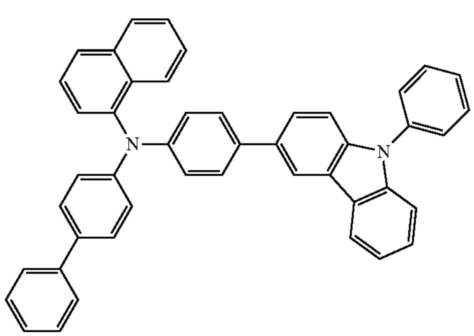
685
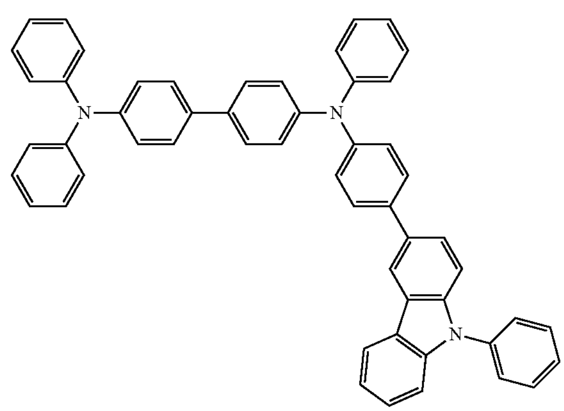

-continued
686
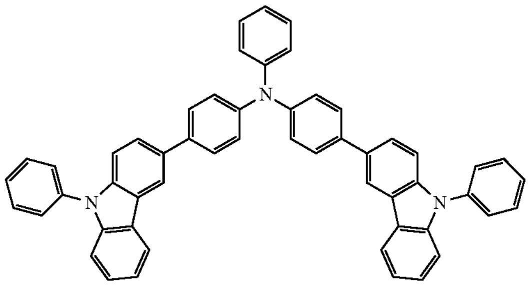
687
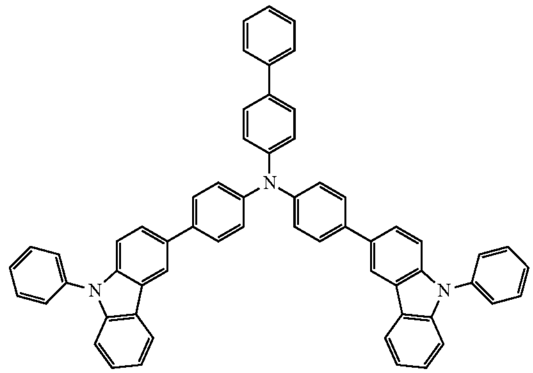
688
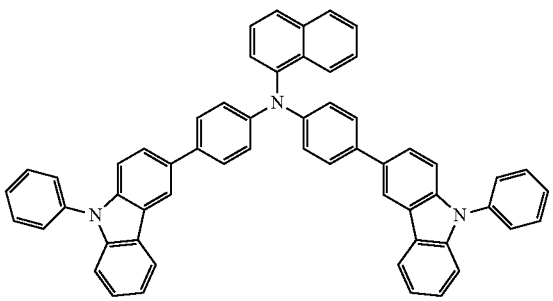
689
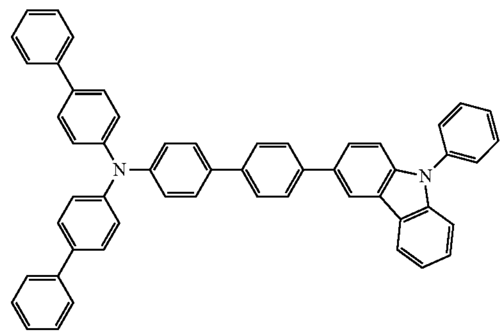
690
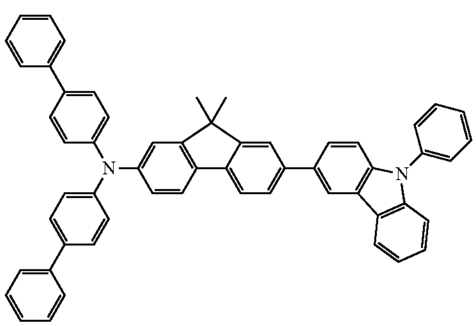
691
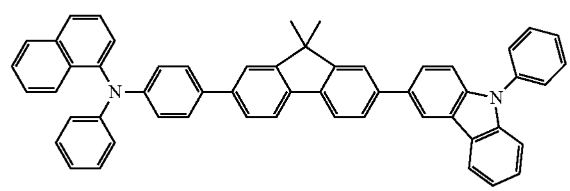
692
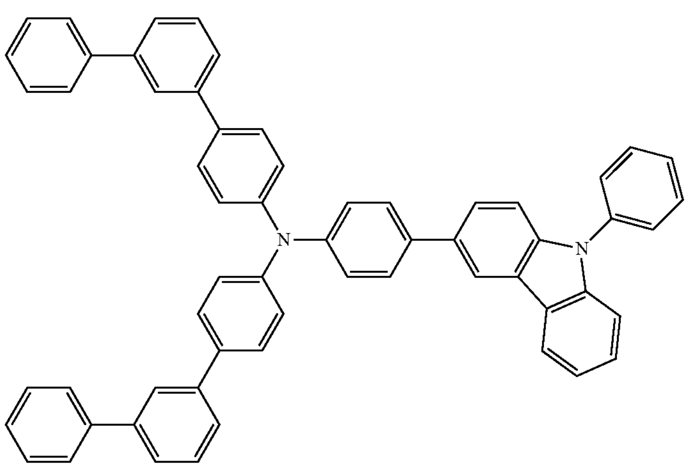

-continued
693
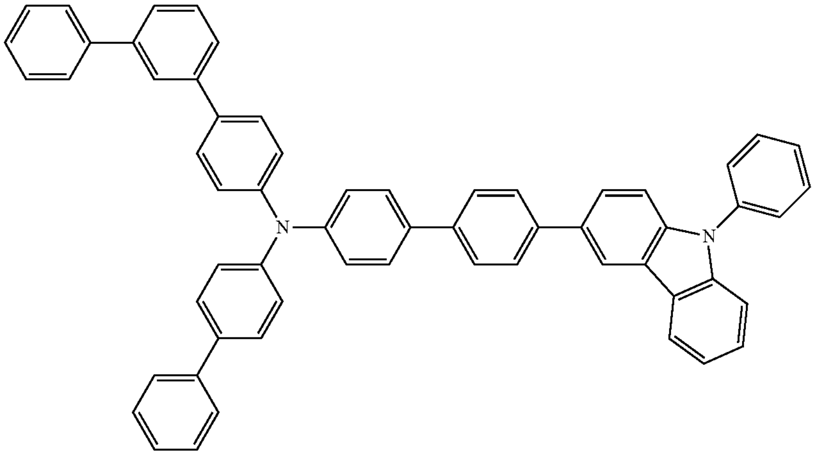
694
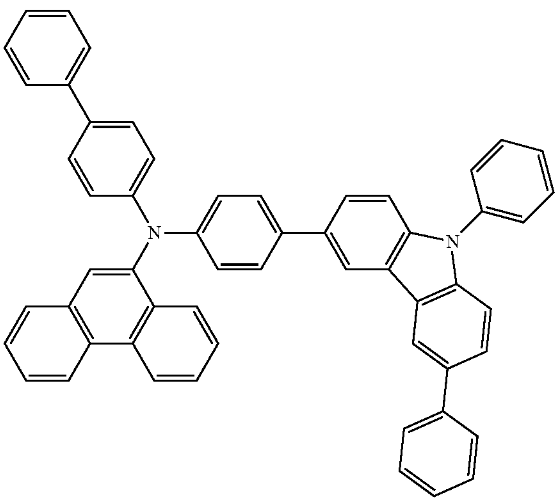
695
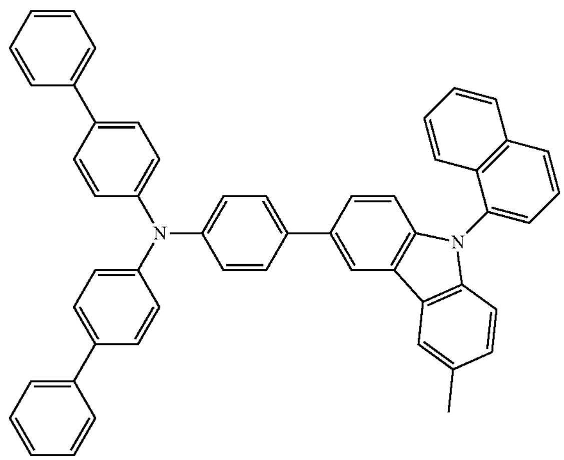
696
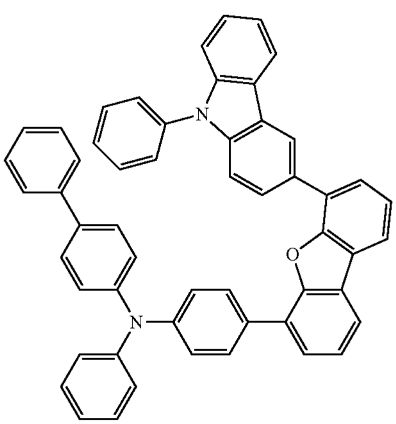
697
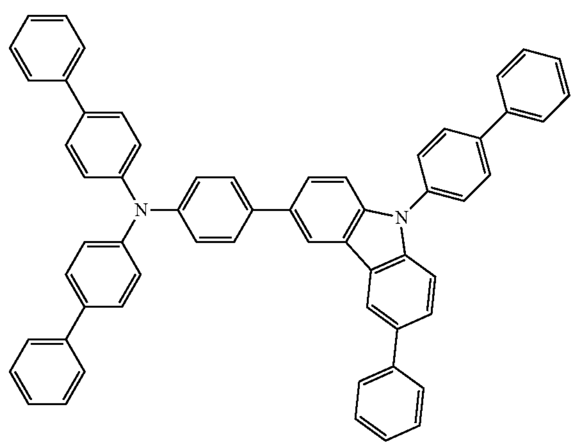

-continued
698
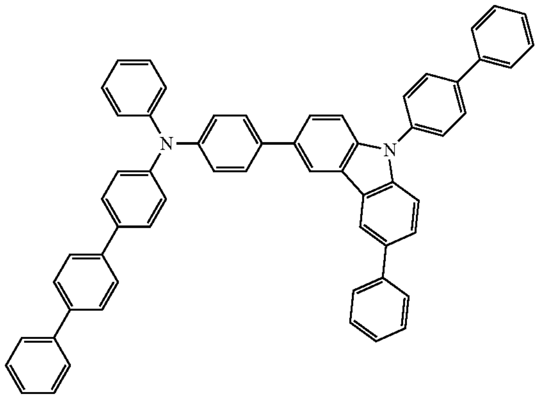
699
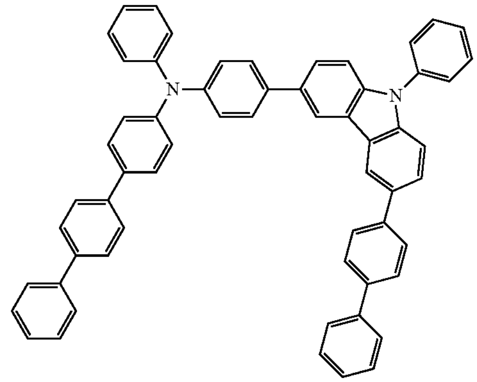
700
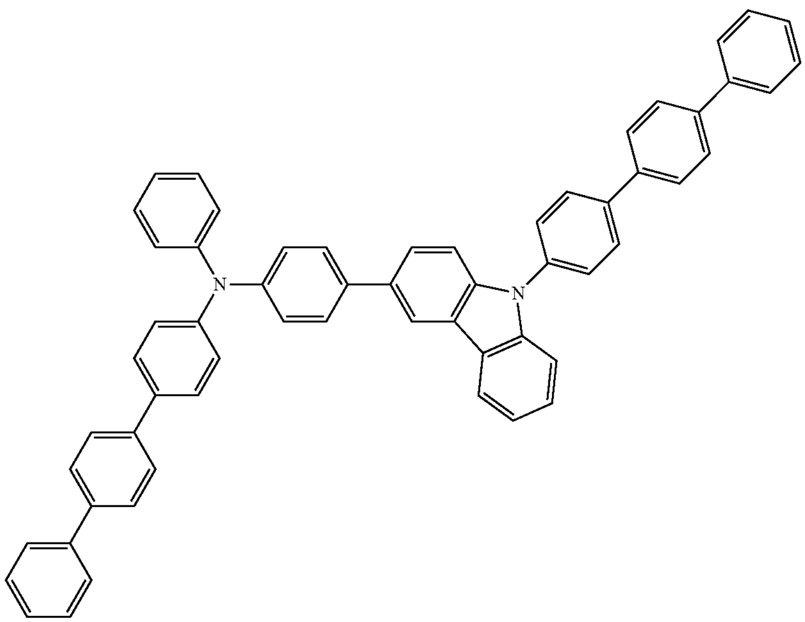
701
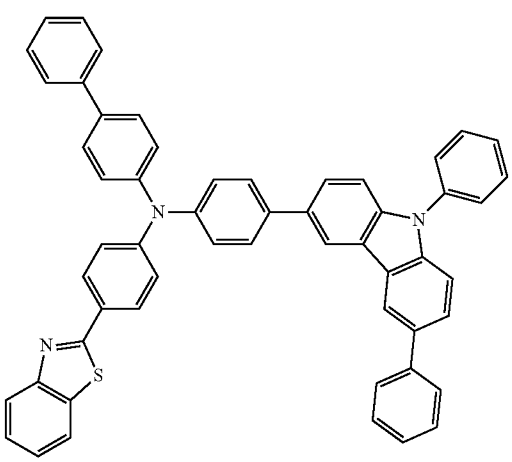
702
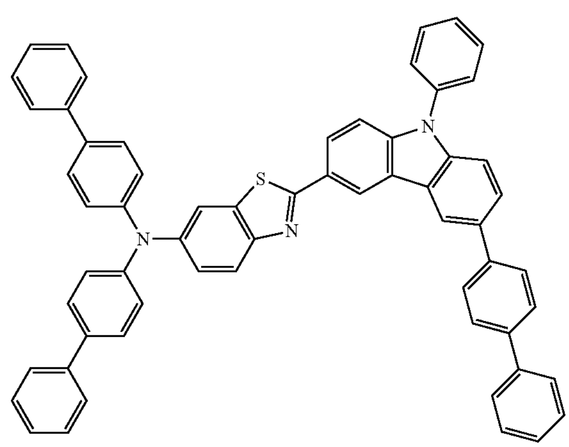

-continued
703
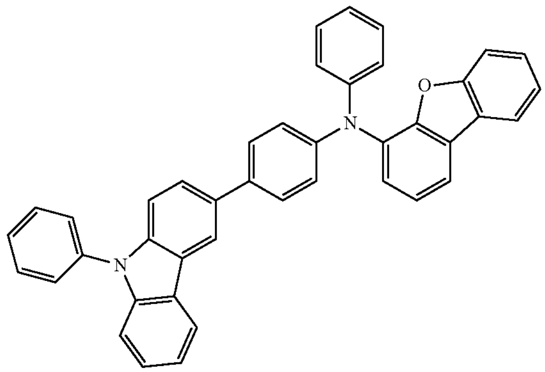
704
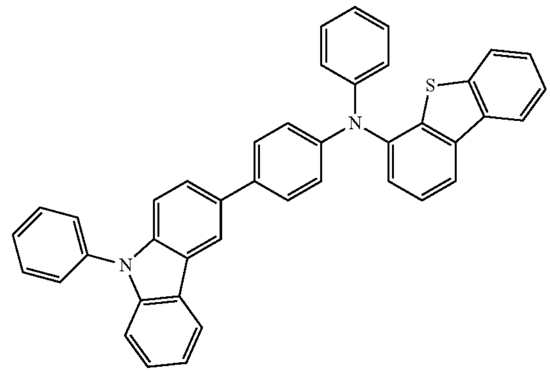
705
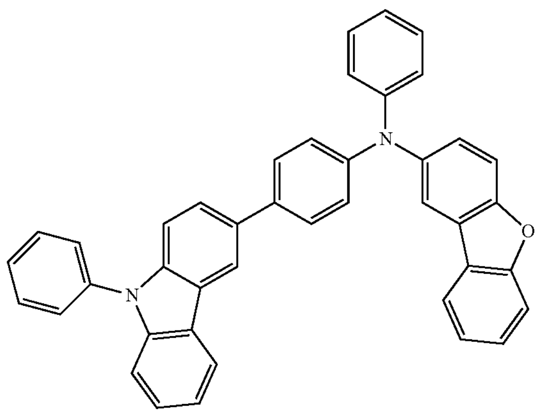
706
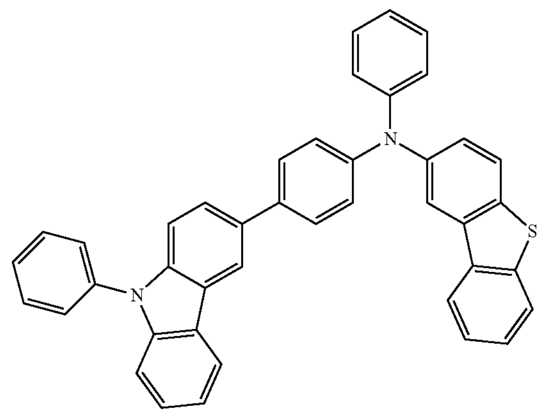
707
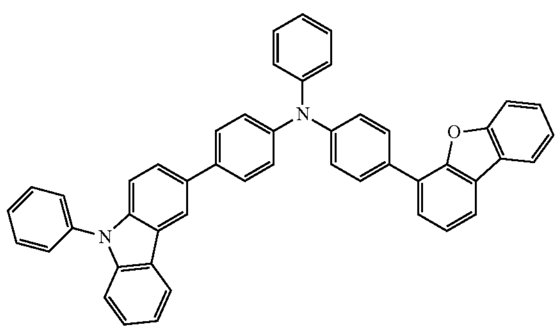
708
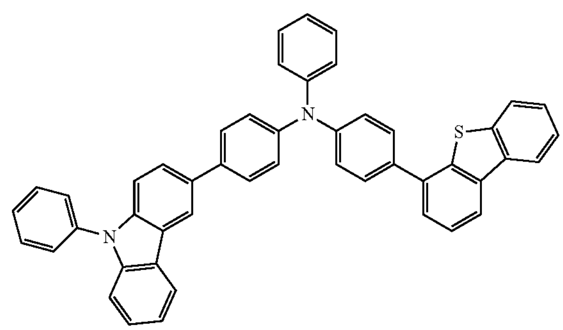
709
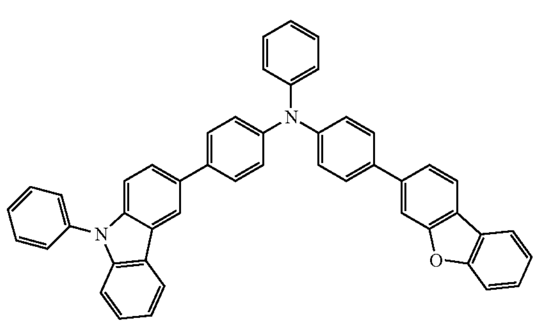
710
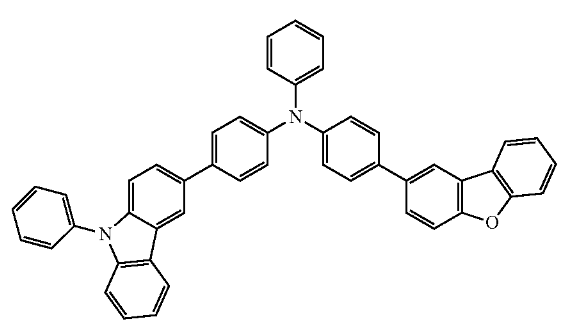

-continued
711
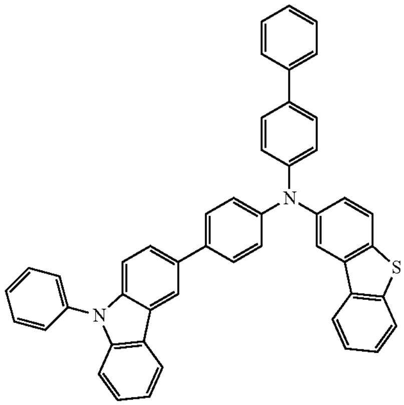
712
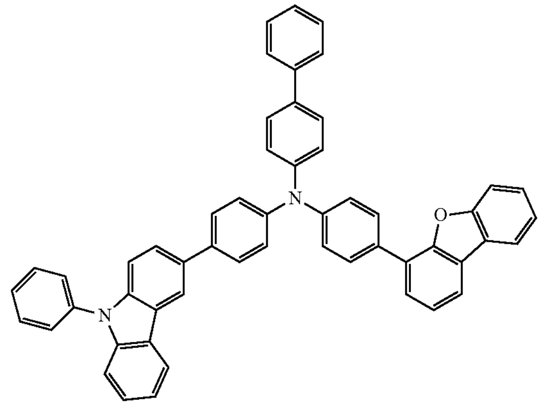
713
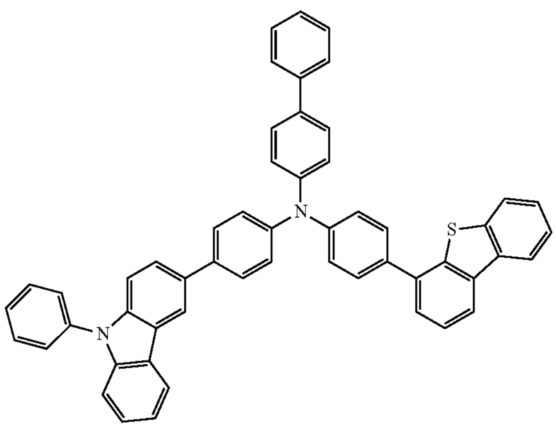
714
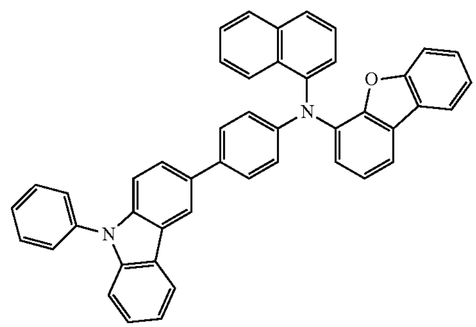
715
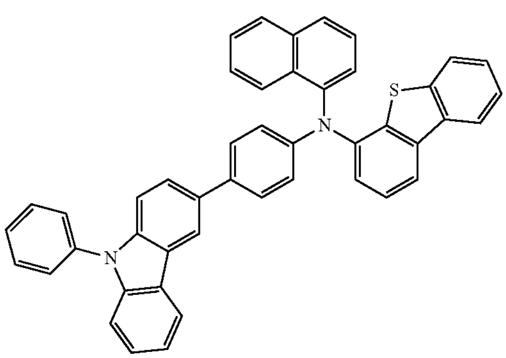
716
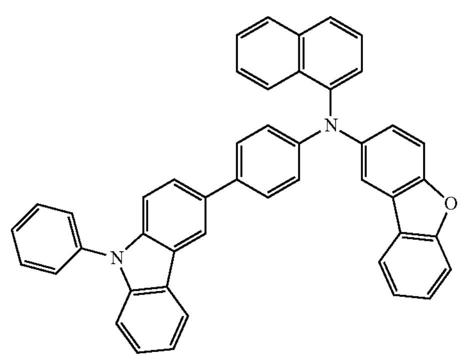

-continued
717
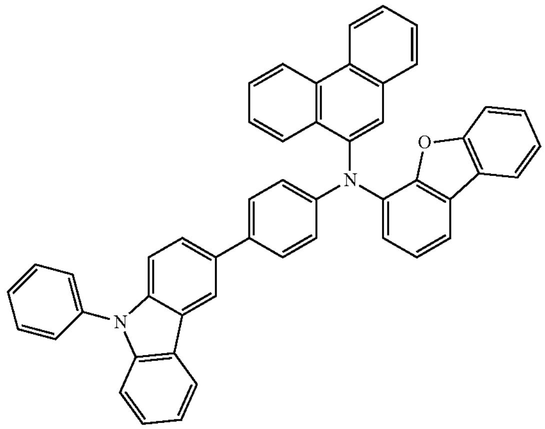
718
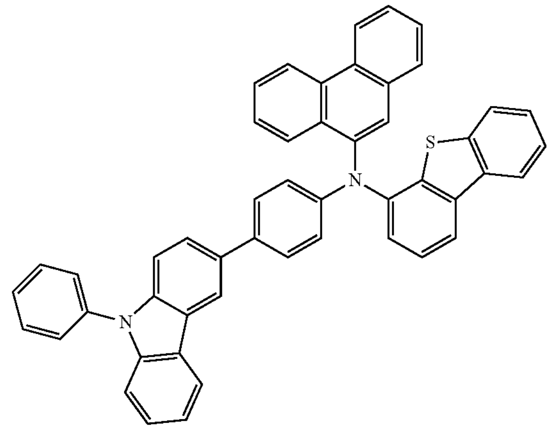
719
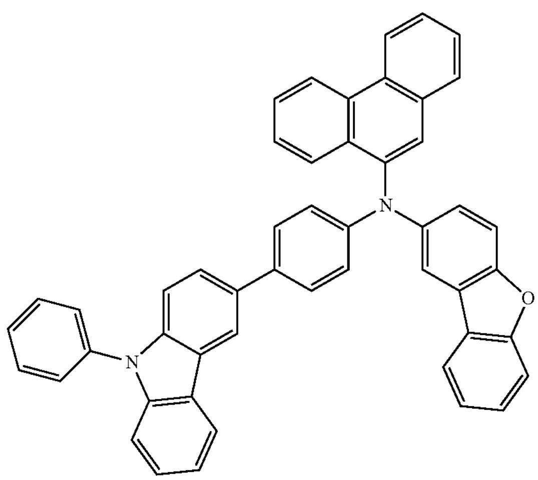
720
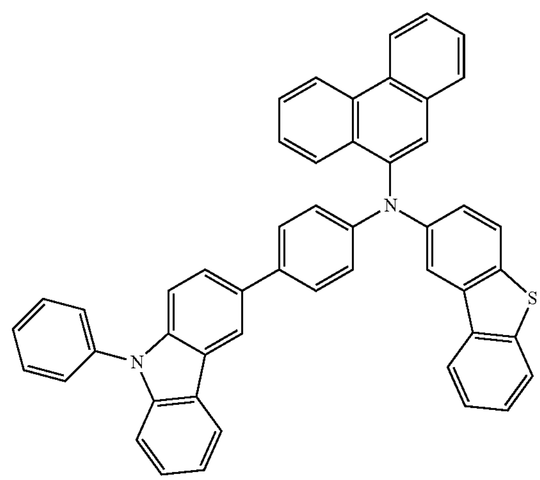
721
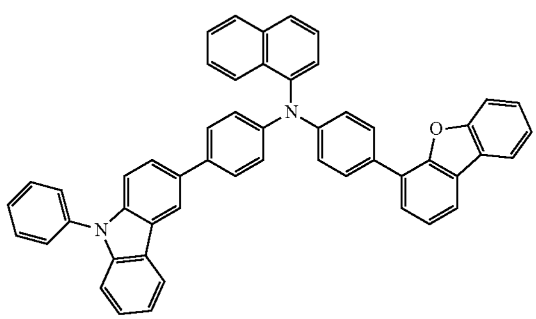
722
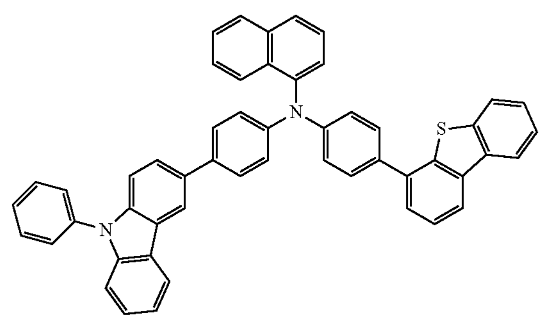
723
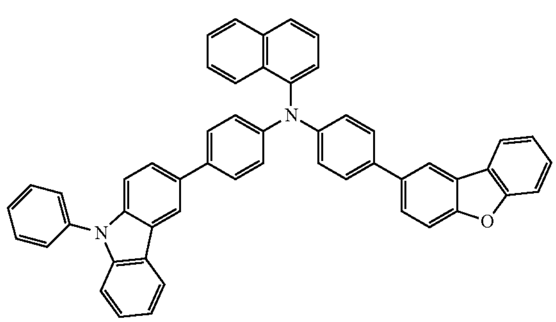
724
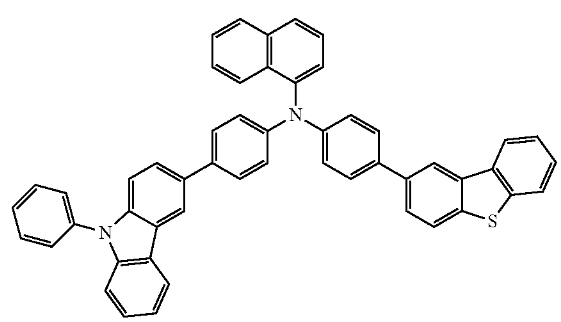

-continued
725
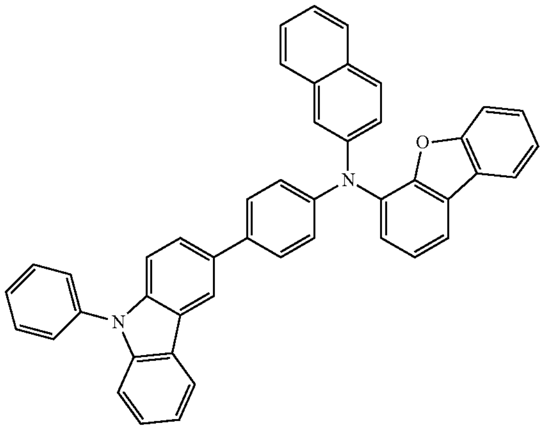
726
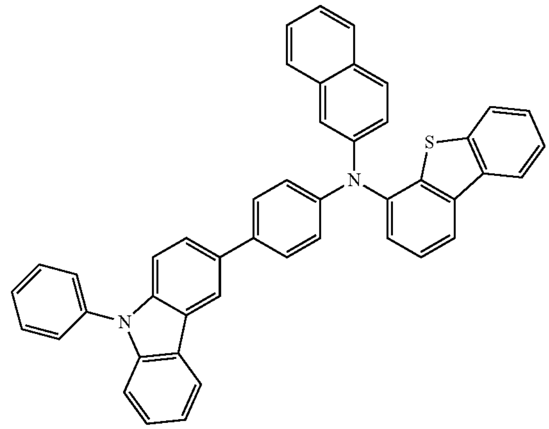
727
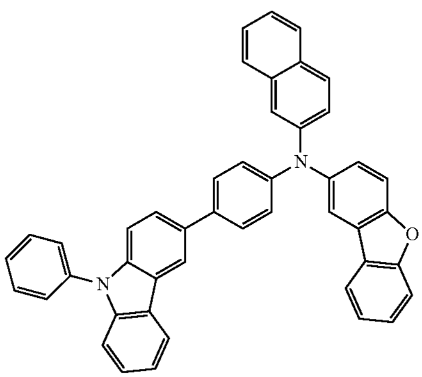
728
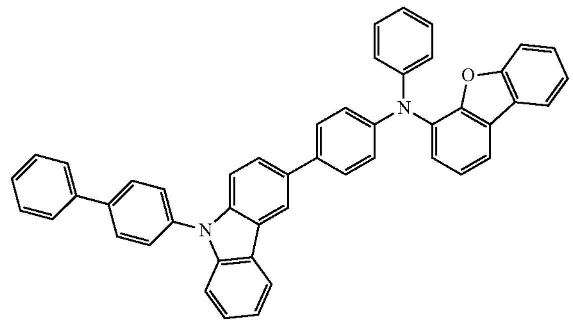
729
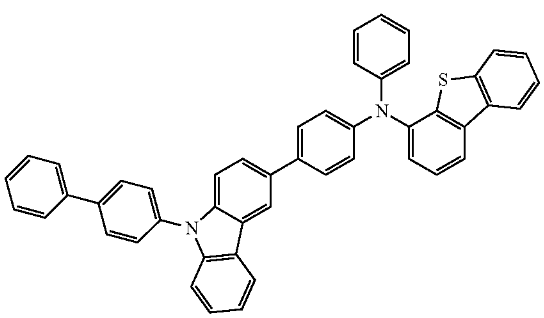
730
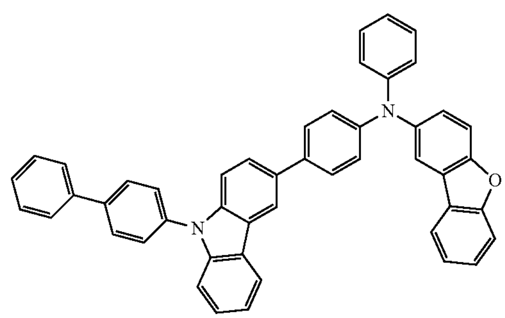
731
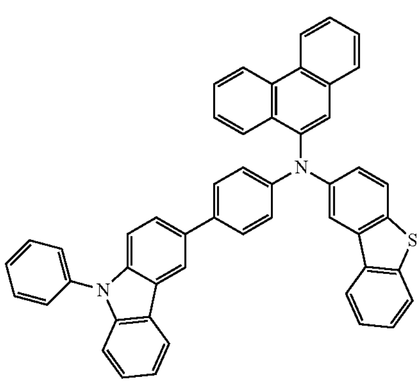
732
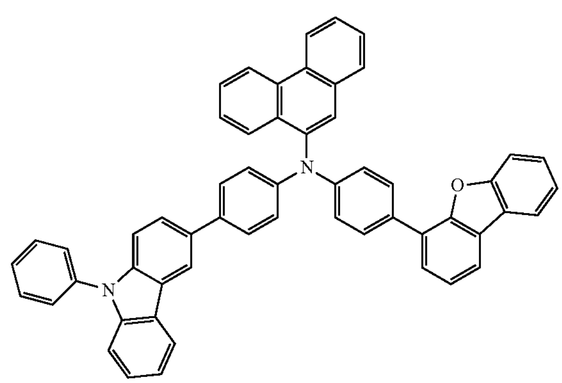

-continued
733
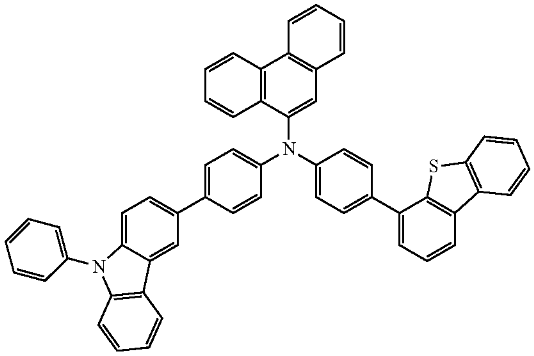
734
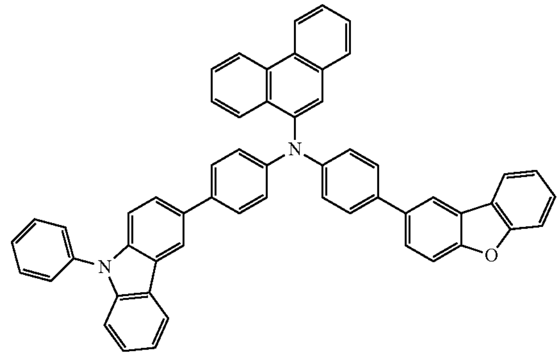
735
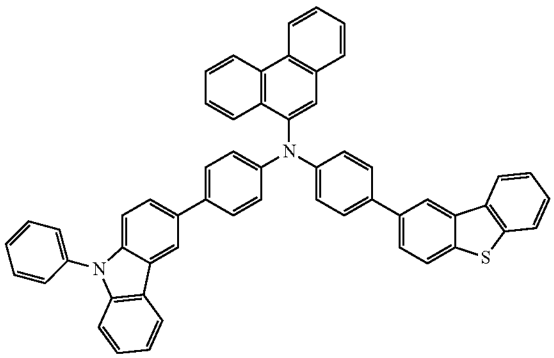
736
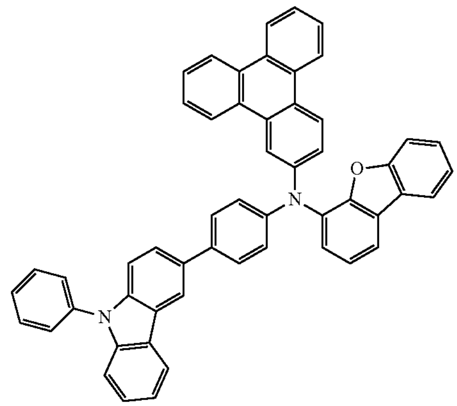
737
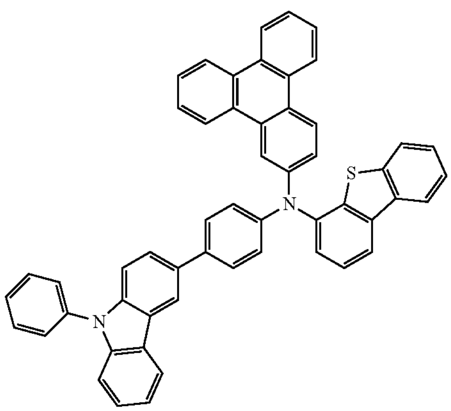
738
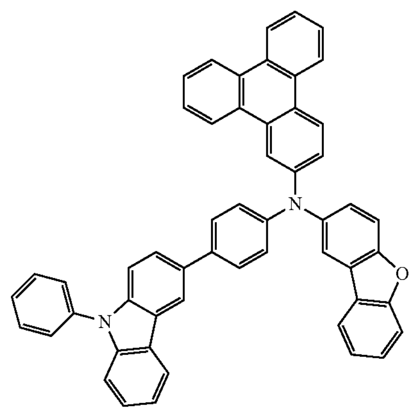
739
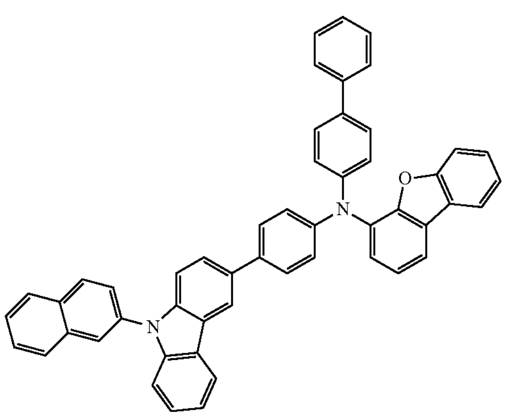
740
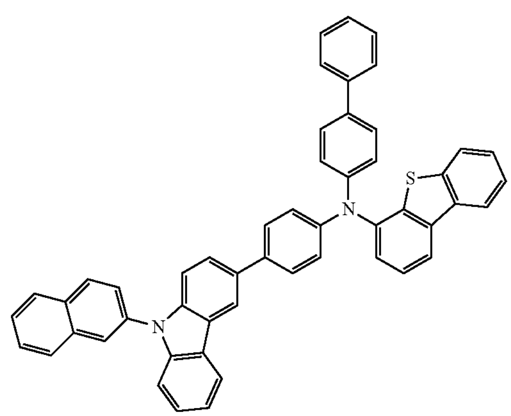

-continued
741
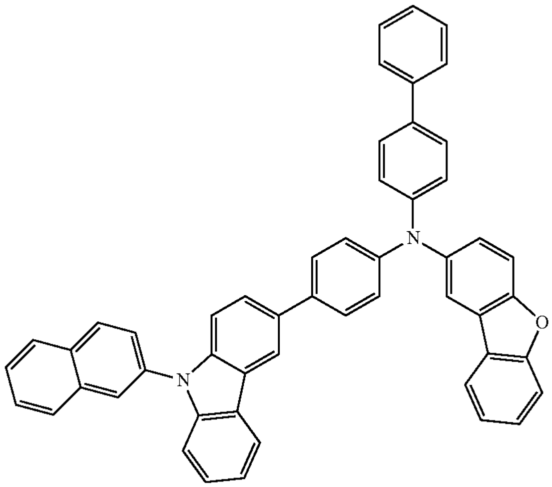
742
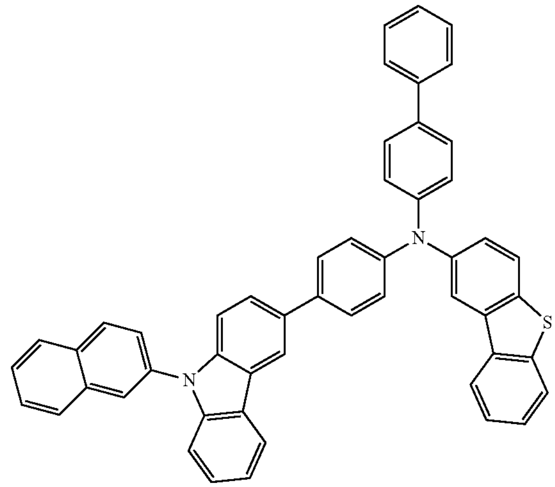
743
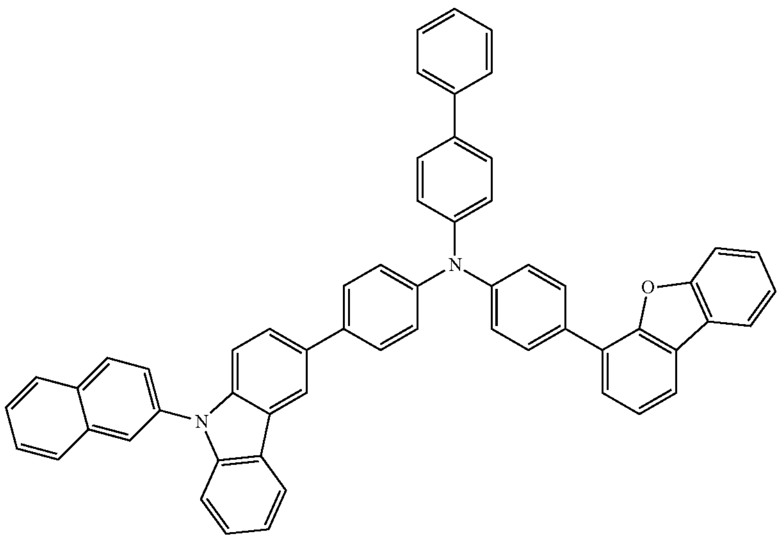
744
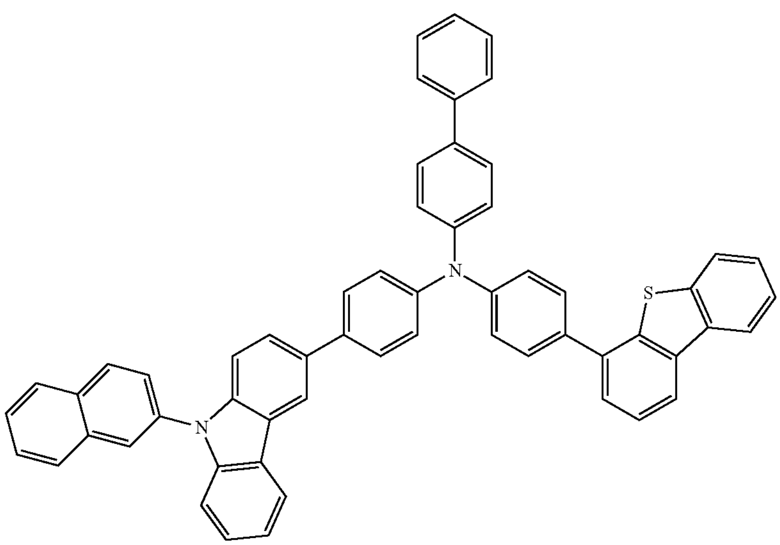

-continued
745
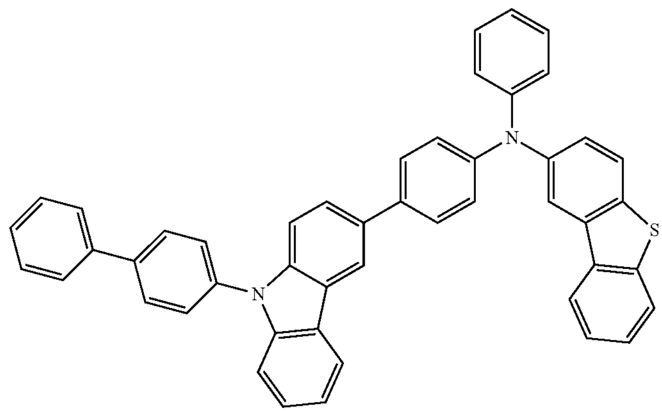
746
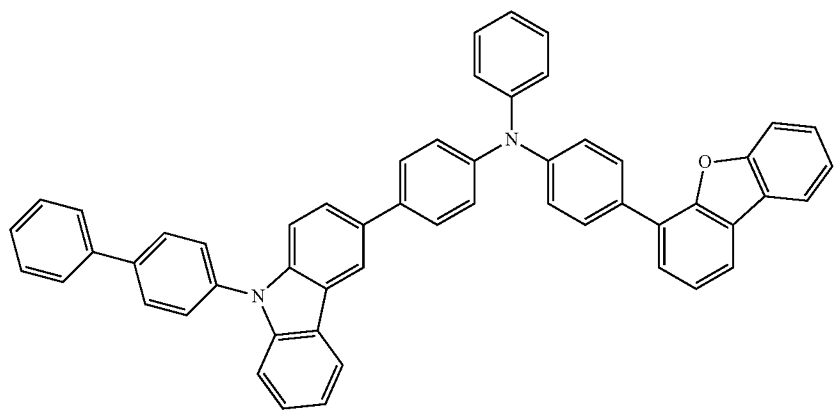
747
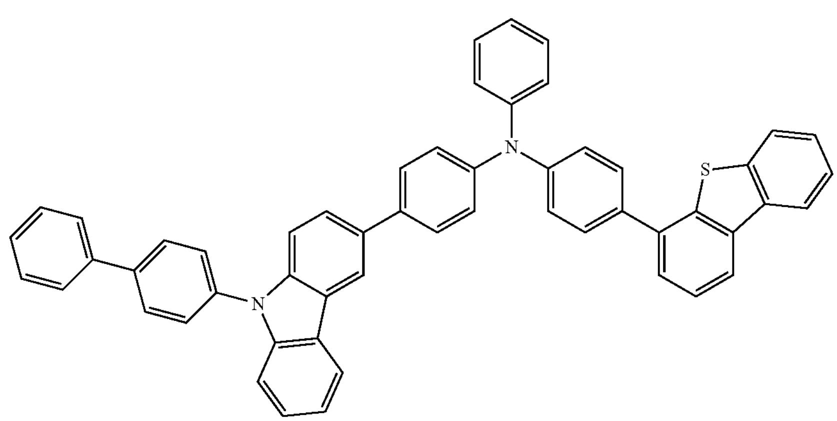

-continued
748
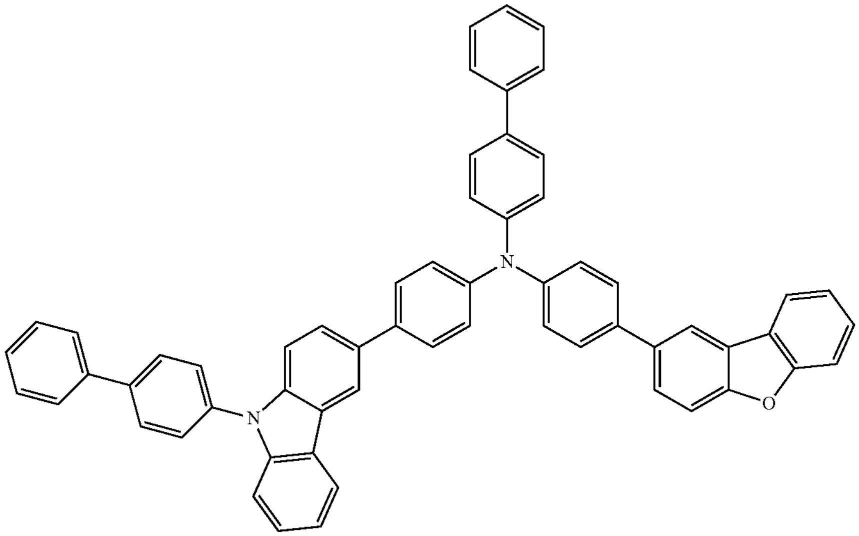
749
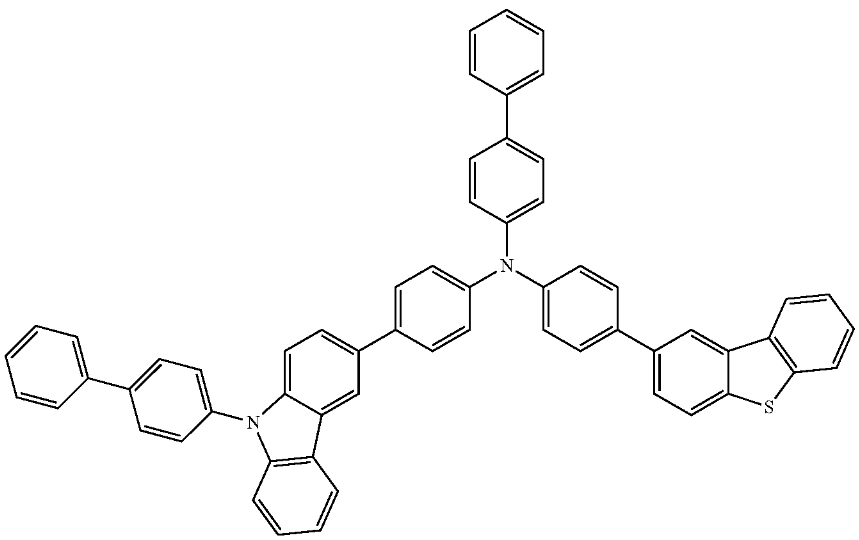
750
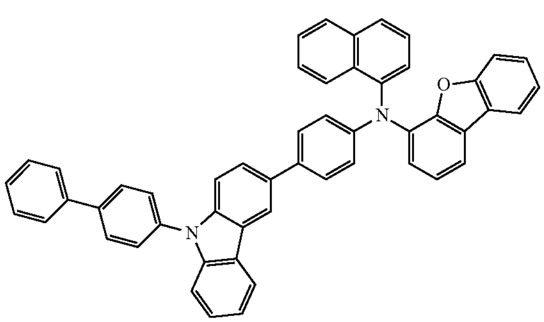
751
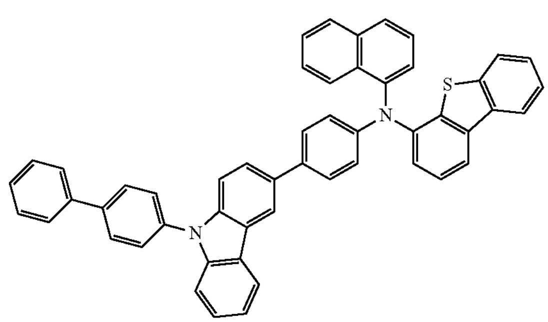

-continued
752
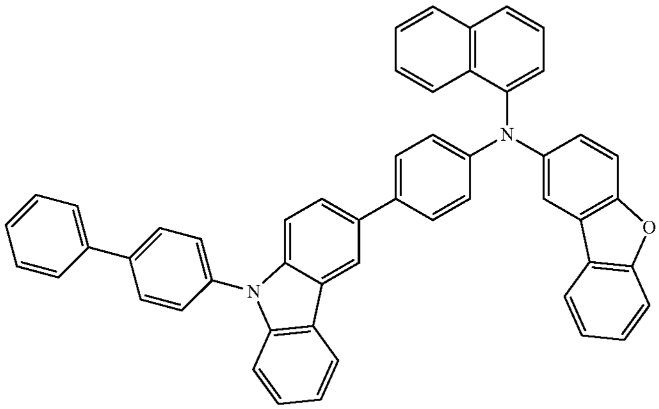
753
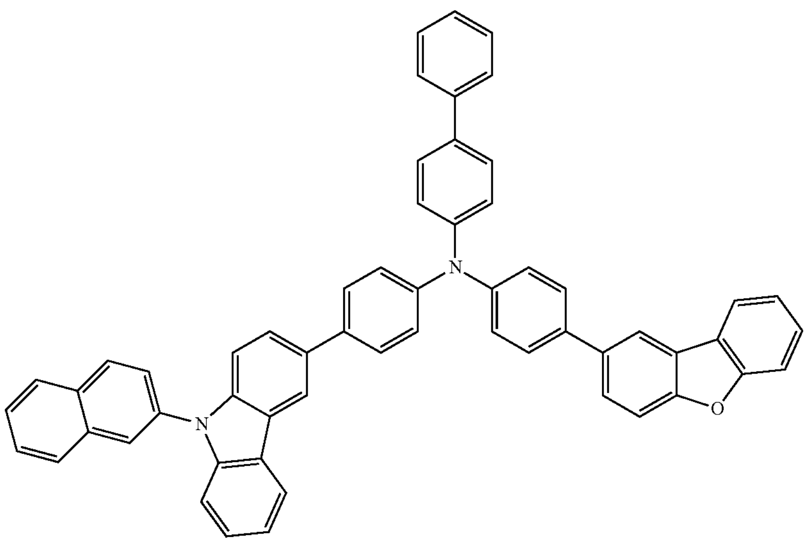
754
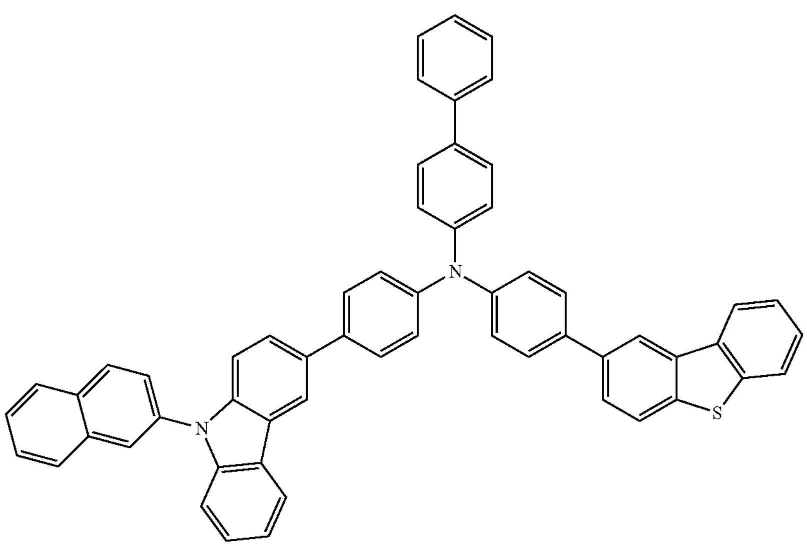

-continued
755
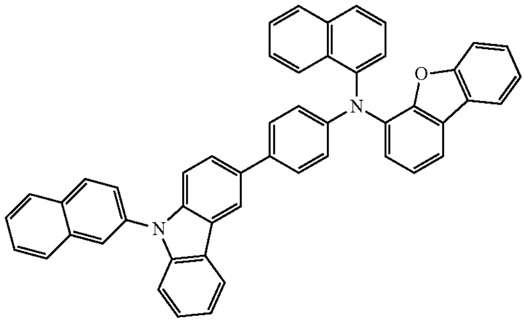
756
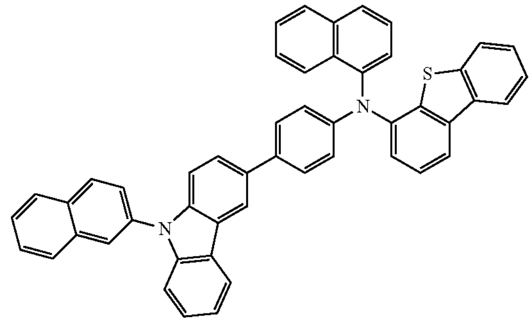
757
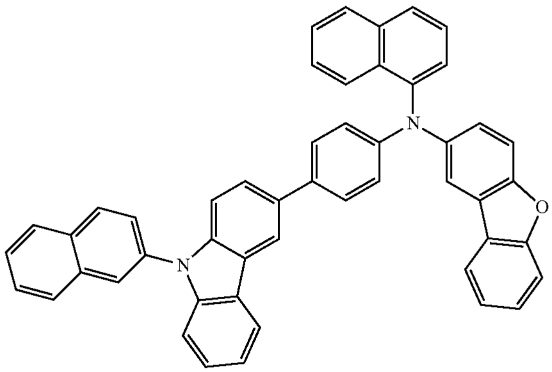
758
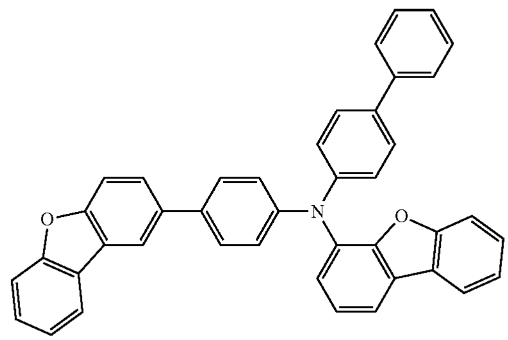
759
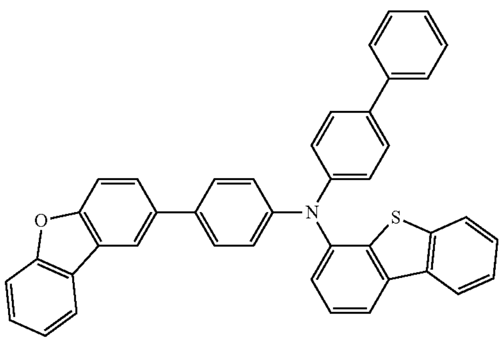
760
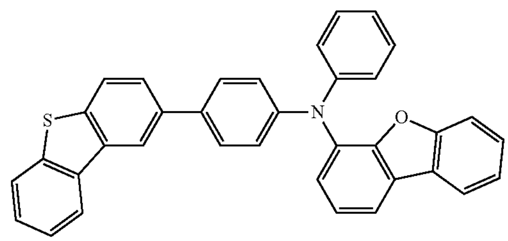
761
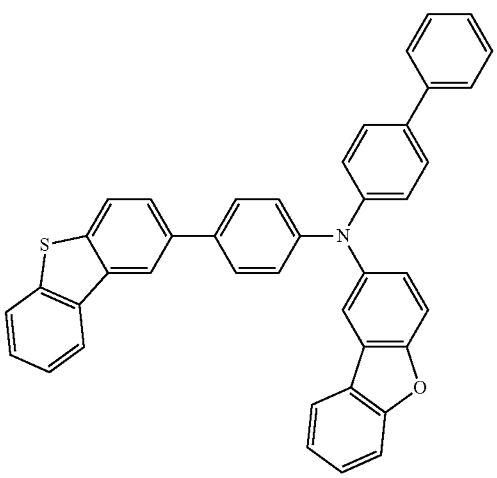
762
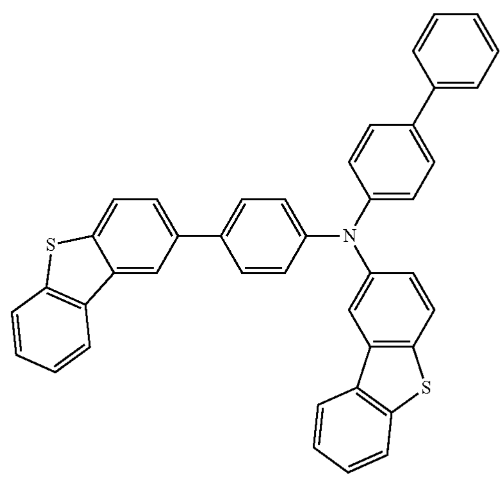

-continued
763
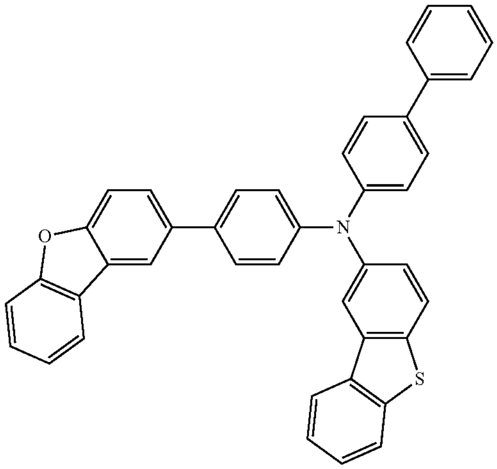
764
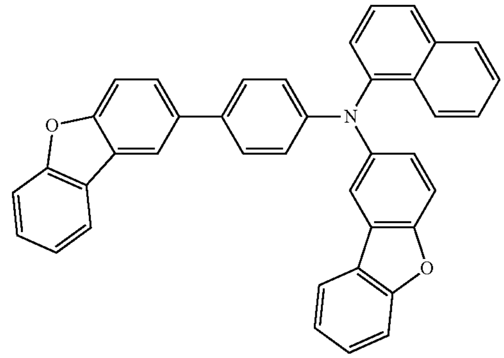
765
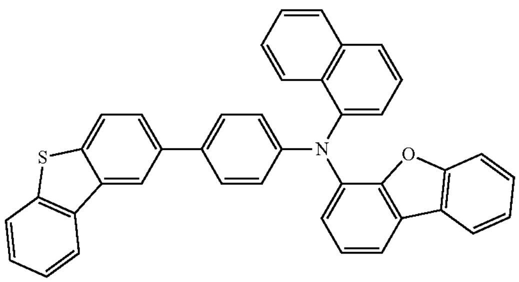
766
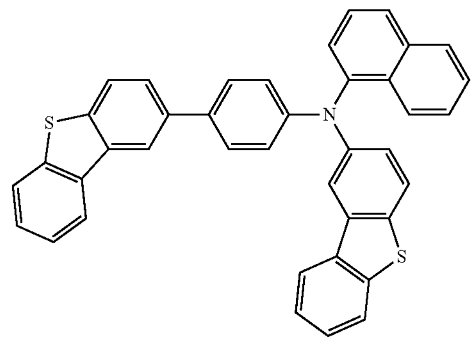
767
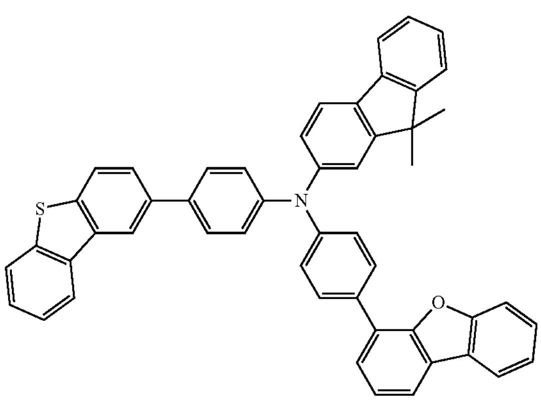
768
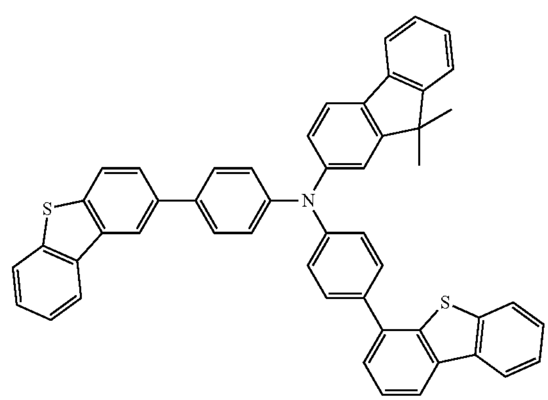

-continued
769
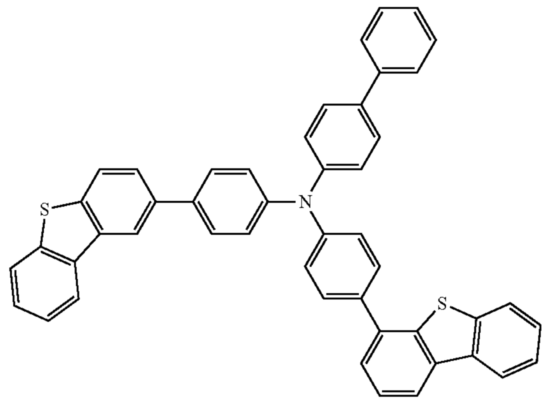
770
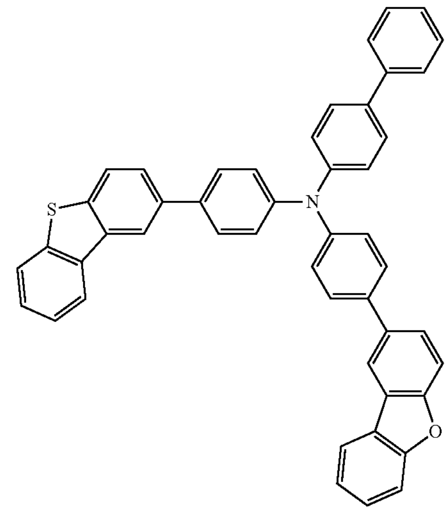
771
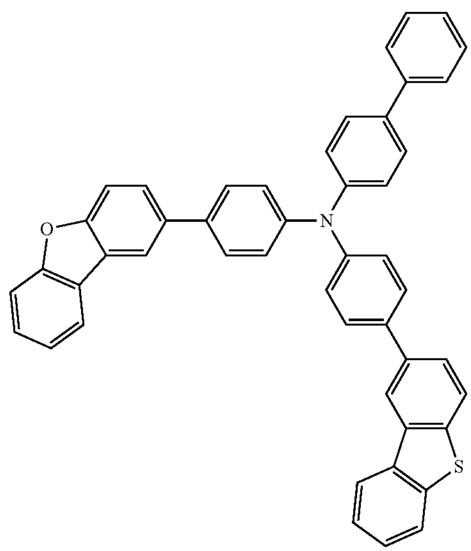
772
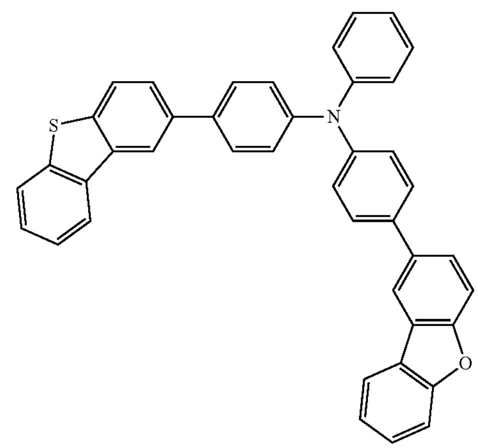
773
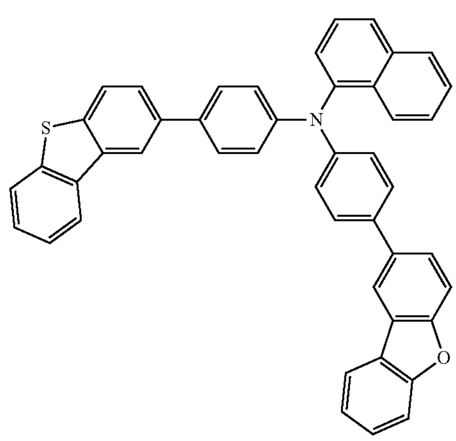
774
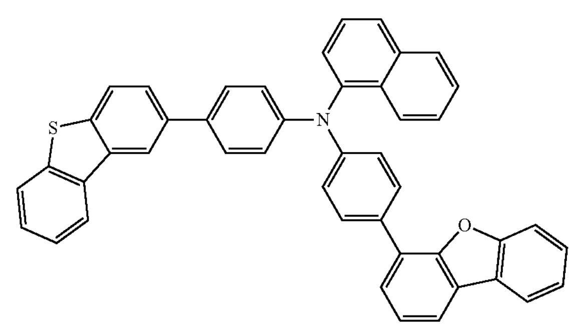

-continued
775
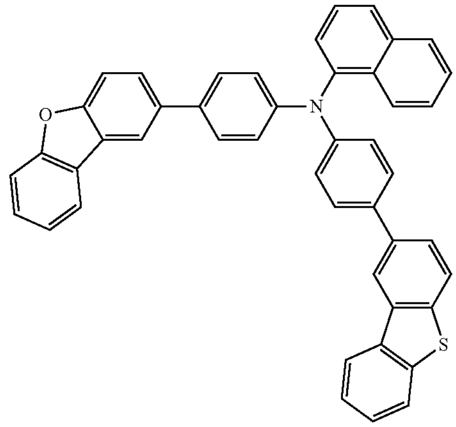
776
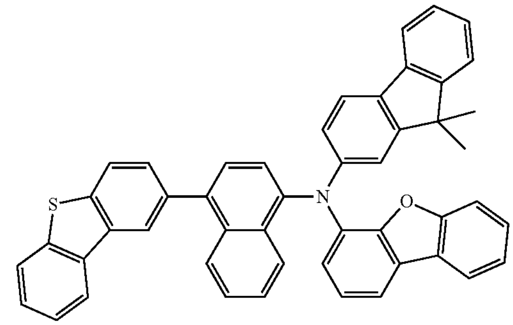
777
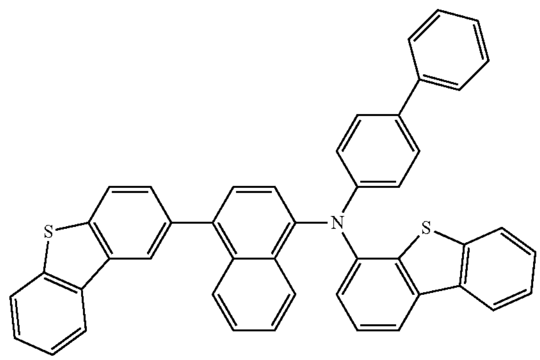
778
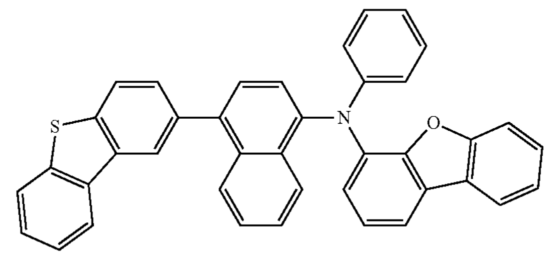
779
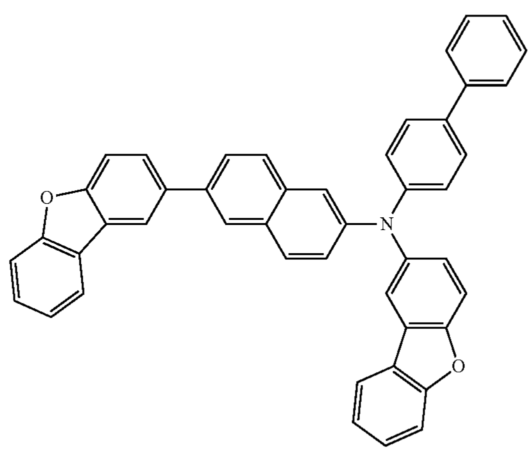
780
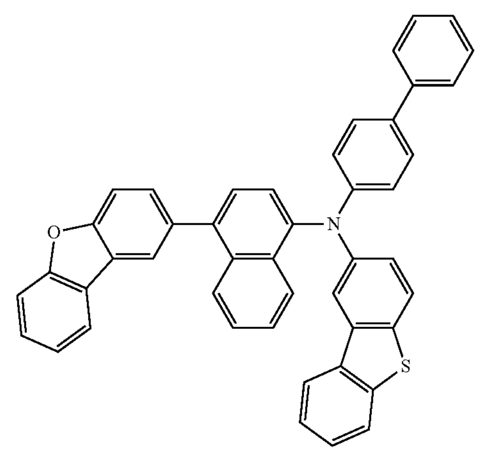
781
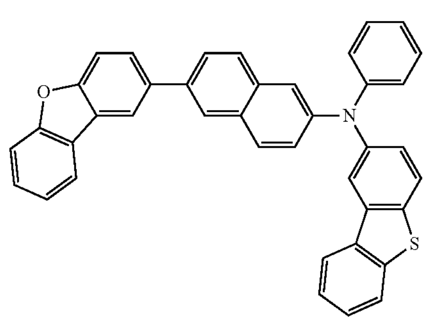
782
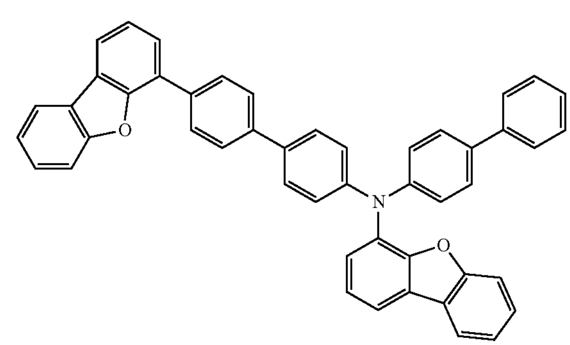

-continued
783
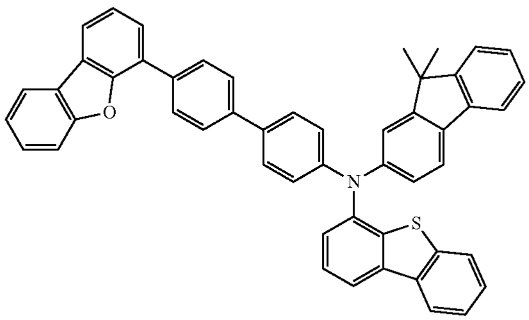
784
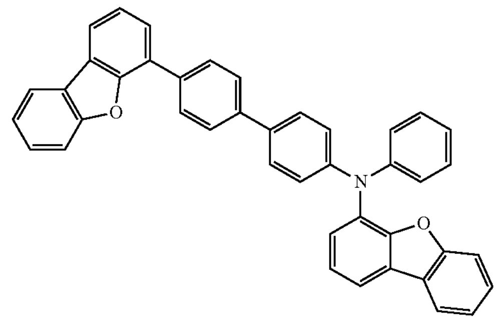
785
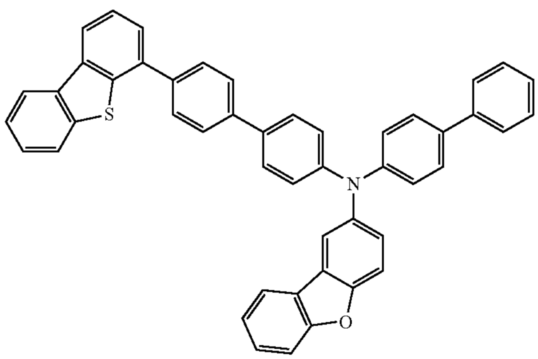
786
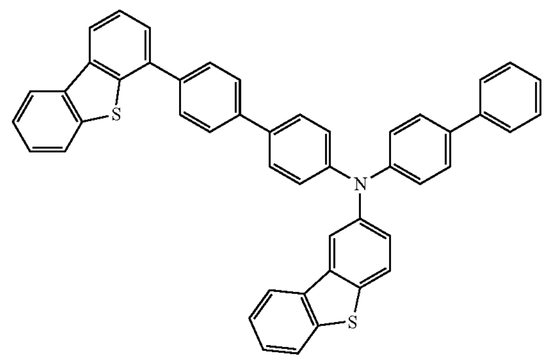
787
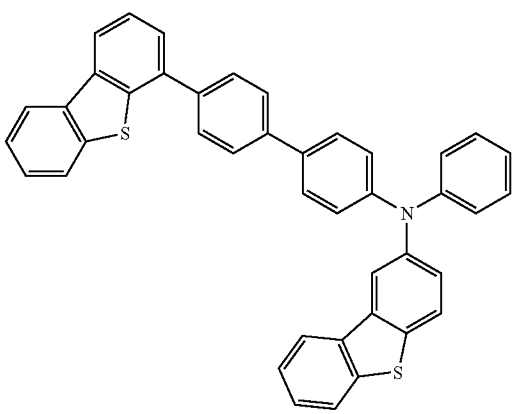
788
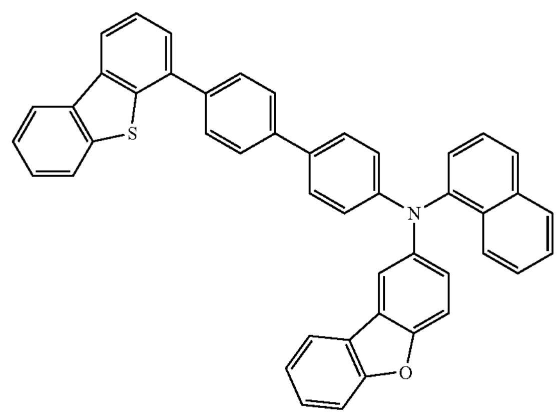
789
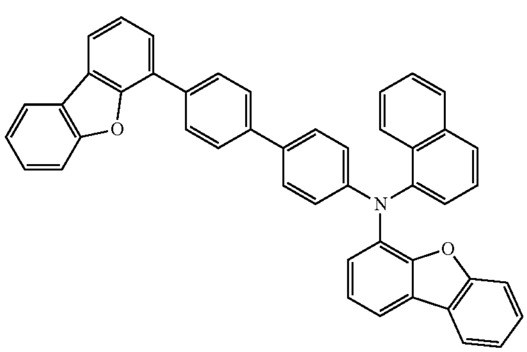
790
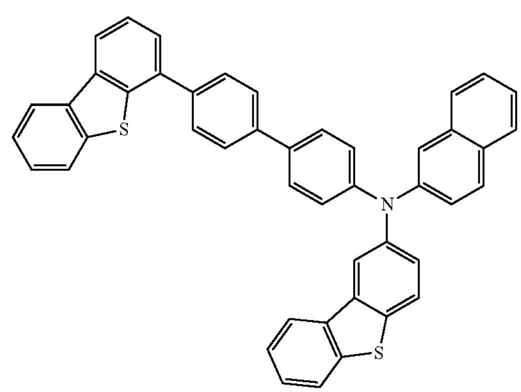

-continued

791

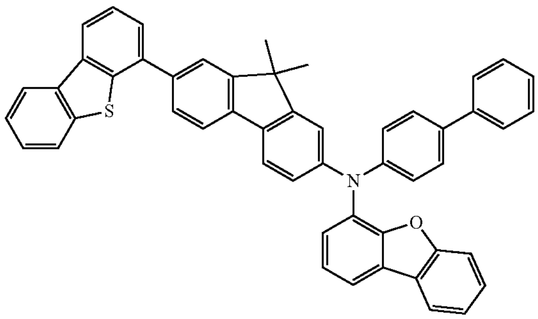

792

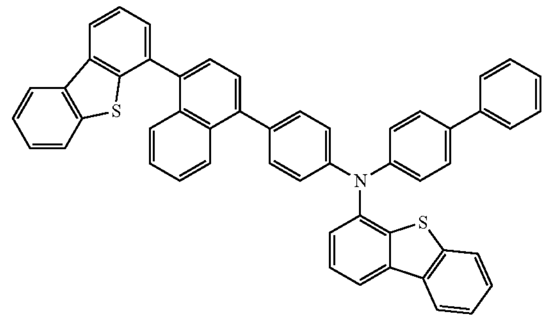

793

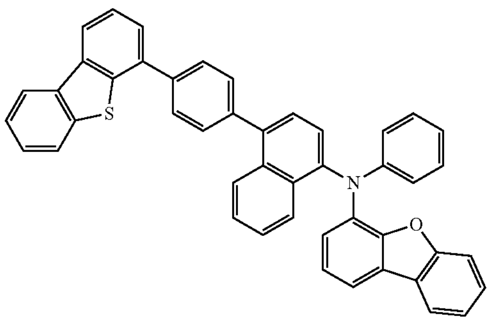

794

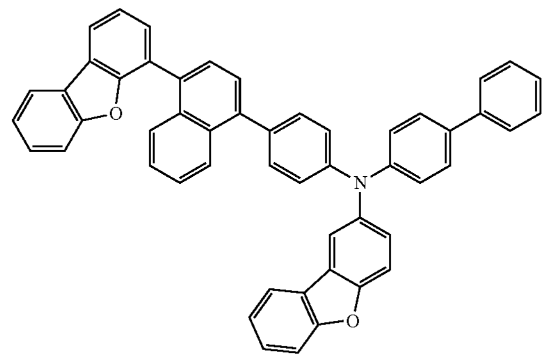

795

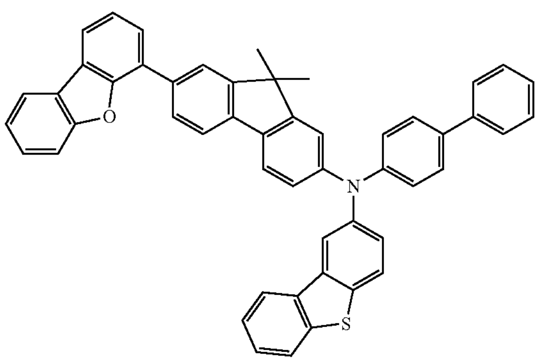

796

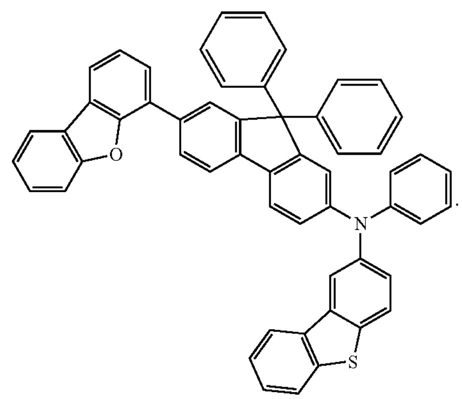

In the formulae of the compounds illustrated above, Ph is a phenyl group, and Me is a methyl group.

In some embodiments, the first material may be one selected from Compounds 101A to 189A, the second material may be one selected from Compounds 301A to 373A, and the third material may be one selected from Compounds 501 and 796.

In some embodiments, the first material may be one selected from Compounds 101B to 163B, and the second material may be one selected from Compounds 301B to 460B, and the third material may be one selected from Compounds 501 to 796.

When the emission layer includes the first material represented by Formula 1 and the second material represented by any one of Formulae 2-1 to 2-5, and the hole transport region includes the third material represented by Formula 3, an exciton zone of the emission layer (e.g., a zone of the emission layer containing excitons) is enlarged as holes may be easily transferred from the hole transport region to the emission layer, and thus the resulting organic light-emitting device may have a high efficiency and a long lifespan.

The hole transport region may include at least one selected from a hole injection layer (HIL), a hole transport layer (HTL), a buffer layer, and an electron blocking layer (EBL).

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole transport layer/buffer layer, a structure of hole injection layer/electron blocking layer, a structure of a hole injection layer/hole transport layer/electron blocking layer, or a structure of hole transport layer/electron blocking layer, wherein layers of each structure are sequentially stacked from the first electrode 110 in the stated order, but embodiments of the present invention are not limited thereto.

In some embodiments, the emission layer may include a host and a dopant, and the host may include the first material represented by Formula 1 and the second material represented by Formulae 2-1 to 2-5;

the hole transport region may include at least one selected from a hole transport layer and an electron blocking layer, and at least one selected from the hole transport layer and the electron blocking layer may include the third material represented by Formula 3.

When the hole transport region includes a hole injection layer, the hole injection layer may be formed on the first electrode 110 by one or more suitable methods, such as vacuum deposition, spin coating, casting, a Langmuir-Blodgett (LB) method, inkjet printing, laser printing, and/or laser-induced thermal imaging (LITI).

When the hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Å/sec to about 100 Å/sec, depending on the compound for forming the hole injection layer and a structure of the desired hole injection layer.

When the hole injection layer is formed by spin coating, the spin coating may be performed at a coating rate in a range of about 2,000 rpm to about 5,000 rpm and at a temperature in a range of about 80° C. to about 200° C., depending on the compound for forming the hole injection layer and a structure of the desired hole injection layer.

When the hole transport region includes a hole transport layer, the hole transport layer may be formed on the first electrode 110 or the hole injection layer by one or more suitable methods, such as vacuum deposition, spin coating, casting, an LB method, inkjet printing, laser printing, and/or LITI. When the hole transport layer is formed by vacuum deposition and/or spin coating, the deposition and coating conditions may be similar to the conditions for forming the hole injection layer.

A thickness of the hole transport region may be in a range of about 100 Å to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the hole transport region includes an electron blocking layer, a thickness of the electron blocking layer may be in a range of about 50 Å to about 800 Å, for example, about 100 Å to about 500 Å.

When thicknesses of the hole transport region, the hole injection layer, the hole transport layer, and the electron blocking layer are within any of these ranges, satisfactory hole transporting properties of the hole transport region may be obtained without a substantial increase in driving voltage.

The hole transport region may further include a charge-generating material to improve conductive properties, in addition to the third material described above. The charge-generating material may be homogeneously or non-homogeneously dispersed throughout the hole transport region.

The charge-generating material may be, for example, a p-dopant. The p-dopant may be one selected from a quinone derivative, a metal oxide, and a cyano group-containing compound, for example, a quinone derivative, a metal oxide, or a cyano group-containing compound, but embodiments of the present invention are not limited thereto. For example, the p-dopant may be a quinone derivative, such as tetracyanoquinonedimethane (TCNQ) and/or 2,3,5,6-tetrafluoro-tetracyano-1,4-benzoquinonedimethane (F4-TCNQ); a metal oxide, such as tungsten oxide and/or molybdenum oxide; and/or Compound HT-D1, but embodiments of the present invention are not limited thereto:

<Compound HT-D1>

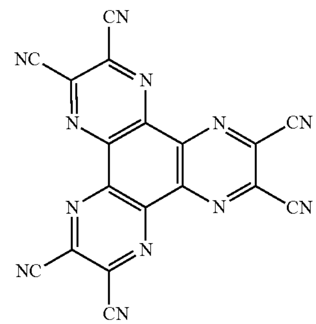

<F4-TCNQ>

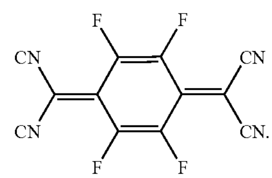

The hole transport region may further include at least one selected from a buffer layer and an electron blocking layer, in addition to the hole injection layer and the hole transport layer. The buffer layer may compensate for an optical resonance distance according to a wavelength of light emitted from the emission layer. Accordingly, the light-emission efficiency of the organic light-emitting device including the buffer layer may improve. A material in the buffer layer may be the material that is also included in the hole transport region. The electron blocking layer may prevent or substantially block the injection of electrons from the electron transport region.

An emission layer 150 may be formed on the hole transport region 130 by using (utilizing) one or more suitable methods, such as vacuum deposition, spin coating, casting, an LB method, inkjet printing, laser printing, and/or LITI. When the emission layer 150 is formed by vacuum deposition and/or spin coating, deposition and coating conditions for forming the emission layer 150 may be similar to the deposition and coating conditions for forming the hole injection layer.

When the organic light-emitting device 10 is a full-color organic light-emitting device, the emission layer 150 may be patterned into sub-pixels including a red emission layer, a green emission layer, or a blue emission layer. In some embodiments, the emission layer 150 may have a stacked structure of a red emission layer, a green emission layer, and a blue emission layer, or may include a red-light emission material, a green-light emission material, and a blue-light emission material that are mixed with each other in a single layer, to emit white light.

The emission layer 150 may include the first material represented by Formula 1 and the second material represented by any one of Formulae 2-1 to 2-5.

A thickness of the emission layer 150 may be in a range of about 100 Å to about 1,000 Å, for example, about 200 Å to about 600 Å. When the thickness of the emission layer is within any of these ranges, excellent light-emission characteristics of the emission layer may be obtained without a substantial increase in driving voltage.

The emission layer 150 may include a host and a dopant.

In the emission layer 150, the host may include the first material represented by Formula 1 and the second material represented by any one of Formulae 2-1 to 2-5.

A weight ratio of the first material to the second material in the emission layer may be in a range of about 10:90 to about 90:10, for example, about 20:80 to about 80:20, or about 25:75 to about 50:50. When the weight ratio of the first material to the second material is within any of these ranges, hole transfer and electron transfer in the emission layer 150 may be effectively balanced.

The dopant may include at least one selected from a fluorescent dopant and a phosphorescent dopant.

The phosphorescent dopant may include an organometallic complex represented by Formula 401:

Formula 401

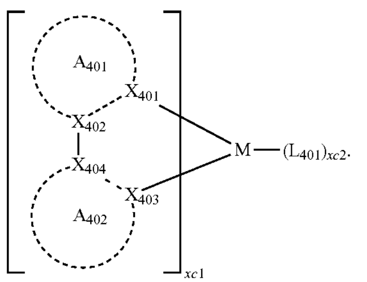

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen (—N—) or carbon (—C—);

rings $A_{401}$ and $A_{402}$ may be each independently selected from:

a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; and at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene is selected from:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

where $Q_{401}$ to $Q_{407}$, $Q_{411}$ to $Q_{417}$, and $Q_{421}$ to $Q_{427}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

$L_{401}$ may be an organic ligand;

xc1 may be 1, 2, or 3; and xc2 may be 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propanedionate, 2,2,6,6-tetramethyl-3,5-heptanedionate, and/or hexafluoroacetonate), a carboxylic acid ligand (for example, picolinate, dimethyl-3-pyrazolecarboxylate, and/or benzoate), a carbon monoxide ligand, an isonitrile ligand, a cyano ligand, and a phosphorus ligand (for example, phosphine and/or phosphite), but embodiments of the present invention are not limited thereto.

In Formula 401, when $A_{401}$ has two or more substituents, the two or more substituents of $A_{401}$ may be linked to each other to form a saturated or unsaturated ring.

In Formula 401, when $A_{402}$ has two or more substituents, the two or more substituents of $A_{402}$ may be linked to each other to form a saturated or unsaturated ring.

In Formula 401, when xc1 is 2 or greater, a plurality of ligands

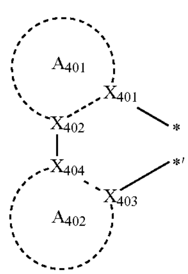

in Formula 401 may be identical to or different from each other. In Formula 401, when xc1 is 2 or greater, $A_{401}$ and/or $A_{402}$ of one ligand may be respectively linked to $A_{401}$ and/or $A_{402}$ of a different neighboring ligand either directly (e.g., via a single bond) or via a linking group (e.g., a $C_1$-$C_5$ alkylene group, a $C_2$-$C_5$ alkenylene group, —N(R')— (where R' is a $C_1$-$C_{10}$ alkyl group or a $C_6$-$C_{20}$ aryl group), and/or —C(═O)—) therebetween.

The phosphorescent dopant may include at least one of Compounds PD1 to PD74, but embodiments of the present invention are not limited thereto:

PD1

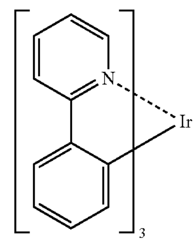

PD2

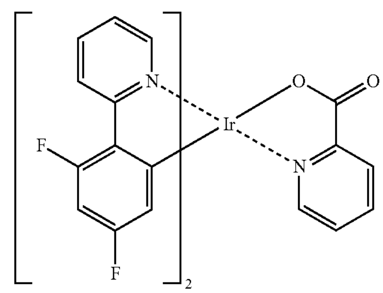

PD3

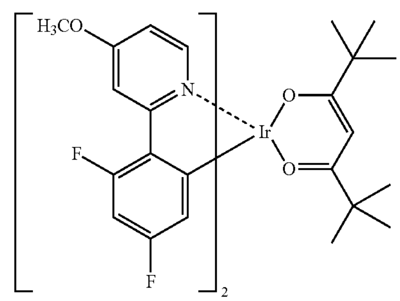

PD4

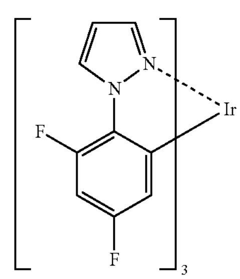

PD5

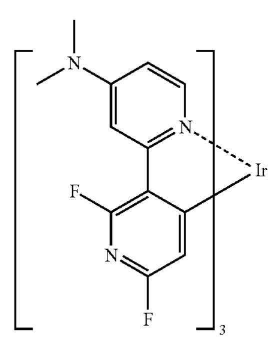

-continued
PD6
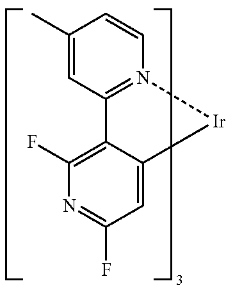
PD7
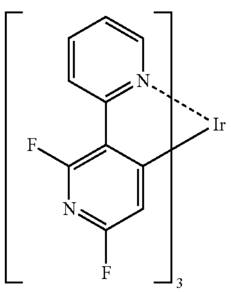
PD8
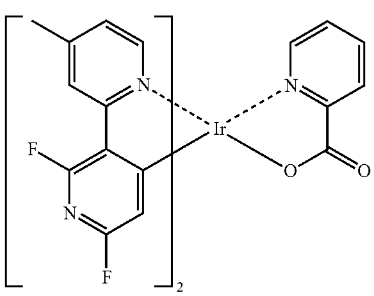
PD9
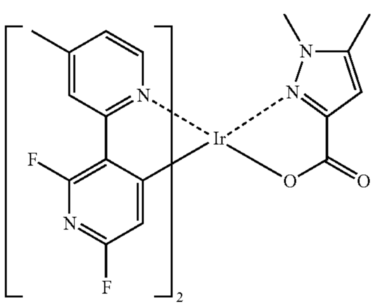
PD10
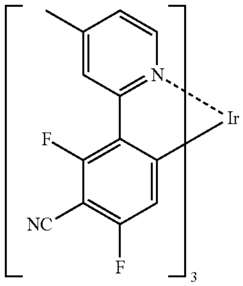
-continued
PD11
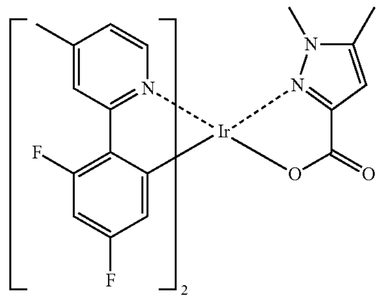
PD12
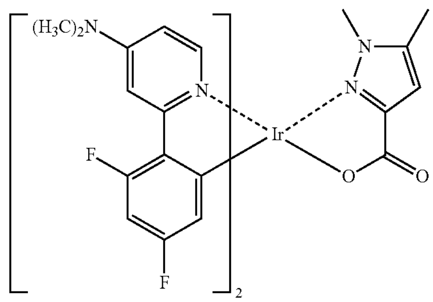
PD13
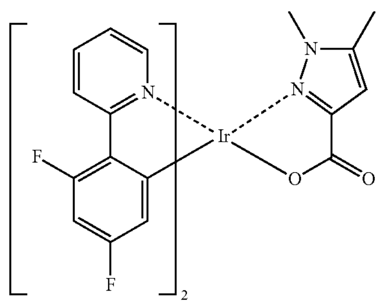
PD14
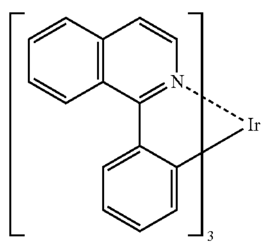
PD15
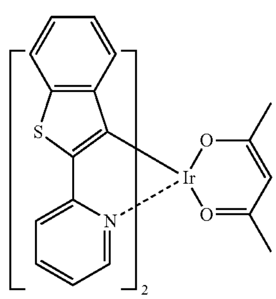

-continued
PD16
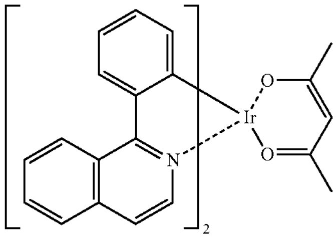
PD17
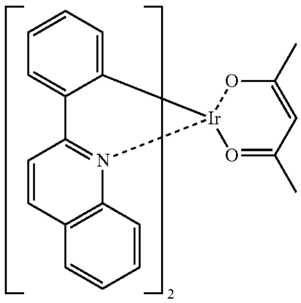
PD18
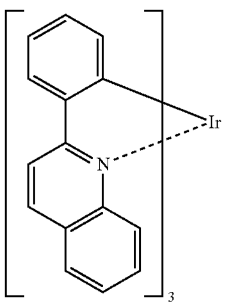
PD19
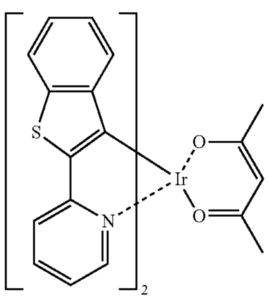
PD20
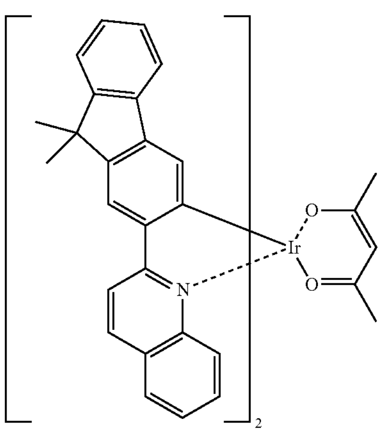
-continued
PD21
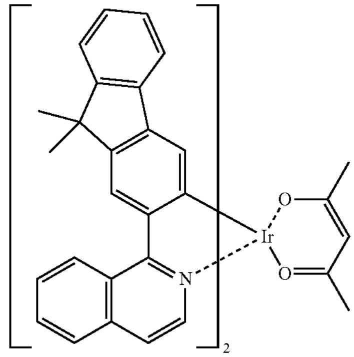
PD22
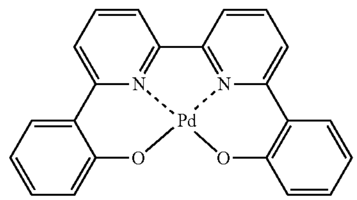
PD23
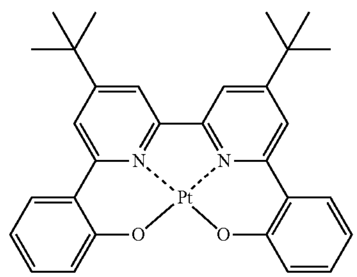
PD24
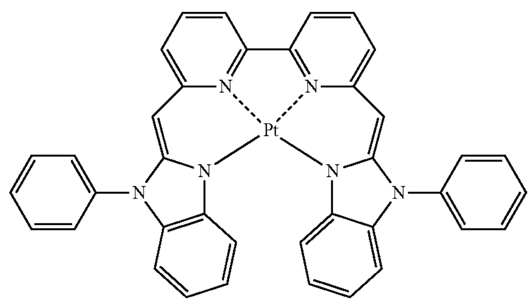
PD25
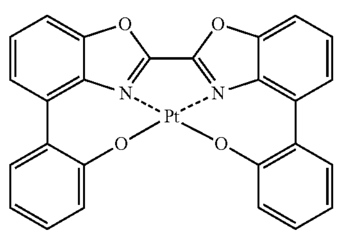
PD26
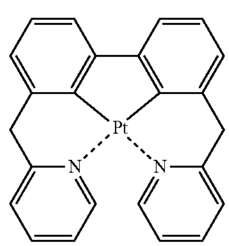

-continued
PD27
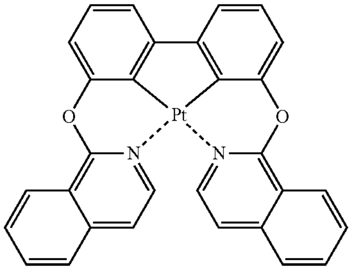
PD28
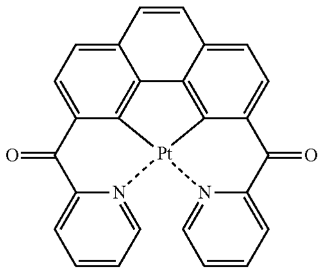
PD29
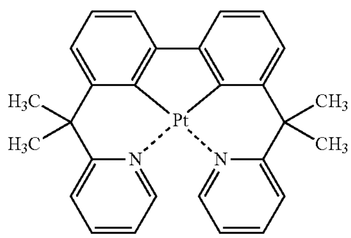
PD30
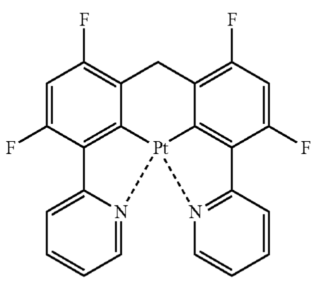
PD31
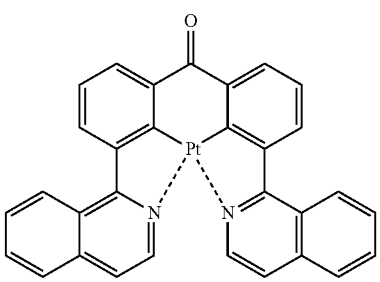
PD32
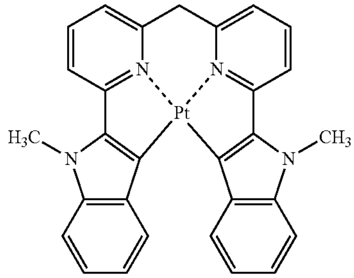
-continued
PD33
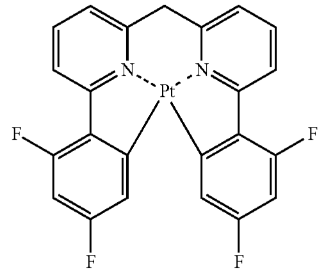
PD34
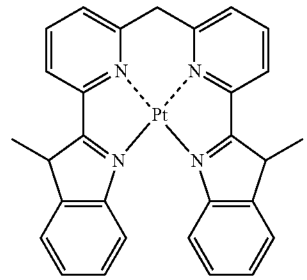
PD35
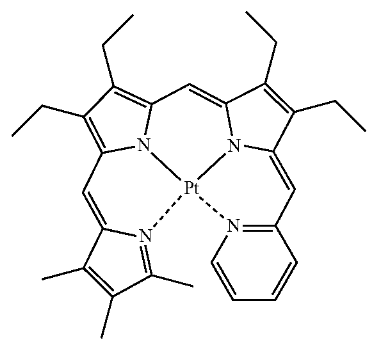
PD36
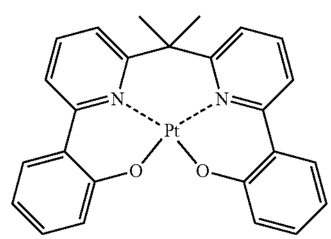
PD37
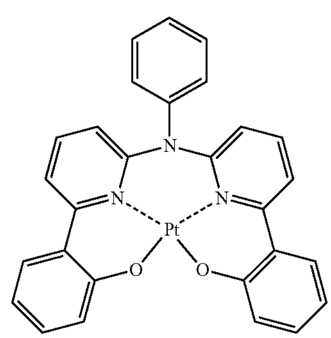

-continued
PD38
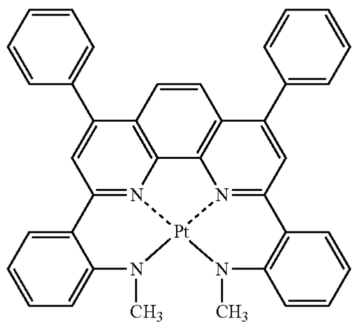
PD39
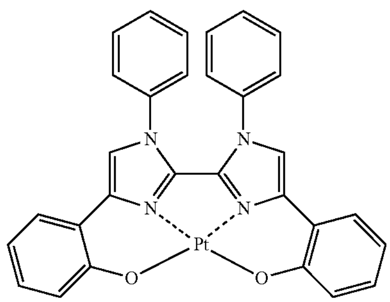
PD40
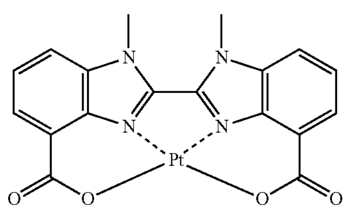
PD41
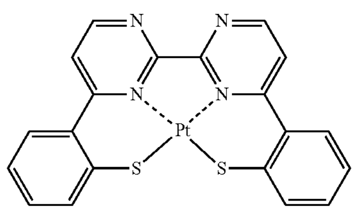
PD42
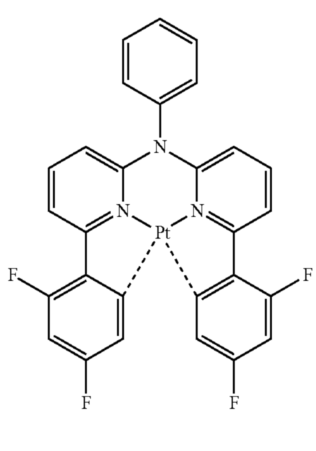
-continued
PD43
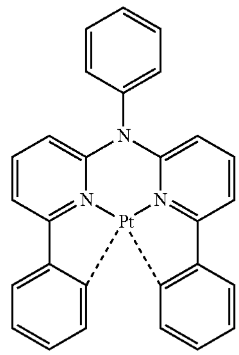
PD44
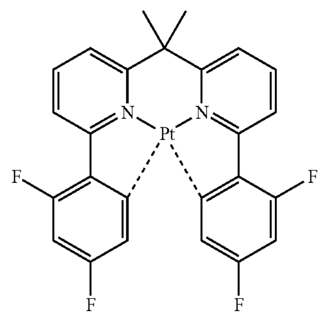
PD45
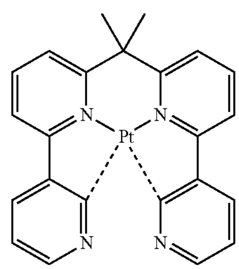
PD46
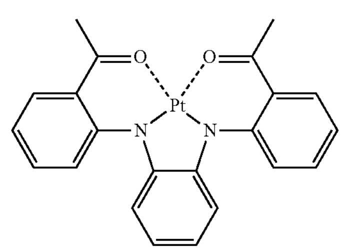
PD47
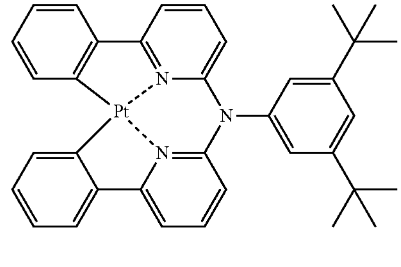

-continued
PD48
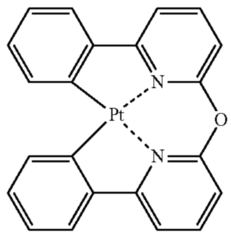
PD49
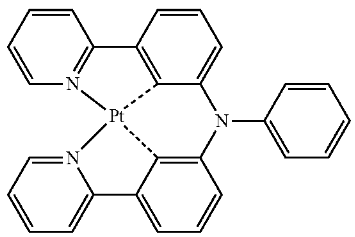
PD50
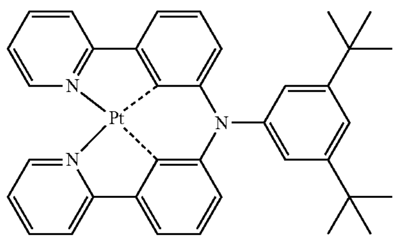
PD51
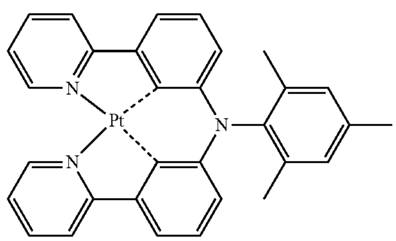
PD52
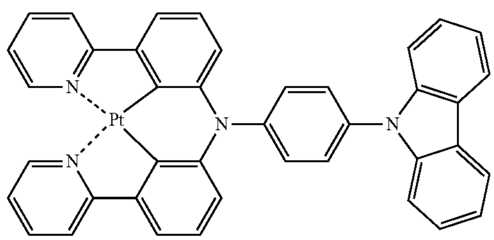
PD53
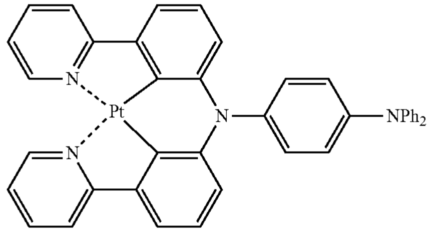
-continued
PD54
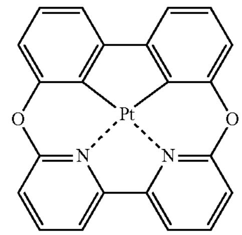
PD55
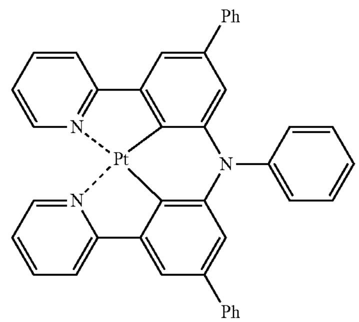
PD56
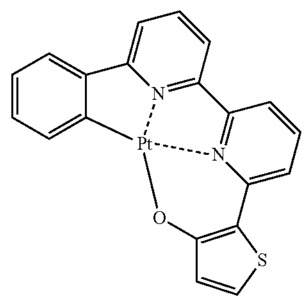
PD57
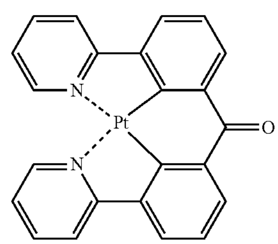
PD58
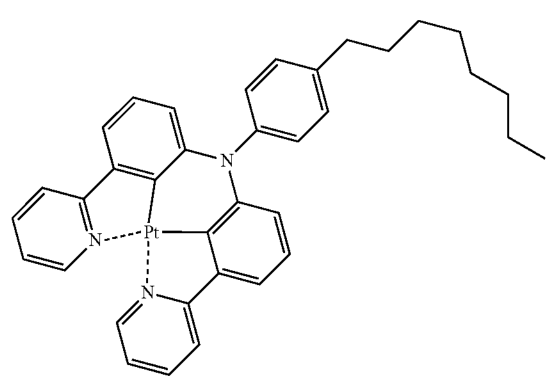

-continued
PD59
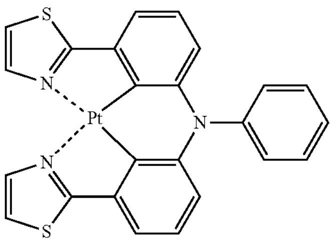
PD60
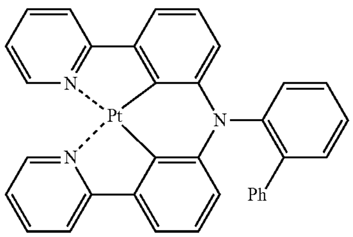
PD61
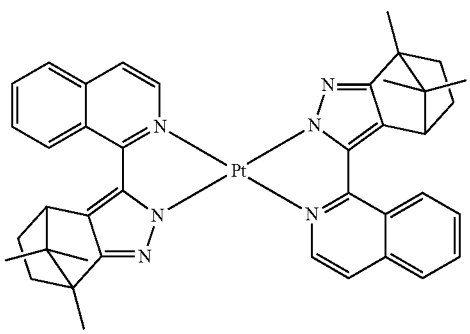
PD62
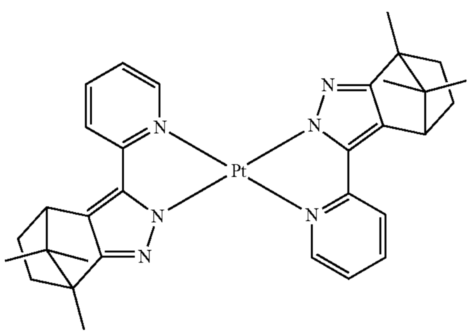
PD63
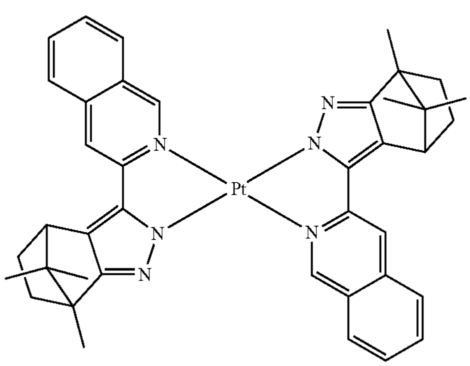
-continued
PD64
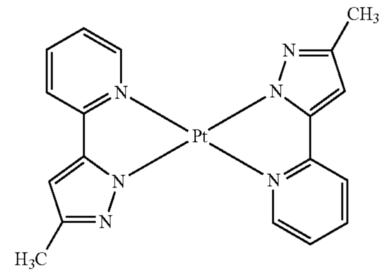
PD65
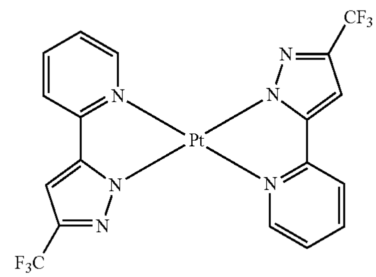
PD66
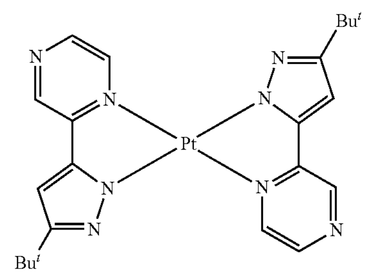
PD67
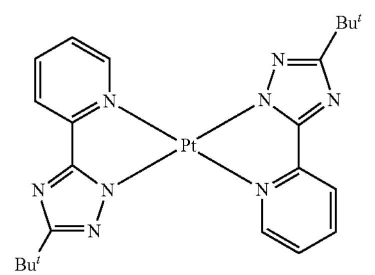
PD68
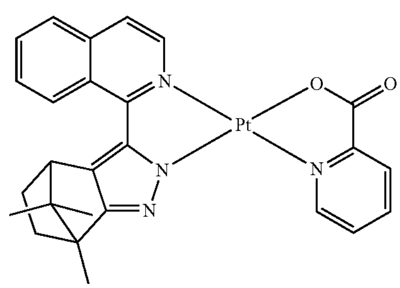
PD69
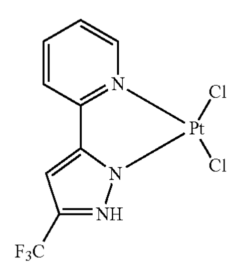

-continued

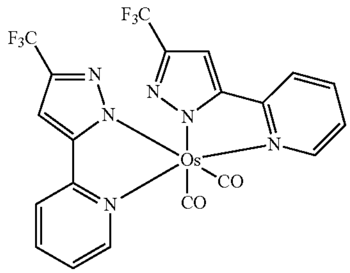

PD70

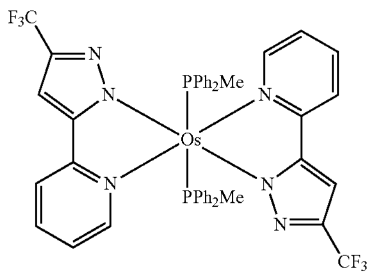

PD71

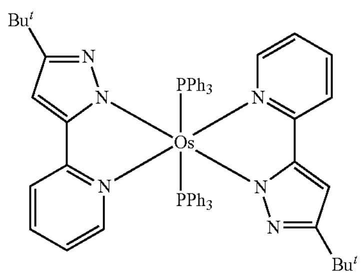

PD72

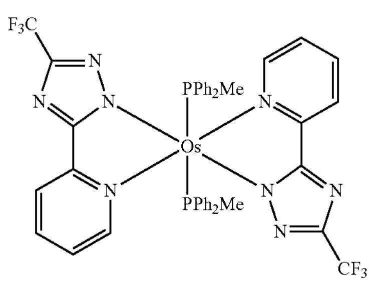

PD73

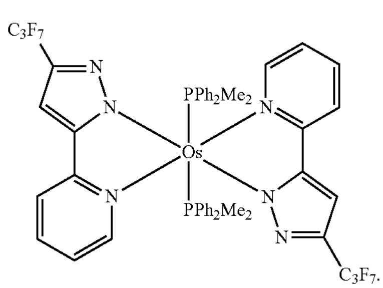

PD74

In some embodiments, the phosphorescent dopant may include PtOEP or PD75:

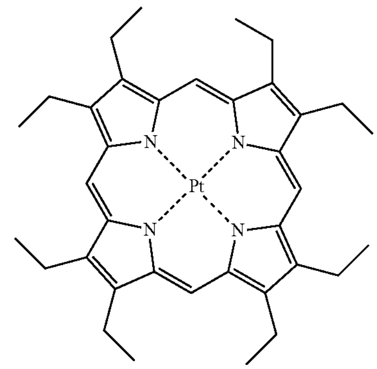

PtOEP

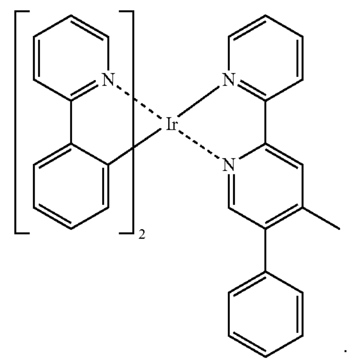

PD75

In the emission layer, the amount of the dopant may be within a range of about 0.01 to about 15 parts by weight based on 100 parts by weight of the host, but embodiments of the present invention are not limited thereto.

The electron transport region 170 may be positioned on the emission layer 150.

The electron transport region 170 may include at least one selected from a hole blocking layer (HBL), an electron transport layer (ETL), and an electron injection layer (EIL), but embodiments of the present invention are not limited thereto.

For example, the electron transport region may have a structure of electron transport layer/electron injection layer or a structure of hole blocking layer/electron transport layer/electron injection layer, wherein layers of each structure are sequentially stacked from the emission layer in the stated order, but embodiments of the present invention are not limited thereto.

The electron transport region may include a hole blocking layer. When the the emission layer includes a phosphorescent dopant, the hole blocking layer may prevent or substantially block the diffusion of triplet excitons and/or holes into the electron transfer layer from the emission layer.

When the electron transport region includes a hole blocking layer, the hole blocking layer may be formed on the emission layer by one or more suitable methods, such as vacuum deposition, spin coating, casting, an LB method, inkjet printing, laser printing, and/or LITI. When the hole blocking layer is formed by vacuum deposition and/or spin coating, deposition and coating conditions for forming the hole blocking layer may be similar to the deposition and coating conditions for forming the hole injection layer.

The hole blocking layer may include, for example, at least one selected from BCP and Bphen, but embodiments of the present invention are not limited thereto.

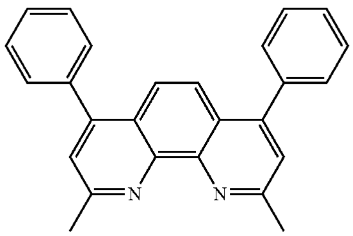

BCP

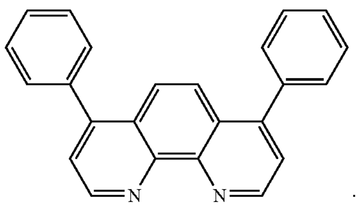

Bphen

A thickness of the hole blocking layer may be in a range of about 20 Å to about 1,000 Å, for example, about 30 Å to about 300 Å. When the thickness of the hole blocking layer is within any of these ranges, excellent hole blocking characteristics of the hole blocking layer may be obtained without a substantial increase in driving voltage.

The electron transport region may include an electron transport layer. The electron transport layer may be formed on the emission layer or the hole blocking layer by one or more suitable methods, such as vacuum deposition, spin coating, casting, an LB method, inkjet printing, laser printing, and/or LITI. When the electron transport layer is formed by vacuum deposition and/or spin coating, vacuum deposition and coating conditions for forming the electron transport layer may be similar to the vacuum deposition and coating conditions for forming the hole injection layer.

In some embodiments, the organic light-emitting device 10 may include the electron transport region 170 between the emission layer 150 and the second electrode 190. The electron transport region 170 may include at least one selected from the electron transport layer and the electron injection layer.

The electron transport layer may further include at least one selected from $Alq_3$, Balq, TAZ, and NTAZ (illustrated below), in addition to BCP and Bphen (illustrated above):

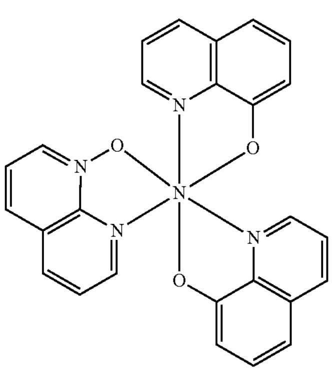

$Alq_3$

-continued

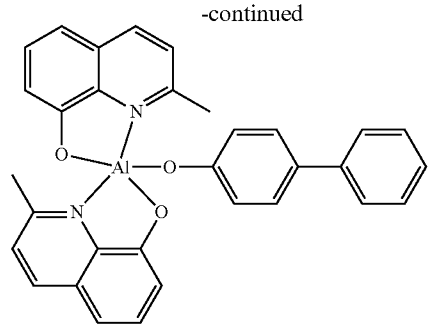

BAlq

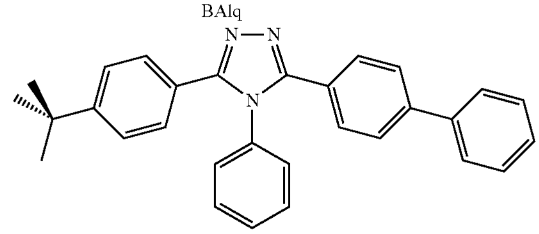

TAZ

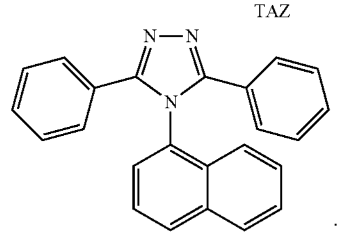

NTAZ

In some embodiments, the electron transport layer may include at least one selected from a compound represented by Formula 601 and a compound represented by Formula 602:

$$Ar_{601}\text{-}[(L_{601})_{xe1}\text{-}E_{601}]_{xe2}. \quad \text{Formula 601}$$

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{301})(Q_{302})(Q_{303})$ (where $Q_{301}$ to $Q_{303}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

$L_{601}$ may have the same definition as $L_{201}$ is defined herein;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

xe1 may be selected from 0, 1, 2, and 3; and xe2 may be selected from 1, 2, 3, and 4.

Formula 602

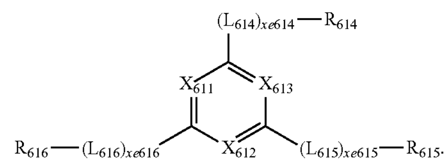

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may each independently have the same definition as $L_{201}$ is defined herein;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and
xe611 to xe616 may be each independently selected from 0, 1, 2, and 3.
The compound represented by Formula 601 and the compound represented by Formula 602 may be each independently selected from Compounds ET1 to ET15:
ET1
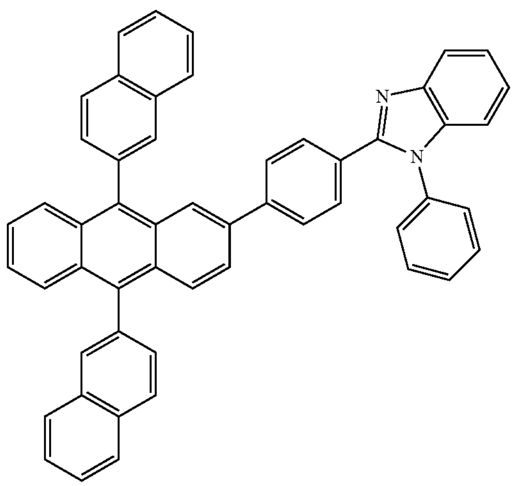
ET2
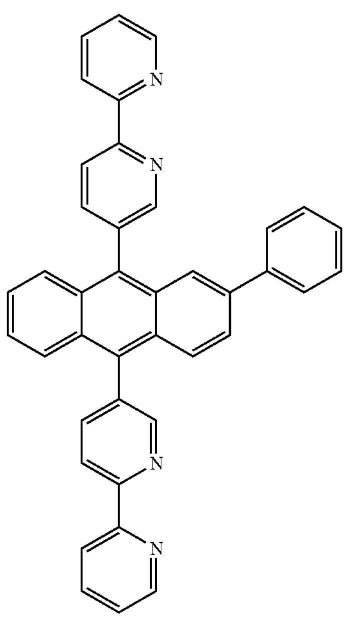
-continued
ET3
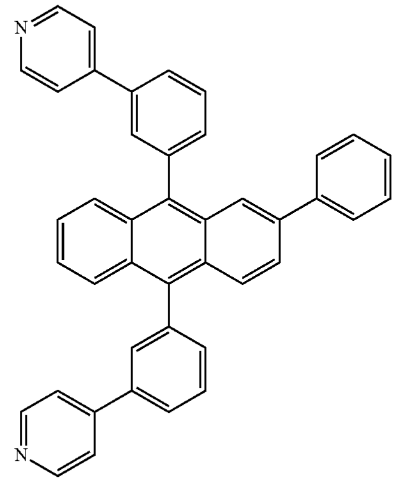
ET4
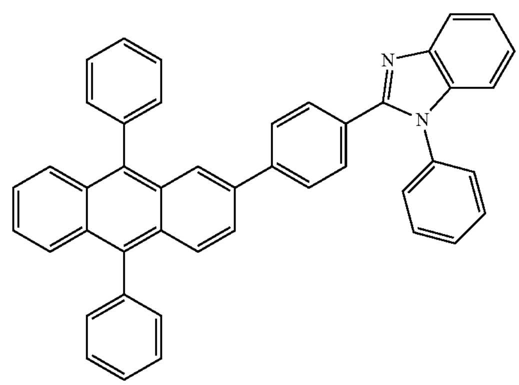
ET5
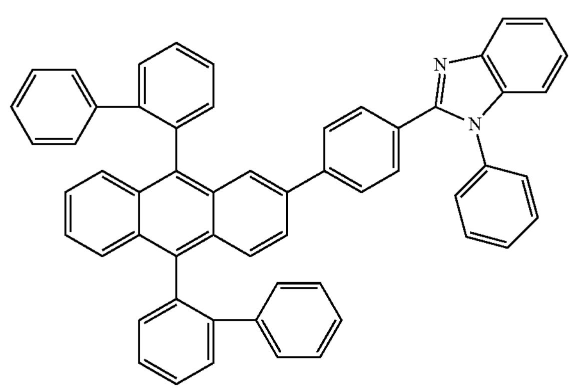

ET6
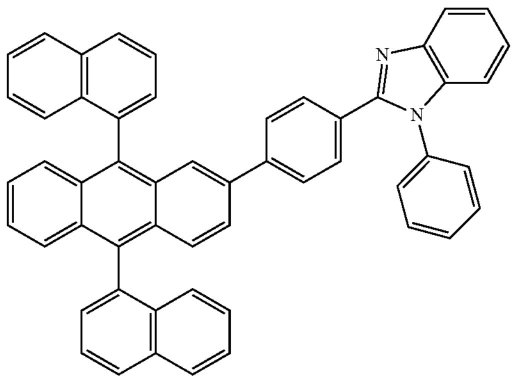
ET7
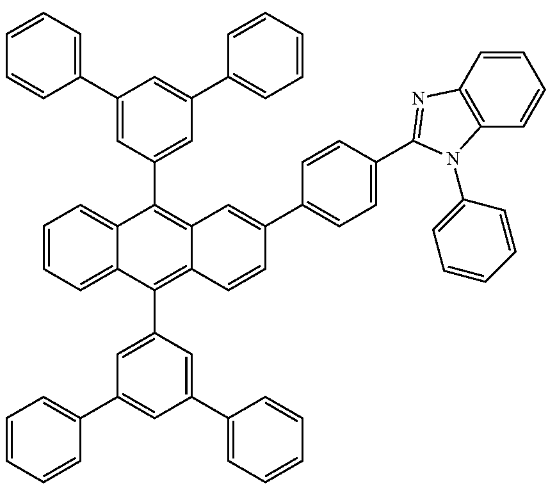
ET8
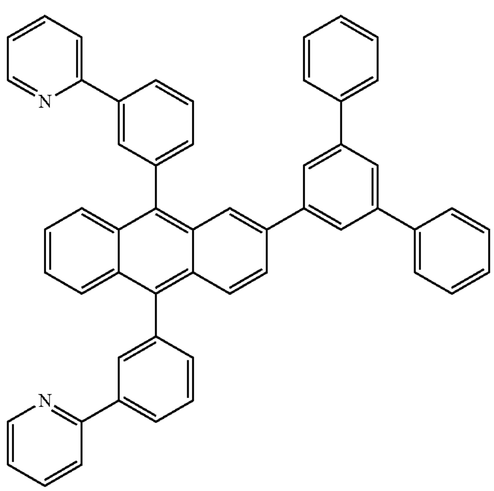
ET9
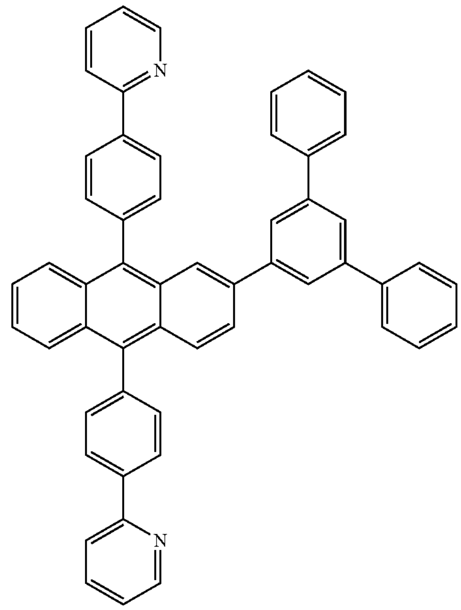
ET10
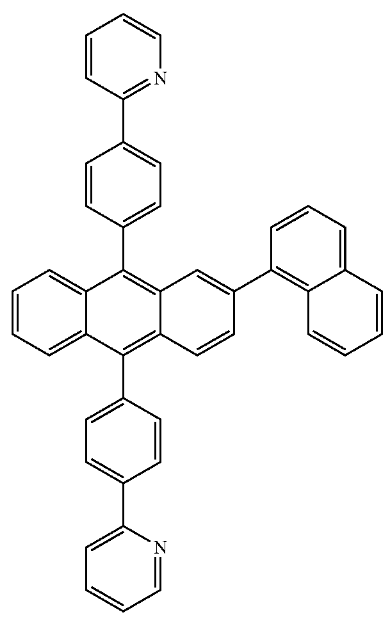

-continued

ET11

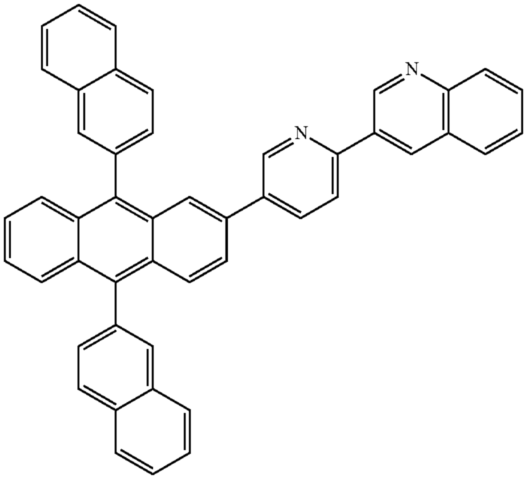

ET12

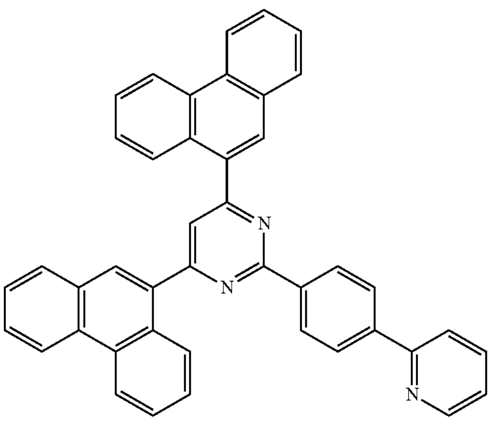

ET13

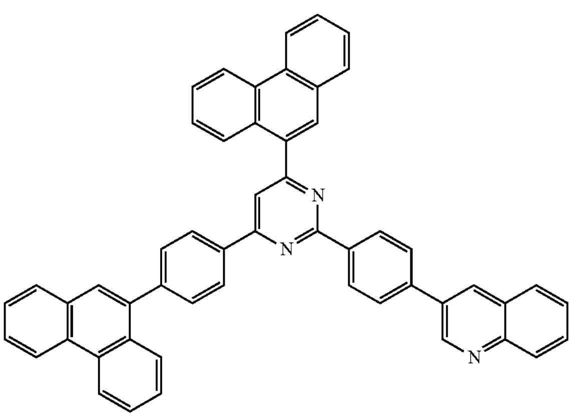

-continued

ET14

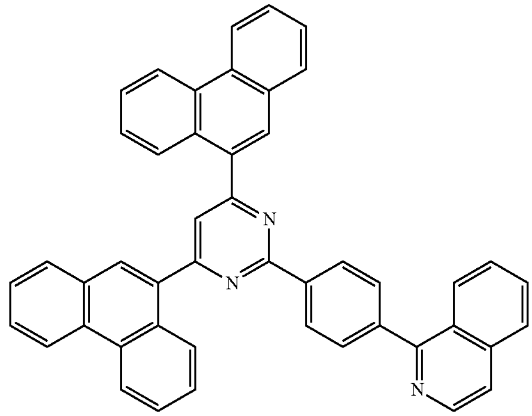

ET15

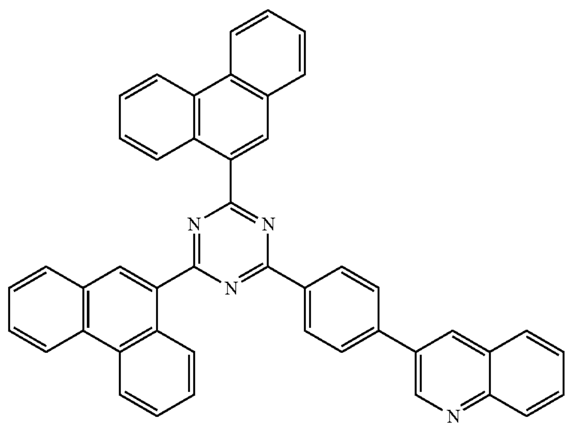

A thickness of the electron transport layer may be in a range of about 100 Å to about 1,000 Å, for example, about 150 Å to about 500 Å. When the thickness of the electron transport layer is within any of these ranges, excellent electron transport characteristics of the electron transport layer may be obtained without a substantial increase in driving voltage.

In some embodiments, the electron transport layer may further include a metal-containing material, in addition to the materials described above.

The metal-containing material may include a Li complex. The Li complex may include, for example, Compound ET-D1 (lithium quinolate, LiQ) and/or ET-D2.

ET-D1

-continued

ET-D2

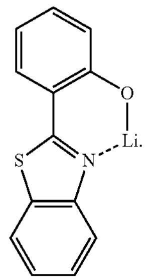

The electron transport region may include an electron injection layer that facilitates electron injection from the second electrode 190.

The electron injection layer may be formed on the electron transport layer by one or more suitable methods, such as vacuum deposition, spin coating, casting, an LB method, inkjet printing, laser printing, and/or LITI. When an electron injection layer is formed by vacuum deposition and/or spin coating, vacuum deposition and coating conditions for the electron injection layer may be similar to the vacuum deposition and coating conditions for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of these ranges, satisfactory electron injection characteristics of the electron injection layer may be obtained without a substantial increase in driving voltage.

The second electrode 190 may be positioned on the electron transport region 170. The second electrode 190 may be a cathode that is an electron injection electrode. A second electrode material for forming the second electrode 190 may be a material having a low work function such as a metal, an alloy, an electrically conductive compound, or a mixture thereof. Non-limiting examples of the second electrode material may include lithium (Li), magnesium (Mg), aluminum (Al), aluminum-lithium (Al—Li), calcium (Ca), magnesium-indium (Mg—In), and magnesium-silver (Mg—Ag). In some embodiments, the second electrode material may be ITO and/or IZO. The second electrode 190 may be a reflective electrode, a semi-transmissive electrode, or a transmissive electrode.

Hereinbefore, the organic light-emitting device 10 has been described with reference to the drawing, but embodiments of the present invention are not limited thereto.

The term "$C_1$-$C_{60}$ alkyl group" used herein refers to a linear or branched aliphatic monovalent hydrocarbon group having 1 to 60 carbon atoms in the main chain. Non-limiting examples of the $C_1$-$C_{60}$ alkyl group may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" used herein refers to a divalent group having a same structure as the $C_1$-$C_{60}$ alkyl group.

The term "$C_1$-$C_{60}$ alkoxy group" used herein refers to a monovalent group represented by —$OA_{101}$ (where $A_{101}$ is the $C_1$-$C_{60}$ alkyl group). Non-limiting examples of the $C_1$-$C_{60}$ alkoxy group may include a methoxy group, an ethoxy group, and an isopropyloxy group.

The term "$C_2$-$C_{60}$ alkenyl group" used herein refers to a hydrocarbon group including at least one carbon-carbon double bond at one or more positions along a carbon chain of the $C_2$-$C_{60}$ alkyl group (e.g., in the middle or at either terminal end of the $C_2$-$C_{60}$ alkyl group). Non-limiting examples of the $C_2$-$C_{60}$ alkenyl group may include an ethenyl group, a propenyl group, and a butenyl group. The term "$C_2$-$C_{60}$ alkenylene group" used herein refers to a divalent group having the same structure as the $C_2$-$C_{60}$ alkenyl group.

The term "$C_2$-$C_{60}$ alkynyl group" used herein refers to a hydrocarbon group including at least one carbon-carbon triple bond at one or more positions along a carbon chain of the $C_2$-$C_{60}$ alkyl group (e.g., in the middle or at either terminal end of the $C_2$-$C_{60}$ alkyl group). Non-limiting examples of the $C_2$-$C_{60}$ alkynyl group may include an ethynyl group and a propynyl group. The term "$C_2$-$C_{60}$ alkynylene group" used herein refers to a divalent group having the same structure as the $C_2$-$C_{60}$ alkynyl group.

The term "$C_3$-$C_{10}$ cycloalkyl group" used herein refers to a monovalent monocyclic saturated hydrocarbon group including 3 to 10 carbon atoms as ring-forming atoms. Non-limiting examples of the $C_3$-$C_{10}$ cycloalkyl group may include a cyclopropyl group, a cyclobutyl group, a cyclopentyl group, a cyclohexyl group, and a cycloheptyl group. The term "$C_3$-$C_{10}$ cycloalkylene group" used herein refers to a divalent group having the same structure as the $C_3$-$C_{10}$ cycloalkyl group.

The term "$C_1$-$C_{10}$ heterocycloalkyl group" used herein refers to a monovalent monocyclic group including at least one heteroatom selected from N, O, Si, P, and S as a ring-forming atom and 1 to 10 carbon atoms as the remaining ring-forming atoms. Non-limiting examples of the $C_1$-$C_{10}$ heterocycloalkyl group may include a tetrahydrofuranyl group and a tetrahydrothiophenyl group. The term "$C_1$-$C_{10}$ heterocycloalkylene group" used herein refers to a divalent group having the same structure as the $C_1$-$C_{10}$ heterocycloalkyl group.

The term "$C_3$-$C_{10}$ cycloalkenyl group" used herein refers to a monovalent monocyclic group including 3 to 10 carbon atoms as ring-forming atoms and at least one double bond in the ring of the $C_3$-$C_{10}$ cycloalkenyl group, that does not have aromaticity. Non-limiting examples of the $C_3$-$C_{10}$ cycloalkenyl group may include a cyclopentenyl group, a cyclohexenyl group, and a cycloheptenyl group. The term "$C_3$-$C_{10}$ cycloalkenylene group" used herein refers to a divalent group having the same structure as the $C_3$-$C_{10}$ cycloalkenyl group.

The term "$C_1$-$C_{10}$ heterocycloalkenyl group" used herein refers to a monovalent monocyclic group including at least one heteroatom selected from N, O, Si, P, and S as a ring-forming atom, 1 to 10 carbon atoms as the remaining ring-forming atoms, and at least one double bond in its ring. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group" used herein refers to a divalent group having the same structure as the $C_1$-$C_{10}$ heterocycloalkenyl group.

The term "$C_6$-$C_{60}$ aryl group" used herein refers to a monovalent group including a carbocyclic aromatic system having 6 to 60 carbon atoms as ring-forming atoms, and a $C_6$-$C_{60}$ arylene group used herein refers to a divalent group including a carbocyclic aromatic system having 6 to 60 carbon atoms as ring-forming atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include two or more rings, the respective rings may be fused to each other.

The term "$C_6$-$C_{60}$ heteroaryl group" used herein refers to a monovalent group having a carbocyclic aromatic system including at least one heteroatom selected from N, O, P, and S as a ring-forming atom and 1 to 60 carbon atoms as the remaining ring-forming atoms. The term "$C_1$-$C_{60}$ heteroarylene group" used herein refers to a divalent group having a carbocyclic aromatic system including at least one heteroatom selected from N, O, Si, P, and S as a ring-forming atom and 1 to 60 carbon atoms as the remaining ring-forming atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include two or more rings, the respective rings may be fused to each other.

The term "$C_6$-$C_{60}$ aryloxy group" used herein refers to a monovalent group represented by —$OA_{102}$ (where $A_{102}$ is the $C_6$-$C_{60}$ aryl group), and the TERM "$C_6$-$C_{60}$ arylthio group" used herein refers to a monovalent group represented by —$SA_{103}$ (where $A_{103}$ is the $C_6$-$C_{60}$ aryl group).

The term "monovalent non-aromatic condensed polycyclic group" used herein refers to a monovalent group that has two or more rings condensed to each other, only carbon atoms as ring-forming atoms (for example, having 8 to 60 carbon atoms), and does not have overall aromaticity. Non-limiting example of the monovalent non-aromatic condensed polycyclic group may include a fluorenyl group. A divalent non-aromatic condensed polycyclic group used herein refers to a divalent group having the same structure as the monovalent non-aromatic condensed polycyclic group.

The term "monovalent non-aromatic condensed heteropolycyclic group" used herein refers to a monovalent group that has two or more rings condensed to each other, has at least one heteroatom selected from N, O, Si, P, and S as a ring-forming atom, and carbon atoms as the remaining ring-forming atoms (for example, having 1 to 60 carbon atoms), and does not have overall aromaticity. A non-limiting example of the monovalent non-aromatic condensed heteropolycyclic group may include a carbazolyl group. The term "divalent non-aromatic condensed heteropolycyclic group" used herein refers to a divalent group having the same structure as the monovalent non-aromatic condensed heteropolycyclic group.

As used herein, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{11})(Q_{12})(Q_{13})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{21})(Q_{22})(Q_{23})$; and —$Si(Q_{31})(Q_{32})(Q_{33})$, where $Q_{11}$ to $Q_{13}$, $Q_{21}$ to $Q_{23}$, and $Q_{31}$ to $Q_{33}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

As used herein, the expression "Ph" denotes a phenyl group, the expression "Me" denotes a methyl group, the expression "Et" denotes an ethyl group, and the expression "ter-Bu" or "$Bu^t$" denotes a tert-butyl group.

Hereinafter, compounds according to embodiments of the present invention and an organic light-emitting device including the compounds are described in more detail with reference to Synthesis Examples and Examples. However, embodiments of the present invention are not limited thereto. The expression "B was used instead of A" used in describing Synthesis Examples indicates that a molar equivalent of A was identical to a molar equivalent of B.

EXAMPLES

Example 1

An indium tin oxide (ITO) glass substrate (available from Corning Inc.) at a thickness of 15 $\Omega/cm^2$ (500 Å) was cut to a size of 50 mm×50 mm×0.5 mm, sonicated in isopropyl alcohol and pure water for 10 minutes each, and then cleaned with UV and ozone for 10 minutes.

2-TNATA (available from Duksan Hi-Metal Co Ltd) was vacuum-deposited on the prepared ITO glass substrate (here, the anode) to form a hole injection layer having a thickness of 600 Å, and Compound 587 (available from Duksan Hi-Metal Co Ltd) was vacuum-deposited on the hole injection layer to form an electron blocking layer having a thickness of 300 Å, thereby forming a hole transport region.

Compound 108B (available from Shinil Steel Co. Ltd.) and Compound 426B (available from Toray Industries, Inc.), as a host, and PD75 (available from Universal Display Corporation), as a dopant, were co-deposited at a weight ratio of 50:50:10 to form an emission layer having a thickness of 400 Å. Then, Alq3 was deposited on the emission layer to form an electron transport layer having a thickness of 300 Å, and an Al cathode having a thickness of 2000 Å was formed on the electron transport layer, thereby completing the manufacture of an organic light-emitting device.

Examples 2 to 16 and Comparative Examples 1 to 4

Organic light-emitting devices were manufactured in the same (or substantially the same) manner as in Example 1, except that materials for the host and the electron blocking layer were changed according to Table 1.

Evaluation Example 1

Driving voltages, current densities, efficiencies, and lifespans ($T_{97}$) of the organic light-emitting devices prepared in Examples 1 to 16 and Comparative Examples 1 to 4 were evaluated using Keithley SMU 236 and a luminance meter PR650. The results are shown in Table 1. The lifespan ($T_{97}$) is defined as the time for the luminance of an organic light-emitting device to decline to 97% of its initial luminance.

TABLE 1

| | Emission layer host | | Material for electron blocking layer | Driving voltage (V) | Current density ($mA/cm^2$) | Efficiency (cd/A) | Lifespan ($T_{97}$) (hr) |
|---|---|---|---|---|---|---|---|
| Example 1 | Compound 108B | Compound 426B | Compound 587 | 4.5 | 10 | 101.5 | 153 |
| Example 2 | Compound 108B | Compound 426B | Compound 660 | 4.6 | 10 | 100.2 | 145 |
| Example 3 | Compound 108B | Compound 426B | Compound 710 | 4.8 | 10 | 103.4 | 140 |
| Example 4 | Compound 108B | Compound 426B | Compound 682 | 4.7 | 10 | 98.9 | 143 |
| Example 5 | Compound 103B | Compound 319B | Compound 587 | 4.7 | 10 | 102.5 | 161 |
| Example 6 | Compound 103B | Compound 319B | Compound 660 | 4.7 | 10 | 102.7 | 169 |
| Example 7 | Compound 103B | Compound 319B | Compound 710 | 4.9 | 10 | 104.5 | 172 |
| Example 8 | Compound 103B | Compound 319B | Compound 682 | 4.9 | 10 | 101.6 | 146 |
| Example 9 | Compound 121A | Compound 373A | Compound 587 | 4.4 | 10 | 99.8 | 157 |
| Example 10 | Compound 121A | Compound 373A | Compound 660 | 4.5 | 10 | 97.5 | 152 |
| Example 11 | Compound 121A | Compound 373A | Compound 710 | 4.6 | 10 | 100.6 | 178 |
| Example 12 | Compound 121A | Compound 373A | Compound 682 | 4.5 | 10 | 101.5 | 154 |
| Example 13 | Compound 140A | Compound 310A | Compound 587 | 4.6 | 10 | 103.7 | 167 |
| Example 14 | Compound 140A | Compound 310A | Compound 660 | 4.7 | 10 | 105.6 | 148 |
| Example 15 | Compound 140A | Compound 310A | Compound 710 | 4.8 | 10 | 104.3 | 157 |
| Example 16 | Compound 140A | Compound 310A | Compound 682 | 4.7 | 10 | 104.9 | 144 |
| Comparative Example 1 | Compound 108B | Compound 426B | NPB | 4.3 | 10 | 87.4 | 47 |

TABLE 1-continued

| | Emission layer host | | Material for electron blocking layer | Driving voltage (V) | Current density (mA/cm$^2$) | Efficiency (cd/A) | Lifespan ($T_{97}$) (hr) |
|---|---|---|---|---|---|---|---|
| Comparative Example 2 | Compound 103B | Compound 319B | NPB | 4.4 | 10 | 86.7 | 68 |
| Comparative Example 3 | Compound 121A | Compound 373A | NPB | 4.3 | 10 | 90.2 | 54 |
| Comparative Example 4 | Compound 140A | Compound 310A | NPB | 4.3 | 10 | 88.5 | 58 |

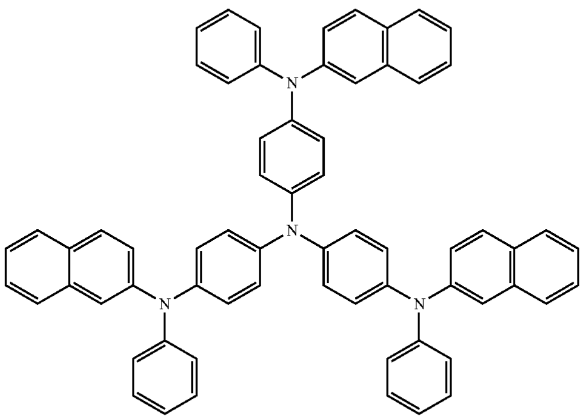

2-TNATA

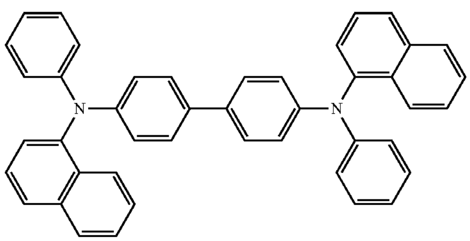

NPB

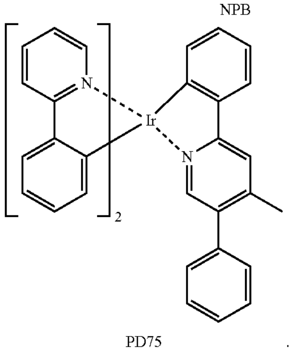

PD75 .

Referring to Table 1, the organic light-emitting devices of Examples 1 to 16 had better efficiency and lifespan characteristics than the organic light-emitting devices of Comparative Examples 1 to 4.

According to one or more embodiments of the present invention, an organic light-emitting device including the compounds represented by Formulae 1, 2-1 to 2-5, and 3 may have high efficiency and a long lifespan.

As used herein, the terms "use," "using," and "used" may be considered synonymous with the terms "utilize," "utilizing," and "utilized," respectively.

In addition, as used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer comprises a first material represented by Formula 1 and a second material represented by any one of Formulae 2-1 to 2-5, and the hole transport region comprises a third material represented by Formula 3:

Formula 1

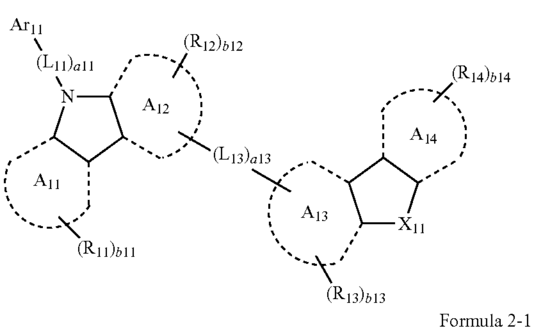

Formula 2-1

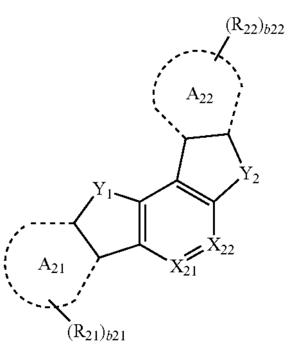

-continued

Formula 2-2

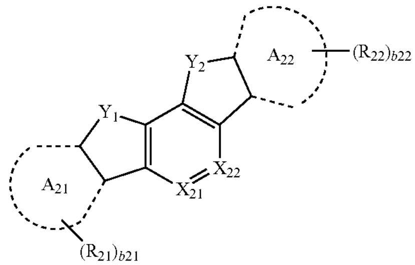

Formula 2-3

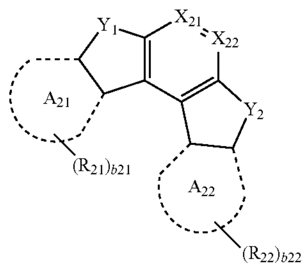

Formula 2-4

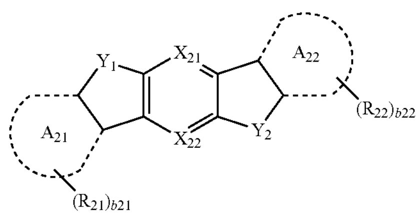

Formula 2-5

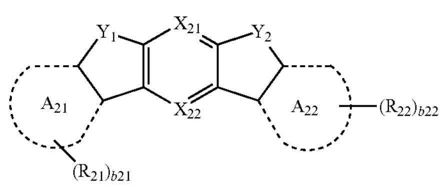

Formula 3

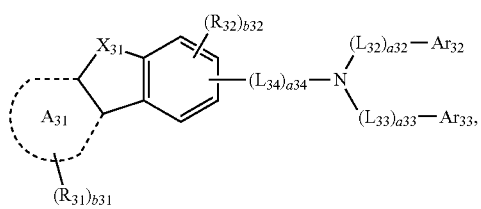

wherein, in Formulae 2-1 and 2-3 to 2-5, $A_{21}$ and $A_{22}$ are each independently selected from among a quinoline, an isoquinoline, 2,6-naphthyridine, 1,8-naphthyridine, 1,5-naphthyridine, 1,6-naphthyridine, 1,7-naphthyridine, 2,7-naphthyridine, a quinoxaline, a phthalazine, a quinazoline, and a cinnoline;

wherein, in Formula 2-2, $A_{21}$ and $A_{22}$ are each independently selected from among 2,6-naphthyridine, 1,8-naphthyridine, 1,5-naphthyridine, 1,6-naphthyridine, 1,7-naphthyridine, 2,7-naphthyridine, a phthalazine, and a cinnoline;

wherein, in Formulae 1, 2-1 to 2-5, and 3, $A_{11}$ to $A_{14}$, and $A_{31}$ are each independently selected from a benzene, a naphthalene, a pyridine, a pyrimidine, a quinoline, an isoquinoline, 2,6-naphthyridine, 1,8-naphthyridine, 1,5-naphthyridine, 1,6-naphthyridine, 1,7-naphthyridine, 2,7-naphthyridine, a quinoxaline, a phthalazine, a quinazoline, and a cinnoline;

$X_{11}$ is selected from O, S, $N[(L_{12})_{a12}\text{-}Ar_{12}]$, $C(R_{15})(R_{16})$, $Si(R_{15})(R_{16})$, $P[(L_{12})_{a12}\text{-}Ar_{12}]$, $B[(L_{12})_{a12}\text{-}Ar_{12}]$, and $P(=O)[(L_{12})_{a12}\text{-}Ar_{12}]$;

$X_{21}$ is $C(R_{23})$ or N;

$X_{22}$ is $C(R_{24})$ or N;

$Y_1$ is $N[(L_{21})_{a21}\text{-}Ar_{21}]$;

$Y_2$ is selected from $N[(L_{22})_{a22}\text{-}Ar_{22}]$, O, S, and $Si(R_{25})(R_{26})$;

$X_{31}$ is selected from O, S, and $N[(L_{31})_{a31}\text{-}Ar_{31}]$;

$L_{11}$ to $L_{13}$, $L_{21}$, $L_{22}$, and $L_{31}$ to $L_{34}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a31 to a34 are each independently selected from 0, 1, 2, and 3, and when all is 2 or greater, two or more $L_{11}$s are identical to or different from each other, when a12 is 2 or greater, two or more $L_{12}$s are identical to or different from each other, when a13 is 2 or greater, two or more $L_{13}$s are identical to or different from each other, when a21 is 2 or greater, two or more $L_{21}$s are identical to or different from each other, when a22 is 2 or greater, two or more $L_{22}$s are identical to or different from each other, when a31 is 2 or greater, two or more $L_{31}$s are identical to or different from each other, when a32 is 2 or greater, two or more $L_{32}$s are identical to or different from each other, when a33 is 2 or greater, two or more $L_{33}$s are identical to or different from each other, and when a34 is 2 or greater, two or more $L_{34}$s are identical to or different from each other;

$Ar_{11}$ and $Ar_{12}$ are each independently $HT_2$, and $Ar_{21}$ and $Ar_{22}$ are each independently selected from:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, $-Si(Q_{31})(Q_{32})(Q_{33})$, $-B(Q_{34})(Q_{35})$, and $-N(Q_{36})(Q_{37})$; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group, each substituted with at least one selected from a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{21})(Q_{22})(Q_{23})$, —$B(Q_{24})(Q_{25})$, and —$N(Q_{26})(Q_{27})$, provided that when $A_{11}$ to $A_{14}$ are each independently selected from a benzene, a naphthalene, and a pyridine, $Ar_{11}$ and $Ar_{12}$ are each independently selected from a pentalenyl group, an indenyl group, an azulenyl group, a heptalenyl group, an indacenyl group, an acenaphthyl group, a benzofluorenyl group, a dibenzofluorenyl group, a phenalenyl group, an anthracenyl group, a pyrenyl group, a naphthacenyl group, a picenyl group, a perylenyl group, a pentaphenyl group, a hexacenyl group, a pentacenyl group, a rubicenyl group, a coronenyl group, an ovalenyl group, a benzothiophenyl group, a benzocarbazolyl group, a dibenzocarbazolyl group, and a dibenzosilolyl group;

a pentalenyl group, an indenyl group, an azulenyl group, a heptalenyl group, an indacenyl group, an acenaphthyl group, a benzofluorenyl group, a dibenzofluorenyl group, a phenalenyl group, an anthracenyl group, a pyrenyl group, a naphthacenyl group, a picenyl group, a perylenyl group, a pentaphenyl group, a hexacenyl group, a pentacenyl group, a rubicenyl group, a coronenyl group, an ovalenyl group, a benzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —$Si(Q_{31})(Q_{32})(Q_{33})$, —$B(Q_{34})(Q_{35})$, and —$N(Q_{36})(Q_{37})$;

a pentalenyl group, an indenyl group, an azulenyl group, a heptalenyl group, an indacenyl group, an acenaphthyl group, a benzofluorenyl group, a dibenzofluorenyl group, a phenalenyl group, an anthracenyl group, a pyrenyl group, a naphthacenyl group, a picenyl group, a perylenyl group, a pentaphenyl group, a hexacenyl group, a pentacenyl group, a rubicenyl group, a coronenyl group, an ovalenyl group, a benzothiophenyl group, a benzocarbazolyl group, a dibenzocarbazolyl group, and a dibenzosilolyl group, each substituted with a phenyl group substituted with at least one selected from a $C_1$-$C_{20}$ alkyl group and a phenyl group; and —$Si(Q_1)(Q_2)(Q_3)$, —$B(Q_4)(Q_5)$, and —$N(Q_6)(Q_7)$;

$Ar_{31}$ to $Ar_{33}$ are each independently $HT_2$;

wherein $HT_2$ is a hole transport group;

$R_{11}$ to $R_{16}$, $R_{21}$ to $R_{26}$, $R_{31}$, and $R_{32}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_4)(Q_5)$, and —$N(Q_6)(Q_7)$;

$R_{15}$ and $R_{16}$ are optionally linked to each other to form a saturated or unsaturated ring;

b11 to b14, b31, and b32 are each independently selected from 0, 1, 2, and 3;

b21 and b22 are each 0; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-Coo arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, wherein the third material represented by Formula 3 is represented by any one of Formulae 3A to 3D, Formula 3A

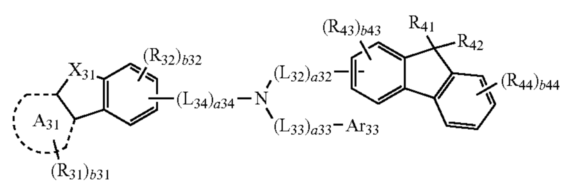

-continued

Formula 3B

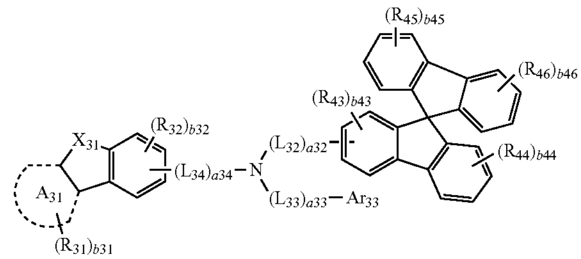

Formula 3C

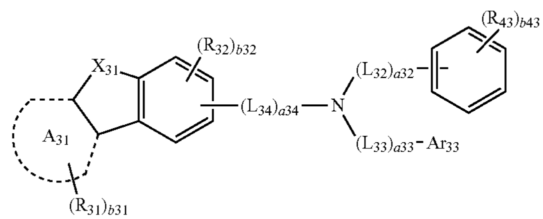

Formula 3D

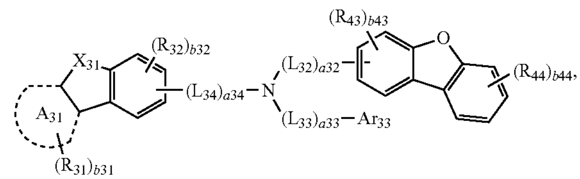

in Formulae 3A to 3D, $A_{31}$, $X_{31}$, $L_{32}$ to $L_{34}$, a32 to a34, $Ar_{33}$, $R_{31}$, $R_{32}$, b31, and b32 are the same as defined in Formula 3, $R_{41}$ to $R_{46}$ are each independently the same as $R_{31}$ defined in Formula 3, and b43 to b46 are each independently the same as b31 defined in Formula 3 except for the following:

in Formulae 3A and 3C, $X_{31}$ is S or $N[(L_{31})_{a31}$-$Ar_{31}]$, and when $Ar_{33}$ is a substituted or unsubstituted heterocyclic group, the heterocyclic group comprises N or S; and in Formula 3D, $X_{31}$ is S, and when $Ar_{33}$ is a substituted or unsubstituted heterocyclic group, the heterocyclic group comprises S.

2. The organic light-emitting device of claim 1, wherein $A_{11}$ to $A_{14}$ are each independently selected from a benzene, a naphthalene, a pyridine, an isoquinoline, and a quinoxaline, $A_{31}$ is selected from a benzene and a naphthalene, the second material is represented by any one selected from among Formulae 2-1 and 2-3 to 2-5, and $A_{21}$ is selected from an isoquinoline and a quinoxaline.

3. The organic light-emitting device of claim 1, wherein $A_{11}$ is selected from a benzene, a naphthalene, a pyridine, an isoquinoline, and a quinoxaline, $A_{12}$ to $A_{14}$, and $A_{31}$ are each independently selected from a benzene and a naphthalene, the second material is represented by any one selected from among Formulae 2-1 and 2-3 to 2-5, and $A_{21}$ is selected from an isoquinoline and a quinoxaline.

4. The organic light-emitting device of claim 1, wherein, in Formulae 2-1 to 2-5, $X_{21}$ is $C(R_{23})$ and $X_{22}$ is $C(R_{24})$.

5. The organic light-emitting device of claim 1, wherein, in Formulae 1, 2-1 to 2-5, and 3, $L_{11}$ to $L_{13}$ are each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthryl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, and a quinazolinyl group, and $L_{21}$, $L_{22}$, and $L_{31}$ to $L_{34}$ are each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$), wherein $Q_{31}$ to $Q_{33}$ are each independently selected from a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group.

6. The organic light-emitting device of claim 1, wherein, in Formulae 1, 2-1 to 2-5, and 3, $L_{11}$ to $L_{13}$ are each independently selected from groups represented by Formulae 3-1 to 3-34, and $L_{21}$, $L_{22}$, and $L_{31}$ to $L_{34}$ are each independently selected from groups represented by Formulae 3-1 to 3-10, 3-26 to 3-28, 3-32, and 3-33:

3-1

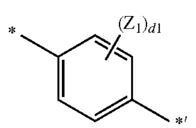

3-2

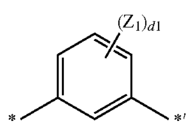

3-3

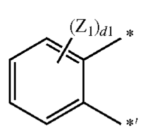

3-4

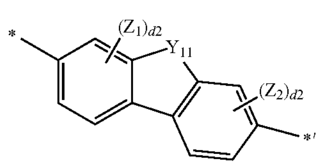

3-5

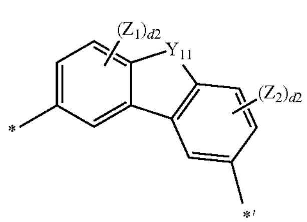

-continued 3-6

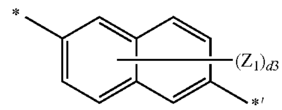

3-7

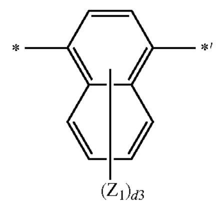

3-8

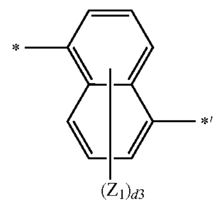

3-9

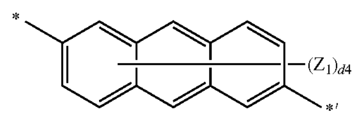

3-10

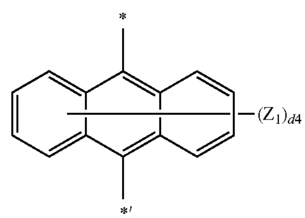

3-11

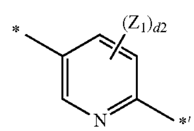

3-12

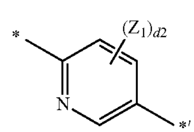

3-13

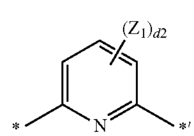

3-14

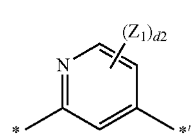

3-15

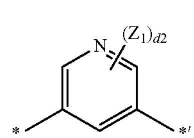

-continued
3-16
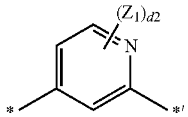
3-17
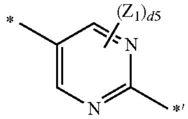
3-18
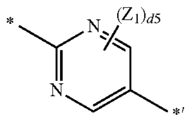
3-19
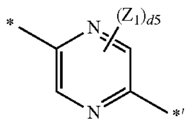
3-20
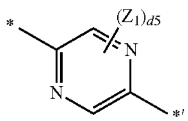
3-21
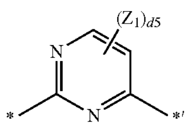
3-22
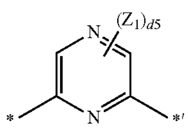
3-23
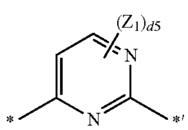
3-24
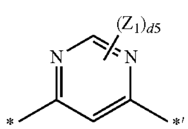
3-25
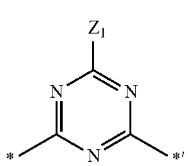
3-26
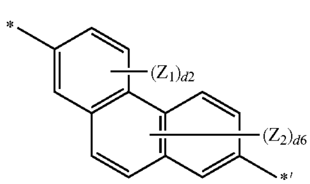
-continued
3-27
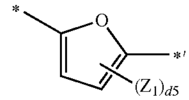
3-28
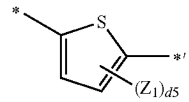
3-29
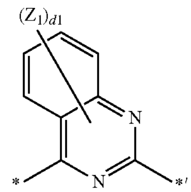
3-30
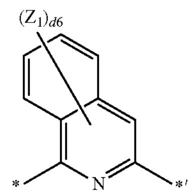
3-31
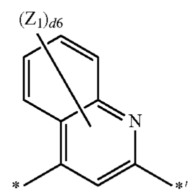
3-32
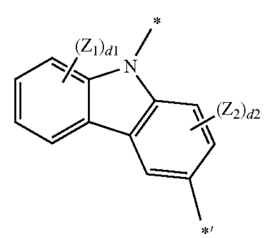
3-33
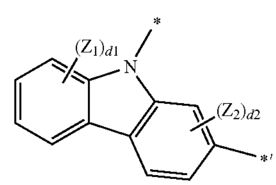
3-34
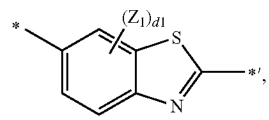
wherein, in Formulae 3-1 to 3-34,
$Y_{11}$ is selected from O, S, S(=O), S(=O)$_2$, C($Z_3$)($Z_4$), N($Z_5$), and Si($Z_6$)($Z_7$);
$Z_1$ to $Z_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthryl group, a pyrenyl group, a phenanthrenyl group, a fluorenyl group, a carbazolyl group, a benzocarbazolyl group, and a dibenzocarbazolyl group;

d1 is an integer selected from 1 to 4; d2 is an integer selected from 1 to 3; d3 is an integer selected from 1 to 6; d4 is an integer selected from 1 to 8; d5 is 1 or 2; d6 is an integer selected from 1 to 5; and * and *' are each independently a binding site to a neighboring atom.

7. The organic light-emitting device of claim 1, wherein $Ar_{21}$ and $Ar_{22}$ are each independently selected from:

101A

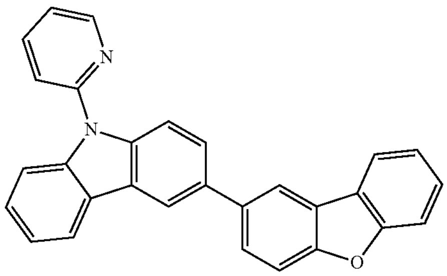

102A

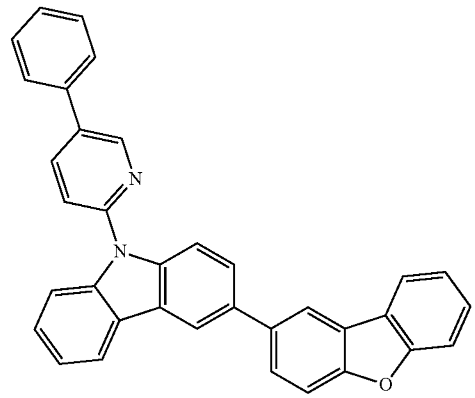

103A

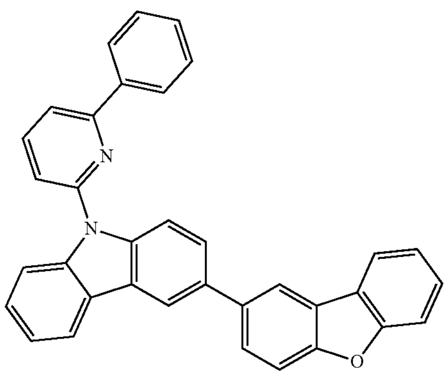

104A

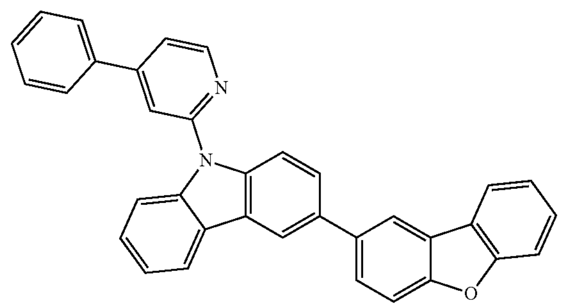

105A

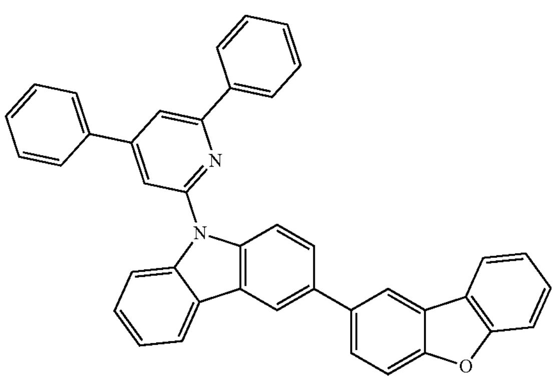

106A

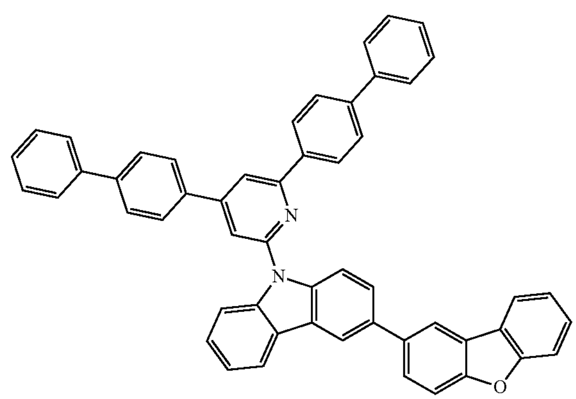

-continued
107A
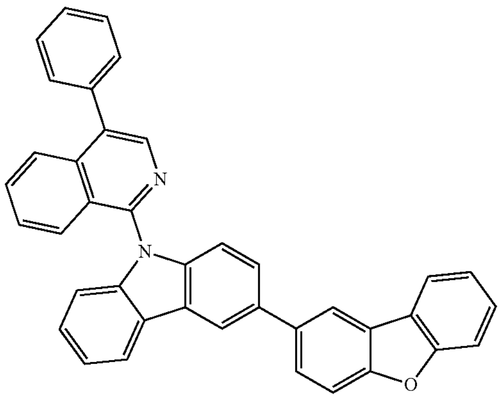
108A
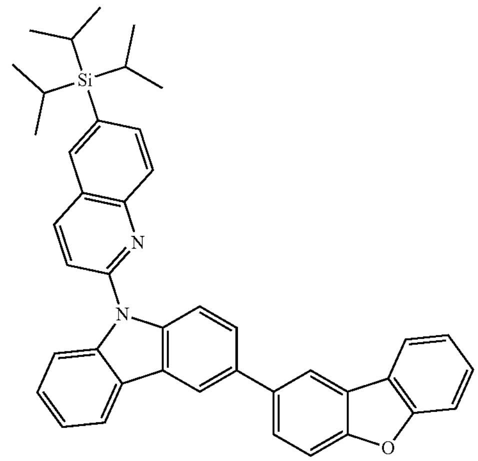
109A
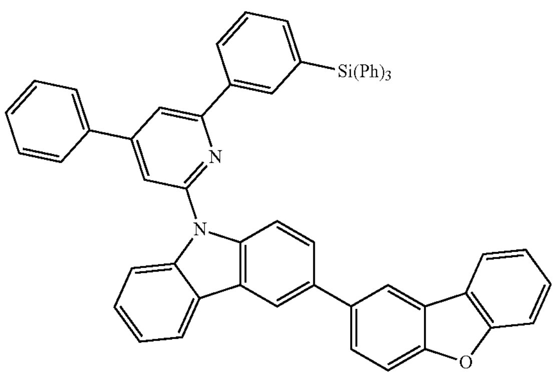
110A
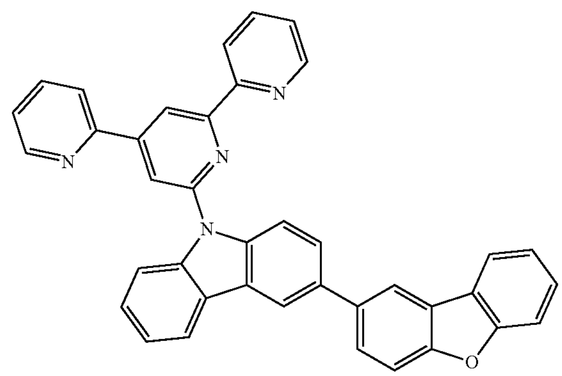
111A
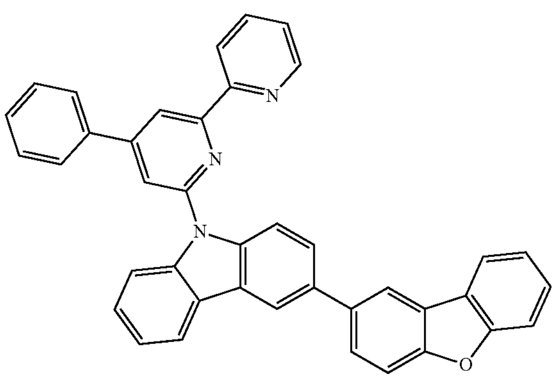
112A
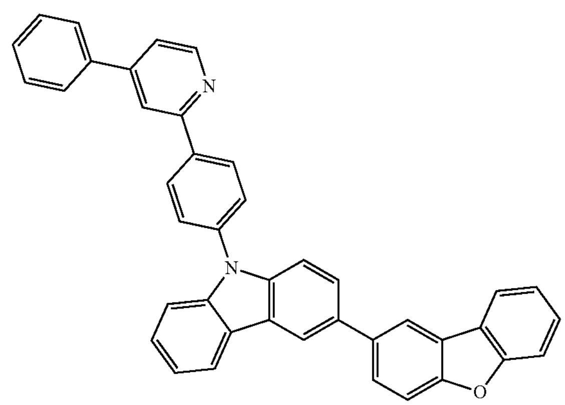

-continued
113A
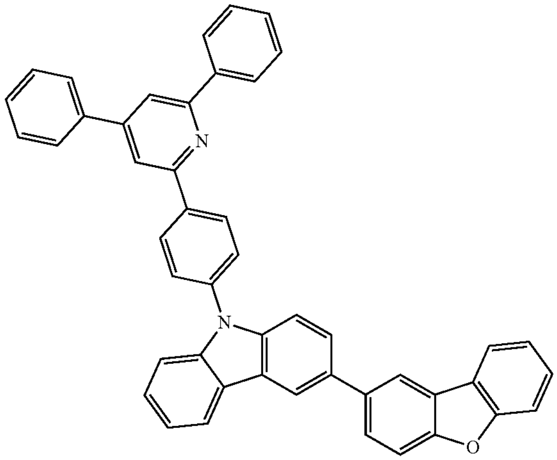
114A
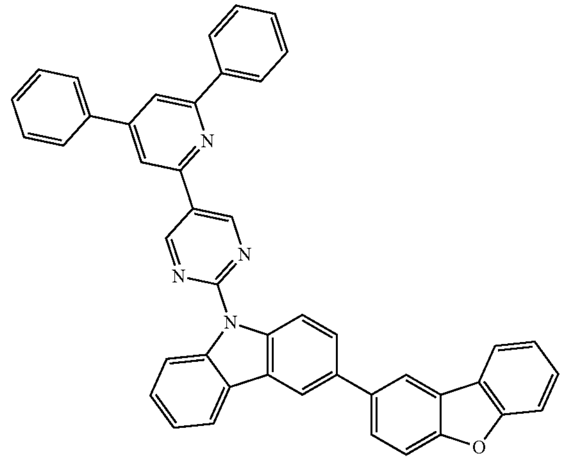
115A
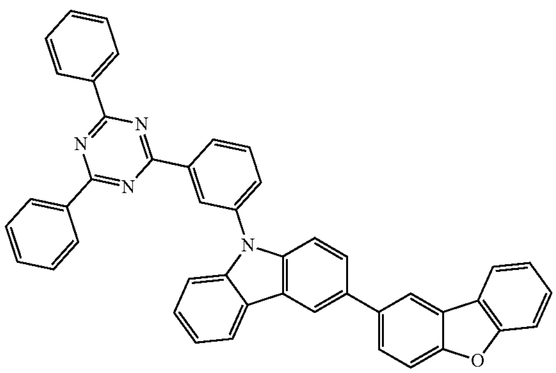
116A
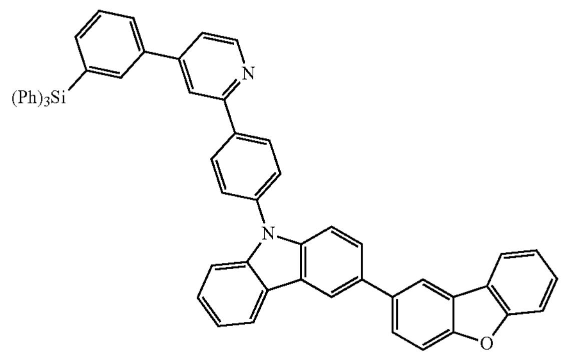
117A
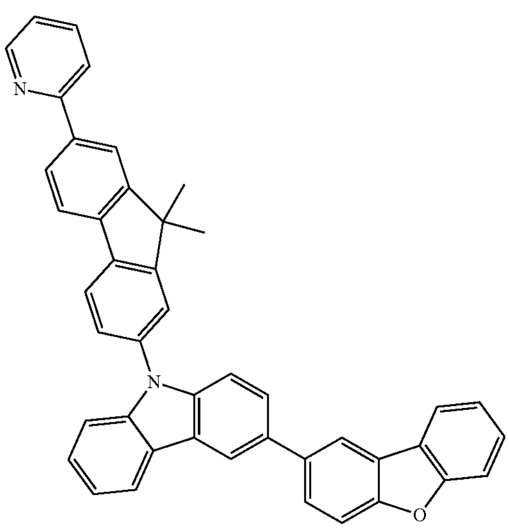
118A
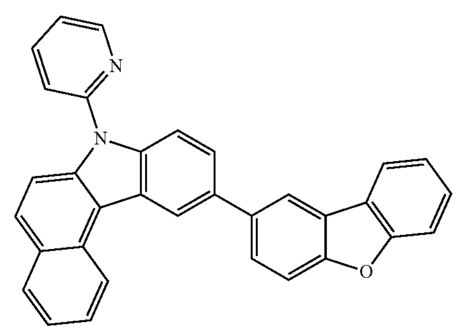

-continued
119A
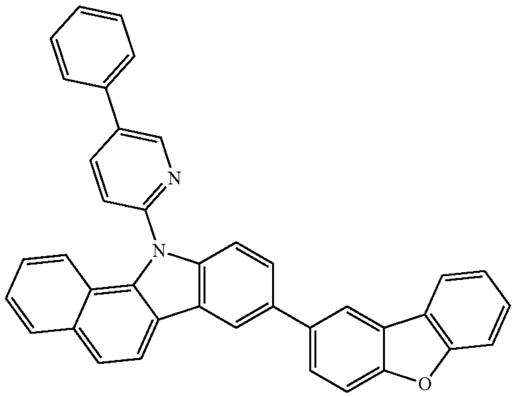
120A
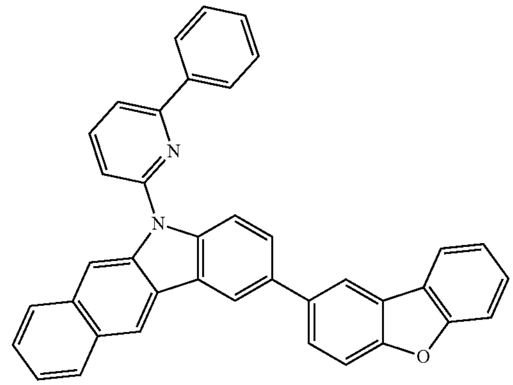
121A
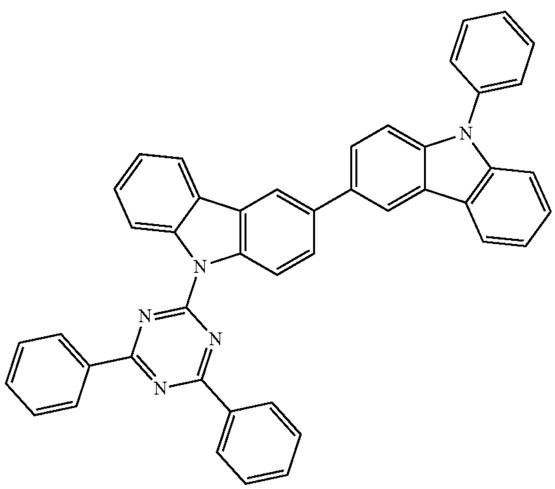
123A
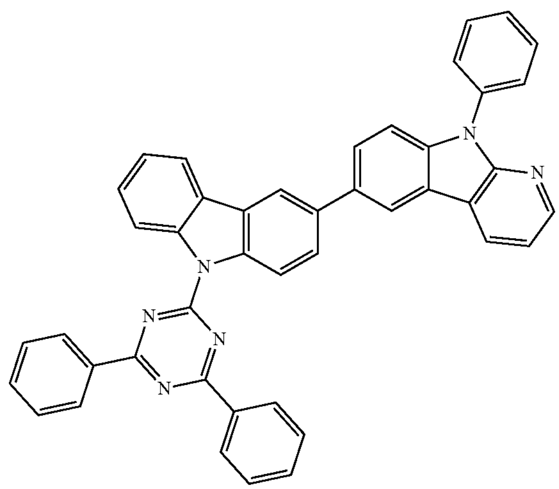
124A
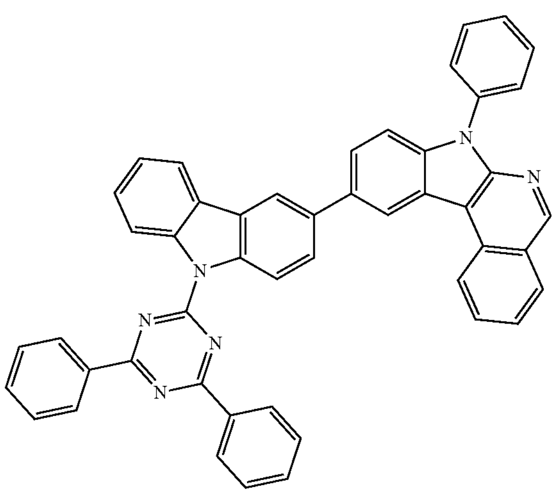
125A
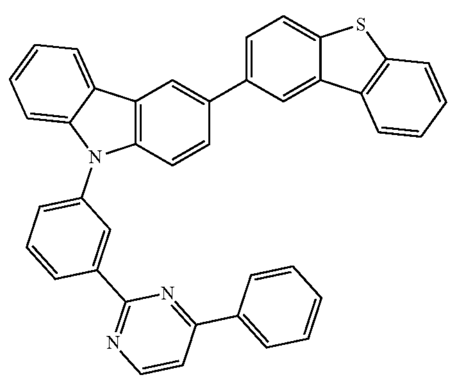

-continued
126A
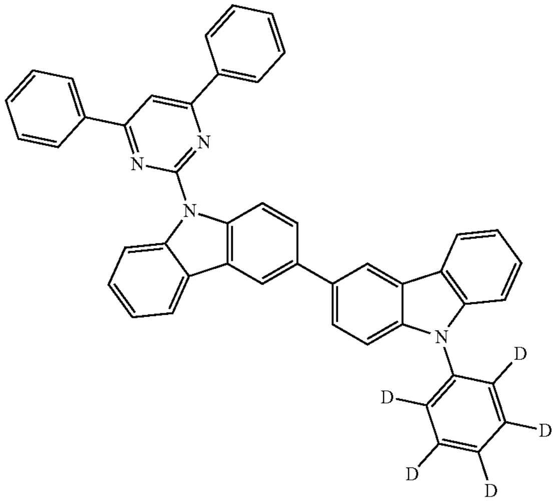
127A
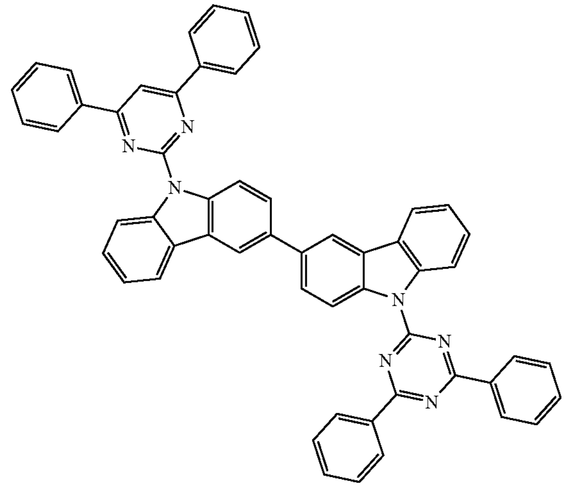
128A
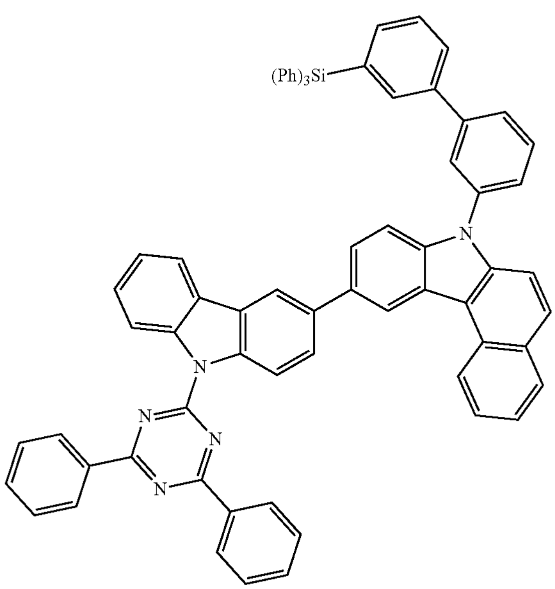
129A
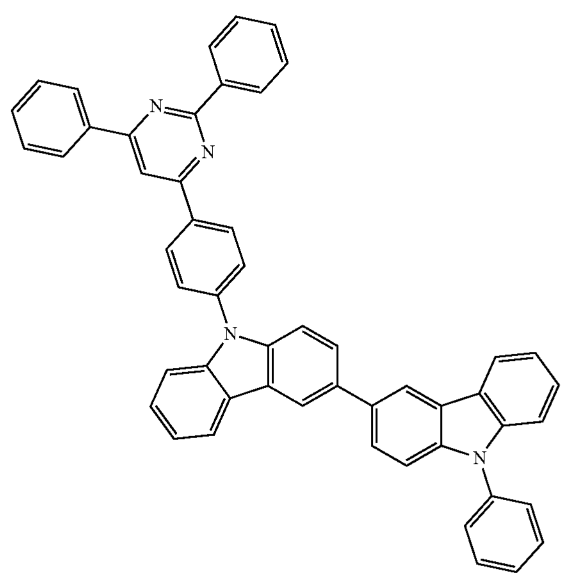

-continued
130A
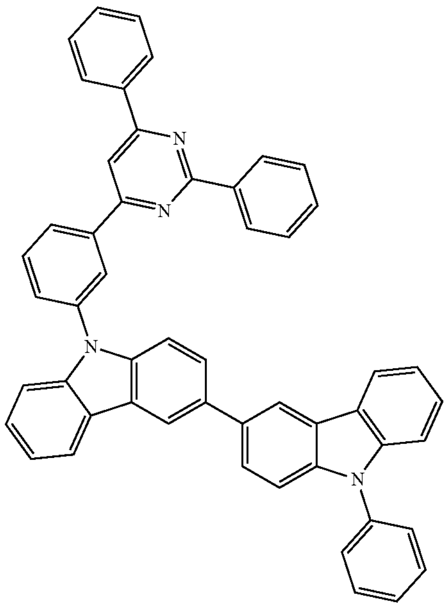
131A
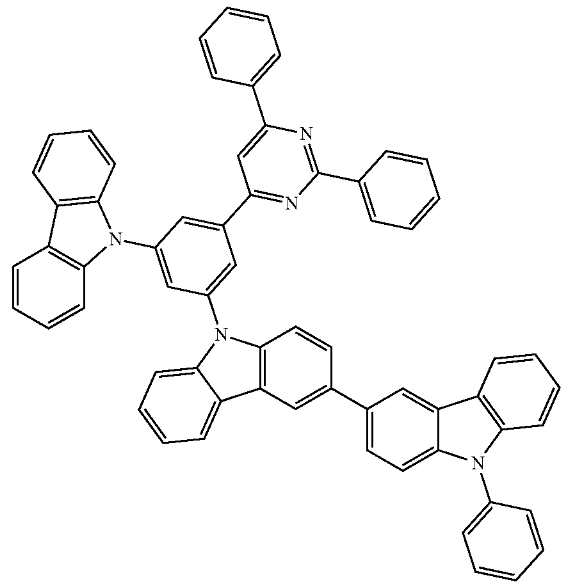
132A
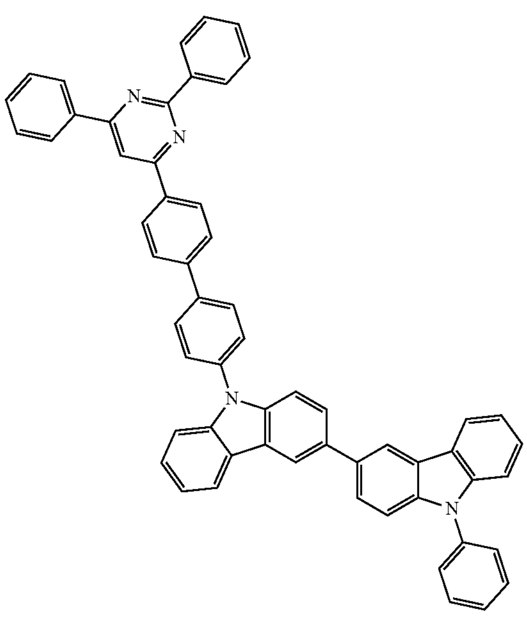
133A
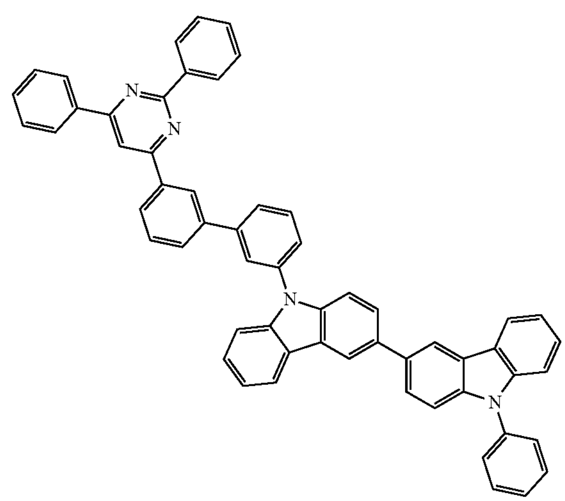

-continued
134A
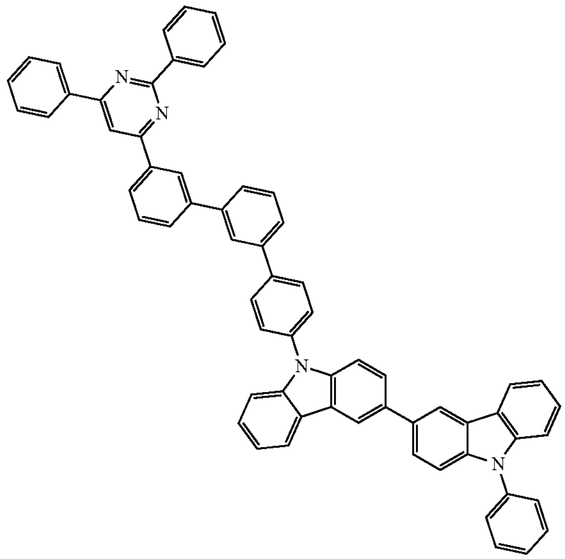
135A
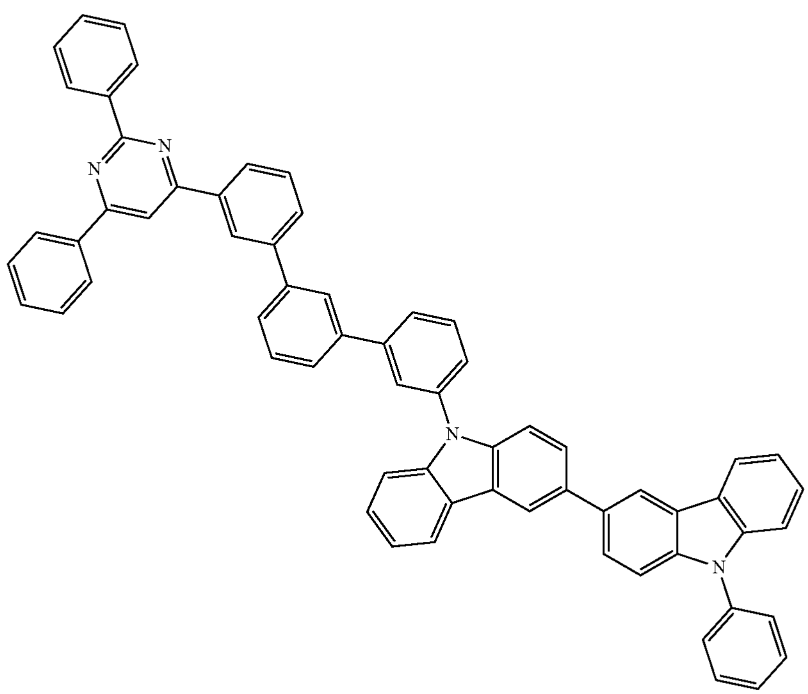

-continued
136A
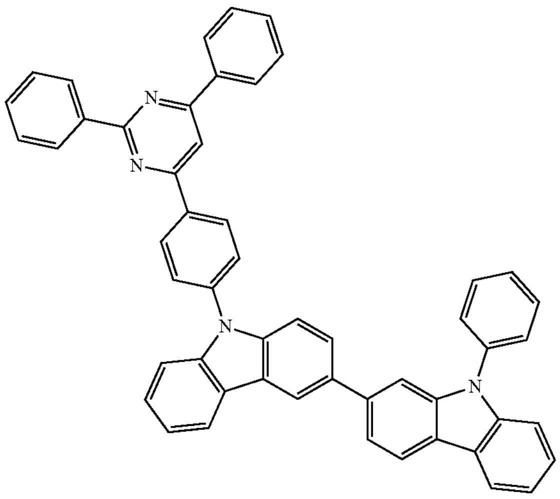
137A
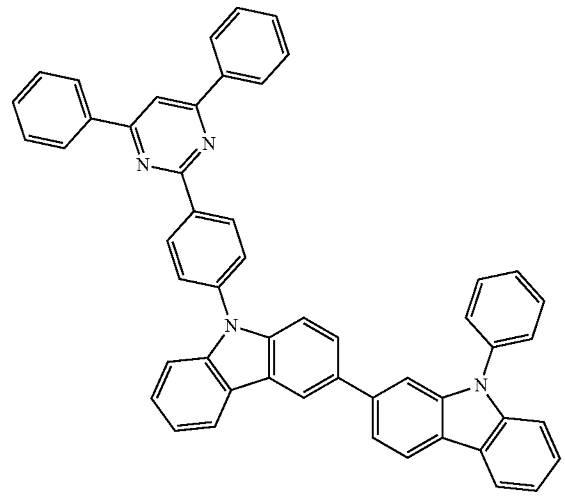
138A
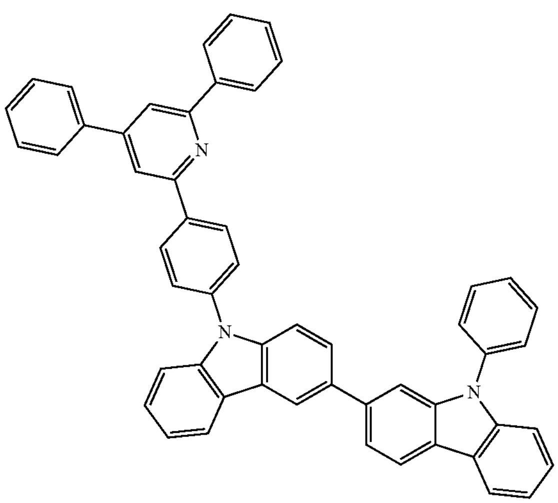
139A
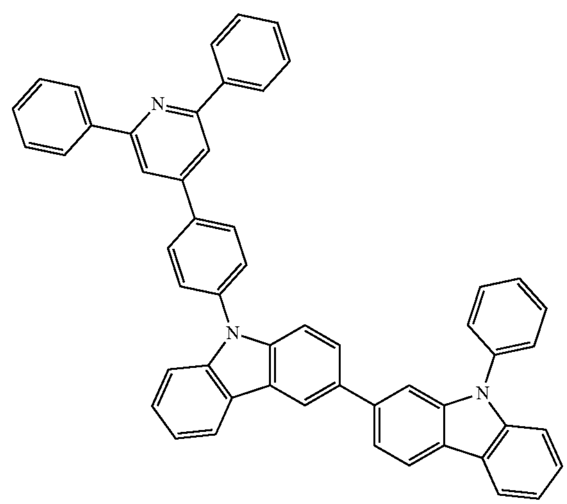
140A
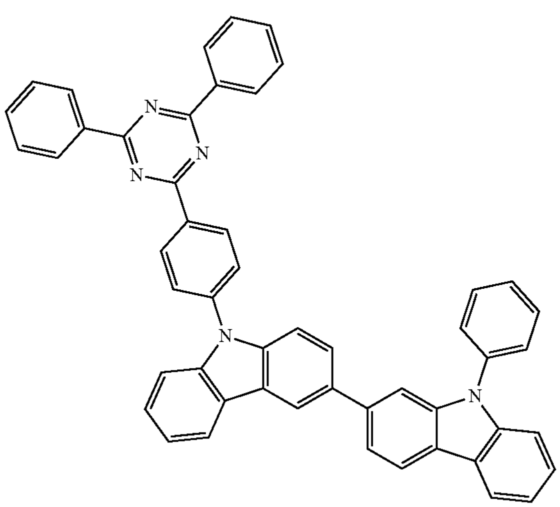
141A
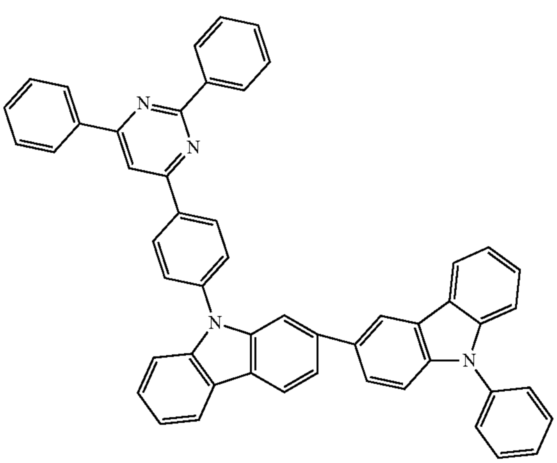

-continued
142A
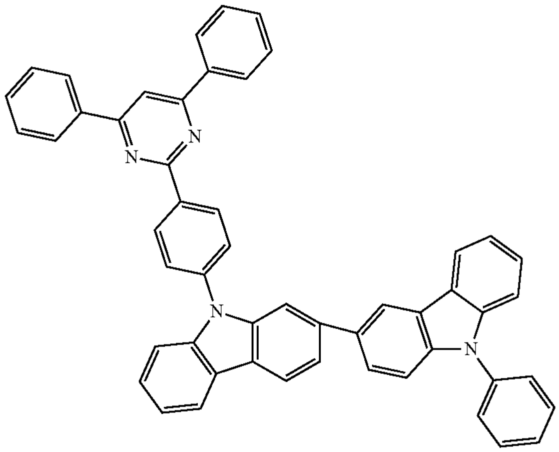
143A
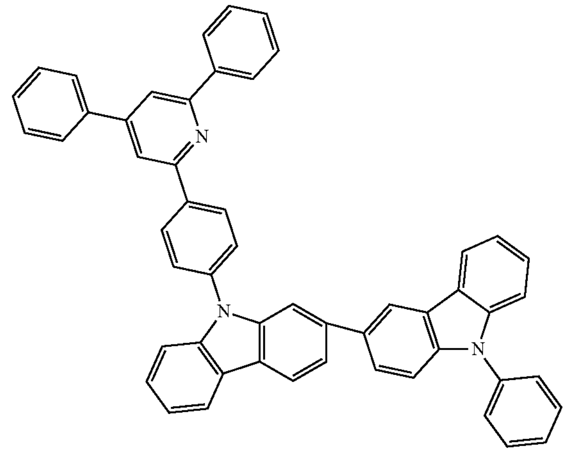
144A
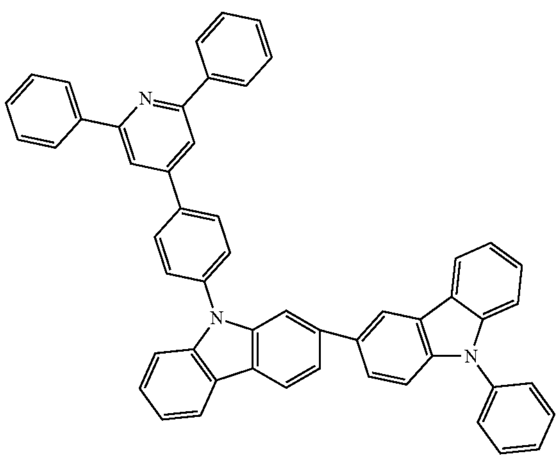
146A
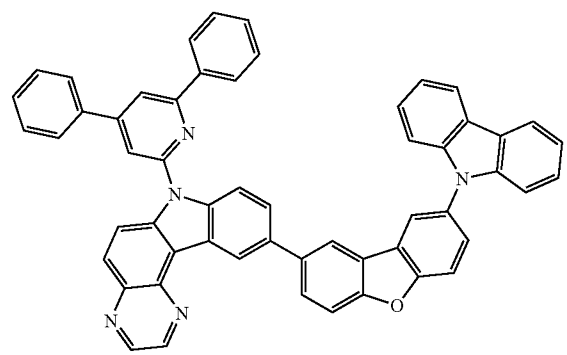
147A
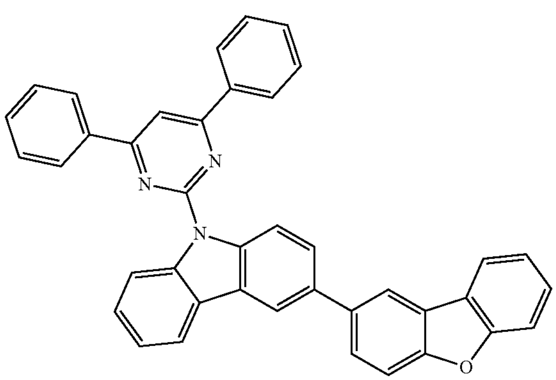
148A
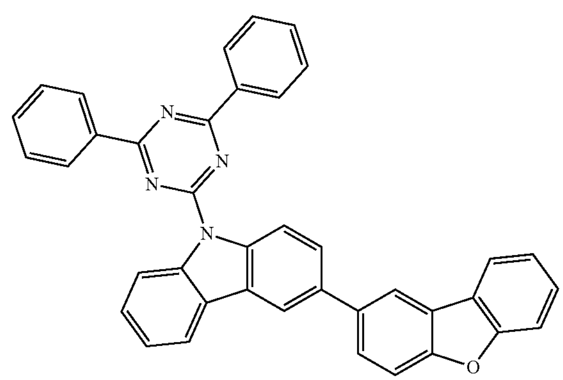

-continued
149A
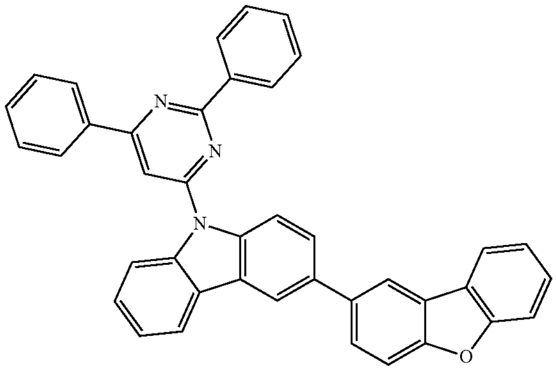
150A
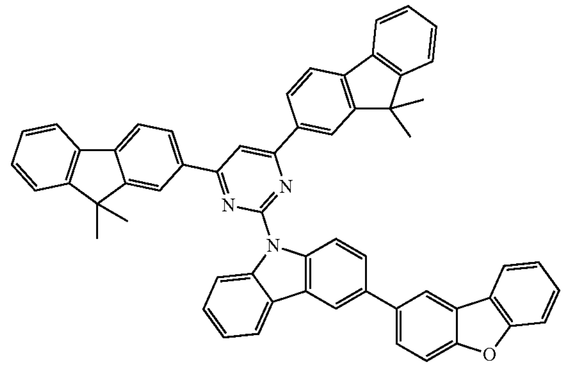
151A
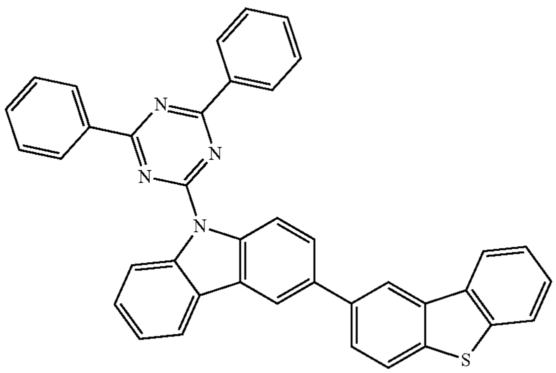
152A
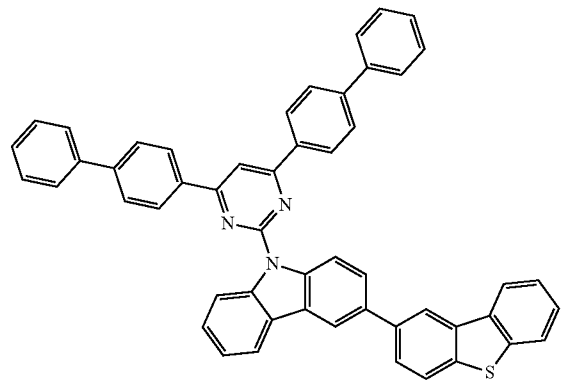
153A
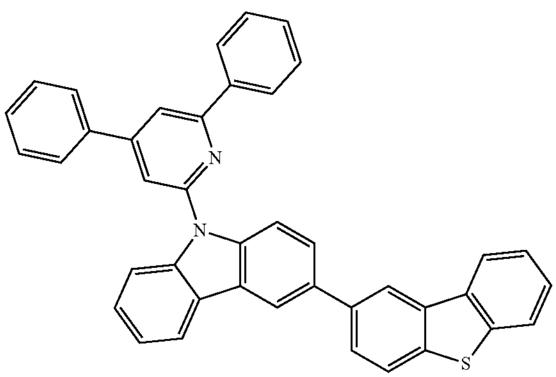
154A
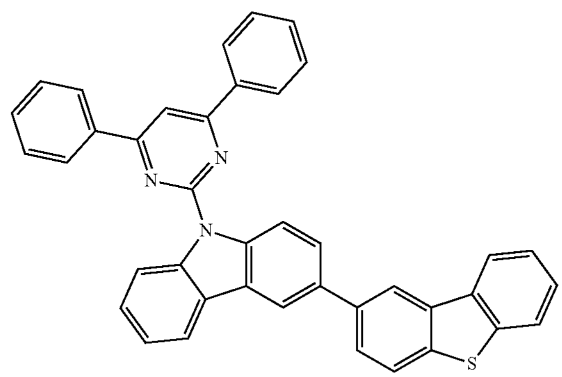
155A
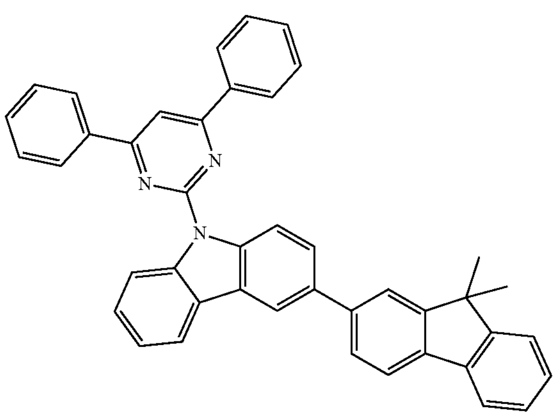
156A
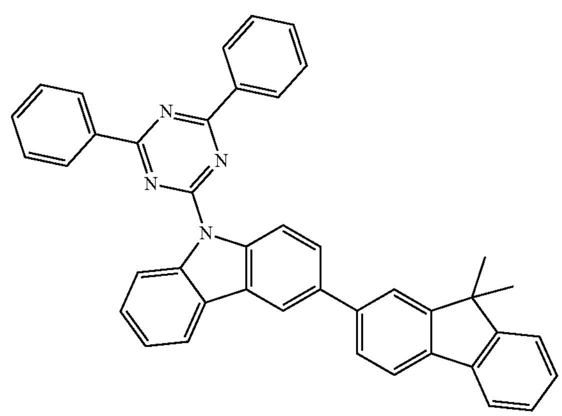

-continued
157A
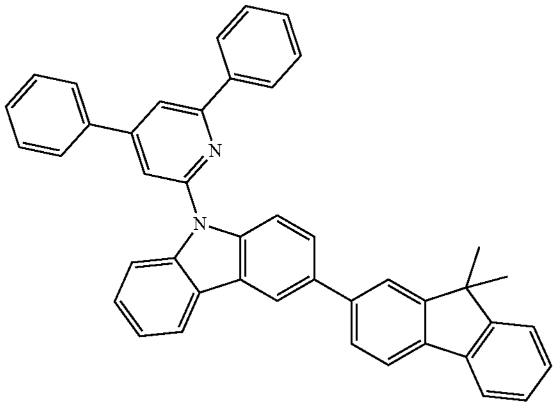
158A
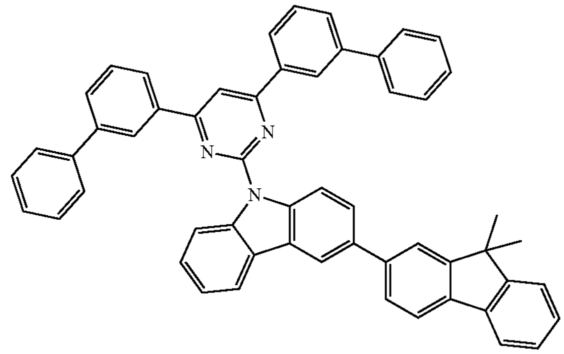
159A
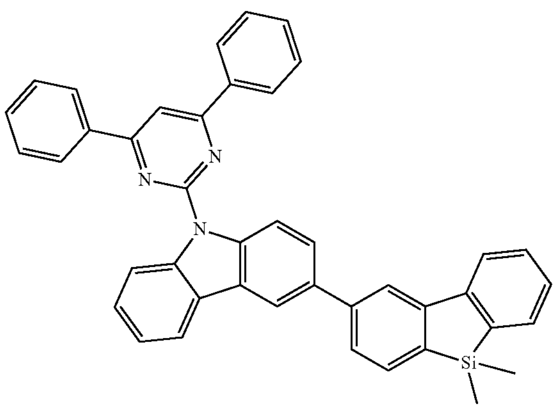
160A
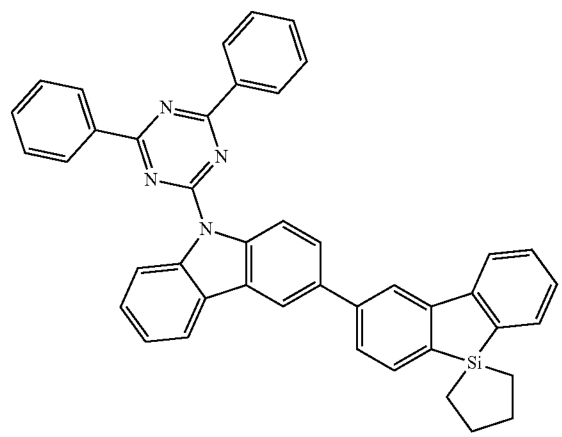
161A
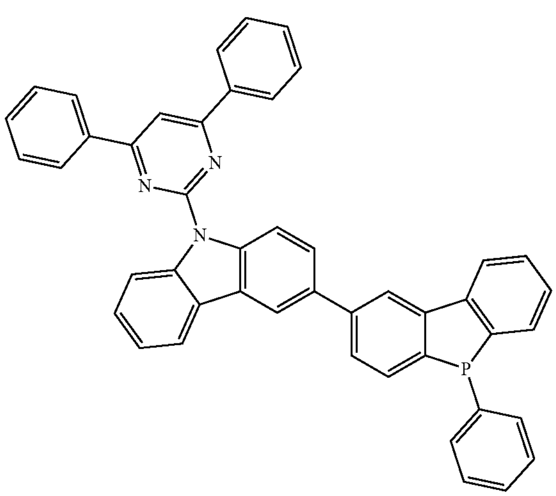
162A
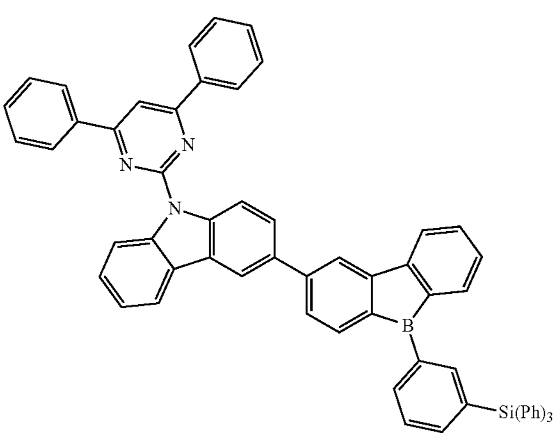

-continued
163A
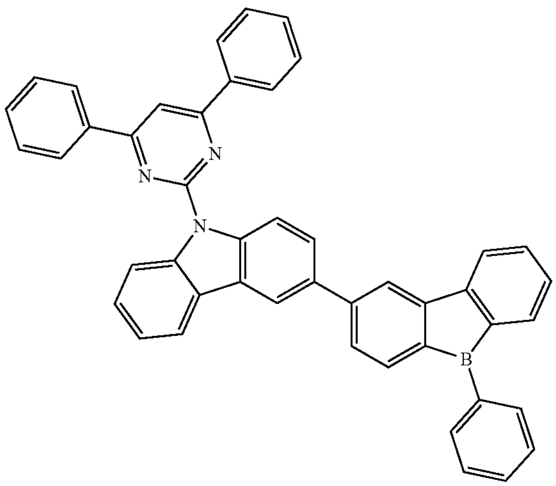
164A
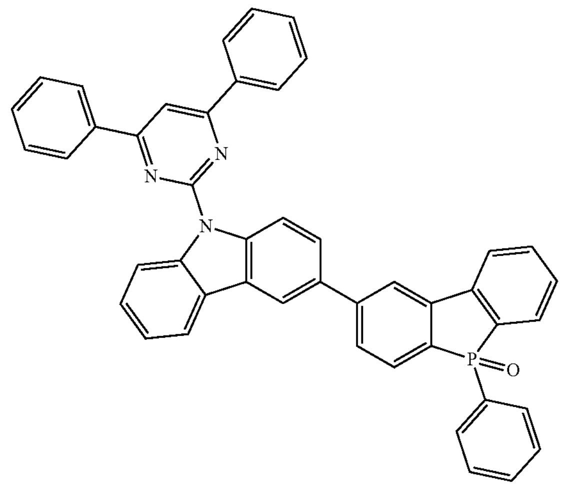
165A
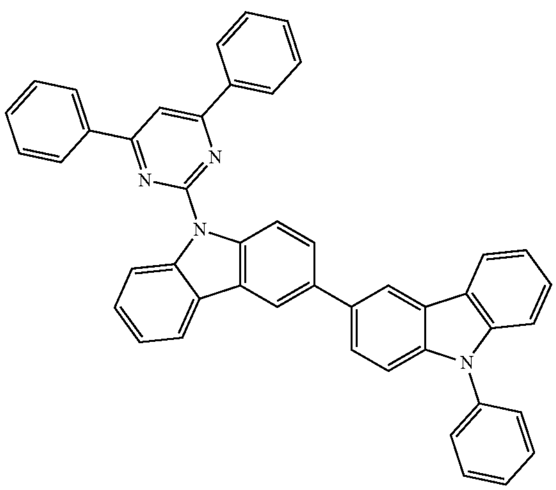
166A
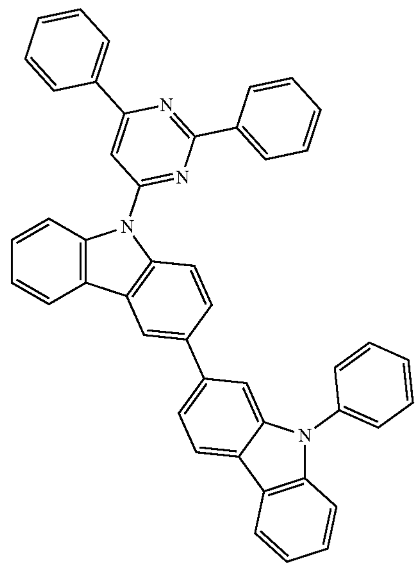
167A
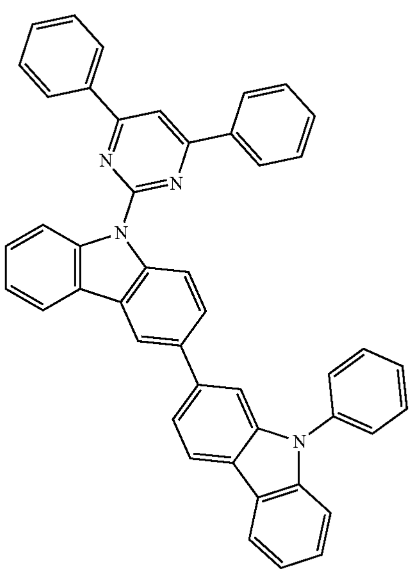
168A
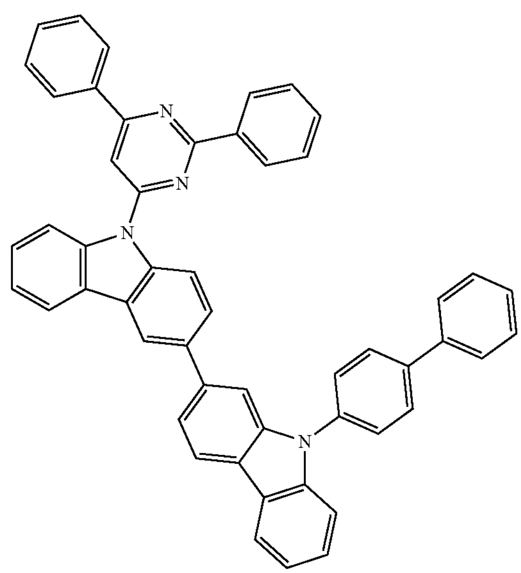

-continued
169A
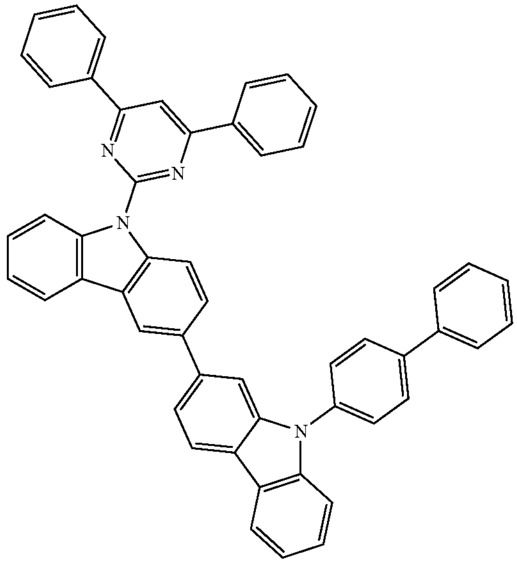
170A
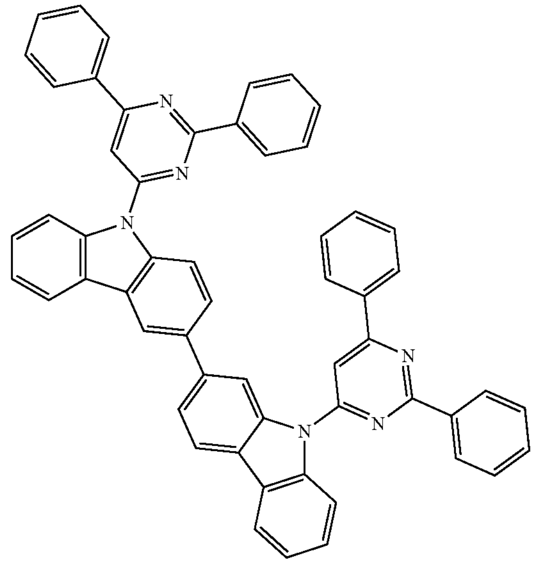
171A
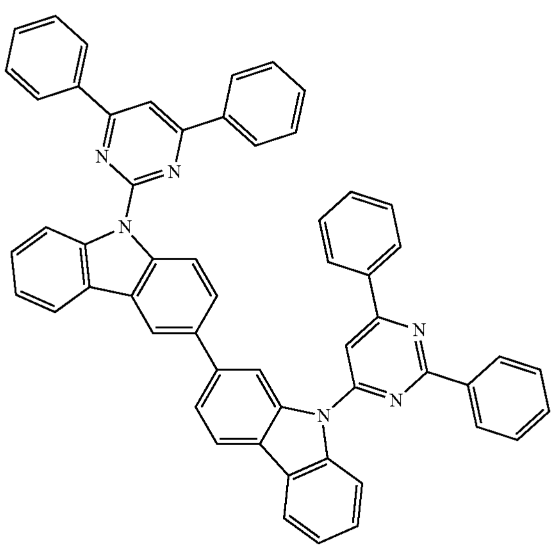
172A
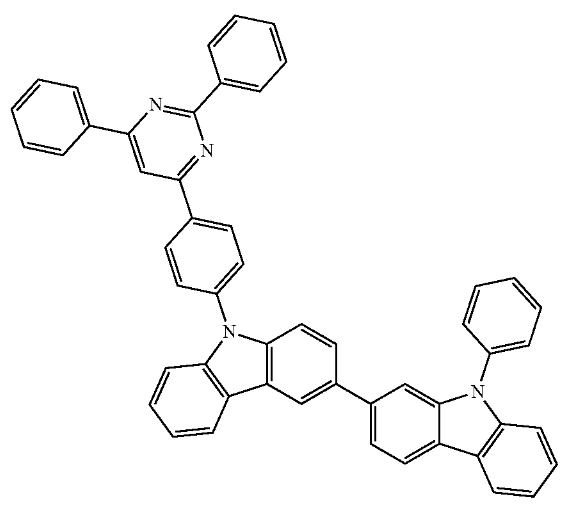

-continued
173A
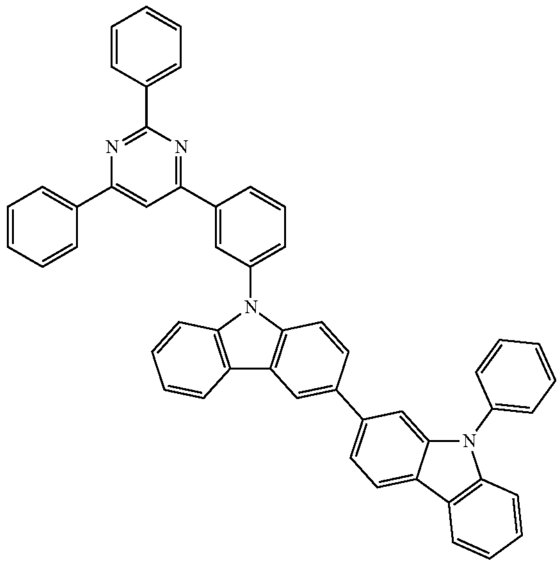
174A
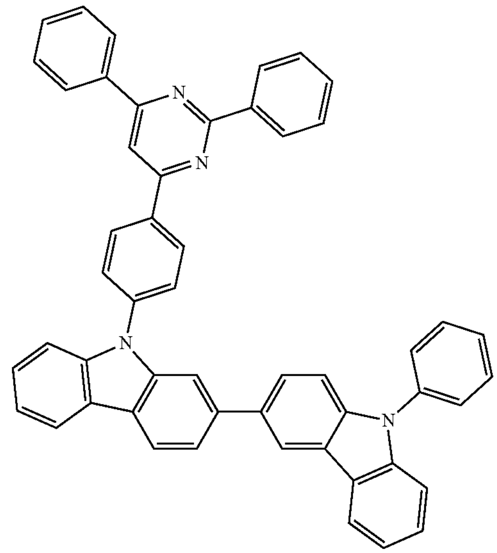
175A
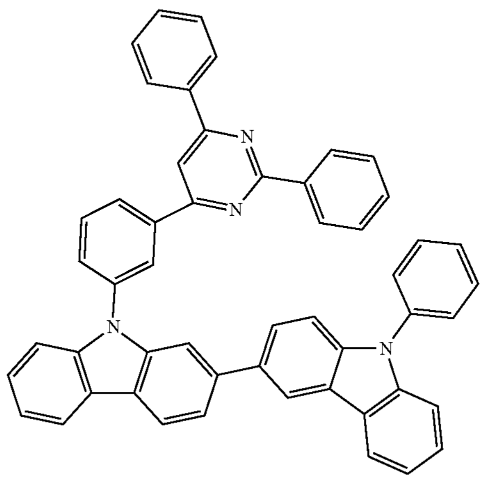
176A
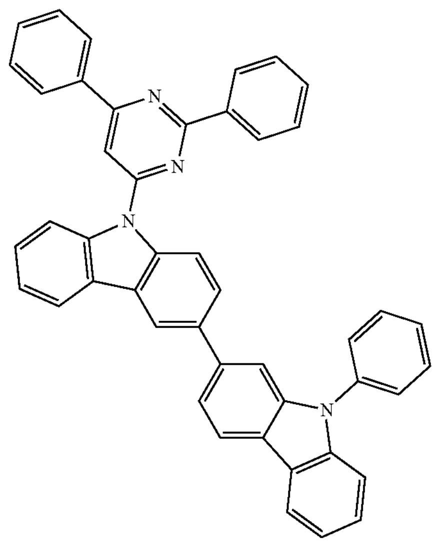
177A
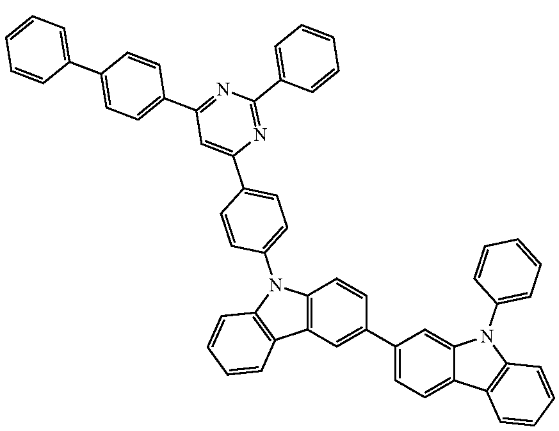
178A
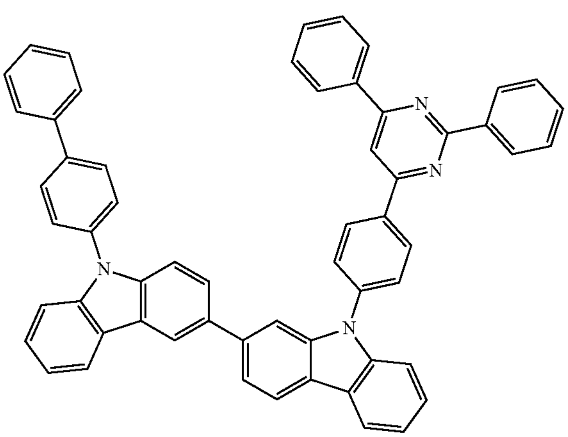

-continued
179A
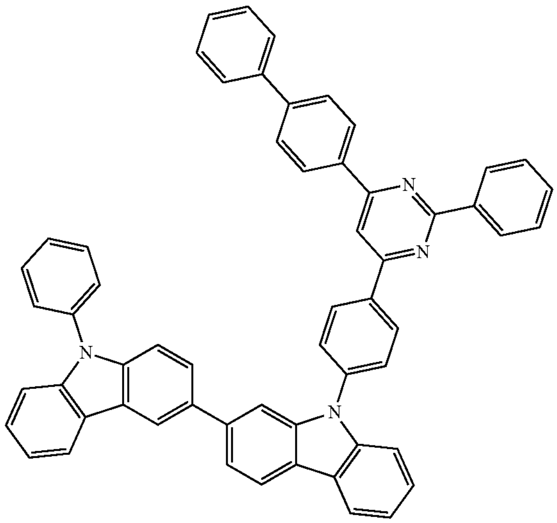
180A
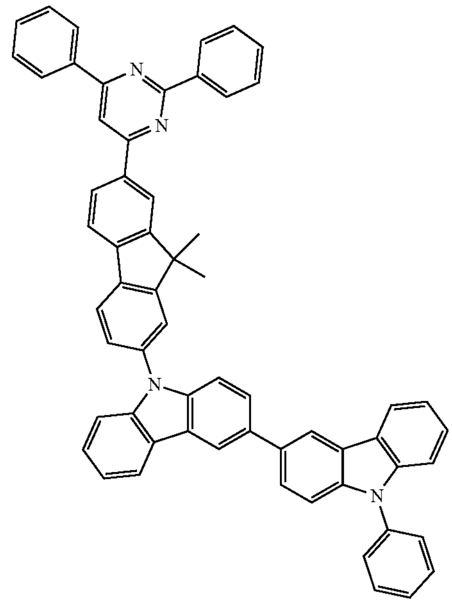
181A
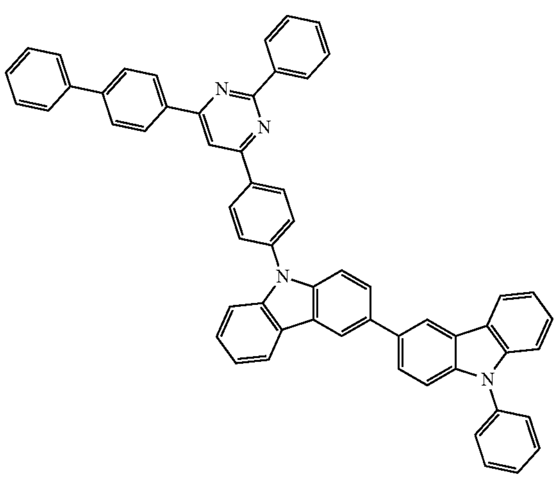
182A
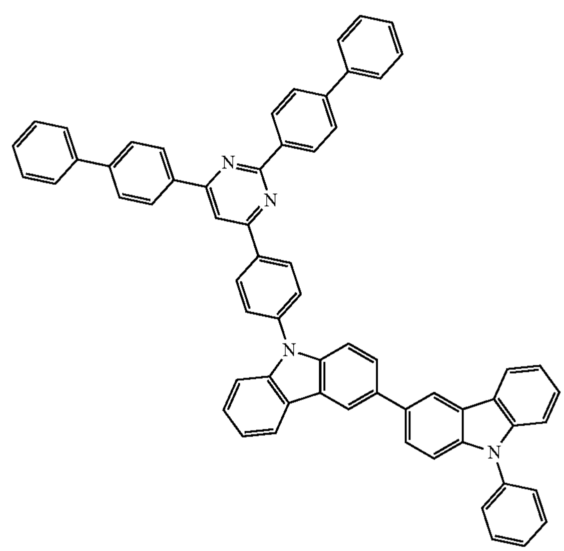

-continued
183A
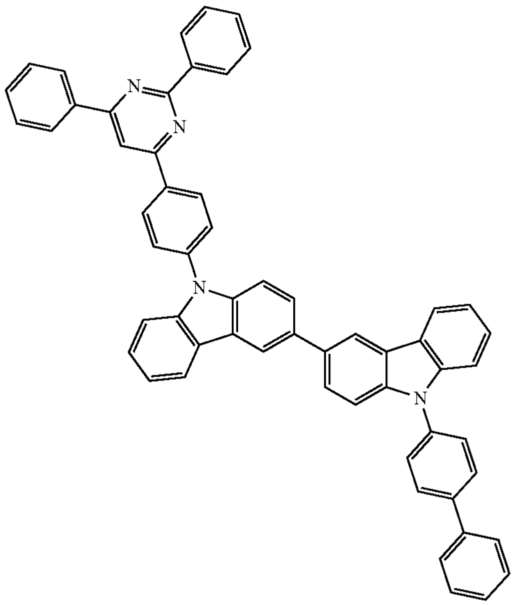
184A
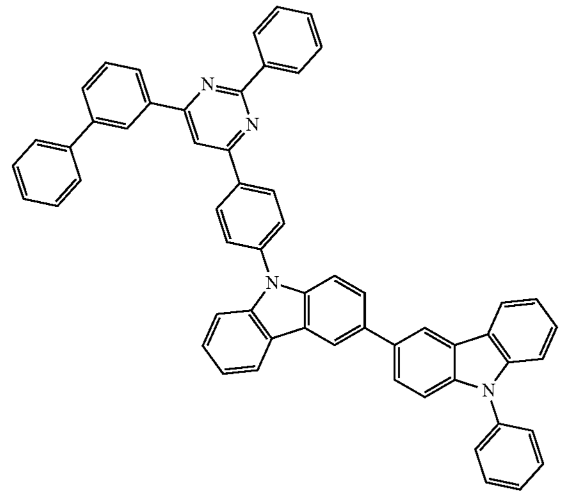
185A
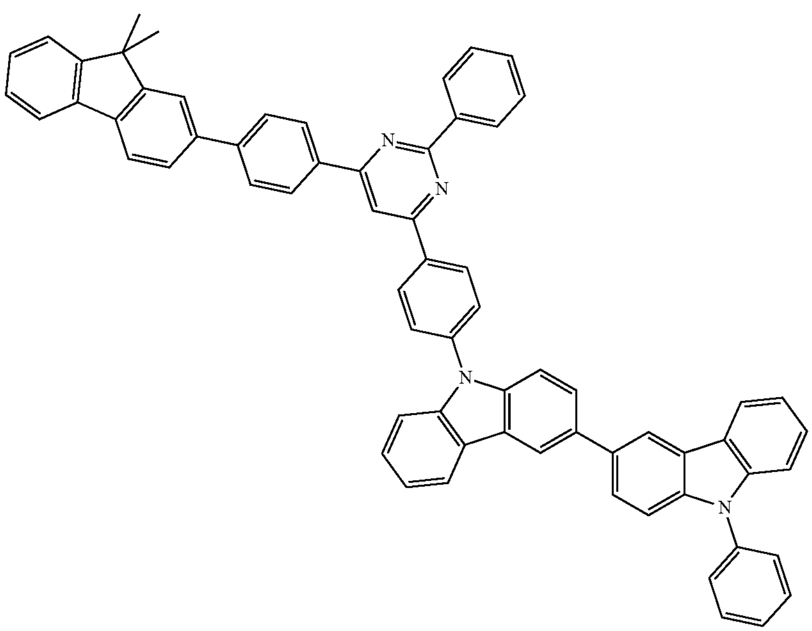

-continued
186A
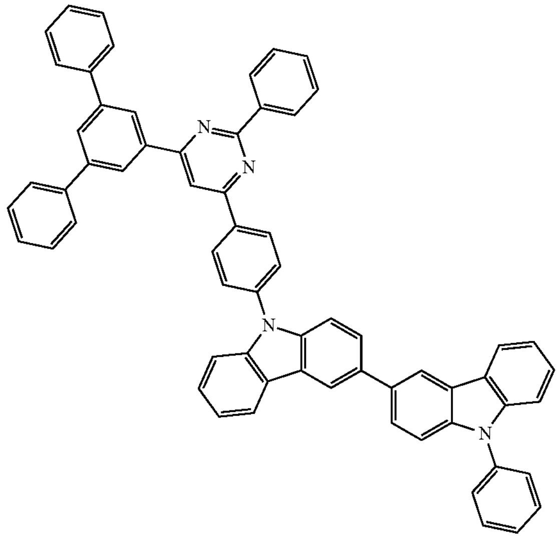
187A
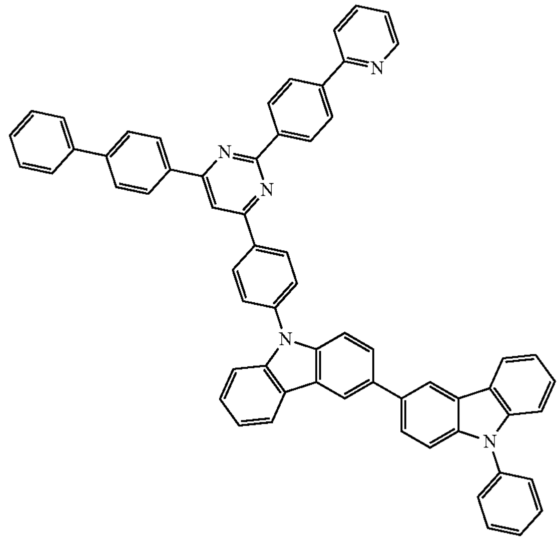
188A
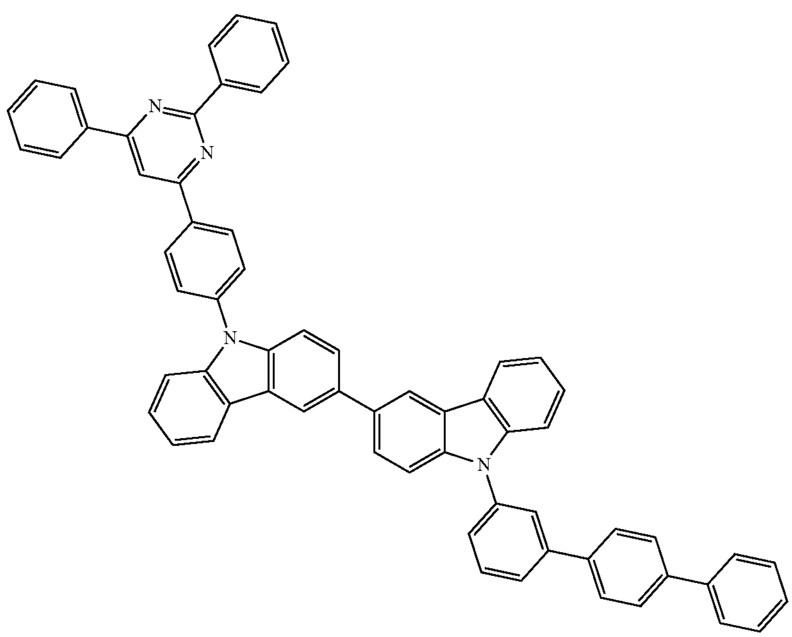

-continued
189A
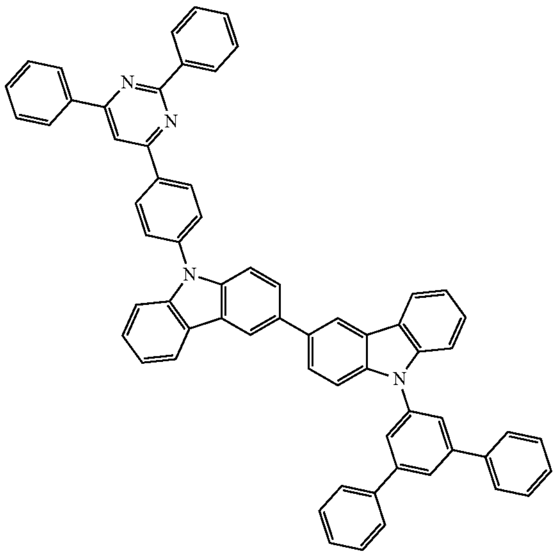
101B
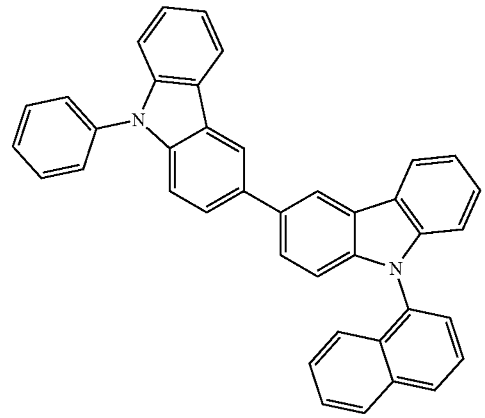
102B
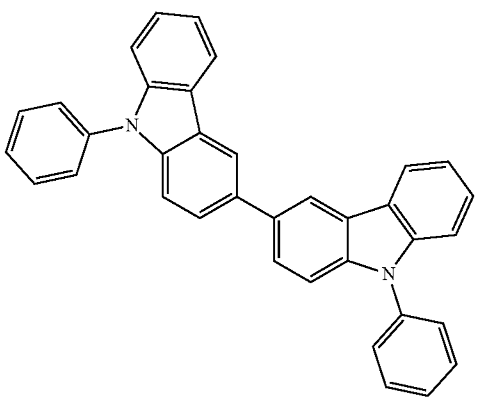
103B
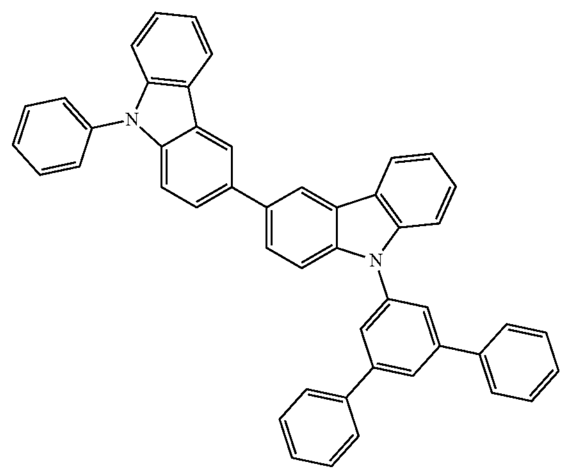
104B
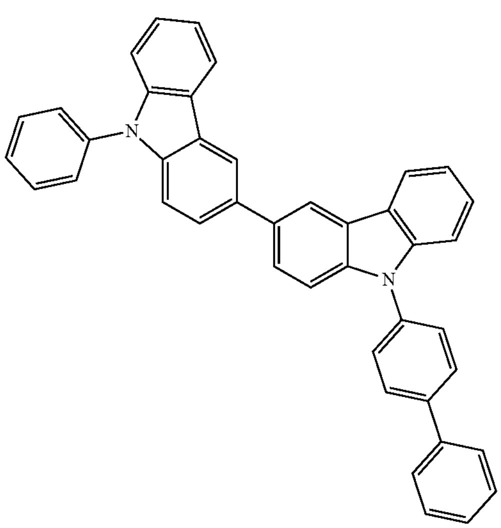
105B
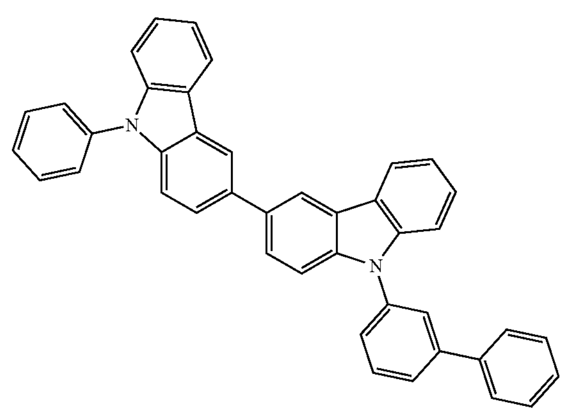

-continued
106B
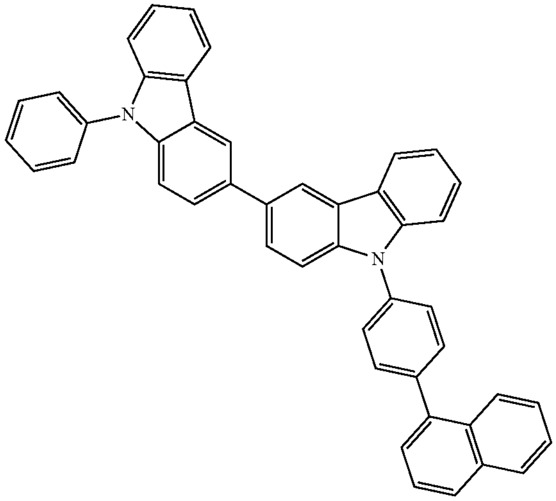
107B
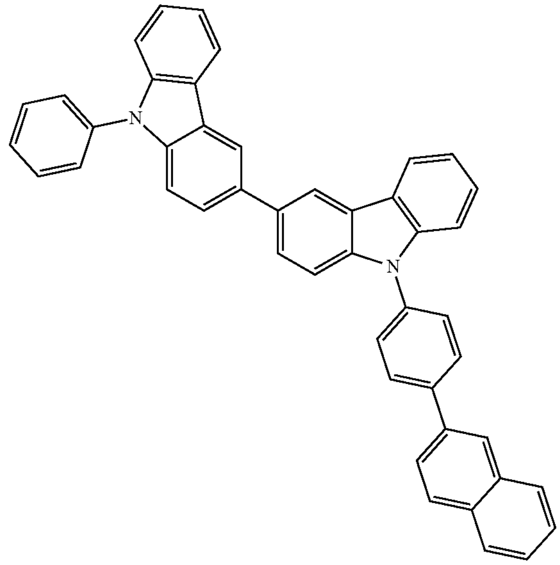
108B
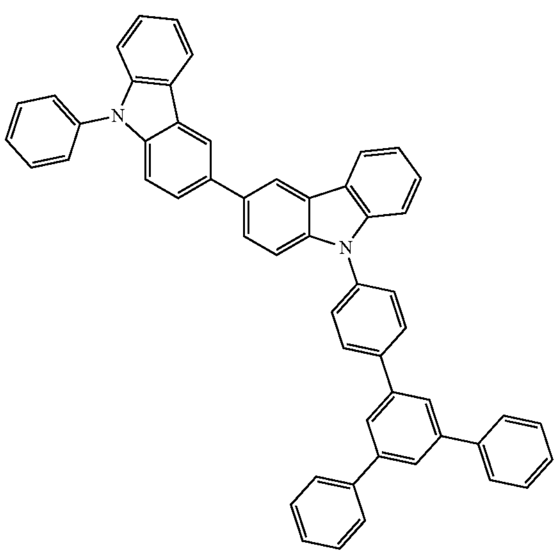
109B
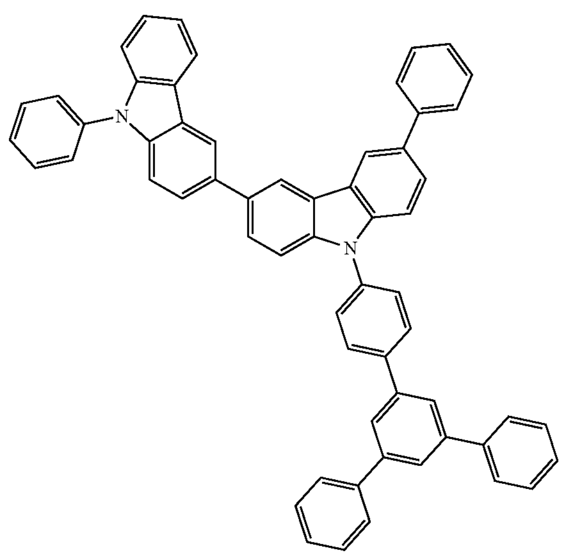

-continued
110B
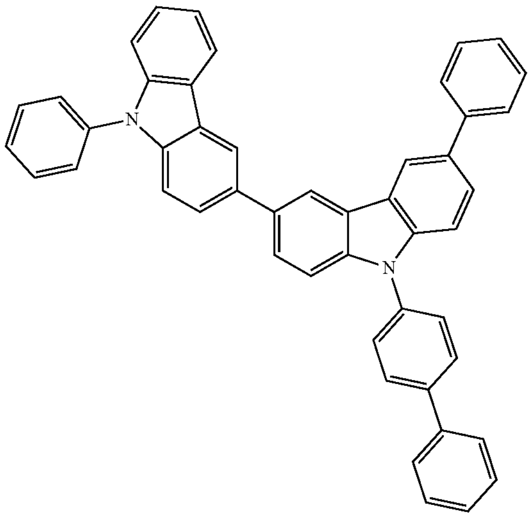
111B
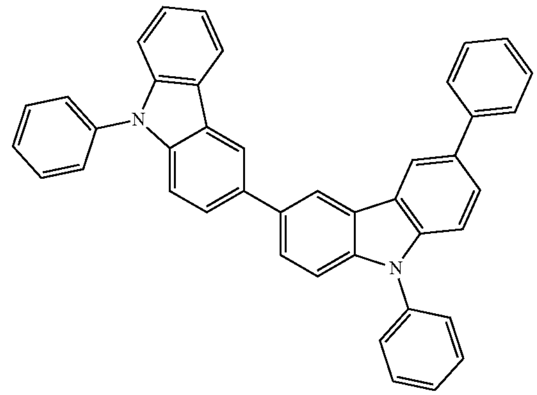
112B
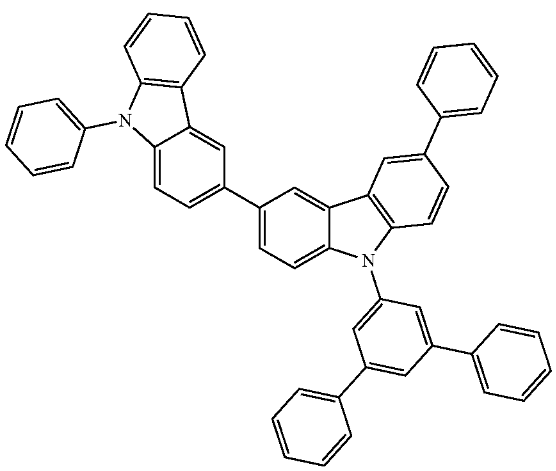
113B
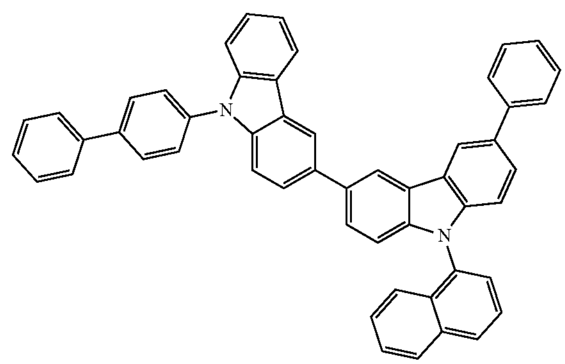
114B
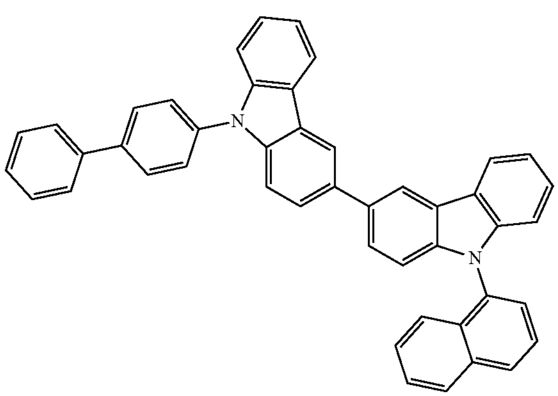
115B
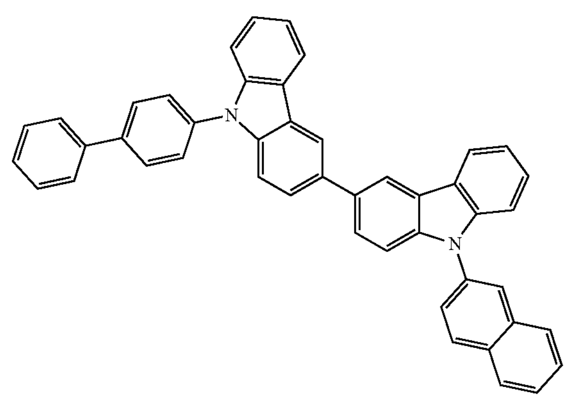

-continued
116B
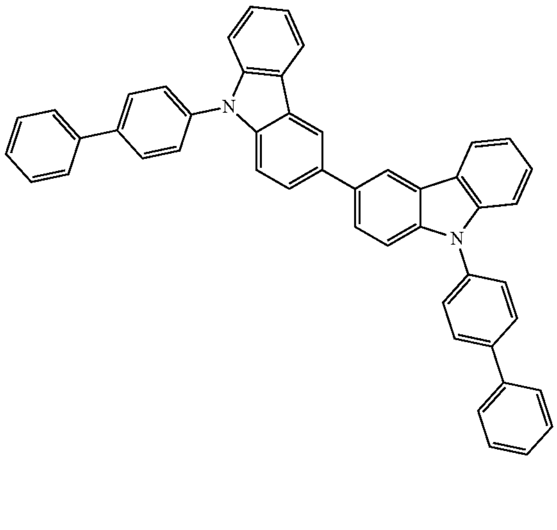
117B
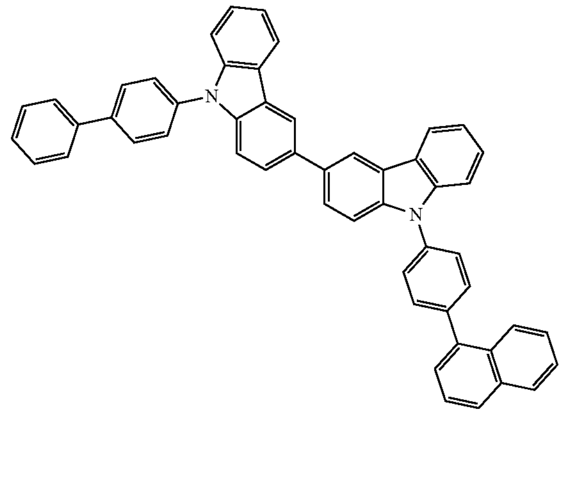
118B
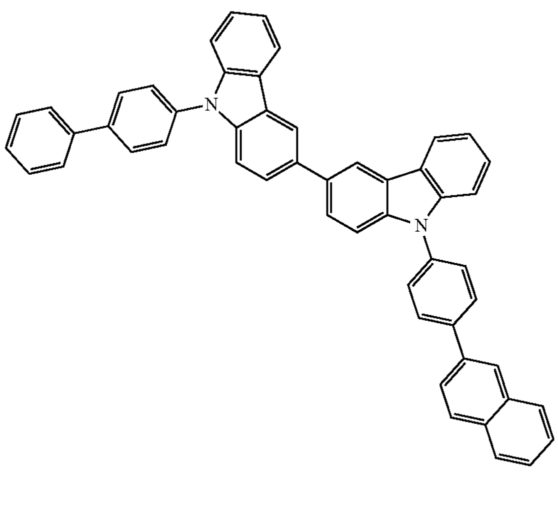
119B
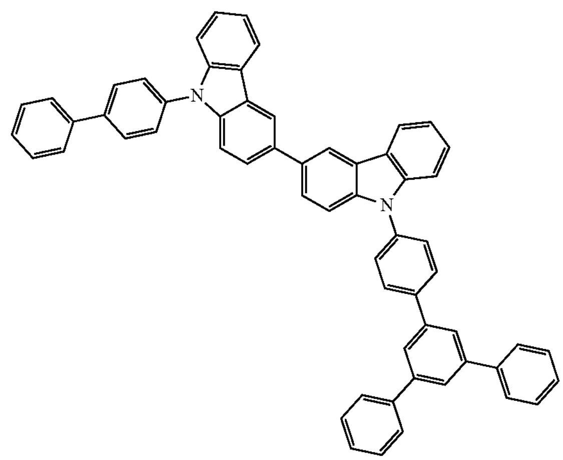
120B
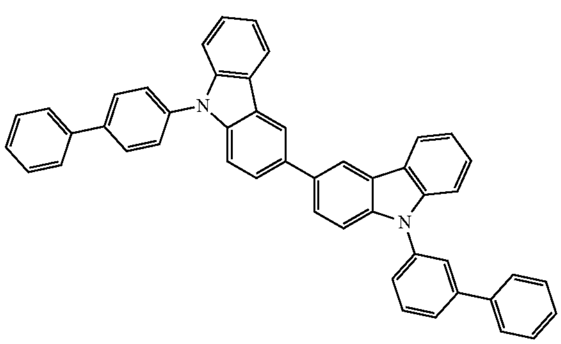

121B
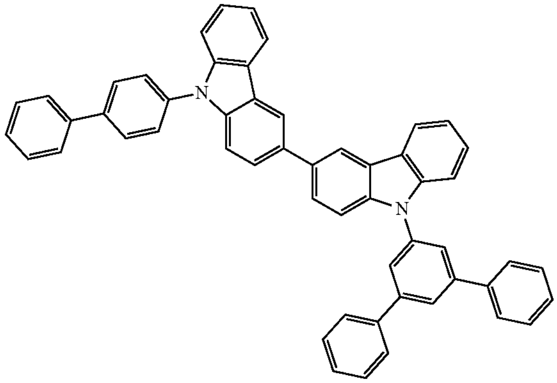
122B
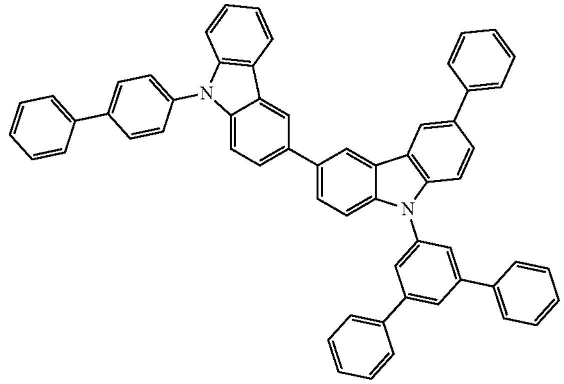
123B
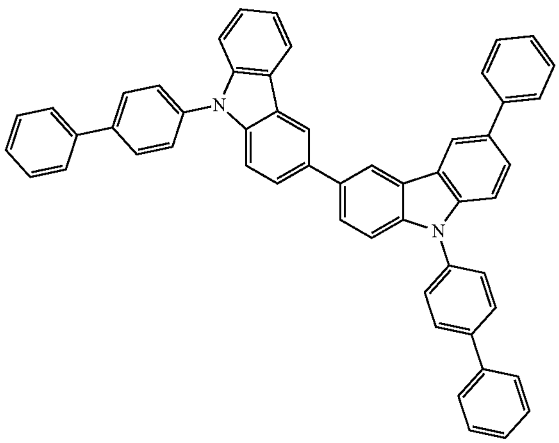
124B
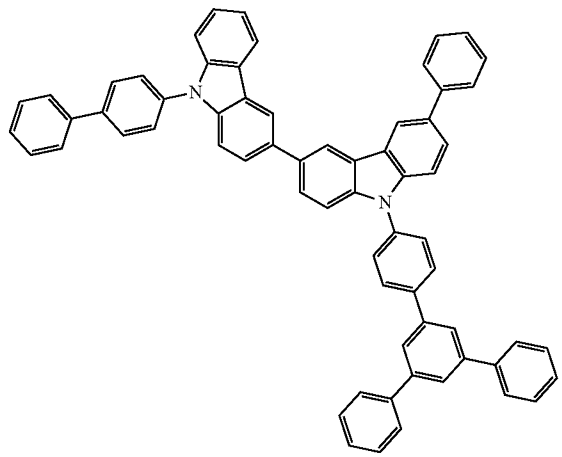
125B
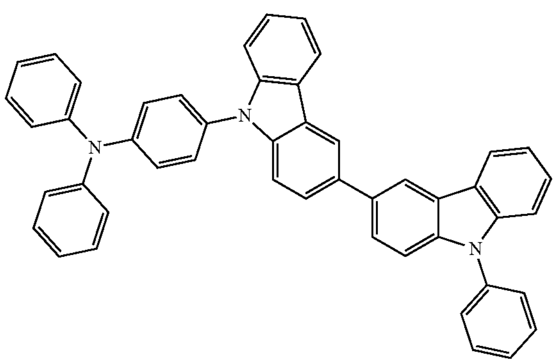
126B
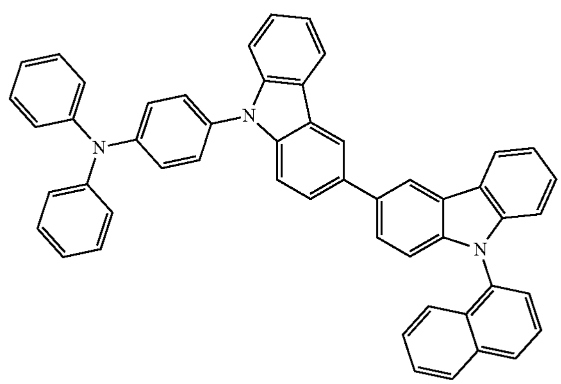

-continued
127B
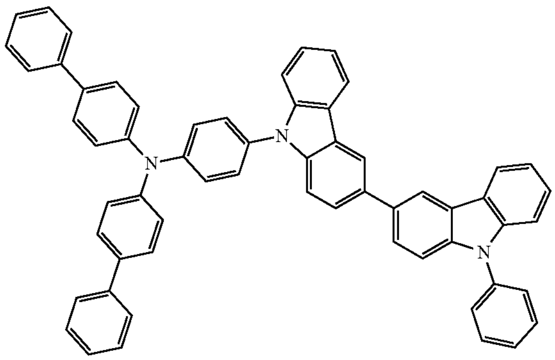
128B
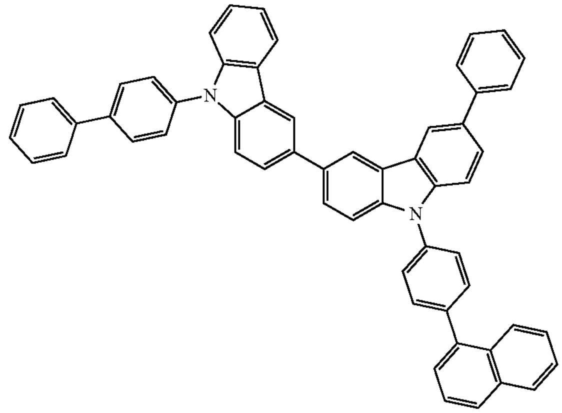
129B
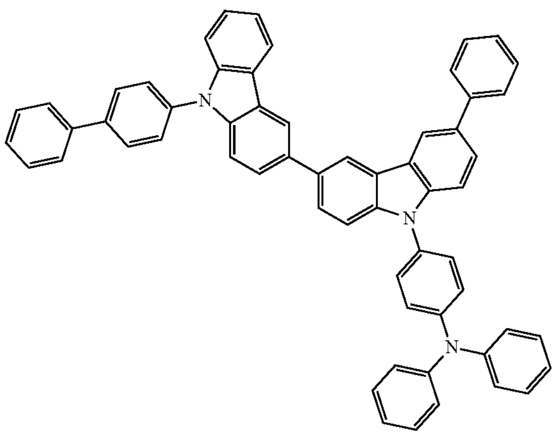
130B
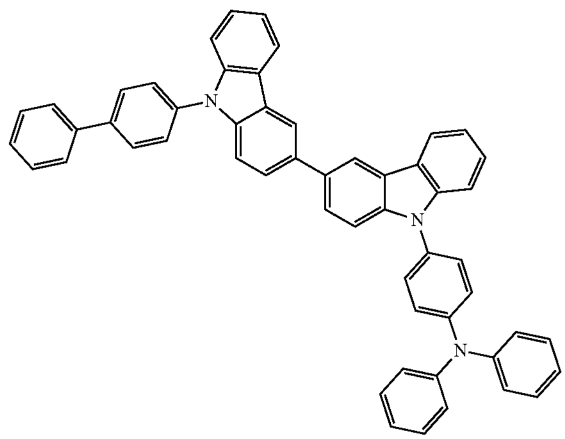
131B
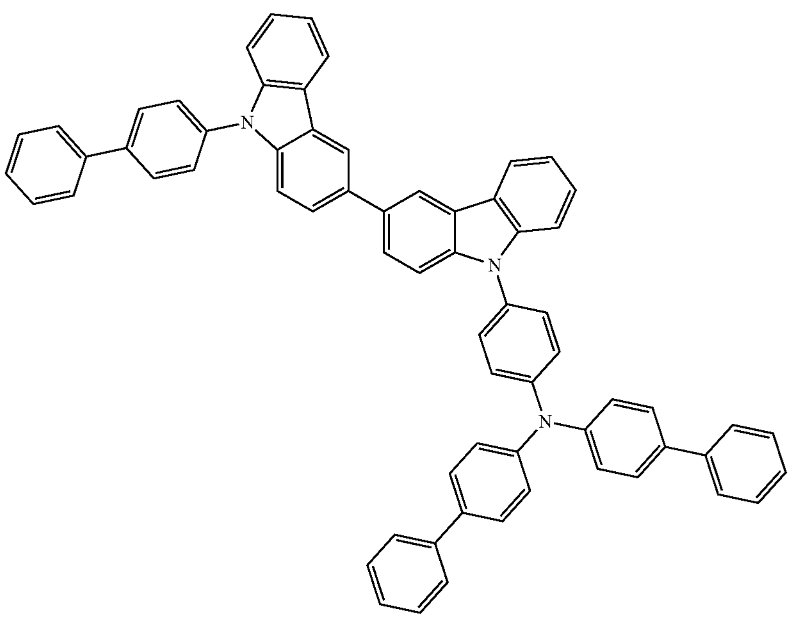

-continued
132B
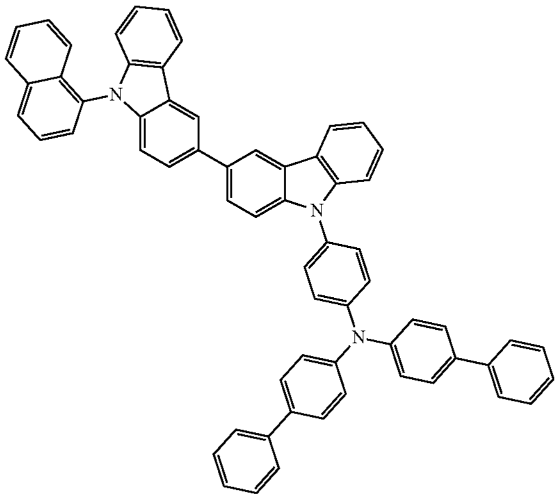
133B
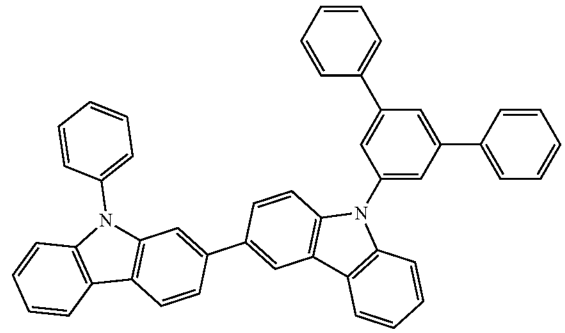
134B
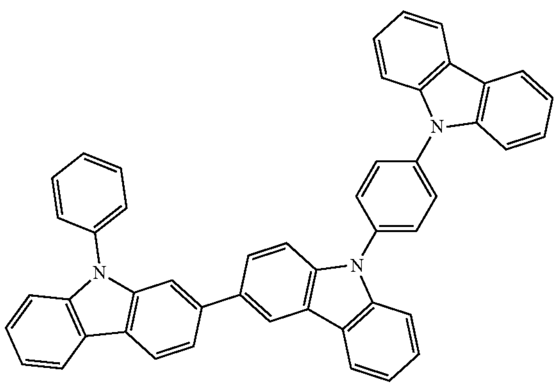
135B
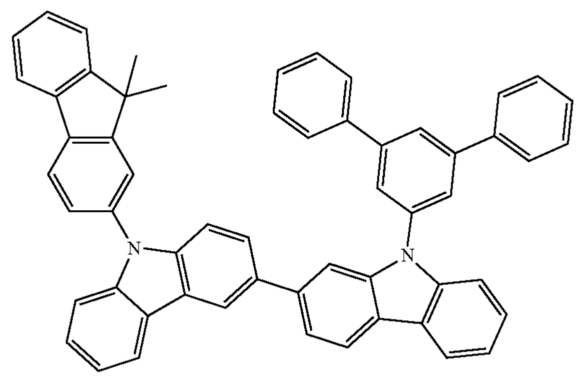
136B
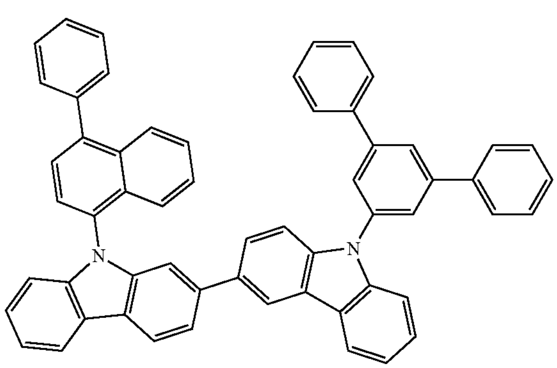
137B
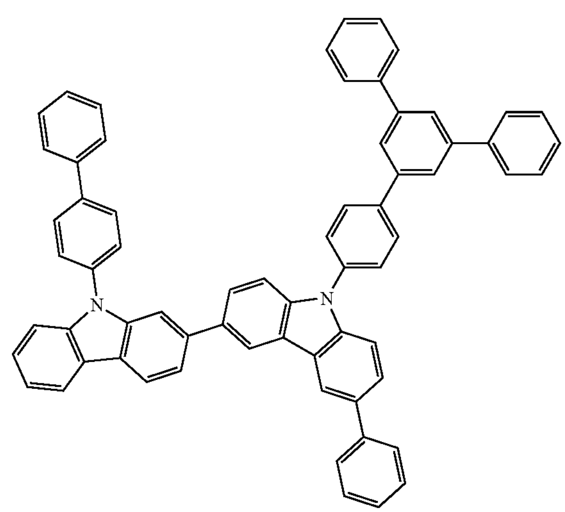

-continued
138B
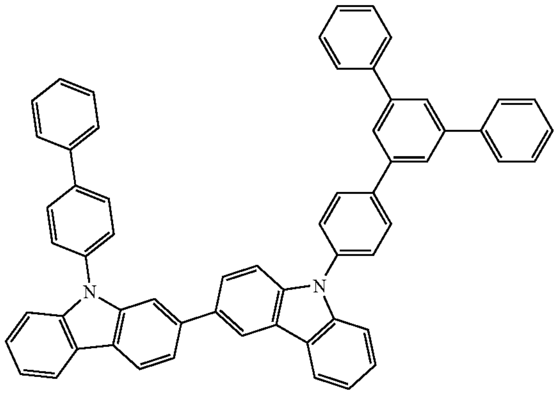
139B
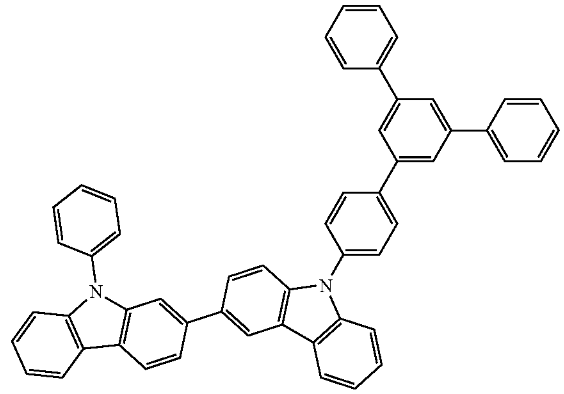
140B
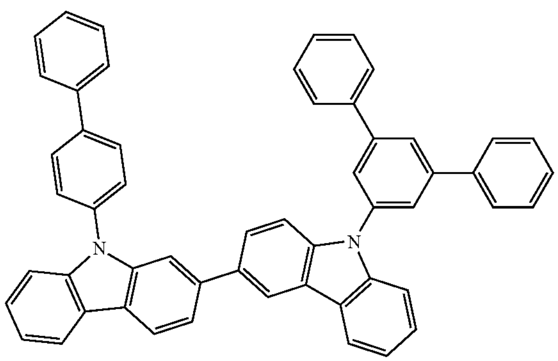
141B
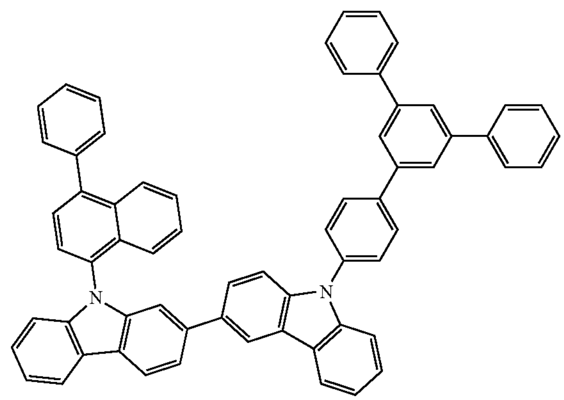
142B
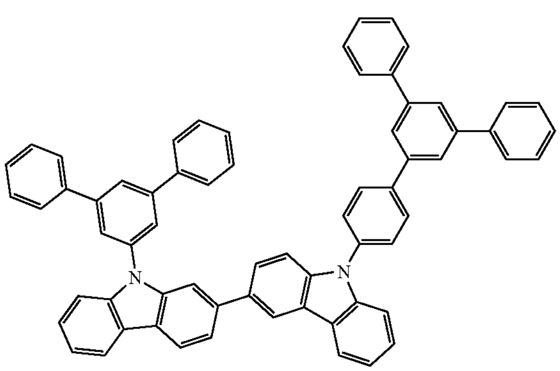
143B
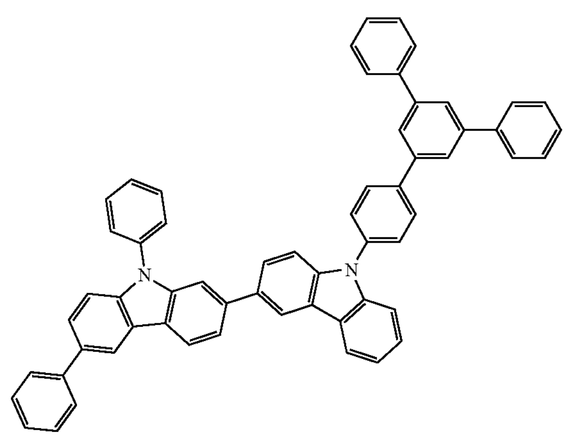

-continued
144B
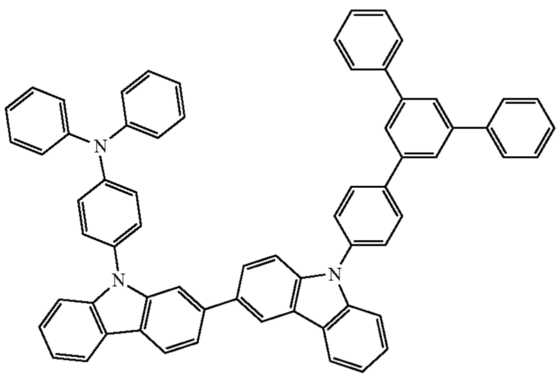
145B
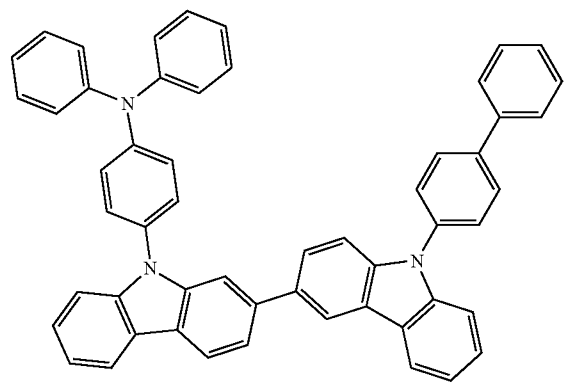
146B
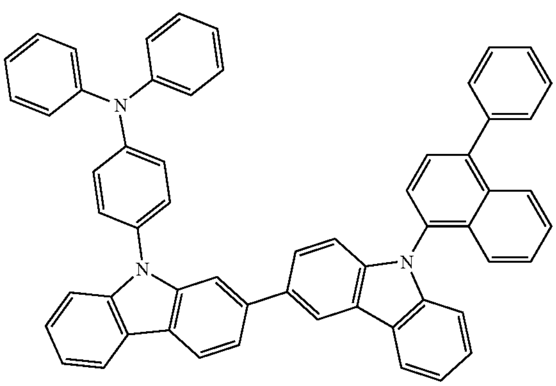
147B
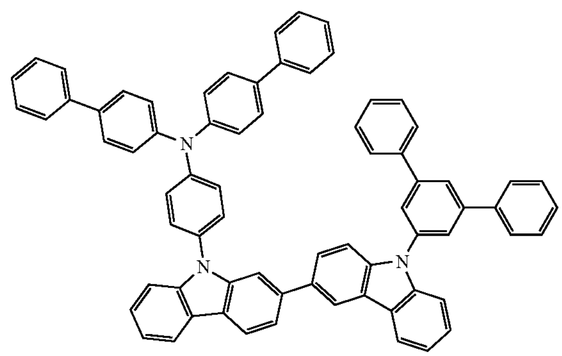
148B
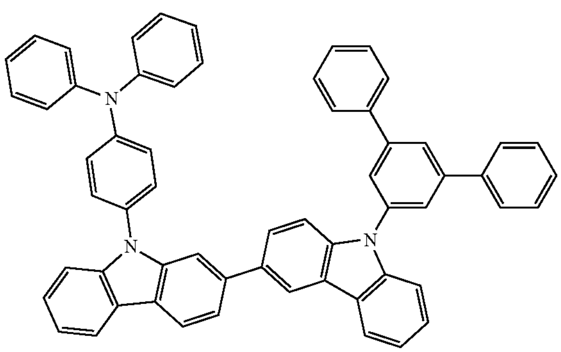
149B
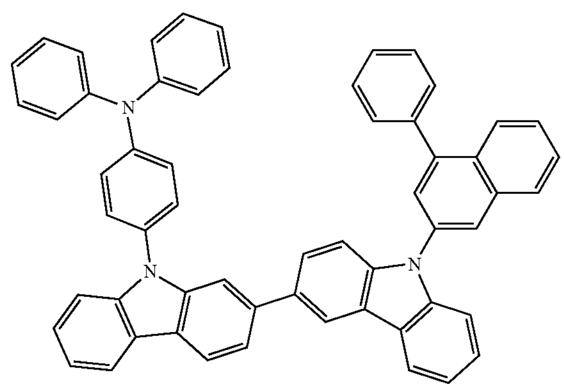
150B
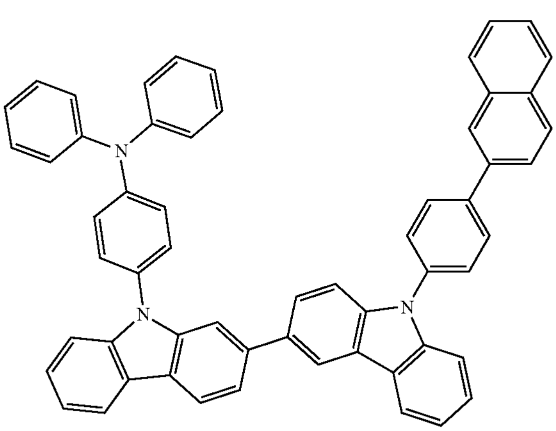
151B
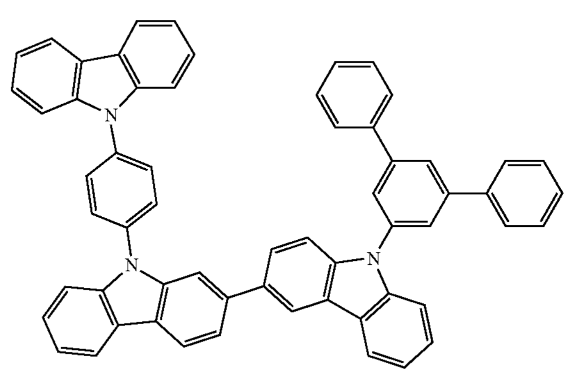

-continued
152B
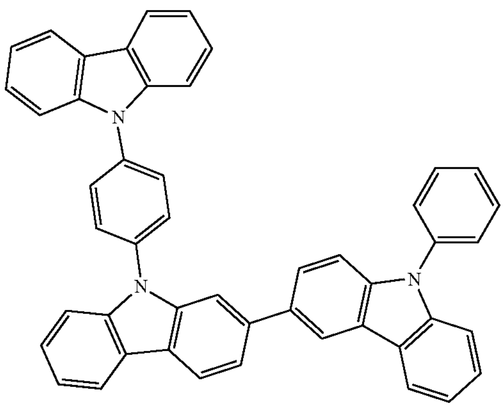
153B
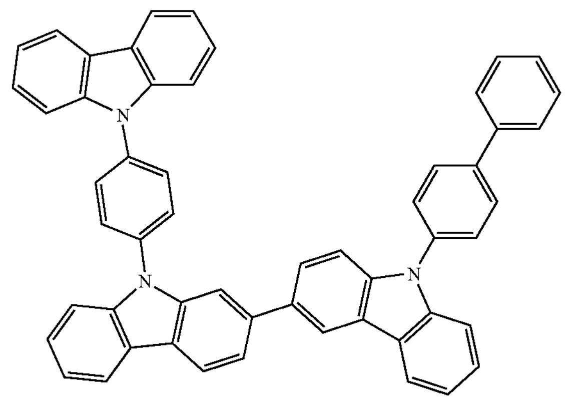
154B
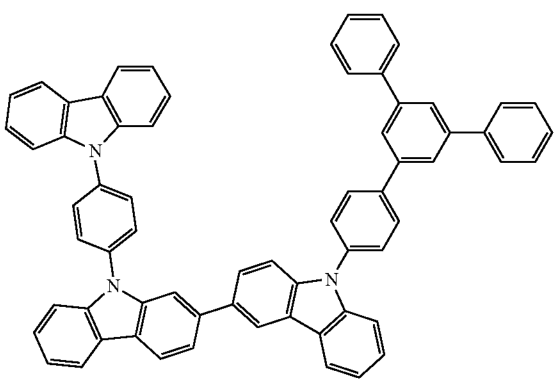
155B
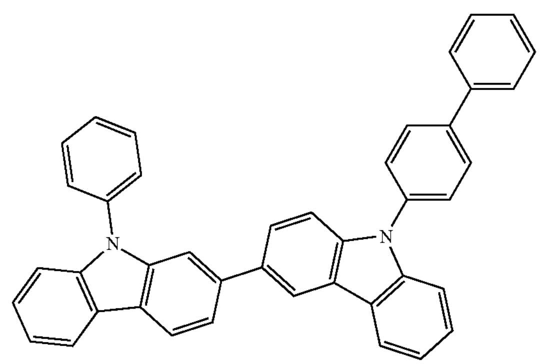
156B
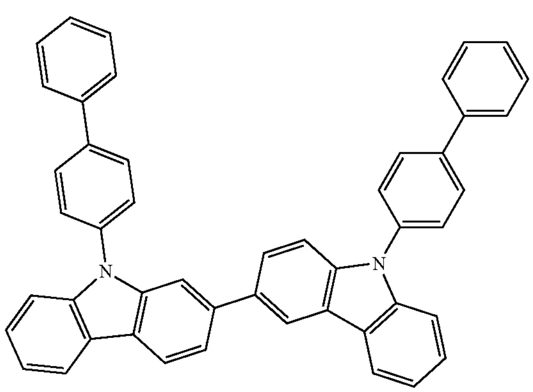
157B
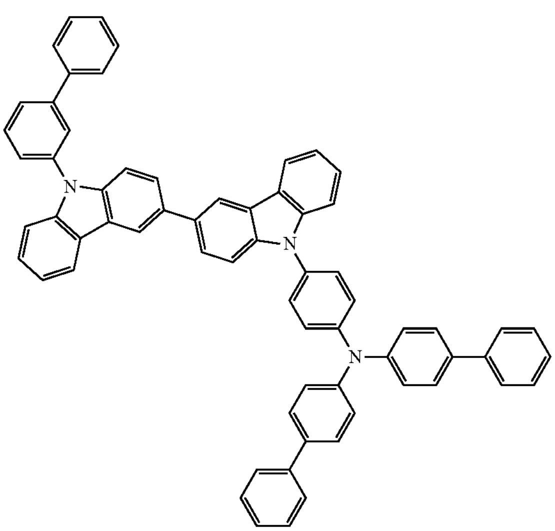

-continued
158B
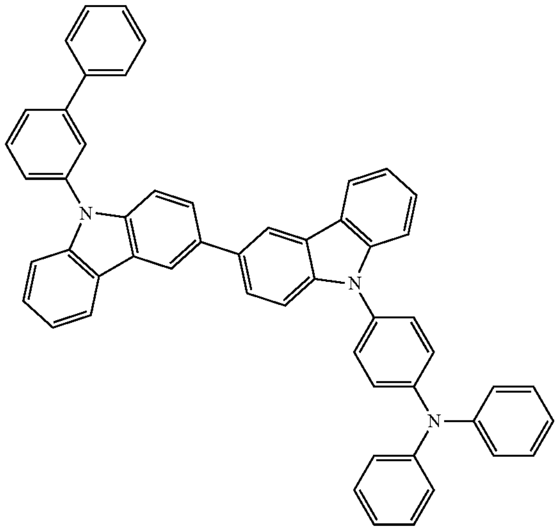
159B
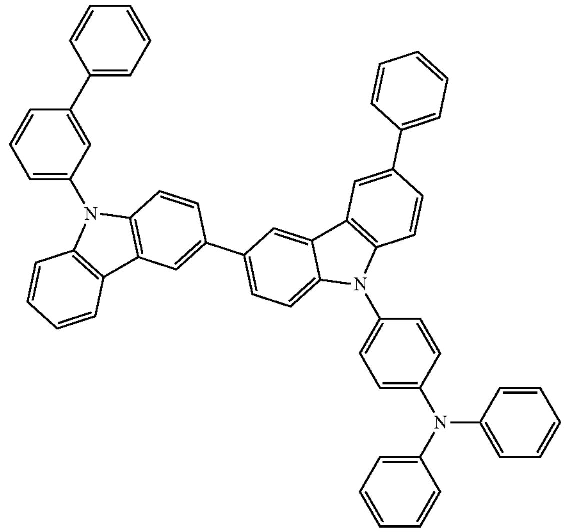
160B
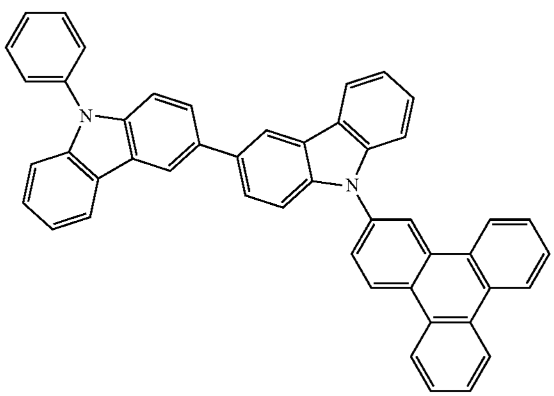
162B
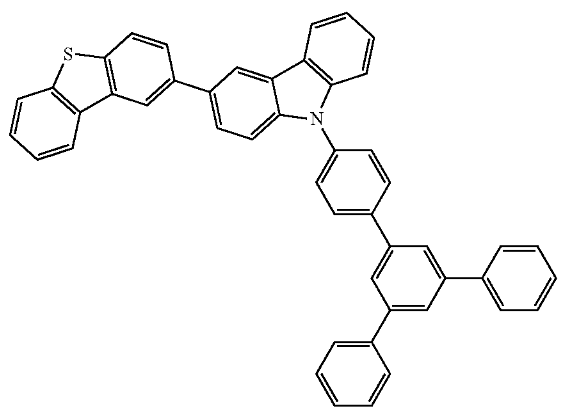
163B
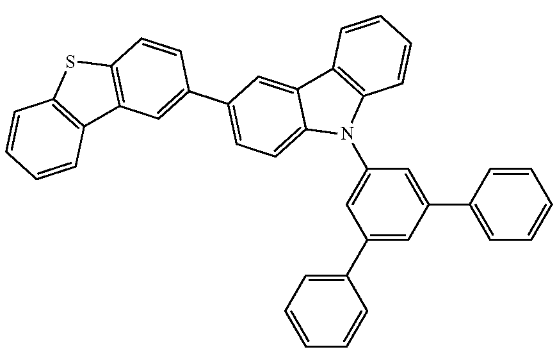
501
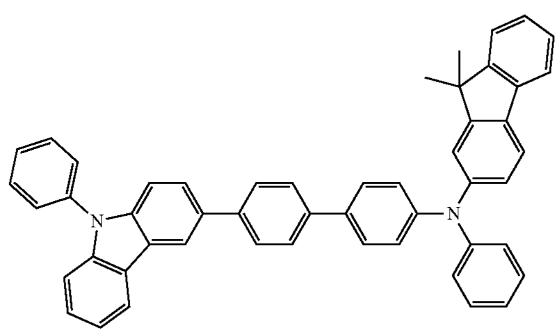

-continued
5-2
503
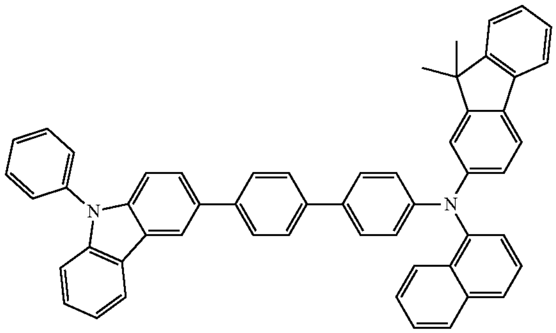
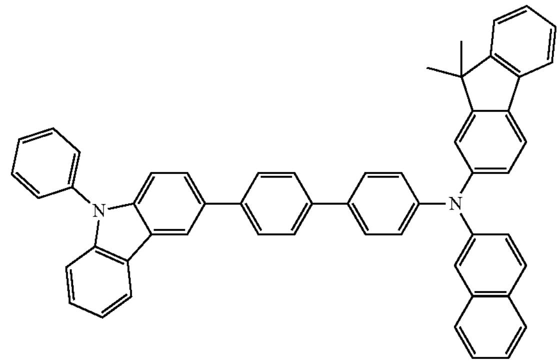
504
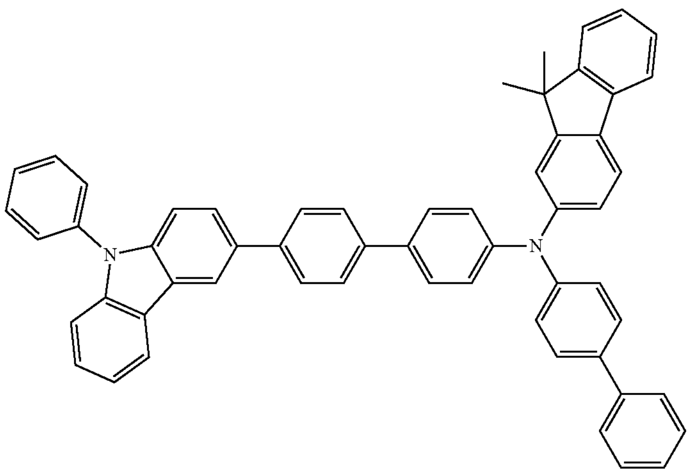
505
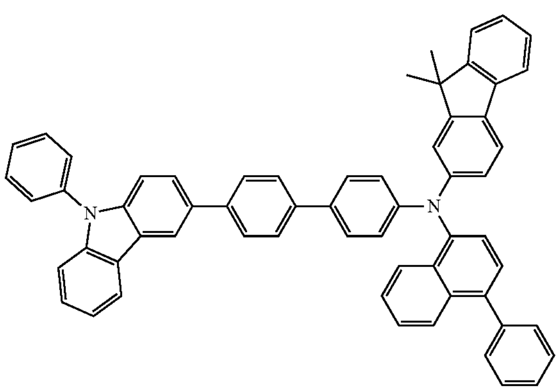
506
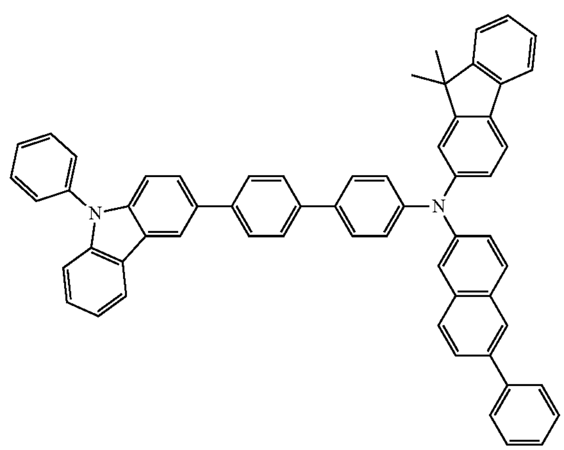

-continued
507
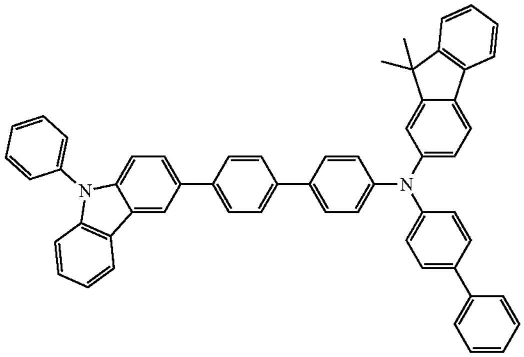
508
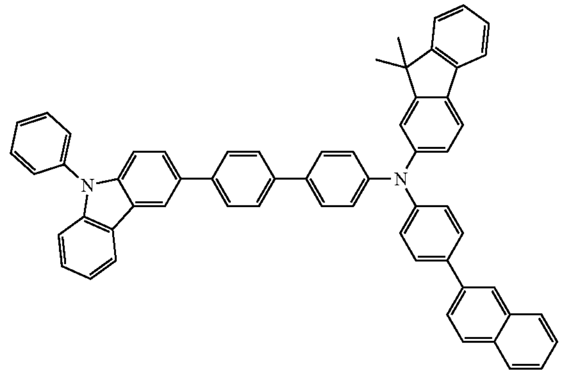
509
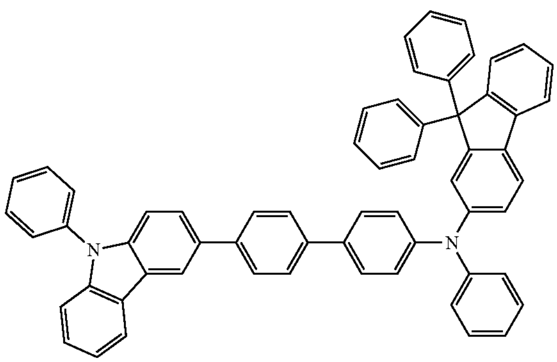
510
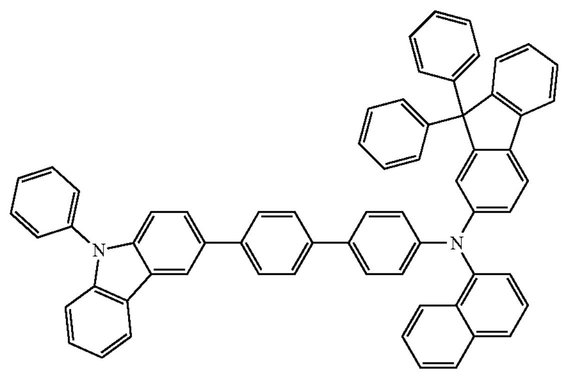
511
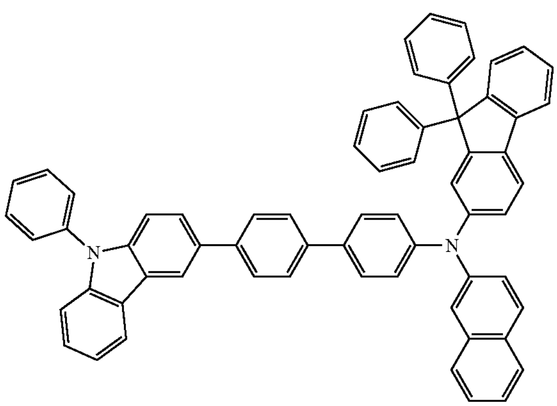
512
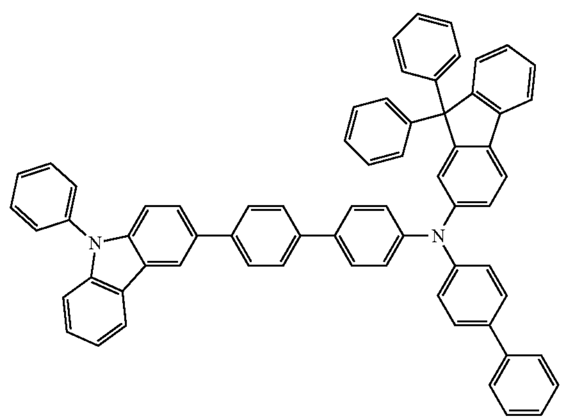

-continued
513
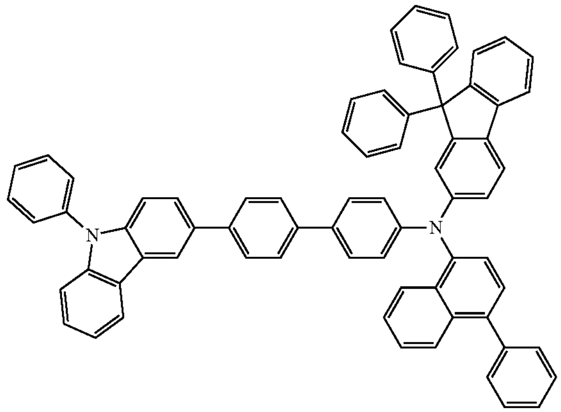
514
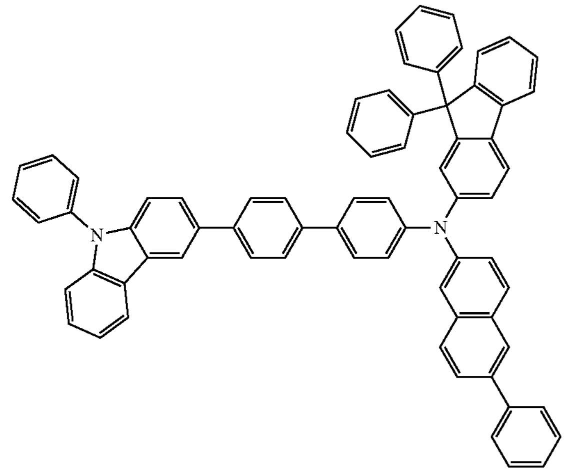
515
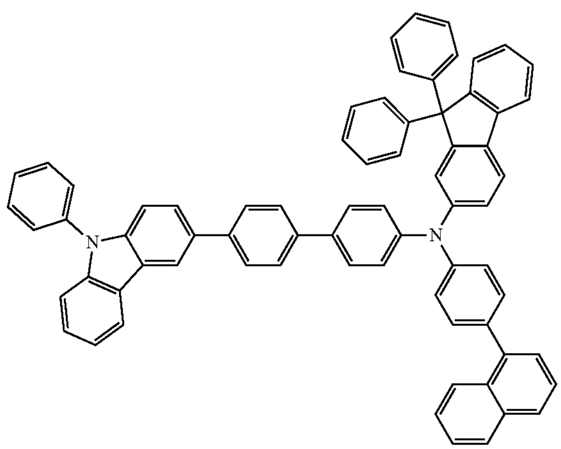
516
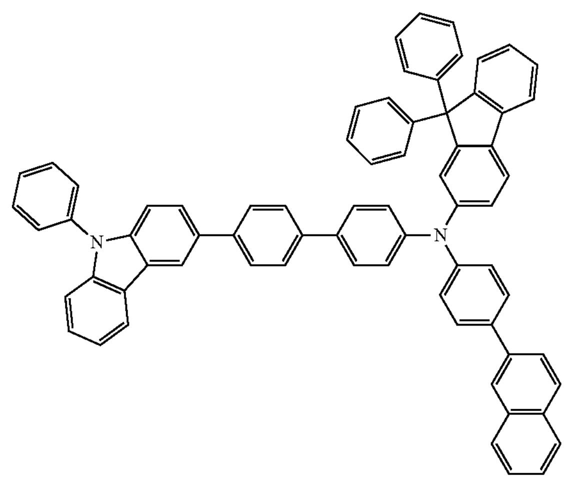
517
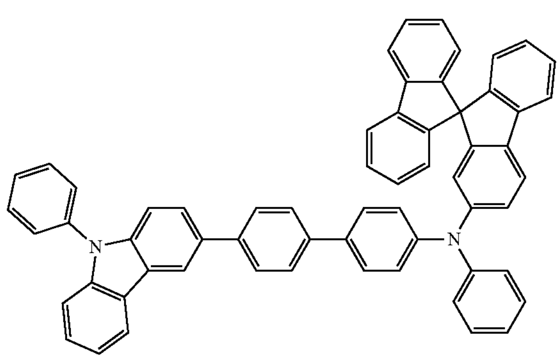
518
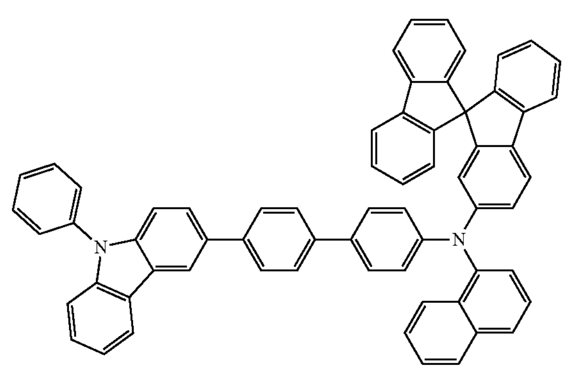

-continued
519
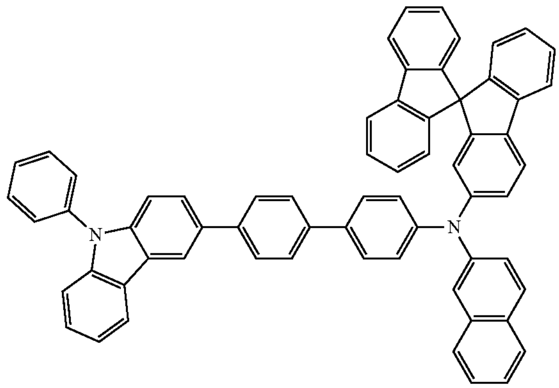
520
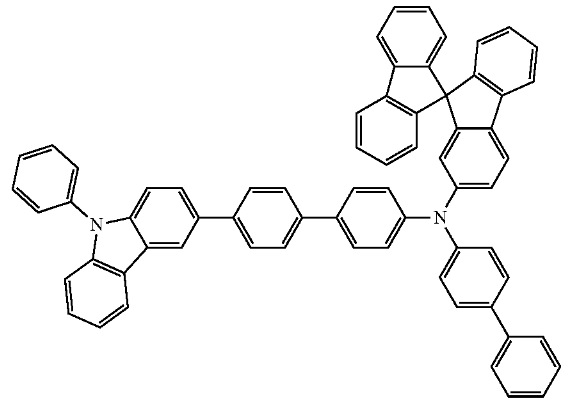
521
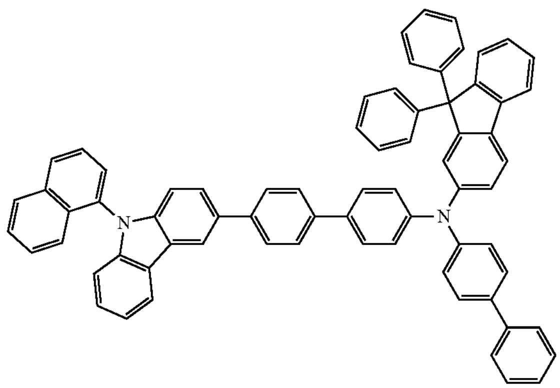
522
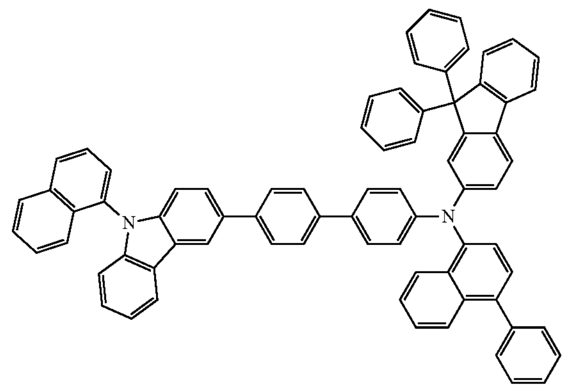
523
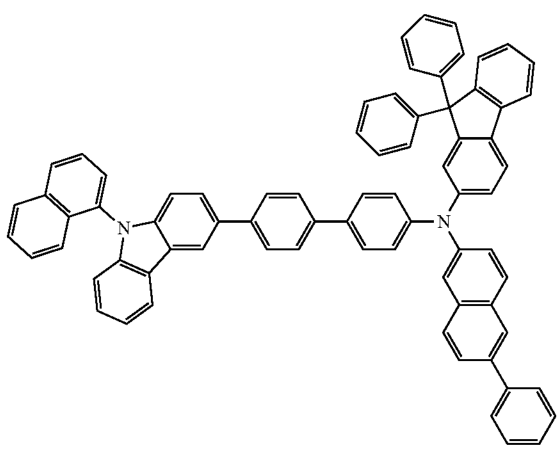
524
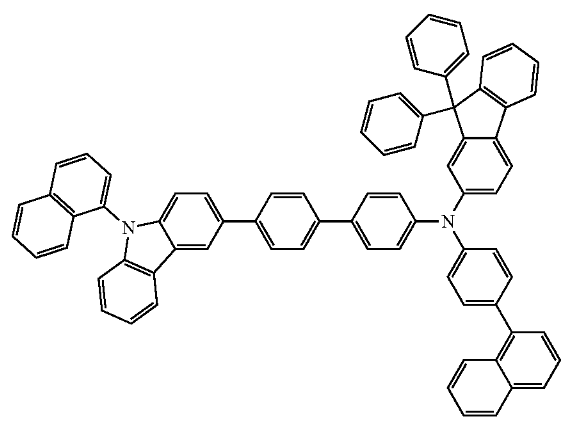
525
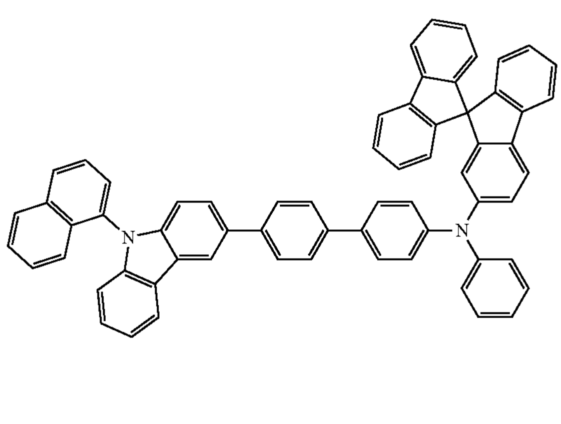
526
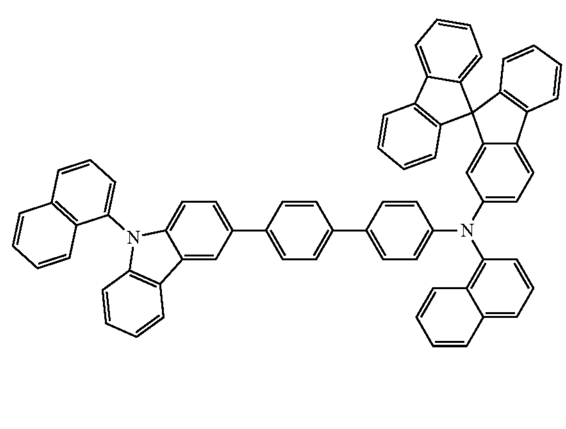

-continued
527
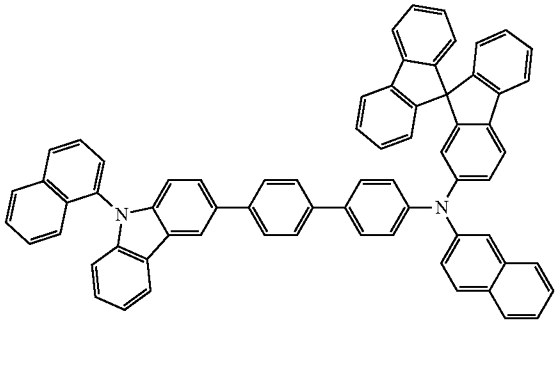
528
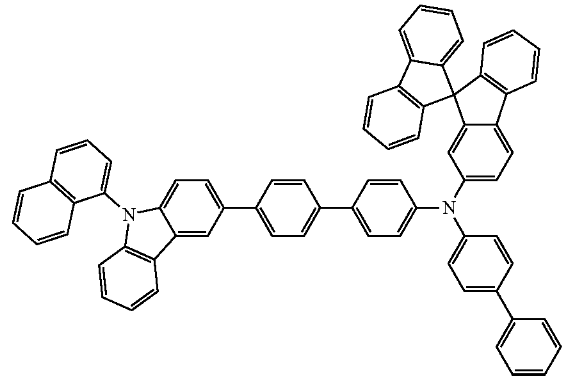
529
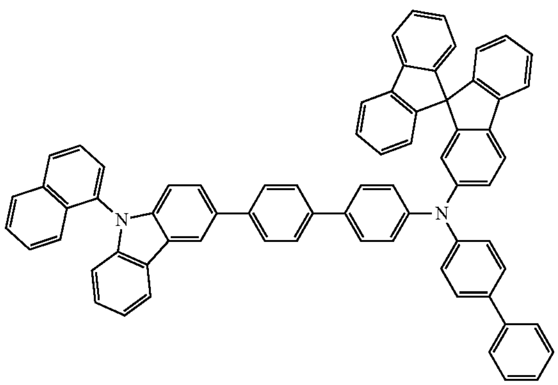
530
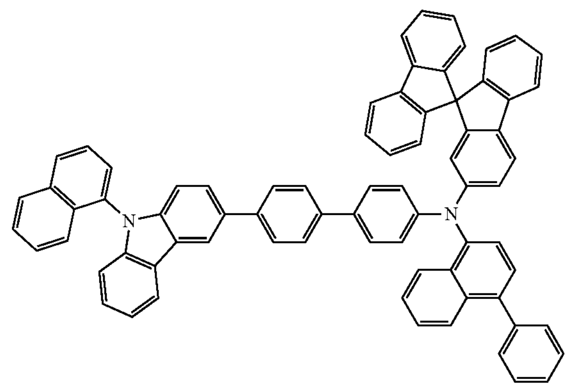
531
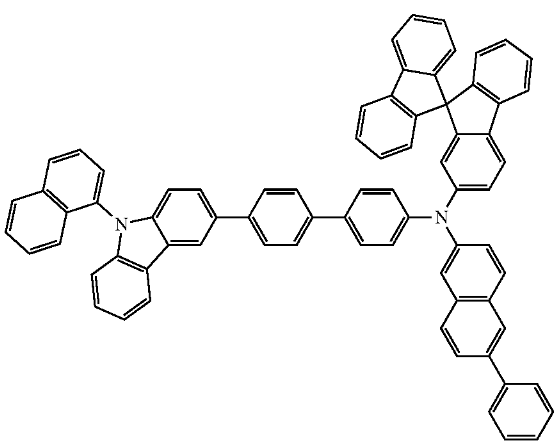
532
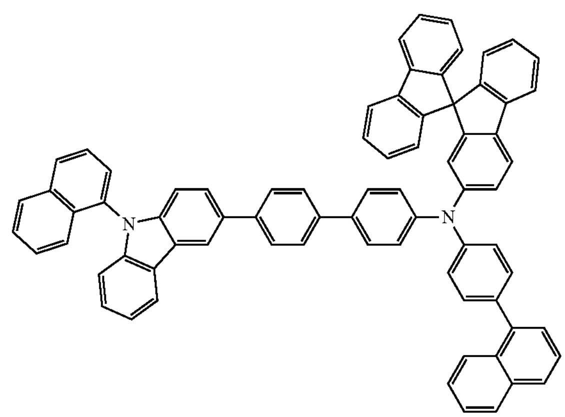

-continued
533
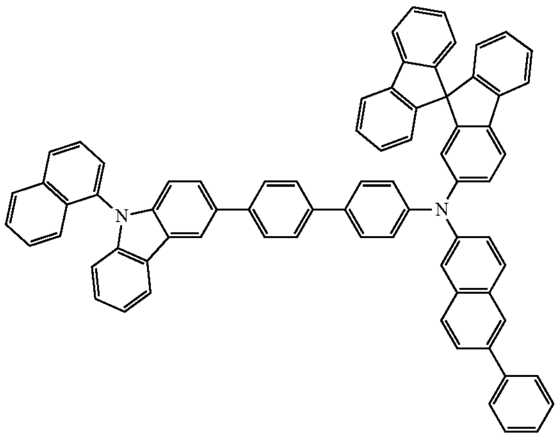
534
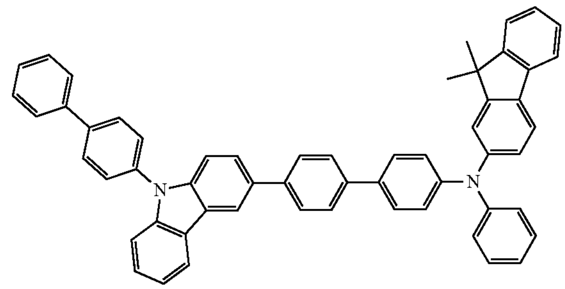
535
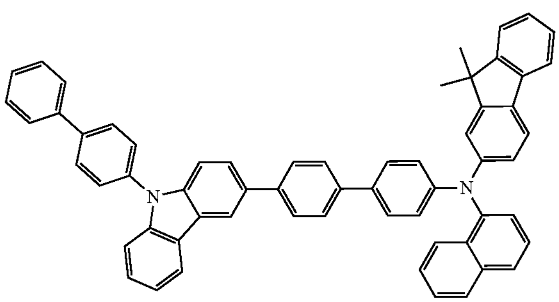
536
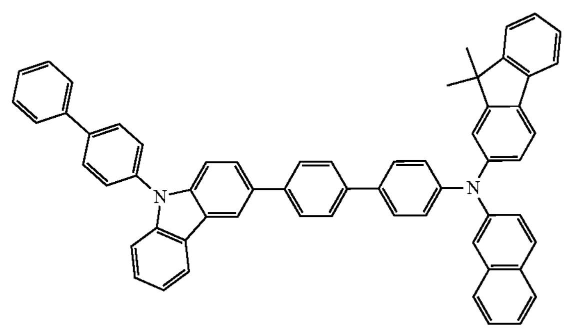
537
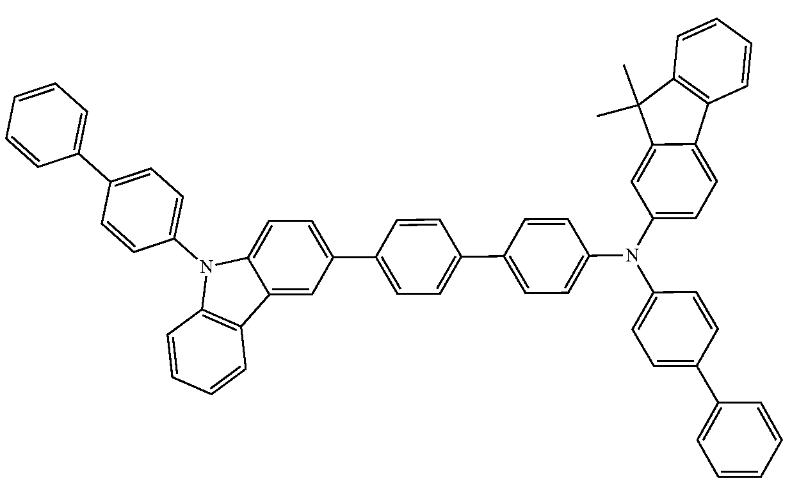

-continued
538
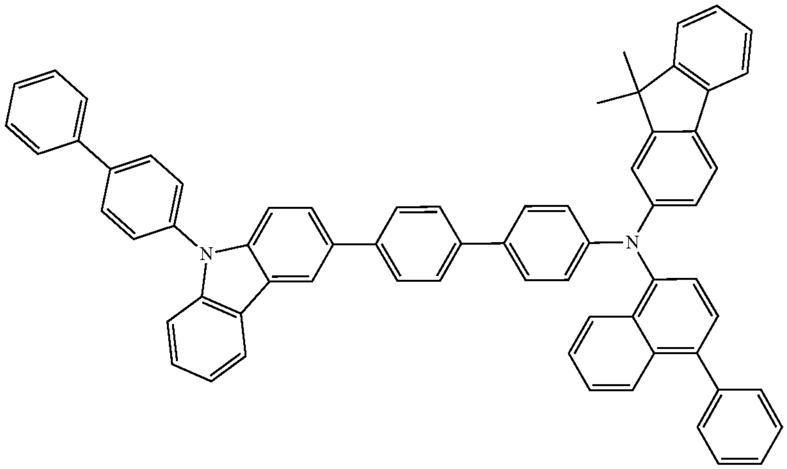
539
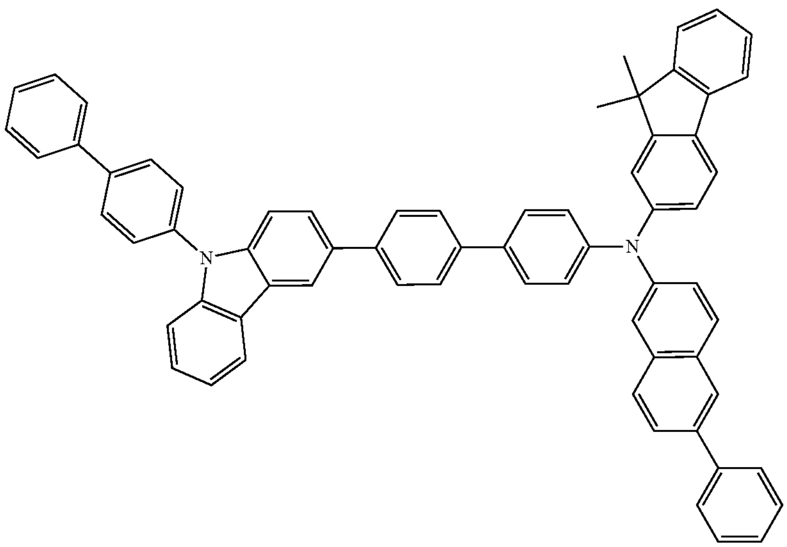
540
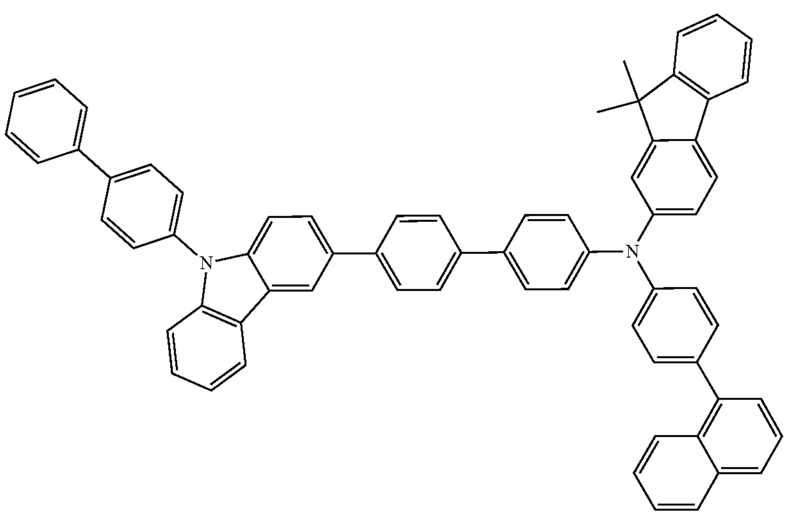

-continued
541
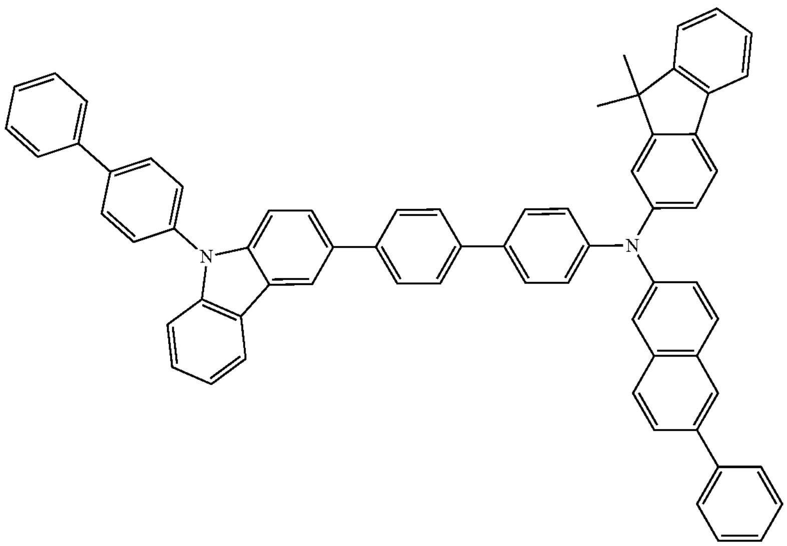
542
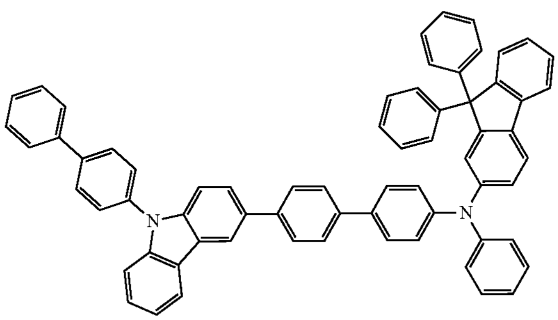
543
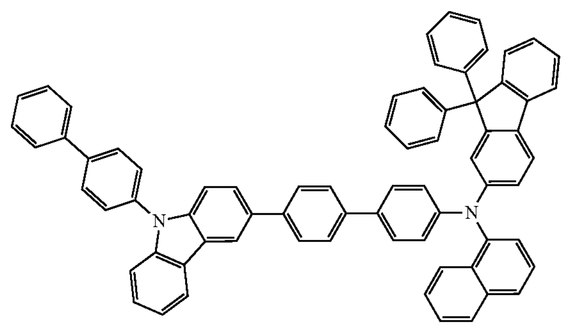
544
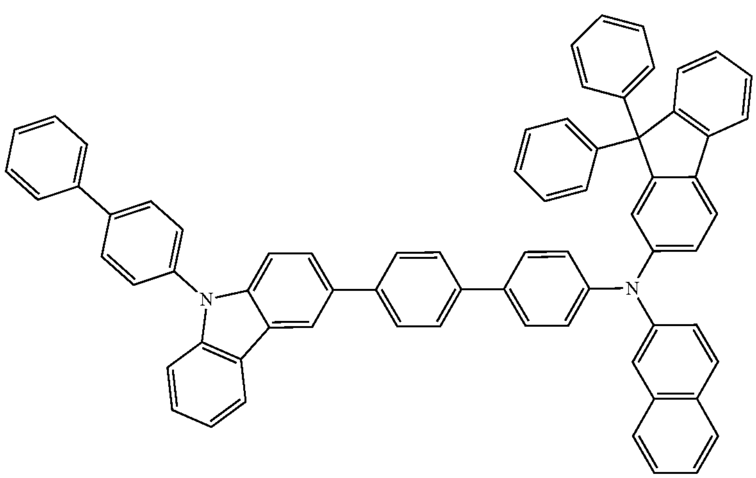

-continued
545
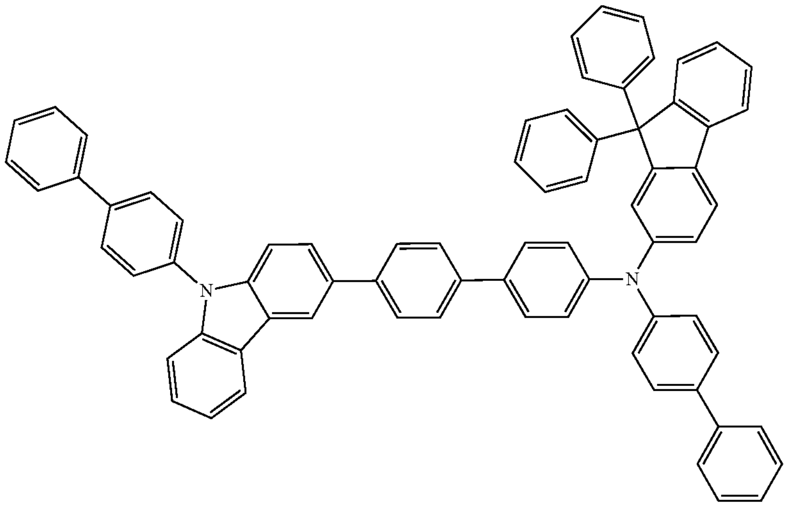
546
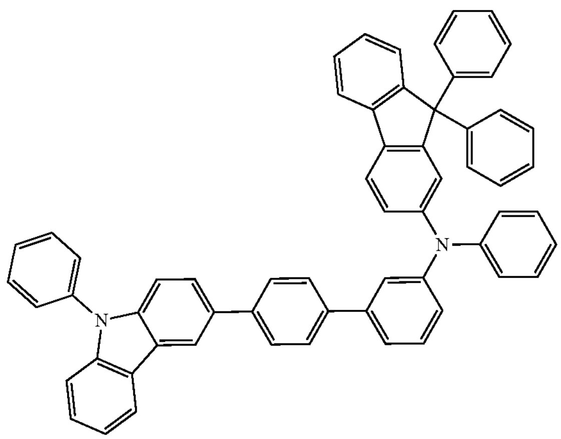
547
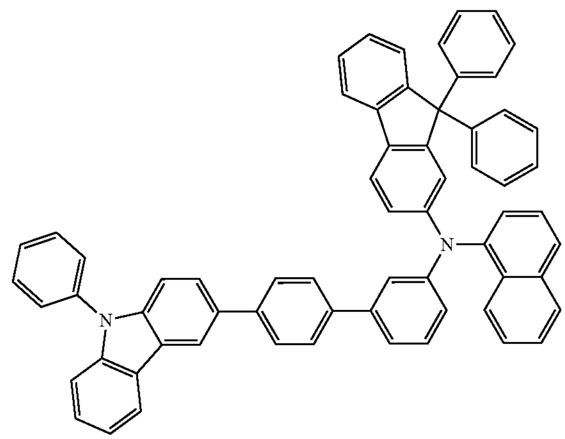
548
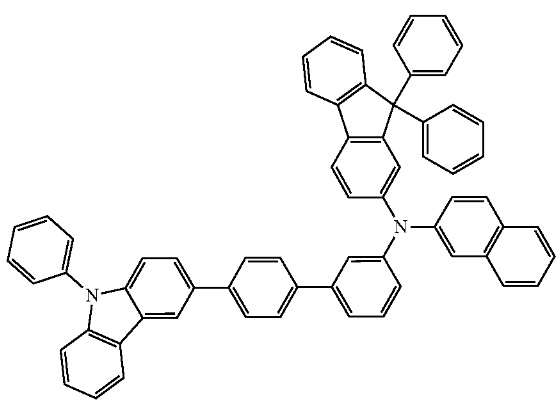
549
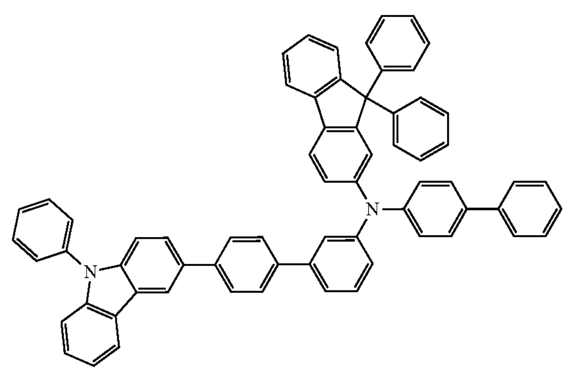

-continued
550
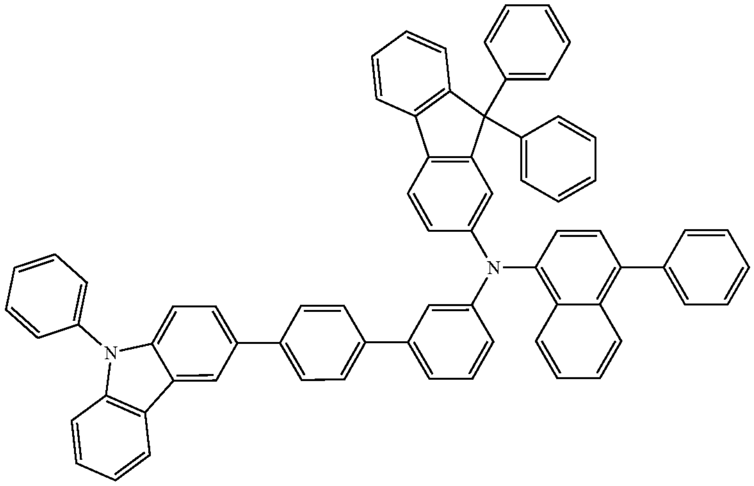
551
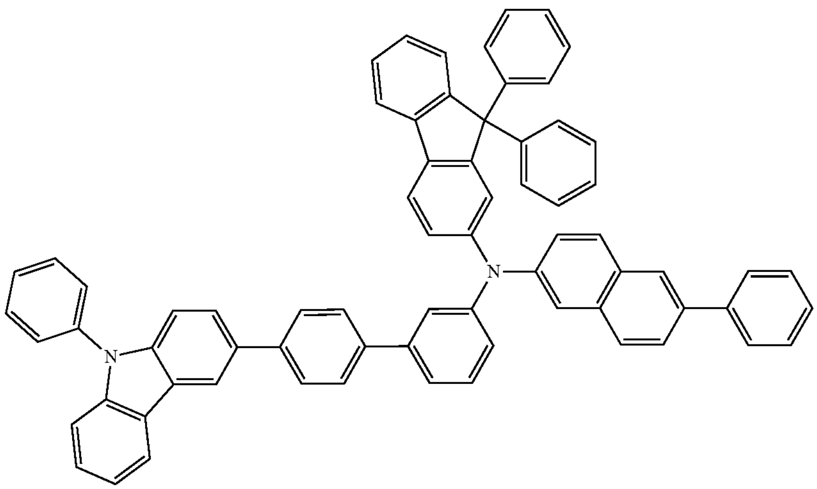
552
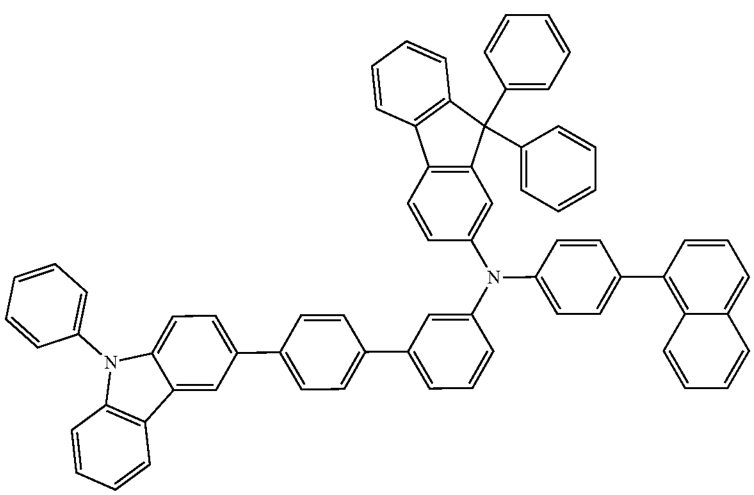

-continued
553
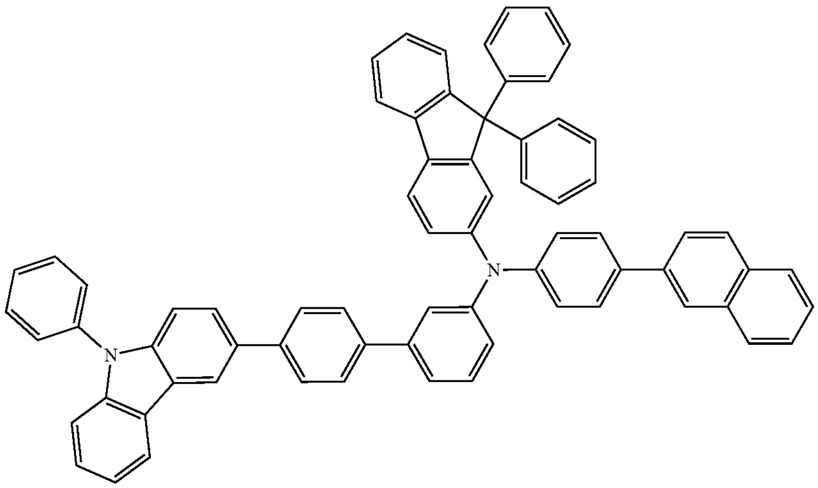
554
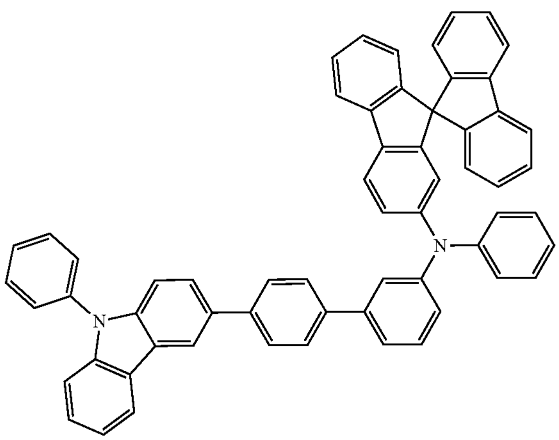
555
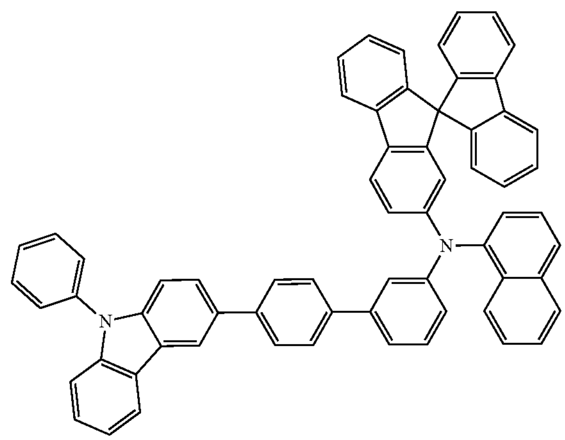
556
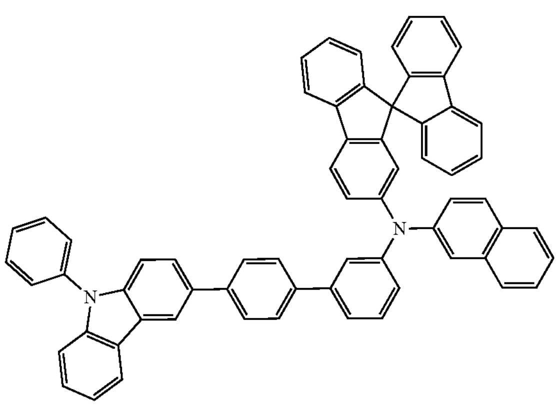
557
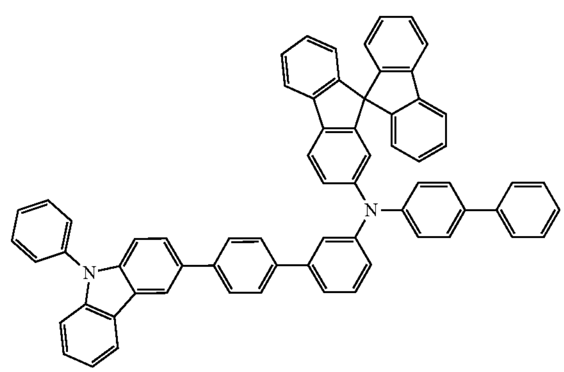

-continued
558
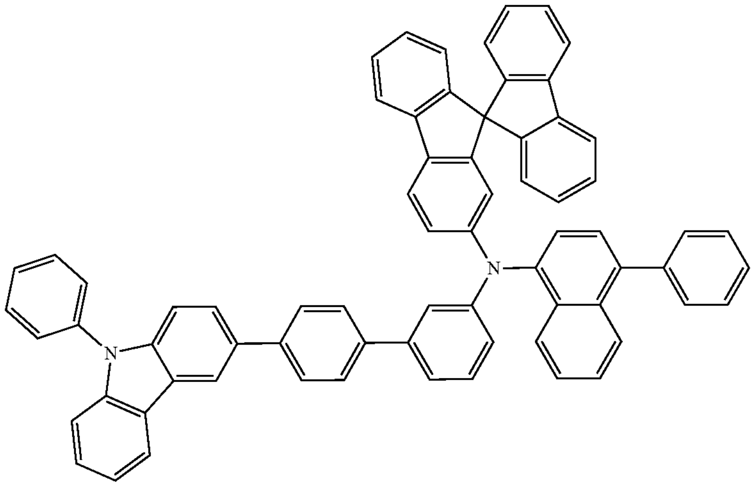
559
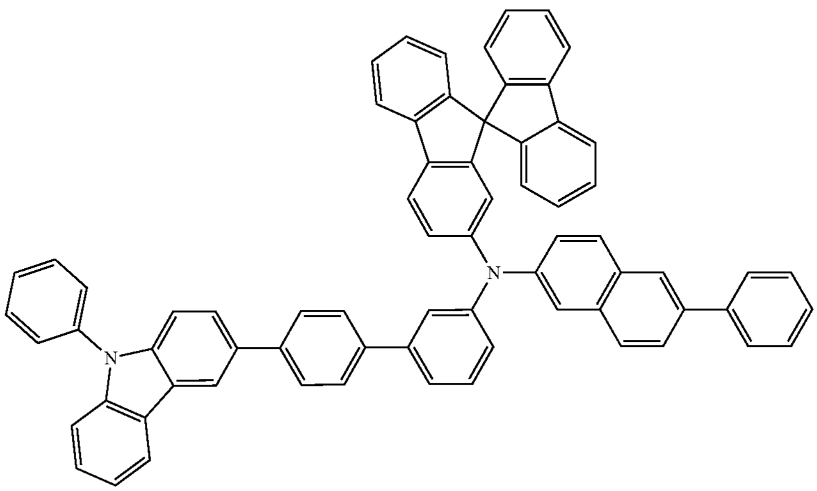
560
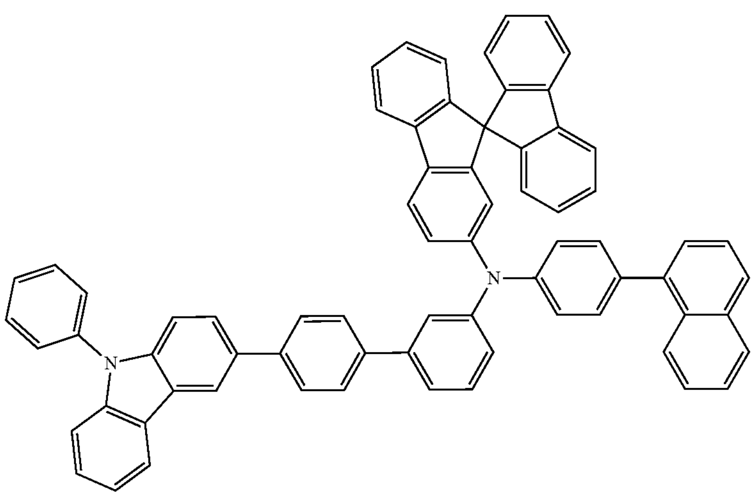

-continued
561
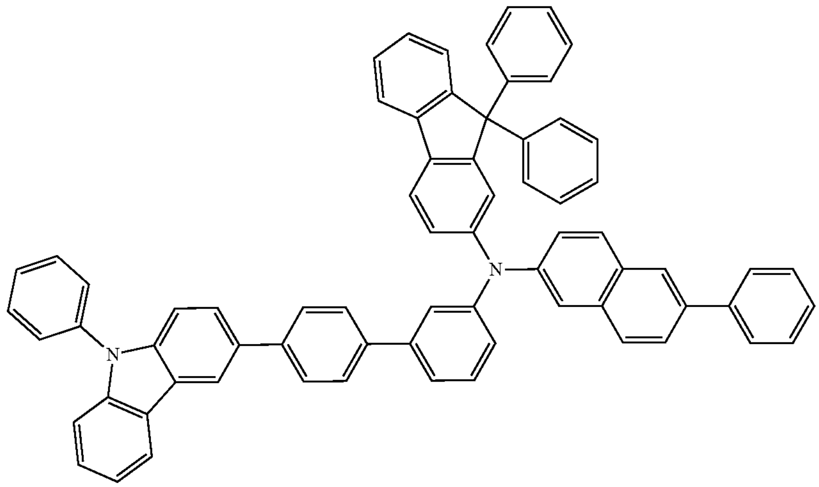
562
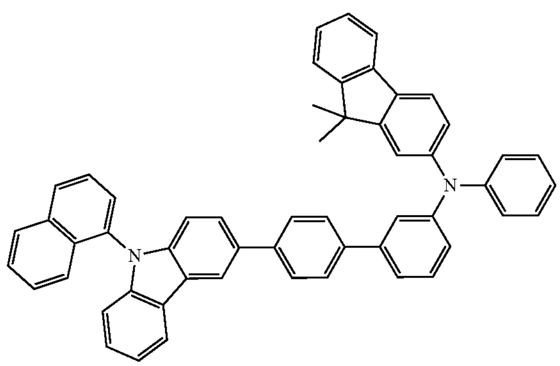
563
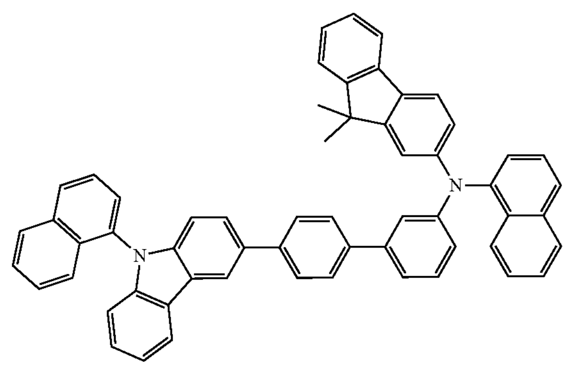
564
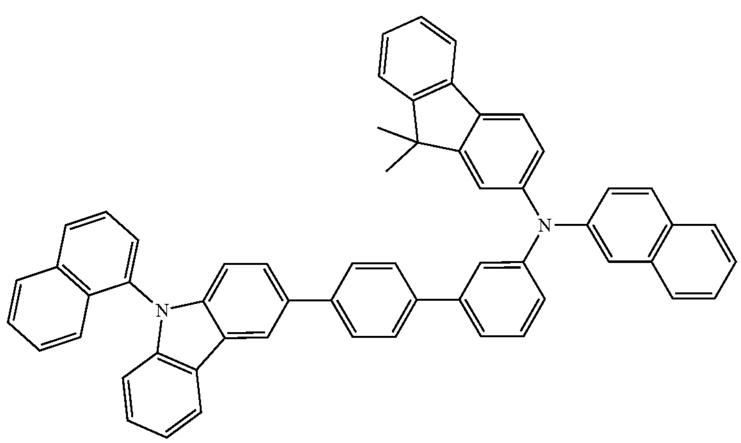

-continued
565
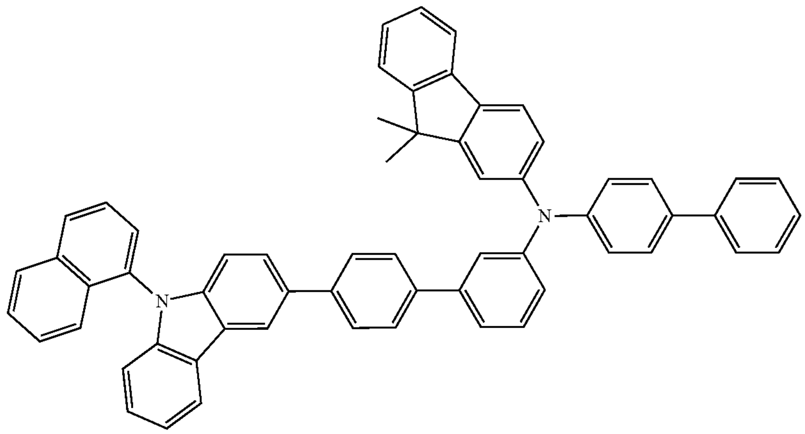
566
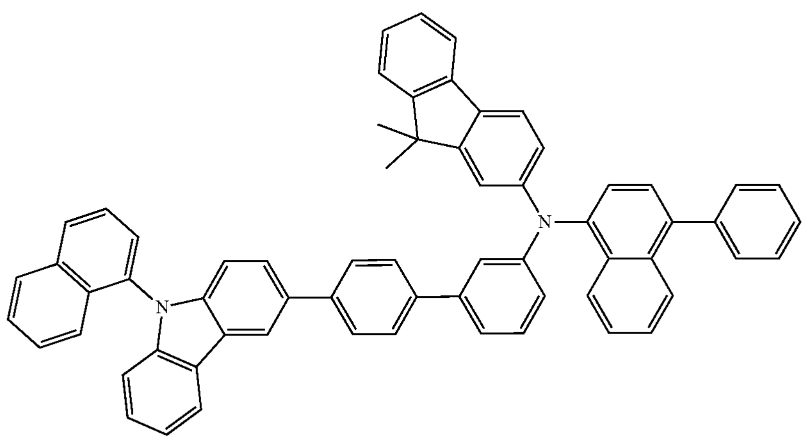
567
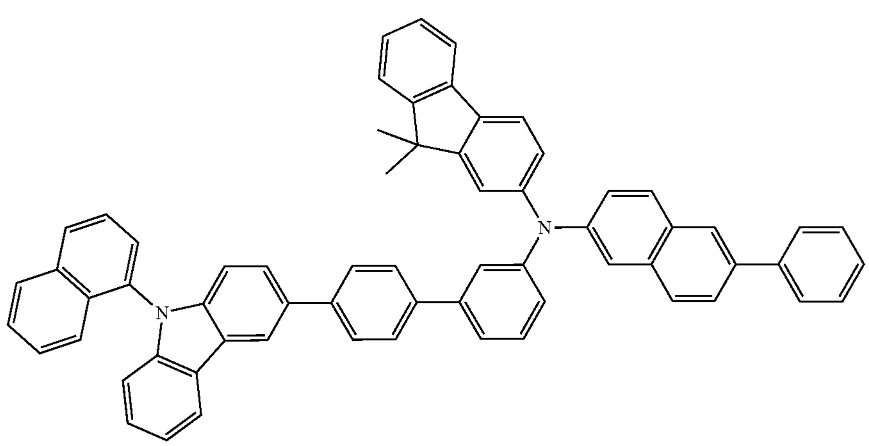

-continued
568
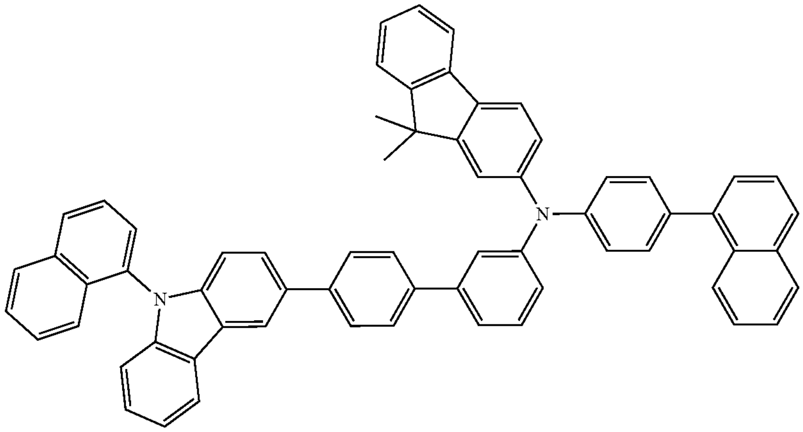
569
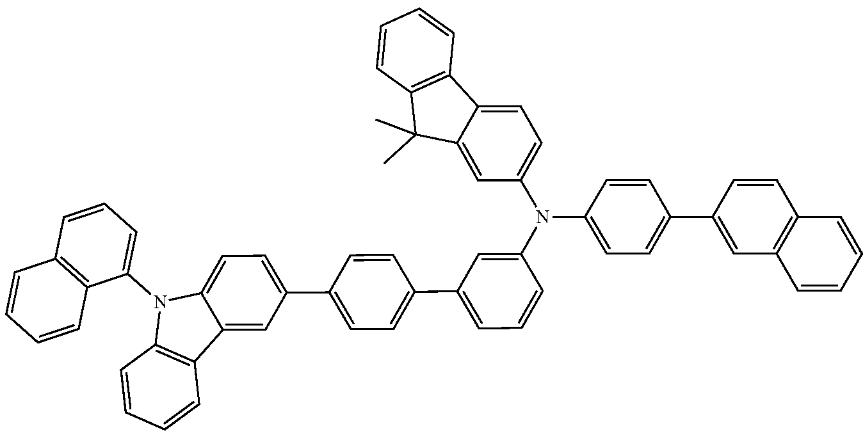
570
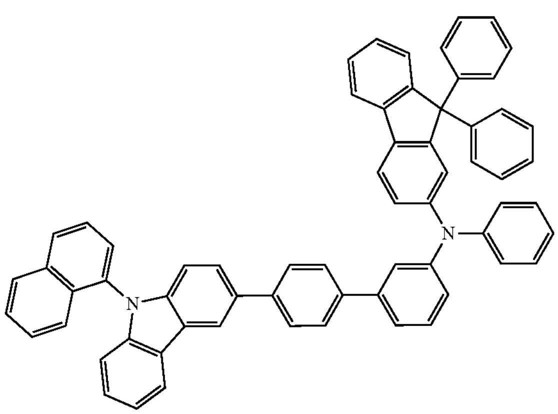
571
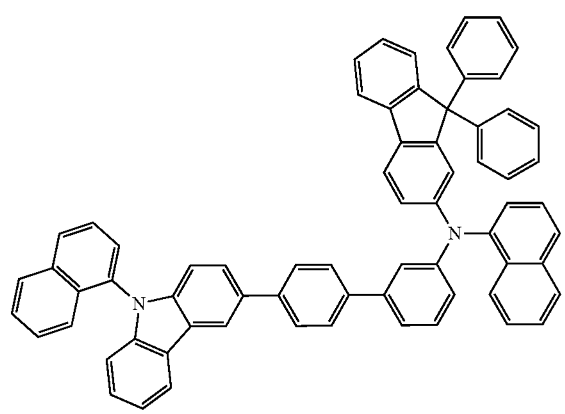

-continued
572
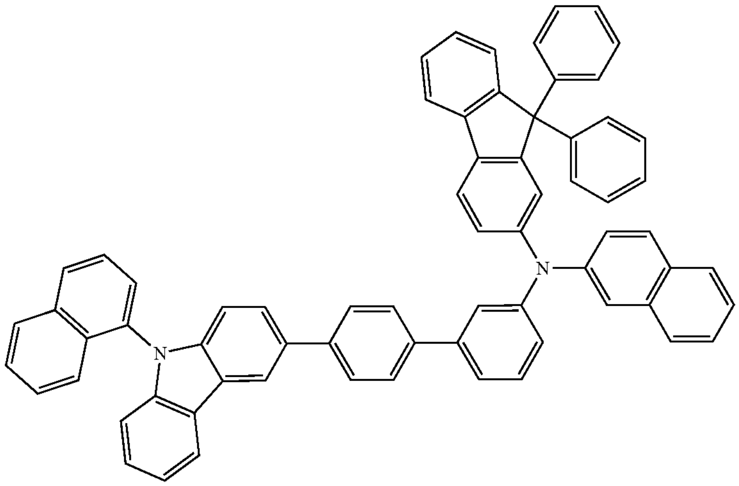
573
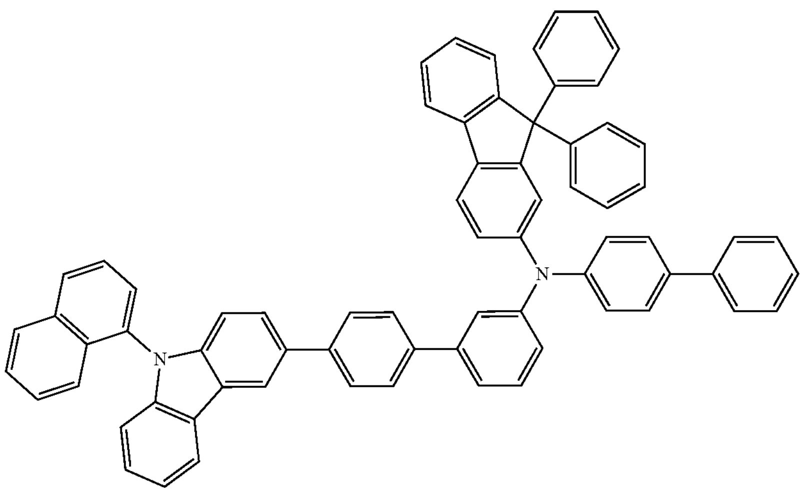
574
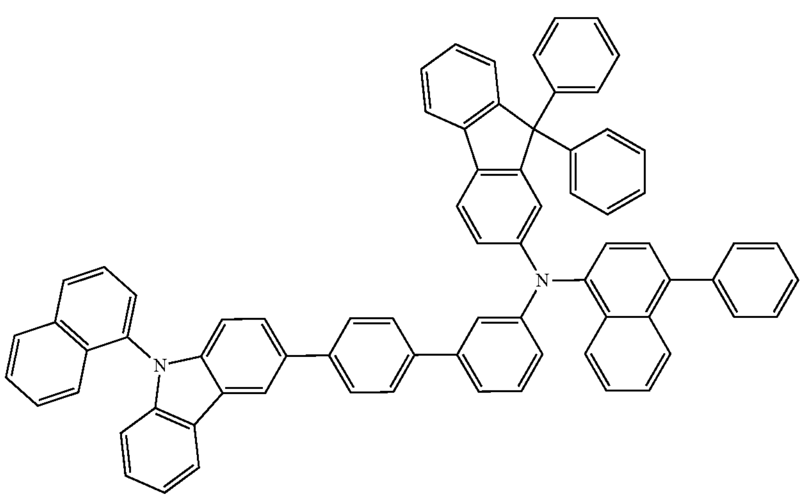

-continued
575
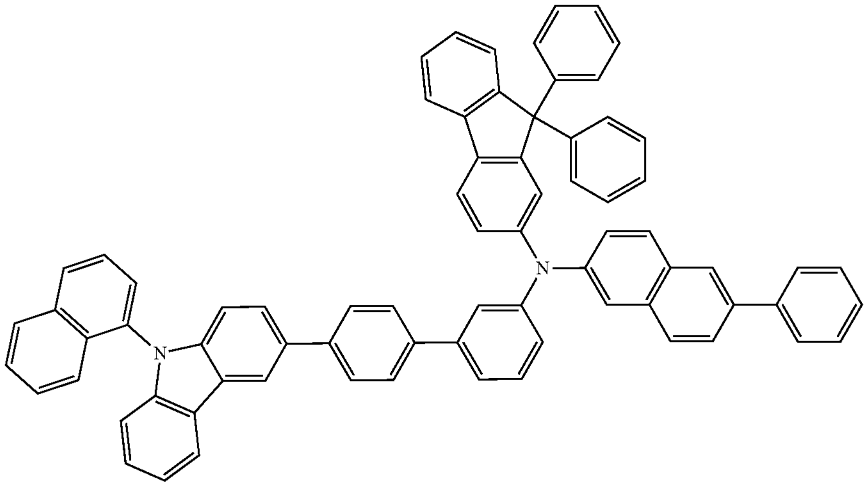
576
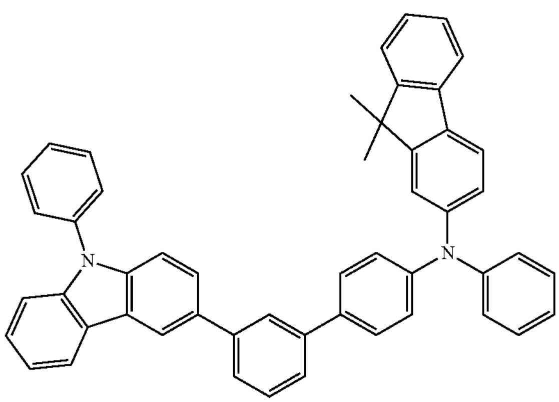
577
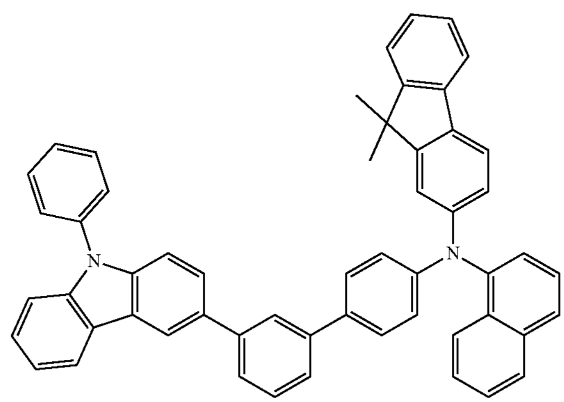
578
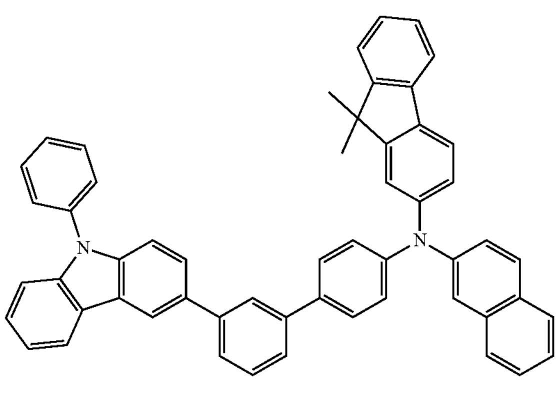
579
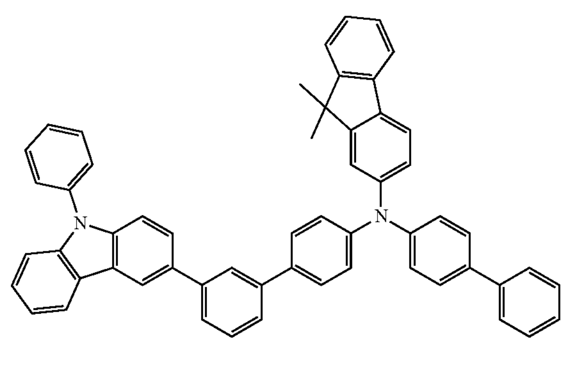

-continued
580
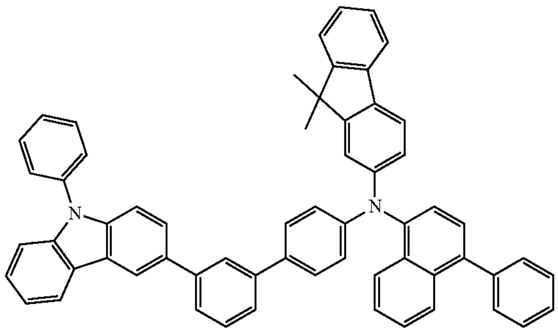
581
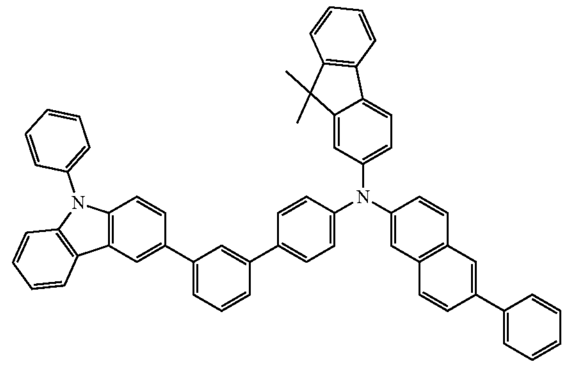
582
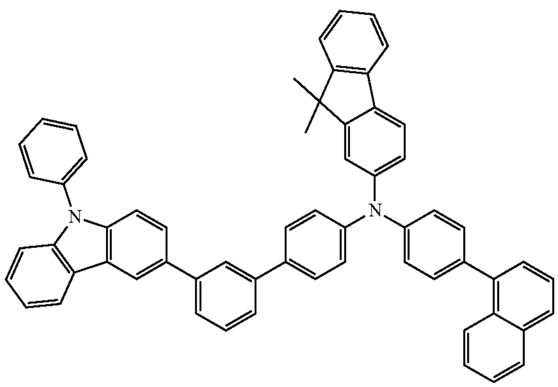
583
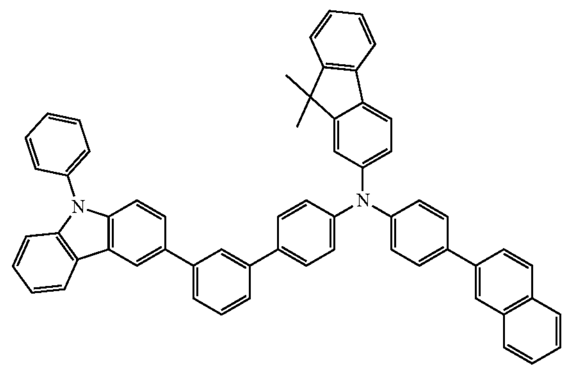
584
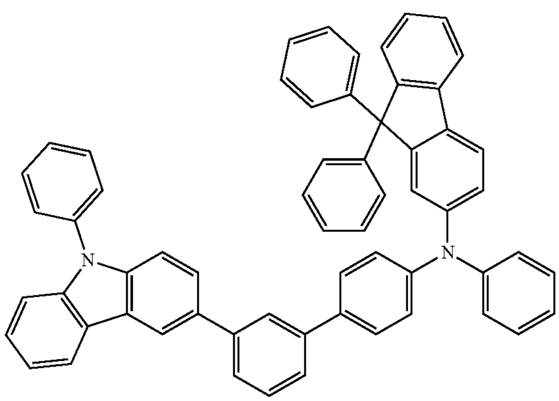
585
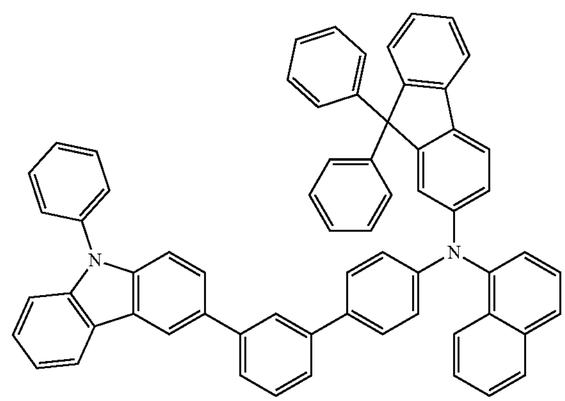
586
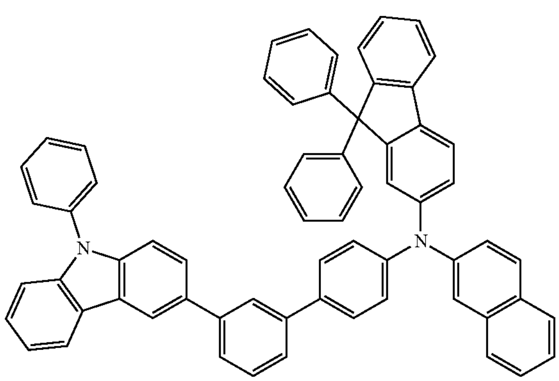
587
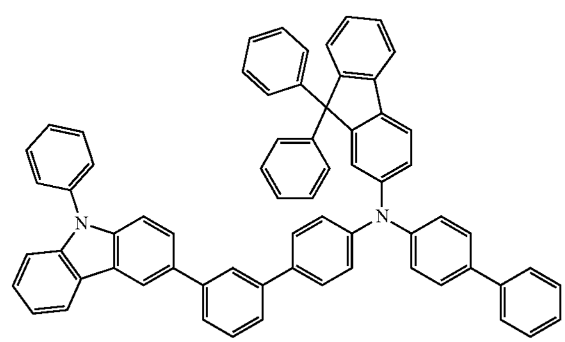

-continued
588
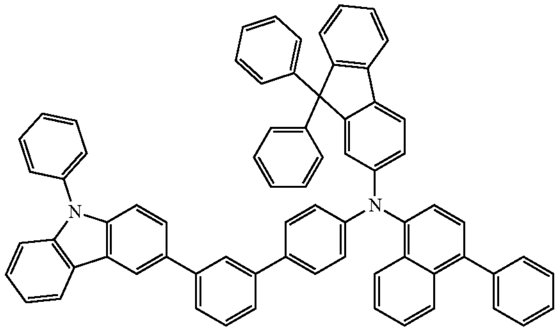
589
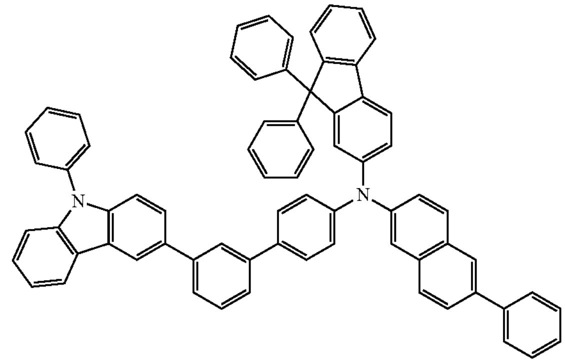
590
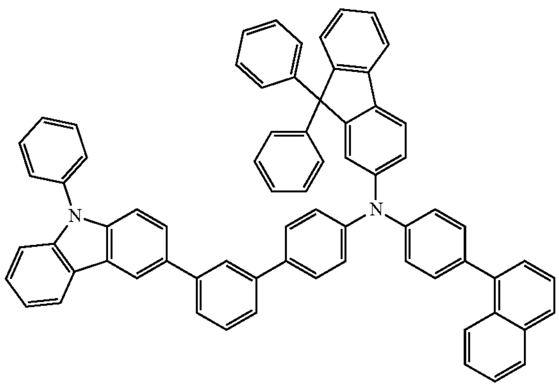
591
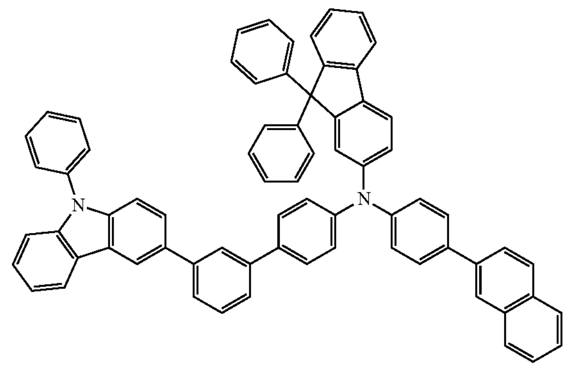
592
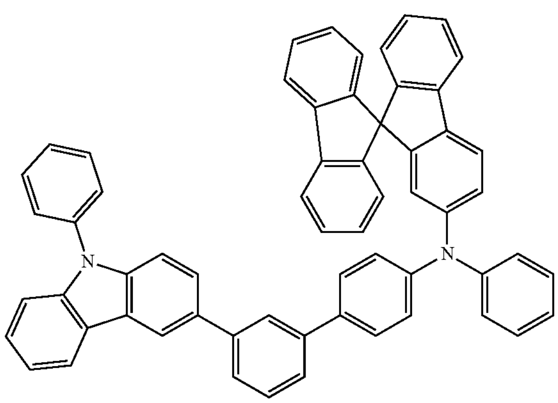
593
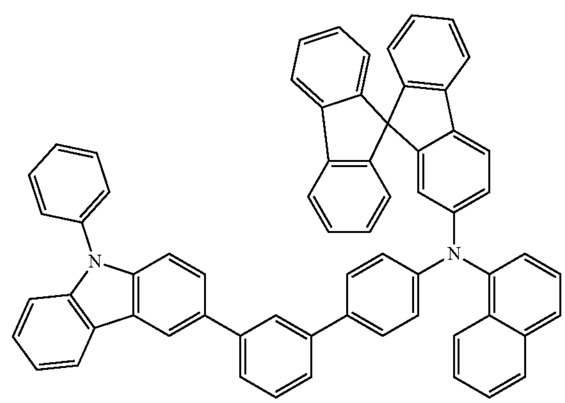
594
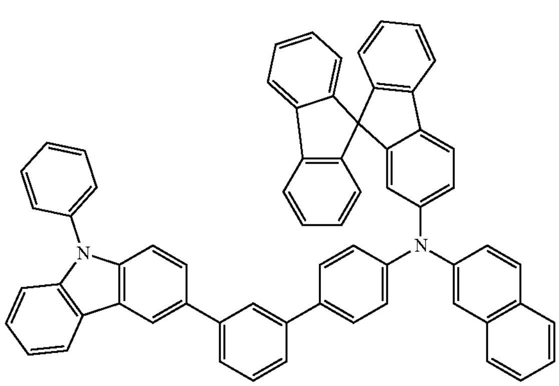
595
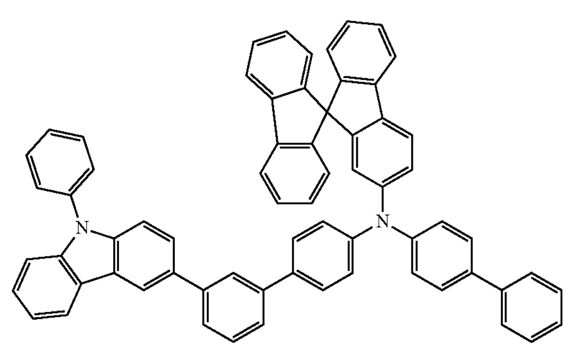

-continued
596
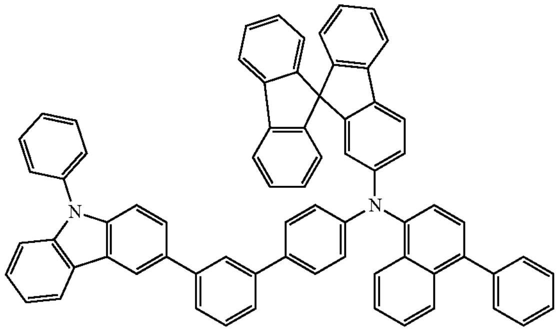
597
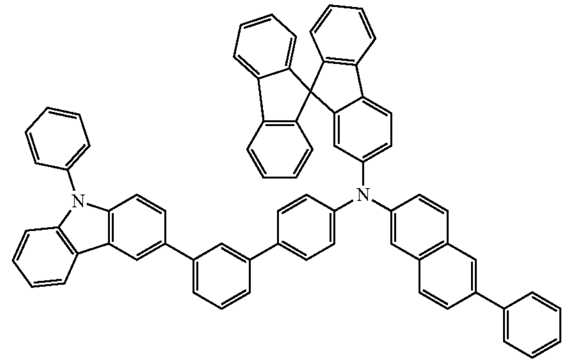
598
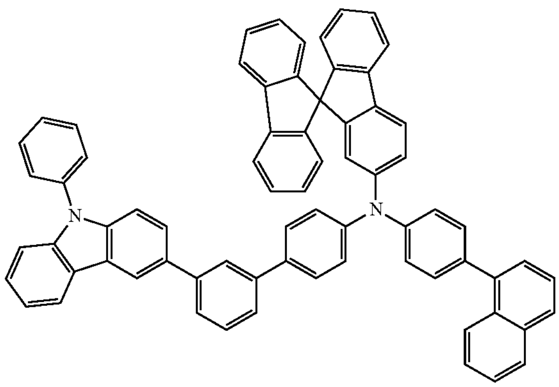
599
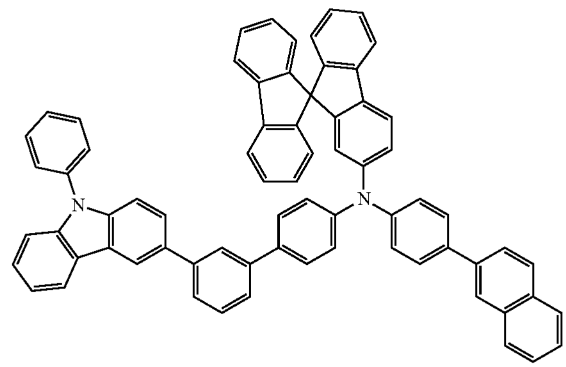
600
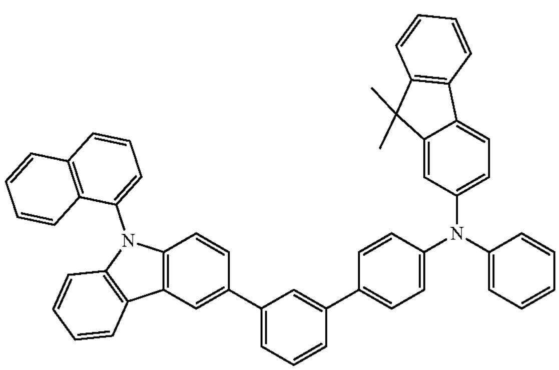
601
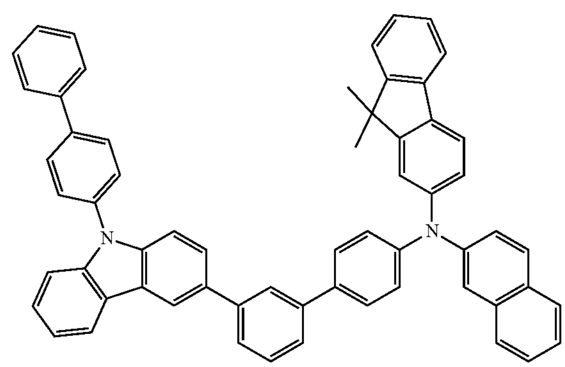
602
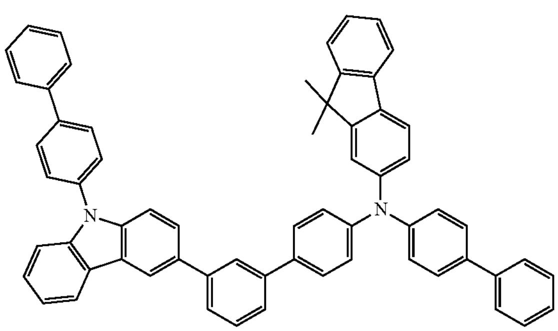
603
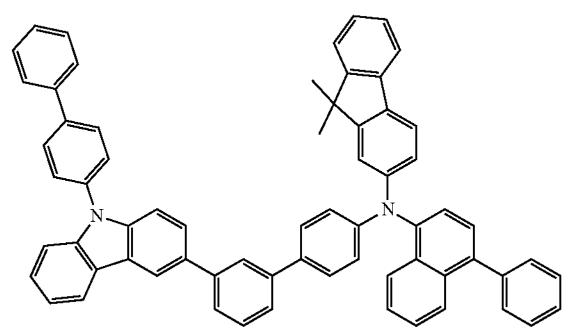

-continued
604
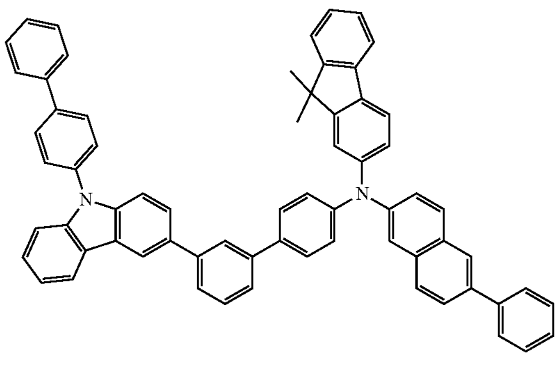
605
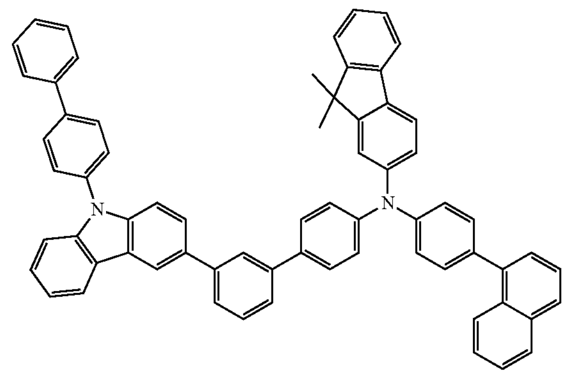
606
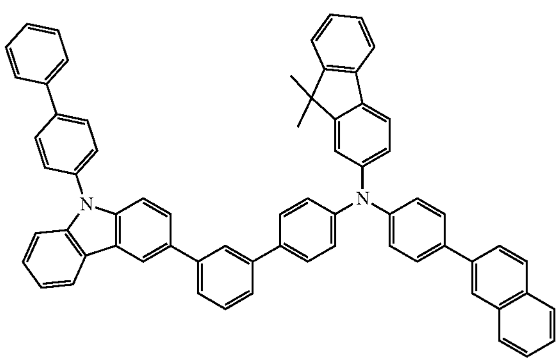
607
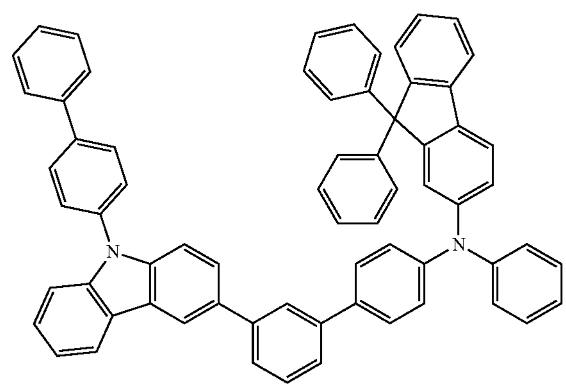
608
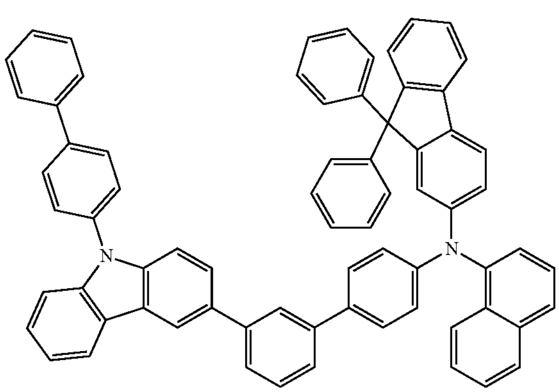
609
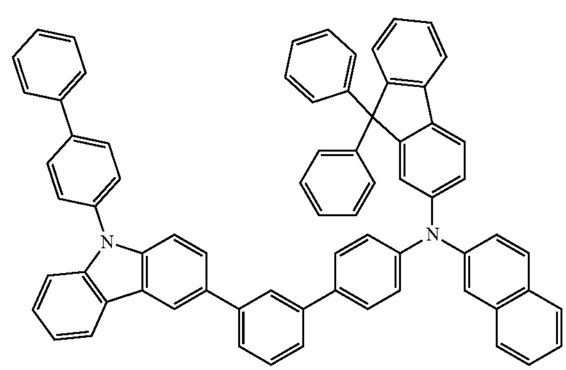
610
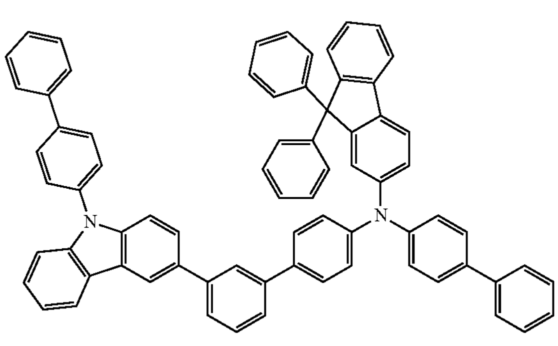
611
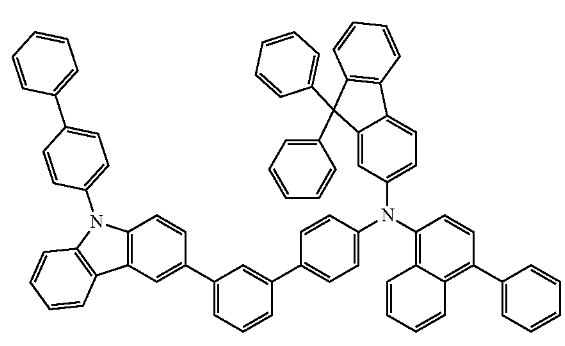

-continued
612
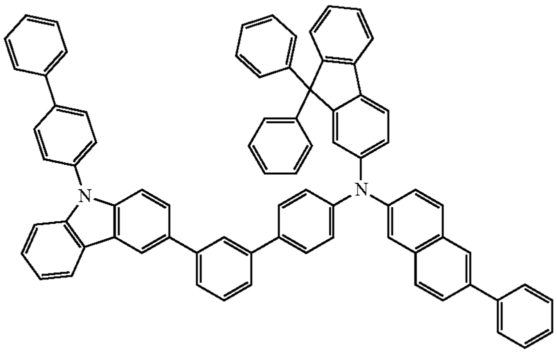
613
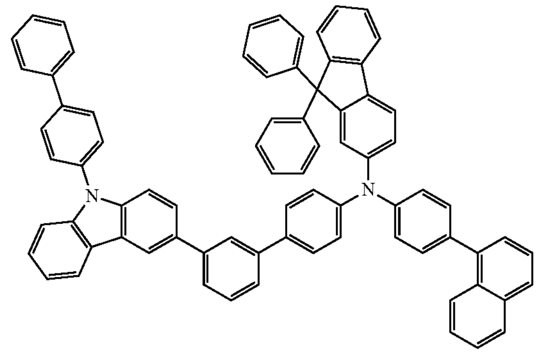
614
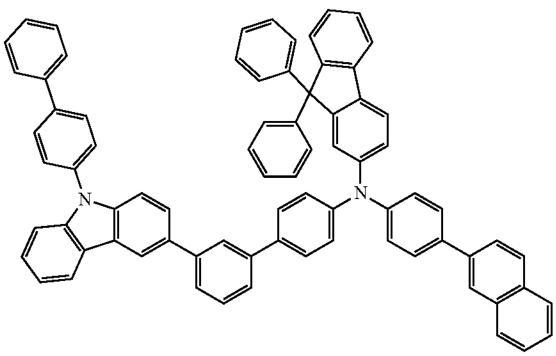
615
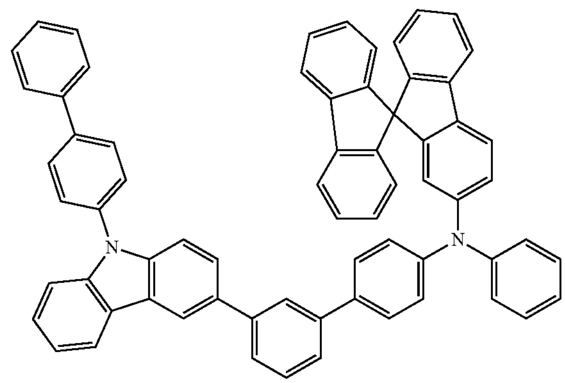
616
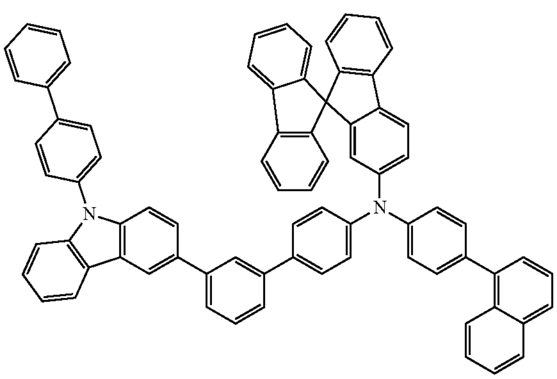
617
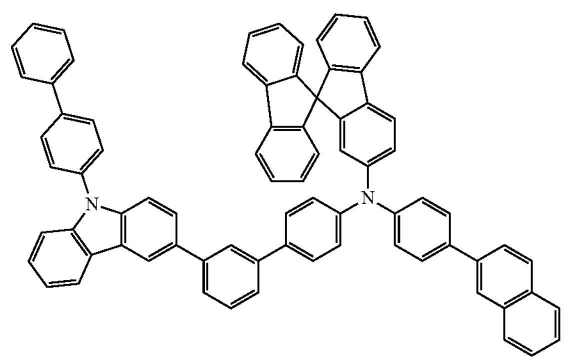
618
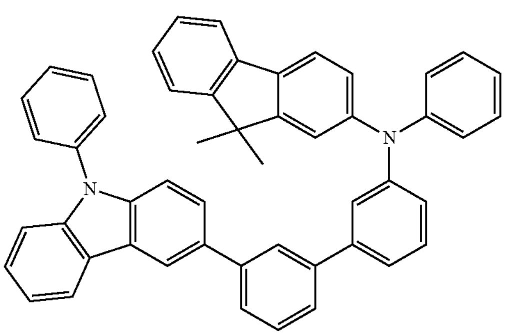
619
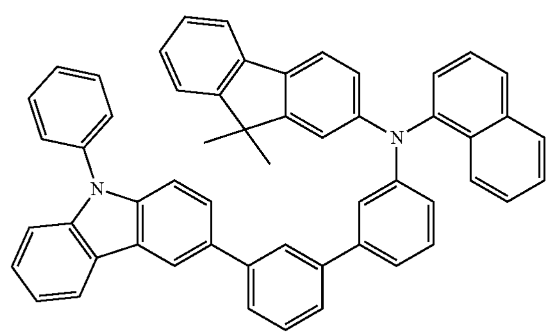

-continued
620
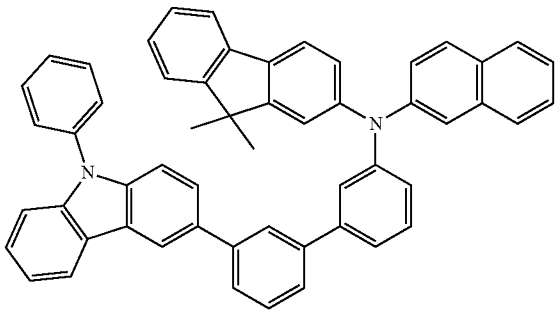
621
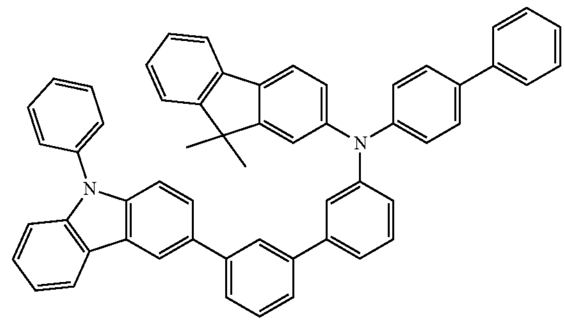
622
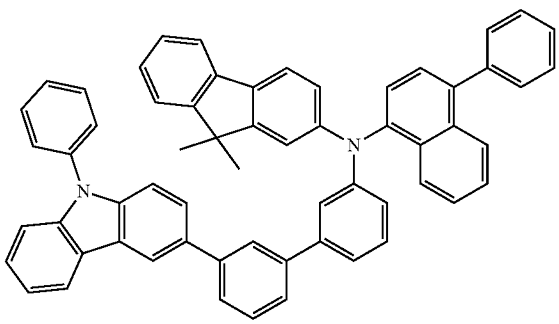
623
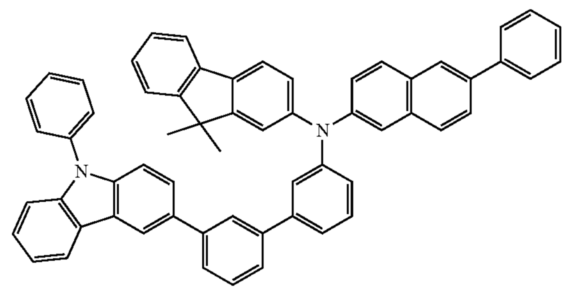
624
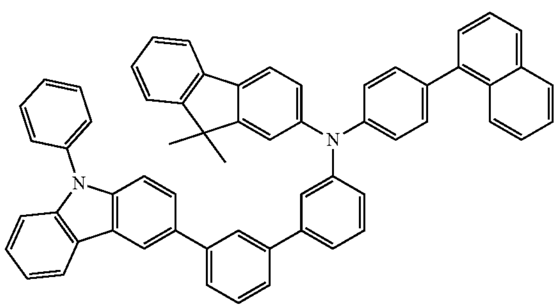
625
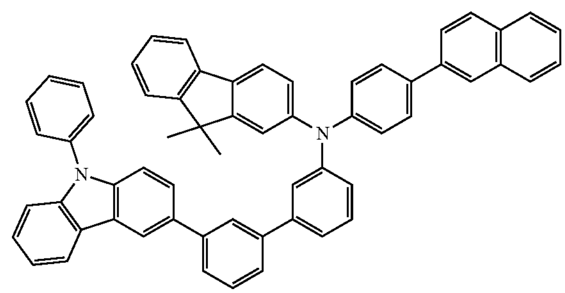
626
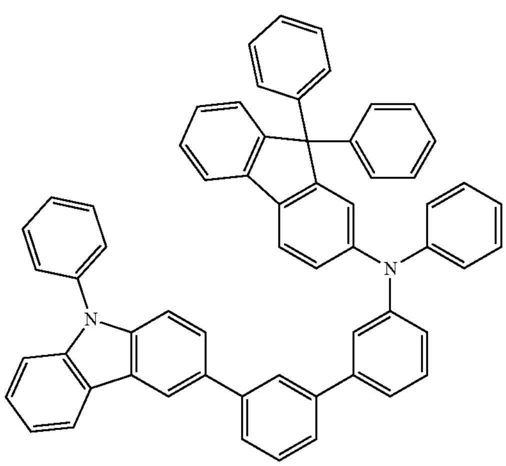
627
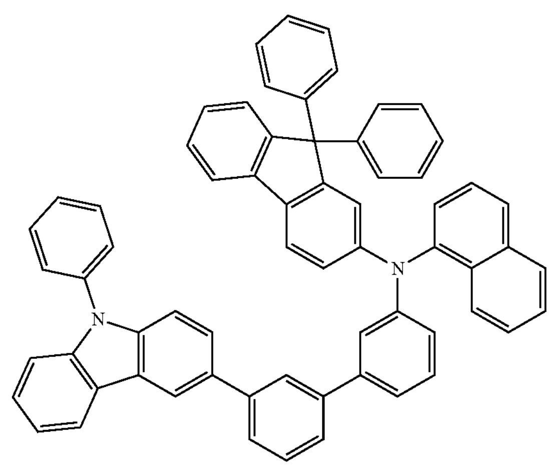

-continued
628
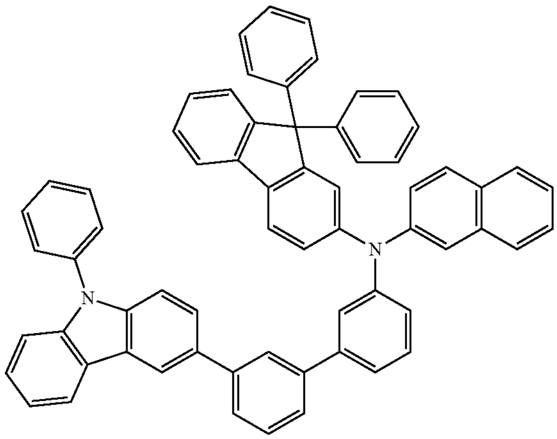
629
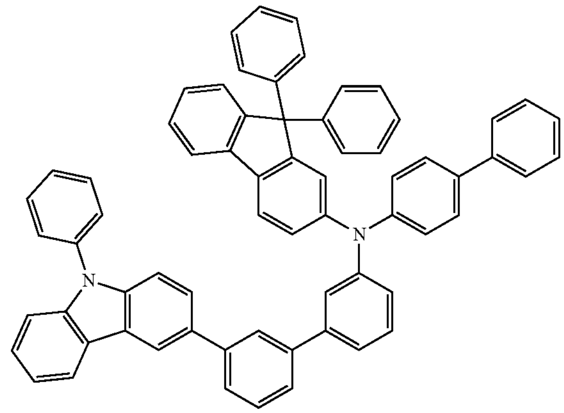
630
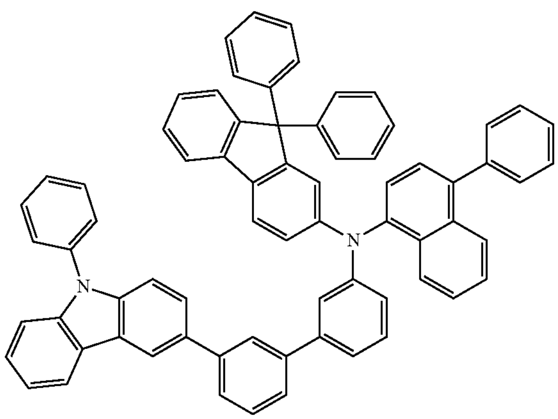
631
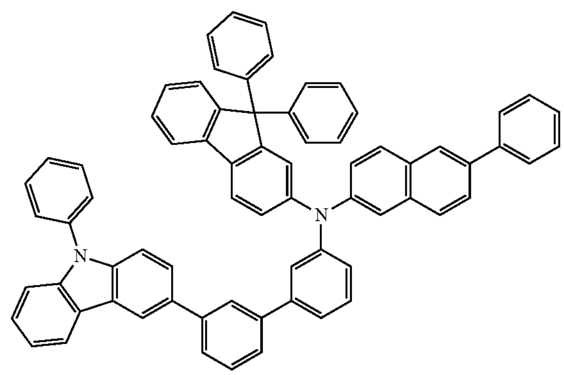
632
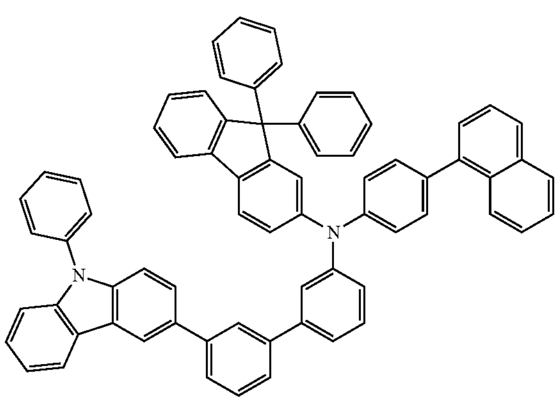
633
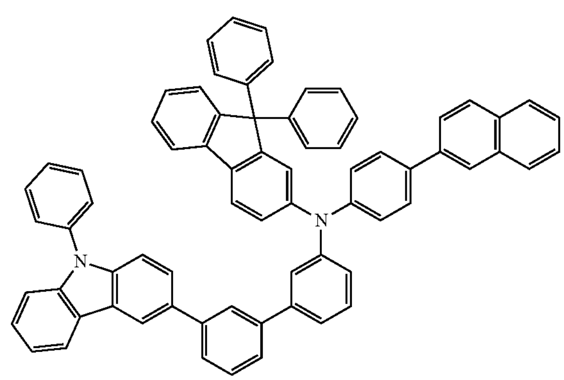

-continued
634
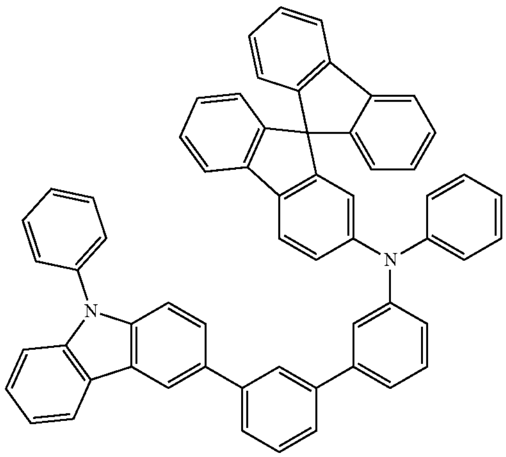
635
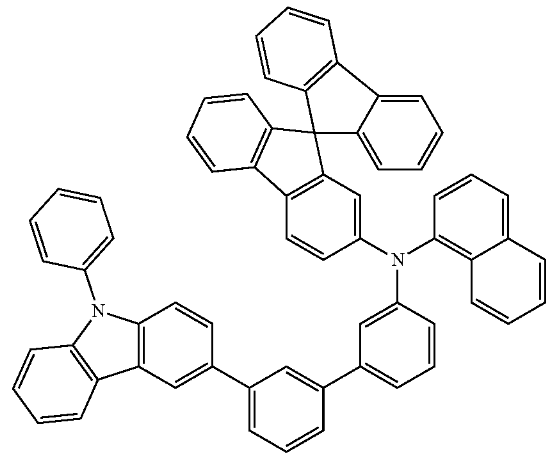
636
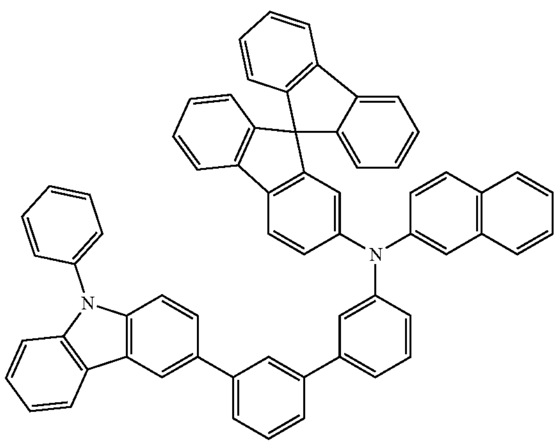
637
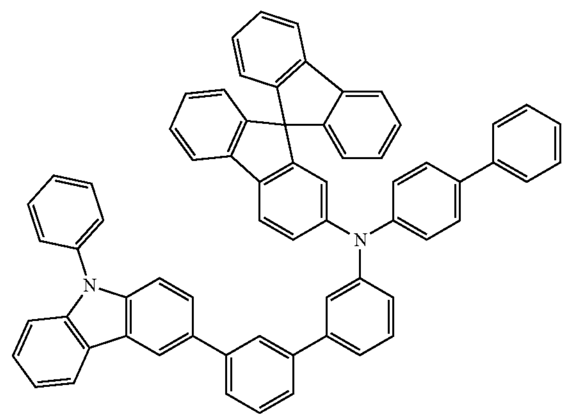
638
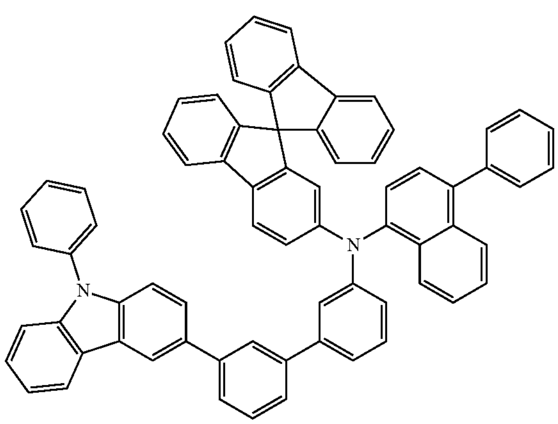
639
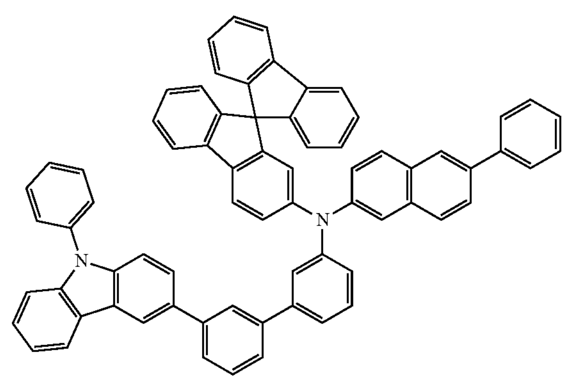

-continued
640
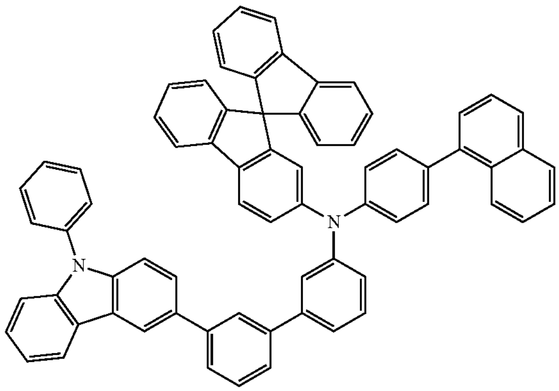
641
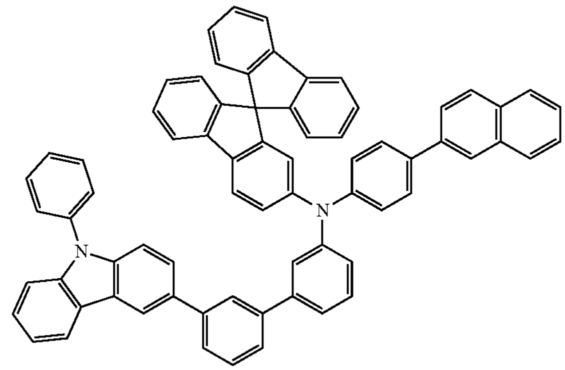
642
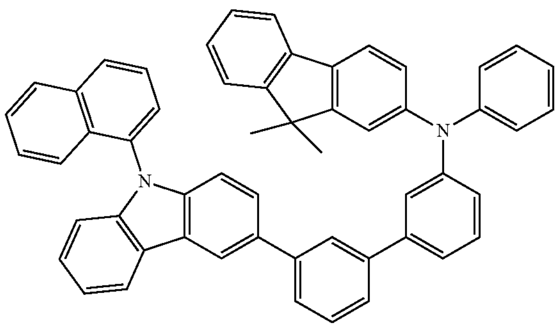
643
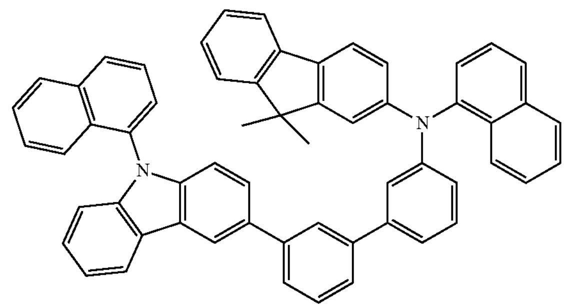
644
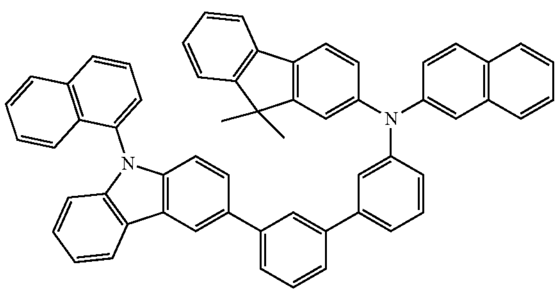
645
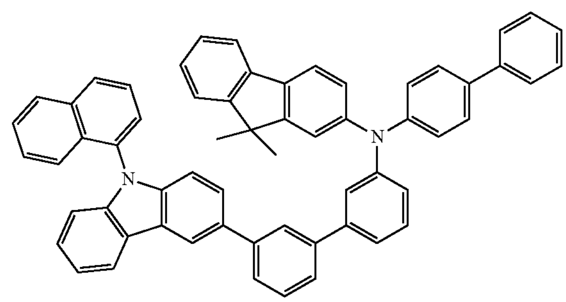
646
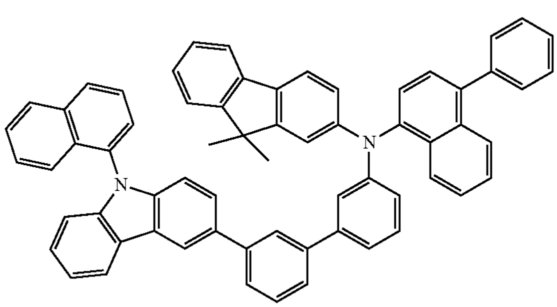
647
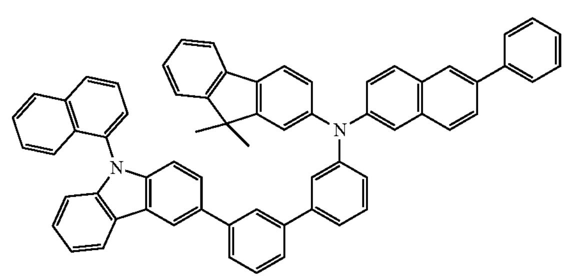

-continued
648
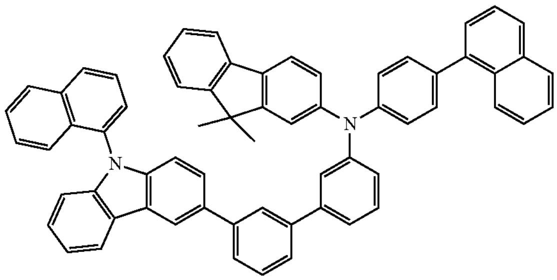
649
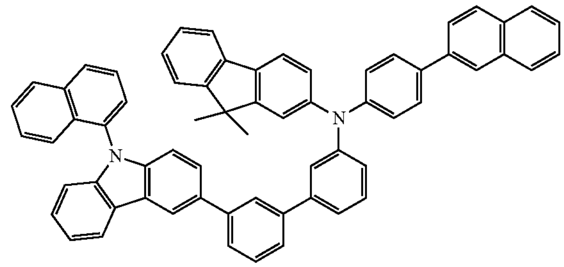
650
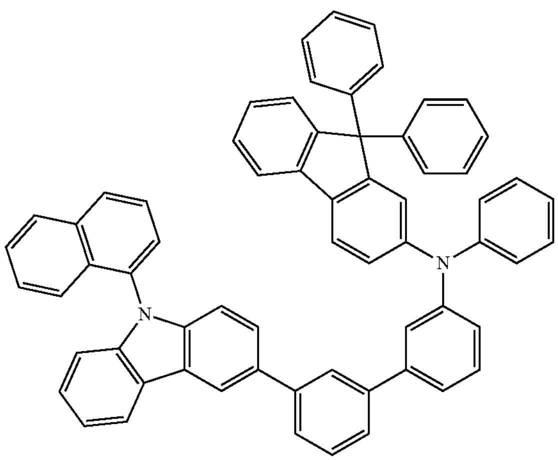
651
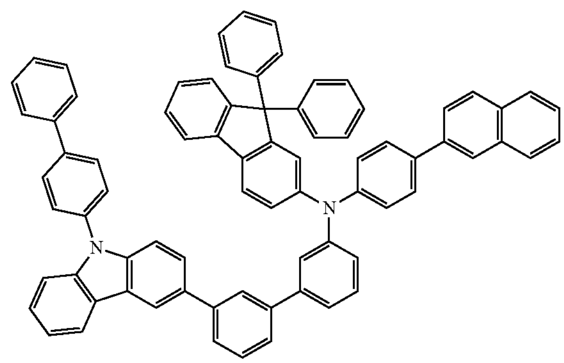
652
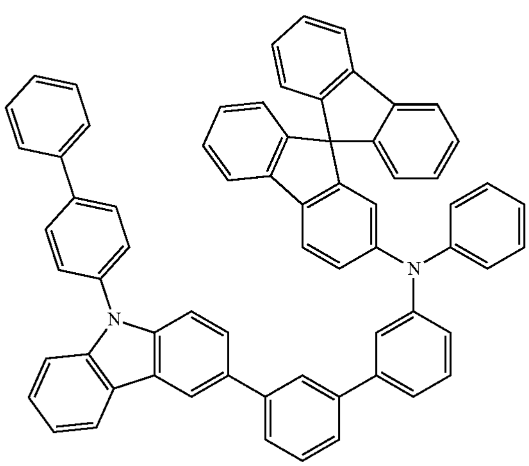
653
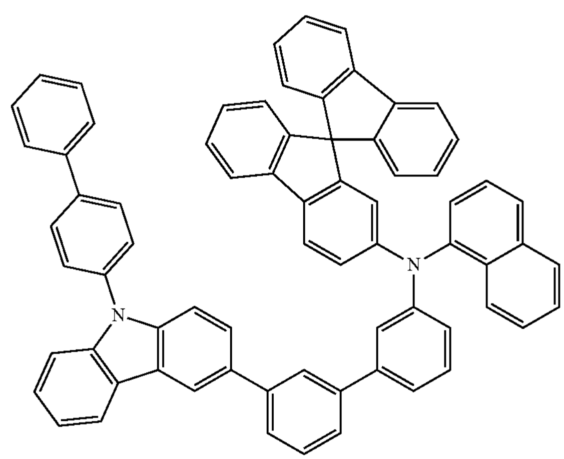

-continued
654
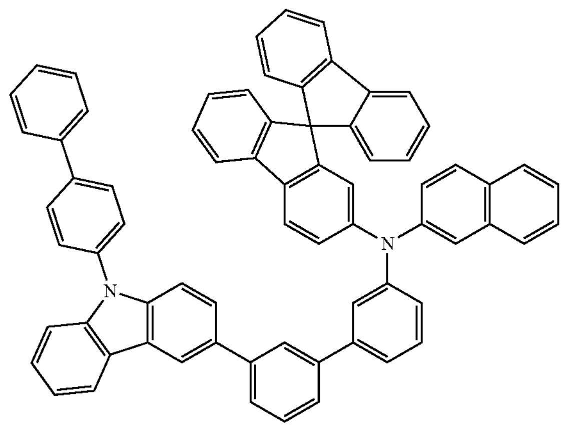
655
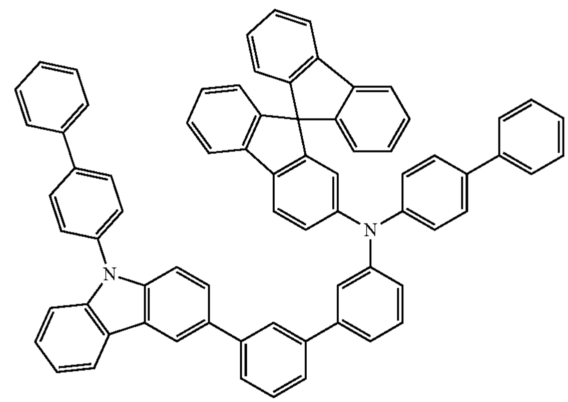
656
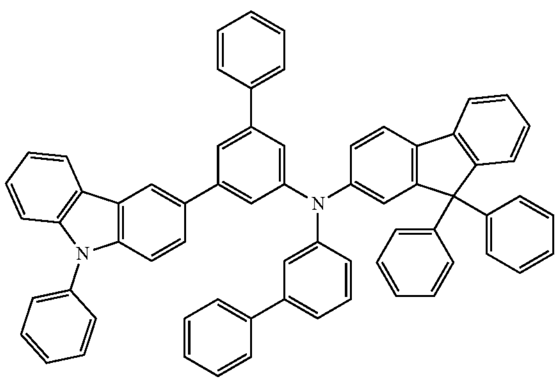
657
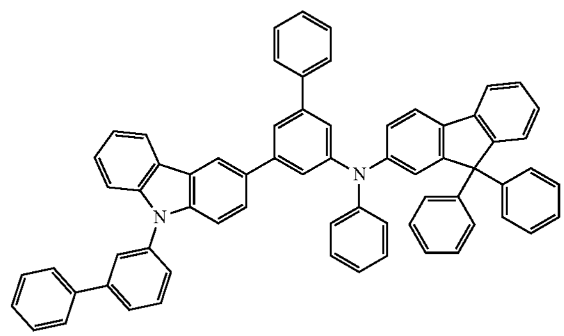
658
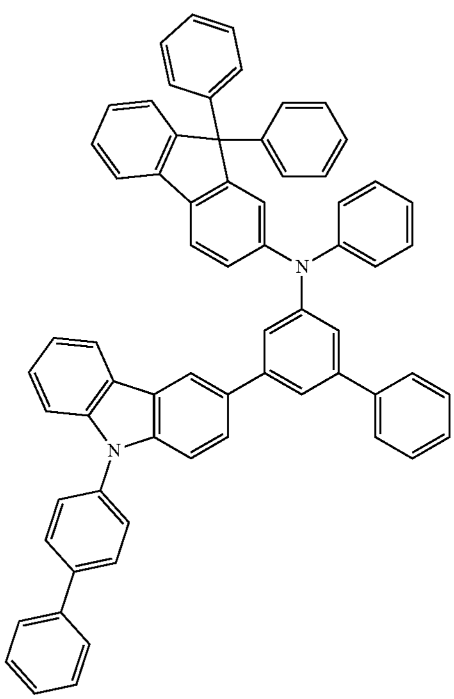
659
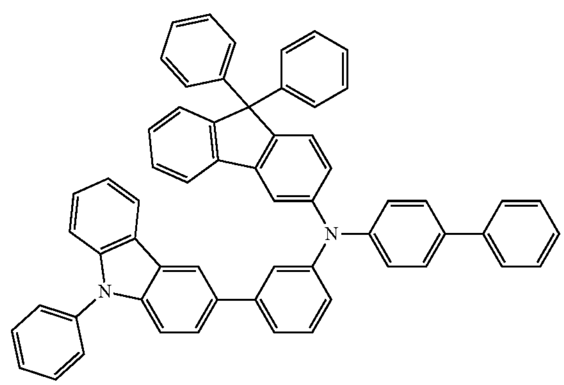

-continued
660
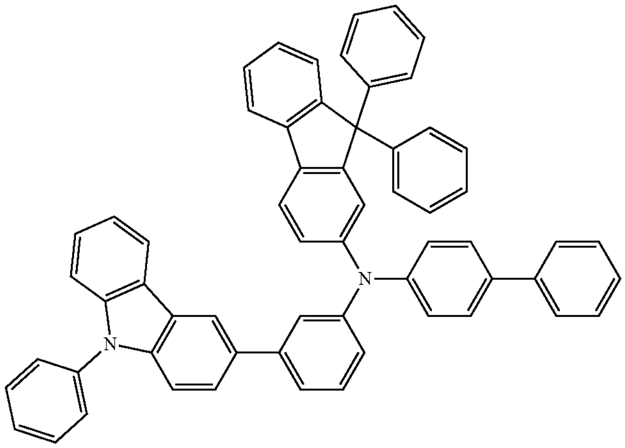
661
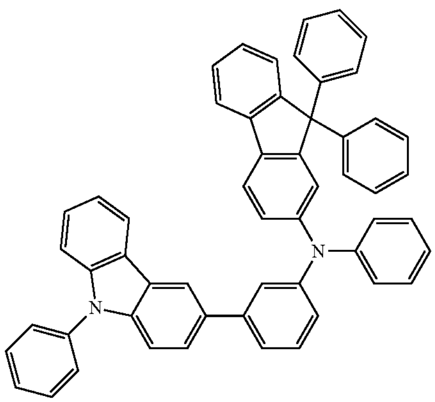
662
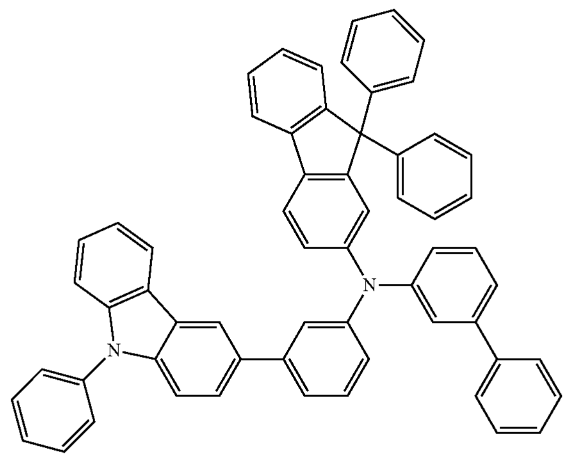
663
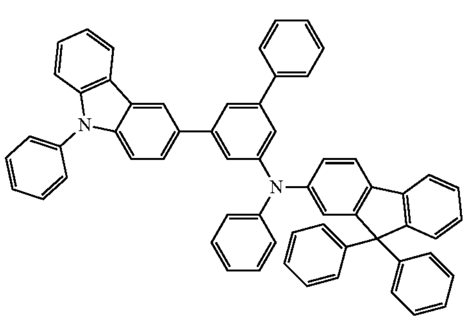
664
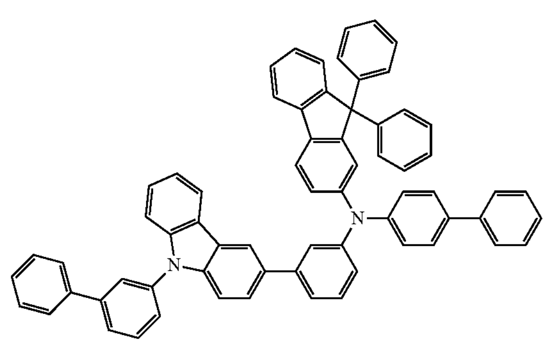

-continued
665
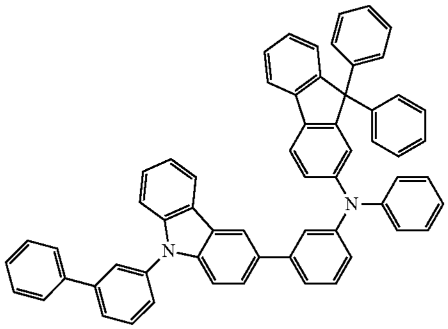
666
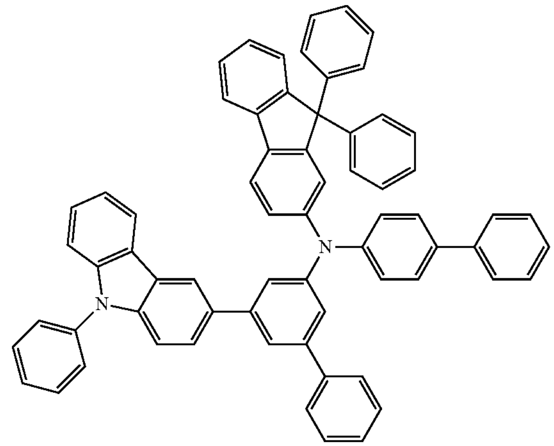
667
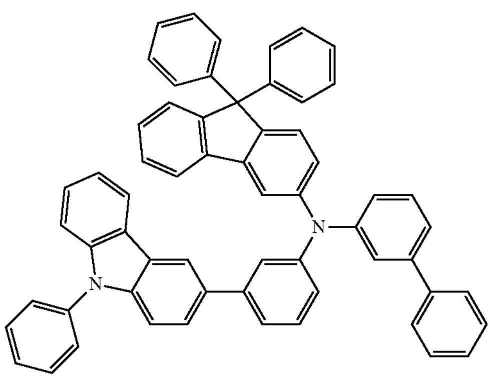
668
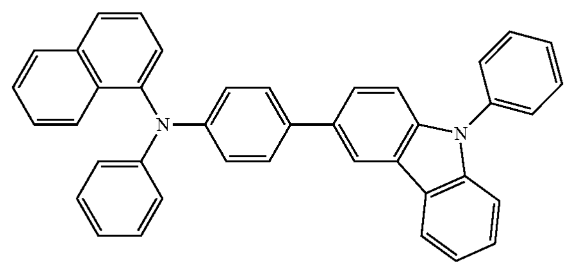
669
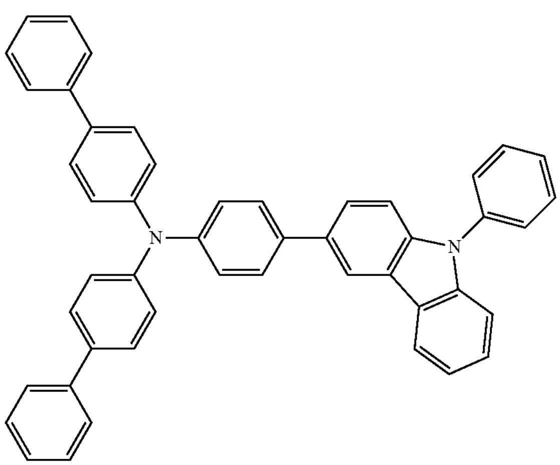
670
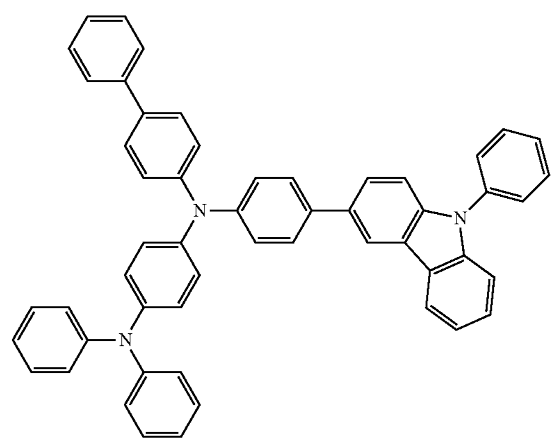

-continued
671
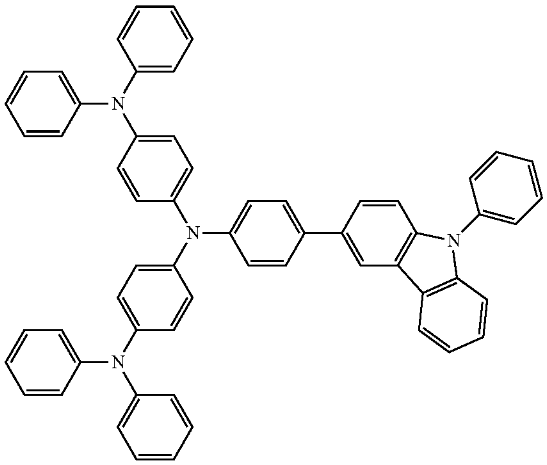
672
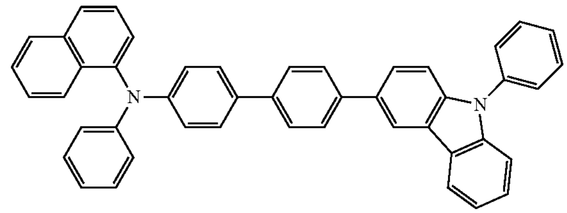
673
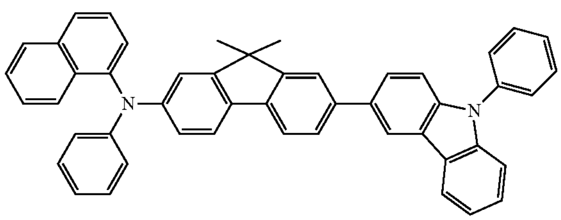
674
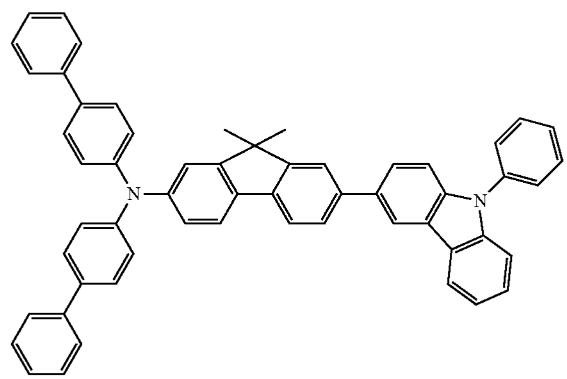
675
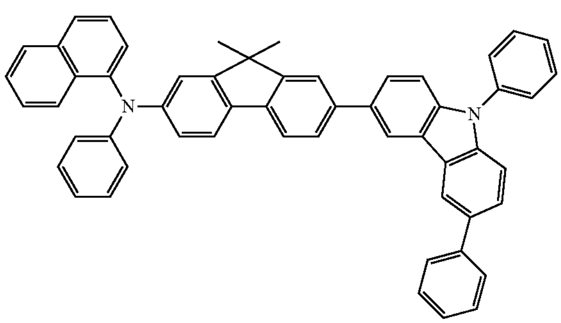
676
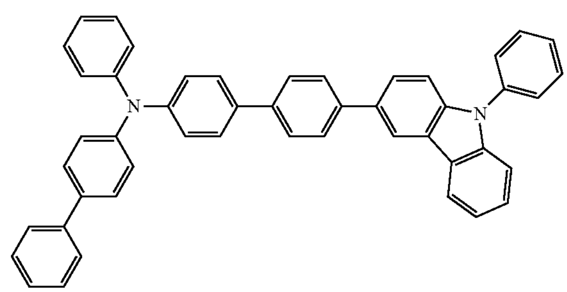
677
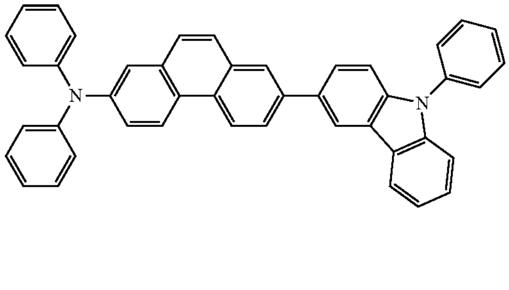
678
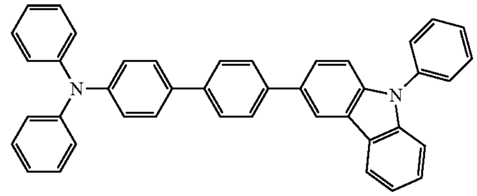

-continued
679
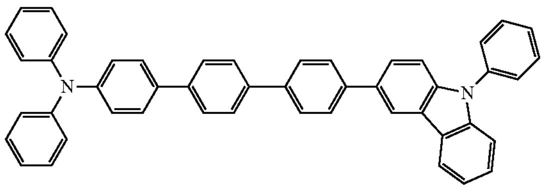
680
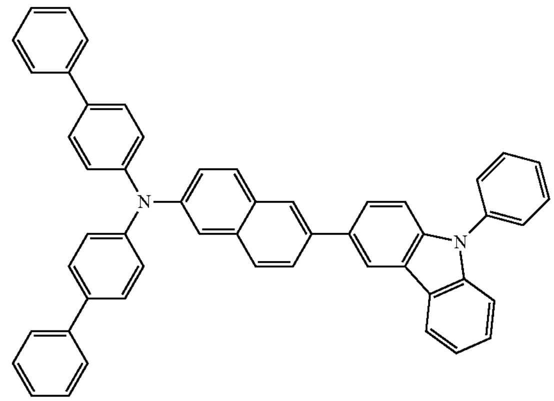
681
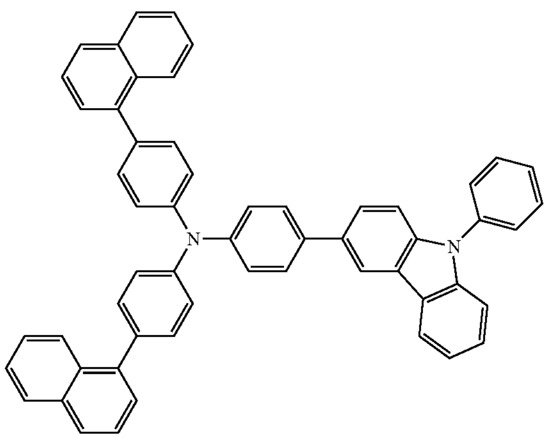
682
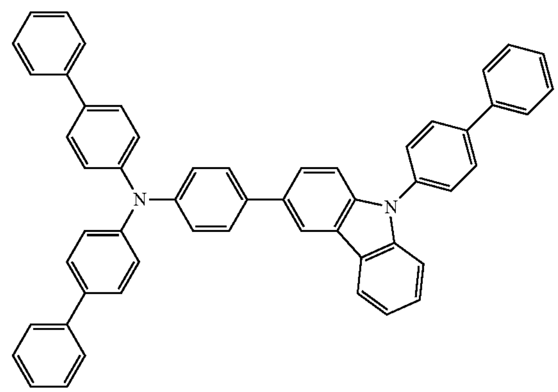
683
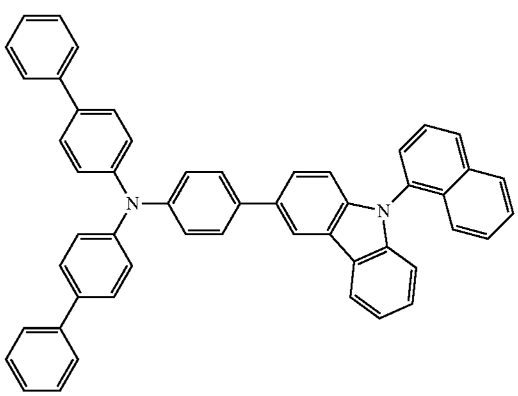
684
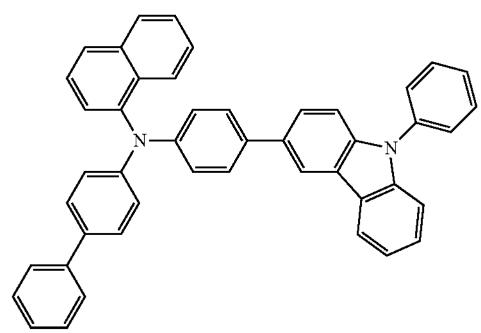

-continued
685
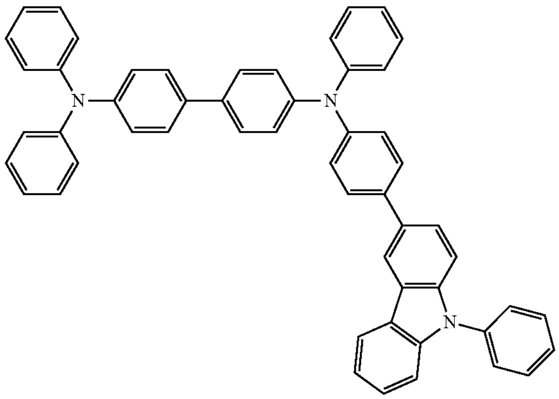
686
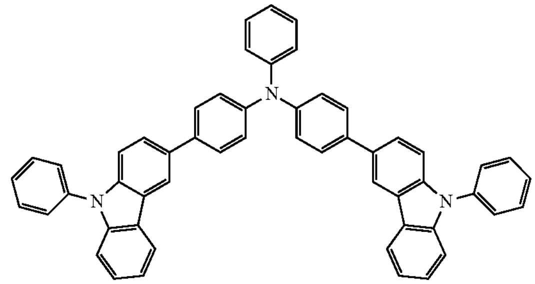
687
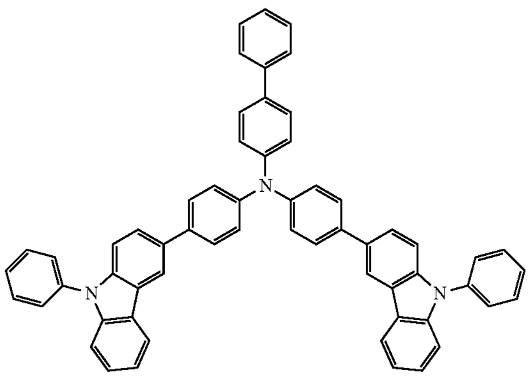
688
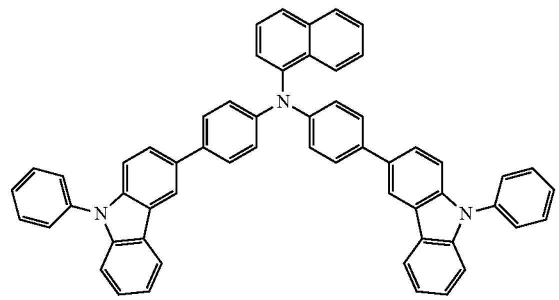
690
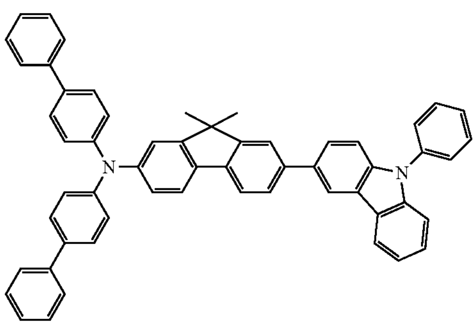
691
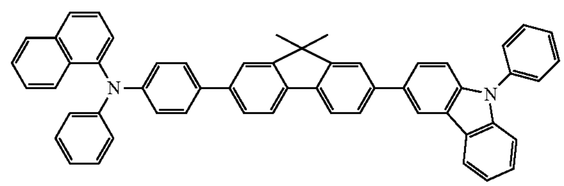
692
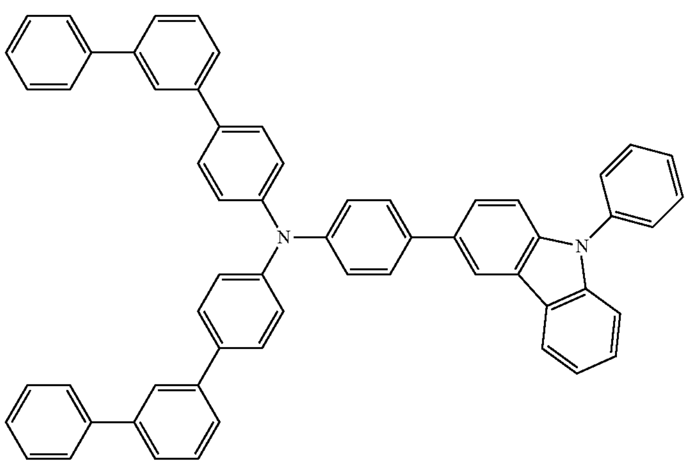

-continued
693
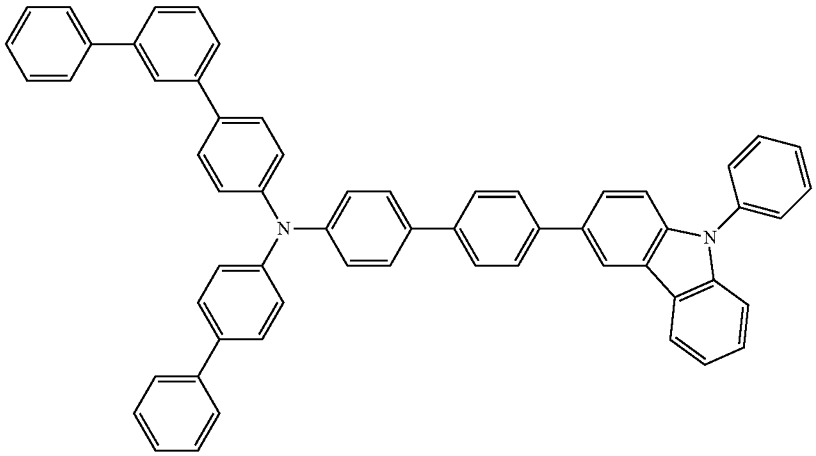
694
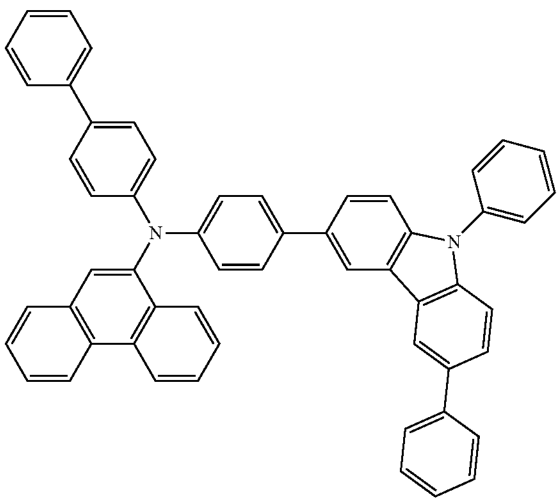
695
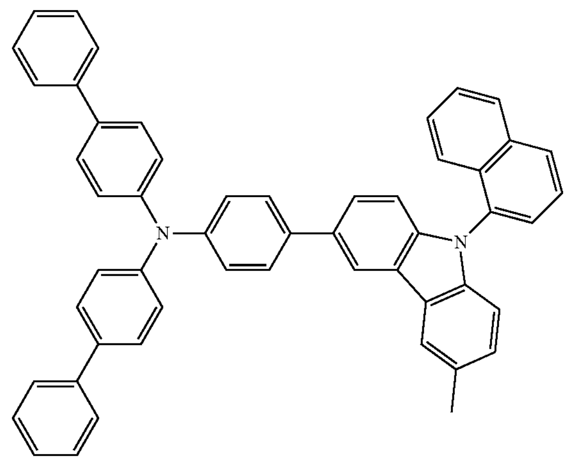
696
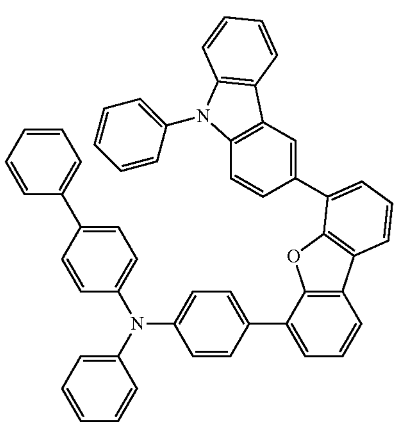
697
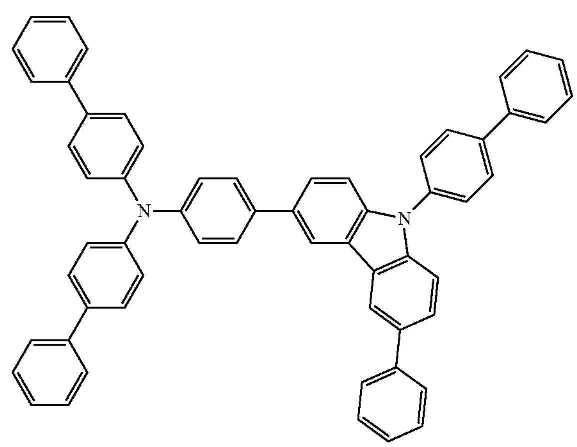

-continued

698

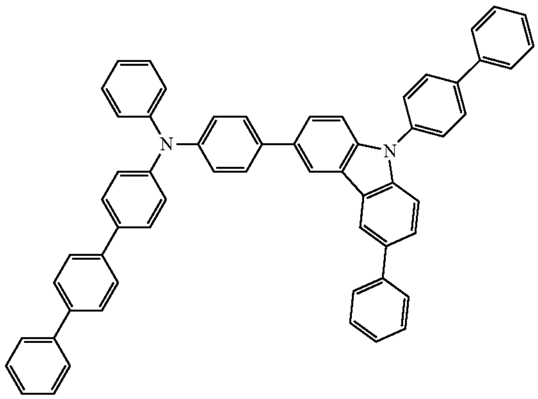

699

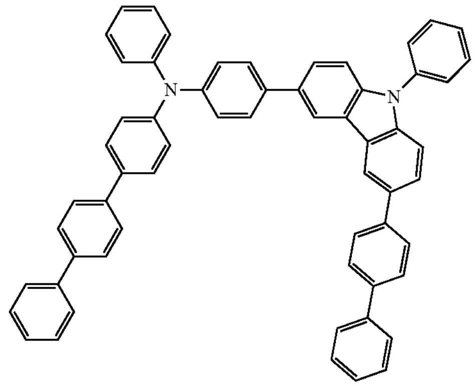

700

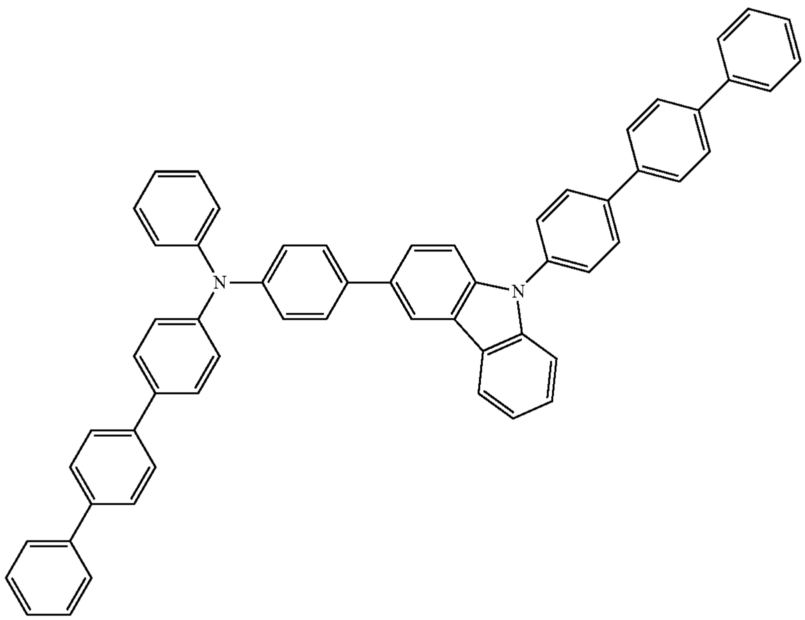

701

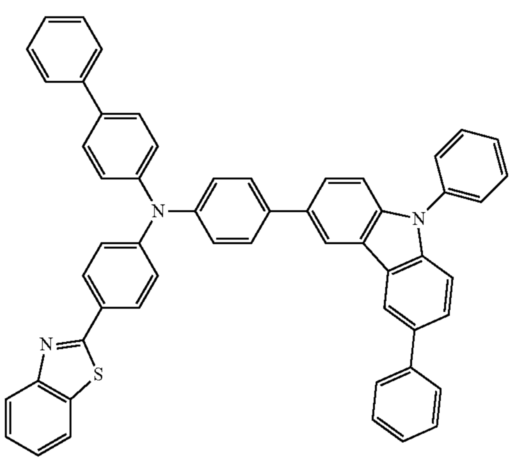

702

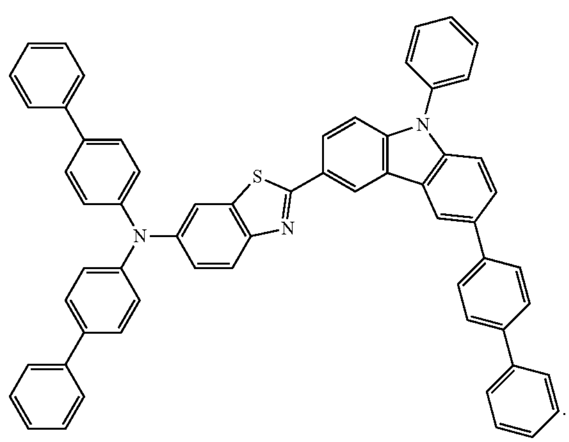

wherein, in Formulae 5-1 to 5-45, $Z_{41}$ to $Z_{43}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_{21}$ to $Q_{27}$ and $Q_{31}$ to $Q_{37}$ are each independently selected from a $C_1$-$C_{10}$ alkyl group, a $C_1$-$C_{10}$ alkoxy group, a phenyl group, and a naphthyl group;

f1 is an integer selected from 1 to 4; f2 is an integer selected from 1 to 3; f3 is 1 or 2; f4 is an integer selected from 1 to 6; and f5 is an integer selected from 1 to 5.

8. The organic light-emitting device of claim 7, wherein $Z_{41}$ to $Z_{43}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from a $C_1$-$C_{10}$ alkyl group, a $C_1$-$C_{10}$ alkoxy group, a phenyl group, a naphthyl group, a fluorenyl group, a spiro-fluorenyl group, a pyridinyl group, a pyrazinyl group, a pyrimidinyl group, a quinolinyl group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_{21}$ to $Q_{27}$ and $Q_{31}$ to $Q_{37}$ are each independently selected from a $C_1$-$C_{10}$ alkyl group, a $C_1$-$C_{10}$ alkoxy group, a phenyl group, and a naphthyl group.

9. The organic light-emitting device of claim 1, wherein $HT_2$ is selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —Si($Q_{31}$)($Q_{32}$)($Q_{33}$), —B($Q_{34}$)($Q_{35}$), and —N($Q_{36}$)($Q_{37}$);

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with a phenyl group substituted with at least one selected from a $C_1$-$C_{20}$ alkyl group and a phenyl group; and —Si($Q_1$)($Q_2$)($Q_3$), —B($Q_4$)($Q_5$), and —N($Q_6$)($Q_7$), wherein $Q_1$ to $Q_7$ and $Q_{31}$ to $Q_{37}$ are each independently selected from a $C_1$-$C_{10}$ alkyl group, a $C_1$-$C_{10}$ alkoxy group, a phenyl group, and a naphthyl group.

10. The organic light-emitting device of claim 1, wherein $HT_2$ is selected from:

—Si($Q_1$)($Q_2$)($Q_3$), —B($Q_4$)($Q_5$), and —N($Q_6$)($Q_7$); and groups represented by Formulae 7-1 to 7-9, wherein $Q_1$ to $Q_7$ are each independently selected from a $C_1$-$C_{10}$ alkyl group, a $C_1$-$C_{10}$ alkoxy group, a phenyl group, and a naphthyl group:

5-1

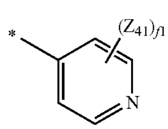

5-2

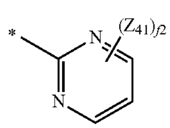

5-3

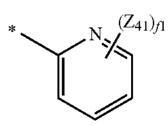

-continued 5-4

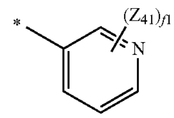

5-5

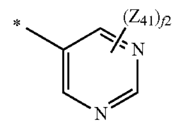

5-6

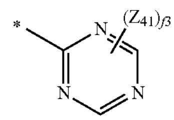

5-7

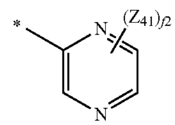

5-8

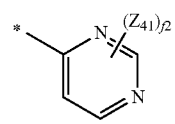

5-9

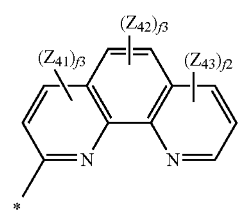

5-10

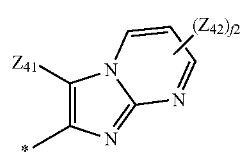

5-11

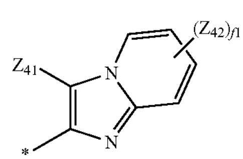

5-12

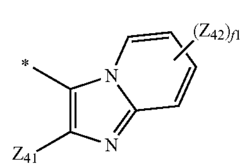

5-13

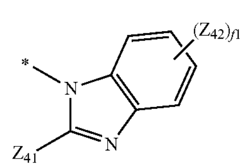

-continued
5-14
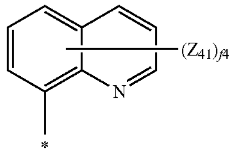
5-15
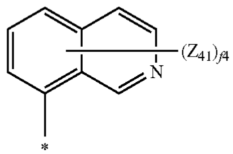
5-16
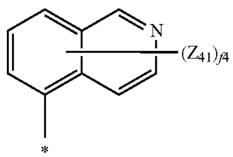
5-17
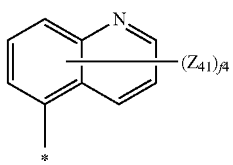
5-18
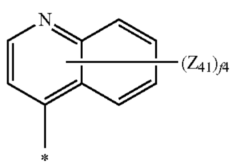
5-19
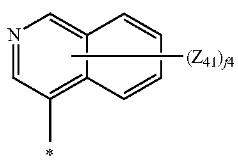
5-20
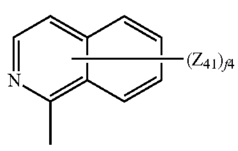
5-21
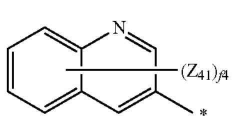
5-22
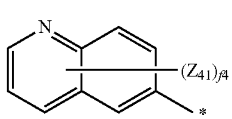
5-23
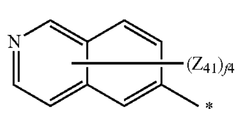
-continued
5-24
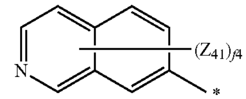
5-25
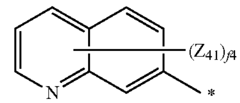
5-26
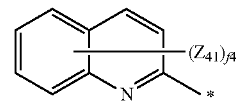
5-27
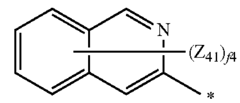
5-28
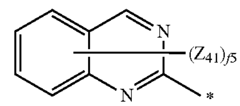
5-29
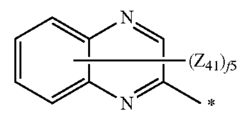
5-30
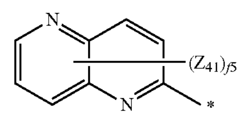
5-31
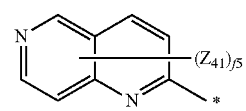
5-32
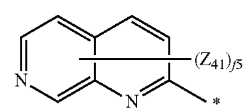
5-33
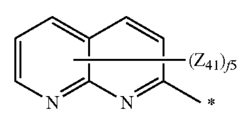
5-34
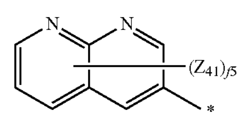
5-35
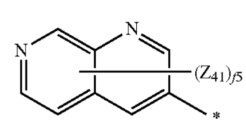
5-36
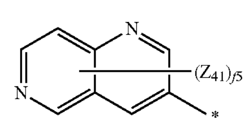

-continued 5-37

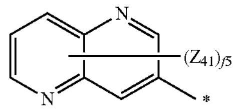

5-38

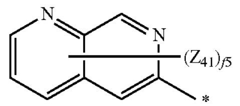

5-39

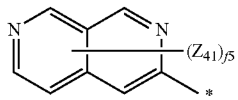

5-40

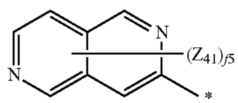

5-41

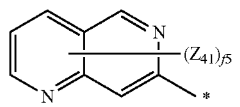

5-42

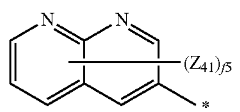

5-43

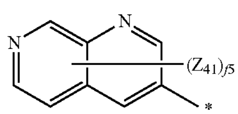

5-44

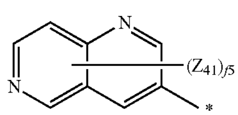

5-45

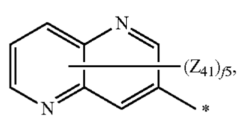

wherein, in Formulae 7-1 to 7-9, $Y_{31}$ and $Y_{32}$ are each independently selected from a single bond, O, S, $C(Z_{34})(Z_{35})$, $N(Z_{36})$, and $Si(Z_{37})(Z_{38})$;

$Z_{31}$ to $Z_{38}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

e1 is an integer selected from 1 to 5, e2 is an integer selected from 1 to 7, e3 is an integer selected from 1 to 3, e4 is an integer selected from 1 to 4, and * and *' are each independently a binding site to a neighboring atom.

11. The organic light-emitting device of claim 1, wherein $HT_2$ is selected from groups represented by Formulae 8-1 to 8-46:

8-1

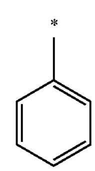

8-2

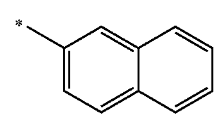

8-3

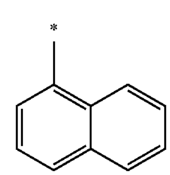

-continued
8-4
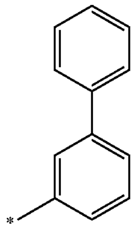
8-5
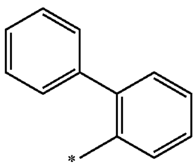
8-6
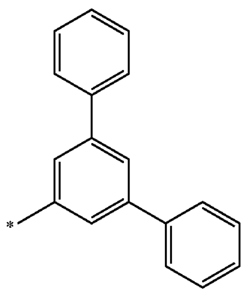
8-7
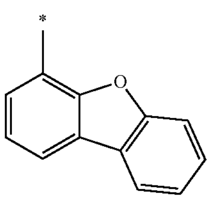
8-8
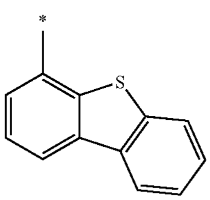
8-9
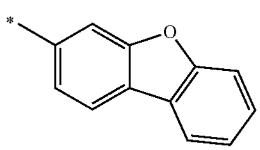
8-10
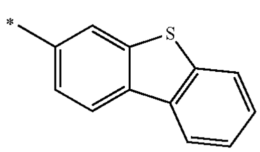
8-11
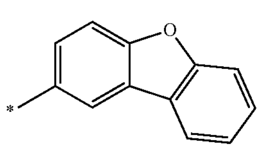
-continued
8-12
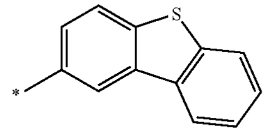
8-13
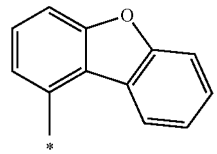
8-14
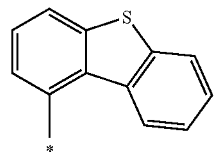
8-15
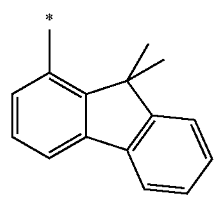
8-16
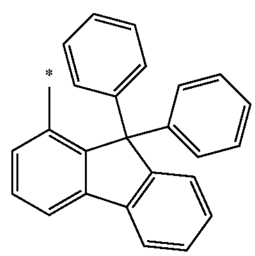
8-17
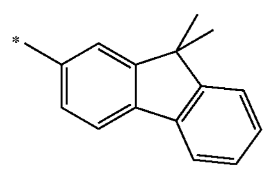
8-18
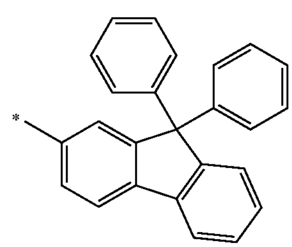
8-19
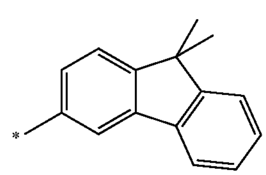

-continued
8-20
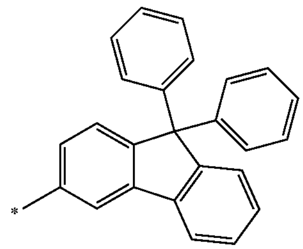
8-21
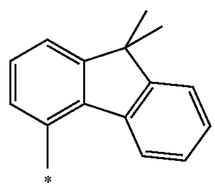
8-22
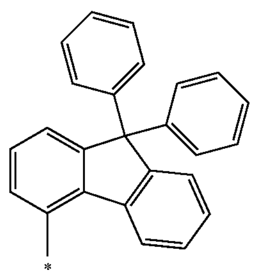
8-23
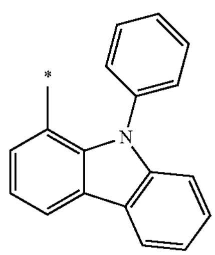
8-24
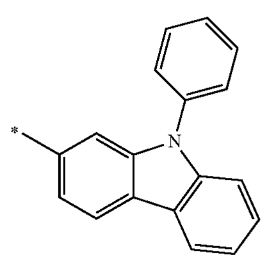
8-25
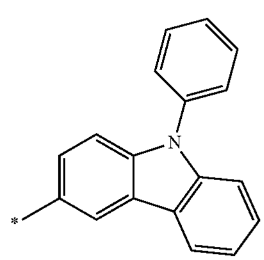
-continued
8-26
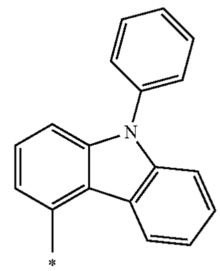
8-27
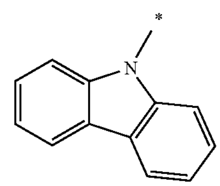
8-28
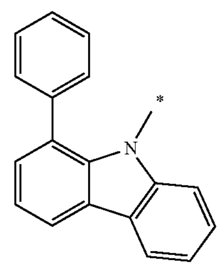
8-29
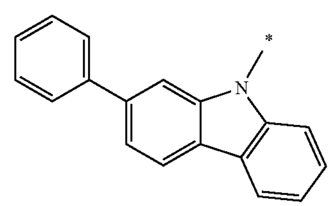
8-30
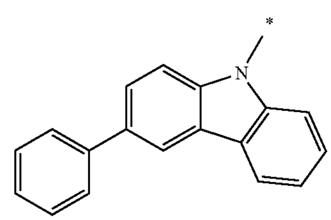
8-31
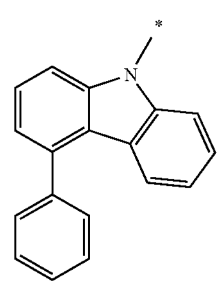

-continued
8-32
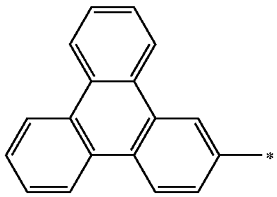
8-33
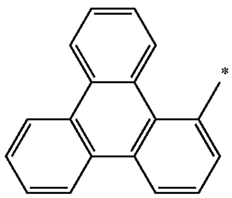
8-34
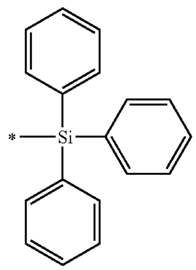
8-35
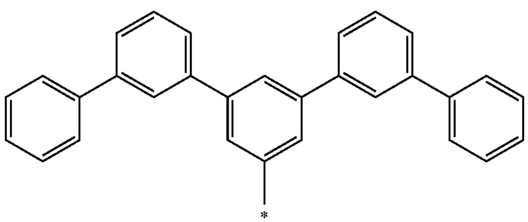
8-36
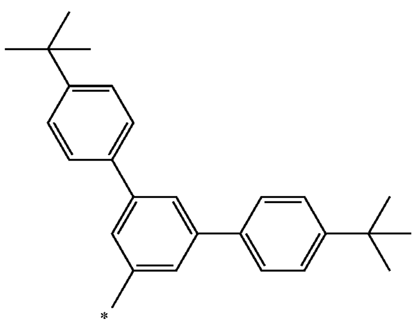
8-37
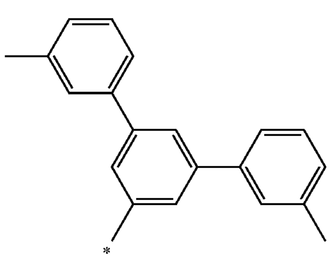
-continued
8-38
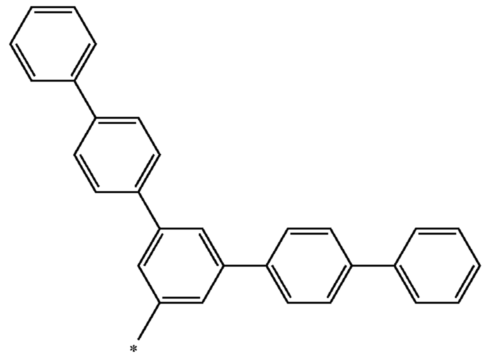
8-39
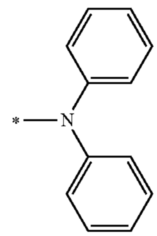
8-40
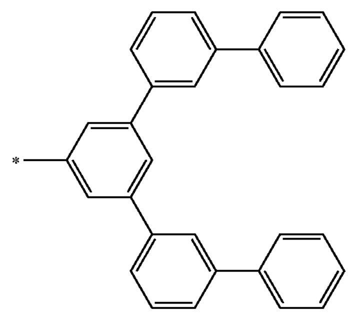
8-41
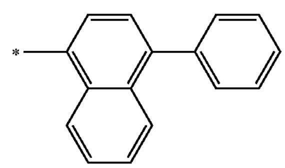
8-42
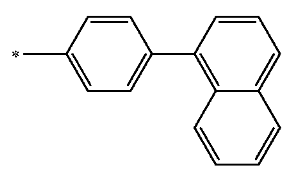
8-43
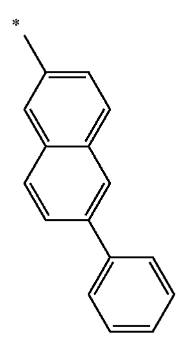

-continued 8-44

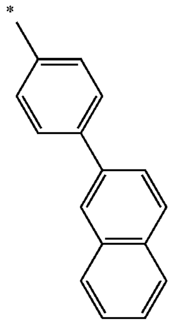

8-45

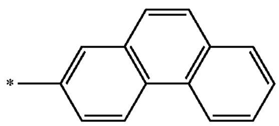

8-46

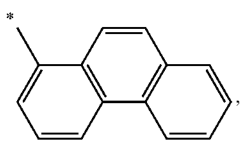

wherein, in Formulae 8-1 to 8-46, * is a binding site to a neighboring atom.

12. The organic light-emitting device of claim 1, wherein, in Formulae 1, 2-1 to 2-5, and 3, $R_{11}$ to $R_{16}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, a dibenzocarbazolyl group, and —Si($Q_{31}$)($Q_{32}$)($Q_{33}$); and —Si($Q_1$)($Q_2$)($Q_3$);

$R_{21}$ to $R_{26}$, $R_{31}$, and $R_{32}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —$Si(Q_{31})(Q_{32})(Q_{33})$; and —$Si(Q_1)(Q_2)(Q_3)$, wherein $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, and a naphthyl group.

13. The organic light-emitting device of claim 1, wherein the first material is represented by any one of Formulae 1A to 1G:

7-1

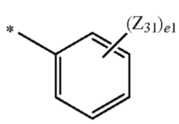

7-2

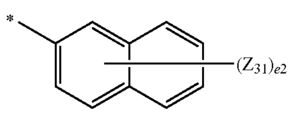

7-3

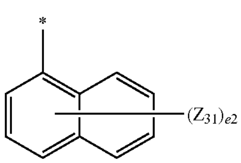

7-4

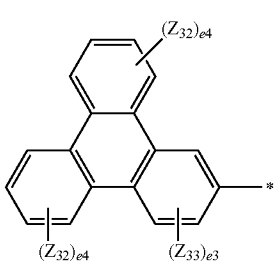

-continued 7-5

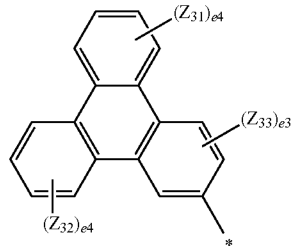

7-6

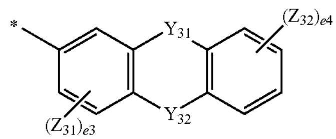

7-7

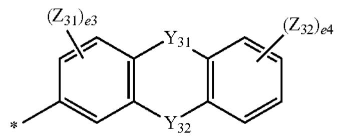

7-8

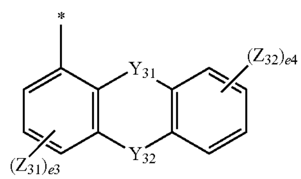

7-9

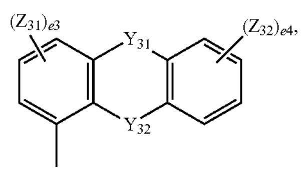

wherein, in Formulae 1A to 1G, $X_{11}$, $L_{11}$, $L_{13}$, a11, a13, $Ar_{11}$, $R_{11}$ to $R_{14}$, and b11 to b14 are the same as defined in Formula 1.

14. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer comprises a first material selected from Compounds 101A to 121A, 123A to 144A, 146A to 189A and Compounds 101B to 160B, 162B, and 163B and a second material selected from any one of Formulae 2-1 to 2-5, Formula 2-1

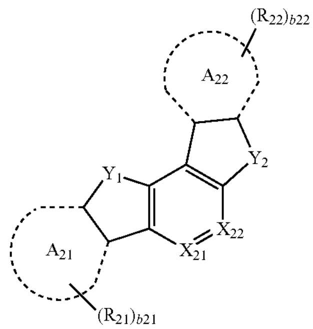

Formula 2-2

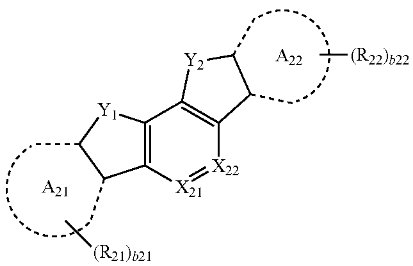

Formula 2-3

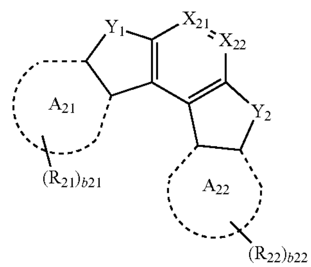

Formula 2-4

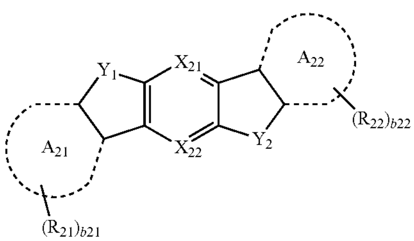

Formula 2-5

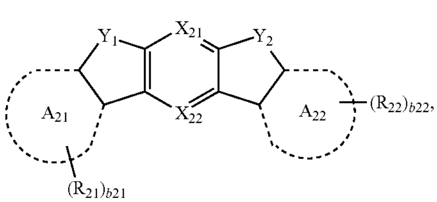

wherein, in Formulae 2-1 and 2-3 to 2-5, $A_{21}$ and $A_{22}$ are each independently selected from among a quinoline, an isoquinoline, 2,6-naphthyridine, 1,8-naphthyridine, 1,5-naphthyridine, 1,6-naphthyridine, 1,7-naphthyridine, 2,7-naphthyridine, a quinoxaline, a phthalazine, a quinazoline, and a cinnoline;

wherein, in Formula 2-2, $A_{21}$ and $A_{22}$ are each independently selected from among 2,6-naphthyridine, 1,8-naphthyridine, 1,5-naphthyridine, 1,6-naphthyridine, 1,7-naphthyridine, 2,7-naphthyridine, a phthalazine, and a cinnoline;

wherein, in Formulae 2-1 to 2-5, $X_{21}$ is $C(R_{23})$ or N:

$X_{22}$ is $C(R_{24})$ or N:

$Y_1$ is $N[(L_{21})_{a21}\text{-}Ar_{21}]$:

$Y_2$ is selected from $N[(L_{22})_{a22}\text{-}Ar_{22}]$, O, S, and $Si(R_{25})(R_{26})$:

$L_{21}$ and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 and a22 are each independently selected from 0, 1, 2, and 3, and when a11 is 2 or greater, two or more $L_{11}$s are identical to or different from each other, when a12 is 2 or greater, two or more $L_{12}$s are identical to or different from each other, when a13 is 2 or greater, two or more $L_{13}$s are identical to or different from each other, when a21 is 2 or greater, two or more $L_{21}$s are identical to or different from each other, when a22 is 2 or greater, two or more $L_{22}$s are identical to or different from each other, when a31 is 2 or greater, two or more $L_{31}$s are identical to or different from each other, when a32 is 2 or greater, two or more $L_{32}$s are identical to or different from each other, when a33 is 2 or greater, two or more $L_{33}$s are identical to or different from each other, and when a34 is 2 or greater, two or more $L_{34}$s are identical to or different from each other;

$Ar_{21}$ and $Ar_{22}$ are each independently selected from:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{31})(Q_{32})(Q_{33})$, —$B(Q_{34})(Q_{35})$, and —$N(Q_{36})(Q_{37})$; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, and an imidazopyrimidinyl group, each substituted with at least one selected from a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —$Si(Q_{21})(Q_{22})(Q_{23})$, —$B(Q_{24})(Q_{25})$, and —$N(Q_{26})(Q_{27})$, $R_{21}$ to $R_{26}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_4)(Q_5)$, and —$N(Q_6)(Q_7)$;

b21 and b22 are each 0; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and the hole transport region comprises a third material selected from Compounds 501 to 688 and 690 to 702:

Formula 1A

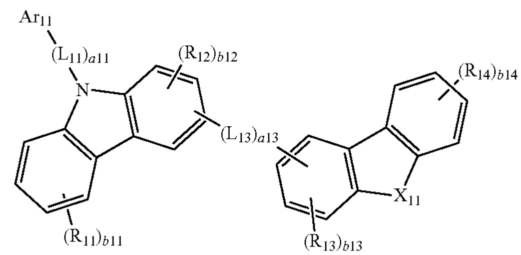

Formula 1B

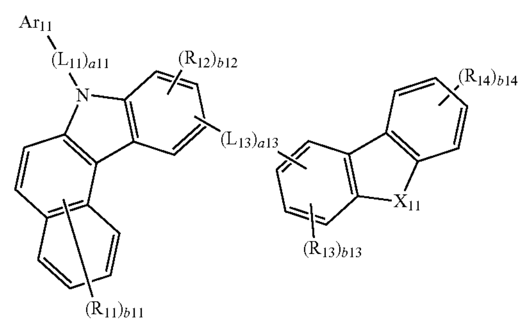

Formula 1C

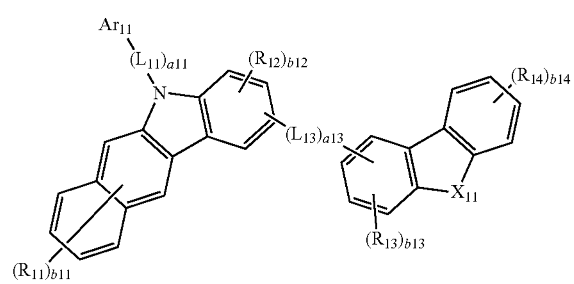

Formula 1D

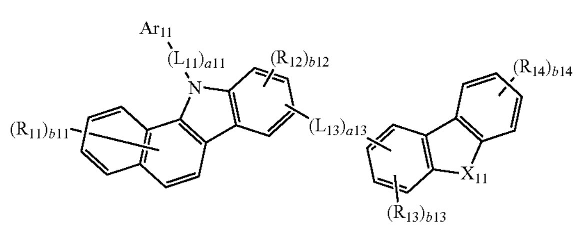

-continued

Formula 1E

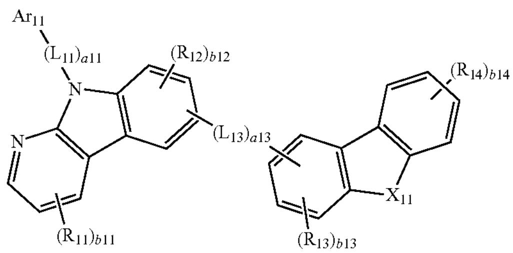

Formula 1F

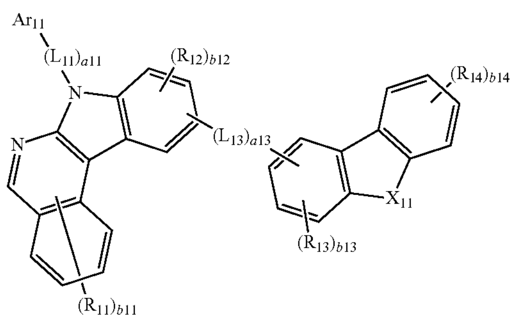

-continued

Formula 1G

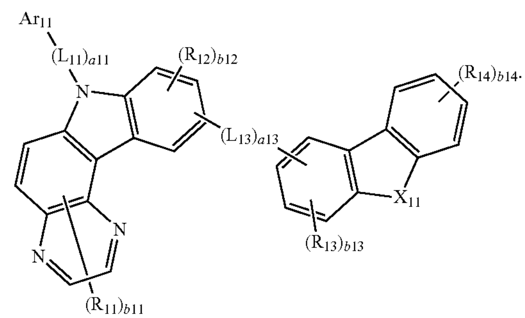

wherein, in the formulae above, Ph is a phenyl group and Me is a methyl group.

15. The organic light-emitting device of claim 14, wherein the first material is selected from Compounds 101A to 121A, 123A to 144A, and 146A to 189A, and the third material is selected from Compounds 501 to 688 and 690 to 702.

16. The organic light-emitting device of claim 1, wherein the emission layer comprises a host and a dopant, the host comprising the first material represented by Formula 1 and the second material represented by any one of Formulae 2-1 to 2-5, and the hole transport region comprises at least one selected from a hole transport layer and an electron blocking layer, and at least one selected from the hole transport layer and the electron blocking layer comprises the third material represented by Formula 3.

* * * * *